US011869847B2

(12) United States Patent
Lin et al.

(10) Patent No.: US 11,869,847 B2
(45) Date of Patent: Jan. 9, 2024

(54) LOGIC DRIVE BASED ON MULTICHIP PACKAGE COMPRISING STANDARD COMMODITY FPGA IC CHIP WITH COOPERATING OR SUPPORTING CIRCUITS

(71) Applicant: iCometrue Company Ltd., Zhubei (TW)

(72) Inventors: Mou-Shiung Lin, Hsinchu (TW); Jin-Yuan Lee, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 32 days.

(21) Appl. No.: 17/543,729

(22) Filed: Dec. 6, 2021

(65) Prior Publication Data

US 2022/0093524 A1 Mar. 24, 2022

Related U.S. Application Data

(63) Continuation of application No. 17/089,713, filed on Nov. 4, 2020, now Pat. No. 11,227,838, which is a
(Continued)

(51) Int. Cl.

| | |
|---|---|
| ***H01L 23/538*** | (2006.01) |
| ***H01L 23/31*** | (2006.01) |
| ***H01L 23/00*** | (2006.01) |

(52) U.S. Cl.

CPC ...... *H01L 23/5389* (2013.01); *H01L 23/3128* (2013.01); *H01L 23/5383* (2013.01);
(Continued)

(58) Field of Classification Search

CPC ............. H01L 23/5389; H01L 23/3128; H01L 23/5383; H01L 23/5386; H01L 24/20;
(Continued)

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Daniel D Chang

(57) ABSTRACT

A multichip package includes: a chip package comprising a first IC chip, a polymer layer in a space beyond and extending from a sidewall of the first IC chip, a through package via in the polymer layer, an interconnection scheme under the first IC chip, polymer layer and through package via, and a metal bump under the interconnection scheme and at a bottom of the chip package, wherein the first IC chip comprises memory cells for storing data therein associated with resulting values for a look-up table (LUT) and a selection circuit comprising a first input data set for a logic operation and a second input data set associated with the data stored in the memory cells, wherein the selection circuit selects, in accordance with the first input data set, data from the second input data set as an output data for the logic operation; and a second IC chip over the chip package, wherein the second IC chip couples to the first IC chip through, in sequence, the through package via and interconnection scheme, wherein the second IC chip comprises a hard macro having an input data associated with the output data for the logic operation.

26 Claims, 85 Drawing Sheets

302

Related U.S. Application Data continuation-in-part of application No. 16/918,909, filed on Jul. 1, 2020, now Pat. No. 10,985,154.

(60) Provisional application No. 63/023,235, filed on May 11, 2020, provisional application No. 63/012,072, filed on Apr. 17, 2020, provisional application No. 62/983,634, filed on Feb. 29, 2020, provisional application No. 62/964,627, filed on Jan. 22, 2020, provisional application No. 62/903,655, filed on Sep. 20, 2019, provisional application No. 62/891,386, filed on Aug. 25, 2019, provisional application No. 62/882,941, filed on Aug. 5, 2019, provisional application No. 62/869,567, filed on Jul. 2, 2019.

(52) U.S. Cl.
CPC .......... *H01L 23/5386* (2013.01); *H01L 24/20* (2013.01); *H01L 2224/214* (2013.01); *H01L 2924/143* (2013.01); *H01L 2924/1431* (2013.01); *H01L 2924/1443* (2013.01); *H01L 2924/14335* (2013.01)

(58) Field of Classification Search
CPC ......... H01L 2224/214; H01L 2924/143; H01L 2924/1431; H01L 2924/14335; H01L 2924/1443; H01L 24/16; H01L 24/25; H01L 25/18; H01L 25/03; H01L 25/105; H01L 2224/0401; H01L 2224/04105; H01L 2224/05025; H01L 2224/05572; H01L 2224/08145; H01L 2224/10126; H01L 2224/12105; H01L 2224/13022; H01L 2224/13025; H01L 2224/13082; H01L 2224/16145; H01L 2224/16235; H01L 2224/16237; H01L 2224/16238; H01L 2224/24137; H01L 2224/2518; H01L 2224/32145; H01L 2224/32225; H01L 2224/33181; H01L 2224/48227; H01L 2224/73204; H01L 2224/73251; H01L 2224/73253; H01L 2224/73259; H01L 2224/73265; H01L 2224/96; H01L 2225/0651; H01L 2225/06562; H01L 2225/1023; H01L 2225/1035; H01L 2225/1041; H01L 2225/1058; H01L 2924/15192; H01L 2924/15311; H01L 2924/18161; H01L 2924/18162; H01L 27/0924; H01L 23/5382; H01L 23/49816; H01L 23/5385; H03K 19/0016; H03K 19/018592; H03K 19/17728; H03K 19/17736; H03K 19/1776
See application file for complete search history.

(56) References Cited

U.S. PATENT DOCUMENTS 5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,034,542 A 3/2000 Ridgeway
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,998,872 B1 * 2/2006 Chirania .......... H03K 19/17728 326/39
7,030,652 B1 4/2006 Lewis et al.
7,061,271 B1 6/2006 Young et al.
7,126,214 B2 * 10/2006 Huppenthal ........ H01L 25/0657 712/15
7,190,190 B1 3/2007 Camarota et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,550,994 B1 6/2009 Camarota
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
8,064,224 B2 11/2011 Mahajan et al.
8,081,079 B1 12/2011 Camarota
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.
9,524,955 B2 12/2016 Huang et al.
9,543,276 B2 1/2017 Jee et al.
9,583,431 B1 2/2017 Rahman
9,593,009 B2 3/2017 Fuergut et al.

(56) References Cited

U.S. PATENT DOCUMENTS 9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Kuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 * 8/2018 Yu .......................... H01L 25/50
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,290,611 B2 5/2019 Yu et al.
10,325,882 B2 6/2019 Kang et al.
10,333,623 B1 6/2019 Liao et al.
10,340,249 B1 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,522,449 B2 12/2019 Chen et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,892,011 B2 1/2021 Lin et al.
10,892,291 B2 1/2021 Chhun et al.
11,114,408 B2 9/2021 Shen et al.
11,211,334 B2 12/2021 Lin et al.
11,217,368 B2 1/2022 Choa et al.
2001/0045844 A1 11/2001 New et al.
2002/0092307 A1 7/2002 Ghoshal
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0185457 A1 8/2005 Kim et al.
2005/0218929 A1 10/2005 Wang et al.
2006/0138509 A1 6/2006 Lee et al.
2007/0037379 A1 2/2007 Enquist et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0133704 A1 6/2010 Marimuthu et al.
2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0112066 A1 4/2014 Chow et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepereq
2015/0287672 A1 10/2015 Yazdani
2015/0327367 A1 11/2015 Shen
2016/0118390 A1 4/2016 Liaw
2016/0133571 A1 5/2016 Lee et al.
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0301650 A1 10/2017 Yu
2018/0053730 A1 2/2018 Shao
2018/0061742 A1 3/2018 Ananiev
2018/0068937 A1 3/2018 Marimuthu et al.
2018/0076179 A1 3/2018 Hsu et al.
2018/0102776 A1 4/2018 Chandrasekar et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0210799 A1 7/2018 Gao
2018/0226349 A1 8/2018 Yu et al.
2018/0226371 A1 8/2018 Enquist
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.

(56) References Cited

U.S. PATENT DOCUMENTS

| | | | |
|---|---|---|---|
| 2019/0013276 | A1 | 1/2019 | Lee et al. |
| 2019/0019756 | A1 | 1/2019 | Yu et al. |
| 2019/0020343 | A1 | 1/2019 | Lin et al. |
| 2019/0051641 | A1 | 2/2019 | Lin et al. |
| 2019/0057932 | A1 | 2/2019 | Wu et al. |
| 2019/0067152 | A1 | 2/2019 | Wuu et al. |
| 2019/0097304 | A1 | 3/2019 | Hsiao et al. |
| 2019/0129817 | A1 | 5/2019 | Zhuo |
| 2019/0221547 | A1 | 7/2019 | Drab et al. |
| 2019/0238134 | A1 | 8/2019 | Lin et al. |
| 2019/0238135 | A1 | 8/2019 | Lin et al. |
| 2019/0245543 | A1 | 8/2019 | Lin et al. |
| 2019/0253056 | A1 | 8/2019 | Lin et al. |
| 2019/0304803 | A1 | 10/2019 | Hu et al. |
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0371763 | A1 | 12/2019 | Agarwal et al. |
| 2019/0372574 | A1 | 12/2019 | Lin et al. |
| 2020/0058617 | A1 | 2/2020 | Wu et al. |
| 2020/0082885 | A1 | 3/2020 | Lin et al. |
| 2020/0111734 | A1 | 4/2020 | Lin et al. |
| 2020/0144224 | A1 | 5/2020 | Lin et al. |
| 2020/0161242 | A1 | 5/2020 | Lin et al. |
| 2020/0243422 | A1 | 7/2020 | Kim et al. |
| 2020/0373215 | A1 | 11/2020 | Wu et al. |
| 2021/0005592 | A1 | 1/2021 | Lin et al. |
| 2021/0043557 | A1 | 2/2021 | Lin et al. |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |
| 2022/0020729 | A1 | 1/2022 | Gao et al. |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

650

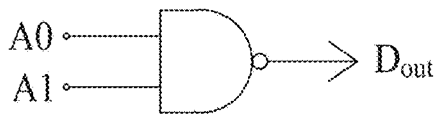
Fig. 20A
| A0 | A1 | Dout | |
|---|---|---|---|
| 0 | 0 | 1 | D0 |
| 0 | 1 | 1 | D1 |
| 1 | 0 | 1 | D2 |
| 1 | 1 | 0 | D3 |
Fig. 20B
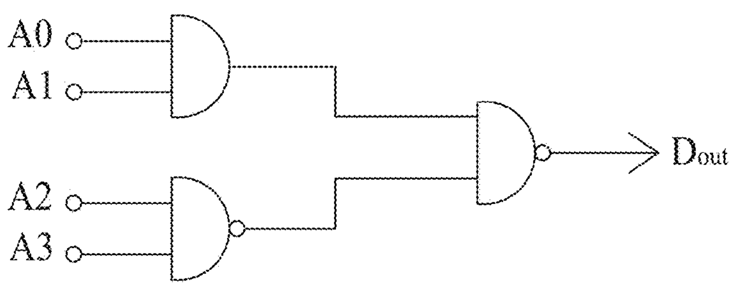
Fig. 20C
| Input | | | | Onput | |
|---|---|---|---|---|---|
| A0 | A1 | A2 | A3 | Dout | |
| 0 | 0 | 0 | 0 | 1 | D0 |
| 0 | 0 | 0 | 1 | 1 | D1 |
| 0 | 0 | 1 | 0 | 1 | D2 |
| 0 | 0 | 1 | 1 | 1 | D3 |
| 0 | 1 | 0 | 0 | 1 | D4 |
| 0 | 1 | 0 | 1 | 1 | D5 |
| 0 | 1 | 1 | 0 | 1 | D6 |
| 0 | 1 | 1 | 1 | 1 | D7 |
| 1 | 0 | 0 | 0 | 1 | D8 |
| 1 | 0 | 0 | 1 | 1 | D9 |
| 1 | 0 | 1 | 0 | 1 | D10 |
| 1 | 0 | 1 | 1 | 1 | D11 |
| 1 | 1 | 0 | 0 | 0 | D12 |
| 1 | 1 | 0 | 1 | 0 | D13 |
| 1 | 1 | 1 | 0 | 0 | D14 |
| 1 | 1 | 1 | 1 | 1 | D15 |
Fig. 20D

| Input | | | | Output | | | | |
|---|---|---|---|---|---|---|---|---|
| A1 | A0 x A3 | | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

| | 1 | 2 | 3 | 4 | 5 | 6 | 7 | 8 |
|---|---|---|---|---|---|---|---|---|
| 1 | 1 | 0 | 0 | 0 | 0 | 0 | 0 | 0 |
| 2 | 0 | 1 | 0 | 0 | 0 | 0 | 0 | 0 |
| 3 | 0 | 0 | 1 | 0 | 0 | 0 | 0 | 0 |
| 4 | 0 | 0 | 0 | 1 | 0 | 0 | 0 | 0 |
| 5 | 0 | 0 | 0 | 0 | 1 | 0 | 0 | 0 |
| 6 | 0 | 0 | 0 | 0 | 0 | 1 | 0 | 0 |
| 7 | 0 | 0 | 0 | 0 | 0 | 0 | 1 | 0 |
| 8 | 0 | 0 | 0 | 0 | 0 | 0 | 0 | 1 |

Fig. 22C

| | 1 | 2 | 3 | 4 | 5 | 6 | 7 | 8 |
|---|---|---|---|---|---|---|---|---|
| 1 | 0 | 0 | 1 | 0 | 0 | 0 | 0 | 0 |
| 2 | 0 | 0 | 0 | 0 | 1 | 0 | 0 | 0 |
| 3 | 1 | 0 | 0 | 0 | 0 | 0 | 0 | 0 |
| 4 | 0 | 0 | 0 | 0 | 0 | 0 | 0 | 1 |
| 5 | 0 | 0 | 0 | 1 | 0 | 0 | 0 | 0 |
| 6 | 0 | 0 | 0 | 0 | 0 | 1 | 0 | 0 |
| 7 | 0 | 1 | 0 | 0 | 0 | 0 | 0 | 0 |
| 8 | 0 | 0 | 0 | 0 | 0 | 0 | 1 | 0 |

Fig. 22D

| 1 | 2 | 3 | 4 | 5 | 6 | 7 | 8 |
|---|---|---|---|---|---|---|---|
| 1 | 1 | 1 | 1 | 1 | 1 | 1 | 1 |

| 1 | 2 | 3 | 4 | 5 | 6 | 7 | 8 |
|---|---|---|---|---|---|---|---|
| 0 | 1 | 0 | 1 | 0 | 0 | 0 | 1 |

300

300

LOGIC DRIVE BASED ON MULTICHIP PACKAGE COMPRISING STANDARD COMMODITY FPGA IC CHIP WITH COOPERATING OR SUPPORTING CIRCUITS

PRIORITY CLAIM

This application is a continuation of application Ser. No. 17/089,713, filed on Nov. 4, 2020, now U.S. Pat. No. 11,227,838, which is a continuation-in-part of application Ser. No. 16/918,909, filed on Jul. 1, 2020, which claims priority benefits from provisional application No. 62/869,567, filed on Jul. 2, 2019 and entitled "CRYPTOGRAPHY METHOD FOR STANDARD COMMODITY PROGRAMMABLE LOGIC IC CHIPS IN LOGIC DRIVE", provisional application No. 62/882,941, filed on Aug. 5, 2019 and entitled "VERTICAL INTERCONNECT ELEVATOR BASED ON THROUGH SILICON VIAS", provisional application No. 62/891,386, filed on Aug. 25, 2019 and entitled "VERTICAL INTERCONNECT ELEVATOR BASED ON THROUGH SILICON VIAS", provisional application No. 62/903,655, filed on Sep. 20, 2019 and entitled "3D CHIP PACKAGE BASED ON THROUGH-SILICON-VIA INTERCONNECTION ELEVATOR", provisional application No. 62/964,627, filed on Jan. 22, 2020 and entitled "3D chiplet system-in-a-package using vertical-through-via connector", provisional application No. 62/983,634, filed on Feb. 29, 2020 and entitled "A Non-volatile Programmable Logic Device Based On Multichip Package", provisional application No. 63/012,072, filed on Apr. 17, 2020 and entitled "VERTICAL INTERCONNECT ELEVATOR BASED ON THROUGH SILICON VIAS" and provisional application No. 63/023,235, filed on May 11, 2020 and entitled "3D Chip Package based on Through-Silicon-Via Interconnection Elevator". The present application incorporates the foregoing disclosures herein by reference.

BACKGROUND OF THE DISCLOSURE

Field of the Disclosure

The present invention relates to a cryptography method, I/O or control circuits, hard macros and power supply for a programmable logic IC chip.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 45. The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a logic package, logic package drive, logic device, logic module, logic drive, logic disk, logic storage, logic storage drive, logic disk drive, logic solid-state disk, logic solid-state drive, Field Programmable Gate Array (FPGA) logic disk, or FPGA logic drive (to be abbreviated as "logic drive" or "logic storage" below, that is when "logic drive" is mentioned below, it means and reads as "logic package, logic package drive, logic device, logic module, logic drive, logic disk, logic disk drive, logic storage, logic storage drive, logic solid-state disk, logic solid-state drive, FPGA logic disk, or FPGA logic drive") comprising plural FPGA IC chips for field programming purposes. The logic drive is a standardized commodity device or product formed by a multichip packaging method using one or a plurality of standardized commodity FPGA IC chips, one or a plurality of non-volatile memory IC chips and/or one or a plurality of cooperating or supporting (CS) IC chips. In some cases, the logic drive further comprises one or a plurality of volatile memory IC chip in the multichip package. The logic drive is to be used for different specific applications when field programmed or user programmed. The abbreviated "logic drive" may be alternatively referred to as "logic storage", or "logic storage drive".

Another aspect of the disclosure provides a standardized commodity logic drive in a multichip package comprising one or a plurality of FPGA IC chips and one or a plurality of non-volatile memory IC chips for use in different algorithms, architectures and/or applications requiring logic, computing and/or processing functions by field programming, wherein data stored in the one or a plurality of non-volatile memory IC chips are used for configuring the one or a plurality of FPGA IC chips in the same multichip package. Uses of the standardized commodity logic drive is analogues to uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing. The multichip package may be in a 2D format with IC chips disposed on the same horizontal plane or in a 3D stacked format with chips stacked vertically with at least two stacking layers. The multichip package may be in a format with IC chips both disposed in a horizontal plane (the 2D format) and stacked in the vertical direction (the 3D format).

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 45. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The developed software codes or programs related to the innovation are used for configuring the one or a plurality of FPGA IC chips in the multichip package, and may be stored in the one or a plurality of non-volatile memory IC chips in the same multichip package. With non-volatile memory cells in the one or a plurality of non-volatile memory IC chips in the multichip package, the logic drive may be used as an alternative of the ASIC chip fabricated using advanced technology nodes. The standard commodity logic drive comprises one or a plurality of FPGA IC chips fabricated by using advanced technology nodes or generations more advanced than 20 nm or 10 nm. The innovation is implemented in the logic drive by configuring the hardware of FPGA IC chips by altering the data in the 5T or 6T SRAM cells of the programmable interconnection (configurable switches including pass/no-pass switching gates and multiplexers) and/or programmable logic circuits, cells or blocks (including LUTs and multiplexers) therein using the data stored in the non-volatile memory cells in the one or a plurality of non-volatile memory IC chips or the one or a plurality of FPGA IC chips in the multichip package. Compared to the implementation by developing a logic ASIC or COT IC chip, implementing the same or similar innovation and/or application using the logic drive may reduce the NRE cost down to smaller than US $1M by developing a software and installing it in the purchased or rented standard commodity logic drive. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 45. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, it is "club innovation platform" for club innovators only. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm or 10 nm technology nodes) and writing software programs in common programing languages, for example, C, Java, C++, C#, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or NAND flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides the standardized commodity logic drive for use as an edge device or a personal device for a user or client, wherein the user or client may install or download configuration data or information from developers or suppliers to configure the FPGA IC chips in his or her personal logic drive for applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP). The installed or downloaded configuration data or information from the developers or suppliers may be based on tiny machine learning algorithm or architecture implemented in ultra-low power machine learning technologies and approaches dealing with machine intelligence at the edge devices of the cloud. The tiny machine learning applications include machine learning architectures, techniques, tools, and approaches capable of performing on-device analytics. As an example, the on-device analytics may use a machine training mode or parameters being pruned as small as possible, and retraining is just updating the machine training model or parameters for a simple training process. The logic drive may be formatted or partitioned for configured applications using methods similar to that of formatting, assigning addresses or locations of a data storage hard disc or solid-state memory disc. The on-device analytics using logic drive at the edge of clouds provides security and privacy for the user or client. The user or client does not need to buy 10 different devices, instead, he or she just needs to buy a logic drive and decide what to install or load onto it for an application, for example, image recognition or speech recognition. When the user or client needs a smart home device, he or she does not need to keep buying new hardware for the new need. One benefit of the on-device analytics using the logic drive is that the user or client does not have to connect with the cloud so your data is private. Each configured application in the edge device (the logic drive with applications installed or downloaded therein) has a model or parameters that becomes personalized by training with the user's or client's data locally.

Another aspect of the disclosure provides a standard commodity FPGA IC chip comprising logic blocks. The logic blocks comprise (i) logic gate arrays comprising Boolean logic gates or operators, for example, NAND, NOR, AND, and/or OR logic gates or circuits; (ii) computing units comprising, for examples, adder, multiplication, shift register, floating point circuits, and/or division circuits; (iii) Look-Up-Tables (LUTs) and multiplexers. The Boolean operators, the functions of logic gates, logic operations, or a certain computing, operation or process, if reused from a previous design, may be carried out using hard wired circuits, for example, hard macros (for example, DSP slices for multiplication or division, phase locked loop (PLL) for clock generation, digital clock manager (DCM), floating-point calculator, block static random-access memory (SRAM) cells for cache memory of the logic operation, intellectual property (IP) cores and/or CPU cores based on ARM Cortex processor/controller cores. The ARM Cortex processor/controller cores may be 8, 16, 32, 64-bit or greater than 64-bit Reduced Instruction Set Computing (RISC) ARM processor/controller cores licensed from ARM Holdings. The hard macos are targeted for specific TC manufacturing technology. The hard macos are block level designs which are optimized for power or area or timing and silicon tested. While accomplishing physical design it is possible to only access I/O points of the hard macros unlike soft macros which allows us to manipulate the RTL. The hard macros are blocks that are generated using full custom design methodology and are imported into the physical design database as a Graphic Design System GDS2 file. The hard macros are used in the FPGA IC chip to accelerate the FPGA compilation by reducing the FPGA compilation time. The FPGA compilation time can be reduced by using pre-compiled circuit blocks (hard macros). Hard macros consist of previously synthesized, mapped, placed and routed circuitry that can be relatively placed with short tool runtimes and that make it possible to reuse previous computational effort. In the FPGA IC chip, the hard macro circuits couple to the logic cells or elements to perform a logic, computing or processing function. The field programmable logic cells or elements may be used for the smart interfaces or coupling (including field programmability and artificial intelligent networking) between two of the hard macro circuits on the FPGA IC chip. As an application example, the FPGA IC chip may be used as a Data Process Unit (DPU) when comprising a sea of (i) a plurality of the logic cells or elements which are field programmable, and (ii) a plurality of Central Process Unit (CPU) cores which are hard macros implemented with hard and fixed metal wires, lines or traces; wherein each CPU core is designed using one or a plurality of the ARM Cortex cores based on a Reduced Instruction Set Computing (RISC) architecture, or using a x86 CPU cores based on Complex Instruction Set Computing (CISC) architecture. The number of the plurality of Central Process Unit (CPU) cores maybe 4, 8, 16, 32, 64, 128, 256, 512, or greater than 512. A CPU core couples to one or a plurality of the logic cells or elements to perform a computing or processing function. In the DPU (FPGA) IC chip, the logic cells or elements may be used for the smart interfaces or coupling (including field programmability and artificial intelligent networking) between CPU cores of the plurality of CPU cores on the DPU (FPGA) IC chip. The logic cells or elements may be configured to provide smart interfaces, couplings or interactions (including field programmability and artificial intelligent networking) between CPU cores of the plurality of CPU cores on the DPU (FPGA) IC chip. In the DPU (FPGA) IC chip, a logic cell or element couples to first and second CPU cores through first and second interconnection schemes of the DPU (FPGA) IC chip, respectively. That is, the first CPU core couples or interfaces with the second CPU core through, in sequence, the first interconnection scheme, the logic cell or element, and the second interconnection schemes. The DPU IC chip is an embedded-FPGA (e-FPGA) IC chip and becoming a field programmable multi-core CPU, which provides a general-purpose CPU having high parallel computing or processing capability and high flexibility with artificial intelligent networking.

The hard macros couple to an input or output of the logic operator or circuit comprising a look-up table and multiplexer. Alternatively, the Boolean gates, operators or circuits, the functions of logic operators or circuits, or a certain computing, logic operation or logic process may be carried out using, for example, Look-Up-Tables (LUTs) and/or multiplexers. The Look-Up-Tables (LUTs) and/or multiplexers can also be programmed or configured as functions of, for example, DSP, microcontroller, adders, and/or multipliers. The LUTs store or memorize (i) the processing or computing results of logic functions or logic operations, for example, based on logic gates, (ii) computing results of calculations, decisions of decision-making processes, or (iii) results of operations, events or activities, for example, functions of DSP, GPU, TPU (Tensor flow Processing Unit), microcontroller. For example, LUTs and multiplexers may be configured for functions of adders, and/or multipliers. The LUTs can be used to carry out logic functions based on truth tables. In general, a logic gate, or circuit may comprise n inputs, a LUT for storing or memorizing $2^n$ corresponding data, resulting values or results, a multiplexer for selecting the right (corresponding) resulting value or result for the given n-input data set inputting at the n inputs, and I output. The LUTs may store or memorize data, resulting values or results in, for example, SRAM cells. The data, resulting values or results for the LUTs in the SRAM cells of the FPGA IC chip may be backed up and stored in the non-volatile memory cells on the FPGA IC chip or in the one or a plurality of non-volatile memory IC chips in a multichip package. One or a plurality of LUTs and multiplexers (the selection circuits) may form a logic cell or element. A FPGA IC chip may comprise one or a plurality of logic arrays each comprises a plurality of logic cells or elements.

The logic cell or element may provide freedom and flexibility to implement logic function or operation, and/or computing or processing. For a first example, the logic cell or element may comprise: (i) a logic operator or circuit comprising (a) first and second basic logic gates or circuits, each comprises a LUT and a multiplexer. Each LUT comprises 8 SRAM cells for storing 8 ($2^3$) resulting values, data or information; and each LUT is followed by a corresponding multiplexer to select a resulting value, data or information from the each LUT according to the three input data of the corresponding multiplexer, as an output data for the each LUT/multiplexer. Each basic logic gate or circuit may be configured as, for example, a NAND, NOR, AND, OR or Exclusive-OR Boolean gate, operator or circuit. Each of the first and second basic logic gates or circuits may have the output data at an output point thereof; (b) a full adder (FA) having two input data (at its input points) from the two output data of the first and second basic logic gates or circuits respectively. The full adder may have a third input point for a carry-in data from another logic cell or element at a prior computing stage. The full adder (FA) comprises two output points, one for an output data of addition computing, and the other one for carry-out for another logic cell or element at a following computing stage; (c) a LUT-selection multiplexer to select one from the two output data of the first and second basic logic gates or circuits as an output data of the LUT-selection multiplexer. The LUT-selection multiplexer comprises two input points for two input data from the two output data of the first and second basic logic gates or circuits, and selects a data from its two input data, according to a control data from an input data of the logic cell or element, as an output data at its output point; (d) an addition-selection multiplexer to select a data path (in the logic cell or element) to go through full adder or not. The addition-selection multiplexer comprises two input points for two input data from the output data of the LUT-selection multiplexer and the full adder, and selects a data from its two input data, according to a configuration data stored in a SRAM cell of the logic cell or element, as an output data at its output point. In summary, the logic operator or circuit in the first example has 5 input data (3 for the two first and second basic logic gates or circuits, 1 for the LUT-selection multiplexer and 1 for the carry-in). The logic operator or circuit in the first example has 2 output data (1 for the logic operator or circuit and 1 for the carry-out). The logic operator or circuit in the first example comprises 16 SRAM cells for storing 16 resulting values for the two LUTs and 1 SRAM cell for the addition-selection multiplexer. (ii) a flip-flop for synchronizing the output of the operator or circuits. The flip-flop has two input points, including a first input point for the output data from the operator or circuit and a second input point for the clock signal, wherein the flip-flop may generate an output data by synchronizing the output of the operator or circuits with the clock signal. (iii) a synchronization-selection multiplexer to select synchronization or asynchronization of the output data of the logic operator or circuit. The synchronization-selection multiplexer comprises two input points, including a first input point for data from the output data of the logic operator or circuit and a second input point for the output data from the flip-flop, and selects a data from its two input data, according to a configuration data stored in a SRAM cell of the logic cell or element, as an output data thereof at its output point. In summary, the logic cell or element in the first example has 6 input data (3 for the two multiplexers for the LUTs, 1 for the LUT-selection multiplexer, 1 for the carry-in and 1 for the clock signal). The logic cell or element in the first example has 2 output data (1 for the logic cell or element and 1 for the carry-out). The logic cell or element in the first example comprises 16 SRAM cells for storing 16 resulting values for the two LUTs, 1 SRAM cell for the addition-selection multiplexer and 1 SRAM cell for the synchronization-selection multiplexer.

For a second example, the logic cell or element may comprise: (i) a logic operator or circuit comprising a basic logic gate or circuit comprising a LUT and a multiplexer. The LUT comprises 16 SRAM cells for storing 16 (24) resulting values, data or information; and the LUT is followed by a corresponding multiplexer to select a resulting value, data or information from the LUT according to the four input data of the corresponding multiplexer, as an output data of the basic logic gate or circuit. The basic logic gate or circuit may be configured as, for example, a NAND, NOR, AND, OR or Exclusive-OR Boolean gate, circuit or operator. The basic logic gate or circuit may have the output data at an output point thereof. The logic operator or circuit may further comprise an input point for a carry-in data and an output point for a carry-out data; (ii) a cascade circuit comprising, for example, an AND or OR logic gate or circuit to perform an AND or OR logic operation. The cascade circuit has a first input point for the output data of the basic logic gate or circuit and a second input point for a cascade-in data from another logic cell or element at a prior computing stage. The cascade circuit may generate a cascade-out data based on performing the AND or OR logic operation on the two input data at the first and second input points of the cascade circuit; (iii) a flip-flop for synchronizing the cascade-out data. The flip-flop has two input points, including a first input point for the cascade-out data from the cascade circuit and a second input point for the clock signal, wherein the flip-flop may generate an output data by synchronizing the cascade-out data with the clock signal; (iv) a synchronization-selection multiplexer to select synchronization or asynchronization of the cascade-out data of the cascade circuit. The synchronization-selection multiplexer comprises two input points, including a first input point for the cascade-out data of the cascade circuit and a second input point for the output data from the flip-flop, and selects a data from its two input data at its first and second input points, according to a configuration data stored in a SRAM cell of the logic cell or element, as an output data thereof at its output point. The output data at the output point of the synchronization-selection multiplexer is synchronizing with the clock signal. The logic cell or element may further comprise an output point (cascade-out point), wherein the cascade-out data is bypassing the flip-flop and is not synchronizing with the clock signal. The cascade-out point may couple to the second input point for a cascade-in data of the cascade circuit of another logic cell or element in the next computing stage through fixed metal wires, lines or traces. In summary, the logic cell or element in the second example has 6 input data (4 for the LUT and multiplexer, 1 for the carry-in and 1 for the clock signal). The logic cell or element in the second example has 3 output data (1 for the logic cell or element and 1 for the carry-out and 1 for cascade-out). The logic cell or element in the second example comprises 16 SRAM cells for storing 16 resulting values for the LUT and 1 SRAM cell for the synchronization-selection multiplexer.

In the first and second examples, the flip-flop may further comprise a set input point and a reset input point for set and reset data from a set/reset circuit to control setting, resetting or no-change of the flip-flop. The clock signal is controlled by a clock circuit to control on, off or inverse of the clock signal. In the second example, the logic operator or circuit may be a look-up table (LUT) comprising 16 SRAM cells for storing 16 resulting values and a multiplexer to select a resulting value according to four inputs thereof, wherein the look-up table (LUT) and multiplexer may be configured as a full adder.

Another aspect of the disclosure provides a standard commodity FPGA IC chip with programmable interconnection, comprising cross-point switches in the middle of interconnection metal lines or traces. For example, N metal lines or traces are connected to the input terminals of the cross-point switches, and M metal lines or traces are connected to the output terminals of the cross-point switches, and the cross-point switches are located between the N metal lines or traces and the M metal lines and traces. The cross-point switches are designed such that each of the N metal lines or traces may be programed to connect to anyone of the M metal lines or traces. Each of the cross-point switches may comprise, for example, a pass/no-pass circuit comprising a n-type and a p-type transistor, in pair, wherein one of the N metal lines or traces are connected to the connected source terminals of the N-type and P-type transistor pairs in the pass-no-pass circuit, while one of the M metal lines and traces are connected to the connected drain terminal of the N-type and P-type transistor pairs in the pass-no-pass circuit. The connection or disconnection (pass or no pass) of the cross-point switch is controlled by the data (0 or 1) stored or latched in a SRAM cell. The data for the cross-point switch in the SRAM cells of the FPGA IC chip may be backed up and stored in the non-volatile memory cells in the one or a plurality of non-volatile memory IC chips in a multichip package.

Alternatively, each of the cross-point switches may comprise, for example, a pass/no-pass circuit comprising a switch buffer, wherein the switch buffer comprises two-stages of inverters (buffers), a control N-MOS, and a control P-MOS. Wherein one of the N metal lines or traces is connected to the common (connected) gate terminal of an input-stage inverter of the buffer in the pass-no-pass circuit, while one of the M metal lines and traces is connected to the common (connected) drain terminal of output-stage inverter of buffer in the pass-no-pass circuit. The output-stage inverter is stacked with the control P-MOS at the top (between $V_{cc}$ and the source of the P-MOS of the output-stage inverter) and the control N-MOS at the bottom (between $V_{ss}$ and the source of the N-MOS of the output-stage inverter). The connection or disconnection (pass or no pass) of the cross-point switch is controlled by the data (0 or 1) stored in a 5T or 6T SRAM cell. The data for the cross-point switch in the SRAM cells of the FPGA IC chip may be backed up and stored in the non-volatile memory cells in the one or a plurality of non-volatile memory IC chips in a multichip package.

Alternatively, the cross-point switches may comprise, for example, multiplexers and switch buffers. The multiplexer selects one of the N inputting data from the N inputting metal lines based on the data stored in the 5T or 6T SRAM cells (for the multiplexer); and outputs the selected one of inputs to a switch buffer. The switch buffer passes or does not pass the output data from the multiplexer to one metal line connected to the output of the switch buffer based on the data stored in the 5T or 6T SRAM cells (for the switch buffer). The switch buffer comprises two-stages of inverters (buffer), a control N-MOS, and a control P-MOS. Wherein the selected data from the multiplexer is connected to the common (connected) gate terminal of input-stage inverter of the buffer, while said one of the M metal lines or traces is connected to the common (connected) drain terminal of output-stage inverter of the buffer. The output-stage inverter is stacked with the control P-MOS at the top (between Vcc and the source of the P-MOS of the output-stage inverter) and the control N-MOS at the bottom (between Vss and the source of the N-MOS of the output-stage inverter). The connection or disconnection of the switch buffer is controlled by the data (0 or 1) stored in the 5T or 6T SRAM cell (for the switch buffer). One latched node of the 5T or 6T SRAM cell is connected or coupled to the gate of the control N-MOS transistor in the switch buffer circuit, and the other latched node of the 5T or 6T SRAM cell is connected or coupled to the gate of the control P-MOS transistor in the switch buffer circuit. The data for the multiplexer and the switch buffer in the SRAM cells of the FPGA IC chip may be backed up and stored in the non-volatile memory cells in the one or a plurality of non-volatile memory IC chips in a multichip package.

Another aspect of the disclosure provides a Floating-Gate MOS Non-Volatile Memory cell, abbreviated as "FGMOS Non-Volatile Memory" cell or "FGMOS NVM" cell. The FGMOS NVM cell may be used in the standard commodity FPGA IC chip for encryption or decryption circuits therein, for example, cryptography cross-point switches or cryptography inverters to be described below. The encryption or decryption circuit is a cryptography circuit or a security circuit. The FGMOS NVM cells are used as encryption/decryption memory cells for storing encryption/decryption information or data to program or configure encryption/decryption or security circuits in this FPGA IC chip. Alternatively, 5T or 6T SRAM cells are used as encryption/decryption memory cells for encryption/decryption information or data to program or configure the encryption-decryption circuits in this FPGA IC chip, and the data of the 5T or 6T SRAM cells are backed up and stored in the on-chip FGMOS NVM cells of this FPGA IC chip. Furthermore, 5T or 6T SRAM cells of this FPGA IC chip are used for (i) storing the resulting values, data or information for the LUTs, and (ii) storing data for configuring the programmable interconnection, as described and specified above. The data of the 5T or 6T SRAM cells are backed up and stored in the on-chip FGMOS NVM cells of this FPGA IC chip. Alternatively, the on-chip FGMOS NVM cells of this FPGA IC chip may replace the 5T or 6T SRAM cells and are used for (i) storing the resulting values, data or information for the LUTs, and (ii) storing data for configuring the programmable interconnection.

As an example, a first type of the FGMOS NVM cell may be a Floating-Gate CMOS Non-Volatile Memory cell, abbreviated as "FGCMOS NVM" cell, comprising a floating-gate P-MOS (FG P-MOS) transistor and a floating-gate N-MOS (FG N-MOS) transistor, with the floating gates of the FG P-MOS and the FG N-MOS connected, and the drains of the FG P-MOS and the FG N-MOS connected or coupled. The FG P-MOS FET and the FG N-MOS FET are planar MOSFETs, FIN Field Effective Transistors (FINFETs) or Gate-All-Around Field Effective Transistors (GAAFETs). The FG P-MOS transistor is smaller than the FG N-MOS transistor, that is, the gate capacitance of the FG N-MOS transistor is larger than or equal to 2 times the gate capacitance of the FG P-MOS transistor. The data stored in the FGCMOS NVM cell is erased by electron tunneling through the gate oxide (or insulator) between the floating gate and connected source/N-well of the FG P-MOS by (i) biased or coupled the source/N-well of the FG P-MOS with an erase voltage $V_{Er}$, (ii) biased or coupled the source/substrate (or P-well) of the FG N-MOS with a ground voltage Vss, and (iii) the connected or coupled drains are disconnected. Since the gate capacitance of the FG P-MOS transistor is smaller than that of the FG N-MOS transistor, the voltage of $V_{Er}$ is dropped largely across the gate oxide of the FG P-MOS transistor, that means the voltage difference between the floating gate and the source/N-well terminal of the FG P-MOS is large enough to cause the electron tunneling. Therefore, the electrons trapped in the floating gate are tunneling through the gate oxide of the FG P-MOS transistor and the FGCMOS NVM cell after erase is at a logic state of "1". The data is stored or programmed in the FGCMOS NVM cell by hot electron injection through the gate oxide (or insulator) between the floating gate and the channel/drain of the FG N-MOS by (i) biased or coupled the connected or coupled drains with a programming (write) voltage $V_{Pr}$, (ii) biased or coupled the source/N-well of the FG P-MOS with the programming voltage $V_{Pr}$, and (iii) biased or coupled the source/substrate (or P-well) of the FG N-MOS with aground voltage Vss. The electrons are injected to and trapped in the floating gate by the hot carrier injection through the gate oxide of the FG N-MOS, and the FGCMOS NVM cell after programming (write) is at a logic state of "0". The first type of FGMOS NVM cell uses electron tunneling for erasing and hot electron injection for programming (write). The data stored in the FGCMOS NVM cell may be read or accessed through the connected or coupled drains with the source/N-well of the FG P-MOS biased at the read, access, or operation voltage Vcc, and the source/substrate (or P-well) of the FG N-MOS biased at the ground voltage Vss. For the read, access or operation process or mode, when the floating gate is charged at a logic level of "1", the FG P-MOS transistor may be turned off and the FG N-MOS transistor may be turned on, and therefore, the ground voltage Vss at the source of the FG N-MOS is coupled to the output (the connected drain) of the FGCMOS NVM cell through a channel of the FG N-MOS transistor. Thereby, the output of the FGCMOS NVM cell may be at a logic level of "0". When the floating gate is charged at a logic level of "0", the FG P-MOS transistor may be turned on and the FG N-MOS transistor may be turned off, and therefore, the power supply voltage of Vcc at the source of the FG P-MOS is coupled to the output (the connected drain) of the FGCMOS NVM cell through a channel of the FG P-MOS transistor. Thereby, the output of the FGCMOS NVM cell may be at a logic level of "1".

As another example, a second type of the FGMOS NVM cell may be a FGCMOS cell using electron tunneling for both erasing and programming. The second type of a FGMOS NVM cell comprises a floating-gate P-MOS (FG P-MOS) transistor and a floating-gate N-MOS (FG N-MOS) transistor, with the floating gates of the FG P-MOS and the FG N-MOS connected, and the drains of the FG P-MOS and the FG N-MOS connected. The FG P-MOS FET and FG N-MOS FET are planar MOSFETs, FINFETs or GAAFETs. The FG N-MOS transistor is smaller than the FG P-MOS transistor, that is, the gate capacitance of the FG P-MOS transistor is larger than or equal to 2 times the gate capacitance of the FG N-MOS transistor. The data stored in the FGCMOS NVM cell is erased by electron tunneling through the gate oxide (or insulator) between the floating gate and the source of the FG N-MOS by (i) biased or coupled the source of the FG N-MOS with an erase voltage $V_{Er}$, (ii) biased the source/N-well of the FG P-MOS with a ground voltage Vss, and (iii) the drain of the FG N-MOS are disconnected. Since the capacitance between the floating gate and the source junction of the FG N-MOS transistor is much smaller than that of the sum of the gate capacitances of the FG P-MOS transistor and the FG N-MOS transistor, the voltage of $VE_r$ is dropped largely across the gate oxide between the floating gate and the source junction of the FG N-MOS transistor, that means the voltage difference between the floating gate and the source terminal of the FG N-MOS is large enough to cause the electron tunneling. Therefore, the electrons trapped in the floating gate are tunneling through the gate oxide between the floating gate and the source junction of the FG N-MOS transistor, and the FGCMOS NVM cell after erase is at a logic state of "1". The data is stored or programmed in the FGCMOS NVM cell by electron tunneling through the gate oxide (or insulator) between the floating gate and the channel/source of the FG N-MOS by (i) biased or coupled the source/N-well of the FG P-MOS with a programming voltage $V_{Pr}$, (ii) biased or coupled the source/substrate (or P-well) of the FG N-MOS with the ground voltage Vss, and (iii) the drain of the FG N-MOS is disconnected. Since the gate capacitance of the FG N-MOS transistor is smaller than that of the FG P-MOS transistor, the voltage of $V_{Pr}$ is dropped largely across the gate oxide of the FG N-MOS transistor, that means the voltage difference between the floating gate and the source/channel terminal of the FG N-MOS is large enough to cause the electron tunneling. Therefore, the electrons at the source/channel of the FG N-MOS transistor may tunnel through the gate oxide to the floating gate and be trapped in the floating gate. Thereby, the floating gate may be programmed to a logic level of "0". The "read", "access" or "operation" process or mode for the second type FGMOS NVM cell is the same as that of the first type.

As another example, a third type of the FGMOS NVM cell uses electron tunneling for both erasing and programming as in the above second type of the FGMOS NVM cell. The third type of a FGCMOS NVM cell may be a FGCMOS NVM cell comprising an additional floating-gate P-MOS (AD FG P-MOS) transistor in addition to the floating-gate P-MOS (FG P-MOS) transistor and the floating-gate N-MOS (FG N-MOS) transistor in the above second type of the FGMOS NVM cell. The floating gates of the FG P-MOS, the FG N-MOS and the AD FG P-MOS are connected, and the drains of the FG P-MOS and the FG N-MOS connected. The source, drain and N-well of the AD P-MOS are connected, so the AD FG P-MOS is functioning like a MOS capacitor. The FG P-MOS and FG N-MOS FETs are planar MOSFETs, FINFETs or GAAFETs. The AD FG P-MOS capacitor is formed based on a planar MOSFET or FINFET. The sizes of the FG N-MOS transistor, the FG P-MOS transistor and the AD FG P-MOS may be designed such that the functions of erase, programing (write) and read of the third type of the FGMOS NVM cell can be performed with a certain voltage biases at each of terminals. That is, the gate capacitances of the FG N-MOS transistor, the FG P-MOS transistor and the AD FG P-MOS may be designed for erase, write and read functions. In the following example for the conditions of voltage biases, the sizes of the FG N-MOS transistor, the FG P-MOS transistor and the AD FG P-MOS are assumed the same; that is, the gate capacitances of the FG N-MOS transistor, the FG P-MOS transistor and the AD FG P-MOS are assumed the same. The data stored in the FGCMOS NVM cell is erased by electron tunneling through the gate oxide (or insulator) between the floating gate and the connected source/drain/N-well of the AD FG P-MOS by (i) biased or coupled the connected source/drain/N-well of the AD FG P-MOS with an erase voltage $V_{Er}$, (ii) biased or coupled the source/N-well of the FG P-MOS with a ground voltage Vss, and (iii) biased or coupled the source/substrate (or P-well) of the FG N-MOS at a ground voltage Vss, and (iv) the connected drains of the FG P-MOS and the FG N-MOS are disconnected. Since the capacitance between the floating gate and the connected source/drain/N-well of the AD FG P-MOS is smaller than that of the sum of the gate capacitances of the FG P-MOS transistor and the FG N-MOS transistor, the voltage $V_{Er}$ is dropped largely across the gate oxide between the floating gate and the connected source/drain/N-well of the AD FG P-MOS, that means the voltage difference between floating gate and source/drain/N-well connected terminal of the AD FG P-MOS is large enough to cause the electron tunneling. Therefore, the electrons trapped in the floating gate are tunneling through the gate oxide between the floating gate and the connected source/drain/N-well of the AD FG P-MOS, and the FGCMOS NVM cell after erase is at a logic state of "1". The data is stored or programmed in the FGCMOS NVM cell by electron tunneling through the gate oxide (or insulator) between the floating gate and the channel/source of the FG N-MOS by (i) biased or coupled the source/N-well of the FG P-MOS, and the connected source/drain/N-well of the AD FG P-MOS with a programming voltage $V_{Pr}$, (ii) biased or coupled the source/substrate (or P-well) of the FG N-MOS with the ground voltage $V_{ss}$, and (iii) the drain of the FG N-MOS is disconnected. Since the gate capacitance of the FG N-MOS transistor is smaller than the sum of the gate capacitances of the FG P-MOS transistor and the AD FG P-MOS, the voltage $V_{Pr}$ is dropped largely across the gate oxide of the FG N-MOS transistor, that means the voltage difference between floating gate and source/channel terminal of the FG N-MOS is large enough to cause the electron tunneling. Therefore, the electrons at the source/channel of the FG N-MOS transistor may tunnel through the gate oxide to the floating gate and be trapped in the floating gate. Thereby, the floating gate may be programmed to a logic level of "0". The "read", "access" or "operation" process or mode for the third type FGMOS NVM cell is the same as that of the first type using the FG P-MOS transistor and the FG N-MOS transistor, except that the connected source/drain/N-well of the AD FG P-MOS may be biased or coupled to either Vcc or Vss or a given voltage between Vcc and Vss.

A fourth type of the FGMOS NVM cell comprises a floating-gate P-MOS (FG P-MOS) capacitor and a floating-gate N-MOS (FG N-MOS) transistor, with the floating gates of the FG P-MOS capacitor and the FG N-MOS transistor connected. The FG P-MOS capacitor is between the floating gate and N-well with $N^+$ region for contact. The FG N-MOS FET is a planar MOSFET, FINFET or GAAFET. The AD FG P-MOS capacitor is formed based on a planar MOSFET or FINFET. The FG P-MOS capacitor is smaller than that of the FG N-MOS transistor, for example, the gate capacitance of the FG N-MOS transistor is larger than or equal to 2 times of the gate capacitance of the FG P-MOS capacitor. The source, drain and N-well (with the $N^+$ region for contact) of the FG P-MOS capacitor are connected. The sizes of the FG N-MOS transistor, the FG P-MOS capacitor may be designed such that the functions of erase, programing (write) and read of the third type of the FGMOS NVM cell can be performed with a certain voltage biases at each of terminals. That is, the gate capacitances of the FG N-MOS transistor and the FG P-MOS capacitor may be designed for erase, write and read functions. In the following example, the voltage biases are applied at each of terminals pf the FGMOS NVM cell for the case that the size of the FG N-MOS transistor is equal to or greater than two times of the size of the FG P-MOS capacitor, that is, the gate capacitance of the FG N-MOS transistor is equal to or greater than two times of the gate capacitance of the FG P-MOS capacitor. The data stored in the FGMOS NVM cell is erased by electron tunneling through the gate oxide (or insulator) between the floating gate and the connected source/drain/N-well of the FG P-MOS capacitor by (i) biased or coupled the connected source/drain/N-well of the FG P-MOS capacitor with an erase voltage $V_{Er}$, and (ii) biased or coupled the source/substrate (or P-well) of the FG N-MOS transistor at a ground voltage Vss. Since the capacitance between the floating gate and the connected source/drain/N-well of the FG P-MOS capacitor is smaller than that of the gate capacitance of the FG N-MOS transistor, the voltage $V_{Er}$ is dropped largely across the gate oxide between the floating gate and the connected source/drain/N-well of the FG P-MOS capacitor, that means the voltage difference between floating gate and source/drain/N-well connected terminal of the FG P-MOS capacitor is large enough to cause the electron tunneling. Therefore, the electrons trapped in the floating gate are tunneling through the gate oxide between the floating gate and the connected source/drain/N-well of the FG P-MOS capacitor, and the FGMOS NVM cell after erase is at a logic state of "1". The data is stored or programmed in the FGMOS NVM cell by hot electron injection through the gate oxide (or insulator) between the floating gate and the channel/drain of the FG N-MOS transistor by (i) biased or coupled to the drain of FG N-MOS transistor with a programming (write) voltage $V_{Pr}$, (ii) biased or coupled the N-region/$N^+$-well of the FG P-MOS capacitor with the programming voltage $V_{Pr}$, and (iii) biased or coupled the source/substrate (or P-well) of the FG N-MOS with a ground voltage Vss. The electrons are injected to and trapped in the floating gate by the hot carrier injection through the gate oxide of the FG N-MOS and the FGMOS NVM cell after programming (write) is at a logic state of "0". The fourth type of FGMOS NVM cell uses electron tunneling for erasing and hot electron injection for programming (write).

Another aspect of the disclosure provides a FPGA IC chip comprising Magnetoresistive Random Access Memory cell, abbreviated as "MRAM" cell for non-volatile storage of data or information; wherein the FPGA IC chip is used in the logic drive. The MRAM cells are used for encryption or decryption circuits therein, for example, cryptography cross-point switches or cryptography inverters to be described below. The encryption or decryption circuit is a cryptography circuit or a security circuit. The MRAM cells are used as encryption/decryption memory cells for storing encryption/decryption information or data to program or configure the encryption/decryption circuits in this FPGA IC chip. Alternatively, the on-chip 5T or 6T SRAM cells are used as encryption/decryption memory cells for storing encryption/decryption information or data to program or configure the encryption/decryption circuits in this FPGA IC chip, and the data of the 5T or 6T SRAM cells are backed up and stored in the on-chip MRAM cells of this FPGA IC chip. Furthermore, on-chip 5T or 6T SRAM cells in this FPGA IC chip may be used for (i) storing the resulting values, data or information for the LUTs, and (ii) storing data for configuring the programmable interconnection, as described and specified above. The data of the 5T or 6T SRAM cells are backed up and stored in the on-chip MRAM cells of this FPGA IC chip. Alternatively, the on-chip MRAM cells of this FPGA IC chip may replace the 5T or 6T SRAM cells and are used for (i) storing the resulting values, data or information for the LUTs, and (ii) storing data for configuring the programmable interconnection. As an example, a first type of the MRAM cells uses a spin-polarized current to switch the spin of electrons, the so-called Spin Transfer Torque MRAM, STT-MRAM. The STT-MRAM cell is based on the interaction between the electron spin and the magnetic field of the magnetic layers in a Magnetoresistive Tunneling Junction (MTJ) of the STT-MRAM cell. The STT-MRAM cell mainly comprises an MTJ formed by four stacked thin layers: (i) a free magnetic layer, comprising, for example, $Co_2Fe_6B_2$. The free layer has a thickness between 0.5 nm and 3.5 nm, or 1 nm and 3 nm; (ii) a tunneling barrier layer, comprising for example, MgO. The tunneling barrier layer has a thickness between 0.3 nm and 2.5 nm, or 0.5 nm and 1.5 nm; (iii) a pinned or fixed magnetic layer comprising, for example, $Co_2Fe_6B_2$. The pinned layer has a thickness between 0.5 nm and 3.5 nm, or 1 nm and 3 nm. The pinned layer may have a similar material as that of the free layer, and (iv) a pinning layer, comprising, for example, an anti-ferromagnetic (AF) layer. The AF layer may be a synthetic layer comprising, for example, $Co/[CoPt]_4$. The direction of the magnetization of the pinned layer is pinned or fixed by the neighboring pinning layer of the AF layer. The stacked layers of the MTJ may be formed by the Physical Vapor Deposition (PVD) method using a multi-cathode PVD chamber or sputter, followed by etching to form a mesa structure of MTJ. The direction of the magnetization of the free layer or the pinned (fixed layer) may be (i) in-plane with the free or pined (fixed) layer (iMTJ) or (ii) perpendicular to the plane of the free or pinned (fixed) layer (pMTJ). The direction of magnetization of the pinned (fixed) layer is fixed by the bi-layers structure of pinned/pinning layers. The interfacing of the ferromagnetic pinned (fixed) layer and the AF pinning layer results in that the direction of ferromagnetic pinned (fixed) layer is in a fixed direction (for example, up or down in the pMTJ), and become harder to change or flip in external electromagnetic force or field. While the direction of ferromagnetic free layer (for example, up or down in the pMTJ) is easier to change or flip in external electromagnetic force or field. The change or flip the direction of the ferromagnetic free layer is used for programming the MTJ MRAM cell. The state "0" is defined when the magnetization direction of the free layer is in-parallel with or in the same direction of that of the pinned (fixed) layer, and the state "1" is defined when the magnetization direction of the free layer is anti-parallel with or in the reverse direction of that of the pinned (fixed) layer. To write "0", electrons are tunneling from the pinned layer to the free layer. When electrons flow through the pinned or fixed layer, the electron spins will be aligned in-parallel with the magnetization direction of the pinned (fixed) layer. When the tunneling electrons with aligned spins flowing in the free layer, (i) the tunneling electrons may be passing through the free layer if the aligned spins of the tunneling electrons are in-parallel with that of the free layer, (ii) the tunneling electrons may flip or change the direction of the magnetization of the free layer to a direction in-parallel with the fixed layer using the spin torque of the electrons if the aligned spins of the tunneling electrons are not in-parallel with that of the free layer. After writing "0", the direction of the magnetization of the free layer is in-parallel with that of the fixed layer. To write "1" from the original "0", electrons are tunneling from the free layer to the pinned (fixed) layer. Since the directions of the magnetizations of the free layer and the pinned (fixed) layer are the same, the electrons with majority of spin polarity (in-parallel with the magnetization direction of the pinned layer) may flow and pass the pinned (fixed) layer, only electrons with minority spin polarity (not in-parallel with the magnetization direction of the pinned layer) may be reflected from pinned (fixed) layer and back to the free layer. The spin polarity of reflected electrons is in the reverse direction of the magnetization of the free layer, and may flip or change the direction of the magnetization of the free layer to a direction reverse-parallel to the fixed layer using the spin torque of the electrons. After writing "1", the direction of the magnetization of the free layer is anti-parallel to that of the fixed layer. Since write "1" is using the minority spin polarity electrons, a larger current flow through MTJ is required as compared to write "0".

Based on the magnetoresistance theory, the resistance of a MTJ is at low resistance state (LR), the "0" state, when the direction of the magnetization of the free layer is in-parallel with the direction of that of the fixed layer, at high resistance state (HR), the "1" state, when the direction of the magnetization of the free layer is anti-parallel with the direction of that of the fixed layer. The two states of resistance may be used in read the MTJ MRAM cell.

As another example, a second type of MRAM cells on the standard commodity FPGA IC chip is a Spin-Orbit Torque Magnetoresistive Random Access Memory cell, abbreviated as "SOT MRAM" cell, for non-volatile storage of data or information; wherein the standard commodity FPGA IC chip is used in the logic drive. The Spin-Orbit Torque MRAM cell (SOT MRAM) is based on the interaction between the electron spin and the orbit of the heavy metal layer (for example, platinum (Pt), tantalum (Ta), gold (Au), tungsten (W) or palladium (Pd)). The SOT MRAM cell comprises the Magnetic Tunneling Junction (MTJ) similar to that in the STT MRAM cell. A heavy metal layer (for example, platinum (Pt), tantalum (Ta), gold (Au), tungsten (W) or palladium (Pd)) is deposited over the free layer of the MTJ. The core of the SOT-MRAM is a magnetic tunnel junction (MTJ) in which a thin dielectric layer is sandwiched between a magnetic fixed layer and a magnetic free layer, as described above. The SOT-MRAM device features switching spin polarization or magnetization direction of the free magnetic layer done by injecting an in-plane current in an adjacent SOT layer (the heavy metal layer). The interaction of the in-plane injected electrons in the SOT layer are interacting with the orbits of the heavy metal in the SOT layer based on the Rashba and Spin Hall Effect (SHE). The induced spin polarization creates a net torque on the adjacent free layer to change its magnetization state. That is, to write or program the SOT MRAM cell, an in-plane current is injected to the SOT heavy metal layer. To read the SOT MRAM cell, the mechanism and operation is similar to that of the STT MRAM cells.

Another aspect of the disclosure provides a method and device enabling innovators in to realize or implement their innovation using the advanced semiconductor technology nodes (for example, more advanced than 20 nm or 10 nm), without a need to develop an expensive ASIC or COT chip using the advanced semiconductor technology nodes. The method provides a logic drive in a multichip package comprising one or a plurality of standard commodity FPGA IC chips and one or a plurality of NVM IC chips. Each of the one or a plurality of standard commodity FPGA IC chips comprising an encryption/decryption circuit (cryptography circuit or a security circuit). The hardware of circuits of the cryptography circuits provides a cryptography method for the innovators (the FPGA developers) to protect their developed software or firmware for implementing their innovation or applications. As described above, the innovators may implement their innovation, architecture, algorithm and/or applications by configuring the data or information in the memory cells (for example, SRAM cells) of LUTs for logic operations and/or of configurable switches for programmable interconnections in the one or the plurality of FPGA chips. The encrypted configuration data or information for the FPGA IC chip may be input or loaded from outside of the FPGA IC chip, for example, from a NAND or NOR flash IC chip packaged in the same logic drive, or may be from circuits or devices outside of the logic drive. A cryptography technique is required to protect the developed configuration data or information (related to the innovation, architecture, algorithm and/or applications) for the one or a plurality of FPGA IC chips in the logic drive. The logic drive in the multichip package becomes a nonvolatile programmable device with security when comprising (i) one or a plurality of NVM IC chips to store and back the configuration data for configuring the one or a plurality of standard commodity FPGA IC chips in the same multichip package; and (ii) the one or a plurality of standard commodity FPGA IC chips comprising the cryptography or security circuits.

Another aspect of the disclosure provides a standard commodity FPGA IC chip comprising an encryption/decryption circuit (cryptography circuit or a security circuit), wherein the encryption/decryption circuit comprises a cryptography cross-point switch in a matrix format in the middle of interconnection metal lines or traces. The hardware of circuits of the cryptography cross-point switches in a matrix format provides a cryptography method for FPGA developers to protect their developed software or firmware for implementing their innovation or applications. As described above, the innovators may implement their innovation, architecture, algorithm and/or applications by configuring the data or information in the memory cells (for example, SRAM cells) of LUTs for logic operations and/or cross-point switches for programmable interconnections in the FPGA chips. The configuration data or information for a FPGA IC chip may be input or loaded from outside of the FPGA IC chip, for example, from a NAND or NOR flash IC chip packaged in the same logic drive, or may be from circuits or devices outside of the logic drive. A cryptography technique is required to protect the developed configuration data or information (related to the innovation, architecture, algorithm and/or applications) for a FPGA IC chip. For example, the stream of configuration data or information is input into the FPGA IC chip through N I/O pads/circuits. There are N metal lines or traces each coupling to one of the N I/O pads/circuits. The N metal lines or traces are connected to the input terminals of the cryptography cross-point switch matrix, and M metal lines or traces are connected to the output terminals of the cryptography cross-point switch matrix, and the cryptography cross-point switches are located between the N metal lines or traces and the M metal lines and traces, wherein N=M. The cryptography cross-point switches are designed such that each of the N metal lines or traces may be programed to connect to one and only one of the M metal lines or traces. The cryptography cross-point switches are bi-directional, the signals or data may propagate in the reverse direction, that is, from the output terminal of the cryptography cross-point switches to the input terminals of the cryptography cross-point switches. The cryptography cross-point switch matrix re-organizes the order or sequence of the input signals or data at its outputs based on the on-off (pass/no-pass) state of the cryptography cross-point switch at the intersection of an input interconnect and an output interconnect, wherein the on-off (pass/no-pass) state of the cryptography cross-point switch is controlled by the data or information stored in the corresponding non-volatile memory cell. The corresponding non-volatile memory cell may be the floating-gate non-volatile memory cell, the FGMOS NVM cell, as the three types of FGMOS NVM cells described above. Alternatively, the corresponding non-volatile memory cell may be the MRAM cell, as the two types of MRAM cells (STT UMRAM or SOT MRAM) as described above. Alternatively, the corresponding non-volatile memory cell may be a Resistive Random Access Memory cell, abbreviated as "RRAM" cell, for non-volatile storage of data or information for configuring or controlling the cryptography circuits. The data or information of the corresponding non-volatile memory cells may be used as a password or a key to encrypt or decrypt the signal and data stream at two terminals of the cryptography cross-point switch matrix. The data or information stored in the nonvolatile memory cells for use in controlling the pass/no-pass of the cryptography cross-point switches is the password or key for the FPGA IC chip. The encrypted N input signals or data stream are inputting to the cryptography cross-point switch matrix, and are decrypted by the cryptography cross-point switch matrix, and are output as the decrypted M output signals or data stream for use as configuration data or information to program the SRAM cells in the LUTs (for logic operations) or programmable interconnection of a FPGA IC chip. In a reverse direction, the decrypted signals or data stream from the SRAM cells in the LUTs (for logic operations) or programmable interconnection of a FPGA IC chip are input at the M metal lines or traces and encrypted by the cryptography cross-point switch matrix, and are output as encrypted signals or data stream at the N metal lines or traces for circuits outside the FPGA IC chip. The cryptography cross-point switches may be represented by a N×N matrix. For a case that the cryptography cross-point switches in a N×N matrix format, there are (N!−1) possible choices or selections of the passwords or keys. For N=8, there are 40,319 (=8!−1) possible passwords or keys. The key or password comprises $N^2$ ($8^2$) bits of data stored in the on-chip non-volatile memory cells, for example FGMOS non-volatile memory cells, MRAM memory cells or RRAM memory cells.

Another aspect of the disclosure provides a standard commodity FPGA IC chip comprising an encryption/decryption circuit (cryptography circuit or a security circuit), wherein the encryption/decryption circuit comprises a cryptography inverter in a N×1 or 1×N matrix in the middle of interconnection metal lines or traces. The hardware of circuits of the cryptography inverters in a N×1 or 1×N matrix format provides a cryptography method for FPGA developers to protect their developed software or firmware for implementing their innovation or applications. As described above, the innovators may implement their innovation, architecture, algorithm and/or applications by configuring the data or information in the memory cells (for example, SRAM cells) of LUTs for logic operations and/or switches for programmable interconnections in the FPGA chips. The configuration data or information for a FPGA IC chip may be input or loaded from outside of the FPGA IC chip, for example, from a NAND or NOR flash IC chip packaged in the same logic drive, or may be from circuits or devices outside of the logic drive. A cryptography technique is required to protect the developed configuration data or information (related to the innovation, architecture, algorithm and/or applications) for a FPGA IC chip. For example, the configuration data or information is input into the FPGA IC chip through N I/O pads/circuits. There are N metal lines or traces each coupling to one of the N I/O pads/circuits. The N metal lines or traces are connected to the input terminals of the cryptography inverter matrix, and M metal lines or traces are connected to the output terminals of the cryptography inverter matrix, and the cryptography inverters are located between the N metal lines or traces and the M metal lines and traces, wherein N=M. The cryptography inverters are designed such that each of the N metal lines or traces may be programed to have input signals or data from the N metal lines inverted or non-inverted at the output to the corresponding one of the M metal lines or traces. The cryptography inverters are bi-directional, the signals or data may propagate in the reverse direction, that is, from the output terminal of the cryptography inverter matrix to the input terminals of the cryptography inverter matrix. The cryptography inverter matrix re-configures the states of the input signals or data at its outputs based on the inverted state or non-inverted state of the cryptography inverter, wherein the inverted or non-inverted state of the cryptography inverter is controlled by the data or information stored in the corresponding non-volatile memory cell. The corresponding non-volatile memory cell may be the floating-gate non-volatile memory cell, the FGMOS NVM cell, as described above. Alternatively, the corresponding non-volatile memory cell may be the MRAM cell, as the two types of MRAM cells (STU MRAM or SOT MRAM) described above. Alternatively, the corresponding non-volatile memory cell may be a Resistive Random Access Memory cell, abbreviated as "RRAM" cell, for non-volatile storage of data or information for configuring or controlling the cryptography circuits. The data or information of the corresponding non-volatile memory cells may be used as a password or a key to encrypt or decrypt the signals and data at two terminals of the cryptography inverter matrix. The data or information stored in the nonvolatile memory cells for use in controlling the invert/non-invert of the cryptography inverters is the password or key for the FPGA IC chip. The encrypted N input signals or data stream are inputting to the cryptography inverter matrix through the N metal lines or traces, and are decrypted by the cryptography inverter matrix, and are then output as the M output signals or data stream for use as configuration data or information to program the SRAM cells in the LUTs (for logic operations) or configuration switches for programmable interconnection of a FPGA IC chip. In a reverse direction, the decrypted signals or data stream from the SRAM cells in the LUTs (for logic operations) or configuration switches for programmable interconnection of a FPGA IC chip are input at the M metal lines or traces and are encrypted by the cryptography inverter matrix, and are output as encrypted signals or data stream at the N metal lines or traces for circuits outside the FPGA IC chip. The cryptography inverters may be represented by a 1×N or N×1 matrix. For a case that the cryptography inverters in a N×1 or 1×N matrix format, there are ($2^N$−1) possible choices or selections of the passwords or keys. For N=8, there are 255 (=$2^8$−1) possible passwords or keys. The key or password comprises N (8) bits of data stored in the on-chip non-volatile memory cells, for example FGMOS non-volatile memory cells, MRAM memory cells or RRAM memory cells.

Another aspect of the disclosure provides a standard commodity FPGA IC chip comprising an encryption/decryption circuit (cryptography circuit or a security circuit), wherein the encryption/decryption circuit comprises the cryptography cross-point switches in a matrix format in series with the cryptography inverters in a N×1 or 1×N matrix format in the middle of interconnection metal lines or traces. The cryptography cross-point switches in a matrix format and the cryptography inverters in a N×1 or 1×N matrix format are as described above. The cryptography cross-point switches in a matrix format may be placed in series before the cryptography inverters in a N×1 or 1×N matrix format, that is, the inputs of cryptography cross-point switches are connected to the inputting N-metal line, and the outputs of cryptography inverters are connected to the M-metal line, wherein N=M. Alternatively, the cryptography cross-point switches in a matrix format may be placed in series after the cryptography inverters in a N×1 or 1×N matrix format, that is, the inputs of cryptography inverters are connected to the inputting N-metal line, and the outputs of cryptography cross-point switches are connected to the M-metal line, wherein N=M. The hardware of circuits of the cryptography cross-point switches in a matrix format in series with cryptography inverters in a N×1 or 1×N matrix format provide a cryptography method for FPGA developers to protect their developed software or firmware for implementing their innovation or applications. For a case that the cryptography cross-point switches in a N×N matrix format are placed in series with the cryptography inverters in a N×1 or 1×N matrix format, there are ($N!2^N$−1) possible choices or selections of the passwords or keys. For N=8, there are 10,321,919 ($8!2^N$−1) possible passwords or keys. The key or password comprises $N^2$+N ($8^2$+8) bits of data stored in the on-chip non-volatile memory cells, for example FGMOS non-volatile memory cells, MRAM memory cells or RRAM memory cells. The FPGA IC chip in the logic drive may have the encryption logic (based on the on-chip cryptography or security circuit) using a 128, 256, 512 or 1024-bit encryption key.

Another aspect of the disclosure provides logistics and procedures in encrypting/decrypting FPGA IC chips in the standard commodity logic drive. The logic drive comprises a FPGFA IC chip with cryptography circuits and a non-volatile memory (NVM) IC chip, and is packaged in a multichip package. The logic drive in the multichip package is a non-volatile programmable logic device with security. The non-volatile memory IC chip may be a NOR or NAND flash chip, MRAM IC chip or RRAM IC chip. The multichip package may be in a 2D format with the FPGA IC chip and the NVM IC chip disposed on the same horizontal plane or in a stacked format with the FPGA IC chip and the NVM IC chip stacked vertically. The current semiconductor IC companies, when facing the presence of the standard commodity logic drive, may adapt the following business models: (1) still keeping as hardware companies by selling the hardware of software-loaded standard commodity logic drives without performing ASIC or COT IC chip design and/or production. They may purchase the standard commodity logic drives, and develop software or firmware to configure the standard commodity FPGA IC chips in the logic drives; and/or (2) become software companies to develop and sell software or firmware to configure the standard commodity FPGA IC chips in the logic drives for their innovation or application, and let their customers or users to install the purchased software or firmware in the customers' or users' own standard commodity logic drive.

In the business model (1), the developers may adapt following procedures when using the cross-point switches as the cryptography circuit: (i) during the developing stage of the FPGA IC chip in the developers' own standard commodity logic drive, the developers may set up a cryptography key or password in a N×N matrix with 1's in the diagonal, and all other elements are 0's, wherein the a cryptography key or password (the N×N matrix) is stored in the NVM cells (FGMOS, MRAM or RRAM as mentioned or described above) on the FPGA IC chip. The data used to configure the FPGA IC chip are stored and backed-up in the NVM IC chip in the same multichip package; (ii) After the FPGA IC chip is completely developed and before selling the logic drive to customers or users, the developers may encrypt/decrypt the FPGA IC chip by setting up a cryptography key or password in a N×N matrix hiving only one l's randomly in each row and each column, wherein the cryptography key or password (the N×N matrix) is stored in the NVM cells (FGMOS, MRAM or RRAM as mentioned or described above) on the FPGA IC chip. Alternatively, wherein the cryptography key or password (the N×N matrix) is stored, by one-time programming, in the NVM cells comprising the e-fuses or anti-fuses on the FPGA IC chip. The encrypted configuration data are stored in the NVM IC chip in the multichip package, and are decrypted by the cryptography circuit on the FPGA IC chip using the on-chip cryptography key or password. The decrypted configuration data is loaded to the SRAM cells for configuring the LUTs and/or programmable switches of the FPGA IC chip. Therefore, there are (N!−1) possible choices or selections of the N×N matrixes determined by the passwords or keys in the non-volatile memory cells on the FPGA IC chip. For N=8, there are 40,319 (8!−1) possible N×N matrixes, passwords or keys.

Alternatively, the developers may adapt following procedures when using the inverters as the cryptography circuit: (i) during the developing stage of the FPGA IC chip in the developers' own standard commodity logic drive, the developers may set up a cryptography key or password in a 1×N or N×1 matrix with 1's for all elements; (ii) After the FPGA IC chip is completely developed and before selling to the customers or users, the FPGA IC chip is encrypted/decrypted by setting up a cryptography key or password in a 1×N or N×1 matrix having randomly 1 or 0 for any element, wherein the cryptography key or password (the 1×N or N×1 matrix) is stored in the NVM cells (FGMOS, MRAM or RRAM as mentioned or described above) on the FPGA IC chip. Alternatively, wherein the cryptography key or password (the 1×N or N×1 matrix) is stored, by one-time programming, in the NVM cells comprising the e-fuses or anti-fuses on the FPGA IC chip. Therefore, there are ($2^N$−1) possible choices or selections of the 1×N or N×1 matrixes for the cryptography passwords or keys. For N=8, there are 255 ($2^8$−1) possible 1×N or N×1 matrixes, cryptography passwords or keys. All other specification for using the inverters as the cryptography circuit are the same as that described for using the cross-point switches as the cryptography circuit. In case that the cryptography cross-point switches in a matrix format is in series with the cryptography inverters in a N×1 or 1×N matrix format, the logistics and procedures in encrypting/decrypting the FPGA IC chip in the logic drive is the combination of that for using the cross-point switches as the cryptography circuit (described and specified above) and that for using the inverters as the cryptography circuit (described and specified above). There are (N!$2^N$−1) possible cryptography passwords or keys for the case. For N=8, there are 10,321,919 (8!$2^8$−1) possible cryptography passwords or keys. Only using the correct cryptography password or key, the users can operate the FPGA IC chip by obtaining the correct function of the LUTs and the programmable interconnection. Since the cryptography password or key is chosen and stored in the non-volatile memory cells of the FPGA IC chip by the FPGA developers, the configuration data or information are securely protected. The developers may sell the standard commodity logic drive with loaded (encrypted) configuration data or information in the NVM IC chip in the logic drive and with the cryptography password or key installed in the non-volatile memory cells of the FPGA IC chip in the same logic drive Alternatively, the developers may adapt following procedures when using the inverters as the cryptography circuit: (i) during the developing stage of the FPGA IC chip in the developers' own standard commodity logic drive, the developers may set up a cryptography key or password in a 1×N or N×1 matrix with 1's for all elements; (ii) After the FPGA IC chip is completely developed and before selling to the customers or users, the FPGA IC chip is encrypted/decrypted by setting up a cryptography key or password in a 1×N or N×1 matrix having randomly 1 or 0 for any element. Therefore, there are ($2^N$−1) possible choices or selections of the 1×N or N×1 matrixes for the cryptography passwords or keys. For N=8, there are 255 ($2^8$−1) possible 1×N or N×1 matrixes, cryptography passwords or keys. All other specification for using the inverters as the cryptography circuit are the same as that described for using the cross-point switches as the cryptography circuit. In case that the cryptography cross-point switches in a matrix format is in series with the cryptography inverters in a N×1 or 1×N matrix format, the logistics and procedures in encrypting/decrypting the FPGA IC chip in the logic drive is the combination of that for using the cross-point switches as the cryptography circuit (described and specified above) and that for using the inverters as the cryptography circuit (described and specified above). There are (N!$2^N$−1) possible cryptography passwords or keys for the case. For N=8, there are 10,321,919 (8!$2^8$−1) possible cryptography passwords or keys. Only using the correct cryptography password or key, the users can operate the FPGA IC chip by obtaining the correct function of the LUTs and the programmable interconnection. Since the cryptography password or key is chosen and stored in the non-volatile memory cells of the FPGA IC chip by the FPGA developers, the configuration data or information are securely protected. The developers may sell the standard commodity logic drive with loaded (encrypted) configuration data or information in the NVM IC chip in the logic drive and with the cryptography password or key installed in the non-volatile memory cells of the FPGA IC chip in the same logic drive In the business model (2), the developers may develop the configuration data, information, software or firmware using the FPGA IC chip in their own standard commodity logic drive. After completed the development, the developers may sell to the user or customer the software or firmware comprising encrypted configuration data or information for configuring the FPGA IC chip in the user's own standard commodity logic drive. The user or customer may configure the FPGA IC chips in the user's own standard commodity logic drive through network installation by, for example, downloading a file or executable program comprising (a) a user-specific password or key to be installed in the non-volatile memory cells for cryptography circuits (cryptography cross-point switches and/or cryptography inverters) of the FPGA IC chips in the user's own standard commodity logic drive; and (b) the configuration data or information to be installed in the NAND or NOR flash memory IC chip in the user's own standard commodity logic drive, wherein the configuration data or information are encrypted according to the user-specific password or key. The downloaded file or executable program may be a temporary file temporarily stored in the user's own terminal device (for example, computers or mobile phones) and maybe deleted after finishing the above installations.

The FPGA IC chip in the logic drive comprises the cryptography password or key stored in the on-chip non-volatile memory cells, for example FGMOS non-volatile memory cells, MRAM memory cells or RRAM memory cells. Alternatively, the FPGA IC chip in the logic device may store the cryptography password or key in dedicated RAM cells on the FPGA IC chip, wherein the dedicated RAM cells may be backed up by a small externally connected battery. Alternatively, an e-fuse or anti-fuse on the FPGA IC chip may be used to store the cryptography password or key. The e-fuse or the anti-fuse is a one-time programing memory, and may be programmed to store the cryptography password or key. The e-fuse comprises a narrow neck in a metal trace or line of the interconnection metal lines or traces in the metal interconnection scheme of the FPGA IC chip. When programming the cryptography password or key, selected fuse is cut and broken at the narrow neck by applying high currents through the selected e-fuse. A first type anti-fuse comprises a thin oxide window between two terminals or electrodes. when programming the cryptography password or key, the two terminals or electrodes of the selected first type anti-fuse are shorted by applying high voltage between two terminals or electrodes of the anti-fuse to break the oxide in the oxide window. A second type anti-fuse comprises a short channel between the source and drain of a MOSFET on the FPGA IC chip of the logic drive. When programming the cryptography password or key, the source and drain of the selected second type anti-fuse is shorted by a punch-through current by applying high voltage between source and drain. The purposes, usages, functions and applications of the dedicated RAMs with battery, e-fuses and the first and second types of anti-fuses are the same or similar to that of FGMOS NVM cells, MRAM cells and RRAM cells on the FPGA IC chip in the multichip logic drive.

Another aspect of the disclosure provides a logic drive in a multichip package comprising a standard commodity FPGA IC chip, an NVM IC chip, and a cooperating or supporting (CS) IC chip, wherein the cooperating or supporting IC chip is a cryptography or security IC chip. The cryptography or security circuits (encryption/decryption circuits, cryptography key or password) on the FPGA IC chip (as described and specified above) may be separated from the FPGA IC chip to form as the cooperating or supporting IC chip. The cryptography or security IC chip comprises non-volatile memory cells comprising the FGMOS NVM cells, MRAM cells, RRAM cells, e-fuses or anti-fuses; the functions, purposes of the above non-volatile memory cells are the same as that described and specified on the FPGA IC chip. The FPGA IC chip, NVM IC chip, and cooperating or supporting IC chip may be disposed on a same horizontal plane in the 2D multichip package or may be stacked vertically in 2 layers or 3 layers in the 3D multichip package. The cooperating or supporting IC chip (the cryptography or security IC chip) may be designed and implemented using a technology node more mature or less advanced than the FPGA IC chip. For example, the FPGA IC chip maybe designed and implemented using a technology node more advanced than 20 nm or 10 nm, while the cryptography or security IC chip may be designed and implemented using a technology node less advanced than 20 nm or 30 m. The semiconductor technology node used to fabricate the FPGA IC chip is more advanced than that used to fabricate the cryptography or security IC chip. For example, the FPGA IC chip may be designed and implemented using FINFET or Gate-All-Around FET (GAAFET) transistors, while the cryptography or security IC chip may be designed and implemented using conventional planar MOSFET transistors. The cryptography or security circuits (encryption/decryption circuits, cryptography key or password, as described and specified above) on the cryptography or security IC chip are used for security of the configuration data or information in the SRAM cells of the FPGA IC chip in the same multichip package. The purposes, functions and specifications of the FPGA IC chip, NVM IC chip and the cryptography or security IC chip in the multichip package are as described above. The logic drive in the multichip package becomes a nonvolatile programmable device with security when comprising (i) then FPGA IC chip; (ii) the NVM IC chips to store and back the configuration data for configuring the standard commodity FPGA IC chip in the same multichip package; and (iii) the cryptography or security IC chip comprising the cryptography or security circuits for security of the configuration data or information in the SRAM cells of the FPGA IC chip.

Another aspect of the disclosure provides a logic drive in a multichip package comprising a standard commodity FPGA IC chip, an NVM IC chip, and a cooperating or supporting IC chip, wherein the cooperating or supporting IC chip is an I/O or control chip. I/O or control circuits on the FPGA IC chip (as described and specified above) may be separated from the FPGA IC chip to form as the cooperating or supporting IC or control chip. The FPGA IC chip, NVM IC chip, and cooperating or supporting IC chip may be disposed on a same horizontal plane in the 2D multichip package or may be stacked vertically in 2 layers or 3 layers in the 3D multichip package. The cooperating or supporting IC chip (the I/O or control chip) may be designed and implemented using a technology node more mature or less advanced than the FPGA IC chip. For example, the FPGA IC chip may be designed and implemented using a technology node more advanced than 20 nm or 10 nm, while the I/O or control IC chip may be designed and implemented using a technology node less advanced than 20 nm or 30 nm. The semiconductor technology node used to fabricate the FPGA IC chip is more advanced than that used to fabricate the I/O or control chip. For example, the FPGA IC chip may be designed and implemented using FINFET or GAAFET transistors, while the I/O or control IC chip may be designed and implemented using conventional planar MOSFET transistors. The purposes, functions and specifications of the FPGA IC chip, NVM IC chip and the I/O or control chip in the multichip package are as described above.

When the I/O or control circuits on the FPGA IC chip (as described and specified above) are separated from the FPGA IC chip to form as the cooperating or supporting IC chip, the I/O or control chip, the FPGA IC chip may become a standard commodity product. The standard commodity FPGA IC chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm; with a chip size and manufacturing yield optimized with the minimum manufacturing cost for the used semiconductor technology node or generation. The I/O or control chip may be fabricated used mature or less advanced technology nodes, for example, less advanced than 20 nm or 30 m. Transistors used in the advanced semiconductor technology node or generation for the FPGA IC chip may be a FIN Field-Effect-Transistor (FINFET), a FINFET on Silicon-On-Insulator (FINFET SOI) or a GAAFET. The standard commodity FPGA IC chip may only communicate or couple directly with other chips in or of the logic drive only; its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.1 pF and 2 pF or 0.1 pF and 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. The size of the ESD device may be between 0.05 pF and 2 pF or 0.05 pF and 1 pF. All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in the I/O or control chip packaged in the same logic drive. None or minimal area of the standard commodity FPGA IC chip is used for the control or I/O circuits, for example, less than 15%, 10%, 5%, 2% or 1% area (not counting the seal ring and the dicing area of the chip; that means, only including area upto the inner boundary of the seal ring) is used for the control or I/O circuits; or, none or minimal transistors of the standard commodity FPGA IC chip are used for the control or I/O circuits, for example, less than 15%, 10%, 5%, 2% or 1% of the total number of transistors are used for the control or I/O circuits; or all or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95% or 99% area (not counting the seal ring and the dicing area of the chip; that means, only including area upto the inner boundary of the seal ring) is used for logic blocks, and/or programmable interconnection; or, all or most transistors of the standard commodity FPGA IC chip are used for logic blocks or repetitive arrays, and/or programmable interconnection, for example, greater than 85%, 90%, 95% or 99% of the total number of transistors are used for logic blocks, and/or programmable interconnection.

The cooperating or supporting chip (the I/O or control chip) is designed, implemented and fabricated using varieties of semiconductor technology nodes or generations, including old or matured technology notes or generations, for example, a semiconductor note or generation less advanced than or equal to, or above or equal to 20 nm, 30 nm, 40 nm, 50 nm, 90 nm, 130 nm, 250 nm, 350 nm, or 500 nm. The semiconductor technology node or generation used in the I/O or control chip is 1, 2, 3, 4, 5 or greater than 5 notes or generations older, more matured or less advanced than that used in the standard commodity FPGA IC chip packaged in the same logic drive. Transistors used in the I/O or control chip may be a Fully Depleted Silicon-on-insulator (FDSOI) MOSFET, a Partially Depleted Silicon-on-insulator (PDSOI) MOSFET or a conventional planar MOSFET. Transistors used in the I/O or control chip may be different from that used in the standard commodity FPGA IC chips packaged in the same logic drive; for example, the I/O or control chip may use the conventional planar MOSFET, while the standard commodity FPGA IC chip packaged in the same logic drive may use the FINFET or GAAFET. The power supply voltage (Vcc) used in the I/O or control chip may be greater than or equal to 1.5V, 2.0 V, 2.5V, 3 V, 3.5V, 4V, or 5V, while the power supply voltage (Vcc) used in the standard commodity FPGA IC chips packaged in the same logic drive may be smaller than or equal to 2.5V, 2V, 1.8V, 1.5V, or 1 V. The power supply voltage used in the I/O or control chip may be different from that used in the standard commodity FPGA IC chip packaged in the same logic drive; for example, the I/O or control chip may use a power supply of 4V, while the standard commodity FPGA IC chip packaged in the same logic drive may use a power supply voltage of 1.5V; or the I/O or control chip may use a power supply of 2.5V, while the standard commodity FPGA IC chip packaged in the same logic drive may use a power supply of 0.75V. The gate oxide (physical) thickness of the Field-Effect-Transistors (FETs) may be thicker than or equal to 5 nm, 6 nm, 7.5 nm, 10 nm, 12.5 nm, or 15 nm, while the gate oxide (physical) thickness of FETs used in the standard commodity FPGA IC chip packaged in the same logic drive may be thinner than 4.5 nm, 4 nm, 3 nm or 2 nm. The gate oxide (physical) thickness of FETs used in the I/O or control chip may be different from that used in the standard commodity FPGA IC chip packaged in the same logic drive; for example, the I/O or control chip may use a gate oxide (physical) thickness of FETs of 10 nm, while the standard commodity FPGA IC chip packaged in the same logic drive may use a gate oxide (physical) thickness of FETs of 3 nm; or the I/O or control chip may use a gate oxide (physical) thickness of FETs of 7.5 nm, while the standard commodity FPGA IC chip packaged in the same logic drive may use a gate oxide (physical) thickness of FETs of 2 nm. The I/O or control chip provides inputs and outputs, and ESD protection for the logic drive. The I/O or control chip provides (i) large drivers or receivers, or I/O circuits for communicating or coupling with external or outside (of the logic drive), and (ii) small drivers or receivers, or I/O circuits for communicating or coupling with chips in or of the logic drive. The large drivers or receivers, or I/O circuits for communicating or coupling with external or outside (of the logic drive) have driving capability, loading, output capacitance or input capacitance lager or bigger than that of the small drivers or receivers, or I/O circuits for communicating or coupling with chips (for example, the FPGA IC chip in the same multichip package) in or of the logic drive. The driving capability, loading, output capacitance, or input capacitance of the large I/O drivers or receivers, or I/O circuits for communicating or coupling with external or outside (of the logic drive) may be between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. Each of the large input/output (I/O) circuits may have an I/O power efficiency greater than 3, 5 or 10 pico-Joules per bit, per switch or per voltage swing. The driving capability, loading, output capacitance, or input capacitance of the small I/O drivers or receivers, or I/O circuits for communicating or coupling with chips (for example, the FPGA IC chip in the same multichip package) in or of the logic drive may be between 0.1 pF and 5 pF or 0.1 pF and 2 pF; or smaller than 10 pF, 5 pF, 3 pF, 2 pF or 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. The size of ESD protection device on the I/O or control chip is larger than that on other standard commodity FPGA IC chip in the same logic drive. The size of the ESD device in the large I/O circuits may be between 0.5 pF and 20 pF, 0.5 pF and 15 pF, 0.5 pF and 10 pF 0.5 pF and 5 pF or 0.5 pF and 2 pF; or larger than 0.5 pF, 1 pF, 2 pF, 3 pF, 5 pF or 10 pF. For example, a bi-directional (or tri-state) I/O pad or circuit may be used for the large I/O drivers or receivers, or I/O circuits for communicating or coupling with external or outside circuits (of the logic drive), and may comprise an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. For example, a bi-directional (or tri-state) I/O pad or circuit may be used for the small I/O drivers or receivers, or I/O circuits for communicating or coupling with chips in or of the logic drive, and may comprise an ESD circuit, a receiver, and a driver, and may have an input capacitance or output capacitance between 0.1 pF and 5 pF or 0.1 pF and 2 pF; or smaller than 10 pF, 5 pF, 3 pF, 2 pF or 1 pF.

Furthermore, the power supply voltage (Vcc) used in the I/O or control chip may have a voltage at the same level as that of the FPGA IC chip in addition to the voltage (as mentioned and described above) higher than that of the FPGA IC chip. The higher voltage in the I/O or control chip is for use in the large drivers or receivers, or I/O circuits for communicating or coupling with external or outside circuits (of the logic drive), while the lower voltage in the I/O or control chip is for use in the small drivers or receivers, or I/O circuits for communicating or coupling with chips (for example the FPGA IC chip) in or of the logic drive.

Alternatively, the I/O or control chip may have two different gate oxide thicknesses. For example, one is a thick gate oxide (as mentioned and described above) thicker than that of the FPGA IC chip and the other is a thin gate oxide thinner than the thick gate oxide. The thicker gate oxide in the I/O or control chip is for use in the large drivers or receivers, or I/O circuits for communicating or coupling with external or outside circuits (of the logic drive), while the thinner gate oxide in the I/O or control chip is for use in the small drivers or receivers, or I/O circuits for communicating or coupling with chips (for example the FPGA IC chip) in or of the logic drive.

The I/O or control chip in the multichip package of the standard commodity logic drive may comprise a buffer and/or driver circuits for (1) downloading the programing codes from the non-volatile IC chip in the logic drive to the 5T or 6T SRAM cells of the programmable interconnection on the standard commodity FPGA IC chip. The programming codes from the non-volatile IC chip in the logic drive may go through a buffer or driver in or of the I/O or control chip before getting into the 5T or 6T SRAM cells of the programmable interconnection on the standard commodity FPGA IC chips. The buffer in or of the I/O or control chip may latch the data from the non-volatile chip and increase the bit-width of the data. For example, the data bit-width (in a SATA standard) from the non-volatile chip is 1 bit, and the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chip is 32 bits, the buffer may increase the data bit-width to equal to or greater than 64, 128, or 256 data bit-width. The driver in or of the I/O or control chip may amplify the data signals from the non-volatile chip; (2) downloading data from the non-volatile IC chip in the logic drive to the 5T or 6T SRAM cells of the LUTs on the standard commodity FPGA IC chip. The data from the non-volatile IC chip in the logic drive may go through a buffer or driver in or of the I/O or control chip before getting into the 5T or 6T SRAM cells of LUTs on the standard commodity FPGA IC chip. The buffer in or of the I/O or control chip may latch the data from the non-volatile chip and increase the bit-width of the data. For example, the data bit-width (in a SATA standard) from the non-volatile chip is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chip is 32 bits, the buffer may increase the data bit-width to equal to or greater than 64, 128, or 256 data bit-width. The driver in or of the I/O or control chip may amplify the data signals from the non-volatile chip.

The I/O or control chip in the multichip package of the standard commodity logic drive may comprise I/O circuits or pads (or micro copper pillars or bumps) for I/O ports comprising one or more than one (2, 3, 4, or more than 4) Universal Serial Bus (USB) ports, one or more than one wide-bit I/O ports, one or more than one SerDes ports, one or more than one Serial Advanced Technology Attachment (SATA) ports, one or more than one Peripheral Components Interconnect express (PCIe) ports, one or more IEEE 1394 ports, one or more Ethernet ports, one or more than one audio ports or serial ports, RS-232 or COM (communication) ports, wireless transceiver I/O ports, and/or Bluetooth transceiver I/O ports. The I/O or control chip may comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory storage drive.

Another aspect of the disclosure provides a logic drive in a multichip package comprising a standard commodity FPGA IC chip, an NVM IC chip, and a cooperating or supporting IC chip, wherein the cooperating or supporting IC chip is a hard macro IC chip. The hard macro circuits (originally on the standard commodity original FPGA IC chip, as described and specified above) may be hard macros, for example, DSP slices for multiplication or division, phase locked loop (PLL) for analog clock generation, digital clock manager (DCM), block random-access memory (RAM) cells for logic operation, ARM Cortex processor/controller cores and/or CPU cores. The ARM Cortex processor/controller cores are 8, 16, 32. 64-bit or greater than 64-bit Reduced Instruction Set Computing (RISC) ARM processor/controller cores licensed from the ARM Holdings. A hard macro circuit couple to one or a plurality of logic cells or elements to perform a logic, computing or processing function. The field programmable logic cells or elements may be used for smart interfaces or coupling (including field programmability and artificial intelligent networking) between the hard macro circuits. As described and specified above, the original FPGA IC chip may be used as a Data Process Unit (DPU) when comprising the logic cells or elements and the hard macro circuits of multi-core Central Process Units (CPUs), wherein each CPU core is based on one or a plurality of the ARM Cortex cores using a Reduced Instruction Set Computing (RISC) architecture or a Complex Instruction Set Computing (CISC) architecture. A CPU core couple to one or a plurality logic cells or elements to perform a logic, computing or processing function. The logic cells or elements may be used for the smart interfaces or coupling (including field programmability and artificial intelligent networking) between the CPU cores of the multi-CPU-cores on the original FPGA IC chip. One or a plurality of the hard macro circuits (hard macros, for example DSP slices for multiplication or division, phase locked loop (PLL) for clock generation, digital clock manager (DCM), block random-access memory (RAM) cells for logic operation, ARM Cortex processor/controller cores and/or CPU cores) on the original FPGA IC chip may be separated from the original FPGA IC chip to form the hard macro IC chip as the cooperating or supporting IC chip. The hard macro circuits on the hard macro IC chip provide the same or similar functions and purposes as that on the original FPGA IC chip. As an application example, the original FPGA (DPU) IC chip may be splitted into two IC chips (i) a (new) FPGA IC chip comprising a sea of the plurality of logic cells or elements which are field programmable, and (ii) a hard macro IC chip of the multi-core CPU comprising a sea of the plurality of Central Process Unit (CPU) cores which are hard macros implemented with hard and fixed metal wires, lines or traces; wherein each CPU core is designed using the ARM Cortex cores based on a Reduced Instruction Set Computing (RISC) architecture, or using a x86 CPU cores based on Complex Instruction Set Computing (CISC) architecture. The number of the plurality of Central Process Unit (CPU) cores of the hard macro IC chip of the multi-core CPU maybe 4, 8, 16, 32, 64, 128, 256, 512, or greater than 512. The new FPGA IC chip and hard macro IC chip are packaged in a 2D or 3D multichip package (to be described and specified below). The CPU cores of the hard macro IC chips couple to the logic cells or elements of the new FPGA IC chip through interconnection schemes of the multichip package. The field programmable logic cells or elements of the new FPGA IC chip may be used for the smart (artificial intelligent) networks, interfaces, coupling or interactions between the CPU cores of a plurality of CPU cores of the hard macro IC chip. The logic cells or elements of the new FPGA IC chip may be configured to provide smart (artificial intelligent) networks, interfaces, couplings or interactions between CPU cores of the plurality of CPU cores of the hard macro IC chip through interconnection schemes of the multichip package. In the multichip package, a logic cell or element of the new FPGA IC chip couples to first and second CPU cores of the hard macro IC chip through first and second interconnection schemes of the multichip package, respectively. That is, the first CPU core of the hard macro IC chip couples or interfaces with the second CPU core of the hard macro IC chip through, in sequence, the first interconnection scheme of the multichip package, the logic cell or element of the new FPGA IC chip, and the second interconnection scheme of the multichip package. The multichip package comprising the new FPGA IC chip and the hard macro IC chip provides the function of the original FPGA (DPU) IC chip, and provides a general-purpose CPU having high parallel computing or processing capability and high flexibility (field programmability). Both the hard macro IC chip comprising the CPU cores and the new FPGA IC chip comprising a plurality of logic cells or elements may be standardized, and become standard commodity IC products.

The cooperating or supporting chip (the hard macro IC chip) is designed, implemented and fabricated using varieties of semiconductor technology nodes or generations, including old or matured technology notes or generations, for example, a semiconductor note or generation less advanced than or equal to, or above or equal to 20 nm, 30 nm, 40 nm, 50 nm, 90 nm, 130 nm, 250 nm, 350 nm, or 500 nm. The semiconductor technology node or generation used in the hard macro IC chip is 1, 2, 3, 4, 5 or greater than 5 notes or generations older, more matured or less advanced than that used in the standard commodity FPGA IC chip packaged in the same logic drive. Transistors used in the hard macro IC chip may be a Fully Depleted Silicon-on-insulator (FDSOI) MOSFET, a Partially Depleted Silicon-on-insulator (PDSOI) MOSFET or a conventional planar MOSFET. Transistors used in the hard macro IC chip may be different from that used in the standard commodity FPGA IC chips packaged in the same logic drive; for example, the hard macro IC chip may use the conventional planar MOSFET, while the standard commodity FPGA IC chip packaged in the same logic drive may use the FINFET or GAAFET. The power supply voltage (Vcc) used in the hard macro IC chip may be greater than or equal to 1.5V, 2.0 V, 2.5V, 3 V, 3.5V, 4V, or 5V, while the power supply voltage (Vcc) used in the standard commodity FPGA IC chips packaged in the same logic drive may be smaller than or equal to 2.5V, 2V, 1.8V, 1.5V, or 1 V. The power supply voltage used in the hard macro IC chip may be different from that used in the standard commodity FPGA IC chip packaged in the same logic drive; for example, the hard macro IC may use a power supply of 4V, while the standard commodity FPGA IC chip packaged in the same logic drive may use a power supply voltage of 1.5V; or the hard macro IC chip may use a power supply of 2.5V, while the standard commodity FPGA IC chip packaged in the same logic drive may use a power supply of 0.75V. The gate oxide (physical) thickness of the Field-Effect-Transistors (FETs) used in the hard macro IC chip may be thicker than or equal to 5 nm, 6 nm, 7.5 nm, 10 nm, 12.5 nm, or 15 nm, while the gate oxide (physical) thickness of FETs used in the standard commodity FPGA IC chip packaged in the same logic drive may be thinner than 4.5 nm, 4 nm, 3 nm or 2 nm. The gate oxide (physical) thickness of FETs used in the hard macro IC chip may be different from that used in the standard commodity FPGA IC chip packaged in the same logic drive; for example, the hard macro IC chip may use a gate oxide (physical) thickness of FETs of 10 nm, while the standard commodity FPGA IC chip packaged in the same logic drive may use a gate oxide (physical) thickness of FETs of 3 nm; or the hard macro IC chip may use a gate oxide (physical) thickness of FETs of 7.5 nm, while the standard commodity FPGA IC chip packaged in the same logic drive may use a gate oxide (physical) thickness of FETs of 2 nm. The hard macro IC chip comprises small drivers or receivers, or I/O circuits for communicating or coupling with chips (for example, the FPGA IC chip) in or of the logic drive. The driving capability, loading, output capacitance, or input capacitance of the small IO drivers or receivers, or I/O circuits for communicating or coupling with chips (for example, the FPGA IC chip) in or of the logic drive may be between 0.1 pF and 5 pF or 0.1 pF and 2 pF; or smaller than 10 pF, 5 pF, 3 pF, 2 pF or 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. Furthermore, the power supply voltage (Vcc) used in the hard macro IC chip may have a voltage at the same level as that of the FPGA IC chip in addition to the voltage (as mentioned and described above) higher than that of the FPGA IC chip. The higher voltage in the hard macro IC chip is for use in the on-chip circuit operation or function, or for large drivers or receivers, or I/O circuits for communicating or coupling with external or outside circuits (of the logic drive), while the lower voltage in the hard macro IC chip is for use in the small drivers or receivers, or I/O circuits for communicating or coupling with chips (for example the FPGA IC chip) in or of the logic drive. Alternatively, the hard macro IC chip may have two different gate oxide thicknesses. For example, one is a thick gate oxide (as mentioned and described above) thicker than that of the FPGA IC chip and the other is a thin gate oxide thinner than the thick gate oxide. The thicker gate oxide in the hard macro IC chip is for use in the large drivers or receivers, or I/O circuits for on-chip circuit operation or function, or for communicating or coupling with external or outside circuits (of the logic drive), while the thinner gate oxide in the hard macro IC chip is for use in the small drivers or receivers, or I/O circuits for communicating or coupling with chips (for example the FPGA IC chip) in or of the logic drive. Alternatively, the semiconductor technology node or generation used in the hard macro IC chip may be the same as or similar to that used in the standard commodity FPGA IC chip packaged in the same logic drive, in terms of transistors, gate oxide thickness, power supply voltage and drivers, receiver or I/O circuits. For example, the hard macro IC chip comprising the multi-CPU-cores, DSP hard macros, and/or block RAMs may be fabricated using advanced technology nodes same as or similar to that used in the standard commodity FPGA IC chip packaged in the same logic drive.

By moving the hard macros from the FPGA IC chip to the hard macro IC chip, the FPGA IC chip may have all or most area of the standard commodity FPGA IC chip used for (i) arrays of logic blocks comprising logic cells or elements comprising Look-Up-Tables (LUTs) and multiplexers, and/or (ii) programmable interconnection, in regular repetitive arrays. If the hard macro circuits are included in the FPGA IC chip, the hard macro circuits need redesigning or recompilation when the FPGA IC chip is redesigned or recompiled using a different technology node or a different manufacturing fab. By moving the hard macros from the FPGA IC chip to the hard macro IC chip, the hard macro IC chip implemented using a certain specific technology node in a specific manufacturing fab may be used for the different FPGA IC chips designed, compiled and implemented in several different technology nodes or manufacturing fabs. In this case, the hard macro circuits do not need redesign or recompilation. The hard macro IC chip provides high speed, high efficiency computing, processing or logic operation collectively with the LUTs/multiplexers and programmable interconnections of the FPGA IC chip, resulting in high yield, low manufacturing cost for the FPGA IC chip. Therefore, the FPGA IC chip may be easily becoming standard commodity products.

Another aspect of the disclosure provides a logic drive in a multichip package comprising a standard commodity FPGA IC chip, an NVM IC chip, and a cooperating or supporting IC chip, wherein the cooperating or supporting IC chip is a power management IC chip. The power management IC chip provides power supply and power management for the FPGA IC chip, and comprises a voltage regulator. The FPGA IC chip, NVM IC chip, and cooperating or supporting IC chip may be disposed on a same horizontal plane in the 2D multichip package or may be stacked vertically in 2 layers or 3 layers in the 3D multichip package. The cooperating or supporting IC chip (the power management IC chip) may be designed and implemented using a technology node more mature or less advanced than the FPGA IC chip. For example, the FPGA IC chip may be designed and implemented using a technology node more advanced than 20 nm or 10 nm, while the power management IC chip may be designed and implemented using a technology node less advanced than 20 nm or 30 nm. The semiconductor technology node used to fabricate the FPGA IC chip is more advanced than that used to fabricate the power management IC chip. For example, the FPGA IC chip may be designed and implemented using FINFET or GAAFET transistors, while the power management IC chip may be designed and implemented using conventional planar MOSFET transistors. The purposes, functions and specifications of the FPGA IC chip, NVM IC chip and the power management IC chip in the multichip package are as described above.

Another aspect of the disclosure provides a logic drive in a multichip package comprising a standard commodity FPGA IC chip, an NVM IC chip, and a cooperating or supporting IC chip, wherein the cooperating or supporting IC chip is an Innovated ASIC or COT (abbreviated as IAC below) chip. The FPGA IC chip, NVM IC chip and IAC chip, may be disposed on a same horizontal plane in the 2D multichip package or may be stacked vertically in 2 layers or 3 layers in the 3D multichip package. As described above, the innovators may implement their innovation using the standard commodity FPGA IC chip (fabricated in the advanced technology nodes more advanced than 20 nm or 10 nm). The IAC chip, in addition to the standard commodity FPGA IC chip, provides innovators to implement their innovation with further customized or personalized capability using less expensive technology nodes less advance than 20 nm or 30 nm. The semiconductor technology node used to fabricate the FPGA IC chip is more advanced than that used to fabricate the IAC chip. For example, the IAC chip provides innovators in implement their innovated Intellectual Property (IP) circuits, Application Specific (AS) circuits, analog circuits, mixed-mode signal circuits, Radio-Frequency (RF) circuits, and/or transmitter, receiver, transceiver circuits, etc. The FPGA IC chip, NVM IC chip, and cooperating or supporting IC chip may be disposed on a same horizontal plane in the multichip package or may be stacked vertically in 2 layers or 3 layers. The cooperating or supporting IC chip (the IAC chip) may be designed and implemented using a technology node more mature or less advanced than the FPGA IC chip. For example, the FPGA IC chip may be designed and implemented using a technology node more advanced than 20 nm or 10 nm, while the IAC chip may be designed and implemented using a technology node less advanced than 20 nm or 10 nm. For example, the FPGA IC chip may be designed and implemented using FINFET or GAAFET transistors, while the IAC chip may be designed and implemented using conventional planar MOSFET transistors. The purposes, functions and specifications of the FPGA IC chip, NVM IC chip and the IAC chip in the multichip package are as described above.

The IAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a GAAFET, a Fully Depleted Silicon-on-insulator (FDSOI) MOSFET, a Partially Depleted Silicon-On-Insulator (PD-SOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET or GAAFET, or the IAC chip may use the Fully Depleted Silicon-on-insulator (FDSOI) MOSFET, while the standard commodity FPGA IC chips packaged in the same logic drive may use the FINFET or GAAFET. Since the IAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for use in the standard commodity logic drive to achieve the same or similar innovation and/or application may be reduced by a factor of larger than 2, 5, 10, 20, or 30.

Another aspect of the disclosure provides a logic drive in a multichip package comprising a standard commodity FPGA IC chip, a NVM IC chip, and one or a plurality of cooperating or supporting IC chips, wherein the one or a plurality of cooperating or supporting IC chips provide one or more than one of any combined functions provided by the cryptography or security IC chip, the I/O or control chip, the hard macro IC chip, the power management IC chip, and/or the IAC chip, as described and specified above. The functions of cryptography or security, I/O or control, hard macros, power management and IAC may be combined in one cooperating or supporting IC chip, or partitioned into two, three or four cooperating or supporting IC chips, or separated in five cooperating or supporting IC chips. Any of the functions of cryptography or security, I/O or control, hard macros, power management and IAC not included in the one or the plurality of cooperating or supporting IC chips may be included and kept in the one or the plurality of standard commodity FPGA IC chips in the logic drive. The FPGA IC chip, NVM IC chip, and one or the plurality of cooperating or supporting IC chips may be disposed on a same horizontal plane in the 2D multichip package or may be stacked vertically in 2 layers or 3 layers in the 3D multichip package. The purposes, functions and specifications of the FPGA IC chip, NVM IC chip and the one or the plurality of cooperating or supporting IC chips in the multichip package are as described above.

Another aspect of the disclosure provides the multichip package in a 2D format with IC chips disposed on the same horizontal plane or in a 3D stacked format with the IC chips stacked vertically for the logic drive as described above. The logic drive may be in 3 types of the multichip packages: (i) the first type of the multichip package comprises one or a plurality of standard commodity FPGA IC chips and one or a plurality of NVM IC chip, wherein the one or the plurality of standard commodity FPGA IC chips may comprise circuits providing functions of cryptography or security, I/O or control, hard macros, power management and/or IAC; (ii) the second type of the multichip package comprises one or a plurality of standard commodity FPGA IC chips, one or a plurality of NVM IC chips and a cooperating or supporting IC chip, wherein the cooperating or supporting IC chip is one of the cryptography or security IC chip, I/O or control chip, hard macro IC chip, power management IC chip, or IAC chip, as described and specified above. For the second type, functions of the cryptography or security, I/O or control, hard macros, power management and IAC not included in the cooperating or supporting IC chip may be included and kept in the one or the plurality of standard commodity FPGA IC chips in the logic drive; or (iii) the third type of the multichip package comprises one or a plurality of standard commodity FPGA IC chips, one or a plurality of NVM IC chip and a plurality of cooperating or supporting IC chips, wherein the plurality of cooperating or supporting IC chips each provides one or more than one of any combined functions provided by the cryptography or security IC chip, I/O or control chip, hard macro IC chip, power management IC chip, and/or IAC chip, as described and specified above. For the third type, functions of cryptography or security, I/O or control, hard macros, power management and IAC not included in the plurality of cooperating or supporting IC chips may be included and kept in the one or the plurality of standard commodity FPGA IC chips in the logic drive. The functions of cryptography or security, I/O or control, hard macros, power management and IAC may be combined in one cooperating or supporting IC chip, or partitioned into two, three or four cooperating or supporting IC chips, or separated in five cooperating or supporting IC chips respectively.

Another aspect of the disclosure provides a logic drive in a multichip package comprising a standard commodity FPGA IC chip, an NVM IC chip, and a cooperating or supporting IC chip, wherein the cooperating or supporting IC chip comprises circuits for cooperating or supporting the FPGA IC chips packaged in the same multichip package. The multiple chips in the multichip package may be disposed on a same horizontal plane in the 2D multichip package or may be stacked vertically in the 3D multichip package, wherein the 2D and 3D multichip packages will be described below. The cooperating or supporting IC chip may comprise cooperating and supporting circuits separated and moved from the FPGA IC chips. The cooperating or supporting IC chip may be the cryptography or security IC chip, I/O or control chip, hard macro IC chip, power management IC chip, and/or IAC chip as described and specified above. The cooperating and supporting circuits on the cooperating and supporting IC chip are communicating or coupling to the LUTs/multiplexers or programmable interconnections of the FPGA IC chip to perform certain functions and/or operations, through interconnection schemes (in the 2D or 3D multichip package). The cooperating or supporting IC chips provide functions related to the FPGA IC chips packaged in the same multichip package. For example, (i) the cryptography or security IC chip provides security functions for protecting configuration data or information stored in the SRAM cells of the FPGA IC chip, (ii) the I/O or control chip provides high speed, high bandwidth, low power I/O interfaces between the FPGA IC chip and the I/O or control chip, and further between the FPGA IC chip and the external circuits of the logic drive, (iii) the hard macro IC chip provides high speed, high efficiency computing, processing or logic operation collectively with the LUTs/multiplexers and programmable interconnection of the FPGA IC chip, therefore, resulting in high yield, low manufacturing cost for the FPGA IC chip and enabling the standard commodity FPGA IC chip, (iv) the power management IC chip provides power supply and management for the FPGA IC chip, and/or (v) the IAC chip provides customized and personalized circuits and functions for the FPGA IC chip.

The multichip package in the 2D format with IC chips disposed on the same horizontal plane for the logic drive, mentioned above, may be formed by a method using a Fan-out Interconnection Technology (FOIT). The FOIT package comprises the Front Interconnection Scheme of logic Drive (FISD) formed after the IC chips (one or a plurality of standard commodity FPGA IC chips, one or a plurality of NVM IC chips, and/or one or a plurality of cooperating or supporting IC chips mentioned above) are molded with a molding compound (an epoxy or polymer compound), wherein the molding compound are in a space outside and beyond a sidewall of the IC chips and/or in a gap between the IC chips mentioned above. The FISD is formed on or over (i) the one or the plurality of standard commodity FPGA IC chips, the one or the plurality of NVM IC chips, and/or the one or the plurality of cooperating or supporting IC chips; (ii) the molding compound, and (iii) the exposed micro copper bumps of the IC chips mentioned above. The FISD comprises 1 to 6 metal interconnection layers with an insulating dielectric layer (for example, polyimide) between two neighboring metal interconnection layers. The metal lines or traces are formed by an embossing copper electroplating process, wherein the copper layer is electroplated only in the openings in a photoresist layer. The metal lines or traces comprise an electroplated copper layer on a sputtered copper seed layer, and the sputtered copper seed layer on an adhesion layer (for example a Ti, or TiN layer). The adhesion/seed layer is at the bottom of the electroplated copper layer, but not at a sidewall of the electroplated copper layer. The thicknesses of fan-out interconnection metal lines or traces is between 0.5 μm and 10 μm or 0.5 μm and 5 μm. The metal lines or traces of the FISD are used to interconnect the IC chips in the multichip package, for example, the data in the non-volatile memory cells of a NVM IC chip (in the logic drive) is passing to the SRAM cells of a FPGA IC chip (in the logic drive) to configure the FPGA IC chip through the metal lines or traces of the FISD. In the multichip logic drive, a top surface of the molding compound is coplanar with a top surface of the micro copper bump on the top of the FPGA IC chip. The metal pads, pillars or bumps on the FISD are used for assembly or packaging of the finished logic drive to a next level assembly. The interaction, communication and relationship between the one or the plurality of FPGA IC chips, the one or the plurality of NVM IC chips and the one or the plurality of cooperating or supporting IC chips in the multichip package are as described above, and are through the metal lines or traces of the FISD. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the metal lines or traces of the FISD of the FOIT multichip package.

The multichip package of the logic drive in the 2D format with IC chips disposed on the same horizontal plane for the logic drive, mentioned above, may be formed based on a multiple-Chips-On-an-Interposer (COIP) flip-chip packaging method. The interposer in the COIP multichip package comprises: (1) high density interconnects for fan-out and interconnection between IC chips flip-chip-assembled, bonded or packaged on or over the interposer. The high-density interconnects comprise a First Interconnection Scheme on or of the Interposer (FISIP) and/or a Second Interconnection Scheme on or of the Interposer (SISIP). The FISIP is formed by processes comprising a damascene copper electroplating process, and the SISIP is formed by processes comprising an embossing copper electroplating process. The FISIP comprises 1 to 8 metal interconnection layers with an insulating dielectric layer (for example, low k compound comprising Si, O, C) between two neighboring metal interconnection layers. The metal lines or traces are formed by damascene copper electroplating process, wherein a copper layer is electroplated in openings in an insulating dielectric layer and over the insulating dielectric layer, the un-wanted electroplated copper layer over the insulating dielectric layer is then removed by a chemical-mechanical polishing (CMP) process. The metal lines or traces comprises an electroplated copper layer on a sputtered copper seed layer, and a sputtered copper seed layer on an adhesion layer (for example a Ti, or TiN layer). The adhesion/seed layer is at both the bottom and sidewall of the electroplated copper layer. The SISIP comprises 1 to 6 metal interconnection layers with an insulating dielectric layer (for example, polyimide) between two neighboring metal interconnection layers. The metal lines or traces are formed by the embossing copper electroplating process, wherein the copper layer is electroplated only in openings in the photoresist layer. The metal lines or traces comprise an electroplated copper layer on a sputtered copper seed layer, and a sputtered copper seed layer on an adhesion layer (for example a Ti or TiN layer). The adhesion/seed layer is at the bottom of the electroplated copper layer, but not at a sidewall of the electroplated copper layer. The thicknesses of interconnection metal lines or traces of FISIP is between 0.1 μm and 5 μm, and the thicknesses of interconnection metal lines or traces of SISIP is between 0.5 μm and 10 μm; (2) micro metal pads, bumps or pillars on or over the high density interconnects (FISIP and/or SISIP); (3) Trough-Silicon-Vias (TSVs) in the a silicon substrate of the interposer. The interposer comprises FISIP and/or SISIP comprising fan-out interconnection metal lines or traces, TSVs, and micro metal pads, pillars or bumps. The IC chips (the one or the plurality of standard commodity FPGA IC chips, the one or the plurality of NVM IC chips, and/or the one or the plurality of cooperating or supporting IC chips) are flip-chip assembled, bonded or packaged to the interposer. The micro copper pillars or solder bumps on the IC chips are bonded to the micro metal pads, bumps or pillars on the interposer. The metal lines or traces of the FISIP and/or SISIP are used to interconnect the IC chips in the multichip package, for example, the data in the non-volatile memory cells of a NVM IC chip (in the logic drive) is passing to the SRAM cells of a FPGA IC chip (in the logic drive) to configure the FPGA IC chip through the metal lines or traces of the FISIP and/or SISIP. The IC chips to be flip-chip assembled, bonded or packaged, to the interposer include the IC chips described and specified above. The interaction, communication and relationship between the one or the plurality of FPGA IC chips, the one or the plurality of NVM IC chip and the one or the plurality of cooperating or supporting IC chips in the multichip package are as described above, and are through the metal lines or traces of the FISIP and/or SISIP. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the metal lines or traces of the FISIP and/or SISIP of the COIP multichip package.

The multichip package in the 2D format with IC chips disposed on the same horizontal plane for the logic drive, mentioned above, may be formed based on a Chip-On-Interconnection-Substrate (COIS) flip-chip packaging method using an Interconnection Substrate (IS), wherein the IS comprises (i) an interconnection scheme of a Printed Circuit Board (PCB) substrate or a Ball Grid Array (BGA) substrate (ISPB) and (ii) a silicon Fineline Interconnection Bridges (FIB) embedded in the ISPB. The FIB is used for high speed, high density interconnection between IC chips assembled on the IS. The FIBs comprise First Interconnection Schemes on the substrates of FIBs (FISIB) and/or Second Interconnection Schemes on the substrates of FIBs (SISIB). The FISIB is formed by the damascene copper electroplating processes as described above in forming the FISIP of the interposer, and the SISIB is formed by the embossing copper electroplating processes as described above in forming the SISIP of the interposer. The description, fabrication processes, specifications and features of the FISIB is as described and specified above in the FISIP of the interposers used in the COIP logic drives, and the description, fabrication processes, specifications and features of the SISIB is as described and specified above in the SISIP of the interposers used in the COIP logic drives. The FIBs are then embedded in the ISPB. The ISPB is formed by the PCB or BGA processes, for example, a semi-additive process using laminated insulating dielectric layers and copper foils. The insulating dielectric layers may comprise FR4 (a composite material composed of woven fiberglass cloth with an epoxy resin binder) or BT (Bismaleimide Triazine Resin).

The COIS packages are the same as the COIP package except that Interconnection Substrates (IS) are used instead of the InterPosers (IP). The interconnection schemes of IS comprises the interconnection Scheme of the Printed Circuit Board (PCB) substrate or Ball Grid Array (BGA) substrate (ISPB) and silicon Fineline Interconnection Bridges (FIB) embedded in the ISPB, wherein FIB comprise the FISIB and/or SISIB. The purposes and functions of the interconnections schemes of the IS are same as that of interconnection schemes (FISIP and/or SISIP) of the interposers; and are also same as that of interconnection schemes of the FISD in the FOIT logic drives, as described above. The IC chips (the one or the plurality of standard commodity FPGA IC chips, the one or the plurality of NVM IC chips, and/or the one or the plurality of cooperating or supporting IC chips) are flip-chip assembled, bonded or packaged to the Interconnection Substrate (IS). The copper pillars or solder bumps on the IC chips are bonded to the metal pads or bumps on the Interconnection Substrate (IS). The metal lines or traces of (i) the FISIP and/or SISIP of the FIB, and/or (ii) the ISPB, are used to interconnect the IC chips in the multichip package, for example, the data in the non-volatile memory cells of a NVM IC chip (in the logic drive) is passing to the SRAM cells of a FPGA IC chip (in the logic drive) to configure the FPGA IC chip through the metal lines or traces of the FISIP and/or SISIP. The IC chips to be flip-chip assembled, bonded or packaged, to the IS include the IC chips described and specified above. The interaction, communication and relationship between the one or the plurality of FPGA IC chips, the one or the plurality of NVM IC chips and the one or the plurality of cooperating or supporting IC chips in the multichip package are as described above, and are through the metal lines or traces of the FISIB and/or SISIB; and/or the interconnection Schemes of the Printed Circuit Board (PCB) substrate or Ball Grid Array (BGA) substrate (ISPB). The IC chips to be assembled, bonded or packaged to the IS include the chips mentioned, described and specified above. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the metal lines or traces of the FISIB and/or SISIB of the FIB; and/or the interconnection Schemes of the Printed Circuit Board (PCB) substrate or Ball Grid Array (BGA) substrate of the COIS multichip package.

The multichip package of the logic drive in the 3D format, mentioned above, comprises IC chips stacked vertically at least 2 layers for the logic drive. The 3D multichip package may be formed by a method based on stacking either (i) bare-die IC chips or (ii) IC chip packages on or over a package formed by Fan-out Interconnection Technology (FOIT), as described and specified above, wherein the FOIT package comprises Through-Polymer-Vias (TPVs) in the molding compound. In the 3D logic drive, the one or the plurality of FPGA IC chips may be packaged in a first FOIT package, and the one or the plurality of NVM IC chips, and/or the one or the plurality of cooperating or supporting IC chips may be stacked on or over the first FOIT package, wherein the one or the plurality of NVM IC chips, and/or the one or the plurality of cooperating or supporting IC chips may be in a bare die format or in a package format, wherein the package format comprises, for example, TSOP (Thin Small Outline Package based on lead-frames), BGA package (based on wire-bonding or flip-chip bonding on a Ball Grid Array substrate), or a second FOIT package. In the multichip logic drive, the one or the plurality of NVM IC chips, and/or the one or the plurality of cooperating or supporting IC chips may couple or connect to the first FOIT package comprising the one or plurality of FPGA IC chips, through the TPVs and metal lines or traces of the FISD in the first FOIT package. For example, the data in the non-volatile memory cells of a NVM IC chip (in the logic drive) are passing to the SRAM cells of a FPGA IC chip (in the logic drive) to configure the FPGA IC chip through the TPVs and metal lines or traces of the FISD of the first FOIT. The interaction, communication and relationship between the one or the plurality of FPGA IC chips, the one or the plurality of NVM IC chips and the one or a plurality cooperating or supporting IC chips in the 3D vertical stacked multichip package are as described above, and are through the TPVs and metal lines or traces of the FISD. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the TPVs and metal lines or traces of the FISD.

Alternatively, the FOIT package may further comprise a Backside Interconnection Scheme of the logic Drive (BISD) at the backside of the one or the plurality of FPGA IC chips, wherein the FISD is at the front-side (the side having transistors) of the one or the plurality of FPGA IC chips. The BISD comprises 1 to 4 metal interconnection layers with an insulating dielectric layer (for example, polyimide) between two neighboring metal interconnection layers. The specification and the method of forming the BISD is the same as that of FISD. In the multichip logic drive, the one or the plurality of NVM IC chips, and/or the one or the plurality of cooperating or supporting IC chips may couple or connect to the FOIT package comprising the one or plurality of FPGA IC chips, through the metal lines or traces of the BISD, TPVs and metal lines or traces of the FISD in the FOIT package. For example, the data in the non-volatile memory cells of a NVM IC chip (in the logic drive) are passing to the SRAM cells of a of FPGA IC chip (in the logic drive) to configure the FPGA IC chip through the metal lines or traces of the BISD, TPVs and metal lines or traces of the FISD. The interaction, communication and relationship between the one or the plurality of FPGA IC chips, the one or the plurality of NVM IC chips and the one or the plurality cooperating or supporting IC chips in the 3D vertical stacked multichip package are as described above, and are through the metal lines or traces of the BISD, TPVs and metal lines or traces of the FISD. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through metal lines or traces of the BISD, TPVs and metal lines or traces of the FISD.

The multichip package of the logic drive in the 3D format, mentioned and specified above, comprises IC chips stacked vertically at least 2 layers for the logic drive. The 3D multichip package may be formed by a method based on stacking either (i) bare-die IC chips or (ii) IC chip packages on or over a package formed by Fan-out Interconnection Technology (FOIT), as described and specified above, wherein the FOIT package comprises Through-Polymer-Vias (TPVs) in the molding compound. In the 3D logic drive, the one or the plurality of NVM IC chips, and/or the one or the plurality of cooperating or supporting IC chips may be packaged in a first FOIT package, and the one or the plurality of FPGA IC chips may be stacked on or over the first FOIT package, wherein the one or the plurality of FPGA IC chips may be in a bare die format or in a package format comprising, for example, a second FOIT package. The one or the plurality of NVM IC chips, and/or the one or the plurality of cooperating or supporting IC chips in the first FOIT have the front sides with the transistors facing up, and the one or plurality of FPGA IC chips have the front sides with the transistors facing down (that is facing the first FOIT). The one or the plurality of NVM IC chips, and/or the one or the plurality of cooperating or supporting IC chips may comprising TSVs in their silicon substrates. The first FOIT may comprise TPVs in the molding compound or polymer, the FISD at its top, and the BISD at its bottom. Alternatively, the FISD may be omitted. The one or the plurality of NVM IC chips, and/or the one or the plurality of cooperating or supporting IC chips in the first FOIT may couple or connect to the one or plurality of FPGA IC chips, in bare die or packages. The one or plurality of FPGA IC chips or packages may be flipped assembled or bonded to the first FOIT using the solder reflow bonding, thermal compressing bonding, or the oxide-to-oxide metal-to-metal direct bonding. The cooperating and supporting circuits on the one or the plurality of cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through metal bonds between the first FOIT and the one or plurality of FPGA IC chips. The power supply or ground reference voltage for the one or the plurality of FPGA IC chips and the one or the plurality of cooperating and supporting IC chips may be through the TPVs in the first FOIT.

The FOIT packages comprising the one or the one or plurality of FPGA IC chips, the one or the plurality of NVM IC chips, or the one or the plurality of cooperating and supporting IC chips (as described and specified above), may alternatively use a vertical silicon connector or elevator with Through-Silicon-Vias (TSVs) in a silicon substrate of the vertical silicon connector or elevator. The vertical silicon connector or elevator is disposed on the same horizontal plane as the other chip or chips in a same FOIT package. The TSVs in the silicon substrate of the vertical silicon connector or elevator are used as an alternative for the TPVs. The functions and purposes of the TSVs in the vertical silicon connector or elevator are the same as that of TPVs in the molding compound or polymer of a FOIT package, as described and specified above.

The multichip package of the logic drive in the 3D format comprises IC chips stacked vertically at least 2 layers for the logic drive. The multichip package may be formed by a method based on stacking either (i) bare-IC chips or (ii) IC chip packages on or over a package formed by Chips-On-an-Interposer (COIP) flip-chip packaging method, as described and specified above. In the 3D logic drive, the one or the plurality of FPGA IC chips may be packaged in the COIP package, and the one or the plurality of NVM IC chips, and/or the one or the plurality of cooperating or supporting IC chips may be stacked on or over the COIP package, wherein the one or the plurality of NVM IC chips, and/or the one or a plurality of cooperating or supporting IC chips may be in a bare die format or in a package format, wherein the package format comprises, for example, TSOP (Thin Small Outline Package based on lead-frames), BGA package (based on wire-bonding or flip-chip bonding on a Ball Grid Array substrate), or FOIT package. The COIP package comprises a molding compound over the interposer and in a space outside and beyond a side wall of the one or the plurality of the FPGA IC chips, and/or between in a space between two neighboring FPGA IC chips. Through-Polymer-Vias (TPVs) are in the molding compound. All description, specification, purposes or functions (including the alternatives of the BISD and the vertical silicon connector or elevator with TSVs) for the logic drive in the 3D format using the FOIT package comprising the one or the plurality of FPGA IC chips, as described and specified above, are applied for the logic drive in the 3D format using the COIP package comprising the one or the plurality of FPGA IC chips.

The multichip package of the logic drive in the 3D format comprises IC chips stacked vertically at least 2 layers for the logic drive. The multichip package may be formed by a method based on stacking either (i) bare-IC chips or (ii) IC chip packages on or over a package formed by Chip-On-Interconnection-Substrate (COIS) packaging method, as described and specified above. In the 3D logic drive, the one or plurality of FPGA IC chips may be packaged in the COIS package, and the one or the plurality of NVM IC chips, and/or the one or the plurality of cooperating or supporting IC chips may be stacked on or over the COIS package, wherein the one or the plurality of NVM IC chips, and/or the one or a plurality of cooperating or supporting IC chips may be in a bare die format or in a package format, wherein the package format comprises, for example, TSOP (Thin Small Outline Package based on lead-frames), BGA package (based on wire-bonding or flip-chip bonding on a Ball Grid Array substrate), or FOIT package. The COIS package comprises a molding compound over the Interconnection Substrate (IS), and in a space outside and beyond a side wall of the one or the plurality of the FPGA IC chips, and/or in a space between two neighboring FPGA IC chips. Through-Polymer-Vias (TPVs) are in the molding compound. All description, specification, purposes or functions (including the alternatives of the BISD and the vertical silicon connector or elevator with TSVs) for the logic drive in the 3D format using the FOIT package comprising the one or the plurality of FPGA IC chips, as described above, are applied for the logic drive in the 3D format using the COIS package comprising the one or the plurality of FPGA IC chips.

Another aspect of the disclosure provides a method of forming the 3D vertical stacked logic drive in a multichip package comprising the one or the plurality of standard commodity FPGA IC chips, the one or the plurality of NVM IC chips and/or the one or the plurality of cooperating or supporting IC chips. The stacked logic drive using the single-layer-packaged package with the BISD and TPVs may be formed using by the following process steps: (i) providing a first single-layer-packaged package with both TPVs and the BISD, either separated or still in the wafer or panel format, and with its copper pillars or bumps, or solder bumps faced down at the bottom, and with the exposed copper pads at its top; (ii) Package-On-Package (POP) stacking assembling, by surface-mounting and/or flip-package methods, a second separated single-layer-packaged package (also with both TPVs and the BISD) on top of the provided first single-layer-packaged package. The surface-mounting process is similar to the Surface-Mount Technology (SMT) used in the assembly of components on or to the Printed Circuit Boards (PCB), by first printing solder or solder cream, or flux on the surfaces of the exposed copper pads (at the top of the a first single-layer-packaged package), and then flip-package assembling, connecting or coupling the copper pillars or bumps, or solder bumps on or of the second separated single-layer-packaged package to the solder or solder cream or flux printed surfaces of the exposed copper pads of the first single-layer-packaged package. The flip-package process is performed, similar to the Package-On-Package technology (POP) used in the IC stacking-package technology, by flip-package assembling, connecting or coupling the copper pillars or bumps, or solder bumps on or of the second separated single-layer-packaged package to the surfaces of copper pads of the first single-layer-packaged package. Note that the copper pillars or bumps, or solder bumps on or of the second separated single-layer-packaged package bonded to the surfaces of copper pads of the first single-layer-packaged package may be located vertically over or above locations where IC chips are placed in the first single-layer-packaged package. An underfill material may be filled in the gaps between the first and second single-layer-packaged packages. A third separated single-layer-packaged package (also with both TPVs and the BISD) may be flip-package assembled, connected or coupled to the exposed surfaces of copper pads of the second single-layer-packaged package. In an application, the first single-layer-packaged package may comprise the one or the plurality of FPGA IC chips, the second single-layer-packaged package may comprise the one or the plurality of NVM IC chips, and the third single-layer-packaged package may comprise the one or the plurality of cooperating or supporting IC chips. The purposes, functions and specifications of the one or the plurality of FPGA IC chips, the one or the plurality NVM IC chips and the one or a plurality of cooperating or supporting IC chips in the multichip package logic drive are as described above. The interaction, communication and relationship between the one or the plurality of FPGA IC chips, the one or the plurality of NVM IC chips and the one or a plurality of cooperating or supporting IC chips in the 3D vertical stacked multichip packaged logic drive are as described above. The Package-On-Package stacking assembling process may be repeated for assembling more separated single-layer-packaged packages (for example, up to more than or equal to n separated single-layer-packaged packages, wherein n is greater than or equal to 2, 3, 4, 5, 6, 7, 8) to form the finished stacking logic drive. All the above single-layer-packaged packages may be packages based on the FOIT, COIP or COIS packaging technology as described and specified above. When the first single-layer-packaged packages are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged package are still in the wafer or panel format, the wafer or panel may be used directly as the carrier or substrate for performing POP stacking processes, in the wafer or panel format, for forming the stacked logic drives. The wafer or panel is then cut or diced to obtain the separated stacked finished logic drives.

Another aspect of the disclosure provides the logic drive in the 2D or 3D multichip package comprising the one or the plurality of standard commodity FPGA IC chips, the one or the plurality of NVM IC chips and/or the one or the plurality of cooperating or supporting IC chips (as described and specified above), further comprising one or a plurality of processing and/or computing IC chips, for example, a Central Processing Unit (CPU) chip, Graphic Processing Unit (GPU) chip, Digital Signal Processing (DSP) chip, Tensor Processing Unit (TPU) chip, Application Processing Unit (APU) chip and/or Application Specific IC (ASIC) chip. The interaction, communication and relationship between the one or the plurality of FPGA IC chips, the one or the plurality of NVM IC chip and the one or a plurality of cooperating or supporting IC chips in the multichip packaged logic drive are as described above.

Another aspect of the disclosure provides the logic drive in the 2D or 3D multichip package comprising the one or the plurality of standard commodity FPGA IC chips, the one or the plurality of NVM IC chips and/or the one or the plurality of cooperating or supporting IC chips (as described and specified above), further comprising high speed, wide bit width, high bandwidth memory (HBM) SRAM or DRAM IC chips. The HBM IC chip may have a data bit width of equal to or greater than 64, 128, 256, 512, 1024, 2048, 4096, 8K, or 16K. The interaction, communication and relationship between the one or the plurality of FPGA IC chips, the one or the plurality of NVM IC chip and the one or a plurality of cooperating or supporting IC chips in the multichip packaged logic drive are as described above.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 20A shows a NAND gate in accordance with the present application.

FIG. 20B shows a truth table for a NAND gate in accordance with the present application.

FIG. 20C is a circuit diagram of a logic operator in accordance with an embodiment of the present application.

FIG. 20D shows a truth table for a logic operator as seen in FIG. 7C.

FIG. 22C illustrates a cryptography cross-point switch matrix in an original state for a first type of cryptography block in accordance with an embodiment of the present application.

FIG. 22D illustrates a cryptography cross-point switch matrix in an encryption/decryption state for a first type of cryptography block in accordance with an embodiment of the present application.

Figure 1A:
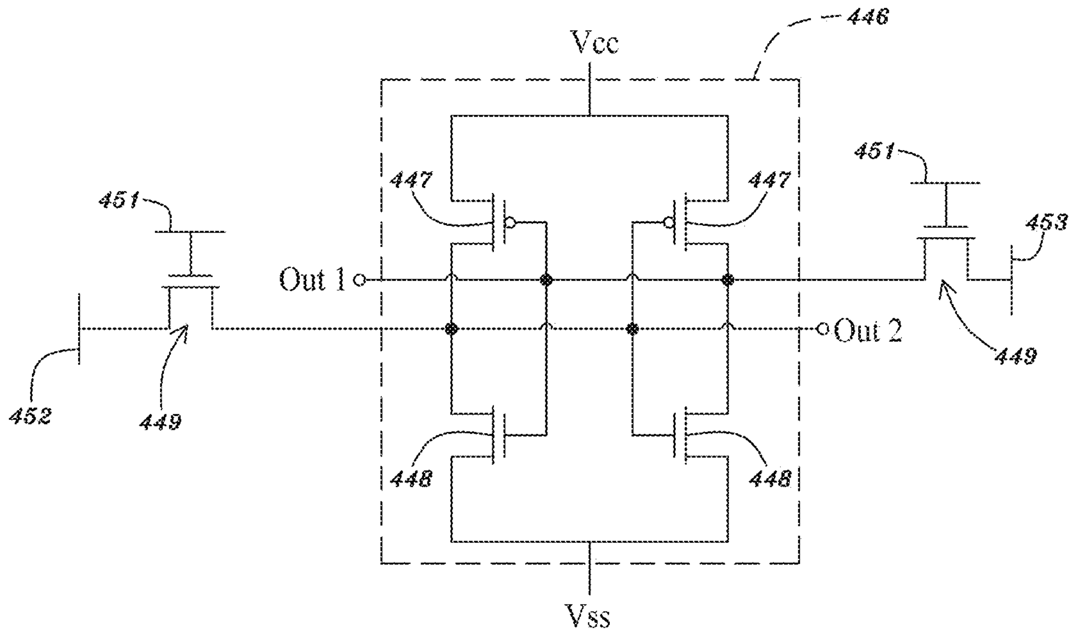
FIGS. 1A and 1B are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells (1) First Type of SRAM Cell (6T SRAM Cell)

FIG. 1A is a circuit diagram illustrating a 6T SRAM cell in accordance with an embodiment of the present application. Referring to FIG. 1A, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as a first output point of the memory unit 446 for a first data output Out1 of the memory unit 446. The gate terminals of the P-type and N-type MOS transistors 447 and 448 in the right pair are coupled to the drain terminals of the P-type and N-type MOS transistors 447 and 448 in the left pair, acting as a second output point of the memory unit 446 for a second data output Out2 of the memory unit 446.

Referring to FIG. 1A, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair, a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second Type of SRAM Cell (5T SRAM Cell)

Figure 1B:
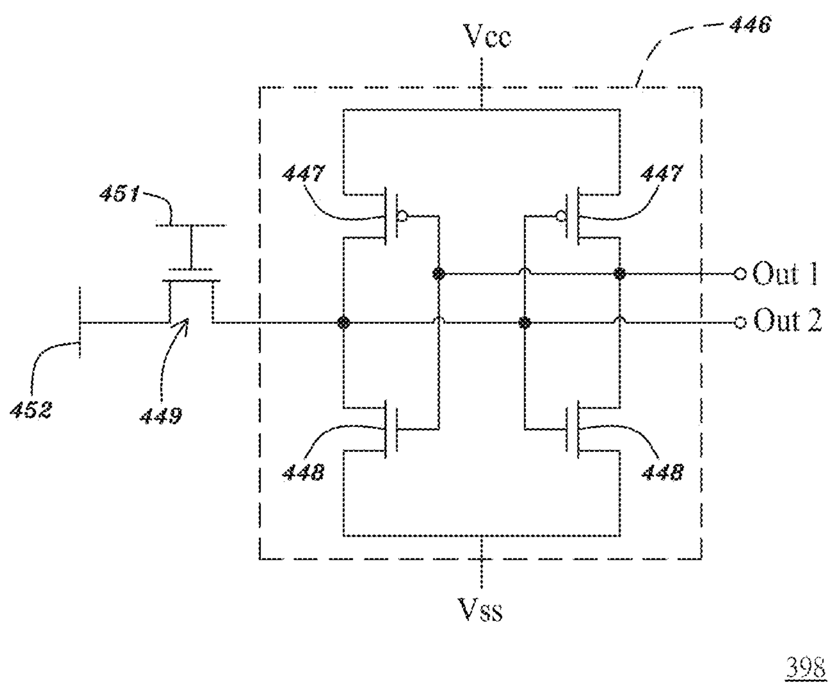

FIG. 1B is a circuit diagram illustrating a 5T SRAM cell in accordance with an embodiment of the present application. Referring to FIG. 1B, a second type of static random-access memory (SRAM) cell 398, i.e., 5T SRAM cell, may have the memory unit 446 as illustrated in FIG. 1A. The second type of static random-access memory (SRAM) cell 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair, a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Non-Volatile Memory (NVM) Cells

I. First Type of Non-Volatile Memory (NVM) Cells

Figure 2A:
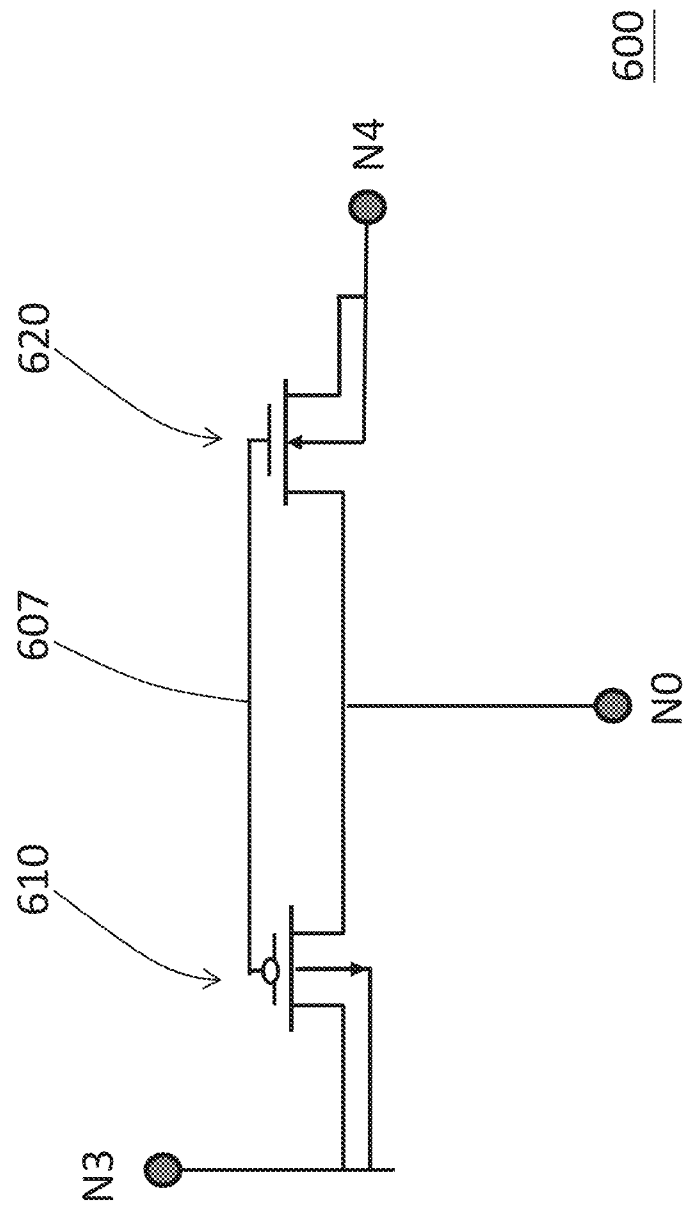
FIG. 2A is a circuit diagram illustrating a first type of non-volatile memory cell in accordance with an embodiment of the present application.
Figure 2B:
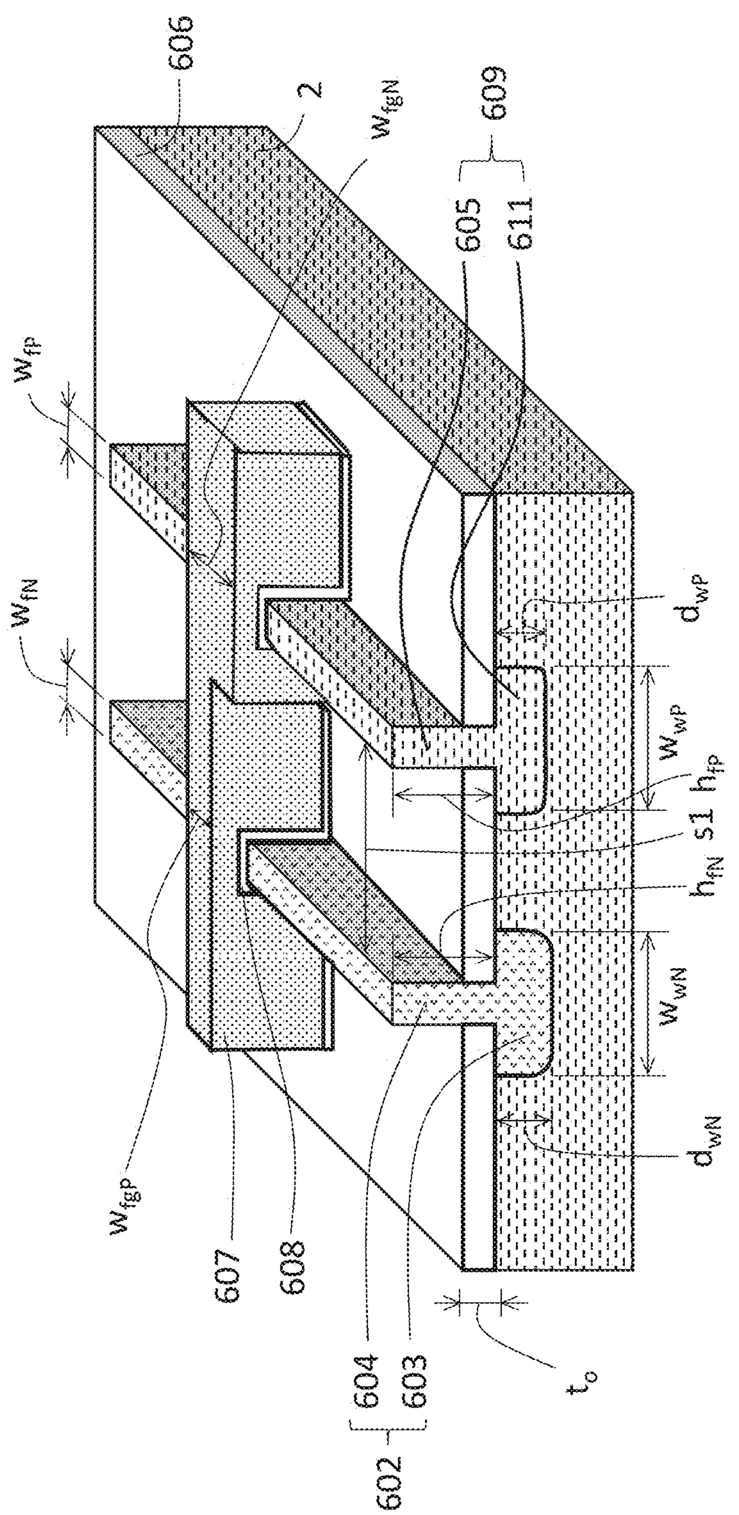
FIGS. 2B and 2C are schematically perspective views showing various structures for a first type of non-volatile memory cell in accordance with an embodiment of the present application.

FIG. 2A is a circuit diagram illustrating a first type of non-volatile memory cell in accordance with an embodiment of the present application. FIG. 2B is a schematically perspective view showing a structure for a first type of non-volatile memory cell in accordance with an embodiment of the present application. Referring to FIGS. 2A and 2B, the first type of non-volatile memory cell 600, i.e., floating-gate (FG) CMOS NVM cells, maybe formed on a P-type or N-type semiconductor substrate 2, e.g., silicon substrate. In this case, a P-type silicon substrate 2 coupling a voltage Vss of ground reference is provided for the first type of non-volatile memory cell 600. The first type of non-volatile memory cell 600 may include:

(1) an N-type stripe 602 formed with an N-type well 603 in the P-type silicon substrate 2 and an N-type fin 604 vertically protruding from the a top surface of the N-type well 603 and extending in a first direction, wherein the N-type well 603 may have a depth $d_{wN}$ between 0.3 and 5 micrometers and a width $w_{wN}$ between 50 nanometers and 1 micrometer, and the N-type fin 604 may have a height $h_{fN}$ between 10 and 200 nanometers and a width $w_{fN}$ between 1 and 100 nanometers;

(2) a P-type stripe 609 formed with a P-type well 611 in the P-type silicon substrate 2 and a P-type fin 605 vertically protruding from the a top surface of the P-type well 611 and extending in the first direction parallel to the N-type fin 604, wherein the P-type well 611 may have a depth $d_{wP}$ between 0.3 and 5 micrometers and a width $w\mathbf{1}_{wP}$ between 50 nanometers and 1 micrometer, wherein the P-type fin 605 may have a height $h_{fP}$ between 10 and 200 nanometers and a width $w_{fP}$ between 1 and 100 nanometers, wherein a space s1 between the N-type fin 604 and P-type fin 605 may range from 100 to 2,000 nanometers;

(3) a field oxide 606, such as silicon oxide, on the P-type well 611 and N-type well 603 and over the P-type silicon substrate 2, wherein the field oxide 606 may have a thickness $t_o$ between 20 and 500 nanometers;

(4) a floating gate 607, such as polysilicon, tungsten, tungsten nitride, titanium, titanium nitride, tantalum, tantalum nitride, copper-containing metal, aluminum-containing metal, or other conductive metals, transversely extending in a second direction substantially vertical to the first direction, over the field oxide 606 and from the N-type fin 604 to the P-type fin 605, wherein the floating gate 607 may have a width $w_{fgN}$ over the P-type fin 605, which may be greater than or equal to a width $w_{fgP}$ thereof over the N-type fin 604, and the width $w_{fgN}$ over the P-type fin 605 may be equal to between 1 and 10 times or between 1.5 and 5 times of the width $w_{fgP}$ over the N-type fin 604 and, for example, equal to 2 times of the width $w_{fgP}$ over the N-type fin 604, wherein the width $w_{fgP}$ over the N-type fin 604 may range from 1 to 25 nanometers, and the width $w_{fgN}$ over the P-type fin 605 may range from 1 to 25 nanometers; and (5) a gate oxide 608, such as silicon oxide, hafnium-containing oxide, zirconium-containing oxide or titanium-containing oxide, transversely extending in the second direction, on the field oxide 606 and from the N-type fin 604 to the P-type fin 605 to be provided on each of a top and opposite sidewalls of the N-type fin 604, on each of a top and opposite sidewalls of the P-type fin 605, between the floating gate 607 and each of the top and opposite sidewalls of the N-type fin 604, between the floating gate 607 and each of the top and opposite sidewalls of the P-type fin 605 and between the floating gate 607 and the field oxide 606, wherein the gate oxide 608 may have a thickness between 1 and 5 nanometers.

Figure 2C:
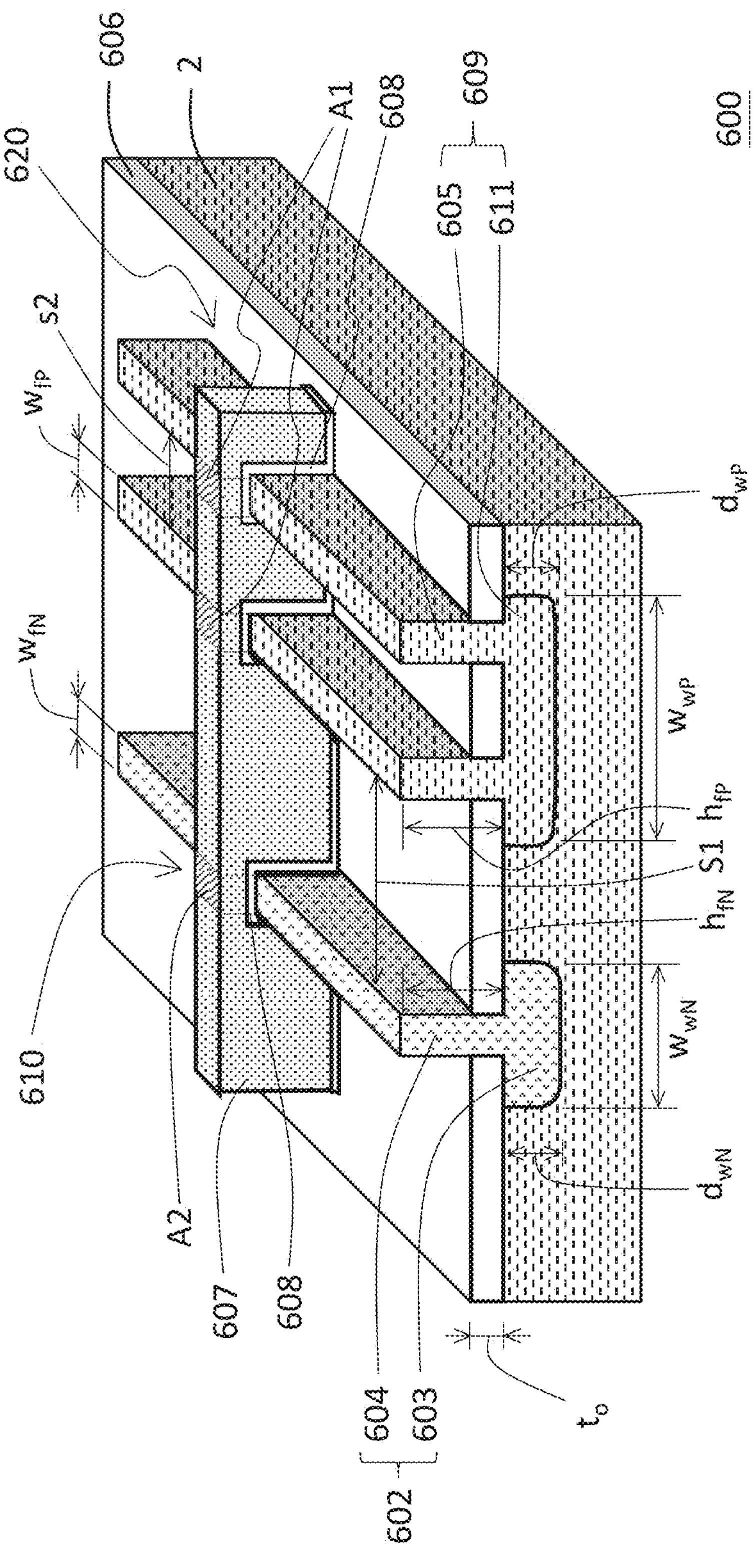

Alternatively, FIG. 2C is a schematically perspective view showing another structure for a first type of non-volatile memory cell in accordance with an embodiment of the present application. For an element indicated by the same reference number shown in FIGS. 2B and 2C, the specification of the element as seen in FIG. 2C may be referred to that of the element as illustrated in FIG. 2B. The difference between the circuits illustrated in FIG. 2B and the circuits illustrated in FIG. 2C is mentioned as below. Referring to FIG. 2C, a plurality of P-type fins, the specification for each of which may be referred to that for the P-type fin 605, arranged in parallel to each other or one another may be formed to vertically protrude from the P-type well 611, wherein each of the plurality of P-type fins 605 may have substantially the same height $h_{fP}$ between 10 and 200 nanometers and substantially the same width $w_{fP}$ between 1 and 100 nanometers, wherein a combination of the P-type fins 605 may be made for an N-type fin field-effect transistor (FinFET). The space s1 between the N-type fin 604 and the P-type fin 605 next to the N-type fin 604 may range from 100 to 2000 nanometers. A space s2 between neighboring two of the P-type fins 605 may range from 2 to 200 nanometers. The P-type fins 605 may have the number between 1 and 10 and for example the number of two in this case. The floating gate 607 may transversely extend over the field oxide 606 and from the N-type fin 604 to the P-type fins 605, wherein the floating gate 607 may have a total area A1 vertically over the P-type fins 605, which may be greater than or equal to a total area A2 thereof vertically over the N-type fin 604, wherein the total area A1 may be equal to between 1 and 10 times or between 1.5 and 5 times of the total area A2 and, for example, equal to 2 times of the total area A2, wherein the total area A1 may range from 1 to 2,500 square nanometers, and the total area A2 may range from 1 to 2,500 square nanometers.

Referring to FIG. 2A-2C, a P-type metal-oxide-semiconductor (MOS) transistor 610 may be formed by a FINFET process technology, which is provided by the floating gate 607, the N-type fin 604 and the gate oxide 608 between the floating gate 607 and the N-type fin 604, wherein the P-type metal-oxide-semiconductor (MOS) transistor 610 includes two $P^+$ portions doped with P-type impurities or atoms, such as boron impurities or atoms, in the N-type fin 604 at two opposite sides of the gate oxide 608. The P-type impurities or atoms in the two $P^+$ portions of the P-type metal-oxide-semiconductor (MOS) transistor 610 may have a concentration greater than those in the P-type well 611.

Referring to FIGS. 2A and 2B, an N-type metal-oxide-semiconductor (MOS) transistor 620 may be formed by a FINFET process technology, which is provided by the floating gate 607, the P-type fin 605 and the gate oxide 608 between the floating gate 607 and the P-type fin 605, wherein the N-type metal-oxide-semiconductor (MOS) transistor 620 includes two $N^+$ portions doped with N-type impurities or atoms, such as arsenic or phosphorus impurities or atoms, in the P-type fin 605 at two opposite sides of the gate oxide 608. The N-type impurities or atoms in the two $N^+$ portions of the N-type metal-oxide-semiconductor (MOS) transistor 620 may have a concentration greater than those in the N-type well 603.

Alternatively, referring to FIGS. 2A and 2C, the N-type metal-oxide-semiconductor (MOS) transistor 620 may be formed by a FINFET process technology, which is provided by the floating gate 607, the plurality of P-type fins 605 and the gate oxide 608 between the floating gate 607 and the plurality of P-type fins 605, wherein the N-type metal-oxide-semiconductor (MOS) transistor 620 includes two $N^+$ portions doped with N-type impurities or atoms, such as arsenic or phosphorus impurities or atoms, in each of the plurality of P-type fins 605 at two opposite sides of the gate oxide 608. The N-type impurities or atoms in the two $N^+$ portions of the N-type metal-oxide-semiconductor (MOS) transistor 620 may have a concentration greater than those in the N-type well 603.

Thereby, referring to FIGS. 2A-2C, the N-type MOS transistor 620 may have a gate capacitance greater than or equal to that of the P-type MOS transistor 610. The gate capacitance of the N-type MOS transistor 620 may be equal to between 1 and 10 times or between 1.5 and 5 times of the gate capacitance of the P-type MOS transistor 610 and, for example, equal to 2 times of the gate capacitance of the P-type MOS transistor 610. The gate capacitance of the N-type MOS transistor 620 may range from 0.1 aF to 10 fF and the gate capacitance of the P-type MOS transistor 610 may range from 0.1 aF to 10 fF.

Referring to FIGS. 2A-2C, the floating gate 607 coupling a gate terminal of the P-type MOS transistor 610, i.e., FG P-MOS, and a gate terminal of the N-type MOS transistor 620, i.e., FG N-MOS, with each other is configured to catch electrons therein. The P-type MOS transistor 610 is configured to form a channel having two ends opposite to each other, one of which couples to a node N3 coupling to its N-type well 603 and the other of which couples to a node NO. The N-type MOS transistor 620 is configured to form a channel having two ends opposite to each other, one of which couples to a node N4 coupling to the P-type well and fin 611 and 605 and the other of which couples to the node NO.

Referring to FIGS. 2A-2C, when the floating gate 607 is being erased, (1) the node N3 may be switched to couple to an erasing voltage $V_{Er}$, (2) the node N4 may be switched to couple to the voltage Vss of ground reference and (3) the node N0 may be switched to be floating. Since the gate capacitance of the P-type MOS transistor 610 is smaller than that of the N-type MOS transistor 620, the voltage difference between the floating gate 607 and the node N3 is large enough to cause electron tunneling. Accordingly, electrons trapped in the floating gate 607 may tunnel through the gate oxide 608 to the node N3. Thereby, the floating gate 607 may be erased to a logic level of "1".

Referring to FIGS. 2A-2C, after the first type of non-volatile memory cell 600 is erased, the floating gate 607 may be positively charged to a logic level of "1" to turn on the N-type MOS transistor 620 and off the P-type MOS transistor 610. In this situation, when the floating gate 607 is being programmed, (1) the node N3 may be switched to couple to a programming voltage $V_{Pr}$, (2) the node N0 may be switched to couple to the programming voltage $V_{Pr}$ and (3) the node N4 may be switched to couple to the voltage Vss of ground reference. Accordingly, electrons passing from the node N4 to the node N0 through the channel of the N-type MOS transistor 620 may induce some hot electrons to jump or inject to the floating gate 607 through the gate oxide 608 to be trapped in the floating gate 607. Thereby, the floating gate 607 may be programmed to a logic level of "0".

Referring to FIGS. 2A-2C, in operation of the first type of non-volatile memory cell 600, (1) the node N3 may be switched to couple to the voltage Vcc of power supply, (2) the node N4 may be switched to couple to the voltage Vss of ground reference and (3) the node N0 may be switched to act as an output point of the first type of non-volatile memory cell 600. When the floating gate 607 is positively charged to a logic level of "1", the P-type MOS transistor 610 may be turned off and the N-type MOS transistor 620 may be turned on to couple the node N4 to the node N0 through the channel of the N-type MOS transistor 620. Thereby, the data output of the first type of non-volatile memory cell 600 at the node N0 may be at a logic level of "0". When the floating gate 607 is negatively charged to a logic level of "0", the P-type MOS transistor 610 may be turned on and the N-type MOS transistor 620 may be turned off to couple the node N3 to the node N0 through the channel of the P-type MOS transistor 610. Thereby, the data output of the first type of non-volatile memory cell 600 at the node N0 may be at a logic level of "1".

II. Second Type of Non-Volatile Memory Cells

Figure 3A:
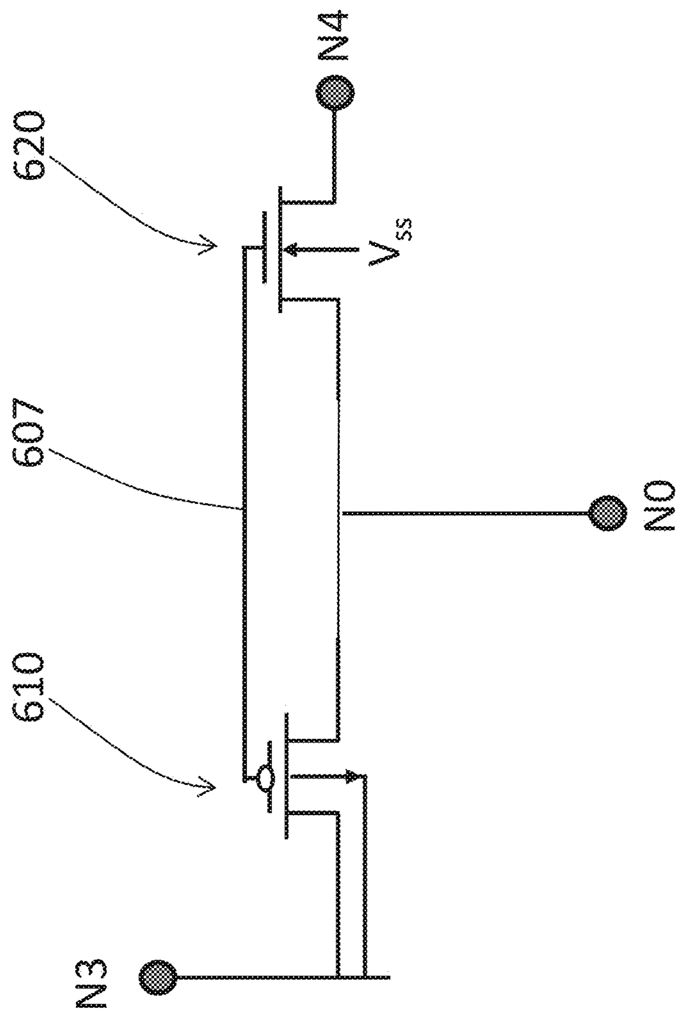
FIG. 3A is a circuit diagram illustrating a second type of non-volatile memory cell in accordance with an embodiment of the present application.
Figure 3B:
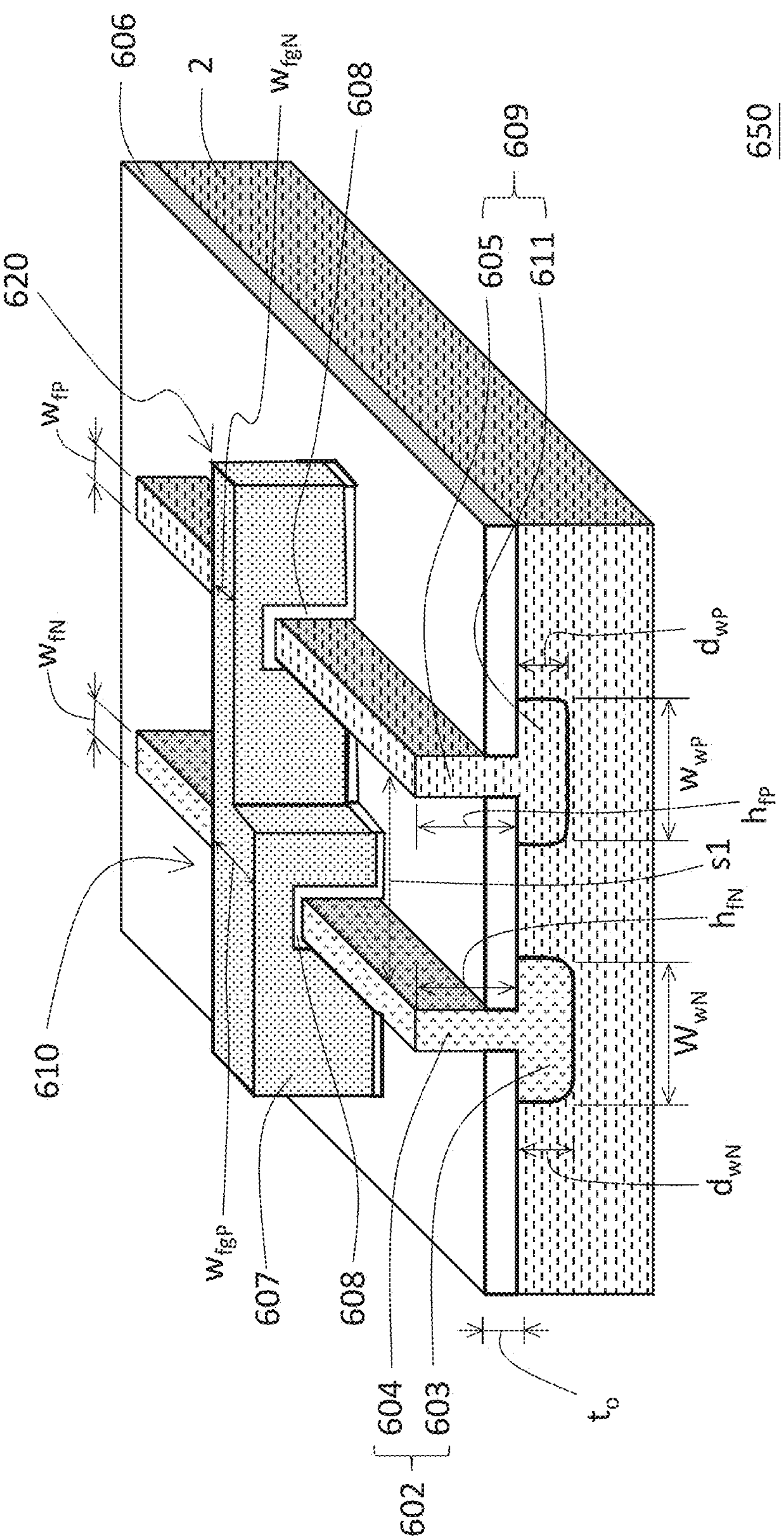
FIGS. 3B and 3C are schematically perspective views showing various structures for a second type of non-volatile memory cell, i.e., floating-gate (FG) CMOS NVM cells, in accordance with an embodiment of the present application.

Alternatively, FIG. 3A is a circuit diagram illustrating a second type of non-volatile memory cell in accordance with an embodiment of the present application. FIG. 3B is a schematically perspective view showing a structure for a second type of non-volatile memory cell, i.e., floating-gate (FG) CMOS NVM cells, in accordance with an embodiment of the present application. In this case, the scheme for the second type of non-volatile memory cell 650 as seen in FIGS. 3A and 3B is similar to that for the first type of non-volatile memory cell 600 as seen in FIGS. 2A and 2B and can be referred to the illustration for FIGS. 2A and 2B, but the difference between the schemes for the second type of non-volatile memory cell 650 as seen in FIGS. 3A and 3B and the first type of non-volatile memory cell 600 as seen in FIGS. 2A and 2B is mentioned as below. For an element indicated by the same reference number shown in FIGS. 2B and 3B, the specification of the element as seen in FIG. 3B may be referred to that of the element as illustrated in FIG. 2B. Referring to FIGS. 3A and 3B, the node N4 may not couple to the P-type well and fin 611 and 605. The width $w_{fgN}$ of the floating gate 607 may be smaller than or equal to the width $w_{fgN}$ of the floating gate 607. The width $w_{fgP}$ over the N-type fin 604 may be equal to between 1 and 10 times or between 1.5 and 5 times of the width $w_{fgP}$ over the P-type fin 605 and, for example, equal to 2 times of the width $w_{fgN}$ over the P-type fin 605, wherein the width $w_{fgP}$ over the N-type fin 604 may range from 1 to 25 nanometers, and the width $w_{fgN}$ over the P-type fin 605 may range from 1 to 25 nanometers.

Figure 3C:
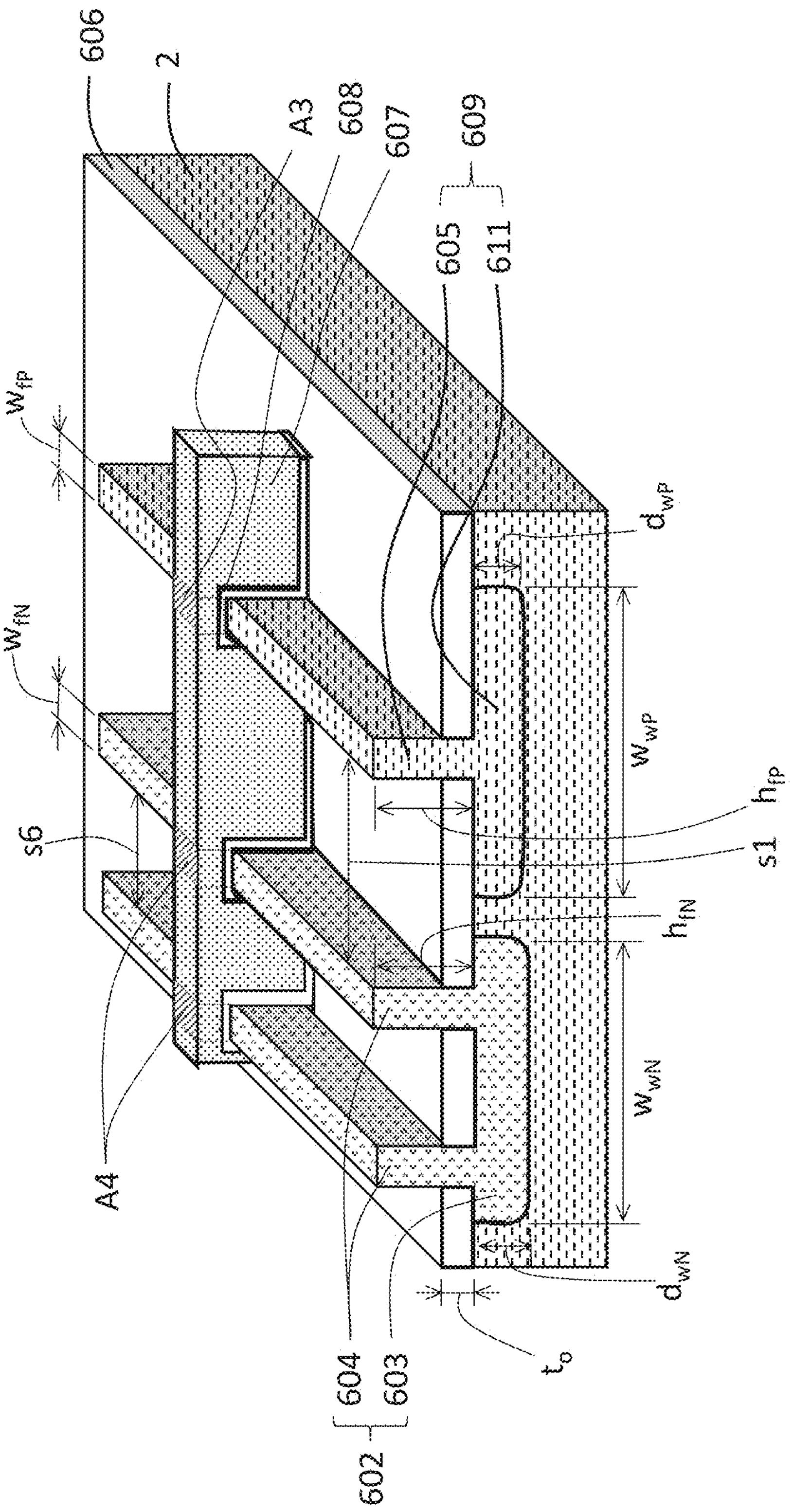

Alternatively, a plurality of N-type fins, the specification for each of which may be referred to that for the N-type fin 604, arranged in parallel to each other or one another may be formed to vertically protrude from the N-type well 603, as seen in FIG. 3C, wherein each of the plurality of N-type fins 604 may have substantially the same height $h_{fN}$ between 10 and 200 nanometers and substantially the same width $w_{fN}$ between 1 and 100 nanometers, wherein the combination of the plurality of N-type fins 604 may be made for a P-type fin field-effect transistor (FinFET). FIG. 3C is a schematically perspective view showing another structure for a second type of non-volatile memory cell in accordance with an embodiment of the present application. For an element indicated by the same reference number shown in FIGS. 2B, 2C and 3C, the specification of the element as seen in FIG. 3C may be referred to that of the element as illustrated in FIGS. 2B and 2C. The difference therebetween is mentioned as below. Referring to FIG. 3C, a space s6 between neighboring two of the N-type fins 604 may range from 2 to 200 nanometers. The N-type fins 604 may have the number between 1 and 10 and for example the number of two in this case. The floating gate 607 may transversely extend over the field oxide 606 and from the N-type fins 604 to the P-type fin 605, wherein the floating gate 607 may have a total area A3 vertically over the P-type fin 605, which may be smaller than or equal to a total area A4 thereof vertically over the N-type fins 604, wherein the total area A4 may be equal to between 1 and 10 times or between 1.5 and 5 times of the total area A3 and, for example, equal to 2 times of the total area A3, wherein the total area A3 may range from 1 to 2,500 square nanometers, and the total area A4 may range from 1 to 2,500 square nanometers.

Referring to FIG. 3A-3C, an N-type metal-oxide-semiconductor (MOS) transistor 620 may be formed by a FINFET process technology, which is provided by the floating gate 607, the P-type fin 605 and the gate oxide 608 between the floating gate 607 and the P-type fin 605, wherein the N-type metal-oxide-semiconductor (MOS) transistor 620 includes two $N^+$ portions doped with N-type impurities or atoms, such as arsenic or phosphorus impurities or atoms, in the P-type fin 605 at two opposite sides of the gate oxide 608. The N-type impurities or atoms in the two $N^+$ portions of the N-type metal-oxide-semiconductor (MOS) transistor 620 may have a concentration greater than those in the N-type well 603.

Referring to FIGS. 3A and 3B, a P-type metal-oxide-semiconductor (MOS) transistor 610 may be formed by a FINFET process technology, which is provided by the floating gate 607, the N-type fin 604 and the gate oxide 608 between the floating gate 607 and the N-type fin 604, wherein the P-type metal-oxide-semiconductor (MOS) transistor 610 includes two $P^+$ portions doped with P-type impurities or atoms, such as boron impurities or atoms, in the N-type fin 604 at two opposite sides of the gate oxide 608. The P-type impurities or atoms in the two $P^+$ portions of the P-type metal-oxide-semiconductor (MOS) transistor 610 may have a concentration greater than those in the P-type well 611.

Alternatively, referring to FIGS. 3A and 3C, the P-type metal-oxide-semiconductor (MOS) transistor 610 may be formed by a FINFET process technology, which is provided by the floating gate 607, the plurality of N-type fins 604 and the gate oxide 608 between the floating gate 607 and the plurality of N-type fins 604, wherein the P-type metal-oxide-semiconductor (MOS) transistor 610 includes two $P^+$ portions doped with P-type impurities or atoms, such as boron impurities or atoms, in each of the plurality of N-type fins 604 at two opposite sides of the gate oxide 608. The P-type impurities or atoms in the two $P^+$ portions of the P-type metal-oxide-semiconductor (MOS) transistor 610 may have a concentration greater than those in the P-type well 611.

Thereby, referring to FIGS. 3A-3C, the P-type MOS transistor 610 may have a gate capacitance greater than or equal to that of the N-type MOS transistor 620. The gate capacitance of the P-type MOS transistor 610 may be equal to between 1 and 10 times or between 1.5 and 5 times of the gate capacitance of the N-type MOS transistor 620 and, for example, equal to 2 times of the gate capacitance of the N-type MOS transistor 620. The gate capacitance of the N-type MOS transistor 620 may range from 0.1 aF to 10 fF and the gate capacitance of the P-type MOS transistor 610 may range from 0.1 aF to 10 fF.

Referring to FIGS. 3A-3C, for a first aspect, when the floating gate 607 is being erased, (1) the node N4 may be switched to couple to the erasing voltage $V_{Er}$, (2) the node N3 may couple to the N-type stripe 602 switched to couple to the voltage Vss of ground reference, (3) the node N0 may be switched to be floating, and (4) the P-type well 611 may be switched to couple to the voltage Vss of ground reference. Since the gate capacitance of the N-type MOS transistor 620 is smaller than that of the P-type MOS transistor 610, the voltage difference between the floating gate 607 and the node N4 is large enough to cause electron tunneling. Accordingly, electrons trapped in the floating gate 607 may tunnel through the gate oxide 608 to the node N4. Thereby, the floating gate 607 may be erased to a logic level of "1".

For a second aspect, when the floating gate 607 is being erased, (1) the node N0 may be switched to couple to the erasing voltage $V_{Er}$, (2) the node N3 may couple to the N-type stripe 602 switched to couple to the voltage Vss of ground reference, (3) the node N4 may be switched to be floating, and (4) the P-type well 611 may be switched to couple to the voltage Vss of ground reference. Since the gate capacitance of the N-type MOS transistor 620 is smaller than that of the P-type MOS transistor 610, the voltage difference between the floating gate 607 and the node N0 is large enough to cause electron tunneling. Accordingly, electrons trapped in the floating gate 607 may tunnel through the gate oxide 608 to the node N0. Thereby, the floating gate 607 may be erased to a logic level of "1".

For a third aspect, when the floating gate 607 is being erased, (1) the nodes NO and N4 may be switched to couple to the erasing voltage $V_{Er}$, (2) the node N3 may couple to the N-type stripe 602 switched to couple to the voltage Vss of ground reference, and (3) the P-type well 611 may be switched to couple to the voltage Vss of ground reference. Since the gate capacitance of the N-type MOS transistor 620 is smaller than that of the P-type MOS transistor 610, the voltage difference between the floating gate 607 and the node N0 is large enough to cause electron tunneling. Accordingly, electrons trapped in the floating gate 607 may tunnel through the gate oxide 608 to the node(s) N0 and/or N4. Thereby, the floating gate 607 may be erased to a logic level of "1".

Referring to FIGS. 3A-3C, after the second type of non-volatile memory cell 650 is erased, the floating gate 607 may be positively charged to a logic level of "1" to turn on the N-type MOS transistor 620 and off the P-type MOS transistor 610. In this situation, for a first aspect, when the floating gate 607 is being programmed, (1) the node N3 may couple to the N-type stripe 602 switched to couple to the programming voltage $V_{Pr}$, (2) the node N4 may be switched to couple to the voltage Vss of ground reference, (3) the node N0 may be switched to be floating, and (4) the P-type well 611 may be switched to couple to the voltage Vss of ground reference. Since the gate capacitance of the N-type MOS transistor 620 is smaller than that of the P-type MOS transistor 610, the voltage difference between the floating gate 607 and the node N4 is large enough to cause electron tunneling. Accordingly, electrons at the node N4 may tunnel through the gate oxide 608 to the floating gate 607 to be trapped in the floating gate 607. Thereby, the floating gate 607 may be programmed to a logic level of "0".

For a second aspect, when the floating gate 607 is being programmed, (1) the node N3 may couple to the N-type stripe 602 switched to couple to the programming voltage $V_{Pr}$, (2) the node N0 may be switched to couple to the voltage Vss of ground reference, (3) the node N4 may be switched to be floating, and (4) the P-type well and fin 611 and 605 may be switched to couple to the voltage Vss of ground reference. Since the gate capacitance of the N-type MOS transistor 620 is smaller than that of the P-type MOS transistor 610, the voltage difference between the floating gate 607 and the node N0 is large enough to cause electron tunneling. Accordingly, electrons at the node N0 may tunnel through the gate oxide 608 to the floating gate 607 to be trapped in the floating gate 607. Thereby, the floating gate 607 may be programmed to a logic level of "0".

For a third aspect, when the floating gate 607 is being programmed, (1) the node N3 may couple to the N-type stripe 602 switched to couple to the programming voltage $V_{Pr}$, (2) the nodes N0 and N4 may be switched to couple to the voltage Vss of ground reference, and (3) the P-type well 611 may be switched to couple to the voltage Vss of ground reference. Since the gate capacitance of the N-type MOS transistor 620 is smaller than that of the P-type MOS transistor 610, the voltage difference between the floating gate 607 and the node N0 and/or between the floating gate 607 and the node N4 is large enough to cause electron tunneling. Accordingly, electrons at the node(s) NO and/or N4 may tunnel through the gate oxide 608 to the floating gate 607 to be trapped in the floating gate 607. Thereby, the floating gate 607 may be programmed to a logic level of "0".

Referring to FIGS. 3A-3C, in operation of the second type of non-volatile memory cell 650, (1) the node N3 may couple to the N-type stripe 602 switched to couple to the voltage Vcc of power supply, (2) the node N4 may be switched to couple to the voltage Vss of ground reference, (3) the node N0 may be switched to act as an output point of the second type of non-volatile memory cell 650, and (4) the P-type well 611 may be switched to couple to the voltage Vss of ground reference. When the floating gate 607 is positively charged to a logic level of "1", the P-type MOS transistor 610 may be turned off and the N-type MOS transistor 620 may be turned on to couple the node N4 to the node NO through the channel of the N-type MOS transistor 620. Thereby, the data output of the second type of non-volatile memory cell 650 may be at a logic level of "0". When the floating gate 607 is negatively charged to a logic level of "0", the P-type MOS transistor 610 may be turned on and the N-type MOS transistor 620 may be turned off to couple the node N3 to the node N0 through the channel of the P-type MOS transistor 610. Thereby, the data output of the second type of non-volatile memory cell 650 may be at a logic level of "1".

III. Third Type of Non-Volatile Memory Cells

Figure 4A:
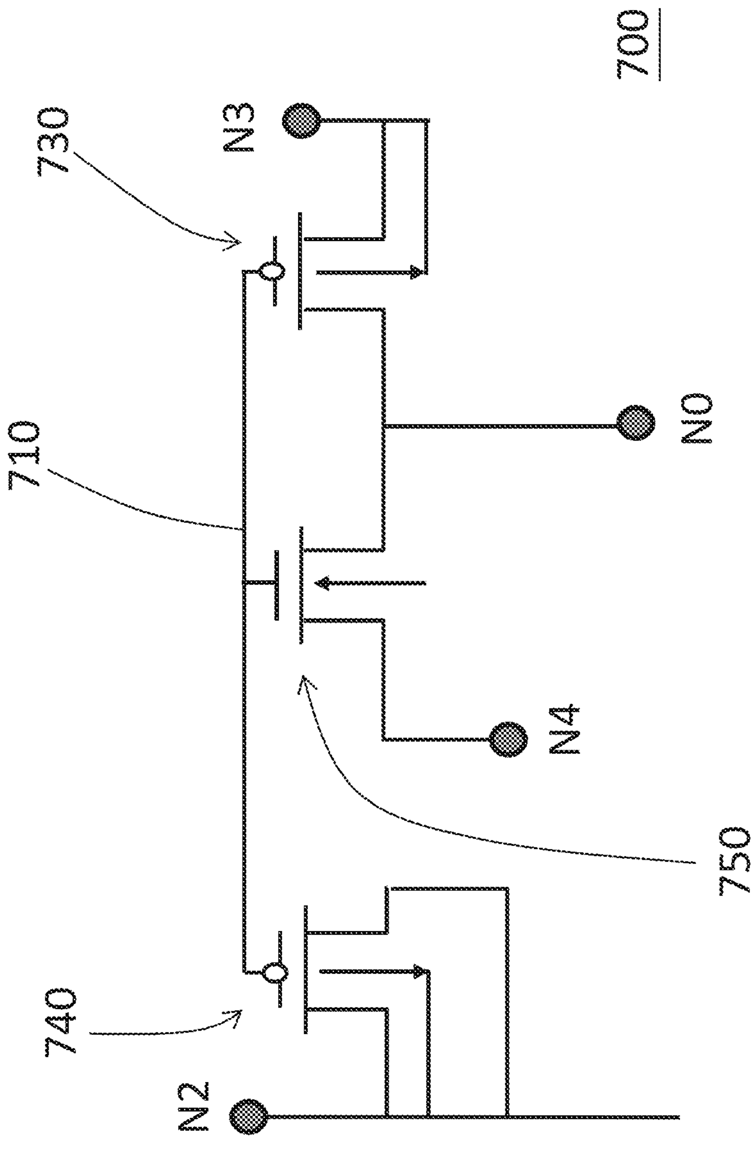
FIG. 4A is a circuit diagram illustrating a third type of non-volatile memory cell in accordance with an embodiment of the present application.
Figure 4B:
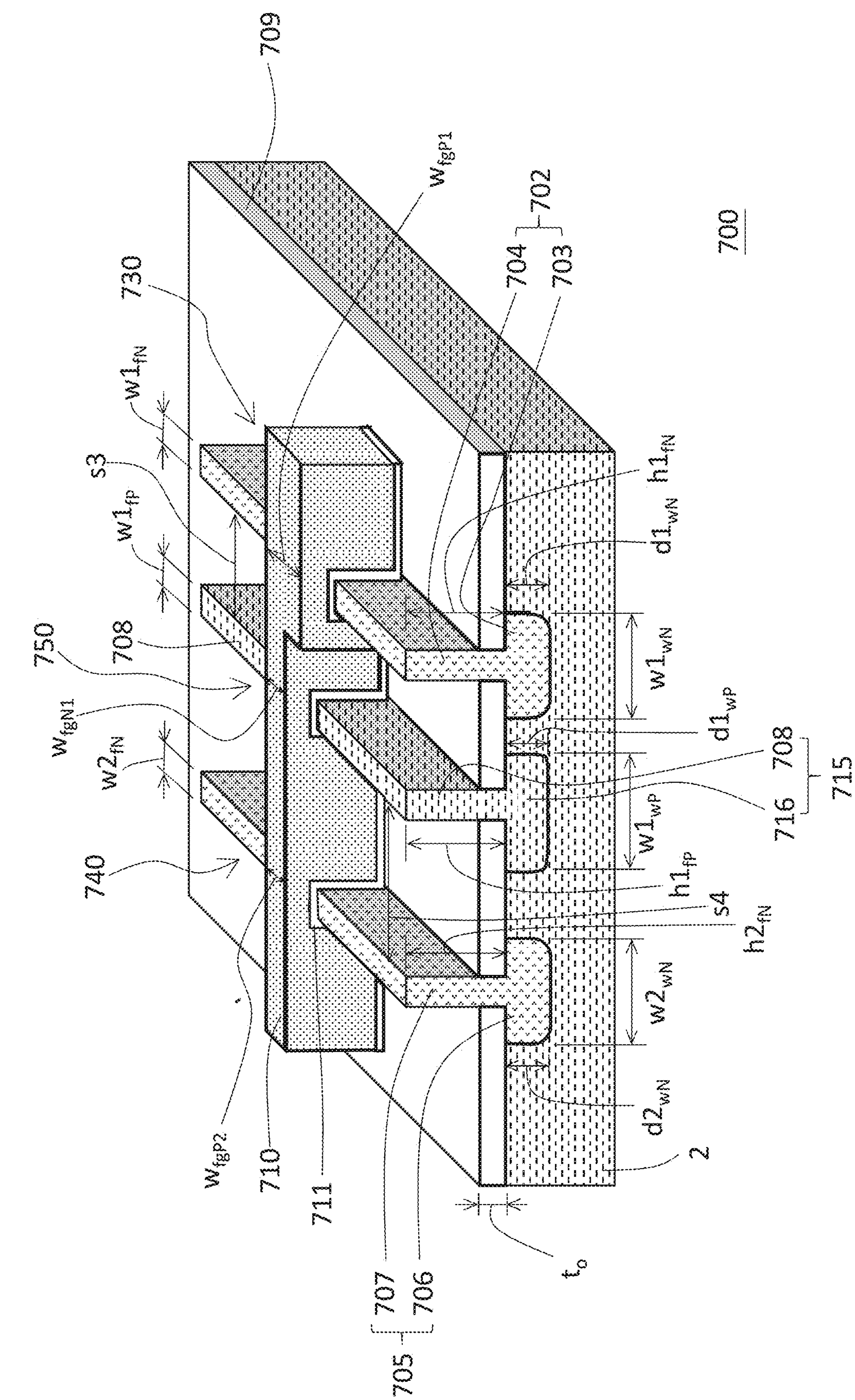
FIGS. 4B and 4C are schematically perspective views showing various structures for a third type of non-volatile memory cell in accordance with an embodiment of the present application.

FIG. 4A is a circuit diagram illustrating a third type of non-volatile memory cell in accordance with an embodiment of the present application. FIG. 4B is a schematically perspective view showing a structure for a third type of non-volatile memory cell in accordance with an embodiment of the present application. Referring to FIGS. 4A and 4B, the third type of non-volatile memory cell 700, i.e. FGCMOS NVM cell, maybe formed on a P-type or N-type semiconductor substrate 2, e.g., silicon substrate. In this case, a P-type silicon substrate 2 coupling to the voltage Vss of ground reference is provided for the third type of non-volatile memory cell 700. The third type of non-volatile memory cell 700 may include:

(1) a first N-type stripe 702 formed with an N-type well 703 in the P-type silicon substrate 2 and an N-type fin 704 vertically protruding from the a top surface of the N-type well 703 and extending in a first direction, wherein the N-type well 703 may have a depth $d1_{wN}$ between 0.3 and 5 micrometers and a width $w1_{wN}$ between 50 nanometers and 1 micrometer, and the N-type fin 704 may have a height $h1_{fN}$ between 10 and 200 nanometers and a width $w1_{fN}$ between 1 and 100 nanometers;

(2) a second N-type stripe 705 formed with an N-type well 706 in the P-type silicon substrate 2 and an N-type fin 707 vertically protruding from a top surface of the N-type well 706 and extending in the first direction parallel to the N-type fin 704, wherein the N-type well 706 may have a depth $d2_{wN}$ between 0.3 and 5 micrometers and a width $w2_{wN}$ between 50 nanometers and 1 micrometer, and the N-type fin 707 may have a height $h2_{fN}$ between 10 and 200 nanometers and a width $w2_{fN}$ between 1 and 100 nanometers;

(3) a P-type stripe 715 formed with a P-type well 716 in the P-type silicon substrate 2 and a P-type fin 708 vertically protruding from the a top surface of the P-type well 716 and extending in the first direction parallel to each of the N-type fins 704 and 707, wherein the P-type well 716 may have a depth $d1_{wP}$ between 0.3 and 5 micrometers and a width $w1_{wP}$ between 50 nanometers and 1 micrometer, wherein the P-type fin 708 may have a height $h1_{fP}$ between 10 and 200 nanometers and a width $w1_{fP}$ between 1 and 100 nanometers, wherein a space s3 between the N-type fin 704 and P-type fin 708 may range from 100 to 2,000 nanometers and a space s4 between the N-type fin 707 and P-type fin 708 may range from 100 to 2,000 nanometers;

(4) a field oxide 709, such as silicon oxide, on the P-type well 716 and N-type wells 703 and 706 and over the P-type silicon substrate 2, wherein the field oxide 709 may have a thickness t, between 20 and 500 nanometers;

(5) a floating gate 710, such as polysilicon, tungsten, tungsten nitride, titanium, titanium nitride, tantalum, tantalum nitride, copper-containing metal, aluminum-containing metal, or other conductive metals, transversely extending in a second direction substantially vertical to the first direction, over the field oxide 709 and from the N-type fin 704 of the first N-type stripe 702 to the N-type fin 707 of the second N-type stripe 705 across over the P-type fin 708, wherein the floating gate 710 may have a width $w_{fgP1}$ over the N-type fin 704 of the first N-type stripe 702, which may be greater than or equal to a width $w_{fgN1}$ thereof over the P-type fin 708 and greater than or equal to a width $w_{fgP2}$ thereof over the N-type fin 707 of the second N-type stripe 705, wherein the width $w_{fgP1}$ over the N-type fin 704 of the first N-type stripe 702 may be equal to between 1 and 10 times or between 1.5 and 5 times of the width $w_{fgN1}$ over the P-type fin 708 and, for example, equal to 2 times of the width $w_{fgN1}$ over the P-type fin 708, and the width $w_{fgP1}$ over the N-type fin 704 of the first N-type stripe 702 may be equal to between 1 and 10 times or between 1.5 and 5 times of the width $w_{fgP2}$ over the N-type fin 707 of the second N-type stripe 705 and, for example, equal to 2 times of the width $w_{fgP2}$ over the N-type fin 707 of the second N-type stripe 705, wherein the width $w_{fgP1}$ over the N-type fin 704 of the first N-type stripe 702 may range from 1 to 25 nanometers, the width $w_{fgP2}$ over the N-type fin 707 of the second N-type stripe 705 may range from 1 to 25 nanometers, and the width $w_{fgN1}$ over the P-type fin 708 may range from 1 to 25 nanometers; and (6) a gate oxide 711, such as silicon oxide, hafnium-containing oxide, zirconium-containing oxide or titanium-containing oxide, transversely extending in the second direction, on the field oxide 709 and from the N-type fin 704 of the first N-type stripe 702 to the N-type fin 707 of the second N-type stripe 705 across over the P-type fin 708 to be provided on each of a top and opposite sidewalls of the N-type fin 704, on each of a top and opposite sidewalls of the N-type fin 707, on each of a top and opposite sidewalls of the P-type fin 708, between the floating gate 710 and each of the top and opposite sidewalls of the N-type fin 704, between the floating gate 710 and each of the top and opposite sidewalls of the N-type fin 707, between the floating gate 710 and each of the top and opposite sidewalls of the P-type fin 708 and between the floating gate 710 and the field oxide 709, wherein the gate oxide 711 may have a thickness between 1 and 5 nanometers.

Figure 4C:
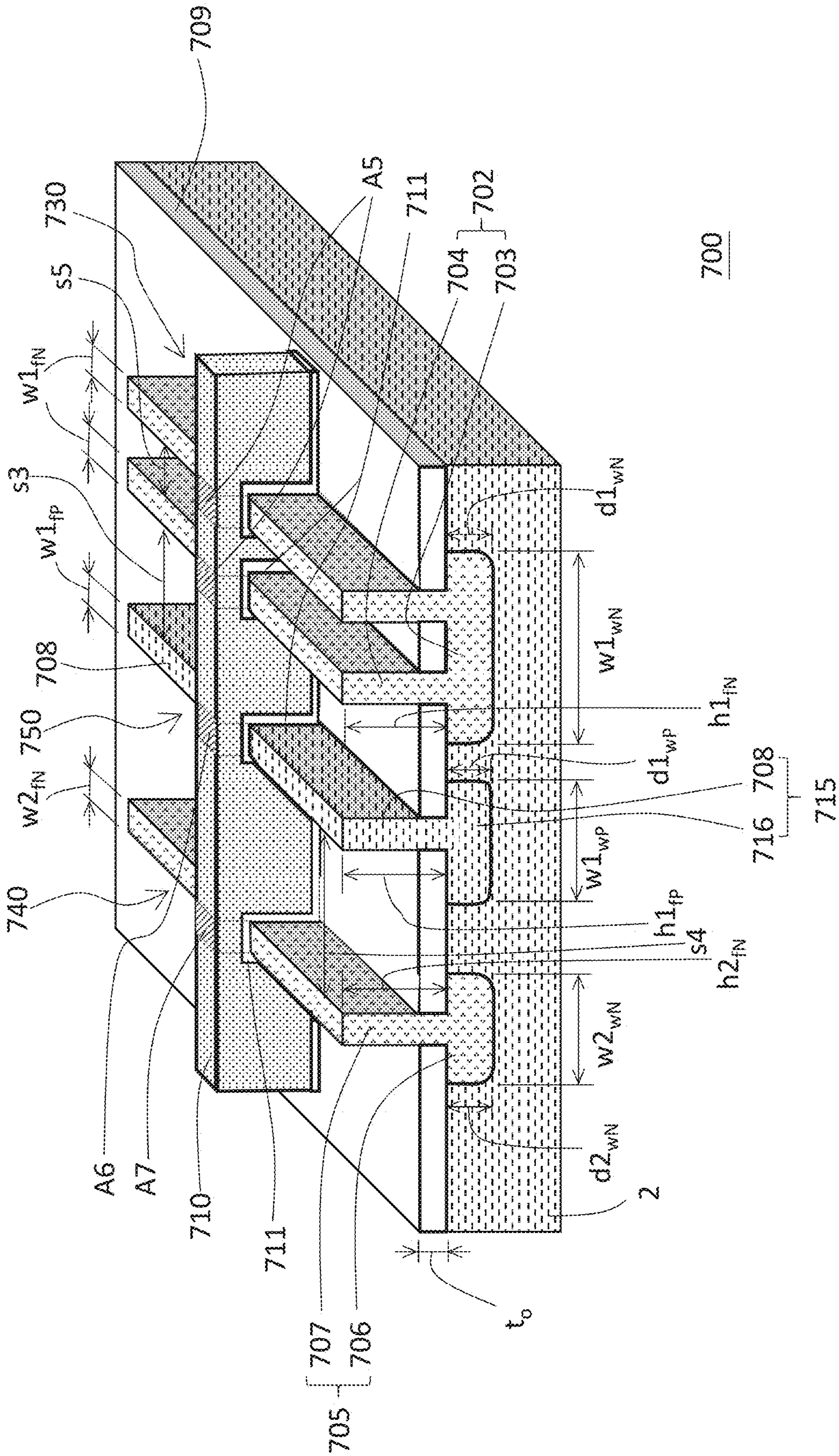

Alternatively, FIG. 4C is a schematically perspective view showing another structure for a third type of non-volatile memory cell in accordance with an embodiment of the present application. For an element indicated by the same reference number shown in FIGS. 4B and 4C, the specification of the element as seen in FIG. 4C may be referred to that of the element as illustrated in FIG. 4B. The difference between the scheme illustrated in FIG. 4B and the scheme illustrated in FIG. 4C is mentioned as below. Referring to FIG. 4C, a plurality of N-type fins, the specification for each of which may be referred to that for the N-type fin 704, arranged in parallel to each other or one another may be formed to vertically protrude from the N-type well 703, wherein each of the plurality of N-type fins 704 may have substantially the same height $h1_{fN}$ between 10 and 200 nanometers and substantially the same width $w1_{fN}$ between 1 and 100 nanometers, wherein the combination of the plurality of N-type fins 704 may be made for a P-type fin field-effect transistor (FinFET). The space s3 between the P-type fin 708 and one of the N-type fins 704 next to the P-type fin 708 may range from 100 to 2,000 nanometers. A space s5 between neighboring two of the N-type fins 704 may range from 2 to 200 nanometers. The N-type fins 704 may have the number between 1 and 10 and for example the number of two in this case. The floating gate 710 may transversely extend over the field oxide 709 and from the N-type fins 704 to the N-type fin 707 across over the P-type fin 708, wherein the floating gate 710 may have a total area A5 vertically over the N-type fins 704, which may be greater than or equal to a total area A6 thereof vertically over the P-type fin 705 and greater than or equal to a total area A7 thereof vertically over the N-type fin 707, wherein the total area A5 may be equal to between 1 and 10 times or between 1.5 and 5 times of the total area A6 and, for example, equal to 2 times of the total area A6, and the total area A5 may be equal to between 1 and 10 times or between 1.5 and 5 times of the total area A7 and, for example, equal to 2 times of the total area A7, wherein the total area A5 may range from 1 to 2,500 square nanometers, the total area A6 may range from 1 to 2,500 square nanometers and the total area A7 may range from 1 to 2,500 square nanometers.

Referring to FIGS. 4A and 4B, a first P-type metal-oxide-semiconductor (MOS) transistor 730 may be formed by a FINFET process technology, which is provided by the floating gate 710, the N-type fin 704 and the gate oxide 711 between the floating gate 710 and the N-type fin 704, wherein the first P-type metal-oxide-semiconductor (MOS) transistor 730 includes two $P^+$ portions doped with P-type impurities or atoms, such as boron impurities or atoms, in the N-type fin 704 at two opposite sides of the gate oxide 711. The P-type impurities or atoms in the two $P^+$ portions of the first P-type metal-oxide-semiconductor (MOS) transistor 730 may have a concentration greater than those in the P-type well 716.

Alternatively, referring to FIGS. 4A and 4C, the first P-type metal-oxide-semiconductor (MOS) transistor 730 may be formed by a FINFET process technology, which is provided by the floating gate 710, the plurality of N-type fins 704 and the gate oxide 711 between the floating gate 710 and the plurality of N-type fins 704, wherein the first P-type metal-oxide-semiconductor (MOS) transistor 730 includes two $P^+$ portions doped with P-type impurities or atoms, such as boron impurities or atoms, in each of the plurality of N-type fins 704 at two opposite sides of the gate oxide 711. The P-type impurities or atoms in the two $P^+$ portions of the first P-type metal-oxide-semiconductor (MOS) transistor 730 may have a concentration greater than those in the P-type well 716.

Referring to FIGS. 4A-4C, a second P-type metal-oxide-semiconductor (MOS) transistor 740, i.e., P-type metal-oxide-semiconductor (MOS) capacitor, may be formed by a FINFET process technology, which is provided by the floating gate 710, the N-type fin 707 and the gate oxide 711 between the floating gate 710 and the N-type fin 707, wherein the second P-type metal-oxide-semiconductor (MOS) transistor 740 includes two $P^+$ portions doped with P-type impurities or atoms, such as boron impurities or atoms, in the N-type fin 707 at two opposite sides of the gate oxide 711. The P-type impurities or atoms in the two $P^+$ portions of the second P-type metal-oxide-semiconductor (MOS) transistor 740 may have a concentration greater than those in the P-type well 716.

Referring to FIGS. 4A-4C, an N-type metal-oxide-semiconductor (MOS) transistor 750 may be formed by a FINFET process technology, which is provided by the floating gate 710, the P-type fin 708 and the gate oxide 711 between the floating gate 710 and the P-type fin 708, wherein the N-type metal-oxide-semiconductor (MOS) transistor 750 includes two $N^+$ portions doped with N-type impurities or atoms, such as arsenic or phosphorus impurities or atoms, in the P-type fin 708 at two opposite sides of the gate oxide 711. The N-type impurities or atoms in the two $N^+$ portions of the N-type metal-oxide-semiconductor (MOS) transistor 750 may have a concentration greater than those in each of the N-type wells 703 and 706.

Thereby, referring to FIGS. 4A-4C, the first P-type MOS transistor 730 may have a gate capacitance greater than or equal to that of the second P-type MOS transistor 740 and greater than or equal to that of the N-type MOS transistor 750. The gate capacitance of the first P-type MOS transistor 730 may be equal to between 1 and 10 times or between 1.5 and 5 times of the gate capacitance of the second P-type MOS transistor 740 and, for example, equal to 2 times of the gate capacitance of the second P-type MOS transistor 740. The gate capacitance of the first P-type MOS transistor 730 may be equal to between 1 and 10 times or between 1.5 and 5 times of the gate capacitance of the N-type MOS transistor 750 and, for example, equal to 2 times of the gate capacitance of the N-type MOS transistor 750. The gate capacitance of the N-type MOS transistor 750 may range from 0.1 aF to 10 fF, the gate capacitance of the first P-type MOS transistor 730 may range from 0.1 aF to 10 fF, and the gate capacitance of the second P-type MOS transistor 740 may range from 0.1 aF to 10 fF.

Referring to FIGS. 4A-4C, the floating gate 710 coupling a gate terminal of the first P-type MOS transistor 730, a gate terminal of the second P-type MOS transistor 740 and a gate terminal of the N-type MOS transistor 750 with one another is configured to catch electrons therein. The first P-type MOS transistor 730 is configured to form a channel having two ends opposite to each other, one of which couples to a node N3 coupling to its N-type well 703 and the other of which couples to a node N0. The second P-type MOS transistor 740 is configured to form a channel having two ends opposite to each other, both of which couples to a node N2 coupling to its N-type well 706. The N-type MOS transistor 750 is configured to form a channel having two ends opposite to each other, one of which couples to a node N4 coupling to the P-type well 716 and the other of which couples to the node N0.

Referring to FIGS. 4A-4C, when the floating gate 710 is being erased, (1) the node N2 may be switched to couple to an erasing voltage $V_{Er}$, (2) the node N4 may be switched to couple to the voltage Vss of ground reference, (3) the node N3 may be switched to couple to the voltage Vss of ground reference and (4) the node N0 may be switched to be floating or to couple to the voltage Vss of ground reference. Since the gate capacitance of the second P-type MOS transistor 740 is smaller than the sum of the gate capacitances of the first P-type MOS transistor 730 and the N-type MOS transistor 750, the voltage difference between the floating gate 710 and the node N2 is large enough to cause electron tunneling. Accordingly, electrons trapped in the floating gate 710 may tunnel through the gate oxide 711 to the node N2. Thereby, the floating gate 710 may be erased to a logic level of "1".

Referring to FIGS. 4A-4C, after the third type of non-volatile memory cell 700 is erased, the floating gate 710 may be positively charged to a logic level of "1" to turn on the N-type MOS transistor 750 and off the first and second P-type MOS transistors 730 and 740. In this situation, when the floating gate 710 is being programmed, (1) the node N2 may be switched to couple to a programming voltage $V_{Pr}$, (2) the node N4 may be switched to couple to the voltage Vss of ground reference, (3) the node N3 may be switched to couple to the programming voltage $V_{Pr}$ and (4) the node N0 may be switched to be floating. Since the gate capacitance of the N-type MOS transistor 750 is smaller than the sum of the gate capacitances of the first and second P-type MOS transistor 730 and 740, the voltage difference between the floating gate 710 and the node N4 is large enough to cause electron tunneling. Accordingly, electrons may tunnel through the gate oxide 711 from the node N4 to the floating gate 710 to be trapped in the floating gate 710. Thereby, the floating gate 710 may be programmed to a logic level of "0".

Referring to FIGS. 4A-4C, in operation of the third type of non-volatile memory cell 700, (1) the node N2 may be switched to couple to a voltage between the voltage Vcc of power supply and the voltage Vss of ground reference, such as the voltage Vcc of power supply, the voltage Vss of ground reference or a half of the voltage Vcc of power supply, or switched to be floating, (2) the node N4 may be switched to couple to the voltage Vss of ground reference, (3) the node N3 may be switched to couple to the voltage Vcc of power supply and (4) the node N0 may be switched to act as an output point of the third type of non-volatile memory cell 700. When the floating gate 710 is positively charged to a logic level of "1", the first P-type MOS transistor 730 may be turned off and the N-type MOS transistor 750 may be turned on to couple the node N4 to the node N0 through the channel of the N-type MOS transistor 750. Thereby, the data output of the third type of non-volatile memory cell 700 at the node N0 may be at a logic level of "0". When the floating gate 710 is negatively charged to a logic level of "0", the first P-type MOS transistor 730 may be turned on and the N-type MOS transistor 750 may be turned off to couple the node N3 to the node N0 through the channel of the first P-type MOS transistor 730. Thereby, the data output of the third type of non-volatile memory cell 700 at the node N0 may be at a logic level of "1".

IV. Fourth Type of Non-Volatile Memory Cells

Figure 5A:
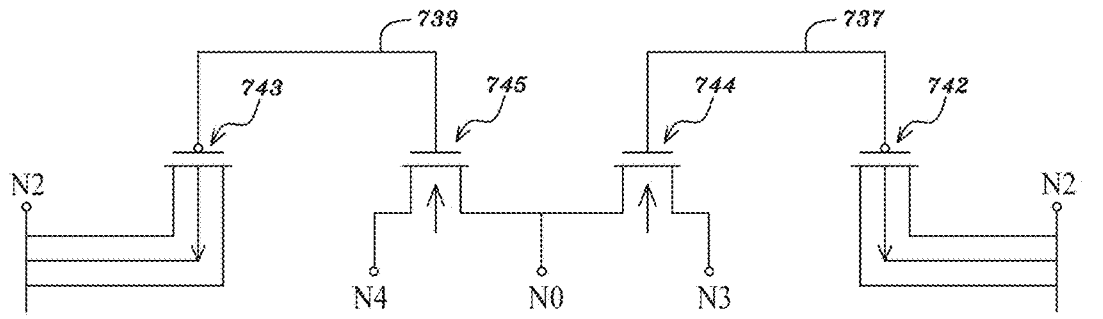
FIG. 5A is a circuit diagram illustrating a fourth type of non-volatile memory cell in accordance with an embodiment of the present application.
Figure 5B:
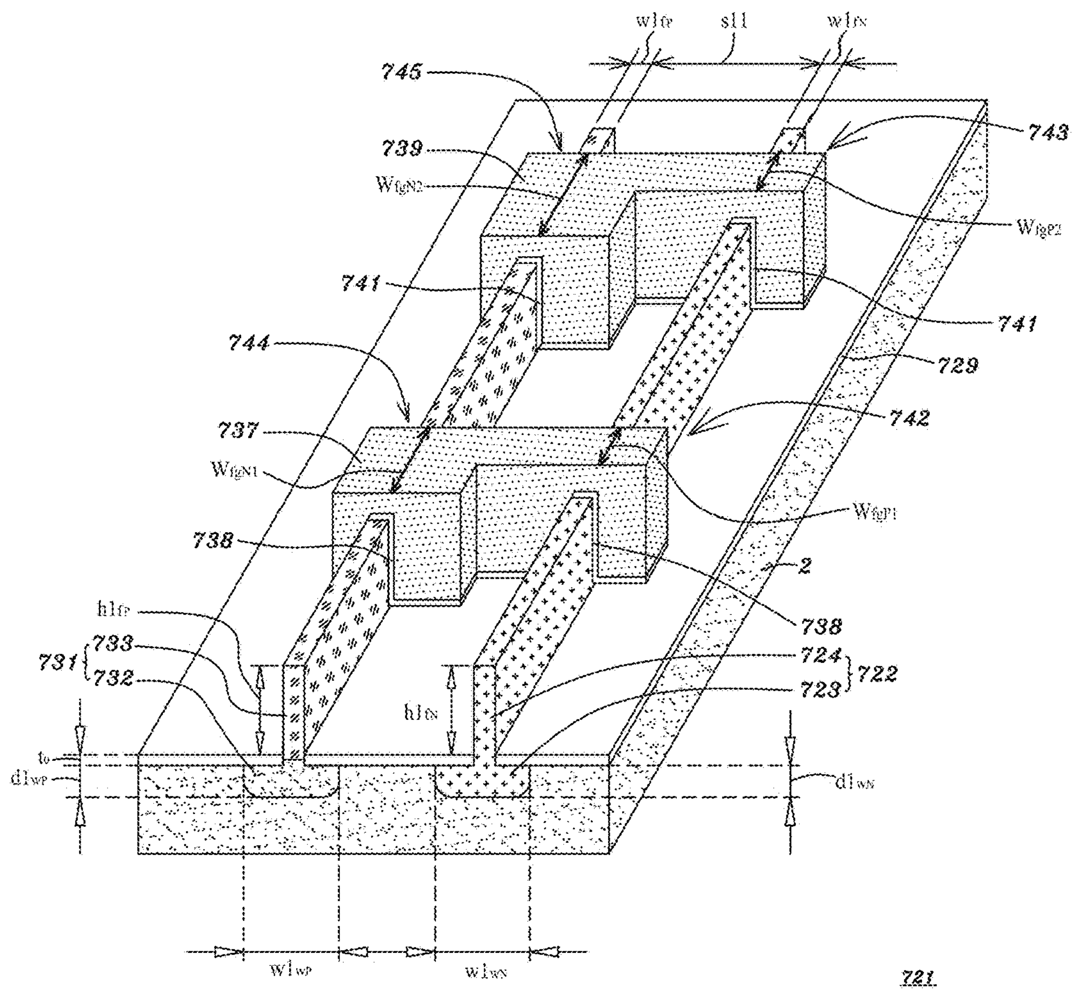
FIGS. 5B-5D are schematically perspective views showing various structures for a fourth type of non-volatile memory cell in accordance with an embodiment of the present application.

FIG. 5A is a circuit diagram illustrating a fourth type of non-volatile memory cell in accordance with an embodiment of the present application. FIG. 5B is a schematically perspective view showing a structure for a fourth type of non-volatile memory cell in accordance with an embodiment of the present application. Referring to FIGS. 5A and 5B, the fourth type of non-volatile memory cell 721 maybe formed on a P-type or N-type semiconductor substrate 2, e.g., silicon substrate. In this case, a P-type silicon substrate 2 coupling to the voltage Vss of ground reference is provided for the fourth type of non-volatile memory cell 721. The fourth type of non-volatile memory cell 721 may include:

(1) an N-type stripe 722 formed with an N-type well 723 in the P-type silicon substrate 2 and an N-type fin 724 vertically protruding from the a top surface of the N-type well 723 and extending in a first direction, wherein the N-type well 723 may have a depth $d1_{wN}$ between 0.3 and 5 micrometers and a width $w1_{wN}$ between 50 nanometers and 1 micrometer, and the N-type fin 724 may have a height $h1_{fN}$ between 10 and 200 nanometers and a width $w1_{fN}$ between 1 and 100 nanometers;

(2) a P-type stripe 731 formed with a P-type well 732 in the P-type silicon substrate 2 and a P-type fin 733 vertically protruding from the a top surface of the P-type well 732 and extending in the first direction parallel to the N-type fin 724, wherein the P-type well 732 may have a depth $d1_{wP}$ between 0.3 and 5 micrometers and a width $w1_{wP}$ between 50 nanometers and 1 micrometer, wherein the P-type fin 733 may have a height $h1_{fP}$ between 10 and 200 nanometers and a width $w1_{fP}$ between 1 and 100 nanometers, wherein a space s11 between the N-type fin 724 and P-type fin 733 may range from 100 to 2,000 nanometers;

(3) a field oxide 729, such as silicon oxide, on the P-type well 732 and N-type well 723 and over the P-type silicon substrate 2, wherein the field oxide 729 may have a thickness $t_s$ between 20 and 500 nanometers;

(4) a first floating gate 737, such as polysilicon, tungsten, tungsten nitride, titanium, titanium nitride, tantalum, tantalum nitride, copper-containing metal, aluminum-containing metal, or other conductive metals, transversely extending in a second direction substantially vertical to the first direction, over the field oxide 729 and from the N-type fin 724 to the P-type fin 733, wherein the first floating gate 737 may have a width $w_{fgP1}$ over the N-type fin 724 and a width $w_{fgN1}$ over the P-type fin 733;

(5) a second floating gate 739, such as polysilicon, tungsten, tungsten nitride, titanium, titanium nitride, tantalum, tantalum nitride, copper-containing metal, aluminum-containing metal, or other conductive metals, transversely extending in the second direction substantially parallel to the first floating gate 737, over the field oxide 729 and from the N-type fin 724 to the P-type fin 733, wherein the second floating gate 739 may have a width $w_{fgP2}$ over the N-type fin 724 and a width $w_{fgN2}$ over the P-type fin 733, wherein each of the widths $w_{fgN1}$ and $w_{fgN2}$ over the P-type fin 733 may be greater than or equal to each of the widths $w_{fgP1}$ and $w_{fgP2}$ over the N-type fin 724, the widths $w_{fgN1}$ and $w_{fgN2}$ over the P-type fin 733 may be substantially the same, and the widths $w_{fgP1}$ and $w_{fgP2}$ over the N-type fin 724 may be substantially the same, wherein each of the widths $w_{fgN1}$ and $w_{fgN2}$ over the P-type fin 733 may be equal to between 1 and 10 times or between 1.5 and 5 times of each of the widths $w_{fgP1}$ and $w_{fgP2}$ over the N-type fin 724, and, for example, equal to 2 times of each of the widths $w_{fgP1}$ and $w_{fgP2}$ over the N-type fin 724, wherein each of the widths $w_{fgN1}$ and $w_{fgN2}$ over the P-type fins 733 and the widths $w_{fgP1}$ and $w_{fgP2}$ over the N-type fin 724 may range from 1 to 25 nanometers;

(6) a first gate oxide 738, such as silicon oxide, hafnium-containing oxide, zirconium-containing oxide or titanium-containing oxide, transversely extending in the second direction, on the field oxide 729 and from the N-type fin 724 to the P-type fin 733 to be provided on each of a top and opposite sidewalls of the N-type fin 724, on each of a top and opposite sidewalls of the P-type fin 733, between the first floating gate 737 and each of the top and opposite sidewalls of the N-type fin 724, between the first floating gate 737 and each of the top and opposite sidewalls of the P-type fin 733, and between the first floating gate 737 and the field oxide 729, wherein the first gate oxide 738 may have a thickness between 1 and 5 nanometers; and (7) a second gate oxide 741, such as silicon oxide, hafnium-containing oxide, zirconium-containing oxide or titanium-containing oxide, transversely extending in the second direction, on the field oxide 729 and from the N-type fin 724 to the P-type fin 733 to be provided on each of a top and opposite sidewalls of the N-type fin 724, on each of a top and opposite sidewalls of the P-type fin 733, between the second floating gate 739 and each of the top and opposite sidewalls of the N-type fin 724, between the second floating gate 739 and each of the top and opposite sidewalls of the P-type fin 733, and between the second floating gate 739 and the field oxide 729, wherein the second gate oxide 741 may have a thickness between 1 and 5 nanometers.

Figure 5C:
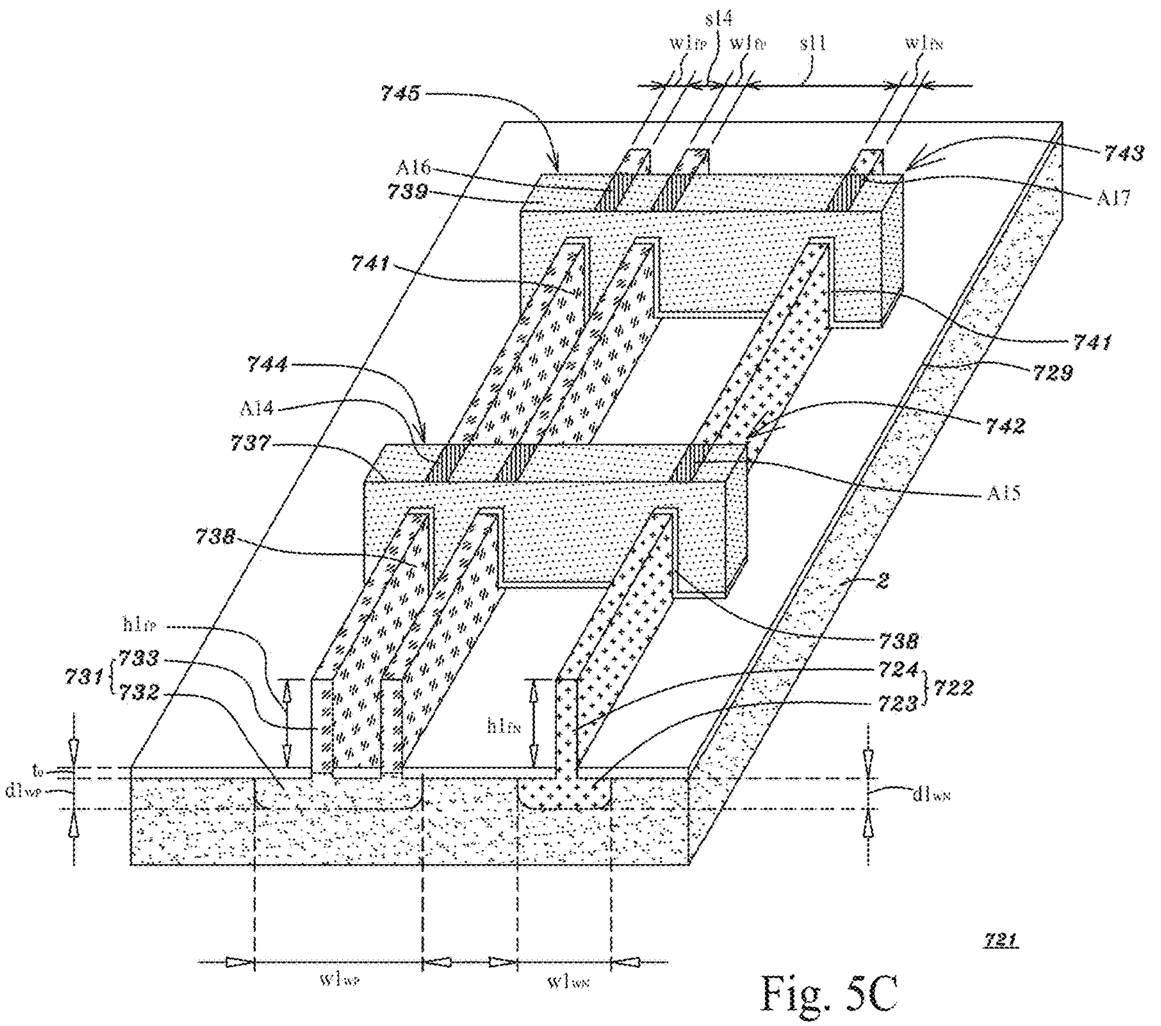

Alternatively, FIG. 5C is a schematically perspective view showing another structure for a fourth type of non-volatile memory cell in accordance with an embodiment of the present application. For an element indicated by the same reference number shown in FIGS. 5B and 5C, the specification of the element as seen in FIG. 5C may be referred to that of the element as illustrated in FIG. 5B. The difference between the scheme illustrated in FIG. 5B and the scheme illustrated in FIG. 5C is mentioned as below. Referring to FIG. 5C, a plurality of P-type fins, the specification for each of which may be referred to that for the P-type fin 733, arranged in parallel to each other or one another may be formed to vertically protrude from the P-type well 732, wherein each of the plurality of P-type fins 733 may have substantially the same height $h1_{fP}$ between 10 and 200 nanometers and substantially the same width $w1_{fP}$ between 1 and 100 nanometers, wherein the combination of the plurality of P-type fins 733 may be made for a N-type fin field-effect transistor (FinFET). The space s11 between the N-type fin 724 and one of the P-type fins 733 next to the N-type fin 724 may range from 100 to 2,000 nanometers. A space s14 between neighboring two of the P-type fins 733 may range from 2 to 200 nanometers. The P-type fins 733 may have the number between 1 and 10 and for example the number of two in this case. Each of the first and second floating gates 737 and 739 may transversely extend over the field oxide 729 and from the N-type fin 724 to the P-type fin 733.

The first floating gate 737 may have a total area A14 vertically over the P-type fins 733 and a total area A15 vertically over the N-type fin 724, and the second floating gate 739 may have a total area A16 vertically over the P-type fins 733 and a total area A17 vertically over the N-type fin 727. The total area A14 may be greater than or equal to the total area A15 and greater than or equal to the total area A17. The total area A16 may be greater than or equal to the total area A15 and greater than or equal to the total area A17. The total area A14 may be equal to between 1 and 10 times or between 1.5 and 5 times of the total area A15 and, for example, equal to 2 times of the total area A15, and the total area A14 may be equal to between 1 and 10 times or between 1.5 and 5 times of the total area A17 and, for example, equal to 2 times of the total area A17. The total area A16 may be equal to between 1 and 10 times or between 1.5 and 5 times of the total area A15 and, for example, equal to 2 times of the total area A15, and the total area A16 may be equal to between 1 and 10 times or between 1.5 and 5 times of the total area A17 and, for example, equal to 2 times of the total area A17. The total area A14 may range from 1 to 2,500 square nanometers, the total area A15 may range from 1 to 2,500 square nanometers, the total area A16 may range from 1 to 2,500 square nanometers and the total area A17 may range from 1 to 2,500 square nanometers.

Referring to FIGS. 5A-5C, a first P-type metal-oxide-semiconductor (MOS) capacitor 742 may be formed by a FINFET process technology, which is provided by the first floating gate 737, the N-type fin 724 and the first gate oxide 738 between the first floating gate 737 and the N-type fin 724, wherein the first P-type metal-oxide-semiconductor (MOS) capacitor 742 includes two $N^+$ portions doped with N-type impurities or atoms, such as arsenic or phosphorus impurities or atoms, in the N-type fin 724 at two opposite sides of the first gate oxide 738. A second P-type metal-oxide-semiconductor (MOS) capacitor 743 may be formed by a FINFET process technology, which is provided by the second floating gate 739, the N-type fin 724 and the second gate oxide 741 between the second floating gate 739 and the N-type fin 724, wherein the second P-type metal-oxide-semiconductor (MOS) capacitor 743 includes two $N^+$ portions doped with N-type impurities or atoms, such as arsenic or phosphorus impurities or atoms, in the N-type fin 724 at two opposite sides of the second gate oxide 741. The N-type impurities or atoms in the two $N^+$ portions of each of the first and second P-type metal-oxide-semiconductor (MOS) capacitors 742 and 743 may have a concentration greater than those in the N-type well 723.

Referring to FIGS. 5A and 5B, a first N-type metal-oxide-semiconductor (MOS) transistor 744 may be formed by a FINFET process technology, which is provided by the first floating gate 737, the P-type fin 733 and the first gate oxide 738 between the first floating gate 737 and the P-type fin 733, wherein the first N-type metal-oxide-semiconductor (MOS) transistor 744 includes two $N^+$ portions doped with N-type impurities or atoms, such as arsenic or phosphorus impurities or atoms, in the P-type fin 733 at two opposite sides of the first gate oxide 738. A second N-type metal-oxide-semiconductor (MOS) transistor 745 may be formed by a FINFET process technology, which is provided by the second floating gate 739, the P-type fin 733 and the second gate oxide 741 between the second floating gate 739 and the P-type fin 733, wherein the second N-type metal-oxide-semiconductor (MOS) transistor 745 includes two $N^+$ portions doped with N-type impurities or atoms, such as arsenic or phosphorus impurities or atoms, in the P-type fin 733 at two opposite sides of the second gate oxide 741. The N-type impurities or atoms in the two $N^+$ portions of each of the first and second N-type metal-oxide-semiconductor (MOS) transistors 744 and 745 may have a concentration greater than those in the N-type well 723.

Alternatively, referring to FIGS. 5A and 5C, the first N-type metal-oxide-semiconductor (MOS) transistor 744 may be formed by a FINFET process technology, which is provided by the first floating gate 737, the plurality of P-type fins 733 and the first gate oxide 738 between the first floating gate 737 and the plurality of P-type fins 733, wherein the first N-type metal-oxide-semiconductor (MOS) transistor 744 includes two $N^+$ portions doped with N-type impurities or atoms, such as arsenic or phosphorus impurities or atoms, in each of the plurality of P-type fins 733 at two opposite sides of the first gate oxide 738. The second N-type metal-oxide-semiconductor (MOS) transistor 745 may be formed by a FINFET process technology, which is provided by the second floating gate 739, the plurality of P-type fins 733 and the second gate oxide 741 between the second floating gate 739 and the plurality of P-type fins 733, wherein the second N-type metal-oxide-semiconductor (MOS) transistor 745 includes two $N^+$ portions doped with N-type impurities or atoms, such as arsenic or phosphorus impurities or atoms, in each of the plurality of P-type fins 733 at two opposite sides of the second gate oxide 741. The N-type impurities or atoms in the two $N^+$ portions of each of the first and second N-type metal-oxide-semiconductor (MOS) transistors 744 and 745 may have a concentration greater than those in the N-type well 723.

Figure 5D:
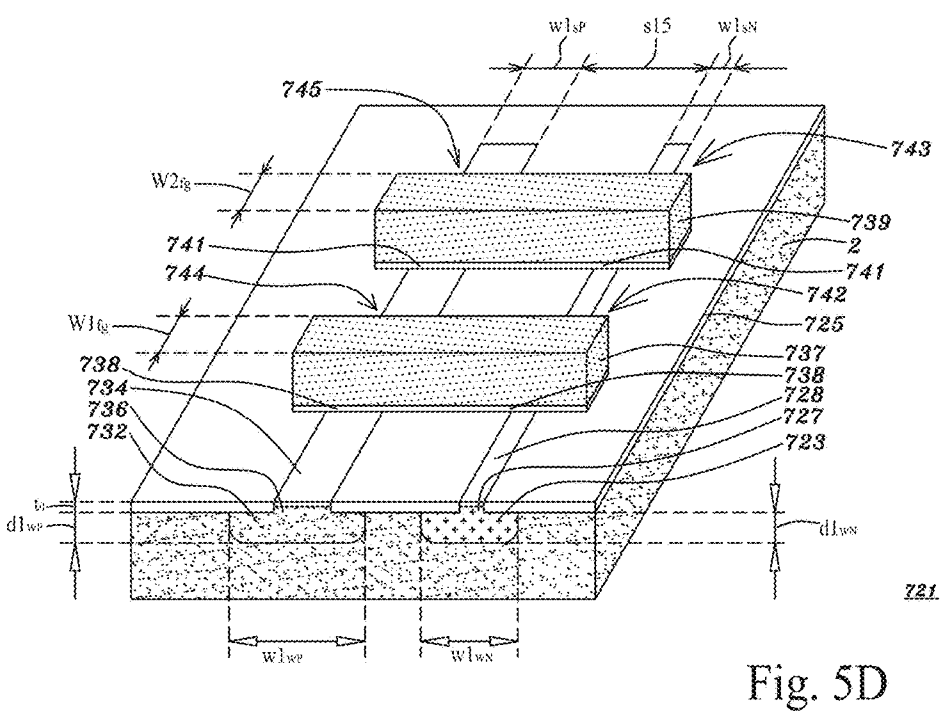

Alternatively, FIG. 5D is a schematically perspective view showing another structure for a fourth type of non-volatile memory cell in accordance with an embodiment of the present application. Referring to FIG. 5D, the fourth type of non-volatile memory cell 721 maybe formed on a P-type or N-type semiconductor substrate 2, e.g., silicon substrate. In this case, a P-type silicon substrate 2 coupling to the voltage Vss of ground reference is provided for the fourth type of non-volatile memory cell 721. The fourth type of non-volatile memory cell 721 may include:

(1) an N-type well 723 in the P-type silicon substrate 2, wherein the N-type well 723 may have a depth $d1_{wN}$ between 0.3 and 5 micrometers and a width $w1_{wN}$ between 50 nanometers and 1 micrometer, wherein an N-type diffusion region 728 is in the N-type well 723 at a top surface thereof;

(2) a P-type well 732 in the P-type silicon substrate 2, wherein the P-type well 732 may have a depth $d1_{wP}$ between 0.3 and 5 micrometers and a width $w1_{wP}$ between 50 nanometers and 1 micrometer, wherein a P-type diffusion region 734 is in the P-type well 732 at a top surface thereof;

(3) a field oxide 725, such as silicon oxide, on the P-type well 735 and N-type well 726 and over the P-type silicon substrate 2, wherein the N-type well 726 has a N-type stripe region 727 not covered by the field oxide 725 and the P-type well 735 has a P-type stripe region 736 not covered by the field oxide 725, wherein the N-type stripe region 727 extends in a first direction and has a width $w1_{sN}$ between 20 and 200 nm, and the P-type stripe region 736 extends in the first direction and parallel to the N-type stripe region 727 and has a width w1, between 40 and 400 nm, wherein the width $w1_{sp}$ may be equal to between 1 and 5 times or between 1.5 and 3 times of the width $w1_{sN}$, wherein a space s15 between the N-type and P-type stripe regions 727 and 736 may range from 40 to 1000 nanometers;

(4) a first floating gate 737, such as polysilicon, tungsten, tungsten nitride, titanium, titanium nitride, tantalum, tantalum nitride, copper-containing metal, aluminum-containing metal, or other conductive metals, transversely extending in a second direction substantially vertical to the first direction, over the field oxide 725 and from the N-type stripe region 727 to the P-type stripe region 736, wherein the first floating gate 737 may have a width $w1_{fg}$ ranging from 20 to 500 nm;

(5) a second floating gate 739, such as polysilicon, tungsten, tungsten nitride, titanium, titanium nitride, tantalum, tantalum nitride, copper-containing metal, aluminum-containing metal, or other conductive metals, transversely extending in the second direction parallel to the first floating gate 737, over the field oxide 725 and from the N-type stripe region 727 to the P-type stripe region 736, wherein the second floating gate 739 may have a width $w2_{fg}$ ranging from 20 to 500 nm;

(6) a first gate oxide 738, such as silicon oxide, hafnium-containing oxide, zirconium-containing oxide or titanium-containing oxide, transversely extending in the second direction, on the field oxide 725 and from the N-type stripe region 727 to the P-type stripe region 736 to be provided on a top planar surface of the N-type stripe region 727, on a top planar surface of the P-type stripe region 736, between the first floating gate 737 and the top planar surface of the N-type stripe region 727, between the first floating gate 737 and the top planar surface of the P-type stripe region 736 and between the first floating gate 737 and the field oxide 725, wherein the first gate oxide 738 may have a thickness between 1 and 15 nanometers; and (7) a second gate oxide 741, such as silicon oxide, hafnium-containing oxide, zirconium-containing oxide or titanium-containing oxide, transversely extending in the second direction, on the field oxide 725 and from the N-type stripe region 727 to the P-type stripe region 736 to be provided on a top planar surface of the N-type stripe region 727, on a top planar surface of the P-type stripe region 736, between the second floating gate 739 and the top planar surface of the N-type stripe region 727, between the second floating gate 739 and the top planar surface of the P-type stripe region 736 and between the second floating gate 739 and the field oxide 725, wherein the second gate oxide 741 may have a thickness between 1 and 15 nanometers.

Referring to FIGS. 5A and 5D, the first P-type metal-oxide-semiconductor (MOS) capacitor 742 may be formed by a planar metal-oxide-semiconductor field-effect transistor (MOSFET) process technology, which is provided by the first floating gate 737, the N-type diffusion region 728 and the first gate oxide 738 between the first floating gate 737 and the N-type diffusion region 728, wherein the first P-type metal-oxide-semiconductor (MOS) capacitor 742 includes two $N^+$ portions doped with N-type impurities or atoms, such as arsenic or phosphorus impurities or atoms, in the N-type diffusion region 728 at two opposite sides of the first gate oxide 738. The second P-type metal-oxide-semiconductor (MOS) capacitor 743 may be formed by a planar MOSFET process technology, which is provided by the second floating gate 739, the N-type diffusion region 728 and the second gate oxide 741 between the second floating gate 739 and the N-type diffusion region 728, wherein the second P-type metal-oxide-semiconductor (MOS) capacitor 743 includes two $N^+$ portions doped with N-type impurities or atoms, such as arsenic or phosphorus impurities or atoms, in the N-type diffusion region 728 at two opposite sides of the second gate oxide 741. The N-type impurities or atoms in the two $N^+$ portions of each of the first and second P-type metal-oxide-semiconductor (MOS) capacitors 742 and 743 may have a concentration greater than those in the N-type well 723.

Referring to FIGS. 5A and 5D, the first N-type metal-oxide-semiconductor (MOS) transistor 744 may be formed by a planar MOSFET process technology, which is provided by the first floating gate 737, the P-type diffusion region 734 and the first gate oxide 738 between the first floating gate 737 and the P-type diffusion region 734, wherein the first N-type metal-oxide-semiconductor (MOS) transistor 744 includes two $N^+$ portions doped with N-type impurities or atoms, such as arsenic or phosphorus impurities or atoms, in the P-type diffusion region 734 at two opposite sides of the first gate oxide 738. The second N-type metal-oxide-semiconductor (MOS) transistor 745 may be formed by a planar MOSFET process technology, which is provided by the second floating gate 739, the P-type diffusion region 734 and the second gate oxide 741 between the second floating gate 739 and the P-type diffusion region 734, wherein the second N-type metal-oxide-semiconductor (MOS) transistor 745 includes two $N^+$ portions doped with N-type impurities or atoms, such as arsenic or phosphorus impurities or atoms, in the P-type diffusion region 734 at two opposite sides of the second gate oxide 741. The N-type impurities or atoms in the two $N^+$ portions of each of the first and second N-type metal-oxide-semiconductor (MOS) transistors 744 and 745 may have a concentration greater than those in the N-type well 723.

Figure 5E:
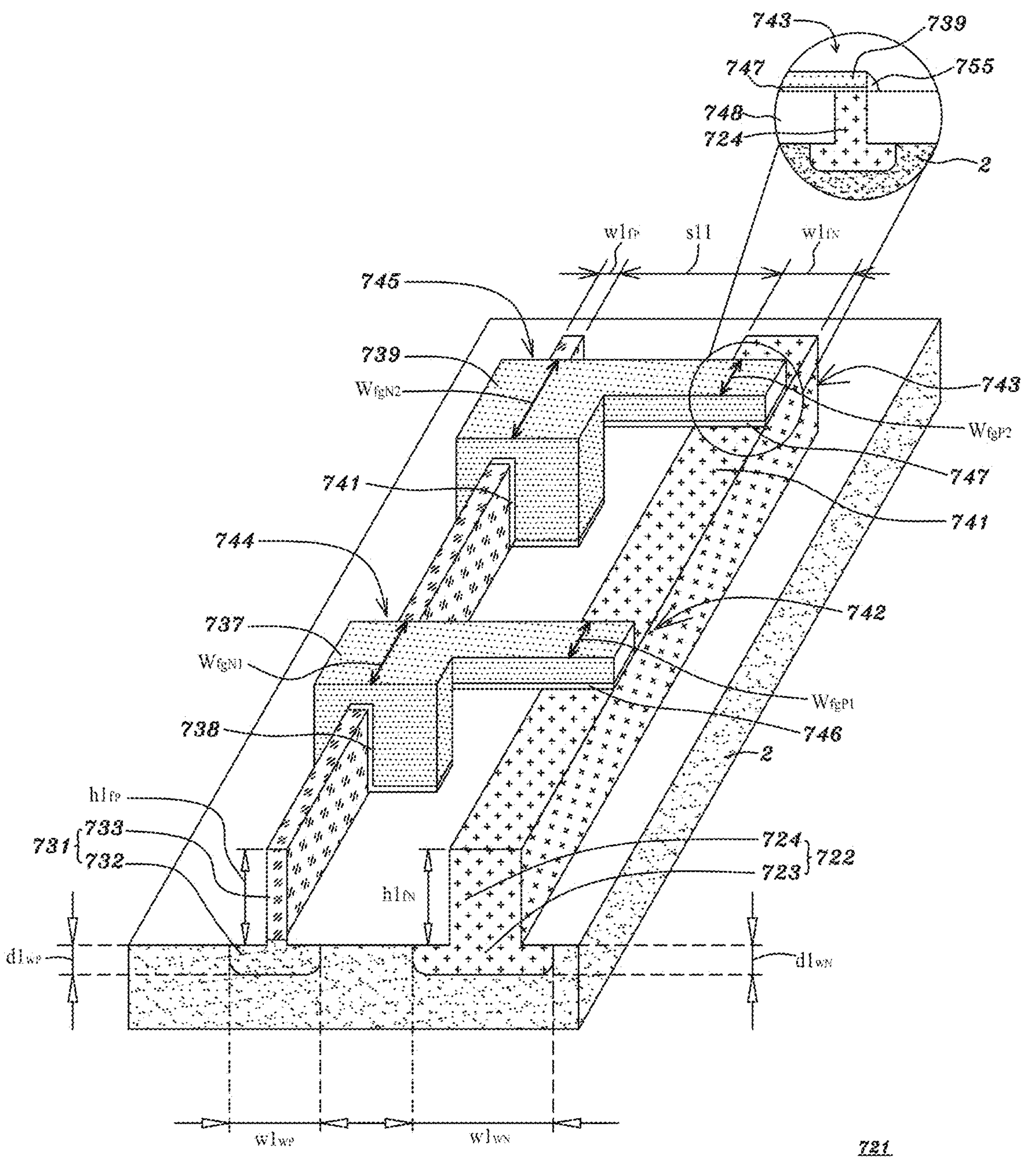
FIG. 5E is a schematically perspective view showing another structure for a fourth type of non-volatile memory cell in accordance with an embodiment of the present application, wherein a drawing at a right upper portion of FIG. 5E is an enlarged cross-sectional view of a P-type metal-oxide-semiconductor (MOS) capacitor.

Alternatively, FIG. 5E is a schematically perspective view showing another structure for a fourth type of non-volatile memory cell in accordance with an embodiment of the present application, wherein a drawing at a right upper portion of FIG. 5E is an enlarged cross-sectional view of a P-type metal-oxide-semiconductor (MOS) capacitor, wherein a field oxide and oxide spacer are further shown in the enlarged cross-sectional view. For an element indicated by the same reference number shown in FIGS. 5B and 5E, the specification of the element as seen in FIG. 5E may be referred to that of the element as illustrated in FIG. 5B. The difference between the scheme illustrated in FIG. 5B and the scheme illustrated in FIG. 5E is mentioned as below. Referring to FIG. 5E, each of the first and second P-type metal-oxide-semiconductor (MOS) capacitors 742 and 743 may be a planar capacitor, that is, the first P-type metal-oxide-semiconductor (MOS) capacitor 742 may include a third gate oxide 746 extending on a top planar surface of the N-type fin 724 and on a top planar surface of a field oxide 748 but not extending on the opposite sidewalls of the N-type fin 724 to be provided between the first floating gate 737 and the top planar surface of the N-type fin 724 and between the first floating gate 737 and the top planar surface of the field oxide 748; the second P-type metal-oxide-semiconductor (MOS) capacitor 743 may include a fourth gate oxide 747 extending on the top planar surface of the N-type fin 724 and on the top planar surface of the field oxide 748 but not extending on the opposite sidewalls of the N-type fin 724 to be provided between the second floating gate 739 and the top planar surface of the N-type fin 724 and between the second floating gate 739 and the top planar surface of the field oxide 748. The field oxide 748, such as silicon oxide, may be formed on the P-type well 732 and N-type well 723 and over the P-type silicon substrate 2, wherein the field oxide 748 may have a thickness between 10 and 200 nanometers, and wherein the P-type fin 733 has a top surface coplanar with the top planar surface of each of the N-type fin 724 and field oxide 748. The third gate oxide 746, such as silicon oxide, hafnium-containing oxide, zirconium-containing oxide or titanium-containing oxide, may have a thickness between 1 and 5 nanometers. The fourth gate oxide 747, such as silicon oxide, hafnium-containing oxide, zirconium-containing oxide or titanium-containing oxide, may have a thickness between 1 and 5 nanometers. The N-type stripe 722 may be formed with the N-type well 723 in the P-type silicon substrate 2 and the N-type fin 724 vertically protruding from the top surface of the N-type well 723 and extending in the first direction, wherein the N-type well 723 may have a depth $d1_{wN}$ between 0.3 and 5 micrometers and a width $w1_{wN}$ between 50 nanometers and 1 micrometer, and the N-type fin 724 may have a height $h1_{fN}$ between 10 and 200 nanometers and a width $w1_{fN}$ between 1 and 100 nanometers, wherein a space s11 between the N-type fin 724 and P-type fin 733 may range from 100 to 2,000 nanometers, wherein the first floating gate 737 may have a width $w_{fgP1}$ over the N-type fin 724, which is smaller than or equal to each of the widths $w_{fgN1}$ and $w_{fgN2}$, and the second floating gate 739 may have a width $w_{fgP2}$ over the N-type fin 724, which is smaller than or equal to each of the widths $w_{fgN1}$ and $w_{fgN2}$, as illustrated in FIG. 5B. In this case, the width $w1_{fN}$ of the N-type fin 724 may be greater than or equal to the width $w1_{fP}$ of the P-type fin 733. Alternatively, the width $w1_{fN}$ of the N-type fin 724 may be smaller than the width $w1_{fP}$ of the P-type fin 733. Further, an oxide spacer 755, such as silicon dioxide, may be formed at a corner between a sidewall of each of the first and second floating gates 737 and 739 and the top planar surface of the field oxide 748.

Figure 5F:
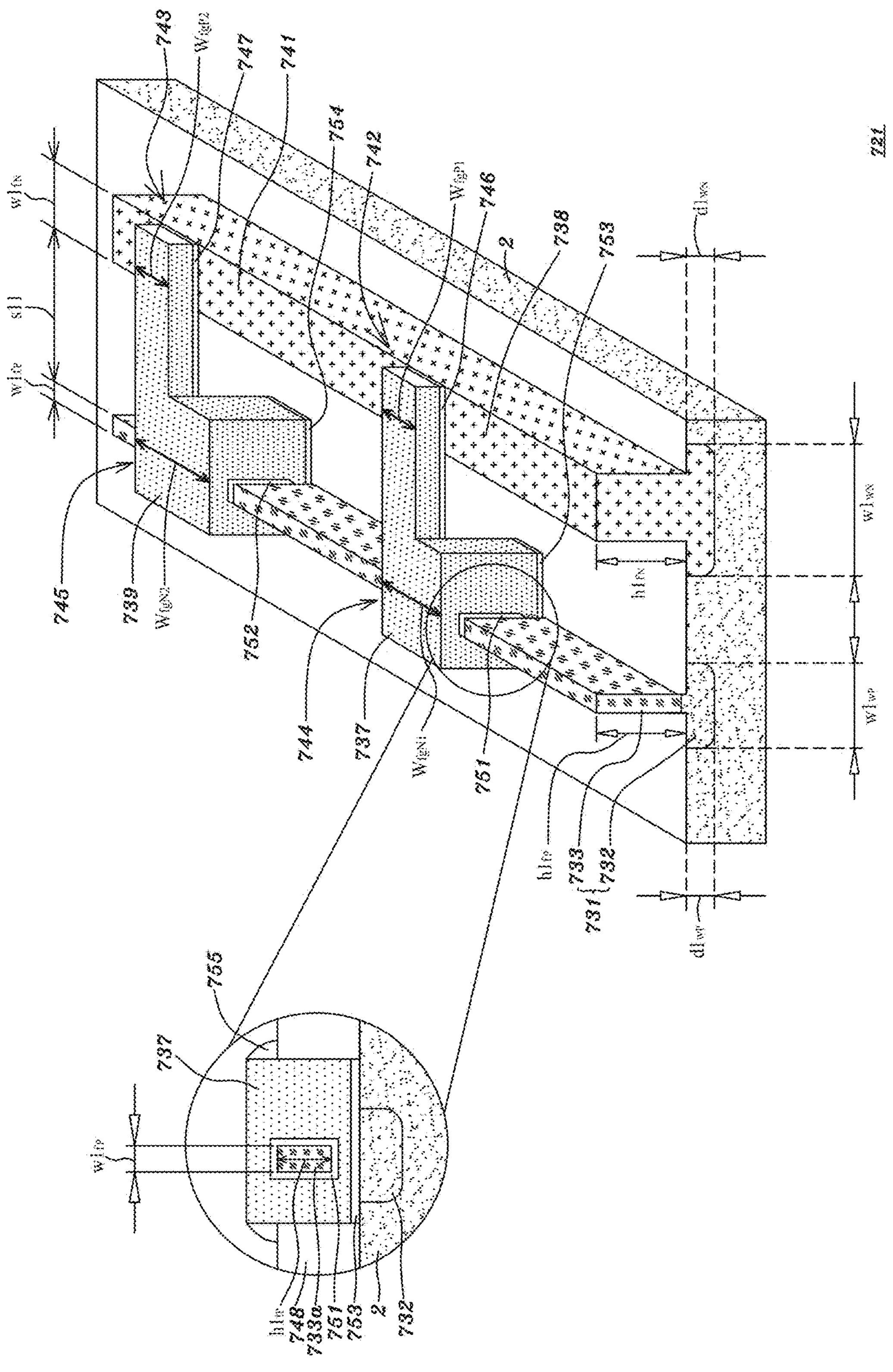
FIG. 5F is a schematically perspective view showing another structure for a fourth type of non-volatile memory cell in accordance with an embodiment of the present application, wherein a drawing at a right upper portion of FIG. 5F is an enlarged cross-sectional view of a N-type metal-oxide-semiconductor (MOS) transistor.

Alternatively, FIG. 5F is a schematically perspective view showing another structure for a fourth type of non-volatile memory cell in accordance with an embodiment of the present application, wherein a drawing at a right upper portion of FIG. 5F is an enlarged cross-sectional view of a N-type metal-oxide-semiconductor (MOS) transistor, wherein a field oxide and oxide spacer are further shown in the enlarged cross-sectional view. For an element indicated by the same reference number shown in FIGS. 5B, 5E and 5F, the specification of the element as seen in FIG. 5F may be referred to that of the element as illustrated in FIGS. 5B and 5E. The difference between the scheme illustrated in FIG. 5E and the scheme illustrated in FIG. 5F is mentioned as below. Referring to FIG. 5F, each of the first and second N-type metal-oxide-semiconductor (MOS) transistors 744 and 745 may be a gate-all-around field-effect transistor (GAAFET), that is, the P-type fin 733 may have two through portions 733*a* each passing in the first direction through one of the first and second floating gates 737 and 739, wherein each of the through portions 733*a* of the P-type fin 733 may be surrounded by one of the first and second floating gates 737 and 739 and each of the first and second floating gates 737 and 739 may have a lower portion under one of the through portions 733*a* of the P-type fin 733, wherein each of the through portions 733*a* of the P-type fin 733 may have a height $\mathbf{h1}_{fP}$ between 5 and 200 nanometers, a width $\mathbf{w1}_{fP}$ between 1 and 100 nanometers and a length $w_{fgN1}$ between 1 and 25 nanometers, wherein a space s11 between the N-type fin 724 and P-type fin 733 may range from 100 to 2,000 nanometers. The first N-type metal-oxide-semiconductor (MOS) transistors 744 may have a first gate oxide 751 around and on one of the through portions 733*a* of the P-type fin 733, wherein the first floating gate 737 is around and on the first gate oxide 751; the second N-type metal-oxide-semiconductor (MOS) transistors 745 may have a second gate oxide 752 around and on the other of the through portions 733*a* of the P-type fin 733, wherein the second floating gate 739 is around and on the second gate oxide 752. Each of the first and second gate oxide 751 and 752 may be made of silicon oxide, hafnium-containing oxide, zirconium-containing oxide or titanium-containing oxide, having a thickness between 1 and 5 nanometers. Furthermore, a first oxide layer 753 made of silicon oxide, hafnium-containing oxide, zirconium-containing oxide or titanium-containing oxide, having a thickness between 1 and 50 nanometers, may be provided on the P-type well 732 and P-type silicon substrate 2, between the first floating gate 737 and P-type well 732 and between the first floating gate 737 and P-type silicon substrate 2. A second oxide layer 754 made of silicon oxide, hafnium-containing oxide, zirconium-containing oxide or titanium-containing oxide, having a thickness between 1 and 50 nanometers, may be provided on the P-type well 732 and P-type silicon substrate 2, between the second floating gate 739 and P-type well 732 and between the second floating gate 739 and P-type silicon substrate 2.

Thereby, referring to FIGS. 5A-5F, each of the first and second N-type MOS transistors 744 and 745 may have a gate capacitance greater than or equal to that of each of the first and second P-type MOS capacitors 742 and 743. The gate capacitance of each of the first and second N-type MOS transistors 744 and 745 may be equal to between 1 and 10 times or between 1.5 and 5 times of the capacitance of each of the first and second P-type MOS capacitors 742 and 743 and, for example, equal to 2 times of the capacitance of each of the first and second P-type MOS capacitors 742 and 743. The gate capacitance of each of the first and second N-type MOS transistors 744 and 745 may range from 0.1 aF to 10 fF, and the capacitance of each of the first and second P-type MOS capacitors 742 and 743 may range from 0.1 aF to 10 fF or range from 0.1 aF to 5 fF.

Referring to FIGS. 5A-5F, the first floating gate 737 coupling a gate terminal of the first P-type MOS capacitor 742 to a gate terminal of the first N-type MOS transistor 744 is configured to catch electrons therein, and the second floating gate 739 coupling a gate terminal of the second P-type MOS capacitor 743 to a gate terminal of the second N-type MOS transistor 745 is configured to catch electrons therein. Each of the first and second P-type MOS capacitors 742 and 743 is configured to form a channel having two ends opposite to each other, both of which couples to a node N2 coupling to the N-type well 723. The first N-type MOS transistor 744 is configured to form a channel having two ends opposite to each other, one of which couples to a node N3 and the other of which couples to a node N0. The second N-type MOS transistor 745 is configured to form a channel having two ends opposite to each other, one of which couples to a node N4 and the other of which couples to the node N0.

Referring to FIGS. 5A-5F, when the first and second floating gates 737 and 739 are being erased, (1) the node N2 may be switched to couple to an erasing voltage $V_{Er}$, (2) the node N4 may be switched to couple to the voltage Vss of ground reference, (3) the node N3 may be switched to couple to the voltage Vss of ground reference, (4) the node NO may be switched to couple to the voltage Vss of ground reference and (5) the P-type well 732 may be switched to couple to the voltage Vss of ground reference. Since the capacitance of the first P-type MOS capacitor 742 is smaller than the gate capacitance of the first N-type MOS transistor 744, the voltage difference between the first floating gate 737 and the node N2 is large enough to cause electron tunneling. Accordingly, for the embodiments as illustrated in FIG. 5A-5D, electrons trapped in the first floating gate 737 may tunnel through the first gate oxide 738 to the node N2. For the embodiments as illustrated in FIGS. 5A, 5E and 5F, electrons trapped in the first floating gate 737 may tunnel through the third gate oxide 746 to the node N2. Thereby, the first floating gate 737 may be erased to a logic level of "1". Since the capacitance of the second P-type MOS capacitor 743 is smaller than the gate capacitance of the second N-type MOS transistor 745, the voltage difference between the second floating gate 739 and the node N2 is large enough to cause electron tunneling. Accordingly, for the embodiments as illustrated in FIGS. 5A-5D, electrons trapped in the second floating gate 739 may tunnel through the second gate oxide 741 to the node N2. For the embodiments as illustrated in FIGS. 5A, 5E and 5F, electrons trapped in the second floating gate 739 may tunnel through the fourth gate oxide 747 to the node N2. Thereby, the second floating gate 739 may be erased to a logic level of "1".

Referring to FIGS. 5A-5F, after the fourth type of non-volatile memory cell 721 is erased, the first floating gate 737 may be positively charged to a logic level of "1" to turn on the first N-type MOS transistor 744, and the second floating gate 739 may be positively charged to a logic level of "1" to turn on the second N-type MOS transistor 745. In this situation, when the fourth type of non-volatile memory cell 721 is being programmed to a logic level of "0", (1) the node N2 may be switched to couple to a programming voltage $V_{Pr}$, (2) the node N4 may be switched to be floating, (3) the node N3 may be switched to couple to the voltage Vss of ground reference, (4) the node N0 may be switched to couple to the programming voltage $V_{Pr}$, and (5) the P-type well 732 may be switched to couple to the voltage Vss of ground reference. Accordingly, for the embodiments as illustrated in FIGS. 5A-5E, electrons passing from the node N3 to the node N0 through the channel of the first N-type MOS transistor 744 may induce some hot electrons to jump or inject to the first floating gate 737 through the first gate oxide 738 to be trapped in the first floating gate 737. For the embodiment as illustrated in FIGS. 5A and 5F, electrons passing from the node N3 to the node N0 through the channel of the first N-type MOS transistor 744 may induce some hot electrons to jump or inject to the first floating gate 737 through the first gate oxide 751 to be trapped in the first floating gate 737. Thereby, the first floating gate 737 may be programmed to a logic level of "0".

Referring to FIGS. 5A-5F, when the fourth type of non-volatile memory cell 721 is being programmed to a logic level of “1”, (1) the node N2 may be switched to couple to a programming voltage $V_{Pr}$, (2) the node N4 may be switched to couple to the voltage Vss of ground reference, (3) the node N3 may be switched to be floating, (4) the node N0 may be switched to couple to the programming voltage $V_{Pr}$ and (5) the P-type well 732 may be switched to couple to the voltage Vss of ground reference. Accordingly, for the embodiments as illustrated in FIGS. 5A-5E, electrons passing from the node N4 to the node N0 through the channel of the second N-type MOS transistor 745 may induce some hot electrons to jump or inject to the second floating gate 739 through the second gate oxide 741 to be trapped in the second floating gate 739. For the embodiment as illustrated in FIGS. 5A and 5F, electrons passing from the node N4 to the node NO through the channel of the second N-type MOS transistor 745 may induce some hot electrons to jump or inject to the second floating gate 739 through the second gate oxide 752 to be trapped in the second floating gate 739. Thereby, the second floating gate 739 may be programmed to a logic level of “0”.

Referring to FIGS. 5A-5F, in operation of the fourth type of non-volatile memory cell 721, (1) the node N2 may be switched to couple to the voltage Vcc of power supply, (2) the node N4 may be switched to couple to the voltage Vss of ground reference, (3) the node N3 may be switched to couple to the voltage Vcc of power supply, (4) the node N0 may be switched to act as an output point of the fourth type of non-volatile memory cell 721 and (5) the P-type well 732 may be switched to couple to the voltage Vss of ground reference. When the first floating gate 737 is programmed to a logic level of “0” and the second floating gate 739 is positively charged to a logic level of “1”, the first N-type MOS transistor 744 may be turned off and the second N-type MOS transistor 745 may be turned on to couple the node N4 to the node N0 through the channel of the second N-type MOS transistor 745. Thereby, the data output of the fourth type of non-volatile memory cell 721 at the node N0 may be at a logic level of “0”. When the first floating gate 737 is positively charged to a logic level of “1” and the second floating gate 739 is programmed to a logic level of “0”, the second N-type MOS transistor 745 may be turned off and the first N-type MOS transistor 744 may be turned on to couple the node N3 to the node N0 through the channel of the first N-type MOS transistor 744. Thereby, the data output of the fourth type of non-volatile memory cell 721 at the node N0 may be at a logic level of “1”.

V. Fifth Type of Non-Volatile Memory Cells

Figure 6A:
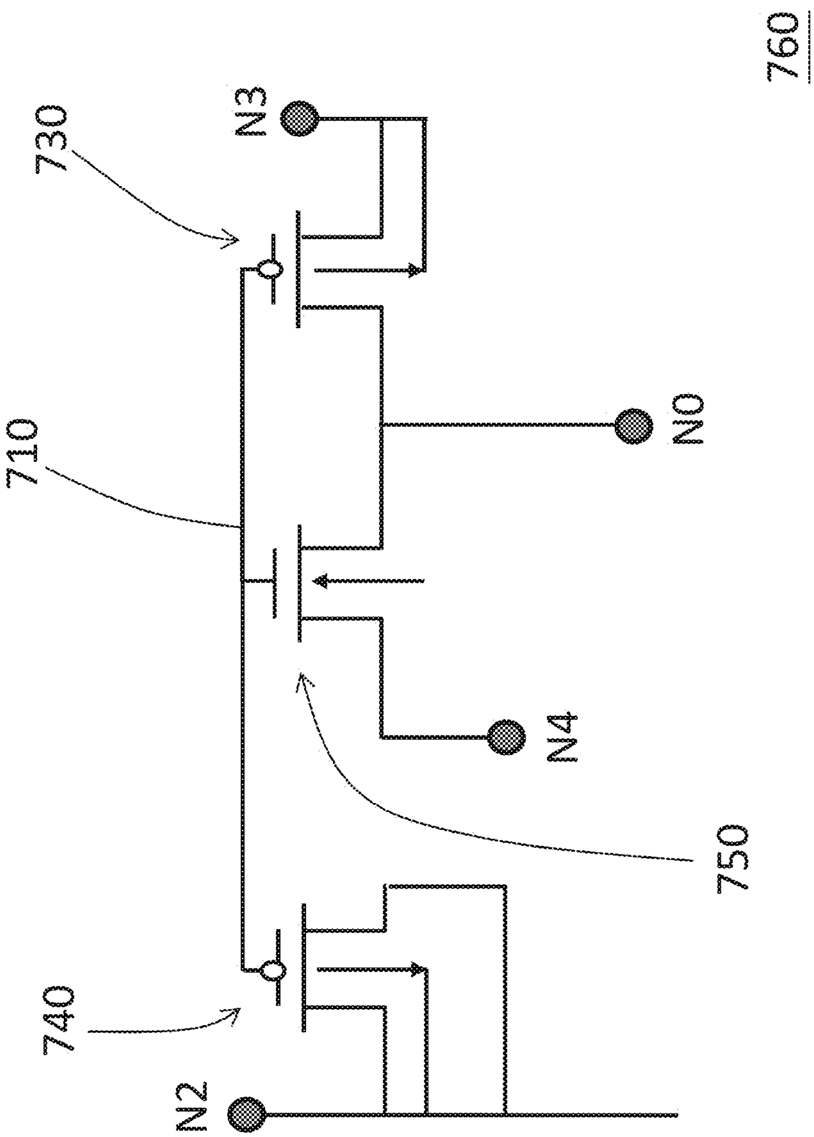
FIG. 6A is a circuit diagram illustrating a fifth type of non-volatile memory cell in accordance with an embodiment of the present application.
Figure 6B:
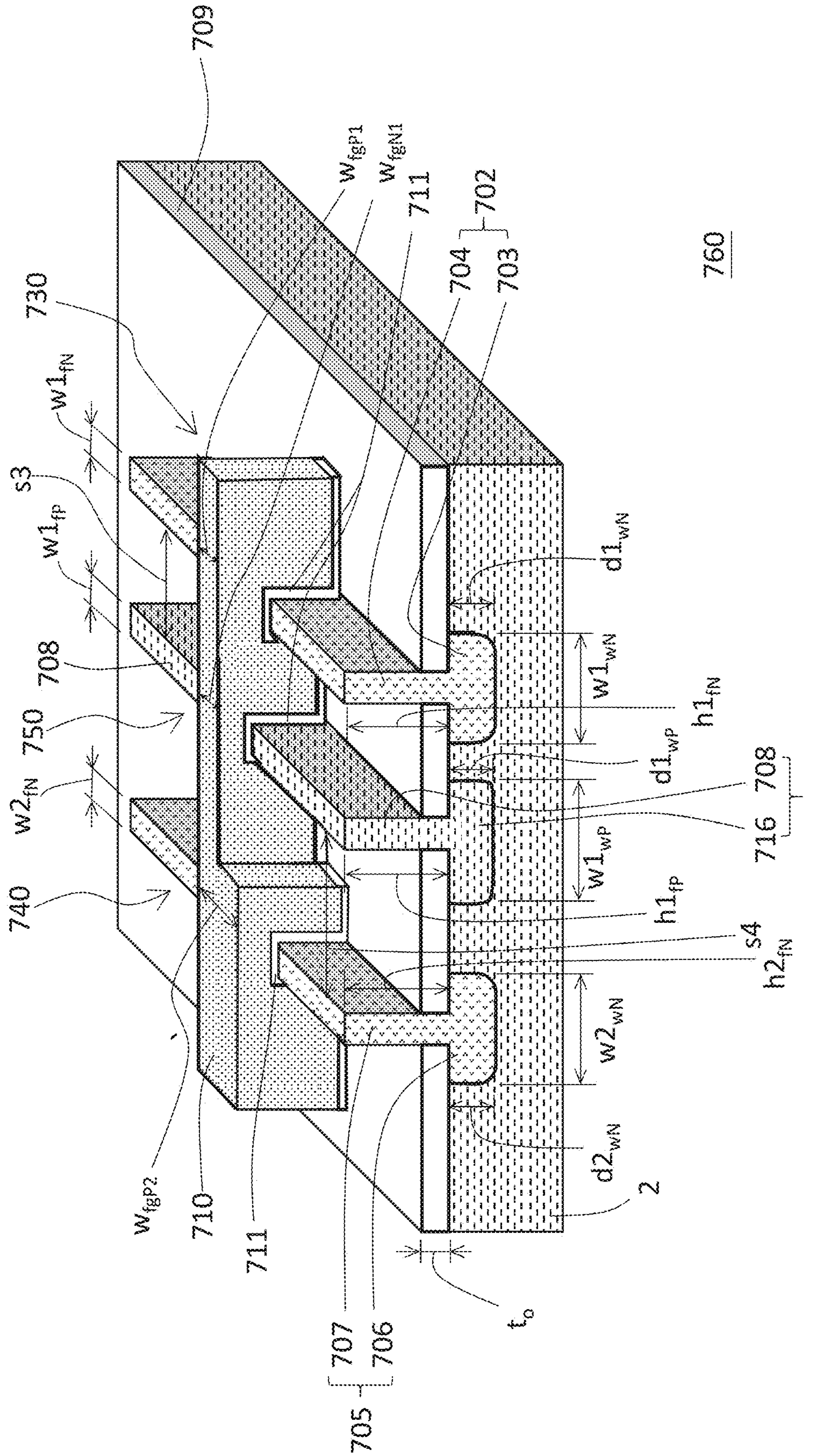
FIGS. 6B and 6C are schematically perspective views showing various structures for a fifth type of non-volatile memory cell in accordance with an embodiment of the present application.

Alternatively, FIG. 6A is a circuit diagram illustrating a fifth type of non-volatile memory cell in accordance with an embodiment of the present application. FIG. 6B is a schematically perspective view showing a structure for a fifth type of non-volatile memory cell in accordance with an embodiment of the present application. In this case, the scheme for the fifth type of non-volatile memory cell 760 as seen in FIGS. 6A and 6B is similar to that of the third type of non-volatile memory cell 700 as seen in FIGS. 4A and 4B and can be referred to the illustration for FIGS. 4A and 4B, but the difference between the schemes for the fifth type of non-volatile memory cell 760 as seen in FIGS. 6A and 6B and the third type of non-volatile memory cell 700 as seen in FIGS. 4A and 4B is mentioned as below. For an element indicated by the same reference number shown in FIGS. 4B and 6B, the specification of the element as seen in FIG. 6B may be referred to that of the element as illustrated in FIG. 4B. Referring to FIGS. 6A and 6B, the width $w_{fgP2}$ of the floating gate 710 may be greater than or equal to the width $w_{fgP1}$ of the floating gate 710 and greater than or equal to the width $w_{fgN1}$ of the floating gate 710. The width $w_{fgP2}$ over the N-type fin 707 may be equal to between 1 and 10 times or between 1.5 and 5 times of the width $w_{fgN1}$ over the P-type fin 708 and, for example, equal to 2 times of the width $w_{fgN1}$ over the P-type fin 708, and the width $w_{fgP2}$ over the N-type fin 707 may be equal to between 1 and 10 times or between 1.5 and 5 times of the width $w_{fgP1}$ over the N-type fin 704 and, for example, equal to 2 times of the width $w_{fgP1}$ over the N-type fin 704, wherein the width $w_{fgP1}$ over the N-type fin 704 may range from 1 to 25 nanometers, the width $w_{fgN1}$ over the P-type fin 708 may range from 1 to 25 nanometers, and the width $w_{fgP2}$ over the N-type fin 707 may range from 1 to 25 nanometers.

Figure 6C:
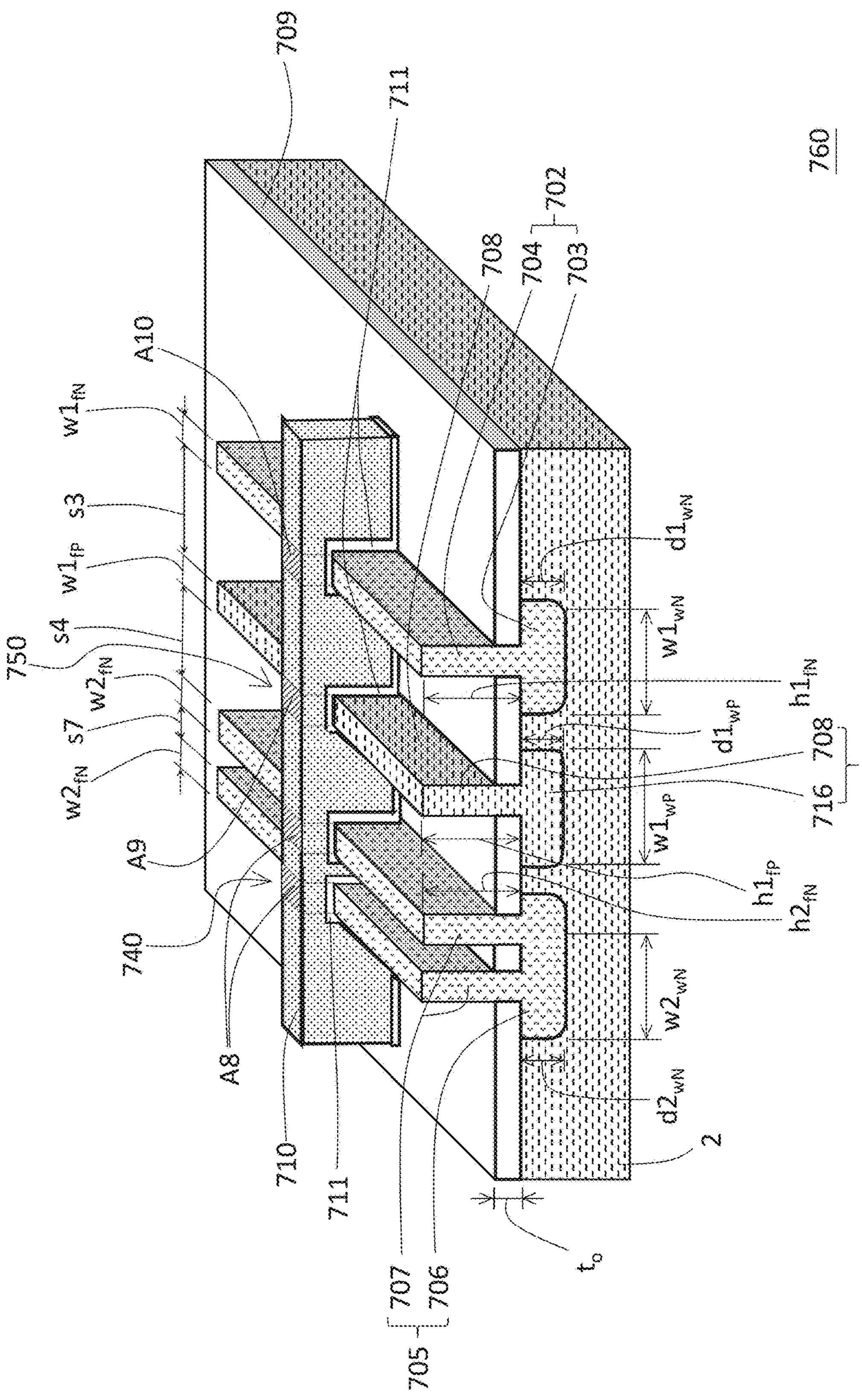

Alternatively, a plurality of N-type fins, the specification for each of which may be referred to that for the N-type fin 707, arranged in parallel to each other or one another may be formed to vertically protrude from the N-type well 706, wherein each of the plurality of N-type fins 707 may have substantially the same height $h2_{f}$, between 10 and 200 nanometers and substantially the same width $w2_{fN}$ between 1 and 100 nanometers, wherein the combination of the plurality of N-type fins 707 may be made for a P-type fin field-effect transistor (FinFET), as seen in FIG. 6C. FIG. 6C is a schematically perspective view showing another structure for a fifth type of non-volatile memory cell in accordance with an embodiment of the present application. The space s4 between the P-type fin 708 and one of the N-type fins 707 next to the P-type fin 708 may range from 100 to 2,000 nanometers. A space s7 between neighboring two of the N-type fins 707 may range from 2 to 200 nanometers. The N-type fins 707 may have the number between 1 and 10 and for example the number of two in this case. The floating gate 710 may transversely extend over the field oxide 709 and from the N-type fin 704 to the N-type fins 707 across over the P-type fin 708, wherein the floating gate 710 may have a total area A8 vertically over the N-type fins 707, which may be greater than or equal to a total area A9 vertically over the P-type fin 708 and greater than or equal to a total area A10 vertically over the N-type fin 704, wherein the total area A8 may be equal to between 1 and 10 times or between 1.5 and 5 times of the total area A9 and, for example, equal to 2 times of the total area A9, and the total area A8 may be equal to between 1 and 10 times or between 1.5 and 5 times of the total area A10 and, for example, equal to 2 times of the total area A10, wherein the total area A8 may range from 1 to 2,500 square nanometers, the total area A9 may range from 1 to 2,500 square nanometers and the total area A10 may range from 1 to 2,500 square nanometers.

Referring to FIGS. 6A-6C, a first P-type metal-oxide-semiconductor (MOS) transistor 730 may be formed by a FINFET process technology, which is provided by the floating gate 710, the N-type fin 704 and the gate oxide 711 between the floating gate 710 and the N-type fin 704, wherein the first P-type metal-oxide-semiconductor (MOS) transistor 730 includes two $P^+$ portions doped with P-type impurities or atoms, such as boron impurities or atoms, in the N-type fin 704 at two opposite sides of the gate oxide 711. The P-type impurities or atoms in the two $P^+$ portions of the first P-type metal-oxide-semiconductor (MOS) transistor 730 may have a concentration greater than those in the P-type well 716.

Referring to FIGS. 6A and 6B, a second P-type metal-oxide-semiconductor (MOS) transistor 740, i.e., P-type metal-oxide-semiconductor (MOS) capacitor, may be formed by a FINFET process technology, which is provided by the floating gate 710, the N-type fin 707 and the gate oxide 711 between the floating gate 710 and the N-type fin 707, wherein the second P-type metal-oxide-semiconductor (MOS) transistor 740 includes two $P^+$ portions doped with P-type impurities or atoms, such as boron impurities or atoms, in the N-type fin 707 at two opposite sides of the gate oxide 711. The P-type impurities or atoms in the two $P^+$ portions of the second P-type metal-oxide-semiconductor (MOS) transistor 740 may have a concentration greater than those in the P-type well 716.

Alternatively, referring to FIGS. 6A and 6C, the second P-type metal-oxide-semiconductor (MOS) transistor 740 may be formed by a FINFET process technology, which is provided by the floating gate 710, the plurality of N-type fins 707 and the gate oxide 711 between the floating gate 710 and the plurality of N-type fins 707, wherein the second P-type metal-oxide-semiconductor (MOS) transistor 740 includes two $P^+$ portions doped with P-type impurities or atoms, such as boron impurities or atoms, in each of the plurality of N-type fins 707 at two opposite sides of the gate oxide 711. The P-type impurities or atoms in the two $P^+$ portions of the second P-type metal-oxide-semiconductor (MOS) transistor 740 may have a concentration greater than those in the P-type well 716.

Referring to FIGS. 6A-6C, an N-type metal-oxide-semiconductor (MOS) transistor 750 may be formed by a FINFET process technology, which is provided by the floating gate 710, the P-type fin 708 and the gate oxide 711 between the floating gate 710 and the P-type fin 708, wherein the N-type metal-oxide-semiconductor (MOS) transistor 750 includes two $N^+$ portions doped with N-type impurities or atoms, such as arsenic or phosphorus impurities or atoms, in the P-type fin 708 at two opposite sides of the gate oxide 711. The N-type impurities or atoms in the two $N^+$ portions of the N-type metal-oxide-semiconductor (MOS) transistor 750 may have a concentration greater than those in each of the N-type wells 703 and 706.

Thereby, referring to FIGS. 6A-6C, the second P-type MOS transistor 740 may have a gate capacitance greater than or equal to that of the first P-type MOS transistor 730 and greater than or equal to that of the N-type MOS transistor 750. The gate capacitance of the second P-type MOS transistor 740 may be equal to between 1 and 10 times or between 1.5 and 5 times of the gate capacitance of the first P-type MOS transistor 730 and, for example, equal to 2 times of the gate capacitance of the first P-type MOS transistor 730. The gate capacitance of the second P-type MOS transistor 740 may be equal to between 1 and 10 times or between 1.5 and 5 times of the gate capacitance of the N-type MOS transistor 750 and, for example, equal to 2 times of the gate capacitance of the N-type MOS transistor 750. The gate capacitance of the N-type MOS transistor 750 may range from 0.1 aF to 10 fF, the gate capacitance of the first P-type MOS transistor 730 may range from 0.1 aF to 10 fF, and the gate capacitance of the second P-type MOS transistor 740 may range from 0.1 aF to 10 fF.

Referring to FIGS. 6A-6C, when the floating gate 710 is being erased, (1) the node N2 may be switched to couple to the voltage Vss of ground reference, (2) the node N4 may be switched to couple to the voltage Vss of ground reference, (3) the node N3 may be switched to couple to the erasing voltage $V_{Er}$ and (4) the node N0 may be switched to be floating. Since the gate capacitance of the first P-type MOS transistor 730 is smaller than the sum of the gate capacitances of the second P-type MOS transistor 740 and the N-type MOS transistor 750, the voltage difference between the floating gate 710 and the node N3 is large enough to cause electron tunneling. Accordingly, electrons trapped in the floating gate 710 may tunnel through the gate oxide 711 to the node N3. Thereby, the floating gate 710 may be erased to a logic level of "1".

Referring to FIGS. 6A-6C, after the fourth type of non-volatile memory cell 760 is erased, the floating gate 710 may be positively charged to a logic level of "1" to turn on the N-type MOS transistor 750 and off the first and second P-type MOS transistors 730 and 740. In this situation, when the floating gate 710 is being programmed, (1) the node N2 may be switched to couple to the programming voltage $V_{Pr}$, (2) the node N4 may be switched to couple to the voltage Vss of ground reference, (3) the node N3 may be switched to couple to the programming voltage $V_{Pr}$ and (4) the node N0 may be switched to be floating. Since the gate capacitance of the N-type MOS transistor 750 is smaller than the sum of the gate capacitances of the first and second P-type MOS transistor 730 and 740, the voltage difference between the floating gate 710 and the node N4 is large enough to cause electron tunneling. Accordingly, electrons may tunnel through the gate oxide 711 from the node N4 to the floating gate 710 to be trapped in the floating gate 710. Thereby, the floating gate 710 may be programmed to a logic level of "0".

Referring to FIGS. 6A-6C, in operation of the fifth type of non-volatile memory cell 760, (1) the node N2 may be switched to couple to a voltage between the voltage Vcc of power supply and the voltage Vss of ground reference, such as the voltage Vcc of power supply, the voltage Vss of ground reference or a half of the voltage Vcc of power supply, or switched to be floating, (2) the node N4 may be switched to couple to the voltage Vss of ground reference, (3) the node N3 may be switched to couple to the voltage Vcc of power supply and (4) the node N0 may be switched to act as an output point of the fifth type of non-volatile memory cell 760. When the floating gate 710 is positively charged to a logic level of "1", the first P-type MOS transistor 730 may be turned off and the N-type MOS transistor 750 may be turned on to couple the node N4 to the node N0 through the channel of the N-type MOS transistor 750. Thereby, the data output of the fifth type of non-volatile memory cell 760 at the node N0 may be at a logic level of "0". When the floating gate 710 is negatively charged to a logic level of "0", the first P-type MOS transistor 730 may be turned on and the N-type MOS transistor 750 may be turned off to couple the node N3 to the node N0 through the channel of the first P-type MOS transistor 730. Thereby, the data output of the fifth type of non-volatile memory cell 760 at the node N0 may be at a logic level of "1".

VI. Sixth Type of Non-Volatile Memory Cells

Figure 7A:
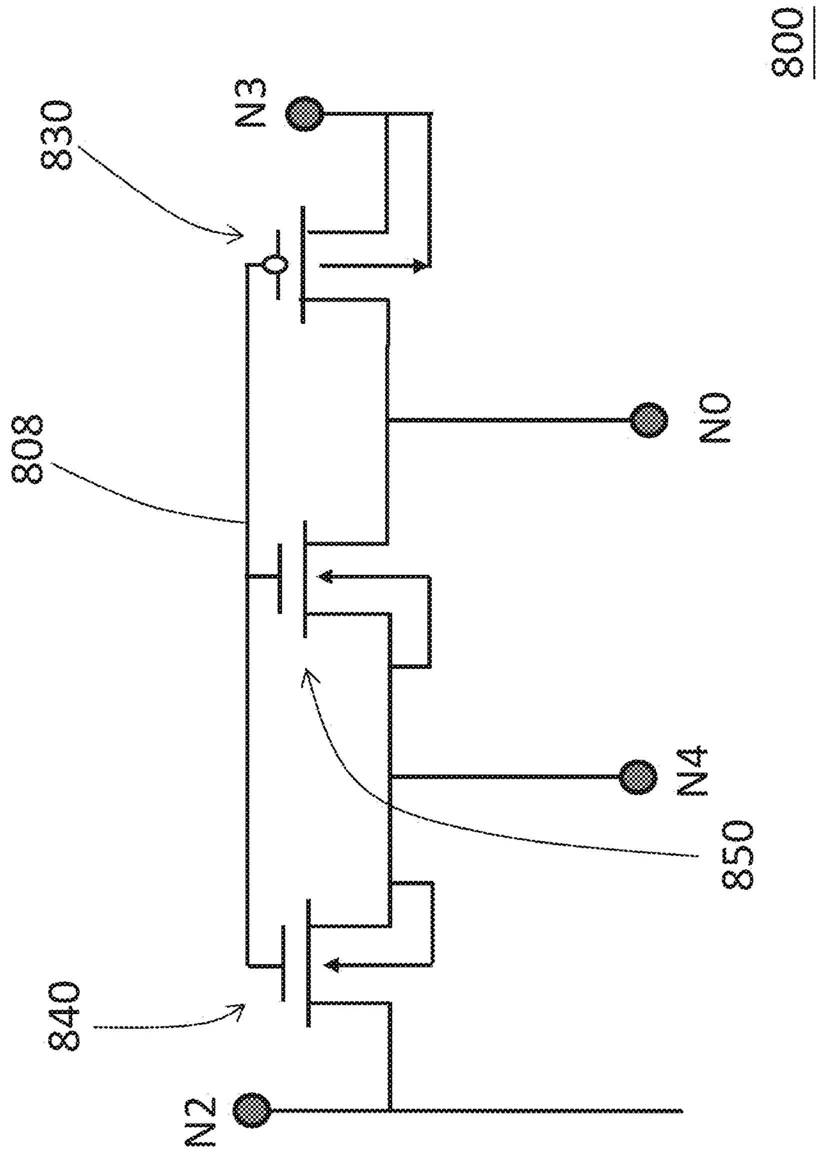
FIG. 7A is a circuit diagram illustrating a sixth type of non-volatile memory cell in accordance with an embodiment of the present application.
Figure 7B:
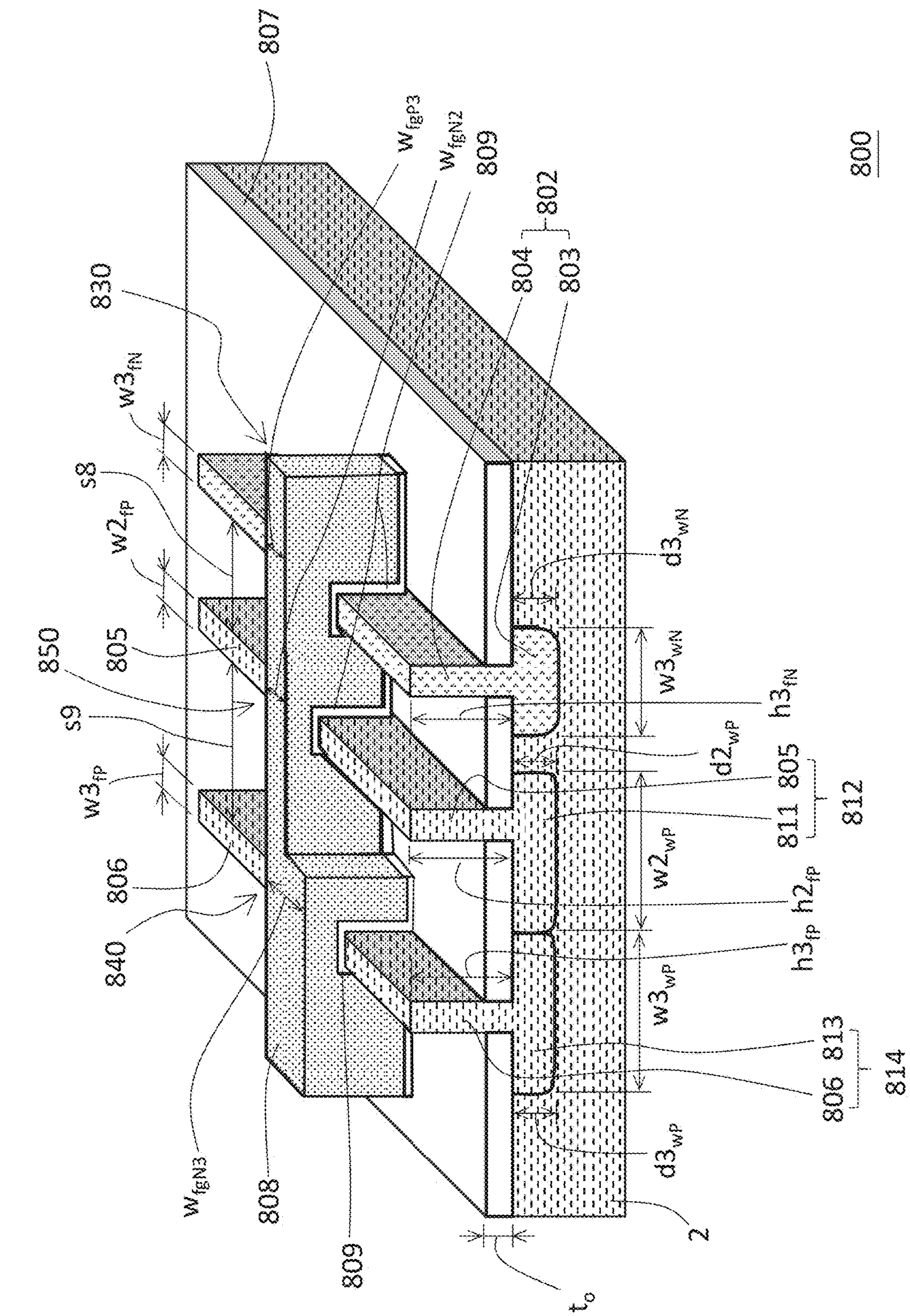
FIGS. 7B-7D are schematically perspective views showing various structures for a sixth type of non-volatile memory cell in accordance with an embodiment of the present application.

FIG. 7A is a circuit diagram illustrating a sixth type of non-volatile memory cell in accordance with an embodiment of the present application. FIG. 7B is a schematically perspective view showing a structure for a sixth type of non-volatile memory cell in accordance with an embodiment of the present application. Referring to FIGS. 7A and 7B, the sixth type of non-volatile memory cell 800 may be formed on a P-type or N-type semiconductor substrate 2, e.g., silicon substrate. In this case, a P-type silicon substrate 2 coupling to the voltage Vss of ground reference is provided for the sixth type of non-volatile memory cell 800. The sixth type of non-volatile memory cell 800 may include:

(1) an N-type stripe 802 formed with an N-type well 803 in the P-type silicon substrate 2 and an N-type fin 804 vertically protruding from the a top surface of the N-type well 803 and extending in a first direction, wherein the N-type well 803 may have a depth $d3_{wN}$ between 0.3 and 5 micrometers and a width $w3_{wN}$ between 50 nanometers and 1 micrometer, and the N-type fin 804 may have a height $h3_{fN}$ between 10 and 200 nanometers and a width $w3_{fN}$ between 1 and 100 nanometers;

(2) a first P-type stripe 812 formed with a P-type well 811 in the P-type silicon substrate 2 and a P-type fin 805 vertically protruding from the P-type well 811 and extending in the first direction parallel to the N-type fin 804, wherein the P-type well 811 may have a depth $d2_{wP}$ between 0.3 and 5 micrometers and a width $w2_{wP}$ between 50 nanometers and 1 micrometer, and the P-type fin 805 may have a height $h2_{fP}$ between 10 and 200 and a width $w2_{fP}$ between 1 and 100 nanometers, wherein a space s8 between the N-type fin 804 and P-type fin 805 may range from 100 to 2,000 nanometers;

(3) a second P-type stripe 814 formed with a P-type well 813 in the P-type silicon substrate 2 and a P-type fin 806 vertically protruding from the P-type well 813 and extending in the first direction parallel to each of the N-type fin 804 and P-type fin 805, wherein the P-type well 813 may have a depth $d3_{wP}$ between 0.3 and 5 micrometers and a width $w3_{wP}$ between 50 nanometers and 1 micrometer, and the P-type fin 806 may have a height $h3_{fP}$ between 10 and 200 and a width $w3_{fP}$ between 1 and 100 nanometers, wherein a space s9 between the P-type fins 805 and 806 may range from 100 to 2,000 nanometers;

(4) a field oxide 807, such as silicon oxide, on the P-type wells 811 and 813 and N-type well 803 and over the P-type silicon substrate 2, wherein the field oxide 807 may have a thickness $t_o$ between 20 and 500 nanometers;

(5) a floating gate 808, such as polysilicon, tungsten, tungsten nitride, titanium, titanium nitride, tantalum, tantalum nitride, copper-containing metal, aluminum-containing metal, or other conductive metals, transversely extending in a second direction substantially vertical to the first direction, over the field oxide 807 and from the N-type fin 804 of the N-type stripe 802 to the P-type fin 806 across over the P-type fin 805, wherein the floating gate 808 may have a width $w_{fgN3}$ over the P-type fin 806, which may be greater than a width $w_{fgN2}$ thereof over the P-type fin 805 and greater than a width $w_{fgP3}$ thereof over the N-type fin 804 of the N-type stripe 802, wherein the width $w_{fgN3}$ over the P-type fin 806 may be equal to between 1 and 10 times or between 1.5 and 5 times of the width $w_{fgN2}$ over the P-type fin 805 and, for example, equal to 2 times of the width $w_{fgN2}$ over the P-type fin 805, and the width $w_{fgN3}$ over the P-type fin 806 may be equal to between 1 and 10 times or between 1.5 and 5 times of the width $w_{fgP3}$ over the N-type fin 804 of the N-type stripe 802 and, for example, equal to 2 times of the width $w_{fgP3}$ over the N-type fin 804 of the N-type stripe 802, wherein the width $w_{fgP3}$ over the N-type fin 804 of the N-type stripe 802 may range from 1 to 25 nanometers, the width $w_{fgN2}$ over the P-type fin 805 may range from 1 to 25 nanometers, and the width $w_{fgN3}$ over the P-type fin 806 may range from 1 to 25 nanometers; and (6) a gate oxide 809, such as silicon oxide, hafnium-containing oxide, zirconium-containing oxide or titanium-containing oxide, transversely extending in the second direction, on the field oxide 807 and from the N-type fin 804 of the N-type stripe 802 to the P-type fin 806 across over the P-type fin 805 to be provided on each of a top and opposite sidewalls of the N-type fin 804, on each of a top and opposite sidewalls of the P-type fin 805, on each of a top and opposite sidewalls of the P-type fin 806, between the floating gate 808 and each of the top and opposite sidewalls of the N-type fin 804, between the floating gate 808 and each of the top and opposite sidewalls of the P-type fin 805, between the floating gate 808 and each of the top and opposite sidewalls of the P-type fin 806 and between the floating gate 808 and the field oxide 807, wherein the gate oxide 809 may have a thickness between 1 and 5 nanometers.

Figure 7C:
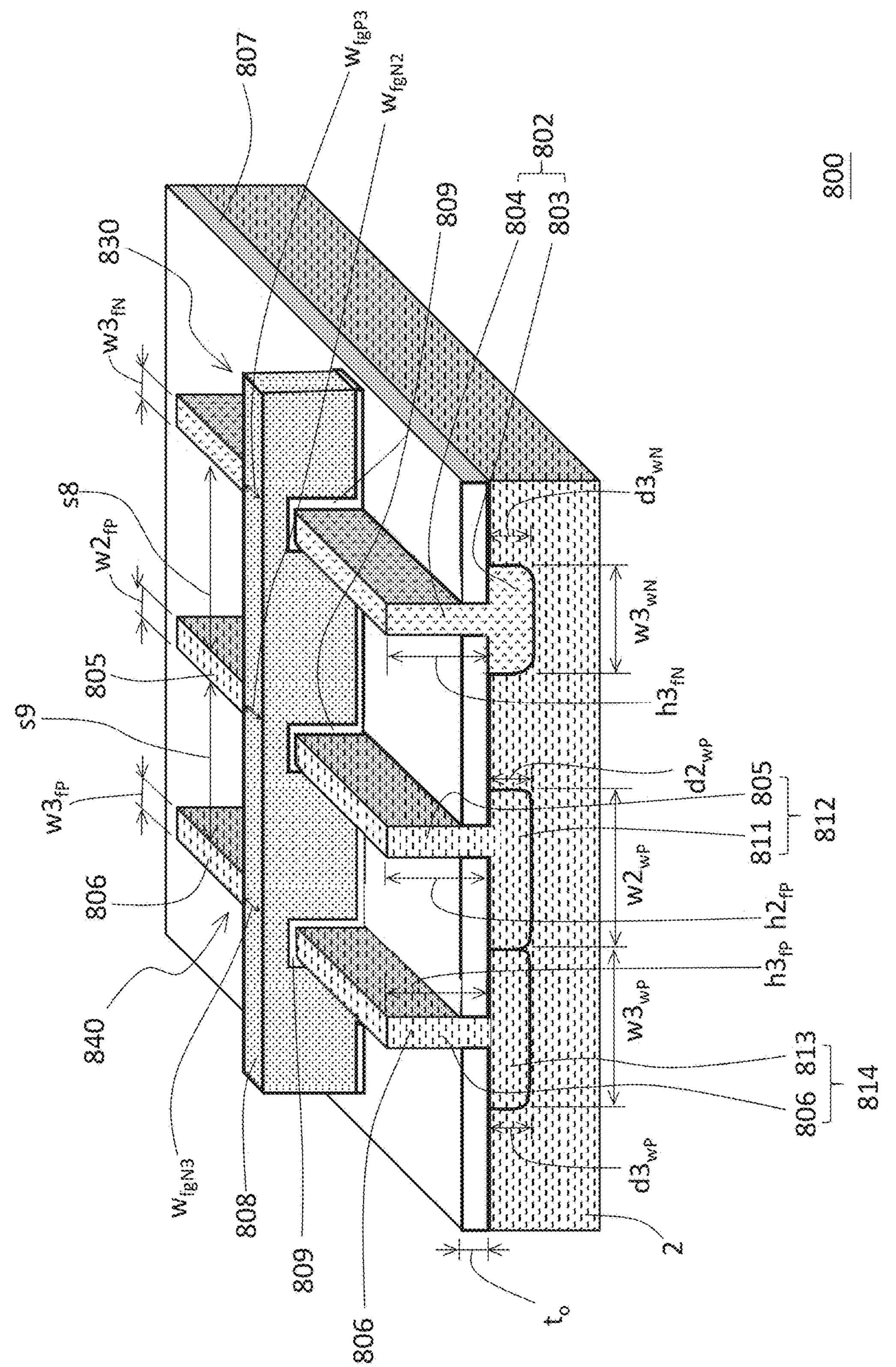

Alternatively, FIG. 7C is a schematically perspective view showing another structure for a sixth type of non-volatile memory cell in accordance with an embodiment of the present application. For an element indicated by the same reference number shown in FIGS. 7B and 7C, the specification of the element as seen in FIG. 7C may be referred to that of the element as illustrated in FIG. 7B. The difference between the circuits illustrated in FIG. 7B and the circuits illustrated in FIG. 7C is mentioned as below. Referring to FIG. 7C, the width $w_{fgN3}$ of the floating gate 808 over the P-type fin 806 may be substantially equal to the width $w_{fgN2}$ of the floating gate 808 over the P-type fin 805 and to the width $w_{fgP3}$ of the floating gate 808 over the N-type fin 804 of the N-type stripe 802. The width $w_{fgP3}$ over the N-type fin 804 of the N-type stripe 802 may range from 1 to 25 nanometers, the width $w_{fgN2}$ over the P-type fin 805 may range from 1 to 25 nanometers, and the width $w_{fgN3}$ over the P-type fin 806 may range from 1 to 25 nanometers.

Figure 7D:
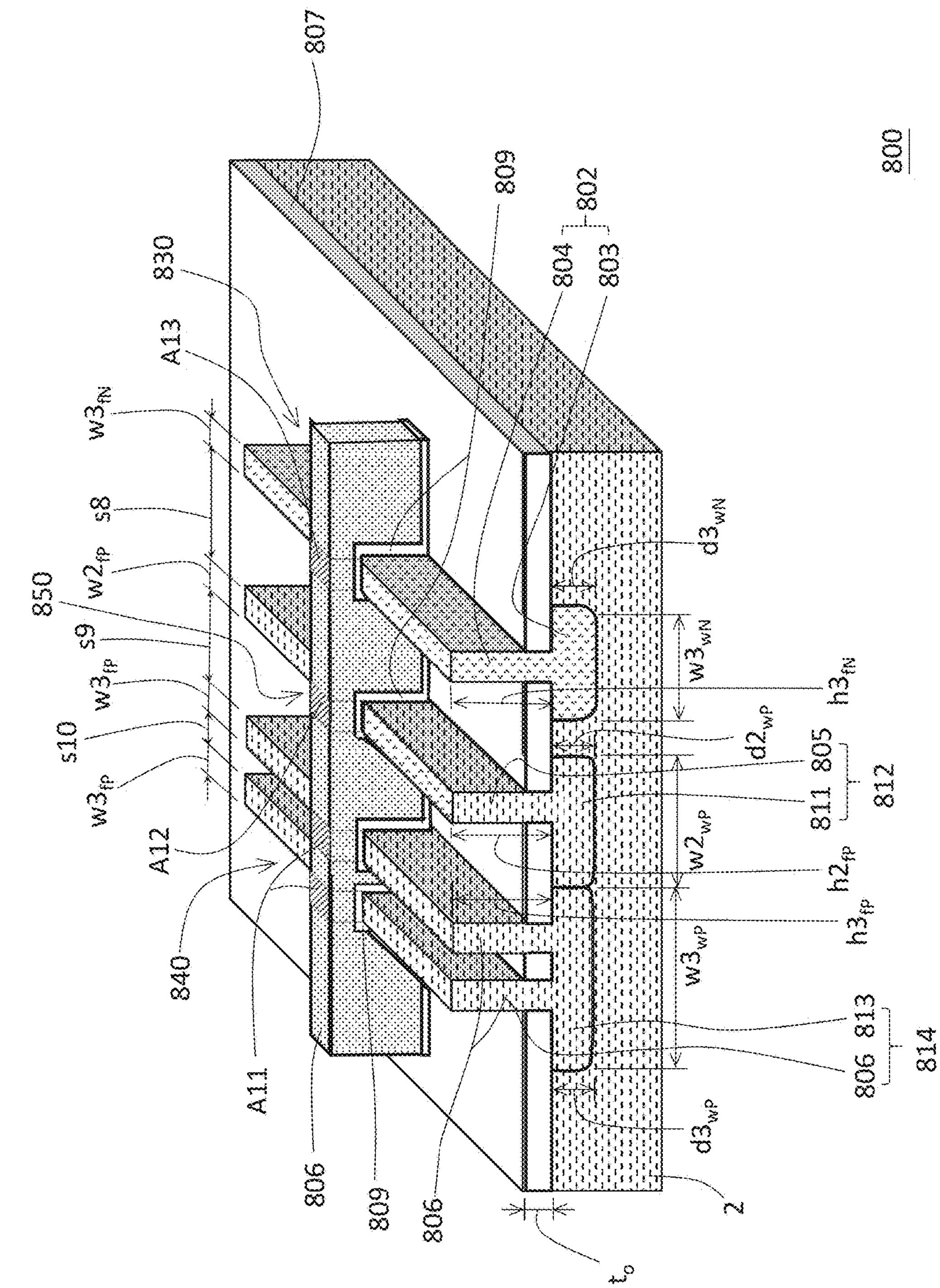

Alternatively, FIG. 7D is a schematically perspective view showing another structure for a sixth type of non-volatile memory cell in accordance with an embodiment of the present application. For an element indicated by the same reference number shown in FIGS. 7B and 7D, the specification of the element as seen in FIG. 7D may be referred to that of the element as illustrated in FIG. 7B. The difference between the circuits illustrated in FIG. 7B and the circuits illustrated in FIG. 7D is mentioned as below. Referring to FIG. 7D, a plurality of P-type fins, the specification for each of which may be referred to that for the P-type fin 806, arranged in parallel to each other or one another may be formed to vertically protrude from the P-type well 813, wherein each of the P-type fins 806 may have substantially the same height $h3_{fP}$ between 10 and 200 nanometers and substantially the same width $w3_{fP}$ between 1 and 100 nanometers, wherein the combination of the plurality of P-type fins 806 may be made for a N-type fin field-effect transistor (FinFET). The space s9 between the P-type fin 805 and one of the P-type fins 806 next to the P-type fin 805 may range from 100 to 2,000 nanometers. A space s10 between neighboring two of the P-type fins 806 may range from 2 to 200 nanometers. The P-type fins 806 may have the number between 1 and 10 and for example the number of two in this case. The floating gate 808 may transversely extend over the field oxide 807 and from the N-type fin 804 to the second N-type fins 806 across over the P-type fin 805, wherein the floating gate 808 may have a total area A11 vertically over the P-type fins 806, which may be greater than or equal to a total area A12 thereof vertically over the P-type fin 805 and greater than or equal to a total area A13 thereof vertically over the N-type fin 804, wherein the total area A11 may be equal to between 1 and 10 times or between 1.5 and 5 times of the total area A12 and, for example, equal to 2 times of the total area A12, and the total area A11 may be equal to between 1 and 10 times or between 1.5 and 5 times of the total area A13 and, for example, equal to 2 times of the total area A13, wherein the total area A11 may range from 1 to 2,500 square nanometers, the total area A12 may range from 1 to 2,500 square nanometers and the total area A13 may range from 1 to 2,500 square nanometers.

Referring to FIGS. 7A-7D, a P-type metal-oxide-semiconductor (MOS) transistor 830 may be formed by a FIN-FET process technology, which is provided by the floating gate 808, the N-type fin 804 and the gate oxide 809 between the floating gate 808 and the N-type fin 804, wherein the P-type metal-oxide-semiconductor (MOS) transistor 830 includes two $P^+$ portions doped with P-type impurities or atoms, such as boron impurities or atoms, in the N-type fin 804 at two opposite sides of the gate oxide 809. The P-type impurities or atoms in the two $P^+$ portions of the P-type metal-oxide-semiconductor (MOS) transistor 830 may have a concentration greater than those in each of the P-type wells 811 and 813.

Referring to FIGS. 7A-7D, a first N-type metal-oxide-semiconductor (MOS) transistor 850 may be formed by a FINFET process technology, which is provided by the floating gate 808, the P-type fin 805 and the gate oxide 809 between the floating gate 808 and the P-type fin 805, wherein the first N-type metal-oxide-semiconductor (MOS) transistor 850 includes two $N^+$ portions doped with N-type impurities or atoms, such as arsenic or phosphorus impurities or atoms, in the P-type fin 805 at two opposite sides of the gate oxide 809. The N-type impurities or atoms in the two $N^+$ portions of the first N-type metal-oxide-semiconductor (MOS) transistor 850 may have a concentration greater than those in the N-type well 803.

Referring to FIGS. 7A-7C, a second N-type metal-oxide-semiconductor (MOS) transistor 840 may be formed by a FINFET process technology, which is provided by the floating gate 808, the P-type fin 806 and the gate oxide 809 between the floating gate 808 and the P-type fin 806, wherein the second N-type metal-oxide-semiconductor (MOS) transistor 840 includes two $N^+$ portions doped with N-type impurities or atoms, such as arsenic or phosphorus impurities or atoms, in the P-type fin 806 at two opposite sides of the gate oxide 809. The N-type impurities or atoms in the two $N^+$ portions of the second N-type metal-oxide-semiconductor (MOS) transistor 840 may have a concentration greater than those in the N-type well 803.

Alternatively, referring to FIGS. 7A and 7D, the second N-type metal-oxide-semiconductor (MOS) transistor 840 may be formed by a FINFET process technology, which is provided by the floating gate 808, the plurality of P-type fins 806 and the gate oxide 809 between the floating gate 808 and the plurality of P-type fins 806, wherein the second N-type metal-oxide-semiconductor (MOS) transistor 840 includes two $N^+$ portions doped with N-type impurities or atoms, such as arsenic or phosphorus impurities or atoms, in each of the plurality of P-type fins 806 at two opposite sides of the gate oxide 809. The N-type impurities or atoms in the two $N^+$ portions of the second N-type metal-oxide-semiconductor (MOS) transistor 840 may have a concentration greater than those in the N-type well 803.

Thereby, referring to FIGS. 7A-7D, the second N-type MOS transistor 840 may have a gate capacitance greater than or equal to that of the first N-type MOS transistor 850 and greater than or equal to that of the P-type MOS transistor 830. The gate capacitance of the second N-type MOS transistor 840 may be equal to between 1 and 10 times or between 1.5 and 5 times of the gate capacitance of the first N-type MOS transistor 850 and, for example, equal to 2 times of the gate capacitance of the P-type MOS transistor 830. The gate capacitance of the second N-type MOS transistor 840 may be equal to between 1 and 10 times or between 1.5 and 5 times of the gate capacitance of the P-type MOS transistor 830 and, for example, equal to 2 times of the gate capacitance of the P-type MOS transistor 830. The gate capacitance of the first N-type MOS transistor 850 may range from 0.1 aF to 10 fF, the gate capacitance of the second N-type MOS transistor 840 may range from 0.1 aF to 10 fF, and the gate capacitance of the P-type MOS transistor 830 may range from 0.1 aF to 10 fF.

Referring to FIGS. 7A-7D, the floating gate 808 coupling a gate terminal of the first N-type MOS transistor 850, a gate terminal of the second N-type MOS transistor 840 and a gate terminal of the P-type MOS transistor 830 with one another is configured to catch electrons therein. The P-type MOS transistor 830 is configured to form a channel having two ends opposite to each other, one of which couples to a node N3 coupling to its N-type well 803 and the other of which couples to a node N0. The first N-type MOS transistor 850 is configured to form a channel having two ends opposite to each other, one of which couples to a node N4 coupling to the P-type well 811 and the other of which couples to the node N0. The second N-type MOS transistor 840 is configured to form a channel having two ends opposite to each other, one of which couples to the node N4 coupling to the P-type well 813 and the other of which couples to a node N2.

Referring to FIGS. 7A-7D, when the floating gate 808 is being erased, (1) the node N3 may be switched to couple to the erasing voltage $V_{Er}$, (2) the node N2 may be switched to couple to the voltage Vss of ground reference, (3) the node N4 may be switched to couple to the voltage Vss of ground reference and (4) the node N0 may be switched to be floating. Since the gate capacitance of the P-type MOS transistor 830 is smaller than the sum of the gate capacitances of the first and second N-type MOS transistors 850 and 840, the voltage difference between the floating gate 808 and the node N3 is large enough to cause electron tunneling. Accordingly, electrons trapped in the floating gate 808 may tunnel through the gate oxide 809 to the node N3. Thereby, the floating gate 808 may be erased to a logic level of "1".

Referring to FIGS. 7A-7D, after the sixth type of non-volatile memory cell 800 is erased, the floating gate 808 may be positively charged to a logic level of "1" to turn on the first and second N-type MOS transistors 850 and 840 and off the P-type MOS transistor 830. In this situation, when the floating gate 808 is being programmed, (1) the node N3 may be switched to couple to the programming voltage $V_{Pr}$, (2) the node N2 may be switched to couple to the programming voltage $V_{Pr}$, (3) the node N4 may be switched to couple to the voltage Vss of ground reference and (4) the node N0 may be switched to be floating. Accordingly, electrons passing from the node N4 to the node N2 through the channel of the second N-type MOS transistor 840 may induce some hot electrons to jump or inject to the floating gate 808 through the gate oxide 809 to be trapped in the floating gate 808. Thereby, the floating gate 808 may be programmed to a logic level of "0".

Referring to FIGS. 7A-7D, in operation of the sixth type of non-volatile memory cell 800, (1) the node N2 may be switched to be floating, (2) the node N4 may be switched to couple to the voltage Vss of ground reference, (3) the node N3 may be switched to couple to the voltage Vcc of power supply and (4) the node N0 may be switched to act as an output point of the sixth type of non-volatile memory cell 800. When the floating gate 808 is positively charged to a logic level of "1", the P-type MOS transistor 830 may be turned off and the first N-type MOS transistor 850 may be turned on to couple the node N4 to the node N0 through the channel of the first N-type MOS transistor 850. Thereby, the data output of the sixth type of non-volatile memory cell 800 at the node N0 may be at a logic level of "0". When the floating gate 808 is negatively charged to a logic level of "0", the first P-type MOS transistor 830 may be turned on and the first N-type MOS transistor 850 may be turned off to couple the node N3 to the node N0 through the channel of the P-type MOS transistor 830. Thereby, the data output of the sixth type of non-volatile memory cell 800 at the node NO may be at a logic level of "1".

VII. Seventh Type of Non-Volatile Memory Cells for the First Alternative

Figure 8A:
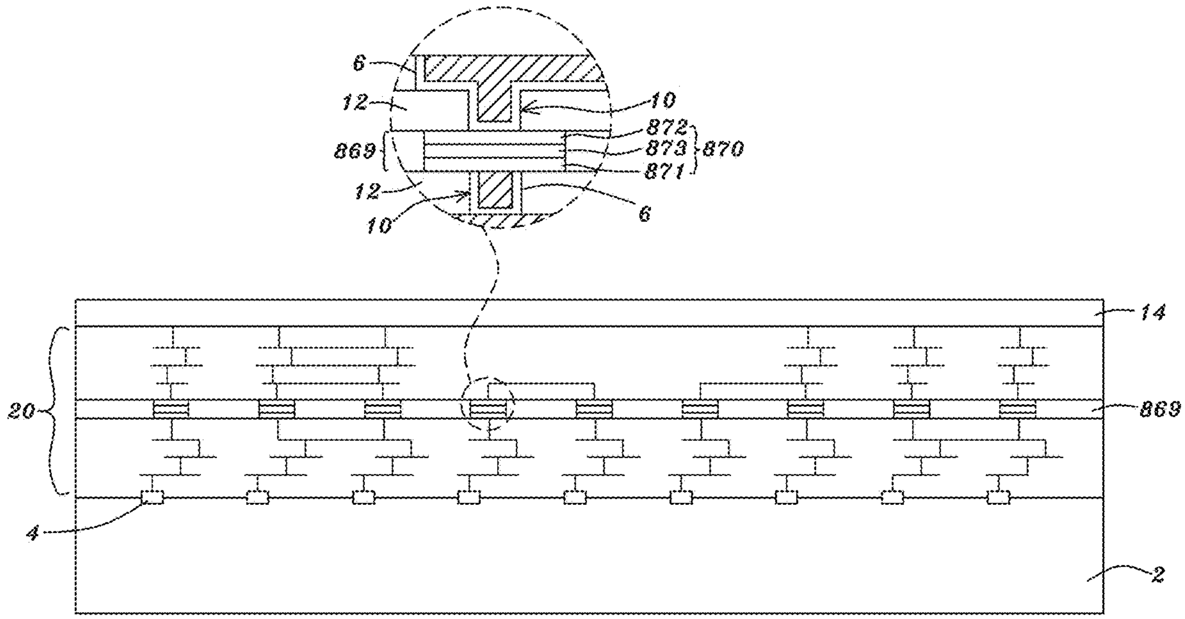
FIGS. 8A-8C are schematically cross-sectional views showing various structures for a resistive random access memory (RRAM) cell for a semiconductor chip in accordance with an embodiment of the present application.
Figure 8B:
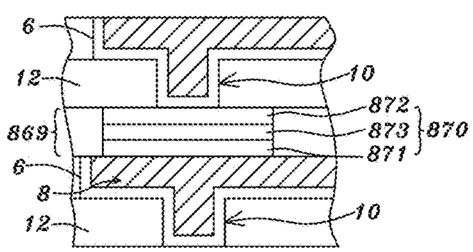
Figure 8C:
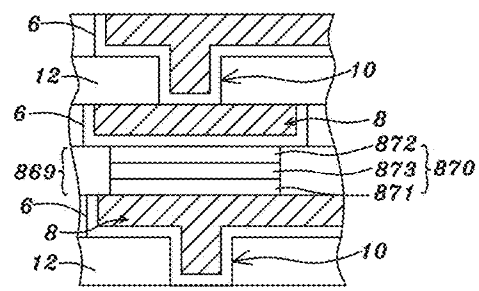

FIGS. 8A-8C are schematically cross-sectional views showing various structures for a resistive random-access memory (RRAM) cell for a semiconductor chip in accordance with an embodiment of the present application. Referring to FIG. 8A, a semiconductor chip 100, used for the FPGA IC chip 200 for example, may include multiple resistive random-access memory (RRAM) cells 870, i.e., programmable resistors, formed in an RRAM layer 869 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the RRAM layer 869 and semiconductor substrate 2 may couple the resistive random-access memory (RRAM) cells 870 to multiple semiconductor devices 4 on the semiconductor substrate 2. Multiple interconnection metal layers 6 in the FISC 20 and between the RRAM layer 869 and passivation layer 14 may couple the resistive random-access memory (RRAM) cells 870 to external circuits outside the semiconductor chip 100 and may have a line pitch less than 0.5 micrometers. Each of the interconnection metal layers 6 in the FISC 20 and over the RRAM layer 869 may have a thickness greater than each of the interconnection metal layers 6 in the FISC 20 and under the RRAM layer 869. The details for the semiconductor substrate 2, semiconductor devices, interconnection metal layers 6, FISC 20 and passivation layer 14 may be referred to the illustration in FIG. 26.

Referring to FIG. 8A, in the RRAM layer 869, each of the resistive random access memory (RRAM) cells 870 may have (i) a bottom electrode 871 made of a layer of nickel, platinum, titanium, titanium nitride, tantalum nitride, copper or an aluminum alloy having a thickness between 1 and 20 nanometers, (ii) a top electrode 872 made of a layer of platinum, titanium nitride, tantalum nitride, copper or an aluminum alloy having a thickness between 1 and 20 nanometers, and (iii) a resistive layer 873 having a thickness between 1 and 20 nanometers between the bottom and top electrodes 871 and 872, wherein the resistive layer 873 may be composed of composite layers of various materials including a colossal magnetoresistance (CMR) material such as $La_{1-x}Ca_xMnO_3$ (0<x<1), $La_{1-x}Sr_xMnO_3$ (0<x<1) or $Pr_{0.7}Ca_{0.3}MnO_3$, a polymer material such as poly(vinylidene fluoride trifluoro ethylene), i.e., P(VDF-TrFE), a conductive-bridging random-access-memory (CBRAM) material such as Ag—GeSe based material, a doped metal oxide such as Nb-doped $SrZrO_3$, or a binary metal oxide such as WOx (0<x<1), NiO, $TiO_2$ or $HfO_2$, or a metal such as titanium. In the RRAM layer 869, the dielectric layer 12 as illustrated in FIG. 26 is provided to have the resistive random-access memory (RRAM) cells 870 formed therein.

For example, referring to FIG. 8A, the resistive layer 873 may include an oxide layer on the bottom electrode 871, in which conductive filaments or paths may be formed depending on the applied electric voltages. The oxide layer of the resistive layer 873 may comprise, for example, hafnium dioxide ($HfO_2$) or tantalum oxide $Ta_2O_5$ having a thickness of 5 nm, 10 nm or 15 nm or between 1 nm and 30 nm, 3 nm and 20 nm, or 5 nm and 15 nm. The oxide layer of the resistive layer 873 may be formed by atomic-layer-deposition (ALD) methods. The resistive layer 873 may further include an oxygen reservoir layer, which may capture the oxygen atoms from the oxide layer, on its oxide layer. The oxygen reservoir layer may comprise titanium (Ti) or tantalum (Ta) to capture the oxygen atoms or ions from the oxide layer to form $TiO_x$ or $TaO_x$. The oxygen reservoir layer may have a thickness between 1 nm and 25 nm, or 3 nm and 15 nm, such as 2 nm, 7 nm or 12 nm. The oxygen reservoir layer may be formed by atomic-layer-deposition (ALD) methods. The top electrode 872 is formed on the oxygen reservoir layer of the resistive layer 873.

For example, referring to FIG. 8A, the resistive layer 873 may include a layer of $HfO_2$ having a thickness between 1 and 20 nanometers on the bottom electrode 871, a layer of titanium dioxide hiving a thickness between 1 and 20 nanometers on the layer of $HfO_2$ and a titanium layer having a thickness between 1 and 20 nanometers on the layer of titanium dioxide. The top electrode 872 is formed on the titanium layer of the resistive layer 873.

Referring to FIG. 8A, each of the resistive random access memory (RRAM) cells 870 may have its bottom electrode 871 formed on a top surface of one of the lower metal vias 10 of a lower one of the interconnection metal layers 6 as illustrated in FIGS. 34A-34D and on a top surface of a lower one of the dielectric layers 12 as illustrated in FIGS. 34A-34D. An upper one of the dielectric layers 12 as illustrated in FIGS. 34A-34D may be formed on the top electrode 872 of said one of the resistive random access memory (RRAM) cells 870 and an upper one of the interconnection metal layers 6 as illustrated in FIGS. 34A-34D may have the upper metal vias 10 each formed in the upper one of the dielectric layers 12 and on the top electrode 872 of one of the resistive random access memory (RRAM) cells 870.

Alternatively, referring to FIG. 8B, each of the resistive random access memory (RRAM) cells 870 may have its bottom electrode 871 formed on a top surface of one of the lower metal pads 8 of a lower one of the interconnection metal layers 6 as illustrated in FIGS. 34A-34D and the dielectric layer 12 in the RRAM layer 869 may be further formed on the top surface of said one of the lower metal pads 8. An upper one of the dielectric layers 12 as illustrated in FIGS. 34A-34D may be formed on the top electrode 872 of said one of the resistive random access memory (RRAM) cells 870 and an upper one of the interconnection metal layers 6 as illustrated in FIGS. 34A-34D may have the upper metal vias 10 each formed in the upper one of the dielectric layers 12 and on the top electrode 872 of one of the resistive random access memory (RRAM) cells 870.

Alternatively, referring to FIG. 8C, each of the resistive random access memory (RRAM) cells 870 may have its bottom electrode 871 formed on a top surface of one of the lower metal pads 8 of a lower one of the interconnection metal layers 6 as illustrated in FIGS. 34A-34D and the dielectric layer 12 in the RRAM layer 869 may be further formed on the top surface of said one of the lower metal pads 8. An upper one of the interconnection metal layers 6 as illustrated in FIGS. 34A-34D may have the upper metal pads 8 each formed in an upper one of the dielectric layers 12, on the top electrode 872 of one of the resistive random-access memory (RRAM) cells 870 and on a top surface of the dielectric layer 12 of the RRAM layer 869.

Figure 8D:
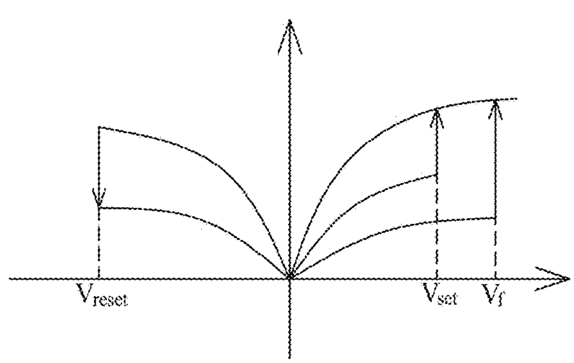
FIG. 8D is a plot showing various states of a resistive random access memory in accordance with an embodiment of the present application.

FIG. 8D is a plot showing various states of a resistive random-access memory in accordance with an embodiment of the present application, wherein the x-axis indicates a voltage of a resistive random-access memory and the y-axis indicates a log value of a current of a resistive random-access memory. Referring to FIGS. 8A and 8D, when the resistive random access memory (RRAM) cells 870 start to be first used before a resetting or setting step as illustrated in the following paragraphs, a forming step is performed to each of the resistive random access memory (RRAM) cells 870 to form vacancies in its resistive layer 873 for electrons capable of moving between its bottom and top electrodes 871 and 872 in a low resistant manner. When each of the resistive random access memory (RRAM) cells 870 is being formed, a forming voltage $V_f$ ranging from 0.25 to 3.3 volts is applied to its top electrode 872, and a voltage Vss of ground reference is applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the forming step become vacancies after the oxygen atoms or ions are left to move toward the oxygen reservoir layer of the resistive layer 873. The vacancies may form conductive filaments or paths in the oxide layer of the resistive layer 873 and thus said each of the resistive random-access memory (RRAM) cells 870 may be formed to a low resistance between 100 and 100,000 ohms.

Referring to FIG. 8D, after the resistive random-access memory (RRAM) cells 870 are formed in the forming step, a resetting step may be performed to one of the resistive random-access memory (RRAM) cells 870. When said one of the resistive random access memory (RRAM) cells 870 is being reset, a resetting voltage $V_{RE}$ ranging from 0.25 to 3.3 volts may be applied to its bottom electrode 871, and a voltage Vss of ground reference is applied to its top electrode 872 such that the oxygen atoms or ions may move from the transition oxide at the interface between the oxide layer of the resistive layer 873 and the oxygen reservoir layer of the resistive layer 873 to the vacancies in the oxide layer of the resistive layer 873 to fill the vacancies such that the vacancies may be largely reduced in the oxide layer of the resistive layer 873. Also, the conductive filaments or paths may be reduced in the oxide layer of the resistive layer 873, and thereby said one of the resistive random-access memory (RRAM) cells 870 may be reset to a high resistance between 1,000 and 100,000,000,000 ohms, greater than the low resistance. The forming voltage $V_f$ is greater than the resetting voltage $V_{RE}$.

Referring to FIG. 8D, after the resistive random-access memory (RRAM) cells 870 are reset with the high resistance, a setting step may be performed to one of the resistive random-access memory (RRAM) cells 870. When said one of the resistive random access memory (RRAM) cells 870 is being set, a setting voltage $V_{SE}$ ranging from 0.25 to 3.3 volts may applied to its top electrode 872, and a voltage Vss of ground reference may be applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the setting step become vacancies after the oxygen atoms or ions are left to move toward the oxygen reservoir layer of the resistive layer 873. The vacancies may form conductive filaments or paths in the oxide layer of the resistive layer 873 and thus said one of the resistive random-access memory (RRAM) cells 870 may be set to the low resistance between 100 and 100,000 ohms. The forming voltage $V_f$ is greater than the setting voltage $V_{SE}$. For said one of the resistive random-access memory (RRAM) cells 870, the high resistance may be equal to between 1.5 and 10,000,000 times of the low resistance.

Figure 8G:
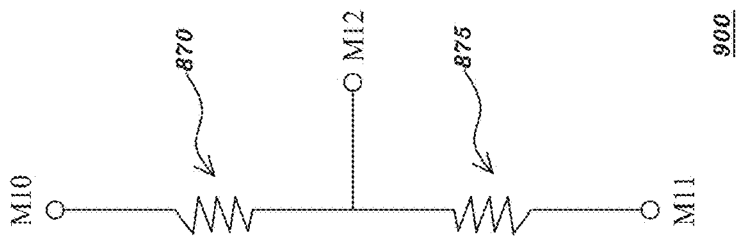
FIGS. 8E and 8G are various circuit diagrams illustrating a seventh type of non-volatile memory cell in accordance with an embodiment of the present application.
Figure 8F:
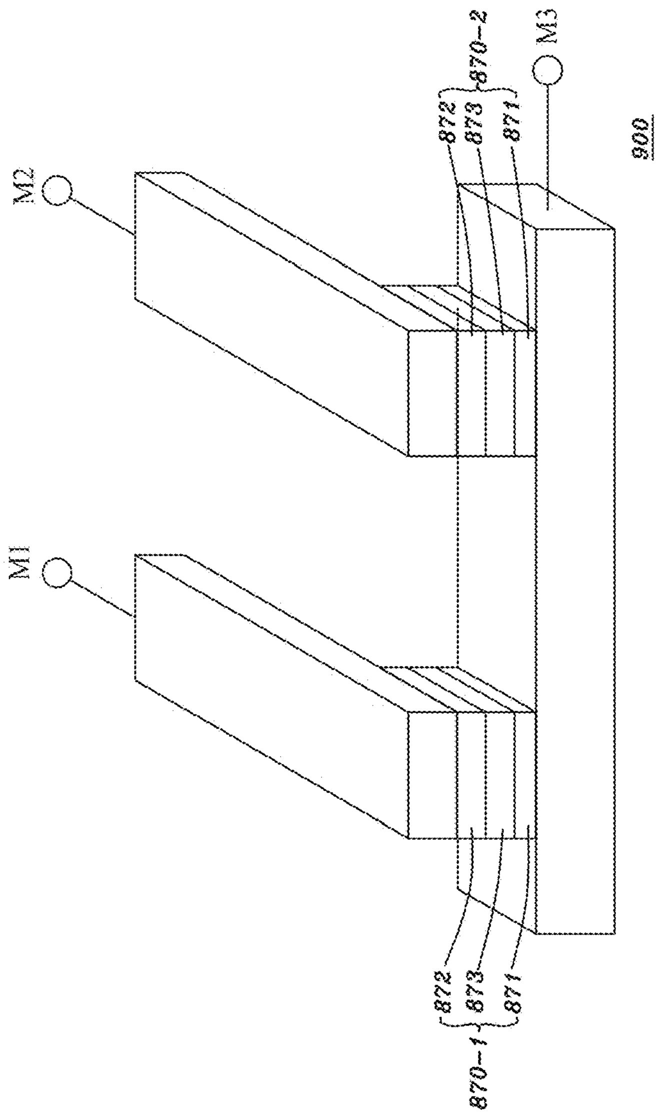
FIG. 8F is a schematically perspective view showing a structure for a seventh type of non-volatile memory cell in accordance with an embodiment of the present application.
Figure 8E:
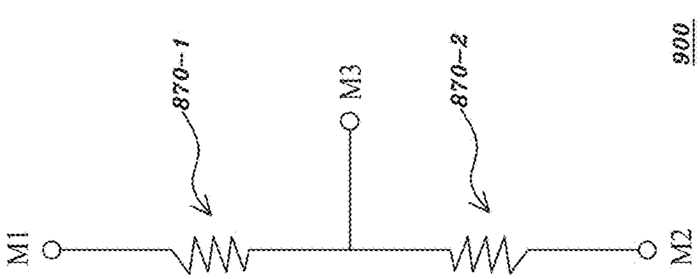

FIG. 8E is a circuit diagram illustrating a seventh type of non-volatile memory cell in accordance with an embodiment of the present application. FIG. 8F is a schematically perspective view showing a structure for a seventh type of non-volatile memory cell in accordance with an embodiment of the present application. Referring to FIGS. 8E and 8F, two of the resistive random-access memory (RRAM) cells 870, called as 870-1 and 870-2 hereinafter, may be provided for a seventh type of non-volatile memory cell 900, i.e., complementary RRAM cell, abbreviated as CRRAM. The resistive random-access memory (RRAM) cell 870-1 may have its bottom electrode 871 coupling to the bottom electrode 871 of the resistive random-access memory (RRAM) cell 870-2 and to a node M3 of the seventh type of non-volatile memory cell 900. The resistive random-access memory (RRAM) cell 870-1 may have its top electrode 872 coupling to a node M1, and the resistive random-access memory (RRAM) cell 870-2 may have its top electrode 872 coupling to a node M2.

Referring to FIGS. 8E and 8F, when the forming step is performed to the resistive random access memory (RRAM) cells 870-1 and 870-2, (1) the nodes M1 and M2 may be switched to couple to a voltage greater than or equal to the forming voltage $V_f$ between 0.25 and 3.3 volts, greater than the voltage Vcc of power supply, and (2) the node M3 may be switched to couple to the voltage Vss of ground reference. Thereby, an electrical current may pass from the top electrode 872 of the resistive random access memory (RRAM) cell 870-1 to the bottom electrode 871 of the resistive random access memory (RRAM) cell 870-1 in a first forward direction to form vacancies in the resistive layer 873 of the resistive random access memory (RRAM) cell 870-1 and thus the resistive random access memory (RRAM) cell 870-1 may be formed with a first low resistance between 100 and 100,000 ohms. An electrical current may pass from the top electrode 872 of the resistive random access memory (RRAM) cell 870-2 to the bottom electrode 871 of the resistive random access memory (RRAM) cell 870-2 in a second forward direction to form vacancies in the resistive layer 873 of the resistive random access memory (RRAM) cell 870-2 and thus the resistive random access memory (RRAM) cell 870-2 may be formed with a second low resistance between 100 and 100,000 ohms. The second low resistance may be equal to or nearly equal to the first low resistance. Alternatively, a ratio value of a difference between the first and second low resistances to a greater one of the first and second low resistances may be less than 50%.

In a first condition, referring to FIGS. 8E and 8F, a resetting step may be performed to the resistive random-access memory (RRAM) cell 870-2 after formed in the forming step. In the resetting step for the resistive random access memory (RRAM) cell 870-2, (1) the node M1 may be switched to couple to a first programming voltage, between 0.25 and 3.3 volts, equal to or greater than the resetting voltage $V_{RE}$ of the resistive random access memory (RRAM) cell 870-2 and greater than the voltage Vcc of power supply, (2) the node M2 may be switched to couple to the voltage Vss of ground reference and (3) the node M3 may be switched to be floating. Thereby, an electrical current may pass from the bottom electrode 871 of the resistive random access memory (RRAM) cell 870-2 to the top electrode 872 of the resistive random access memory (RRAM) cell 870-2 in a second backward direction opposite to the second forward direction to reduce the vacancies in the resistive layer 873 of the resistive random access memory (RRAM) cell 870-2 and thus the resistive random access memory (RRAM) cell 870-2 may be reset with a first high resistance between 1,000 and 100,000,000,000 ohms in the resetting step. The resistive random-access memory (RRAM) cell 870-1 is kept in the first low resistance. The first high resistance may be equal to between 1.5 and 10,000,000 times of the first low resistance. Thereby, the seventh type of non-volatile memory cell 900 may have the voltage at the node M3 to be programmed with a logic level of "1", wherein the node M3 in operation may act as an output point of the seventh type of non-volatile memory cell 900.

In a second condition, referring to FIGS. 8E and 8F, a resetting step may be performed to the resistive random-access memory (RRAM) cell 870-1 after formed in the forming step. In the resetting step for the resistive random access memory (RRAM) cell 870-1, (1) the node M2 may be switched to couple to a second programming voltage, between 0.25 and 3.3 volts, equal to or greater than the resetting voltage $V_{RE}$ of the resistive random access memory (RRAM) cell 870-1 and greater than the voltage Vcc of power supply, wherein the second programming voltage may be substantially equal to the first programming voltage, (2) the node M1 may be switched to couple to the voltage Vss of ground reference and (3) the node M3 may be switched to be floating. Thereby, an electrical current may reversely pass from the bottom electrode 871 of the resistive random access memory (RRAM) cell 870-1 to the top electrode 872 of the resistive random access memory (RRAM) cell 870-1 in a first backward direction opposite to the first forward direction to form relatively few vacancies in the resistive layer 873 of the resistive random access memory (RRAM) cell 870-1 and thus the resistive random access memory (RRAM) cell 870-1 may be reset with a second high resistance between 1,000 and 100,000,000,000 ohms in the resetting step. The resistive random-access memory (RRAM) cell 870-2 is kept in the second low resistance. The second high resistance may be equal to between 1.5 and 10,000,000 times of the second low resistance. Thereby, the seventh type of non-volatile memory cell 900 may have the voltage at the node M3 to be programmed with a logic level of "0", wherein the node M3 in operation may act as an output point of the seventh type of non-volatile memory cell 900.

Referring to FIGS. 8E and 8F, after the seventh type of non-volatile memory cell 900 is programmed with a logic level of "1" as illustrated in the first condition, the seventh type of non-volatile memory cell 900 may be programmed with a logic level of "0" for a third condition. In the third condition, the resistive random-access memory (RRAM) cell 870-1 may be reset with a third high resistance in a resetting step, and the resistive random-access memory (RRAM) cell 870-2 may be set with a third low resistance in a setting step. In the resetting step for the resistive random access memory (RRAM) cell 870-1 and the setting step for the resistive random access memory (RRAM) cell 870-2, (1) the node M2 may be switched to couple to the second programming voltage, between 0.25 and 3.3 volts, equal to or greater than the resetting voltage $V_{RE}$ of the resistive random access memory (RRAM) cell 870-1, equal to or greater than the setting voltage $V_{SE}$ of the resistive random access memory (RRAM) cell 870-2 and greater than the voltage Vcc of power supply, (2) the node M1 may be switched to couple to the voltage Vss of ground reference and (3) the node M3 may be switched to be floating. Thereby, an electrical current may pass from the top electrode 872 of the resistive random access memory (RRAM) cell 870-2 to the bottom electrode 871 of the resistive random access memory (RRAM) cell 870-2 in the second forward direction to form more vacancies in the resistive layer 873 of the resistive random access memory (RRAM) cell 870-2 and thus the resistive random access memory (RRAM) cell 870-2 may be set with the third low resistance between 100 and 100,000 ohms in the setting step. The electrical current may then pass from the bottom electrode 871 of the resistive random access memory (RRAM) cell 870-1 to the top electrode 872 of the resistive random access memory (RRAM) cell 870-1 in the first backward direction to reduce the vacancies in the resistive layer 873 of the resistive random access memory (RRAM) cell 870-1 and thus the resistive random access memory (RRAM) cell 870-1 may be reset with the third high resistance between 1,000 and 100,000,000,000 ohms in the resetting step. The third high resistance may be equal to between 1.5 and 10,000,000 times of the third low resistance. Thereby, the seventh type of non-volatile memory cell 900 may have the voltage at its node M3 to be programmed with a logic level of "0", wherein the node M3 in operation may act as an output point of the seventh type of non-volatile memory cell 900.

Referring to FIGS. 8E and 8F, after the seventh type of non-volatile memory cell 900 is programmed with a logic level of "0" as illustrated in the second condition, the seventh type of non-volatile memory cell 900 may be programmed with a logic level of "1" for a fourth condition. In the fourth condition, the resistive random-access memory (RRAM) cell 870-2 may be reset with a fourth high resistance in the resetting step, and the resistive random-access memory (RRAM) cell 870-1 may be set with a fourth low resistance in the setting step. In the resetting step for the resistive random access memory (RRAM) cell 870-2 and the setting step for the resistive random access memory (RRAM) cell 870-1, the node M1 may be switched to couple to the first programming voltage, between 0.25 and 3.3 volts, equal to or greater than the resetting voltage $V_{RE}$ of the resistive random access memory (RRAM) cell 870-2, equal to or greater than the setting voltage $V_{SE}$ of the resistive random access memory (RRAM) cell 870-1 and greater than the voltage Vcc of power supply, the node M2 may be switched to couple to the voltage Vss of ground reference and the node M3 may be switched to be floating. Thereby, an electrical current may pass from the top electrode 872 of the resistive random access memory (RRAM) cell 870-1 to the bottom electrode 871 of the resistive random access memory (RRAM) cell 870-1 in the first forward direction to form more vacancies in the resistive layer 873 of the resistive random access memory (RRAM) cell 870-1 and thus the resistive random access memory (RRAM) cell 870-1 may be set with the fourth low resistance between 100 and 100,000 ohms in the setting step. The electrical current may then pass from the bottom electrode 871 of the resistive random access memory (RRAM) cell 870-2 to the top electrode 872 of the resistive random access memory (RRAM) cell 870-2 in the second backward direction to form relatively few vacancies in the resistive layer 873 of the resistive random access memory (RRAM) cell 870-2 and thus the resistive random access memory (RRAM) cell 870-2 may be reset with the fourth high resistance between 1,000 and 100,000,000,000 ohms in the resetting step. The fourth high resistance may be equal to between 1.5 and 10,000,000 times of the fourth low resistance. Thereby, the seventh type of non-volatile memory cell 900 may have the voltage of the node M3 to be programmed with a logic level of "1", wherein the node M3 in operation may act as an output point of the seventh type of non-volatile memory cell 900.

In operation, referring to FIGS. 8E and 8F, (1) the node M1 may be switched to couple to the voltage Vcc of power supply, (2) the node M2 may be switched to couple to the voltage Vss of ground reference and (3) the node M3 may be switched to act as an output point of the seventh type of non-volatile memory cell 900. When the resistive random access memory (RRAM) cell 870-1 is reset with the first or third high resistance and the resistive random access memory (RRAM) cell 870-2 is formed or set with the second or third low resistance, the seventh type of non-volatile memory cell 900 may generate a data output at its node M3 to be at a voltage between the voltage Vss of ground reference and a half of the voltage Vcc of power supply, defined as a logic level of "0". When the resistive random access memory (RRAM) cell 870-1 is formed or set with the first or fourth low resistance and the resistive random access memory (RRAM) cell 870-2 is reset with the second or fourth high resistance, the seventh type of non-volatile memory cell 900 may generate a data output at its node M3 to be at a voltage between a half of the voltage Vcc of power supply and the voltage Vcc of power supply, defined as a logic level of "1".

Alternatively, the seventh type of non-volatile memory cell 900 may be composed of the resistive random-access memory (RRAM) cell 870 for a programmable resistor and of a non-programmable resistor 875, as seen in FIG. 8G. FIG. 8G is a circuit diagram illustrating a seventh type of non-volatile memory cell in accordance with an embodiment of the present application. The resistive random-access memory (RRAM) cell 870 may have its bottom electrode 871 coupling to a first end of the non-programmable resistor 875 and to a node M12 of the seventh type of non-volatile memory cell 900. The resistive random-access memory (RRAM) cell 870 may have its top electrode 872 coupling to a node M10, and the non-programmable resistor 875 may have a second end, opposite to its first end, coupling to a node M11.

Referring to FIG. 8G, when the forming step is performed to the resistive random access memory (RRAM) cells 870, (1) the nodes M10 may be switched to couple to the forming voltage $V_f$ between 0.25 and 3.3 volts, greater than a voltage Vcc of power supply, (2) the node M3 may be switched to couple to the voltage Vss of ground reference, and (3) the node M11 may be switched to be floating. Thereby, an electrical current may pass from the top electrode 872 of the resistive random access memory (RRAM) cell 870 to the bottom electrode 871 of the resistive random access memory (RRAM) cell 870 in a forward direction to form vacancies in the resistive layer 873 of the resistive random access memory (RRAM) cell 870 and thus the resistive random access memory (RRAM) cell 870 may be formed with a fifth low resistance, between 100 and 100,000 ohms, lower than the resistance of the non-programmable resistor 875. The resistance of the non-programmable resistor 875 may be equal to between 1.5 and 10,000,000 times of the fifth low resistance.

Referring to FIG. 8G, a resetting step may be performed to the resistive random-access memory (RRAM) cell 870 after formed in the forming step. In the resetting step for the resistive random access memory (RRAM) cell 870, (1) the node M12 may be switched to couple to a third programming voltage, between 0.25 and 3.3 volts, equal to or greater than the resetting voltage $V_{RE}$ of the resistive random access memory (RRAM) cell 870 and greater than the voltage Vcc of power supply, (2) the node M10 may be switched to couple to the voltage Vss of ground reference and (3) the node M11 may be switched to couple to the third programming voltage or to be floating. Thereby, an electrical current may reversely pass from the bottom electrode 871 of the resistive random access memory (RRAM) cell 870 to the top electrode 872 of the resistive random access memory (RRAM) cell 870 in a backward direction opposite to the forward direction to form relatively few vacancies in the resistive layer 873 of the resistive random access memory (RRAM) cell 870 and thus the resistive random access memory (RRAM) cell 870 may be reset with a fifth high resistance, between 1,000 and 100,000,000,000 ohms, greater than the resistance of the non-programmable resistor 875 in the resetting step. The fifth high resistance may be equal to between 1.5 and 10,000,000 times of the resistance of the non-programmable resistor 875. Thereby, the seventh type of non-volatile memory cell 900 may have the voltage at the node M12 to be programmed with a logic level of "0", wherein the node M12 in operation may act as an output point of the seventh type of non-volatile memory cell 900.

Referring to FIG. 8G, after the seventh type of non-volatile memory cell 900 is programmed with a logic level of "0", the seventh type of non-volatile memory cell 900 may be programmed with a logic level of "1". The resistive random-access memory (RRAM) cell 870 may be set with a sixth low resistance in the setting step. In the setting step for the resistive random access memory (RRAM) cell 870, (1) the node M10 may be switched to couple to a fourth programming voltage, between 0.25 and 3.3 volts, equal to or greater than the setting voltage $V_{SE}$ of the resistive random access memory (RRAM) cell 870 and greater than the voltage Vcc of power supply, wherein the fourth programming voltage may be substantially equal to the third programming voltage, (2) the node M11 may be switched to couple to the voltage Vss of ground reference or to be floating and (3) the node M12 may be switched to couple to the voltage Vss of ground reference. Thereby, an electrical current may pass from the top electrode 872 of the resistive random access memory (RRAM) cell 870 to the bottom electrode 871 of the resistive random access memory (RRAM) cell 870 in the forward direction to form more vacancies in the resistive layer 873 of the resistive random access memory (RRAM) cell 870 and thus the resistive random access memory (RRAM) cell 870 may be set with the sixth low resistance, between 100 and 100,000 ohms, lower than the resistance of the non-programmable resistor 875 in the setting step. The resistance of the non-programmable resistor 875 may be equal to between 1.5 and 10,000,000 times of the sixth low resistance. Thereby, the seventh type of non-volatile memory cell 900 may have the voltage of the node M12 to be programmed with a logic level of "1", wherein the node M12 in operation may act as an output point of the seventh type of non-volatile memory cell 900.

Referring to FIG. 8G, after the seventh type of non-volatile memory cell 900 is programmed with a logic level of "1", the seventh type of non-volatile memory cell 900 may be programmed with a logic level of "0". The resistive random-access memory (RRAM) cell 870 may be reset with a sixth high resistance in the resetting step. In the resetting step for the resistive random access memory (RRAM) cell 870, (1) the node M12 may be switched to couple to the third programming voltage, between 0.25 and 3.3 volts, equal to or greater than the resetting voltage $V_{RE}$ of the resistive random access memory (RRAM) cell 870 and greater than the voltage Vcc of power supply, (2) the node M11 may be switched to couple to the third programming voltage or to be floating and (3) the node M10 may be switched to couple to the voltage Vss of ground reference. Thereby, an electrical current may pass from the bottom electrode 871 of the resistive random access memory (RRAM) cell 870 to the top electrode 872 of the resistive random access memory (RRAM) cell 870 in the backward direction opposite to the forward direction to form relatively few vacancies in the resistive layer 873 of the resistive random access memory (RRAM) cell 870 and thus the resistive random access memory (RRAM) cell 870 may be reset with the sixth high resistance, between 1,000 and 100,000,000,000 ohms, higher than the resistance of the non-programmable resistor 875 in the resetting step. The sixth high resistance may be equal to between 1.5 and 10,000,000 times of the resistance of the non-programmable resistor 875. Thereby, the seventh type of non-volatile memory cell 900 may have the voltage of the node M12 to be programmed with a logic level of "0", wherein the node M12 in operation may act as an output point of the seventh type of non-volatile memory cell 900.

In operation, referring to FIG. 8G, (1) the node M10 may be switched to couple to the voltage Vcc of power supply, (2) the node M11 may be switched to couple to the voltage Vss of ground reference and (3) the node M12 may be switched to act as an output point of the seventh type of non-volatile memory cell 900. When the resistive random-access memory (RRAM) cell 870 is reset with the fifth or sixth high resistance, the seventh type of non-volatile memory cell 900 may generate a data output at its node M12 to be at a voltage between the voltage Vss of ground reference and a half of the voltage Vcc of power supply, defined as a logic level of "0". When the resistive random access memory (RRAM) cell 870 is formed or set with the fifth or sixth low resistance, the seventh type of non-volatile memory cell 900 may generate a data output at its node M12 to be at a voltage between a half of the voltage Vcc of power supply and the voltage Vcc of power supply, defined as a logic level of "1".

VIII. Eighth Type of Non-Volatile Memory Cells

Figure 9A:
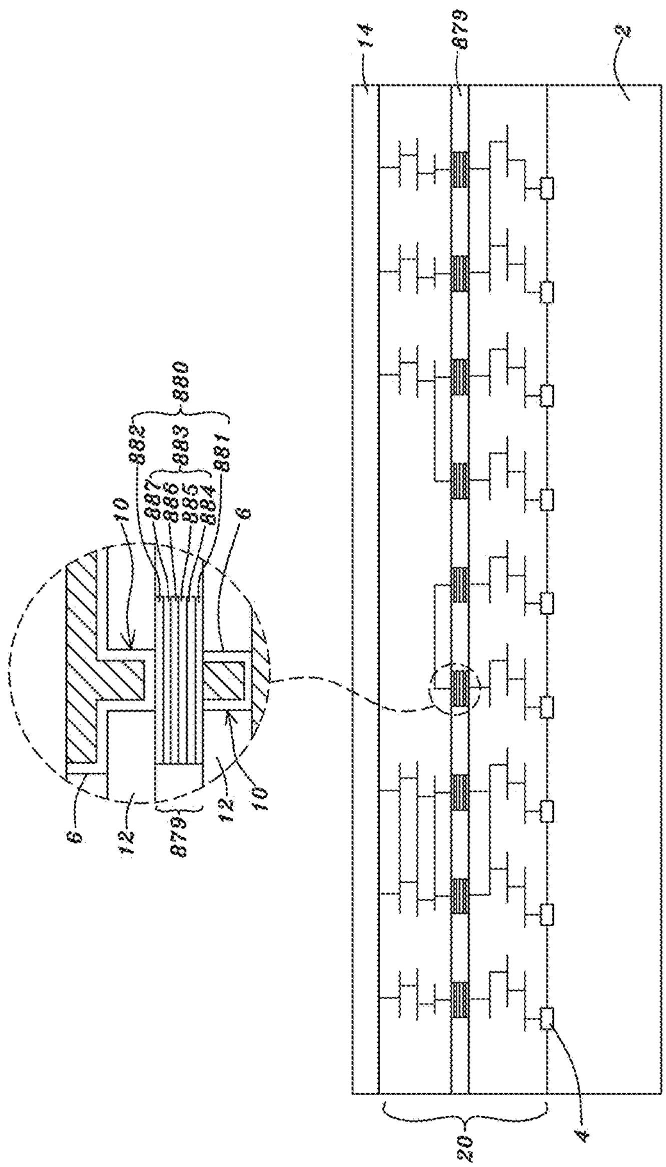
FIGS. 9A-9C are schematically cross-sectional views showing various structures for a spin-transfer-torque (STT) based magnetoresistive random access memory (MRAM) cell for a first alternative in accordance with an embodiment of the present application.
Figure 9B:
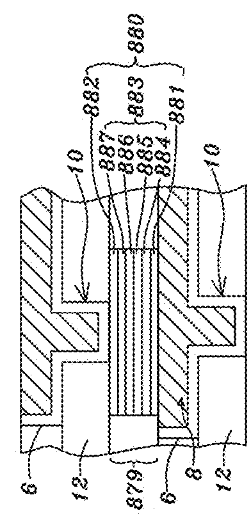
Figure 9C:
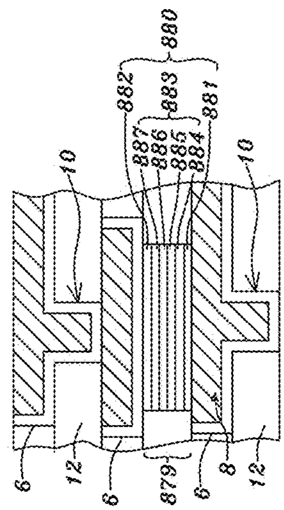

FIGS. 9A-9C are schematically cross-sectional views showing various structures for a spin-transfer-torque (STT) based magnetoresistive random access memory (MRAM) cell for a first alternative in accordance with an embodiment of the present application. Referring to FIG. 9A, a semiconductor chip 100, used for the FPGA IC chip 200 for example, may include multiple spin-transfer-torque (STT) based magnetoresistive random access memory (MRAM) cells 880 formed in an MRAM layer 879 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the MRAM layer 879 and semiconductor substrate 2 may couple the magnetoresistive random access memory (MRAM) cells 880 to multiple semiconductor devices 4 on the semiconductor substrate 2. Multiple interconnection metal layers 6 in the FISC 20 and between the MRAM layer 879 and passivation layer 14 may couple the magnetoresistive random access memory (MRAM) cells 880 to external circuits outside the semiconductor chip 100 and may have a line pitch less than 0.5 micrometers. Each of the interconnection metal layers 6 in the FISC 20 and over the MRAM layer 879 may have a thickness greater than each of the interconnection metal layers 6 in the FISC 20 and under the MRAM layer 879. The details for the semiconductor substrate 2, semiconductor devices, interconnection metal layers 6, FISC 20 and passivation layer 14 may be referred to the illustration in FIGS. 34A-34D.

Referring to FIG. 9A, in the MRAM layer 879, each of the spin-transfer-torque (STT) based magnetoresistive random access memory (MRAM) cells 880 may have a bottom electrode 881 made of titanium nitride, copper or an aluminum alloy having a thickness between 1 and 20 nanometers, a top electrode 882 made of titanium nitride, copper or an aluminum alloy having a thickness between 1 and 20 nanometers, and a magnetoresistive layer 883, i.e., magnetoresistive tunneling junction (MTJ), having a thickness between 1 and 35 nanometers between the bottom and top electrodes 871 and 872. In the MRAM layer 879, the dielectric layer 12 as illustrated in FIGS. 34A-34D is provided to have the magnetoresistive random access memory (MRAM) cells 880 formed therein. For each of the magnetoresistive random access memory (MRAM) cells 880 for a first alternative, its magnetoresistive layer 883 may be composed of (1) an antiferromagnetic (AF) layer 884, i.e., pinning layer, such as Cr, Fe—Mn alloy, NiO, FeS, Co/$[CoPt]_4$, having a thickness between 1 and 10 nanometers on its bottom electrode 881, (2) a pinned magnetic layer 885, such as a FeCoB alloy or $Co_2Fe_6B_2$, having a thickness between 1 and 10 nanometers, between 0.5 and 3.5 nanometers, or between 1 and 3 nanometers on the antiferromagnetic layer 884, (3) a tunneling oxide layer 886, i.e., tunneling barrier layer, such as MgO, having a thickness between 0.5 and 5 nanometers, between 0.3 and 2.5 nanometers or between 0.5 and 1.5 nanometers on the pinned magnetic layer 885 and (4) a free magnetic layer 887, such as a FeCoB alloy or $Co_2Fe_6B_2$, having a thickness between 1 and 10 nanometers, between 0.5 and 3.5 nanometers, or between 1 and 3 nanometers on the tunneling oxide layer 886. Its top electrode 882 is formed on the free magnetic layer 887 of its magnetoresistive layer 883. The pinned magnetic layer 885 of its magnetoresistive layer 883 may have the same material as the free magnetic layer 887 of its magnetoresistive layer 883.

Referring to FIG. 9A, each of the magnetoresistive random access memory (MRAM) cells 880 for the first alternative may have the bottom electrode 881 formed on a top surface of one of the lower metal vias 10 of a lower one of the interconnection metal layers 6 as illustrated in FIGS. 34A-34D and on a top surface of a lower one of the dielectric layers 12 as illustrated in FIGS. 34A-34D. An upper one of the dielectric layers 12 as illustrated in FIGS. 34A-34D may be formed on the top electrode 882 of each of the magnetoresistive random access memory (MRAM) cells 880 for the first alternative and an upper one of the interconnection metal layers 6 as illustrated in FIGS. 34A-34D may have the upper metal vias 10 each formed in the upper one of the dielectric layers 12 and on the top electrode 882 of one of the magnetoresistive random access memory (MRAM) cells 880 for the first alternative.

Alternatively, referring to FIG. 9B, each of the magnetoresistive random access memory (MRAM) cells 880 for the first alternative may have the bottom electrode 881 formed on a top surface of one of the lower metal pads 8 of a lower one of the interconnection metal layers 6 as illustrated in FIGS. 34A-34D and the dielectric layer 12 in the MRAM layer 879 may be further formed on the top surface of said one of the lower metal pads 8. An upper one of the dielectric layers 12 as illustrated in FIGS. 34A-34D may be formed on the top electrode 882 of each of the magnetoresistive random access memory (MRAM) cells 880 for the first alternative and an upper one of the interconnection metal layers 6 as illustrated in FIGS. 34A-34D may have the upper metal vias 10 each formed in the upper one of the dielectric layers 12 and on the top electrode 882 of one of the magnetoresistive random access memory (MRAM) cells 880 for the first alternative.

Alternatively, referring to FIG. 9C, each of the magnetoresistive random access memory (MRAM) cells 880 for the first alternative may have the bottom electrode 881 formed on a top surface of one of the lower metal pads 8 of a lower one of the interconnection metal layers 6 as illustrated in FIGS. 34A-34D and the dielectric layer 12 in the MRAM layer 879 may be further formed on the top surface of said one of the lower metal pads 8. An upper one of the interconnection metal layers 6 as illustrated in FIGS. 34A-34D may have the upper metal pads 8 each formed in an upper one of the dielectric layers 12, on the top electrode 882 of one of the magnetoresistive random access memory (MRAM) cells 880 for the first alternative and on a top surface of the dielectric layer 12 of the MRAM layer 879.

Figure 9D:
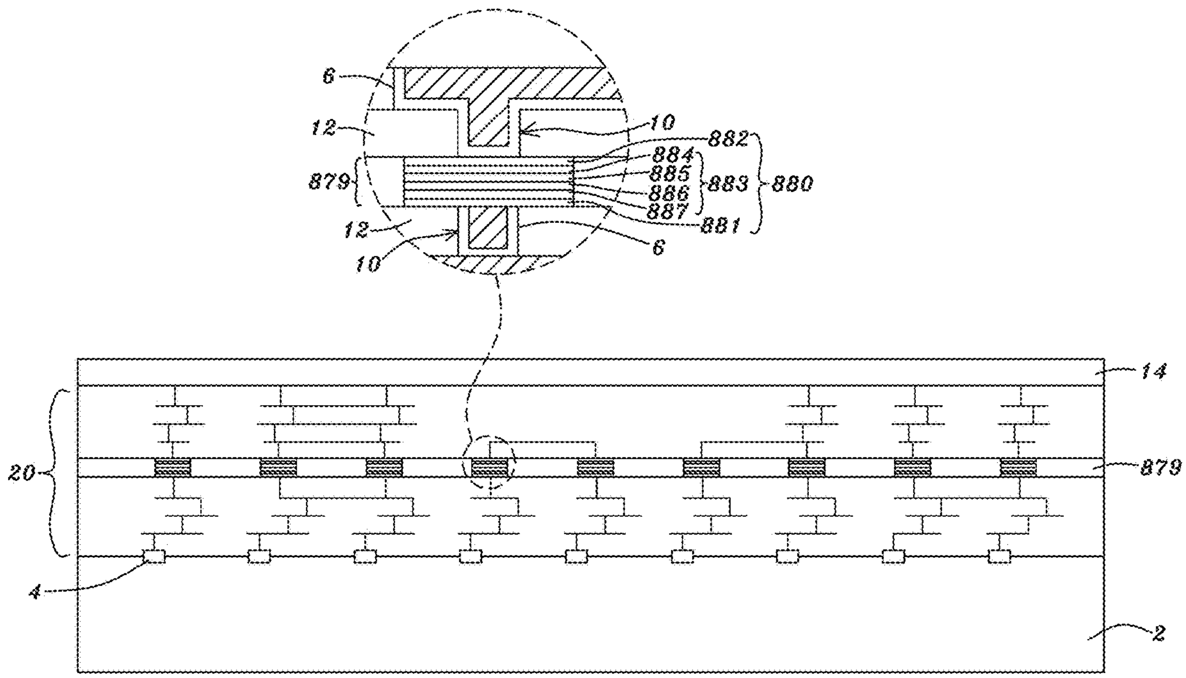
FIG. 9D is a schematically cross-sectional view showing a spin-transfer-torque (STT) based magnetoresistive random access memory (MRAM) cell for a second alternative in accordance with an embodiment of the present application.

For a second alternative, FIG. 9D is a schematically cross-sectional view showing a spin-transfer-torque (STT) based magnetoresistive random access memory (MRAM) cell for a second alternative in accordance with an embodiment of the present application. The scheme of the semiconductor chip as illustrated in FIG. 9D is similar to that as illustrated in FIG. 9A except for the composition of the magnetoresistive layer 883 for a spin-transfer-torque (STT) based magnetoresistive random access memory (MRAM) cell 880 for a second alternative. Referring to FIG. 9D, for the spin-transfer-torque (STT) based magnetoresistive random access memory (MRAM) cell 880 for the second alternative, its magnetoresistive layer 883, i.e., magnetoresistive tunneling junction (MTJ), may be composed of the free magnetic layer 887 on the bottom electrode 881, the tunneling oxide layer 886 on the free magnetic layer 887, the pinned magnetic layer 885 on the tunneling oxide layer 886 and the antiferromagnetic layer 884 on the pinned magnetic layer 885. Its top electrode 882 is formed on the antiferromagnetic layer 884 of its magnetoresistive layer 883. The materials and thicknesses of the free magnetic layer 887, tunneling oxide layer 886, pinned magnetic layer 885 and antiferromagnetic layer 884 for the spin-transfer-torque (STT) based magnetoresistive random access memory (MRAM) cell 880 for the second alternative may be referred to those for the first alternative. Each of the magnetoresistive random access memory (MRAM) cells 880 for the second alternative may have the bottom electrode 881 formed on a top surface of one of the lower metal vias 10 of a lower one of the interconnection metal layers 6 as illustrated in FIGS. 34A-34D and on a top surface of a lower one of the dielectric layers 12 as illustrated in FIGS. 34A-34D. An upper one of the dielectric layers 12 as illustrated in FIGS. 34A-34D may be formed on the top electrode 882 of each of the magnetoresistive random access memory (MRAM) cells 880 and an upper one of the interconnection metal layers 6 as illustrated in FIGS. 34A-34D may have the upper metal vias 10 each formed in the upper one of the dielectric layers 12 and on the top electrode 882 of one of the magnetoresistive random access memory (MRAM) cells 880 for the second alternative.

Alternatively, the magnetoresistive random access memory (MRAM) cells 880 for the second alternative in FIG. 9D may be provided between a lower metal pad 8 and an upper metal via 10 as seen in FIG. 9B. Referring to FIGS. 9B and 9D, each of the magnetoresistive random access memory (MRAM) cells 880 for the second alternative may have the bottom electrode 881 formed on a top surface of one of the lower metal pads 8 of a lower one of the interconnection metal layers 6 as illustrated in FIGS. 34A-34D. An upper one of the dielectric layers 12 as illustrated in FIGS. 34A-34D may be formed on the top electrode 882 of each of the magnetoresistive random access memory (MRAM) cells 880 for the second alternative and an upper one of the interconnection metal layers 6 as illustrated in FIGS. 34A-34D may have the upper metal vias 10 each formed in the upper one of the dielectric layers 12 and on the top electrode 882 of one of the magnetoresistive random access memory (MRAM) cells 880 for the second alternative.

Alternatively, the magnetoresistive random access memory (MRAM) cells 880 for the second alternative in FIG. 9D may be provided between a lower metal pad 8 and an upper metal pad 8 as seen in FIG. 9C. Referring to FIGS. 9C and 9D, each of the magnetoresistive random access memory (MRAM) cells 880 for the second alternative may have the bottom electrode 881 formed on a top surface of one of the lower metal pads 8 of a lower one of the interconnection metal layers 6 as illustrated in FIGS. 34A-34D. An upper one of the interconnection metal layers 6 as illustrated in FIGS. 34A-34D may have the upper metal pads 8 each formed in an upper one of the dielectric layers 12, on the top electrode 882 of one of the magnetoresistive random access memory (MRAM) cells 880 for the second alternative and on a top surface of the dielectric layer 12 of the MRAM layer 879.

Referring to FIGS. 9A-9D, for each of the magnetoresistive random access memory (MRAM) cells 880 for the first and second alternatives, its pinned magnetic layer 885 may have domains each provided with a magnetic field in a direction pinned by its antiferromagnetic layer 884, that is, hardly changed by a spin-transfer torque induced by an electron flow passing through its pinned magnetic layer 885. Its free magnetic layer 887 may have domains each provided with a magnetic field in a direction easily changed by a spin-transfer torque induced by an electron flow passing through its free magnetic layer 887.

Referring to FIGS. 9A-9C, in a setting step for each of the magnetoresistive random access memory (MRAM) cells 880 for the first alternative, when a first setting voltage $V1_{MSE}$ ranging from 0.25 to 3.3 volts is applied to its top electrode 882 and a voltage Vss of ground reference is applied to its bottom electrode 881, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, each of the magnetoresistive random access memory (MRAM) cells 880 for the first alternative may be set to a low resistance between 10 and 100,000,000,000 ohms. In a resetting step for each of the magnetoresistive random access memory (MRAM) cells 880 for the first alternative, when a first resetting voltage $V1_{MRE}$ ranging from 0.25 to 3.3 volts is applied to its bottom electrode 881 and the voltage Vss of ground reference is applied to its top electrode 882, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, each of the magnetoresistive random access memory (MRAM) cells 880 for the first alternative may be reset to a high resistance between 15 and 500,000,000,000 ohms greater than the low resistance. For each of the magnetoresistive random access memory (MRAM) cells 880 for the first alternative, its high resistance may be equal to between 1.5 and 10 times of its low resistance.

Referring to FIG. 9D, in a setting step for each of the magnetoresistive random access memory (MRAM) cells 880 for the second alternative, when the first setting voltage $\mathbf{V1}_{MSE}$ is applied to its bottom electrode 881 and a voltage Vss of ground reference is applied to its top electrode 882, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, each of the magnetoresistive random access memory (MRAM) cells 880 for the second alternative may be set to the low resistance between 10 and 100,000,000,000 ohms. In a resetting step for each of the magnetoresistive random access memory (MRAM) cells 880 for the second alternative, when the first resetting voltage $\mathbf{V1}_{MRE}$ is applied to its top electrode 882 and the voltage Vss of ground reference is applied to its bottom electrode 881, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, each of the magnetoresistive random access memory (MRAM) cells 880 may be reset to the high resistance between 15 and 500,000,000,000 ohms. For each of the magnetoresistive random access memory (MRAM) cells 880 for the second alternative, its high resistance may be equal to between 1.5 and 10 times of its low resistance.

VIII.1 Eighth Type of Non-Volatile Memory Cell for First Alternative

Figure 9E:
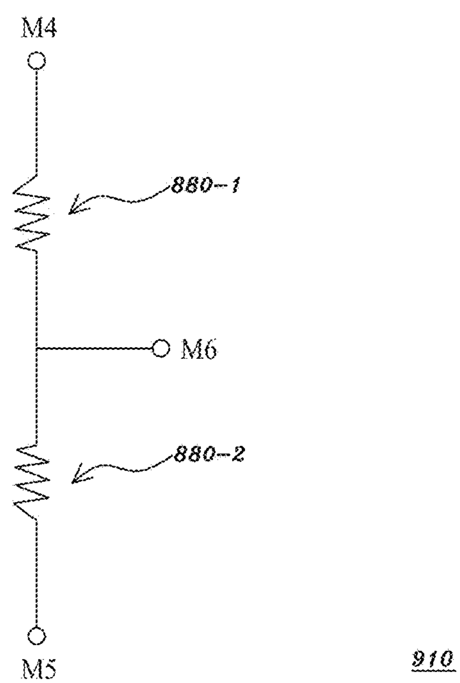
FIG. 9E is a circuit diagram illustrating an eighth type of non-volatile memory cell for a first alternative in accordance with an embodiment of the present application.
Figure 9F:
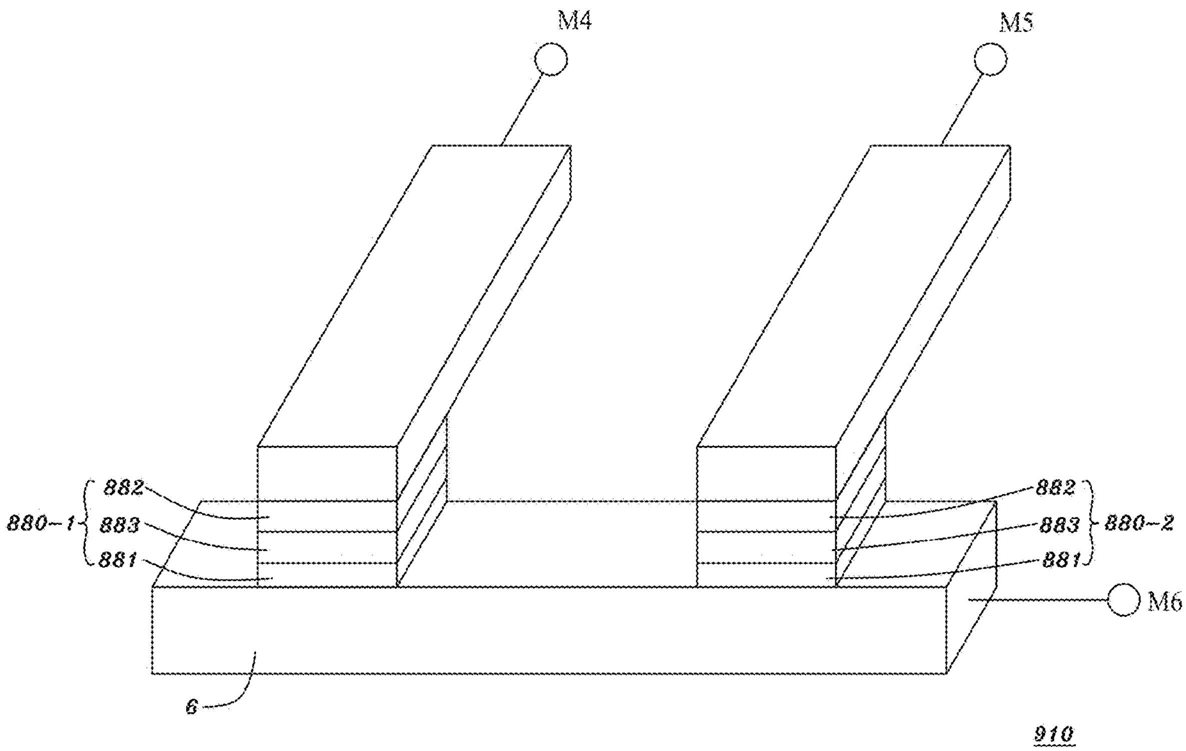
FIG. 9F is a schematically perspective view showing a structure for an eighth type of non-volatile memory cell for a first alternative in accordance with an embodiment of the present application.

FIG. 9E is a circuit diagram illustrating an eighth type of non-volatile memory cell for a first alternative in accordance with an embodiment of the present application. FIG. 9F is a schematically perspective view showing a structure for an eighth type of non-volatile memory cell for a first alternative in accordance with an embodiment of the present application. Referring to FIGS. 9E and 8F, two of the magnetoresistive random access memory (MRAM) cells 880 for the first alternative as seen in FIGS. 9A-9C, called as 880-1 and 880-2 hereinafter, may be provided for an eighth type of non-volatile memory cell 910 for a first alternative, i.e., complementary MRAM cell, abbreviated as CMRAM. For the eighth type of non-volatile memory cell 910 for the first alternative, its magnetoresistive random access memory (MRAM) cell 880-1 may have the bottom electrode 881 coupling to the bottom electrode 881 of its magnetoresistive random access memory (MRAM) cell 880-2 and to its node M6. Its magnetoresistive random access memory (MRAM) cell 880-1 may have the top electrode 882 coupling to its node M4, and its magnetoresistive random access memory (MRAM) cell 880-2 may have the top electrode 872 coupling to its node M5.

In a first condition, referring to FIGS. 9E and 9F, for the eighth type of non-volatile memory cell 910 for the first alternative, its magnetoresistive random access memory (MRAM) cell 880-2 may be reset with a first high resistance in the resetting step, and its magnetoresistive random access memory (MRAM) cell 880-1 may be set with a first low resistance in the setting step. In the resetting step for its magnetoresistive random access memory (MRAM) cell 880-2 and the setting step for its magnetoresistive random access memory (MRAM) cell 880-1, (1) its node M4 may be switched to couple to a fifth programming voltage, between 0.25 and 3.3 volts, equal to or greater than the first resetting voltage $\mathbf{V1}_{MRE}$ of its magnetoresistive random access memory (MRAM) cell 880-2, equal to or greater than the first setting voltage $\mathbf{V1}_{MSE}$ of its magnetoresistive random access memory (MRAM) cell 880-1 and greater than the voltage Vcc of power supply, (2) its node M5 may be switched to couple to the voltage Vss of ground reference and (3) its node M6 may be switched to be floating. Thereby, an electron current may pass from the top electrode 882 of its magnetoresistive random access memory (MRAM) cell 880-2 to the bottom electrode 881 of its magnetoresistive random access memory (MRAM) cell 880-2 to reset the direction of the magnetic field in each domain of the free magnetic layer 887 of its magnetoresistive random access memory (MRAM) cell 880-2 to be opposite to that in each domain of the pinned magnetic layer 885 of its magnetoresistive random access memory (MRAM) cell 880-2. Thus, its magnetoresistive random access memory (MRAM) cell 880-2 may be reset with the first high resistance between 15 and 500,000,000,000 ohms in the resetting step. Further, the electron current may then pass from the bottom electrode 881 of its magnetoresistive random access memory (MRAM) cell 880-1 to the top electrode 882 of its magnetoresistive random access memory (MRAM) cell 880-1 to set the direction of the magnetic field in each domain of the free magnetic layer 887 of its magnetoresistive random access memory (MRAM) cell 880-1 to be the same as that in each domain of the pinned magnetic layer 885 of its magnetoresistive random access memory (MRAM) cell 880-1. Thus, its magnetoresistive random access memory (MRAM) cell 880-1 may be set with the first low resistance between 10 and 100,000,000,000 ohms in the setting step. The first high resistance may be equal to between 1.5 and 10 times of the first low resistance. Thereby, the eighth type of non-volatile memory cell 910 for the first alternative may have a voltage at its node M6 to be programmed with a logic level of “1”, wherein its node M6 in operation may act as an output point of the eighth type of non-volatile memory cell 910 for the first alternative.

In a second condition, referring to FIGS. 9E and 9F, for the eighth type of non-volatile memory cell 910 for the first alternative, its magnetoresistive random access memory (MRAM) cell 880-1 may be reset with a second high resistance in the resetting step, and its magnetoresistive random access memory (MRAM) cell 880-2 may be set with a second low resistance in the setting step. In the resetting step for its magnetoresistive random access memory (MRAM) cell 880-1 and the setting step for its magnetoresistive random access memory (MRAM) cell 880-2, (1) its node M5 may be switched to couple to a sixth programming voltage, between 0.25 and 3.3 volts, equal to or greater than the first resetting voltage $\mathbf{V1}_{MRE}$ of its magnetoresistive random access memory (MRAM) cell 880-1, equal to or greater than the first setting voltage $V1_{MSE}$ of its magnetoresistive random access memory (MRAM) cell 880-2 and greater than the voltage Vcc of power supply, wherein the sixth programming voltage may be substantially equal to the fifth programming voltage, (2) its node M4 may be switched to couple to the voltage Vss of ground reference and (3) its node M6 may be switched to be floating. Thereby, an electron current may pass from the top electrode 882 of its magnetoresistive random access memory (MRAM) cell 880-1 to the bottom electrode 881 of its magnetoresistive random access memory (MRAM) cell 880-1 to reset the direction of the magnetic field in each domain of the free magnetic layer 887 of its magnetoresistive random access memory (MRAM) cell 880-1 to be opposite to that in each domain of the pinned magnetic layer 885 of its magnetoresistive random access memory (MRAM) cell 880-1. Thus, its magnetoresistive random access memory (MRAM) cell 880-1 may be reset with the second high resistance between 15 and 500,000,000,000 ohms in the resetting step. Further, the electron current may then pass from the bottom electrode 881 of its magnetoresistive random access memory (MRAM) cell 880-2 to the top electrode 882 of its magnetoresistive random access memory (MRAM) cell 880-2 to set the direction of the magnetic field in each domain of the free magnetic layer 887 of its magnetoresistive random access memory (MRAM) cell 880-2 to be the same as that in each domain of the pinned magnetic layer 885 of its magnetoresistive random access memory (MRAM) cell 880-2. Thus, its magnetoresistive random access memory (MRAM) cell 880-2 may be set with the second low resistance between 10 and 100,000,000,000 ohms in the setting step. The second high resistance may be equal to between 1.5 and 10 times of the second low resistance. Thereby, the eighth type of non-volatile memory cell 910 for the first alternative may have a voltage at its node M6 to be programmed with a logic level of "0", wherein its node M6 in operation may act as an output point of the eighth type of non-volatile memory cell 910 for the first alternative.

In operation, referring to FIGS. 9E and 9F, for the eighth type of non-volatile memory cell 910 for the first alternative, (1) its node M4 may be switched to couple to the voltage Vcc of power supply, (2) its node M5 may be switched to couple to the voltage Vss of ground reference and (3) its node M6 may be switched to act as an output point of the eighth type of non-volatile memory cell 910 for the first alternative. When its magnetoresistive random access memory (MRAM) cell 880-1 is reset with the second high resistance and its magnetoresistive random access memory (MRAM) cell 880-2 is set with the second low resistance, the eighth type of non-volatile memory cell 910 for the first alternative may generate a data output at its node M6 at a voltage level between the voltage Vss of ground reference and a half of the voltage Vcc of power supply, defined as a logic level of "0". When its magnetoresistive random access memory (MRAM) cell 880-1 is set with the first low resistance and its magnetoresistive random access memory (MRAM) cell 880-2 is reset with the first high resistance, the eighth type of non-volatile memory cell 910 for the first alternative may generate a data output at its node M6 at a voltage level between a half of the voltage Vcc of power supply and the voltage Vcc of power supply, defined as a logic level of "1".

VIII.2 Eighth Type of Non-Volatile Memory Cell for Second Alternative

Figure 9G:
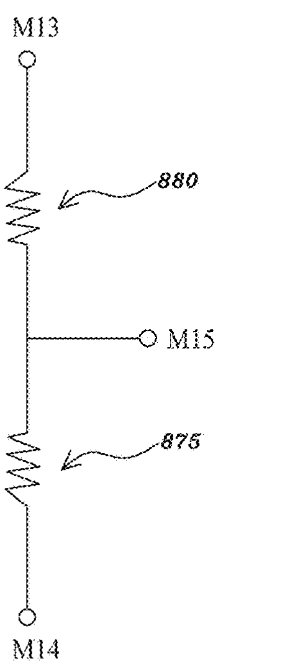
FIG. 9G is a circuit diagram illustrating an eighth type of non-volatile memory cell for a second alternative in accordance with an embodiment of the present application.

Alternatively, the eighth type of non-volatile memory cell 910 for a second alternative may be composed of the magnetoresistive random access memory (MRAM) cell 880 for the first alternative as seen in FIGS. 9A-9C and of a non-programmable resistor 875, as seen in FIG. 9G. FIG. 9G is a circuit diagram illustrating an eighth type of non-volatile memory cell for a second alternative in accordance with an embodiment of the present application. Referring to FIG. 9G, for the eighth type of non-volatile memory cell 910 for the second alternative, its magnetoresistive random access memory (MRAM) cell 880 for the first alternative may have the bottom electrode 881 coupling to a first end of its non-programmable resistor 875 and to its node M15. Its magnetoresistive random access memory (MRAM) cell 880 for the first alternative may have the top electrode 882 coupling to its node M13, and its non-programmable resistor 875 may have a second end, opposite to its first end, coupling to its node M14.

In a first condition, referring to FIG. 9G, for the eighth type of non-volatile memory cell 910 for the second alternative, its magnetoresistive random access memory (MRAM) cell 880 may be set with a seventh low resistance in the setting step. In the setting step for its magnetoresistive random access memory (MRAM) cell 880, (1) its node M13 may be switched to couple to a seventh programming voltage, between 0.25 and 3.3 volts, equal to or greater than the first setting voltage $V1_{MSE}$ of its magnetoresistive random access memory (MRAM) cell 880 and greater than the voltage Vcc of power supply, (2) its node M14 may be switched to couple to the voltage Vss of ground reference and (3) its node M15 may be switched to be floating. Thereby, an electron current may pass from the bottom electrode 881 of its magnetoresistive random access memory (MRAM) cell 880 to the top electrode 882 of its magnetoresistive random access memory (MRAM) cell 880 to set the direction of the magnetic field in each domain of the free magnetic layer 887 of its magnetoresistive random access memory (MRAM) cell 880 to be the same as that in each domain of the pinned magnetic layer 885 of its magnetoresistive random access memory (MRAM) cell 880. Thus, its magnetoresistive random access memory (MRAM) cell 880 may be set with the seventh low resistance, between 10 and 100,000,000,000 ohms, lower than the resistance of its non-programmable resistor 875. The resistance of its non-programmable resistor 875 may be equal to between 1.5 and 10,000,000 times of the seventh low resistance. Thereby, the eighth type of non-volatile memory cell 910 for the second alternative may have a voltage at its node M15 to be programmed with a logic level of "1", wherein its node M15 in operation may act as an output point of the eighth type of non-volatile memory cell 910 for the second alternative.

In a second condition, referring to FIG. 9G, for the eighth type of non-volatile memory cell 910 for the second alternative, its magnetoresistive random access memory (MRAM) cell 880 may be reset with a seventh high resistance in the resetting step. In the resetting step for its magnetoresistive random access memory (MRAM) cell 880, (1) its node M15 may be switched to couple to an eighth programming voltage, between 0.25 and 3.3 volts, equal to or greater than the first resetting voltage $V1_{MRE}$ of its magnetoresistive random access memory (MRAM) cell 880 and greater than the voltage Vcc of power supply, wherein the eighth programming voltage may be substantially equal to the seventh programming voltage, (2) its node M13 may be switched to couple to the voltage Vss of ground reference and (3) its node M14 may be switched to couple to the eighth programming voltage or to be floating. Thereby, an electron current may pass from the top electrode 882 of its magnetoresistive random access memory (MRAM) cell 880 to the bottom electrode 881 of its magnetoresistive random access memory (MRAM) cell 880 to reset the direction of the magnetic field in each domain of the free magnetic layer 887 of its magnetoresistive random access memory (MRAM) cell 880 to be opposite to that in each domain of the pinned magnetic layer 885 of its magnetoresistive random access memory (MRAM) cell 880. Thus, its magnetoresistive random access memory (MRAM) cell 880 may be reset with the seventh high resistance, between 15 and 500,000,000,000 ohms, greater than the resistance of its non-programmable resistor 875. The seventh high resistance may be equal to between 1.5 and 10 times of the resistance of its non-programmable resistor 875. Thereby, the eighth type of non-volatile memory cell 910 for the second alternative may have a voltage at its node M15 to be programmed with a logic level of "0", wherein its node M15 in operation may act as an output point of the eighth type of non-volatile memory cell 910 for the second alternative.

In operation, referring to FIG. 9G, for the eighth type of non-volatile memory cell 910 for the second alternative, (1) its node M13 may be switched to couple to the voltage Vcc of power supply, (2) its node M14 may be switched to couple to the voltage Vss of ground reference and (3) its node M15 may be switched to act as an output point of the eighth type of non-volatile memory cell 910 for the second alternative. When its magnetoresistive random access memory (MRAM) cell 880 is reset with the seventh high resistance, the eighth type of non-volatile memory cell 910 for the second alternative may generate a data output at its node M15 at a voltage level between the voltage Vss of ground reference and a half of the voltage Vcc of power supply, defined as a logic level of "0". When its magnetoresistive random access memory (MRAM) cell 880 is set with the seventh low resistance, the eighth type of non-volatile memory cell 910 for the second alternative may generate a data output at its node M15 at a voltage level between a half of the voltage Vcc of power supply and the voltage Vcc of power supply, defined as a logic level of "1".

VIII.3 Eighth Type of Non-Volatile Memory Cell for Third Alternative

Figure 9H:
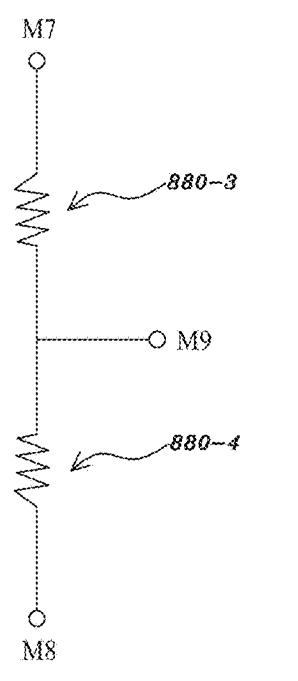
FIG. 9H is a circuit diagram illustrating an eighth type of non-volatile memory cell for a third alternative in accordance with an embodiment of the present application.
Figure 9I:
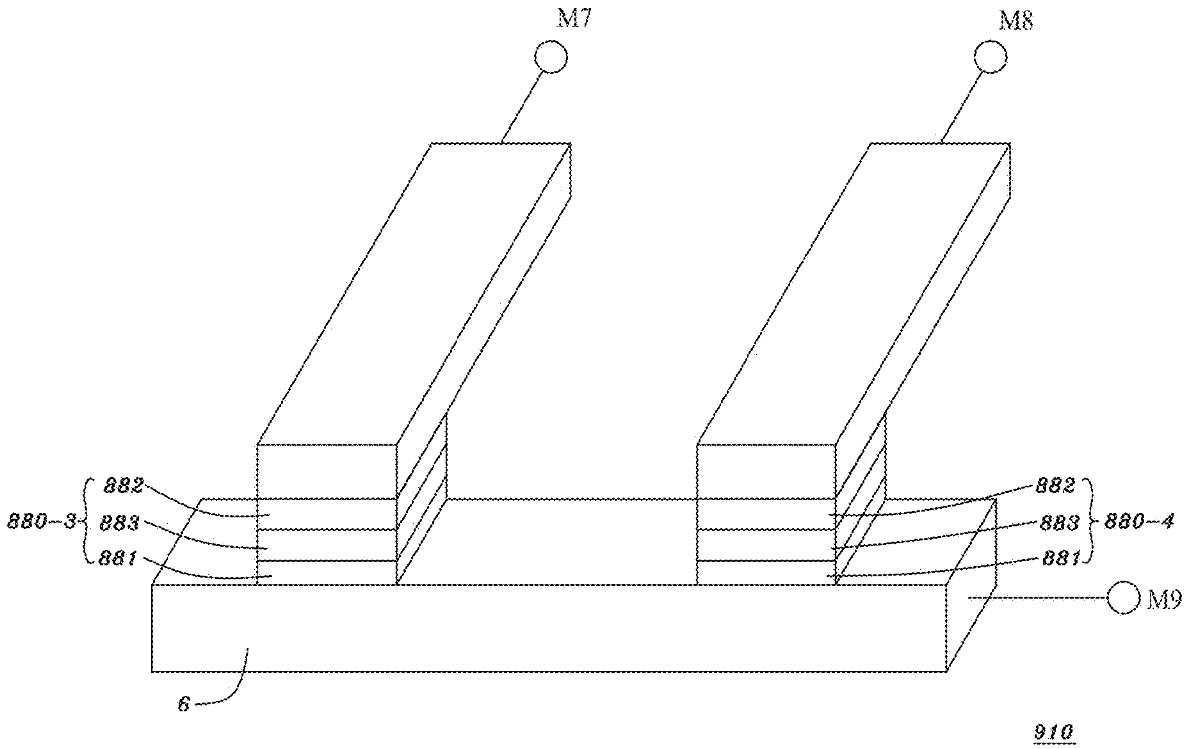
FIG. 9I is a schematically perspective view showing a structure for an eighth type of non-volatile memory cell for a third alternative in accordance with an embodiment of the present application.

FIG. 9H is a circuit diagram illustrating an eighth type of non-volatile memory cell for a third alternative in accordance with an embodiment of the present application. FIG. 9I is a schematically perspective view showing a structure for an eighth type of non-volatile memory cell for a third alternative in accordance with an embodiment of the present application. Referring to FIGS. 9H and 9I, two of the magnetoresistive random access memory (MRAM) cells 880 for the second alternative as seen in FIG. 9D, called as 880-3 and 880-4 hereinafter, may be provided for the eighth type of non-volatile memory cell 910 for a third alternative, i.e., complementary MRAM cell, abbreviated as CMRAM. For the eighth type of non-volatile memory cell 910 for the third alternative, its magnetoresistive random access memory (MRAM) cell 880-3 may have the bottom electrode 881 coupling to the bottom electrode 881 of its magnetoresistive random access memory (MRAM) cell 880-4 and to its node M9. Its magnetoresistive random access memory (MRAM) cell 880-3 may have the top electrode 882 coupling to its node M7, and its magnetoresistive random access memory (MRAM) cell 880-4 may have the top electrode 872 coupling to its node M8.

In a first condition, referring to FIGS. 9H and 9I, for the eighth type of non-volatile memory cell 910 for the third alternative, its magnetoresistive random access memory (MRAM) cell 880-3 may be reset with a third high resistance in the resetting step, and its magnetoresistive random access memory (MRAM) cell 880-4 may be set with a third low resistance in the setting step. In the resetting step for its magnetoresistive random access memory (MRAM) cell 880-3 and the setting step for its magnetoresistive random access memory (MRAM) cell 880-4, (1) its node M7 may be switched to couple to a ninth programming voltage, between 0.25 and 3.3 volts, equal to or greater than the first resetting voltage $V1_{MRE}$ of its magnetoresistive random access memory (MRAM) cell 880-4, equal to or greater than the first setting voltage $V1_{MSE}$ of its magnetoresistive random access memory (MRAM) cell 880-3 and greater than the voltage Vcc of power supply, (2) its node M8 may be switched to couple to the voltage Vss of ground reference and (3) its node M9 may be switched to be floating. Thereby, an electron current may pass from the top electrode 882 of its magnetoresistive random access memory (MRAM) cell 880-4 to the bottom electrode 881 of its magnetoresistive random access memory (MRAM) cell 880-4 to set the direction of the magnetic field in each domain of the free magnetic layer 887 of its magnetoresistive random access memory (MRAM) cell 880-4 to be the same as that in each domain of the pinned magnetic layer 885 of its magnetoresistive random access memory (MRAM) cell 880-4. Thus, its magnetoresistive random access memory (MRAM) cell 880-4 may be set with the third low resistance between 10 and 100,000,000,000 ohms in the setting step. Further, the electron current may then pass from the bottom electrode 881 of its magnetoresistive random access memory (MRAM) cell 880-3 to the top electrode 882 of its magnetoresistive random access memory (MRAM) cell 880-3 to reset the direction of the magnetic field in each domain of the free magnetic layer 887 of its magnetoresistive random access memory (MRAM) cell 880-3 to be opposite to that in each domain of the pinned magnetic layer 885 of its magnetoresistive random access memory (MRAM) cell 880-3. Thus, its magnetoresistive random access memory (MRAM) cell 880-3 may be reset with the third high resistance between 15 and 500,000,000,000 ohms in the resetting step. The third high resistance may be equal to between 1.5 and 10 times of the third low resistance. Thereby, the eighth type of non-volatile memory cell 910 for the third alternative may have a voltage at its node M9 to be programmed with a logic level of "0", wherein its node M9 in operation may act as an output point of the eighth type of non-volatile memory cell 910 for the third alternative.

In a second condition, referring to FIGS. 9H and 9I, for the eighth type of non-volatile memory cell 910 for the third alternative, its magnetoresistive random access memory (MRAM) cell 880-3 may be set with a fourth low resistance in the setting step, and its magnetoresistive random access memory (MRAM) cell 880-4 may be reset with a fourth high resistance in the resetting step. In the resetting step for its magnetoresistive random access memory (MRAM) cell 880-4 and the setting step for its magnetoresistive random access memory (MRAM) cell 880-3, (1) its node M8 may be switched to couple to a tenth programming voltage, between 0.25 and 3.3 volts, equal to or greater than the first resetting voltage $V1_{MRE}$ of its magnetoresistive random access memory (MRAM) cell 880-4, equal to or greater than the first setting voltage $V1_{MSE}$ of its magnetoresistive random access memory (MRAM) cell 880-3 and greater than the voltage Vcc of power supply, wherein the tenth programming voltage may be substantially equal to the ninth programming voltage, (2) its node M7 may be switched to couple to the voltage Vss of ground reference and (3) its node M9 may be switched to be floating. Thereby, an electron current may pass from the top electrode 882 of its magnetoresistive random access memory (MRAM) cell 880-3 to the bottom electrode 881 of its magnetoresistive random access memory (MRAM) cell 880-3 to set the direction of the magnetic field in each domain of the free magnetic layer 887 of its magnetoresistive random access memory (MRAM) cell 880-3 to be the same as that in each domain of the pinned magnetic layer 885 of its magnetoresistive random access memory (MRAM) cell 880-3. Thus, its magnetoresistive random access memory (MRAM) cell 880-3 may be set with the fourth low resistance between 10 and 100,000,000,000 ohms in the setting step. Further, the electron current may then pass from the bottom electrode 881 of its magnetoresistive random access memory (MRAM) cell 880-4 to the top electrode 882 of its magnetoresistive random access memory (MRAM) cell 880-4 to reset the direction of the magnetic field in each domain of the free magnetic layer 887 of its magnetoresistive random access memory (MRAM) cell 880-4 to be opposite to that in each domain of the pinned magnetic layer 885 of its magnetoresistive random access memory (MRAM) cell 880-4. Thus, its magnetoresistive random access memory (MRAM) cell 880-4 may be reset with the fourth high resistance between 15 and 500,000,000,000 ohms in the resetting step. The fourth high resistance may be equal to between 1.5 and 10 times of the fourth low resistance. Thereby, the eighth type of non-volatile memory cell 910 for the third alternative may have a voltage at its node M9 to be programmed with a logic level of "1", wherein its node M9 in operation may act as an output point of the eighth type of non-volatile memory cell 910 for the third alternative.

In operation, referring to FIGS. 9H and 9I, for the eighth type of non-volatile memory cell 910 for the third alternative, (1) its node M7 may be switched to couple to the voltage Vcc of power supply, (2) its node M8 may be switched to couple to the voltage Vss of ground reference and (3) its node M9 may be switched to act as an output point of the eighth type of non-volatile memory cell 910 for the third alternative. When its magnetoresistive random access memory (MRAM) cell 880-3 is reset with the fourth high resistance and its magnetoresistive random access memory (MRAM) cell 880-4 is set with the fourth low resistance, the eighth type of non-volatile memory cell 910 for the third alternative may generate a data output at its node M9 at a voltage level between the voltage Vss of ground reference and a half of the voltage Vcc of power supply, defined as a logic level of "0". When its magnetoresistive random access memory (MRAM) cell 880-3 is set with the fourth low resistance and its magnetoresistive random access memory (MRAM) cell 880-4 is reset with the fourth high resistance, the eighth type of non-volatile memory cell 910 for the third alternative may generate a data output at its node M9 at a voltage level between a half of the voltage Vcc of power supply and the voltage Vcc of power supply, defined as a logic level of "1".

VIII.4 Eighth Type of Non-Volatile Memory Cell for Fourth Alternative

Figure 9J:
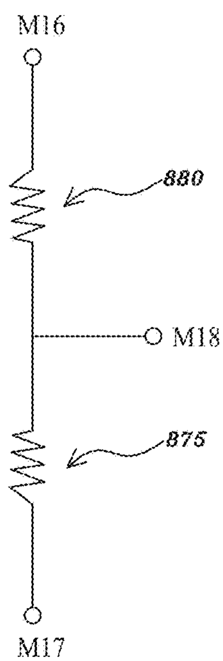
FIG. 9J is a circuit diagram illustrating an eighth type of non-volatile memory cell for a fourth alternative in accordance with an embodiment of the present application.

Alternatively, the eighth type of non-volatile memory cell 910 for a fourth alternative may be composed of the magnetoresistive random access memory (MRAM) cell 880 for the second alternative as seen in FIG. 9D and of a non-programmable resistor 875, as seen in FIG. 9J. FIG. 9J is a circuit diagram illustrating an eighth type of non-volatile memory cell for a fourth alternative in accordance with an embodiment of the present application. Referring to FIG. 9J, for the eighth type of non-volatile memory cell 910 for the fourth alternative, its magnetoresistive random access memory (MRAM) 880 for the second alternative may have the bottom electrode 881 coupling to a first end of its non-programmable resistor 875 and to its node M18. Its magnetoresistive random access memory (MRAM) cell 880 for the second alternative may have the top electrode 882 coupling to its node M16, and its non-programmable resistor 875 may have a second end, opposite to its first end, coupling to its node M17.

In a first condition, referring to FIG. 9J, for the eighth type of non-volatile memory cell 910 for the fourth alternative, its magnetoresistive random access memory (MRAM) cell 880 may be reset with an eighth high resistance in the resetting step. In the resetting step for its magnetoresistive random access memory (MRAM) cell 880, (1) its node M16 may be switched to couple to an eleventh programming voltage, between 0.25 and 3.3 volts, equal to or greater than the first setting voltage $V1_{MSE}$ of its magnetoresistive random access memory (MRAM) cell 880 and greater than the voltage Vcc of power supply, (2) its node M17 may be switched to couple to the voltage Vss of ground reference and (3) its node M18 may be switched to be floating. Thereby, an electron current may pass from the bottom electrode 881 of its magnetoresistive random access memory (MRAM) cell 880 to the top electrode 882 of its magnetoresistive random access memory (MRAM) cell 880 to reset the direction of the magnetic field in each domain of the free magnetic layer 887 of its magnetoresistive random access memory (MRAM) cell 880 to be opposite to that in each domain of the pinned magnetic layer 885 of its magnetoresistive random access memory (MRAM) cell 880. Thus, its magnetoresistive random access memory (MRAM) cell 880 may be reset with the eighth high resistance, between 15 and 500,000,000,000 ohms, greater than the resistance of its non-programmable resistor 875. The eighth high resistance may be equal to between 1.5 and 10 times of the resistance of its non-programmable resistor 875. Thereby, the eighth type of non-volatile memory cell 910 for the fourth alternative may have a voltage at its node M18 to be programmed with a logic level of "0", wherein its node M18 in operation may act as an output point of the eighth type of non-volatile memory cell 910 for the fourth alternative.

In a second condition, referring to FIG. 9J, for the eighth type of non-volatile memory cell 910 for the fourth alternative, its magnetoresistive random access memory (MRAM) cell 880 may be set with an eighth low resistance in the setting step. In the setting step for its magnetoresistive random access memory (MRAM) cell 880, (1) its node M18 may be switched to couple to a twelfth programming voltage, between 0.25 and 3.3 volts, equal to or greater than the first setting voltage $V1_{MSE}$ of its magnetoresistive random access memory (MRAM) cell 880 and greater than the voltage Vcc of power supply, wherein the twelfth programming voltage may be substantially equal to the eleventh programming voltage, (2) its node M16 may be switched to couple to the voltage Vss of ground reference and (3) its node M17 may be switched to couple to the twelfth programming voltage or to be floating. Thereby, an electron current may pass from the top electrode 882 of its magnetoresistive random access memory (MRAM) cell 880 to the bottom electrode 881 of its magnetoresistive random access memory (MRAM) cell 880 to set the direction of the magnetic field in each domain of the free magnetic layer 887 of its magnetoresistive random access memory (MRAM) cell 880 to be the same as that in each domain of the pinned magnetic layer 885 of its magnetoresistive random access memory (MRAM) cell 880. Thus, its magnetoresistive random access memory (MRAM) cell 880 may be set with the eighth low resistance, between 10 and 100,000,000,000 ohms, lower than the resistance of its non-programmable resistor 875. The resistance of its non-programmable resistor 875 may be equal to between 1.5 and 10,000,000 times of the eighth low resistance. Thereby, the eighth type of non-volatile memory cell 910 for the fourth alternative may have a voltage at its node M18 to be programmed with a logic level of "1", wherein its node M18 in operation may act as an output point of the eighth type of non-volatile memory cell 910 for the fourth alternative.

In operation, referring to FIG. 9J, for the eighth type of non-volatile memory cell 910 for the fourth alternative, (1) its node M16 may be switched to couple to the voltage Vcc of power supply, (2) its node M17 may be switched to couple to the voltage Vss of ground reference and (3) its node M18 may be switched to act as an output point of the eighth type of non-volatile memory cell 910 for the fourth alternative. When its magnetoresistive random access memory (MRAM) cell 880 is reset with the eighth high resistance, the eighth type of non-volatile memory cell 910 for the fourth alternative may generate a data output at its node M18 at a voltage level between the voltage Vss of ground reference and a half of the voltage Vcc of power supply, defined as a logic level of "0". When its magnetoresistive random access memory (MRAM) cell 880 is set with the eighth low resistance, the eighth type of non-volatile memory cell 910 for the fourth alternative may generate a data output at its node M18 at a voltage level between a half of the voltage Vcc of power supply and the voltage Vcc of power supply, defined as a logic level of "1".

IX. Ninth Type of Non-Volatile Memory Cells

Figure 10A:
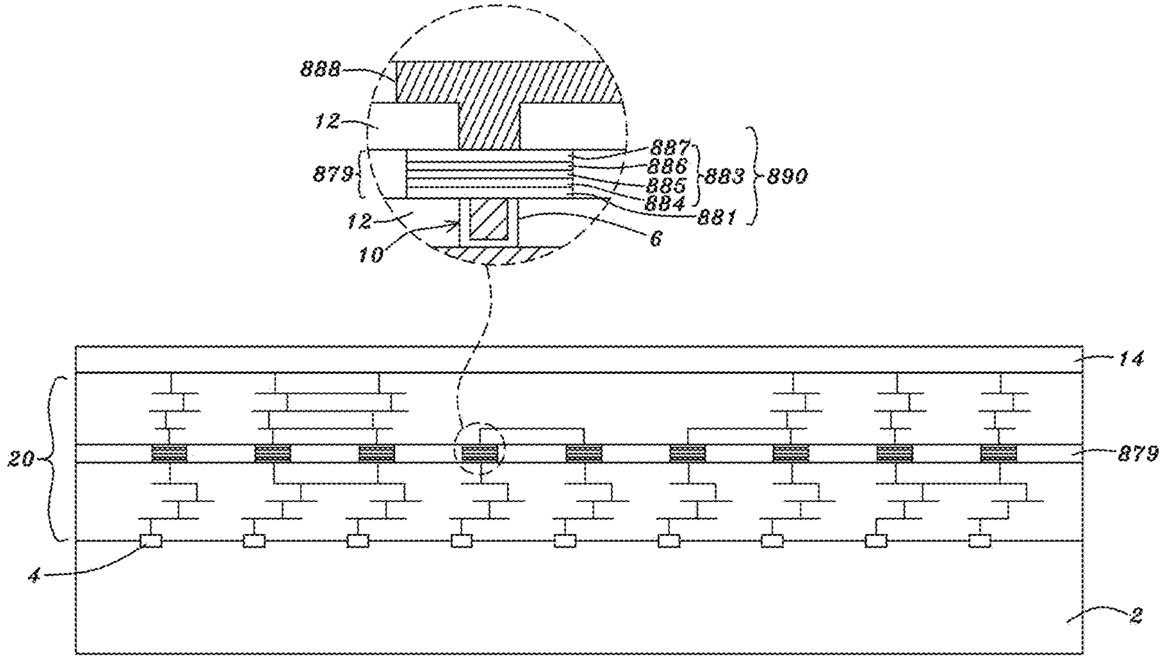
FIGS. 10A-10C are schematically cross-sectional views showing various structures for a spin-orbit-torque (SOT) based magnetoresistive random access memory (MRAM) cell for a first alternative in accordance with an embodiment of the present application.
Figure 10B:
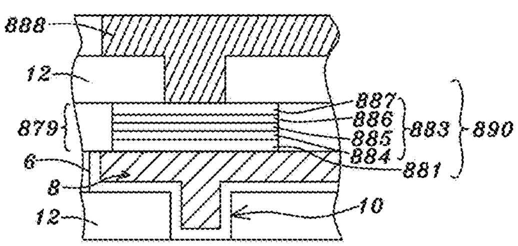
Figure 10C:
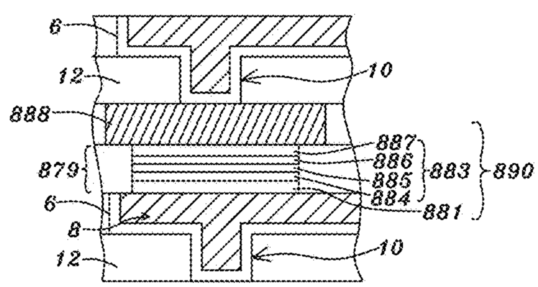

FIGS. 10A-10C are schematically cross-sectional views showing various structures for a spin-orbit-torque (SOT) based magnetoresistive random access memory (MRAM) cell for a first alternative in accordance with an embodiment of the present application. The scheme of the semiconductor chip as illustrated in FIGS. 10A-10C is similar to that as illustrated in FIGS. 9A-9C respectively except for the composition of the MRAM layer 879 for multiple spin-orbit-torque (SOT) based magnetoresistive random access memory (MRAM) cells 890 and a spin-accumulation induced layer 888 further provided on the free magnetic layer 887 of the magnetoresistive layer 883 of the MRAM layer 879 for the spin-orbit-torque (SOT) based magnetoresistive random access memory (MRAM) cells 890. For an element indicated by the same reference number shown in FIGS. 9A-9C and 10A-10C, the specification of the element as seen in FIGS. 10A-10C may be referred to that of the element as illustrated in FIGS. 9A-9C. Referring to FIGS. 10A-10C, for the MRAM layer 879, the structure and specification for its magnetoresistive layer 883 as seen in FIGS. 10A-10C is the same as those as illustrated in FIGS. 9A-9C and may be referred to those as illustrated in FIGS. 9A-9C. Referring to FIGS. 10A-10C, the semiconductor chip 100 may include the spin-accumulation induced layer 888, such as platinum (Pt) layer, tantalum (Ta) layer, gold (Au) layer, tungsten (W) layer, palladium (Pd) layer or precious metal layer, having a thickness between 0.5 and 50 nanometers in an upper one of its dielectric layers 12 as illustrated in FIGS. 34A-34D. For the MRAM layer 879 of the semiconductor chip 100, its top electrode 882 as seen in FIGS. 9A-9C may be skipped such that the spin-accumulation induced layer 888 may be formed on the free magnetic layer 887 of its magnetoresistive layer 883 for the spin-orbit-torque (SOT) based magnetoresistive random access memory (MRAM) cells 890.

Referring to FIGS. 10A and 10B, for each of the magnetoresistive random access memory (MRAM) cells 890, an upper one of the dielectric layers 12 as illustrated in FIGS. 34A-34D may be formed on a top surface of the free magnetic layer 887 of its magnetoresistive layer 883 and the spin-accumulation induced layer 888 may be formed with a metal via and metal line both in the upper one of the dielectric layers 12, wherein the metal via of the spin-accumulation induced layer 888 may be formed on the top surface of the free magnetic layer 887 of its magnetoresistive layer 883 to couple the metal line of the spin-accumulation induced layer 888 to its magnetoresistive layer 883.

Alternatively, referring to FIG. 10C, for each of the magnetoresistive random access memory (MRAM) cells 890, the spin-accumulation induced layer 888 may be formed in an upper one of the dielectric layers 12, on a top surface of the free magnetic layer 887 of its magnetoresistive layer 883 and on a top surface of the dielectric layer 12 of the MRAM layer 879.

Referring to FIGS. 10A-10C, for each of the spin-orbit-torque (SOT) based magnetoresistive random access memory (MRAM) cells 890 for the first alternative, its pinned magnetic layer 885 may have domains each provided with a magnetic field in a direction pinned by its antiferromagnetic layer 884, that is, hardly changed by a spin-transfer torque induced by an electron flow passing through its pinned magnetic layer 885. Its free magnetic layer 887 may have domains each provided with a magnetic field in a direction easily changed by spin accumulation of electrons at a lateral side of the spin-accumulation induced layer 888 adjacent to its free magnetic layer 887, which is induced by an electron flow passing in the spin-accumulation induced layer 888 and across over its free magnetic layer 887.

Figure 10D:
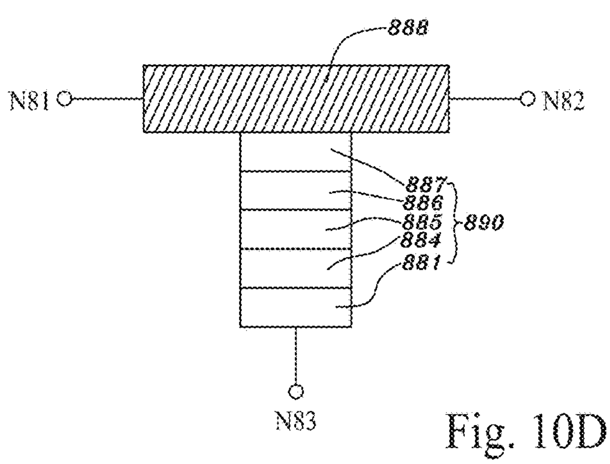
FIG. 10D is a simplified cross-sectional view illustrating a programming step for setting or resetting a spin-orbit-torque (SOT) based magnetoresistive random access memory (MRAM) cell for a first alternative in accordance with an embodiment of the present application.

FIG. 10D is a simplified cross-sectional view illustrating a programming step for setting or resetting a spin-orbit-torque (SOT) based magnetoresistive random access memory (MRAM) cell for a first alternative in accordance with an embodiment of the present application. Referring to FIGS. 10A-10D in a setting step for each of the magnetoresistive random access memory (MRAM) cells 890 for the first alternative, in a case that its pinned magnetic layer 885 has domains each provided with a magnetic field in a direction, e.g., out of the paper, pinned by the antiferromagnetic layer 884, when a node N82 at a right side of the spin-accumulation induced layer 888 is switched to couple to a second setting voltage $V\mathbf{2}_{MSE}$ ranging from 0.25 to 3.3 volts, a node N81 at a left side of the spin-accumulation induced layer 888 is switched to couple to the voltage of ground reference and a node N83 coupling to its antiferromagnetic layer 884 is switched to be floating, spin accumulation of electrons may be induced at a bottom side of the spin-accumulation induced layer 888 by an electron current passing from the node N81 to the node N82 to change a magnetic field in each domain of its free magnetic layer 887 to be substantially in parallel to the magnetic field in each domain of its pined magnetic layer 885, e.g., in a direction out of the paper. Thus, each of the magnetoresistive random access memory (MRAM) cells 890 for the first alternative may be set to a low resistance between 10 and 100,000,000,000 ohms. In a resetting step for each of the magnetoresistive random access memory (MRAM) cells 890 for the first alternative, when the node N81 is switched to couple to a second resetting voltage $V\mathbf{2}_{MRE}$ ranging from 0.25 to 3.3 volts, wherein the second resetting voltage $V\mathbf{2}_{MRE}$ may be substantially equal to the second setting voltage $V\mathbf{2}_{MSE}$, the node N82 is switched to couple to the voltage of ground reference and the node N83 is switched to be floating, spin accumulation of electrons may be induced at the bottom side of the spin-accumulation induced layer 888 by an electron current passing from the node N82 to the node N81 to change a magnetic field in each domain of its free magnetic layer 887 to be opposite to the magnetic field in each domain of its pined magnetic layer 885, e.g., in a direction into the paper. Thus, each of the magnetoresistive random access memory (MRAM) cells 890 for the first alternative may be reset to a high resistance between 15 and 500,000,000,000 ohms greater than the low resistance. For each of the magnetoresistive random access memory (MRAM) cells 890 for the first alternative, its high resistance may be equal to between 1.5 and 10 times of its low resistance.

Figure 10E:
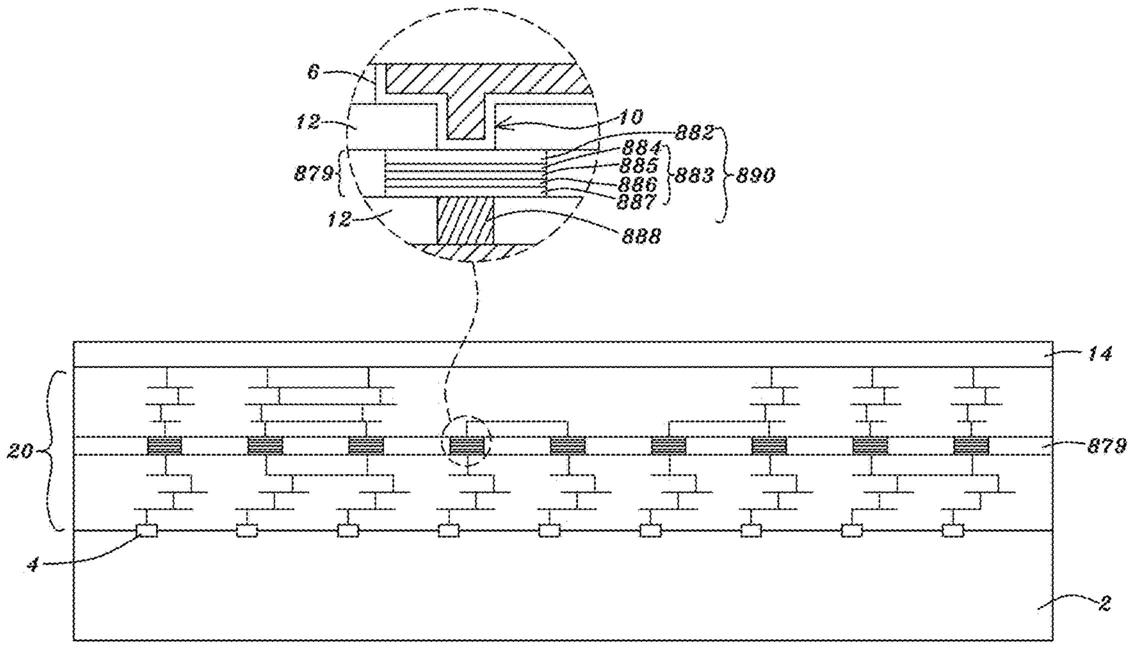
FIGS. 10E-10G are schematically cross-sectional views showing a spin-orbit-torque (SOT) based magnetoresistive random access memory (MRAM) cell, for a second alternative in accordance with an embodiment of the present application.
Figure 10F:
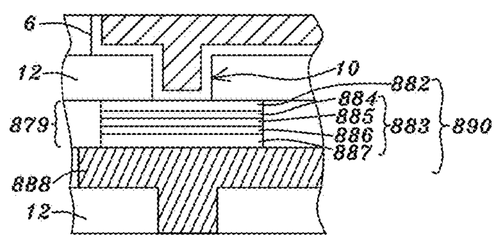
Figure 10G:
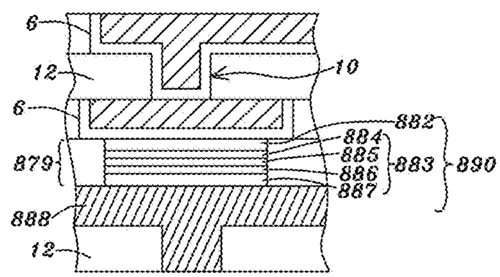

FIGS. 10E-10G are schematically cross-sectional views showing a spin-orbit-torque (SOT) based magnetoresistive random access memory (MRAM) cell, for a second alternative in accordance with an embodiment of the present application. The scheme of the semiconductor chip as illustrated in FIGS. 10E-10G is similar to that as illustrated in FIG. 9D except for the composition of the MRAM layer 879 and a spin-accumulation induced layer 888 further provided under and in contact with the free magnetic layer 887 of the magnetoresistive layer 883 of the MRAM layer 879. For an element indicated by the same reference number shown in FIGS. 9A-9D and 10E-10G, the specification of the element as seen in FIGS. 10E-10G may be referred to that of the element as illustrated in FIGS. 9A-9D. Referring to FIGS. 10E-10G, for the MRAM layer 879, the structure and specification for its magnetoresistive layer 883 as seen in FIGS. 10E-10G is the same as those as illustrated in FIG. 9D and may be referred to those as illustrated in FIG. 9D. Referring to FIGS. 10E-10G, the semiconductor chip 100 may include the spin-accumulation induced layer 888, such as platinum (Pt) layer, tantalum (Ta) layer, gold (Au) layer, tungsten (W) layer, palladium (Pd) layer or precious metal layer, having a thickness between 0.5 and 50 nanometers in a lower one of its dielectric layers 12 as illustrated in FIGS. 34A-34D. For the MRAM layer 879 of the semiconductor chip 100, its bottom electrode 882 as seen in FIG. 9D may be skipped such that the free magnetic layer 887 of its magnetoresistive layer 883 may be formed on the spin-accumulation induced layer 888.

Referring to FIG. 10E, for each of the magnetoresistive random access memory (MRAM) cells 890, the free magnetic layer 887 of its magnetoresistive layer 883 may be formed on a top surface of the spin-accumulation induced layer 888 in a lower one of the dielectric layers 12 as illustrated in FIGS. 34A-34D and on a top surface of the lower one of the dielectric layers 12.

Alternatively, referring to FIGS. 10F and 10G, for each of the magnetoresistive random access memory (MRAM) cells 890, the free magnetic layer 887 of its magnetoresistive layer 883 may be formed on a top surface of the spin-accumulation induced layer 888 in a lower one of the dielectric layers 12 as illustrated in FIGS. 34A-34D and the dielectric layer 12 in the MRAM layer 879 may be further formed on the top surface of the spin-accumulation induced layer 888.

Referring to FIGS. 10E-10G, for each of the spin-orbit-torque (SOT) based magnetoresistive random access memory (MRAM) cells 890 for the second alternative, its pinned magnetic layer 885 may have domains each provided with a magnetic field in a direction pinned by its antiferromagnetic layer 884, that is, hardly changed by a spin-transfer torque induced by an electron flow passing through its pinned magnetic layer 885. Its free magnetic layer 887 may have domains each provided with a magnetic field in a direction easily changed by spin accumulation of electrons at a lateral side of the spin-accumulation induced layer 888 adjacent to its free magnetic layer 887, which is induced by an electron flow passing in the spin-accumulation induced layer 888 and across under its free magnetic layer 887.

Figure 10H:
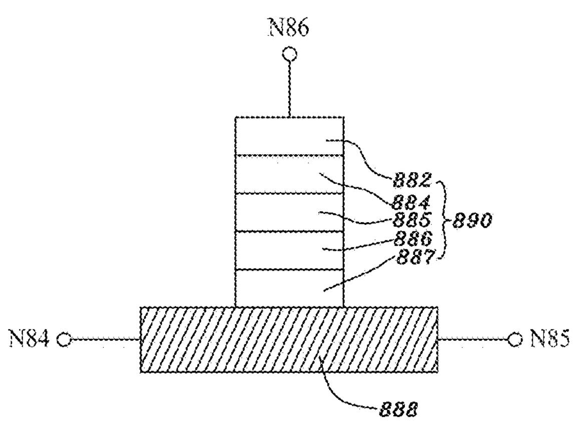
FIG. 10H is a simplified cross-sectional view illustrating a programming step for setting or resetting a spin-orbit-torque (SOT) based magnetoresistive random access memory (MRAM) cell for a second alternative in accordance with an embodiment of the present application.

FIG. 10H is a simplified cross-sectional view illustrating a programming step for setting or resetting a spin-orbit-torque (SOT) based magnetoresistive random access memory (MRAM) cell for a second alternative in accordance with an embodiment of the present application. Referring to FIGS. 10E-10H, in a setting step for each of the magnetoresistive random access memory (MRAM) cells 890 for the second alternative, in a case that its pinned magnetic layer 885 has domains each provided with a magnetic field in a direction, e.g., out of the paper, pinned by the antiferromagnetic layer 884, when a node N84 at a left side of the spin-accumulation induced layer 888 is switched to couple to the second setting voltage $V2_{MSE}$, a node N85 at a right side of the spin-accumulation induced layer 888 is switched to couple to the voltage of ground reference and a node N86 coupling to its antiferromagnetic layer 884 is switched to be floating, spin accumulation of electrons may be induced at a top side of the spin-accumulation induced layer 888 by an electron current passing from the node N85 to the node N84 to change a magnetic field in each domain of its free magnetic layer 887 to be substantially in parallel to the magnetic field in each domain of its pined magnetic layer 885, e.g., in a direction out of the paper. Thus, each of the magnetoresistive random access memory (MRAM) cells 890 for the second alternative may be set to a low resistance between 10 and 100,000,000,000 ohms. In a resetting step for each of the magnetoresistive random access memory (MRAM) cells 890 for the second alternative, when the node N85 is switched to couple to the second resetting voltage $V2_{MRE}$, the node N84 is switched to couple to the voltage of ground reference and the node N86 is switched to be floating, spin accumulation of electrons may be induced at the top side of the spin-accumulation induced layer 888 by an electron current passing from the node N84 to the node N85 to change a magnetic field in each domain of its free magnetic layer 887 to be opposite to a magnetic field in each domain of its pined magnetic layer 885, e.g., in a direction into the paper. Thus, each of the magnetoresistive random access memory (MRAM) cells 890 for the second alternative may be reset to a high resistance between 15 and 500,000,000,000 ohms greater than the low resistance. For each of the magnetoresistive random access memory (MRAM) cells 890 for the second alternative, its high resistance may be equal to between 1.5 and 10 times of its low resistance.

IX.1 Ninth Type of Non-Volatile Memory Cell for First Alternative

Figure 10I:
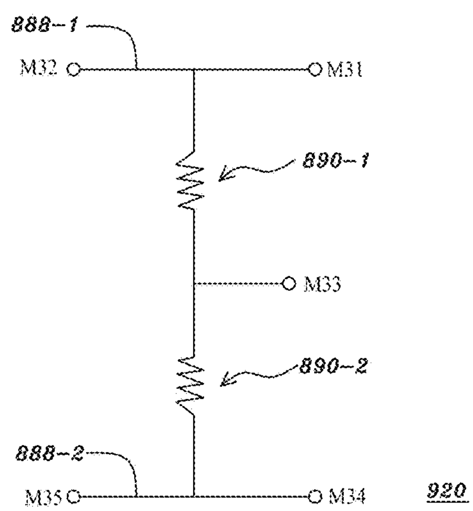
FIG. 10I is a circuit diagram illustrating a ninth type of non-volatile memory cell for a first alternative in accordance with an embodiment of the present application.
Figure 10J:
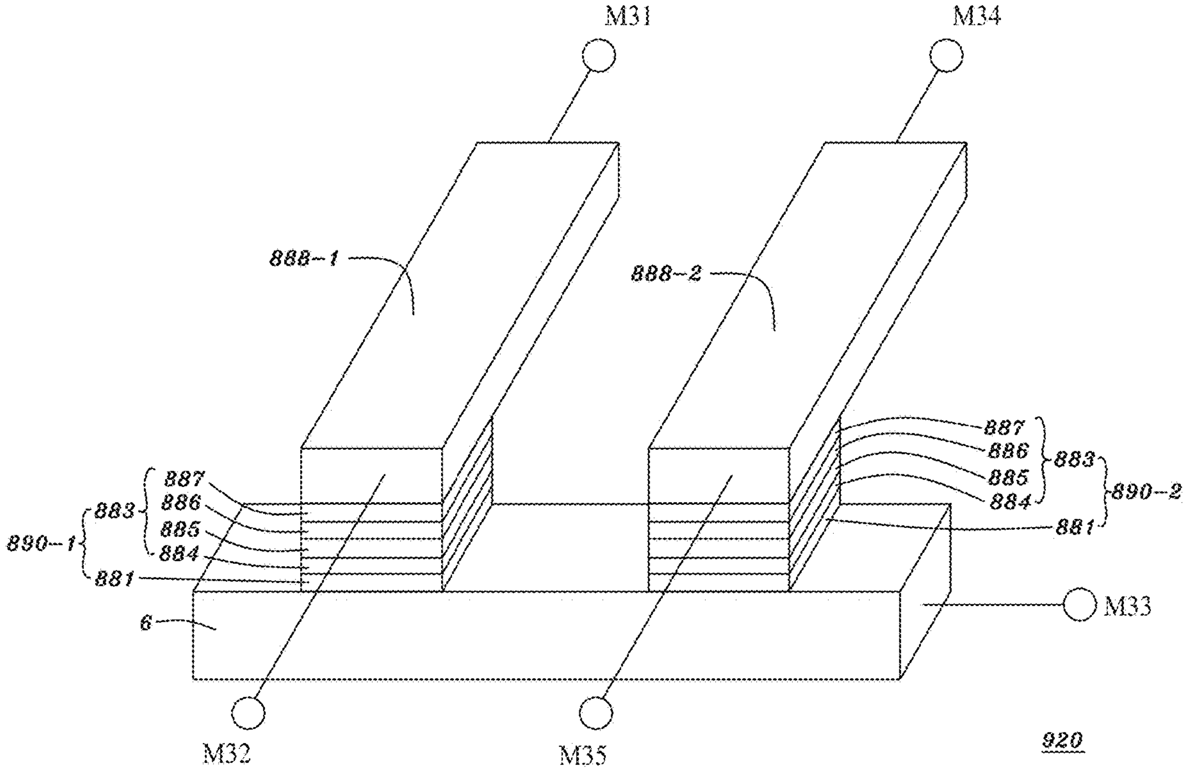
FIG. 10J is a schematically perspective view showing a structure for a ninth type of non-volatile memory cell for a first alternative in accordance with an embodiment of the present application.

FIG. 10I is a circuit diagram illustrating a ninth type of non-volatile memory cell for a first alternative in accordance with an embodiment of the present application. FIG. 10J is a schematically perspective view showing a structure for a ninth type of non-volatile memory cell for a first alternative in accordance with an embodiment of the present application. Referring to FIGS. 10I and 10J, two of the spin-orbit-torque (SOT) magnetoresistive random access memory (MRAM) cells 890 for the first alternative as seen in FIGS. 10A-10D, called as 890-1 and 890-2 hereinafter, may be provided for a ninth type of non-volatile memory cell 920 for a first alternative, i.e., complementary MRAM cell, abbreviated as CMRAM. For the ninth type of non-volatile memory cell 920 for the first alternative, its magnetoresistive random access memory (MRAM) cell 890-1 may have the bottom electrode 881 coupling to the bottom electrode 881 of its magnetoresistive random access memory (MRAM) cell 890-2 and to its node M33. Its magnetoresistive random access memory (MRAM) cell 890-1 may have the free magnetic layer 887 under and in contact with a spin-accumulation induced layer 888-1 laving the same specification as the spin-accumulation induced layer 888 illustrated in FIGS. 10A-10D, wherein the spin-accumulation induced layer 888-1 couples a node M31 to a node M32. Its magnetoresistive random access memory (MRAM) cell 890-2 may have the free magnetic layer 887 under and in contact with a spin-accumulation induced layer 888-2 having the same specification as the spin-accumulation induced layer 888 illustrated in FIGS. 10A-10D, wherein the spin-accumulation induced layer 888-2 couples a node M34 to a node M35.

In a first condition, referring to FIGS. 10I and 10J, for the ninth type of non-volatile memory cell 920 for the first alternative, its magnetoresistive random access memory (MRAM) cell 890-2 may be reset with a ninth high resistance in the resetting step, and its magnetoresistive random access memory (MRAM) cell 890-1 may be set with a ninth low resistance in the setting step. In the resetting step for its magnetoresistive random access memory (MRAM) cell 890-2 and the setting step for its magnetoresistive random access memory (MRAM) cell 890-1, in a case that the pinned magnetic layer 885 of each of its magnetoresistive random access memory (MRAM) cells 890-1 and 890-2 has domains each provided with a magnetic field in a direction, e.g., in a right direction, pinned by the antiferromagnetic layer 884 of said each of its magnetoresistive random access memory (MRAM) cells 890-1 and 890-2, (1) the node M31 may be switched to couple to a thirteenth programming voltage, between 0.25 and 3.3 volts, equal to or greater than the second setting voltage $V2_{MSE}$ of its magnetoresistive random access memory (MRAM) cell 890-1, (2) the node M35 may be switched to couple to a fourteenth programming voltage, between 0.25 and 3.3 volts, equal to or greater than the second resetting voltage $V2_{MRE}$ of its magnetoresistive random access memory (MRAM) cell 890-2, wherein the thirteenth programming voltage may be substantially equal to the fourteenth programming voltage and to the voltage Vcc of power supply, (3) the nodes M32 and M34 may be switched to couple to the voltage Vss of ground reference and (4) its node M33 may be switched to be floating. Thereby, spin accumulation of electrons may be induced at a bottom side of the spin-accumulation induced layer 888-1 by an electron current passing therethrough from the node M32 to the node M31 to change a magnetic field in each domain of the free magnetic layer 887 of its magnetoresistive random access memory (MRAM) cell 890-1 to be substantially in parallel to a magnetic field in each domain of the pined magnetic layer 885 of its magnetoresistive random access memory (MRAM) cell 890-1, e.g., in a right direction. Thus, its magnetoresistive random access memory (MRAM) cell 890-1 may be set with the ninth low resistance between 10 and 100,000,000,000 ohms in the setting step. Further, spin accumulation of electrons may be induced at a bottom side of the spin-accumulation induced layer 888-2 by an electron current passing from the node M34 to the node M35 to change a magnetic field in each domain of the free magnetic layer 887 of its magnetoresistive random access memory (MRAM) cell 890-2 to be substantially opposite to the magnetic field in each domain of the pined magnetic layer 885 of its magnetoresistive random access memory (MRAM) cell 890-2, e.g., in a left direction. Thus, its magnetoresistive random access memory (MRAM) cell 890-2 may be reset with the ninth high resistance between 15 and 500,000,000,000 ohms in the resetting step. The ninth high resistance may be equal to between 1.5 and 10 times of the ninth low resistance. Thereby, the ninth type of non-volatile memory cell 920 for the first alternative may have a voltage at its node M33 to be programmed with a logic level of "1", wherein its node M33 in operation may act as an output point of the ninth type of non-volatile memory cell 920 for the first alternative.

In a second condition, referring to FIGS. 10I and 10J, for the ninth type of non-volatile memory cell 920 for the first alternative, its magnetoresistive random access memory (MRAM) cell 890-1 may be reset with a tenth high resistance in the resetting step, and its magnetoresistive random access memory (MRAM) cell 890-2 may be set with a tenth low resistance in the setting step. In the resetting step for its magnetoresistive random access memory (MRAM) cell 890-1 and the setting step for its magnetoresistive random access memory (MRAM) cell 890-2, in a case that the pinned magnetic layers 885 of each of its magnetoresistive random access memory (MRAM) cells 890-1 and 890-2 has domains each provided with a magnetic field in a direction, e.g., in a right direction, pinned by the antiferromagnetic layer 884 of said each of its magnetoresistive random access memory (MRAM) cells 890-1 and 890-2, (1) the node M32 may be switched to couple to a fifteenth programming voltage, between 0.25 and 3.3 volts, equal to or greater than the second setting voltage $V2_{MSE}$ of its magnetoresistive random access memory (MRAM) cell 890-1, (2) the node M34 may be switched to couple to a sixteenth programming voltage, between 0.25 and 3.3 volts, equal to or greater than the second resetting voltage $V2_{MRE}$ of its magnetoresistive random access memory (MRAM) cell 890-2, wherein the fifteenth programming voltage may be substantially equal to the sixteenth programming voltage and to the voltage Vcc of power supply, (3) the nodes M31 and M35 may be switched to couple to the voltage Vss of ground reference and (4) its node M33 may be switched to be floating. Thereby, spin accumulation of electrons may be induced at the bottom side of the spin-accumulation induced layer 888-2 by an electron current passing therethrough from the node M35 to the node M34 to change a magnetic field in each domain of the free magnetic layer 887 of its magnetoresistive random access memory (MRAM) cell 890-2 to be substantially in parallel to the magnetic field in each domain of the pined magnetic layer 885 of its magnetoresistive random access memory (MRAM) cell 890-2, e.g., in a right direction. Thus, its magnetoresistive random access memory (MRAM) cell 890-2 may be set with the tenth low resistance between 10 and 100,000,000,000 ohms in the setting step. Further, spin accumulation of electrons may be induced at the bottom side of the spin-accumulation induced layer 888-1 by an electron current passing therethrough from the node M31 to the node M32 to change a magnetic field in each domain of the free magnetic layer 887 of its magnetoresistive random access memory (MRAM) cell 890-1 to be substantially opposite to the magnetic field in each domain of the pined magnetic layer 885 of its magnetoresistive random access memory (MRAM) cell 890-1, e.g., in a left direction. Thus, its magnetoresistive random access memory (MRAM) cell 890-1 may be reset with the tenth high resistance between 15 and 500,000,000,000 ohms in the resetting step. The tenth high resistance may be equal to between 1.5 and 10 times of the tenth low resistance. Thereby, the ninth type of non-volatile memory cell 920 for the first alternative may have a voltage at its node M33 to be programmed with a logic level of "0", wherein its node M33 in operation may act as an output point of the ninth type of non-volatile memory cell 920 for the first alternative.

In operation, referring to FIGS. 10I and 10J, for the ninth type of non-volatile memory cell 920 for the first alternative, (1) the nodes M31 and M32 may be switched to couple to the voltage Vcc of power supply, (2) the nodes M34 and M35 may be switched to couple to the voltage Vss of ground reference and (3) its node M33 may be switched to act as an output point of the ninth type of non-volatile memory cell 920 for the first alternative. When its magnetoresistive random access memory (MRAM) cell 890-1 is reset with the tenth high resistance and its magnetoresistive random access memory (MRAM) cell 890-2 is set with the tenth low resistance, the ninth type of non-volatile memory cell 920 for the first alternative may generate a data output at its node M33 at a voltage level between the voltage Vss of ground reference and a half of the voltage Vcc of power supply, defined as a logic level of "0". When its magnetoresistive random access memory (MRAM) cell 890-1 is set with the ninth low resistance and its magnetoresistive random access memory (MRAM) cell 890-2 is reset with the ninth high resistance, the ninth type of non-volatile memory cell 920 for the first alternative may generate a data output at its node M33 at a voltage level between a half of the voltage Vcc of power supply and the voltage Vcc of power supply, defined as a logic level of "1".

IX.2 Ninth Type of Non-Volatile Memory Cell for Second Alternative

Figure 10K:
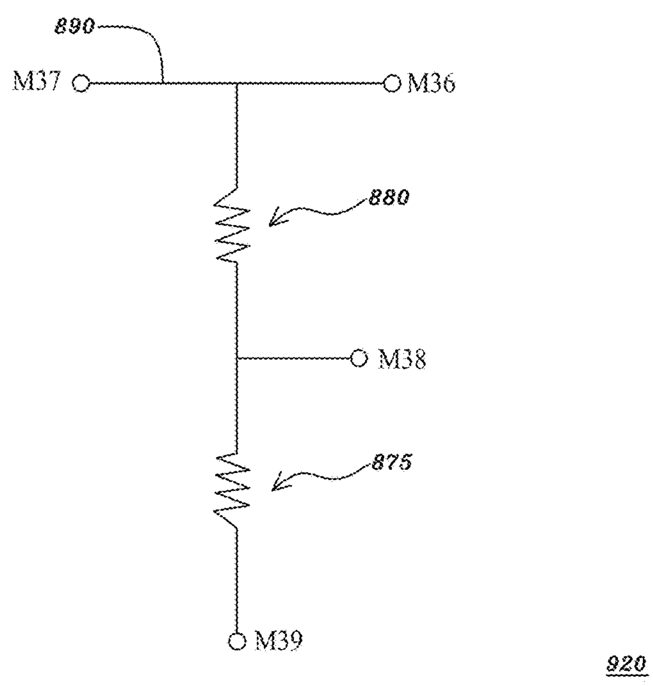
FIG. 10K is a circuit diagram illustrating a ninth type of non-volatile memory cell for a second alternative in accordance with an embodiment of the present application.

Alternatively, the ninth type of non-volatile memory cell 920 for a second alternative may be composed of the spin-orbit-torque (SOT) magnetoresistive random access memory (MRAM) cell 890 for the first alternative as seen in FIGS. 10A-10D and of a non-programmable resistor 875, as seen in FIG. 10K. FIG. 10K is a circuit diagram illustrating a ninth type of non-volatile memory cell for a second alternative in accordance with an embodiment of the present application. Referring to FIG. 10K, for the ninth type of non-volatile memory cell 920 for the second alternative, its magnetoresistive random access memory (MRAM) cell 890 may have the bottom electrode 881 coupling to a first end of its non-programmable resistor 875 and to its node M38. Its magnetoresistive random access memory (MRAM) cell 890 may have the free magnetic layer 887 having the spin-accumulation induced layer 888 formed thereon as seen in FIGS. 10A-10D, wherein the spin-accumulation induced layer 888 couples a node M36 to a node M37. Its non-programmable resistor 875 may have a second end, opposite to the first end of its non-programmable resistor 875, coupling to its node M39.

In a first condition, referring to FIG. 10K, for the ninth type of non-volatile memory cell 920 for the second alternative, its magnetoresistive random access memory (MRAM) cell 890 may be set with an eleventh low resistance in the setting step. In the setting step for its magnetoresistive random access memory (MRAM) cell 890, (1) a first one of the nodes M36 and M37 may be switched to couple to a seventeenth programming voltage, between 0.25 and 3.3 volts, equal to or greater than the second setting voltage $V2_{MSE}$ of its magnetoresistive random access memory (MRAM) cell 890, wherein the seventeenth programming voltage may be substantially equal to the voltage Vcc of power supply, (2) a second one of the nodes M36 and M37 may be switched to couple to the voltage Vss of ground reference and (3) its nodes M38 and M39 may be switched to be floating. Thereby, spin accumulation of electrons may be induced at a bottom side of the spin-accumulation induced layer 888 as illustrated in FIG. 10D by an electron current passing therethrough from the second one of the nodes M36 and M37 to the first one of the nodes M36 and M37 to change a magnetic field in each domain of the free magnetic layer 887 of its magnetoresistive random access memory (MRAM) cell 890 to be substantially in parallel to a magnetic field in each domain of the pined magnetic layer 885 of its magnetoresistive random access memory (MRAM) cell 890. Thus, its magnetoresistive random access memory (MRAM) cell 890 may be set with the eleventh low resistance, between 10 and 100,000,000,000 ohms, lower than the resistance of its non-programmable resistor 875. The resistance of its non-programmable resistor 875 may be equal to between 1.5 and 10,000,000 times of the eleventh low resistance. Thereby, the ninth type of non-volatile memory cell 920 for the second alternative may have a voltage at its node M38 to be programmed with a logic level of "1", wherein its node M38 in operation may act as an output point of the ninth type of non-volatile memory cell 920 for the second alternative.

In a second condition, referring to FIG. 10K, for the ninth type of non-volatile memory cell 920 for the second alternative, its magnetoresistive random access memory (MRAM) cell 890 may be reset with an eleventh high resistance in the resetting step. In the resetting step for its magnetoresistive random access memory (MRAM) cell 890, (1) the second one of the nodes M36 and M37 may be switched to couple to an eighteenth programming voltage, between 0.25 and 3.3 volts, equal to or greater than the second resetting voltage $V2_{MRE}$ of its magnetoresistive random access memory (MRAM) cell 890, wherein the eighteenth programming voltage may be substantially equal to the voltage Vcc of power supply, (2) the first one of the nodes M36 and M37 may be switched to couple to the voltage Vss of ground reference and (3) its nodes M38 and M39 may be switched to be floating. Thereby, spin accumulation of electrons may be induced at the bottom side of the spin-accumulation induced layer 888 as illustrated in FIG. 10D by an electron current passing therethrough from the first one of the nodes M36 and M37 to the second one of the nodes M36 and M37 to change a magnetic field in each domain of the free magnetic layer 887 of its magnetoresistive random access memory (MRAM) cell 890 to be substantially opposite to a magnetic field in each domain of the pined magnetic layer 885 of its magnetoresistive random access memory (MRAM) cell 890. Thus, its magnetoresistive random access memory (MRAM) cell 890 may be reset with the eleventh high resistance, between 15 and 500,000,000,000 ohms, greater than the resistance of its non-programmable resistor 875 in the resetting step. The eleventh high resistance may be equal to between 1.5 and 10 times of the resistance of its non-programmable resistor 875. Thereby, the ninth type of non-volatile memory cell 920 for the second alternative may have a voltage at its node M38 to be programmed with a logic level of "0", wherein its node M38 in operation may act as an output point of the ninth type of non-volatile memory cell 920 for the second alternative.

In operation, referring to FIG. 10K, for the ninth type of non-volatile memory cell 920 for the second alternative, (1) the nodes M36 and M37 may be switched to couple to the voltage Vcc of power supply, (2) its node M39 may be switched to couple to the voltage Vss of ground reference and (3) its node M38 may be switched to act as an output point of the ninth type of non-volatile memory cell 920 for the second alternative. When its magnetoresistive random access memory (MRAM) cell 890 is reset with the eleventh high resistance, the ninth type of non-volatile memory cell 920 for the second alternative may generate a data output at its node M38 at a voltage level between the voltage Vss of ground reference and a half of the voltage Vcc of power supply, defined as a logic level of "0". When its magnetoresistive random access memory (MRAM) cell 890 is set with the eleventh low resistance, the ninth type of non-volatile memory cell 920 for the second alternative may generate a data output at its node M38 at a voltage level between a half of the voltage Vcc of power supply and the voltage Vcc of power supply, defined as a logic level of "1".

IX.3 Ninth Type of Non-Volatile Memory Cell for Third Alternative

Figure 10L:
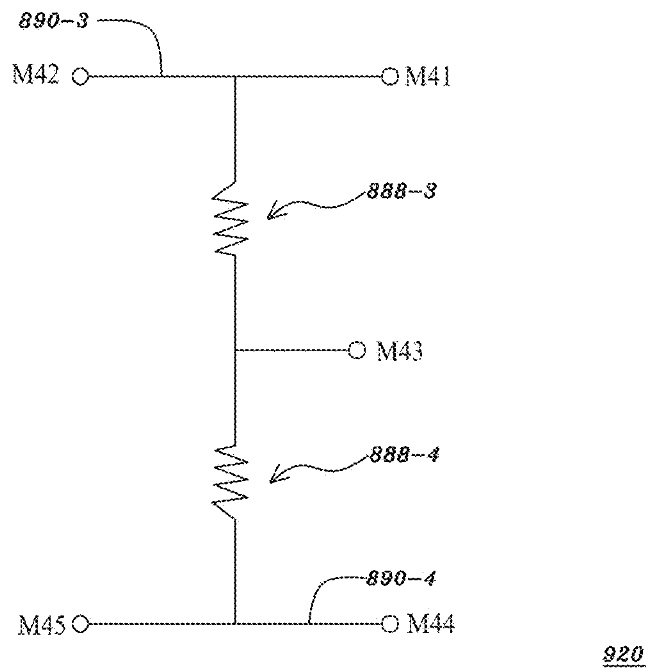
FIG. 10L is a circuit diagram illustrating a ninth type of non-volatile memory cell for a third alternative in accordance with an embodiment of the present application.
Figure 10M:
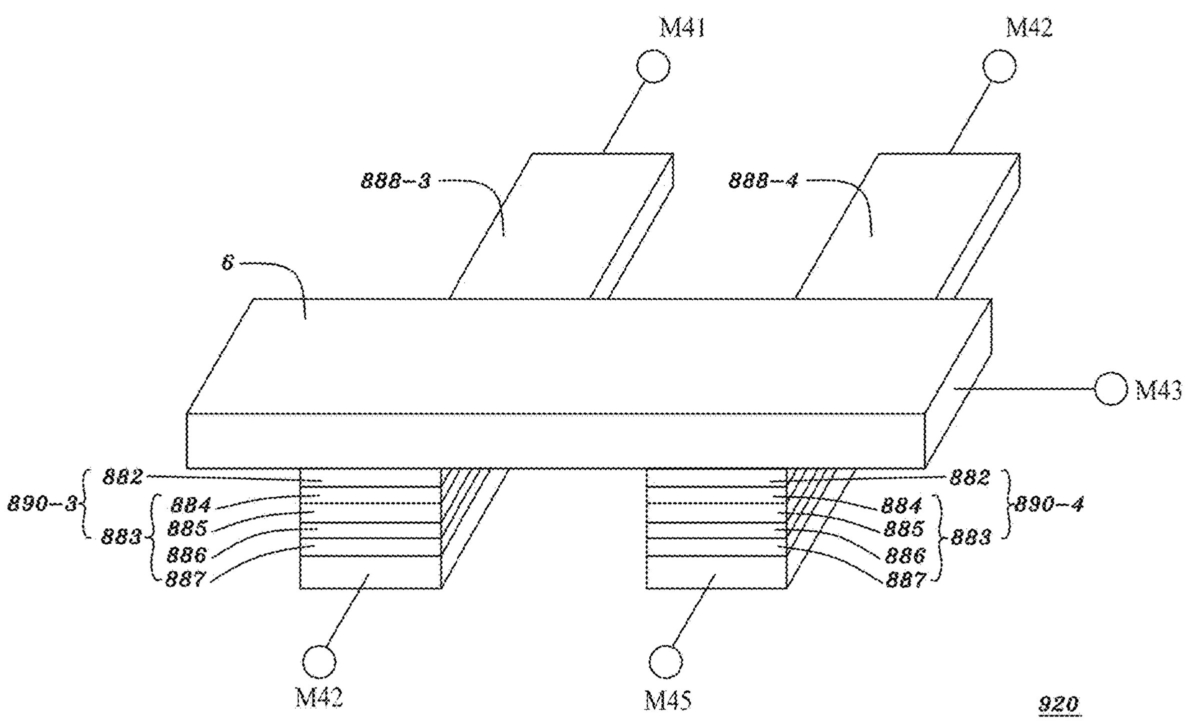
FIG. 10M is a schematically perspective view showing a structure for a ninth type of non-volatile memory cell for a third alternative in accordance with an embodiment of the present application.

FIG. 10L is a circuit diagram illustrating a ninth type of non-volatile memory cell for a third alternative in accordance with an embodiment of the present application. FIG. 10M is a schematically perspective view showing a structure for a ninth type of non-volatile memory cell for a third alternative in accordance with an embodiment of the present application. Referring to FIGS. 10L and 10M, two of the spin-orbit-torque (SOT) magnetoresistive random access memory (MRAM) cells 890 for the second alternative as seen in FIGS. 10E-10H, called as 890-3 and 890-4 hereinafter, may be provided for a ninth type of non-volatile memory cell 920 for a third alternative, i.e., complementary MRAM cell, abbreviated as CMRAM. For the ninth type of non-volatile memory cell 920 for the third alternative, its magnetoresistive random access memory (MRAM) cell 890-3 may have the top electrode 882 coupling to the top electrode 882 of its magnetoresistive random access memory (MRAM) cell 890-4 and to its node M43. Its magnetoresistive random access memory (MRAM) cell 890-3 may have the free magnetic layer 887 on a spin-accumulation induced layer 888-3 having the same specification as the spin-accumulation induced layer 888 illustrated in FIGS. 10E-10H, wherein the spin-accumulation induced layer 888-3 couples a node M41 to a node M42. Its magnetoresistive random access memory (MRAM) cell 890-4 may have the free magnetic layer 887 on a spin-accumulation induced layer 888-4 having the same specification as the spin-accumulation induced layer 888 illustrated in FIGS. 10E-10H, wherein the spin-accumulation induced layer 888-4 couples a node M44 to a node M45.

In a first condition, referring to FIGS. 10L and 10M, for the ninth type of non-volatile memory cell 920 for the third alternative, its magnetoresistive random access memory (MRAM) cell 890-4 may be reset with a twelfth high resistance in the resetting step, and its magnetoresistive random access memory (MRAM) cell 890-3 may be set with a twelfth low resistance in the setting step. In the resetting step for its magnetoresistive random access memory (MRAM) cell 890-4 and the setting step for its magnetoresistive random access memory (MRAM) cell 890-3, in a case that the pinned magnetic layer 885 of each of its magnetoresistive random access memory (MRAM) cells 890-3 and 890-4 has domains each provided with a magnetic field in a direction, e.g., in a left direction, pinned by the antiferromagnetic layer 884 of said each of its magnetoresistive random access memory (MRAM) cells 890-3 and 890-4, (1) the node M41 may be switched to couple to a nineteenth programming voltage, between 0.25 and 3.3 volts, equal to or greater than the second setting voltage $\mathbf{V2}_{MSE}$ of its magnetoresistive random access memory (MRAM) cell 890-3, (2) the node M45 may be switched to couple to a twentieth programming voltage, between 0.25 and 3.3 volts, equal to or greater than the second resetting voltage $\mathbf{V2}_{MRE}$ of its magnetoresistive random access memory (MRAM) cell 890-4, wherein the nineteenth programming voltage may be substantially equal to the twentieth programming voltage and to the voltage Vcc of power supply, (3) the nodes M42 and M44 may be switched to couple to the voltage Vss of ground reference and (4) its node M43 may be switched to be floating. Thereby, spin accumulation of electrons may be induced at a top side of the spin-accumulation induced layer 888-3 by an electron current passing therethrough from the node M42 to the node M41 to change a magnetic field in each domain of the free magnetic layer 887 of its magnetoresistive random access memory (MRAM) cell 890-3 to be substantially in parallel to a magnetic field in each domain of the pined magnetic layer 885 of its magnetoresistive random access memory (MRAM) cell 890-3, e.g., in a left direction. Thus, its magnetoresistive random access memory (MRAM) cell 890-3 may be set with the twelfth low resistance between 10 and 100,000,000,000 ohms in the setting step. Further, spin accumulation of electrons may be induced at a top side of the spin-accumulation induced layer 888-4 by an electron current passing through from the node M44 to the node M45 to change a magnetic field in each domain of the free magnetic layer 887 of its magnetoresistive random access memory (MRAM) cell 890-4 to be substantially opposite to a magnetic field in each domain of the pined magnetic layer 885 of its magnetoresistive random access memory (MRAM) cell 890-4, e.g., in a right direction. Thus, its magnetoresistive random access memory (MRAM) cell 890-4 may be reset with the twelfth high resistance between 15 and 500,000,000,000 ohms in the resetting step. The twelfth high resistance may be equal to between 1.5 and 10 times of the twelfth low resistance. Thereby, the ninth type of non-volatile memory cell 920 for the third alternative may have a voltage at its node M43 to be programmed with a logic level of "1", wherein its node M43 in operation may act as an output point of the ninth type of non-volatile memory cell 920 for the third alternative.

In a second condition, referring to FIGS. 10L and 10M, for the ninth type of non-volatile memory cell 920 for the third alternative, its magnetoresistive random access memory (MRAM) cell 890-3 may be reset with a thirteenth high resistance in the resetting step, and its magnetoresistive random access memory (MRAM) cell 890-4 may be set with a thirteenth low resistance in the setting step. In the resetting step for its magnetoresistive random access memory (MRAM) cell 890-3 and the setting step for its magnetoresistive random access memory (MRAM) cell 890-4, in a case that the pinned magnetic layers 885 of each of its magnetoresistive random access memory (MRAM) cells 890-3 and 890-4 has domains each provided with a magnetic field in a direction, e.g., in a left direction, pinned by the antiferromagnetic layer 884 of said each of its magnetoresistive random access memory (MRAM) cells 890-3 and 890-4, (1) the node M42 may be switched to couple to a twenty-first programming voltage, between 0.25 and 3.3 volts, equal to or greater than the second setting voltage $\mathbf{V2}_{MSE}$ of its magnetoresistive random access memory (MRAM) cell 890-3, (2) the node M44 may be switched to couple to a twenty-second programming voltage, between 0.25 and 3.3 volts, equal to or greater than the second resetting voltage $\mathbf{V2}_{MRE}$ of its magnetoresistive random access memory (MRAM) cell 890-4, wherein the twenty-first programming voltage may be substantially equal to the twenty-second programming voltage and to the voltage Vcc of power supply, (3) the nodes M41 and M45 may be switched to couple to the voltage Vss of ground reference and (4) its node M43 may be switched to be floating. Thereby, spin accumulation of electrons may be induced at the top side of the spin-accumulation induced layer 888-4 by an electron current passing therethrough from the node M45 to the node M44 to change a magnetic field in each domain of the free magnetic layer 887 of its magnetoresistive random access memory (MRAM) cell 890-4 to be substantially in parallel to the magnetic field in each domain of the pined magnetic layer 885 of its magnetoresistive random access memory (MRAM) cell 890-4, e.g., in a left direction. Thus, its magnetoresistive random access memory (MRAM) cell 890-4 may be set with the thirteenth low resistance between 10 and 100,000,000,000 ohms in the setting step. Further, spin accumulation of electrons may be induced at the top side of the spin-accumulation induced layer 888-3 by an electron current passing therethrough from the node M41 to the node M42 to change a magnetic field in each domain of the free magnetic layer 887 of its magnetoresistive random access memory (MRAM) cell 890-3 to be substantially opposite to a magnetic field in each domain of the pined magnetic layer 885 of its magnetoresistive random access memory (MRAM) cell 890-3, e.g., in a right direction. Thus, its magnetoresistive random access memory (MRAM) cell 890-3 may be reset with the thirteenth high resistance between 15 and 500,000,000,000 ohms in the resetting step. The thirteenth high resistance may be equal to between 1.5 and 10 times of the thirteenth low resistance. Thereby, the ninth type of non-volatile memory cell 920 for the third alternative may have a voltage at its node M43 to be programmed with a logic level of "0", wherein its node M43 in operation may act as an output point of the ninth type of non-volatile memory cell 920 for the third alternative.

In operation, referring to FIGS. 10L and 10M, for the ninth type of non-volatile memory cell 920 for the third alternative, (1) the nodes M41 and M42 may be switched to couple to the voltage Vcc of power supply, (2) the nodes M44 and M45 may be switched to couple to the voltage Vss of ground reference and (3) its node M43 may be switched to act as an output point of the ninth type of non-volatile memory cell 920 for the third alternative. When its magnetoresistive random access memory (MRAM) cell 890-3 is reset with the thirteenth high resistance and its magnetoresistive random access memory (MRAM) cell 890-4 is set with the thirteenth low resistance, the ninth type of non-volatile memory cell 920 for the third alternative may generate a data output at its node M43 at a voltage level between the voltage Vss of ground reference and a half of the voltage Vcc of power supply, defined as a logic level of "0". When its magnetoresistive random access memory (MRAM) cell 890-3 is set with the twelfth low resistance and its magnetoresistive random access memory (MRAM) cell 890-4 is reset with the twelfth high resistance, the ninth type of non-volatile memory cell 920 for the third alternative may generate a data output at its node M43 at a voltage level between a half of the voltage Vcc of power supply and the voltage Vcc of power supply, defined as a logic level of "1".

IX.4 Ninth Type of Non-Volatile Memory Cell for Fourth Alternative

Figure 10N:
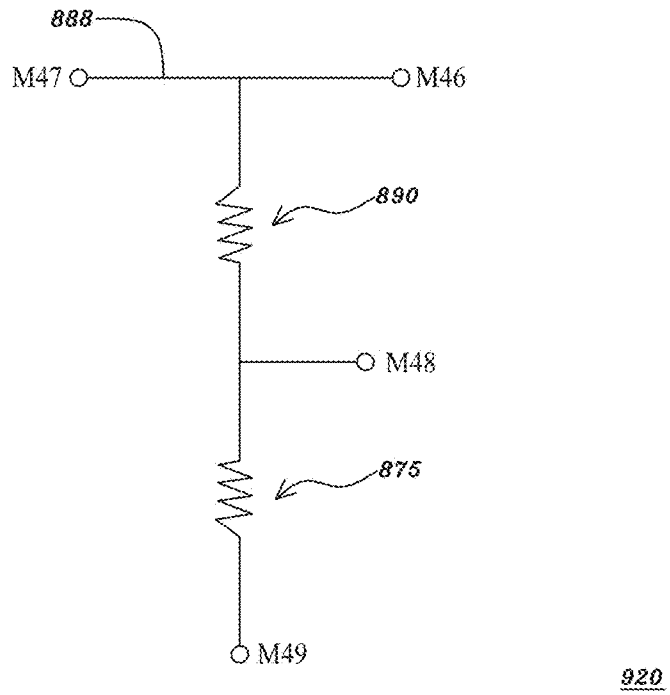
FIG. 10N is a circuit diagram illustrating a ninth type of non-volatile memory cell for a fourth alternative in accordance with an embodiment of the present application.

Alternatively, the ninth type of non-volatile memory cell 920 for a fourth alternative may be composed of the spin-orbit-torque (SOT) magnetoresistive random access memory (MRAM) cell 890 for the second alternative as seen in FIGS. 10E-10H and of a non-programmable resistor 875, as seen in FIG. 10N. FIG. 10N is a circuit diagram illustrating a ninth type of non-volatile memory cell for a fourth alternative in accordance with an embodiment of the present application. Referring to FIG. 10N, for the ninth type of non-volatile memory cell 920 for the fourth alternative, its magnetoresistive random access memory (MRAM) cell 890 may have the top electrode 882 coupling to a first end of its non-programmable resistor 875 and to its node M48. Its magnetoresistive random access memory (MRAM) cell 890 may have the free magnetic layer 887 on the spin-accumulation induced layer 888 as illustrated in FIGS. 10E-10H, wherein the spin-accumulation induced layer 888 couples a node M46 to a node M47. Its non-programmable resistor 875 may have a second end, opposite to the first end of its non-programmable resistor 875, coupling to its node M49.

In a first condition, referring to FIG. 10N, for the ninth type of non-volatile memory cell 920 for the fourth alternative, its magnetoresistive random access memory (MRAM) cell 890 may be set with a fourteenth low resistance in the setting step. In the setting step for its magnetoresistive random access memory (MRAM) cell 890, (1) a first one of the nodes M46 and M47 may be switched to couple to a twenty-third programming voltage, between 0.25 and 3.3 volts, equal to or greater than the second setting voltage $V2_{MSE}$ of its magnetoresistive random access memory (MRAM) cell 890, wherein the twenty-third programming voltage may be substantially equal to the voltage Vcc of power supply, (2) a second one of the nodes M46 and M47 may be switched to couple to the voltage Vss of ground reference and (3) its nodes M48 and M49 may be switched to be floating. Thereby, spin accumulation of electrons may be induced at a top side of the spin-accumulation induced layer 888 as illustrated in FIG. 10H by an electron current passing therethrough from the second one of the nodes M46 and M47 to the first one of the nodes M46 and M47 to change a magnetic field in each domain of the free magnetic layer 887 of its magnetoresistive random access memory (MRAM) cell 890 to be substantially in parallel to a magnetic field in each domain of the pined magnetic layer 885 of its magnetoresistive random access memory (MRAM) cell 890. Thus, its magnetoresistive random access memory (MRAM) cell 890 may be set with the fourteenth low resistance, between 10 and 100,000,000,000 ohms, lower than the resistance of its non-programmable resistor 875. The resistance of its non-programmable resistor 875 may be equal to between 1.5 and 10,000,000 times of the fourteenth low resistance. Thereby, the ninth type of non-volatile memory cell 920 for the fourth alternative may have a voltage at its node M48 to be programmed with a logic level of "1", wherein its node M48 in operation may act as an output point of the ninth type of non-volatile memory cell 920 for the fourth alternative.

In a second condition, referring to FIG. 10N, for the ninth type of non-volatile memory cell 920 for the fourth alternative, its magnetoresistive random access memory (MRAM) cell 890 may be reset with a fourteenth high resistance in the resetting step. In the resetting step for its magnetoresistive random access memory (MRAM) cell 890, (1) the second one of the nodes M46 and M47 may be switched to couple to a twenty-fourth programming voltage, between 0.25 and 3.3 volts, equal to or greater than the second resetting voltage $V2_{MRE}$ of its magnetoresistive random access memory (MRAM) cell 890, wherein the twenty-fourth programming voltage may be substantially equal to the voltage Vcc of power supply, (2) said the first one of the nodes M46 and M47 may be switched to couple to the voltage Vss of ground reference and (3) its nodes M48 and M49 may be switched to be floating. Thereby, spin accumulation of electrons may be induced at the top side of the spin-accumulation induced layer 888 as illustrated in FIG. 10H by an electron current passing therethrough from the first one of the nodes M46 and M47 to the second one of the nodes M46 and M47 to change a magnetic field in each domain of the free magnetic layer 887 of its magnetoresistive random access memory (MRAM) cell 890 to be substantially opposite to a magnetic field in each domain of the pined magnetic layer 885 of its magnetoresistive random access memory (MRAM) cell 890. Thus, its magnetoresistive random access memory (MRAM) cell 890 may be reset with the fourteenth high resistance, between 15 and 500,000,000,000 ohms, greater than the resistance of its non-programmable resistor 875 in the resetting step. The fourteenth high resistance may be equal to between 1.5 and 10 times of the resistance of its non-programmable resistor 875. Thereby, the ninth type of non-volatile memory cell 920 for the fourth alternative may have a voltage at its node M48 to be programmed with a logic level of "0", wherein its node M48 in operation may act as an output point of the ninth type of non-volatile memory cell 920 for the fourth alternative.

In operation, referring to FIG. 10N, for the ninth type of non-volatile memory cell 920 for the fourth alternative, (1) the nodes M46 and M47 may be switched to couple to the voltage Vcc of power supply, (2) its node M49 may be switched to couple to the voltage Vss of ground reference and (3) its node M48 may be switched to act as an output point of the ninth type of non-volatile memory cell 920 for the fourth alternative. When its magnetoresistive random access memory (MRAM) cell 890 is reset with the fourteenth high resistance, the ninth type of non-volatile memory cell 920 for the fourth alternative may generate a data output at its node M48 at a voltage level between the voltage Vss of ground reference and a half of the voltage Vcc of power supply, defined as a logic level of "0". When its magnetoresistive random access memory (MRAM) cell 890 is set with the fourteenth low resistance, the ninth type of non-volatile memory cell 920 for the fourth alternative may generate a data output at its node M48 at a voltage level between a half of the voltage Vcc of power supply and the voltage Vcc of power supply, defined as a logic level of "1".

Figure 11A:
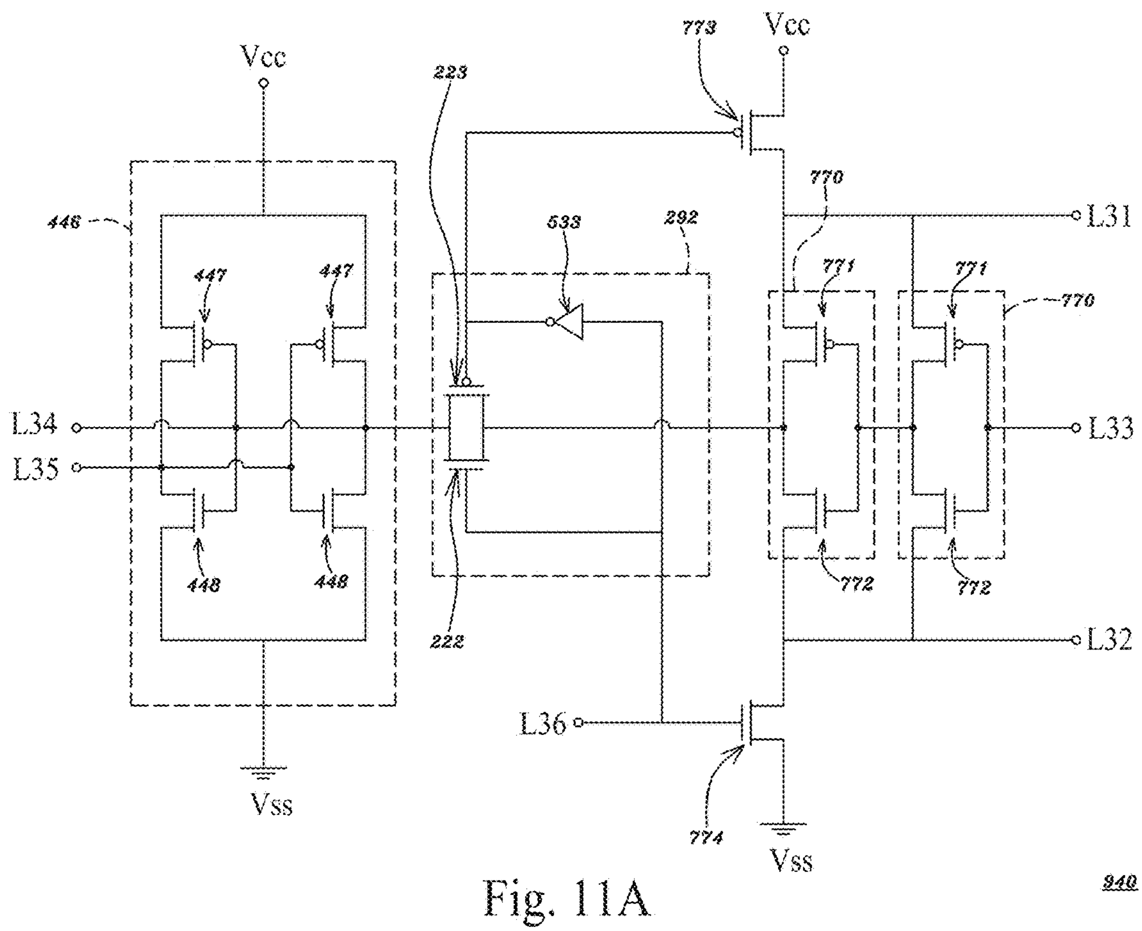
FIGS. 11A and 11B are various circuit diagrams showing various types of latched non-volatile memory cells in accordance with an embodiment of the application.

Specification for Latching Circuit for Non-Volatile Memory Cell (1) First Type of Latched Non-Volatile Memory Cell FIG. 11A is a circuit diagram showing a first type of latched non-volatile memory cell in accordance with an embodiment of the application. Referring to FIG. 11A, the first type of latched non-volatile memory cell 940 may include one of the first through ninth types of non-volatile memory cells 600, 650, 700, 721, 760, 800, 900, 910 and 920 and a memory unit 446 as illustrated in FIG. 1A or 1B configured in operation to receive a data input associated with the data output of said one of the first through sixth types of non-volatile memory cells 600, 650, 700, 721, 760 and 800 at the node N0 as seen in FIG. 2A-2C, 3A-3C, 4A-4C, 5A-5F, 6A-6C or 7A-7D, the data output of the seventh type of non-volatile memory cell 900 at the node M3 or M12 as seen in FIGS. 8A-8G, the data output of the eighth type of non-volatile memory cell 910 at the node M6, M9, M15 or M18 as seen in FIGS. 9A-9J, or the data output of the ninth type of non-volatile memory cell 920 at the node M33, M38, M43 or M48 as seen in FIGS. 10A-10N. In operation, a node L33 may be switched to couple to the output point of said one of the first through sixth types of non-volatile memory cells 600, 650, 700, 721, 760 and 800 at the node N0, the output point of the seventh type of non-volatile memory cell 900 at the node M3 or M12, the output point of the eighth type of non-volatile memory cell 910 at the node M6, M9, M15 or M18, or the data output of the ninth type of non-volatile memory cell 920 at the node M33, M38, M43 or M48. In operation, for said one of the first through sixth types of non-volatile memory cells 600, 650, 700, 721, 760 and 800, its node N3 may be switched to couple to a node L31; for the seventh type of non-volatile memory cell 900, its node M1 or M10 may be switched to couple to the node L31; for the eighth type of non-volatile memory cell 910, its node M4, M7, M13 or M16 may be switched to couple to the node L31; for the ninth type of non-volatile memory cell 920, its node M31, M32, M36, M37, M41, M42, M46 or M47 may be switched to couple to the node L31. In operation, for said one of the first through sixth types of non-volatile memory cells 600, 650, 700, 721, 760 and 800, its node N4 may be switched to couple to a node L32; for the seventh type of non-volatile memory cell 900, its node M2 or M11 may be switched to couple to the node L32; for the eighth type of non-volatile memory cell 910, its node M5, M8, M14, M17, M34, M35, M39, M44, M45 or M49 may be switched to couple to the node L32; for the ninth type of non-volatile memory cell 920, its node M34, M35, M39, M44, M45 or M49 may be switched to couple to the node L32.

Referring to FIG. 11A, the first type of latched non-volatile memory cell 940 may further include two stages of inverters 770 each including a pair of P-type MOS transistor 771 and N-type MOS transistor 772. For the first stage of inverter 770, the pair of P-type MOS transistor 771 and N-type MOS transistor 772 may have respective drain terminals coupling to each other and acting as its output point coupling to an input point of the second stage of inverter 770, respective gate terminals coupling to each other and acting as its input point coupling to the node L33 and respective source terminals coupling to the nodes L31 and L32 respectively. For the second stage of inverter 770, the pair of P-type MOS transistor 771 and N-type MOS transistor 772 may have respective drain terminals coupling to each other and acting as its output point, respective gate terminals coupling to each other and acting as its input point coupling to the output point of the first stage of inverter 770 and respective source terminals coupling to the nodes L31 and L32 respectively. Thereby, a combination of the two stages of inverters 770 may amplify the data output of said one of the first through ninth types of non-volatile memory cells 600, 650, 700, 721, 760, 800, 900, 910 and 920 as its data output at an output point thereof, i.e., the output point of the second stage of inverter 770.

Referring to FIG. 11A, the first type of latched non-volatile memory cell 940 may further include a pass/no-pass switch 292 configured to control connection between its memory unit 446 and its two stages of inverters 770. For the first type of latched non-volatile memory cell 940, its pass/no-pass switch 292 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of its pass/no-pass switch 292 may be configured to form a channel having an end coupling to the output point of its two stages of inverters 770 and another opposite end coupling to its memory unit 446, i.e., the gate terminals of the left pair of P-type and N-type MOS transistors 447 and 448 thereof and the drain terminals of the right pair of P-type and N-type MOS transistors 447 and 448 thereof, and a node L34. Its pass/no-pass switch 292 may further include an inverter 533 configured to invert a data input at an input point thereof coupling to a gate terminal of the N-type MOS transistor 222 of its pass/no-pass switch 292 and a node L36 as a data output at an output point thereof coupling to a gate terminal of the P-type MOS transistor 223 of its pass/no-pass switch 292. Thereby, at an initial state, its pass/no-pass switch 292 may pass the data output of its two stages of inverters 770 to its memory unit 446 and the node L34 to be latched or stored in its memory unit 446. The gate terminals of the right pair of P-type and N-type MOS transistors 447 and 448 of its memory unit 446 and the drain terminals of the left pair of P-type and N-type MOS transistors 447 and 448 of its memory unit 446 may couple to a node L35.

Referring to FIG. 11A, the first type of latched non-volatile memory cell 940 may further include a switching mechanism configured to enable or disable said one of the first through ninth types of non-volatile memory cells 600, 650, 700, 721, 760, 800, 900, 910 and 920 and the two stages of inverters 770. The switching mechanism may be composed of (1) a control P-type MOS transistor 773 having a source terminal coupling to the voltage Vcc of power supply, a drain terminal coupling to the source terminals of the P-type MOS transistors 771 of the two stages of inverters 770 and the node L31 and a gate terminal coupling to the gate terminal of the P-type MOS transistor 223 of the first type of pass/no-pass switch 292 and the output point of the inverter 533 of the first type of pass/no-pass switch 292, and (2) a control N-type MOS transistor 774 having a source terminal coupling to the voltage Vss of ground reference, a drain terminal coupling to the source terminals of the N-type MOS transistors 772 of the two stages of inverters 770 and the node L32 and a gate terminal coupling to the gate terminal of the N-type MOS transistor 222 of the first type of pass/no-pass switch 292, the input point of the inverter 533 of the first type of pass/no-pass switch 292 and a node L36.

(2) Second Type of Latched Non-Volatile Memory Cell

Figure 11B:
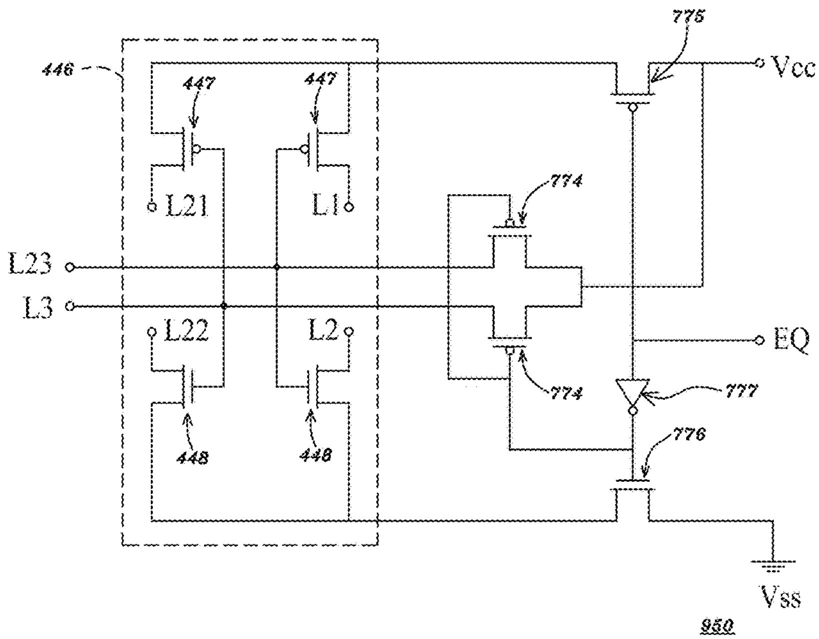

FIG. 11B is a circuit diagram showing a second type of latched non-volatile memory cell in accordance with an embodiment of the application. Referring to FIG. 11B, the second type of latched non-volatile memory cell 950 may include a memory unit 446 as illustrated in FIGS. 1A and 1B. For the memory unit 446, its right pair of the P-type MOS transistor 447 and N-type MOS transistor 448 may have respective drain terminals coupling to nodes L1 and L2 respectively and respective gate terminals coupling to each other and to a node L23; its left pair of the P-type MOS transistor 447 and N-type MOS transistor 448 may have respective drain terminals coupling to nodes L21 and L22 respectively and respective gate terminals coupling to each other and to a node L3; its P-type MOS transistors 447 may have the source terminals coupling to each other, its N-type MOS transistors 448 may have the source terminals coupling to each other.

Referring to FIG. 11B, the second type of latched non-volatile memory cell 950 may further include two non-volatile memory cells configured to store opposite logic levels, each of which may be one of the first through ninth types of non-volatile memory cells 600, 650, 700, 721, 760, 800, 900, 910 and 920 as seen in FIG. 2A-2C, 3A-3C, 4A-4C, 5A-5F, 6A-6C, 7A-7D, 8A-8G, 9A-9J or 10A-10N. In operation, for the first through sixth types of non-volatile memory cells 600, 650, 700, 721, 760 and 800 for a right one of the two non-volatile memory cells of the second type of latched non-volatile memory cell 950, its node N3 may be switched to couple to the node L1, its node N4 may be switched to couple to the node L2, and its output point at the node N0 may be switched to couple to the node L3; for the seventh type of non-volatile memory cell 900 for the right one of the two non-volatile memory cells of the second type of latched non-volatile memory cell 950, its node M1 or M10 may be switched to couple to the node Li, its node M2 or M11 may be switched to couple to the node L2, and its output point at the node M3 or M12 may be switched to couple to the node L3; for the eighth type of non-volatile memory cell 910 for the right one of the two non-volatile memory cells of the second type of latched non-volatile memory cell 950, its node M4, M7, M13 or M16 may be switched to couple to the node Li, its node M5, M8, M14 or M17 may be switched to couple to the node L2, and its output point at the node M6, M9, M15 or M18 may be switched to couple to the node L3; for the ninth type of non-volatile memory cell 920 for the right one of the two non-volatile memory cells of the second type of latched non-volatile memory cell 950, its node M31, M32, M36, M37, M41, M42, M46 or M47 may be switched to couple to the node Li, its node M34, M35, M39, M44, M45 or M49 may be switched to couple to the node L2, and its output point at the node M33, M38, M43 or M48 may be switched to couple to the node L3. In operation, for the first through sixth types of non-volatile memory cells 600, 650, 700, 721, 760 and 800 for a left one of the two non-volatile memory cells of the second type of latched non-volatile memory cell 950, its node N3 may be switched to couple to the node L21, its node N4 may be switched to couple to the node L22, and its output point at the node N0 may be switched to couple to the node L23; for the seventh type of non-volatile memory cell 900 for the left one of the two non-volatile memory cells of the second type of latched non-volatile memory cell 950, its node M1 or M10 may be switched to couple to the node L21, its node M2 or M11 may be switched to couple to the node L22, and its output point at the node M3 or M12 may be switched to couple to the node L23; for the eighth type of non-volatile memory cell 910 for the left one of the two non-volatile memory cells of the second type of latched non-volatile memory cell 950, its node M4, M7, M13 or M16 may be switched to couple to the node L21, its node M5, M8, M14 or M17 may be switched to couple to the node L22, and its output point at the node M6, M9, M15 or M18 may be switched to couple to the node L23; for the ninth type of non-volatile memory cell 920 for the left one of the two non-volatile memory cells of the second type of latched non-volatile memory cell 950, its node M31, M32, M36, M37, M41, M42, M46 or M47 may be switched to couple to the node L21, its node M34, M35, M39, M44, M45 or M49 may be switched to couple to the node L22, and its output point at the node M33, M38, M43 or M48 may be switched to couple to the node L23.

Referring to FIG. 11B, the second type of latched non-volatile memory cell 950 may further include a switch composed of two P-type MOS transistors 774 having respective source terminals coupling to the voltage Vcc of power supply, respective drain terminals each coupling to the node L3 and gate terminals of the left pair of P-type MOS transistor 447 and N-type MOS transistor 448 of the memory cell 446 or to the node L23 and gate terminals of the right pair of P-type MOS transistor 447 and N-type MOS transistor 448 of the memory cell 446, and respective gate terminals coupling to each other. Thereby, the two P-type MOS transistors 774 is configured to control connection between the voltage Vcc of power supply and each of the nodes L3 and L23 and gate terminals of the left and right pairs of the P-type MOS transistor 447 and N-type MOS transistor 448 of the memory cell 446. At an initial state, the two P-type MOS transistors 774 may be turned on to positively pre-charge each of the nodes L3 and L23 and gate terminals of the left and right pairs of the P-type MOS transistor 447 and N-type MOS transistor 448 of the memory cell 446 at a logic level of "1".

Referring to FIG. 11B, the second type of latched non-volatile memory cell 950 may further include a switching mechanism configured to enable or disable its two non-volatile memory cells. The switching mechanism may be composed of (1) a control P-type MOS transistor 775 having a source terminal coupling to the voltage Vcc of power supply and a drain terminal coupling to the source terminals of the P-type MOS transistors 447 of the memory cell 446, (2) a control N-type MOS transistor 776 having a source terminal coupling to the voltage Vss of ground reference and a drain terminal coupling to the source terminals of the N-type MOS transistors 448 of the memory cell 446, and (3) an inverter 777 having an input point coupling to a gate terminal of the control P-type MOS transistor 775 and a node EQ and an output point coupling to a gate terminal of the control N-type MOS transistor 776 and the gate terminals of the two P-type MOS transistors 774. The inverter 777 is configured to invert its data input at its input point as its data output at its output point.

Specification for Anti-Fuse

I. First Type of Anti-Fuse

Figure 12A:
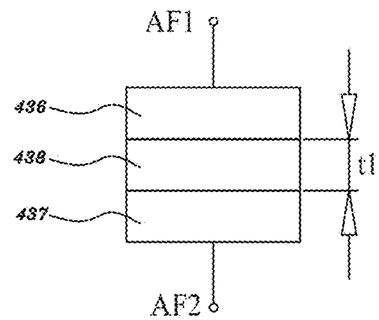
FIGS. 12A-12G are schematically cross-sectional views showing various structures of first through seventh types of anti-fuses in accordance with an embodiment of the present application.

FIG. 12A is a schematically cross-sectional view showing a structure of a first type of anti-fuse in accordance with an embodiment of the present application. Referring to FIG. 12A, the first type of anti-fuse 960 may include top and bottom electrodes 436 and 437 and an oxide window 438 between the top and bottom electrodes 436 and 437, wherein the oxide window 438 may be a layer of silicon dioxide having a thickness t1 between 2 and 20 nm, wherein for a case, both of the top and bottom electrodes 436 and 437 may be made of a metal; for another case, both of the top and bottom electrodes 436 and 437 may be made of polysilicon; for another case, the top electrode 436 may be made of a metal, and the bottom electrode 437 may be made of polysilicon; for another case, the bottom electrode 437 may be made of a metal, and the top electrode 436 may be made of polysilicon. The top electrode 436 may act as a first terminal AF1 of the first type of anti-fuse 960 and the bottom electrode 437 may act as a second terminal AF2 of the first type of anti-fuse 960. Either when the second terminal AF2 of the first type of anti-fuse 960 is switched to couple to the voltage Vss of ground reference and the first terminal AF1 of the first type of anti-fuse 960 is switched to couple to a programming voltage $V_{Pr}$ between 2 and 10 volts, for example, or when the second terminal AF2 of the first type of anti-fuse 960 is switched to couple to a programming voltage $V_{Pr}$ between 2 and 10 volts, for example, and the first terminal AF of the first type of anti-fuse 960 is switched to couple to the voltage Vss of ground reference, a large bias voltage between the first and second terminals AF and AF2 of the first type of anti-fuse 960 may cause the oxide window 438 to break down, resulting in a short circuit between the first and second terminals AF and AF2 of the first type of anti-fuse 960.

II. Second Type of Anti-Fuse

Figure 12B:
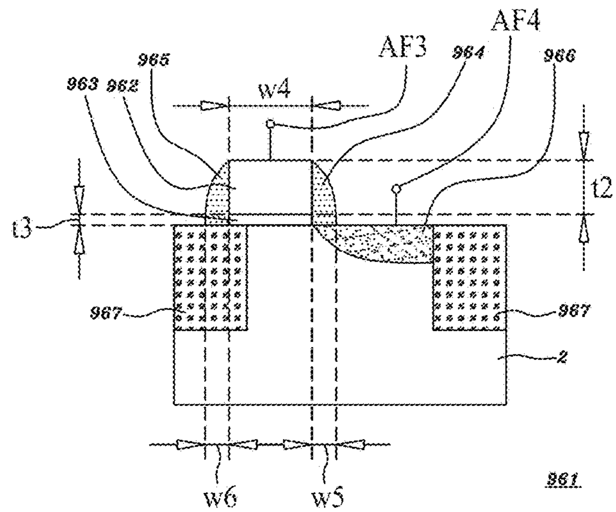

FIG. 12B is a schematically cross-sectional view showing a structure of a second type of anti-fuse in accordance with an embodiment of the present application. Referring to FIG. 12B, the second type of anti-fuse 961 may be provided by a metal-oxide-semiconductor (MOS) device at a top surface of a semiconductor substrate 2, such as P-type or N-type silicon substrate, which including (1) a gate 962, such as polysilicon, tungsten, tungsten nitride, titanium, titanium nitride, tantalum, tantalum nitride, copper-containing metal or aluminum-containing metal, having a thickness t2 between 50 and 300 nm and a width w4 between 20 and 250 nm for example, over the top surface of the semiconductor substrate 2, wherein the gate 962 may act as a first terminal AF3 of the second type of anti-fuse 961, (2) an oxide layer 963, such as silicon dioxide having a thickness t3 between 1 and 15 nm for example, between the gate 962 and top surface of the semiconductor substrate 2, (3) a left-side oxide spacer 964, such as silicon dioxide, on the top surface of the semiconductor substrate 2 and covering a left sidewall of the gate 962 and a left sidewall of the oxide layer 963, wherein the left-side oxide spacer 964 may have a gradually larger width toward a bottom thereof from a top thereof and have a width w5 at the bottom thereof between 20 and 250 nm for example, (4) a right-side oxide spacer 965, such as silicon dioxide, on the top surface of the semiconductor substrate 2 and covering a right sidewall of the gate 962 and a right sidewall of the oxide layer 963, wherein the right-side oxide spacer 965 may have a gradually larger width toward a bottom thereof from a top thereof and have a width w6 at the bottom thereof between 20 and 250 nm for example, (5) a diffusion portion 966 in the semiconductor substrate 2 and at the top surface thereof, vertically under the right-side oxide spacer 965 and extending across a right edge of the right-side oxide spacer 965, wherein the diffusion portion 966 may act as a second terminal AF4 of the second type of anti-fuse 961, and (6) a field oxide 967, such as thermally grown silicon dioxide, on the top surface of the semiconductor substrate 2 and surrounding the diffusion portion 966, wherein the left-side oxide spacer 964 may be vertically over the field oxide 967 and the gate 962 and oxide layer 963 may be vertically over the field oxide 967 and extend across an inner edge of the field oxide 967. The semiconductor substrate 2 may be doped with N-type atoms, such as arsenic atoms, in the semiconductor substrate 2 to form a $N^+$ portion for the diffusion portion 966 when the semiconductor substrate 2 is the P-type silicon substrate; alternatively, the semiconductor substrate 2 may be doped with P-type atoms, such as boron atoms, in the semiconductor substrate 2 to form a $P^+$ portion for the diffusion portion 966 when the semiconductor substrate 2 is the N-type silicon substrate. Either when the second terminal AF4 of the second type of anti-fuse 961 is switched to couple to the voltage Vss of ground reference and the first terminal AF3 of the second type of anti-fuse 961 is switched to couple to a programming voltage $V_{Pr}$ between 2 and 10 volts, for example, or when the second terminal AF4 of the second type of anti-fuse 961 is switched to couple to a programming voltage V, between 2 and 10 volts, for example, and the first terminal AF3 of the second type of anti-fuse 961 is switched to couple to the voltage Vss of ground reference, a large bias voltage between the first and second terminals AF3 and AF4 of the second type of anti-fuse 961 may cause the oxide layer 963 and a portion of the semiconductor substrate 2 between the oxide layer 963 and diffusion portion 966 to break down, resulting in a short circuit between the first and second terminals AF3 and AF4 of the second type of anti-fuse 961.

III. Third Type of Anti-Fuse

Figure 12C:
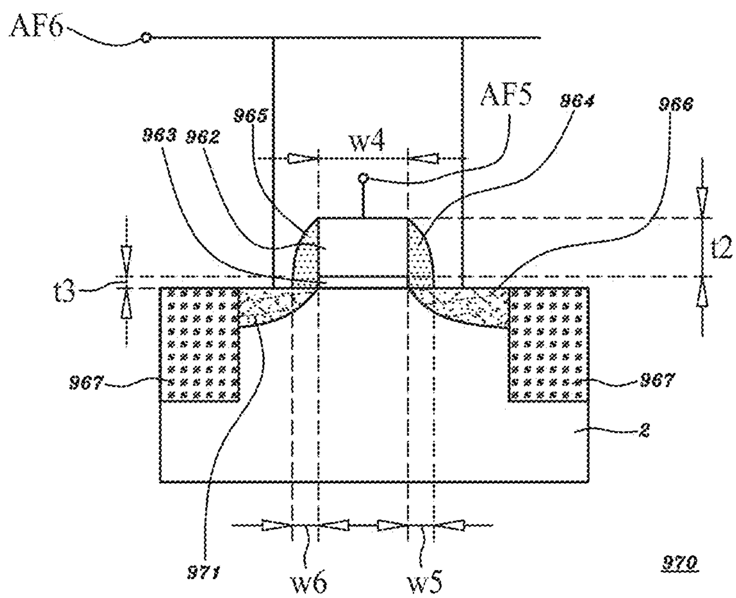

FIG. 12C is a schematically cross-sectional view showing a structure of a third type of anti-fuse in accordance with an embodiment of the present application. Referring to FIG. 12C, the third type of anti-fuse 970 may be provided by a metal-oxide-semiconductor (MOS) device at a top surface of a semiconductor substrate 2, such as P-type or N-type silicon substrate, which includes the structure of the second type of anti-fuse 961 as illustrated in FIG. 12B. For an element indicated by the same reference number shown in FIGS. 12B and 12C, the specification of the element as seen in FIG. 12C may be referred to that of the element as illustrated in FIG. 12B. The difference between the second and third types of anti-fuses 961 and 970 is that the third type of anti-fuse 970 may further include another diffusion portion 971 in the semiconductor substrate 2 and at the top surface thereof, vertically under the left-side oxide spacer 964 and extending across a left edge of the left-side oxide spacer 964, wherein the field oxide 967 may be on the top surface of the semiconductor substrate 2 and surrounds the diffusion portions 966 and 971. The semiconductor substrate 2 may be doped with N-type atoms, such as arsenic atoms, in the semiconductor substrate 2 to form a $N^+$ portion for the diffusion portion 971 when the semiconductor substrate 2 is the P-type silicon substrate; alternatively, the semiconductor substrate 2 may be doped with P-type atoms, such as boron atoms, in the semiconductor substrate 2 to form a $P^+$ portion for the diffusion portion 971 when the semiconductor substrate 2 is the N-type silicon substrate. A length w9 between the diffusion portions 966 and 971 may be between 20 and 250 nm. The gate 962 may act as a first terminal AF5 of the third type of anti-fuse 970, and the diffusion portions 966 and 971 may couple to each other to act as a second terminal AF6 of the third type of anti-fuse 970. Either when the second terminal AF6 of the third type of anti-fuse 970 is switched to couple to the voltage Vss of ground reference and the first terminal AF5 of the third type of anti-fuse 970 is switched to couple to a programming voltage V, between 2 and 10 volts, for example, or when the second terminal AF6 of the third type of anti-fuse 970 is switched to couple to a programming voltage $V_{Pr}$ between 2 and 10 volts, for example, and the first terminal AF5 of the third type of anti-fuse 970 is switched to couple to the voltage Vss of ground reference, a large bias voltage between the first and second terminals AF5 and AF6 of the third type of anti-fuse 970 may cause the oxide layer 963 and a portion of the semiconductor substrate 2 between the oxide layer 963 and one of the diffusion portions 966 and 971 to break down, resulting in a short circuit between the first and second terminals AF5 and AF6 of the third type of anti-fuse 970.

IV. Fourth Type of Anti-Fuse

Figure 12D:
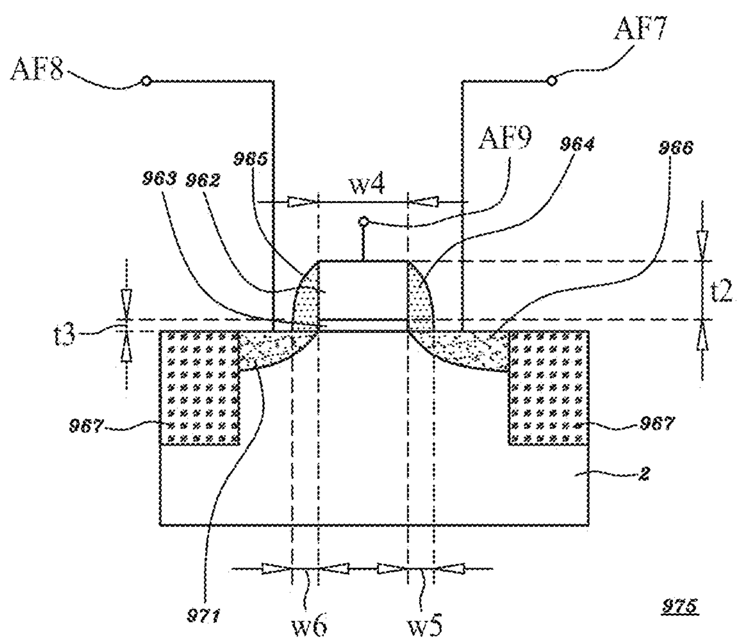

FIG. 12D is a schematically cross-sectional view showing a structure of a fourth type of anti-fuse in accordance with an embodiment of the present application. Referring to FIG. 12D, the fourth type of anti-fuse 975 may be provided by a metal-oxide-semiconductor (MOS) device at a top surface of a semiconductor substrate 2, such as P-type or N-type silicon substrate, which includes the structure of the third type of anti-fuse 970 as illustrated in FIG. 12C. For an element indicated by the same reference number shown in FIGS. 12B-12D, the specification of the element as seen in FIG. 12D may be referred to that of the element as illustrated in FIGS. 12B and 11C. The difference between the third and fourth types of anti-fuses 970 and 975 is that the diffusion portion 966 may act as a first terminal AF7 of the fourth type of anti-fuse 975, the diffusion portion 971 may act as a second terminal AF8 of the fourth type of anti-fuse 975 and the gate 962 may act as a third terminal AF9 of the fourth type of anti-fuse 975. Either when the second terminal AF8 of the fourth type of anti-fuse 975 is switched to couple to the voltage Vss of ground reference, the first terminal AF7 of the fourth type of anti-fuse 975 is switched to couple to a programming voltage $V_{Pr}$ between 2 and 10 volts, for example, and the third terminal AF9 of the fourth type of anti-fuse 975 is switched to couple to the voltage Vss of ground reference or the voltage Vcc of power supply, or when the second terminal AF8 of the fourth type of anti-fuse 975 is switched to couple to a programming voltage $V_{Pr}$ between 2 and 10 volts, for example, the first terminal AF7 of the fourth type of anti-fuse 975 is switched to couple to the voltage Vss of ground reference, and the third terminal AF9 of the fourth type of anti-fuse 975 is switched to couple to the voltage Vss of ground reference or the voltage Vcc of power supply, a large bias voltage between the first and second terminals AF7 and AF8 of the fourth type of anti-fuse 975 may cause a portion of the semiconductor substrate 2 between the diffusion portions 966 and 971 to break down, resulting in a short circuit between the first and second terminals AF7 and AF8 of the fourth type of anti-fuse 975.

V. Fifth Type of Anti-Fuse

Figure 12E:
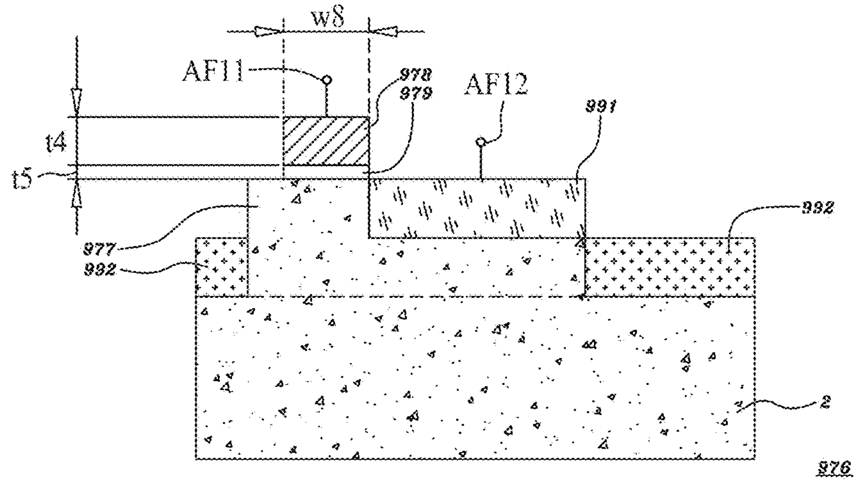

FIG. 12E is a schematically cross-sectional view showing a structure of a fifth type of anti-fuse in accordance with an embodiment of the present application. Referring to FIG. 12E, the fifth type of anti-fuse 976 may be provided by a metal-oxide-semiconductor (MOS) device at a top surface of a semiconductor substrate 2, such as P-type or N-type silicon substrate, which including (1) a fin 977 protruding from the semiconductor substrate 2 and extending in a longitudinal direction, wherein the fin 977 may be a P-type fin doped with P-type atoms, such as boron atoms, therein and protruding from the P-type silicon substrate 2, or an N-type fin doped with N-type atoms, such as arsenic atoms, therein and protruding from the N-type silicon substrate 2, for example, (2) a gate 978, such as polysilicon, tungsten, tungsten nitride, titanium, titanium nitride, tantalum, tantalum nitride, copper-containing metal or aluminum-containing metal, having a thickness t4 between 10 and 100 nm and a width w8 between 1 and 20 nm for example, over a top of the fin 977 and at opposite sidewalls of the fin 977 and extending across the fin 977 in a transverse direction perpendicular to the longitudinal direction, wherein the gate 978 may act as a first terminal AF11 of the fifth type of anti-fuse 976, (3) an oxide layer 979, such as silicon dioxide having a thickness t5 between 1 and 4 nm for example, between the gate 978 and top and sidewalls of the fin 977, (4) a diffusion portion 991 in the fin 977 and at a right side of the oxide layer 979, wherein the diffusion portion 991 may act as a second terminal AF12 of the fifth type of anti-fuse 976, and (5) a field oxide 992, such as thermally grown silicon dioxide, on the semiconductor substrate 2 and surrounding the fin 977, wherein the gate 978 may extend on the field oxide 992 in the transverse direction. The fin 977 may be doped with N-type atoms, such as arsenic atoms, in the fin 977 to form a $N^+$ portion for the diffusion portion 991 when the fin 977 is the P-type fin; alternatively, the fin 977 may be doped with P-type atoms, such as boron atoms, in the fin 977 to form a $P^+$ portion for the diffusion portion 991 when the fin 977 is the N-type fin. Either when the second terminal AF12 of the fifth type of anti-fuse 976 is switched to couple to the voltage Vss of ground reference and the first terminal AF11 of the fifth type of anti-fuse 976 is switched to couple to a programming voltage $V_{Pr}$, between 2 and 10 volts, for example, or when the second terminal AF12 of the fifth type of anti-fuse 976 is switched to couple to a programming voltage $V_{Pr}$ between 2 and 10 volts, for example, and the first terminal AF11 of the fifth type of anti-fuse 976 is switched to couple to the voltage Vss of ground reference, a large bias voltage between the first and second terminals AF11 and AF12 of the fifth type of anti-fuse 976 may cause the oxide layer 979 and a portion of the fin 977 between the oxide layer 979 and diffusion portion 991 to break down, resulting in a short circuit between the first and second terminals AF11 and AF12 of the fifth type of anti-fuse 976.

VI. Sixth Type of Anti-Fuse

Figure 12F:
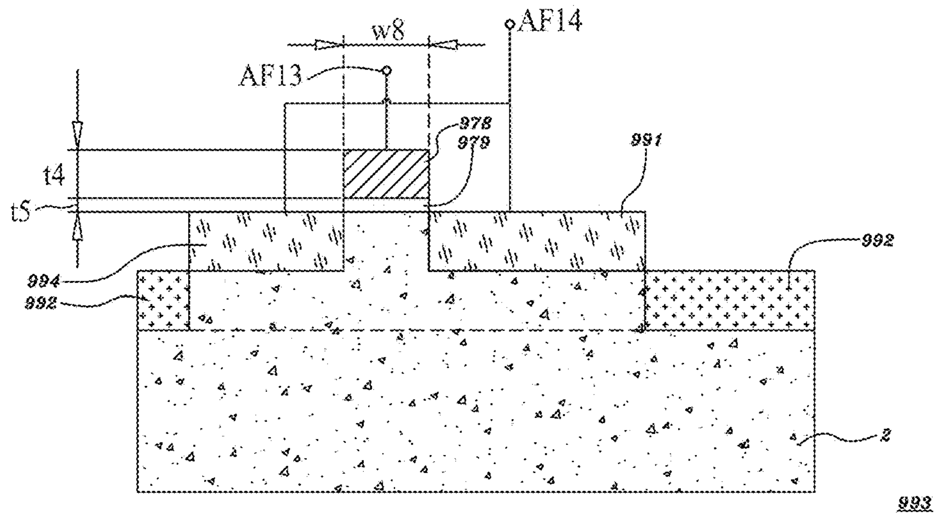

FIG. 12F is a schematically cross-sectional view showing a structure of a sixth type of anti-fuse in accordance with an embodiment of the present application. Referring to FIG. 12F, the sixth type of anti-fuse 993 may be provided by a metal-oxide-semiconductor (MOS) device at a top surface of a semiconductor substrate 2, such as P-type or N-type silicon substrate, which includes the structure of the fifth type of anti-fuse 976 as illustrated in FIG. 12E. For an element indicated by the same reference number shown in FIGS. 12E and 12F, the specification of the element as seen in FIG. 12F may be referred to that of the element as illustrated in FIG. 12E. The difference between the fifth and sixth types of anti-fuses 976 and 993 is that the sixth type of anti-fuse 993 may further include another diffusion portion 994 in the fin 977 and at a left side of the oxide layer 979. The fin 977 may be doped with N-type atoms, such as arsenic atoms, in the fin 977 to form a $N^+$ portion for the diffusion portion 994 when the fin 977 is the P-type fin; alternatively, the fin 977 may be doped with P-type atoms, such as boron atoms, in the fin 977 to form a $P^+$ portion for the diffusion portion 994 when the fin 977 is the N-type fin. A length w10 between the diffusion portions 991 and 994 may be between 1 and 20 nm. The gate 978 may act as a first terminal AF13 of the sixth type of anti-fuse 993, and the diffusion portions 991 and 994 may couple to each other to act as a second terminal AF14 of the sixth type of anti-fuse 993. Either when the second terminal AF14 of the sixth type of anti-fuse 993 is switched to couple to the voltage Vss of ground reference and the first terminal AF13 of the sixth type of anti-fuse 993 is switched to couple to a programming voltage $V_{Pr}$ between 2 and 10 volts, for example, or when the second terminal AF14 of the sixth type of anti-fuse 993 is switched to couple to a programming voltage $V_{Pr}$ between 2 and 10 volts, for example, and the first terminal AF13 of the sixth type of anti-fuse 993 is switched to couple to the voltage Vss of ground reference, a large bias voltage between the first and second terminals AF13 and AF14 of the sixth type of anti-fuse 993 may cause the oxide layer 979 and a portion of the fin 977 between the oxide layer 979 and one of the diffusion portions 991 and 994 to break down, resulting in a short circuit between the first and second terminals AF13 and AF14 of the sixth type of anti-fuse 993.

VII. Seventh Type of Anti-Fuse

Figure 12G:
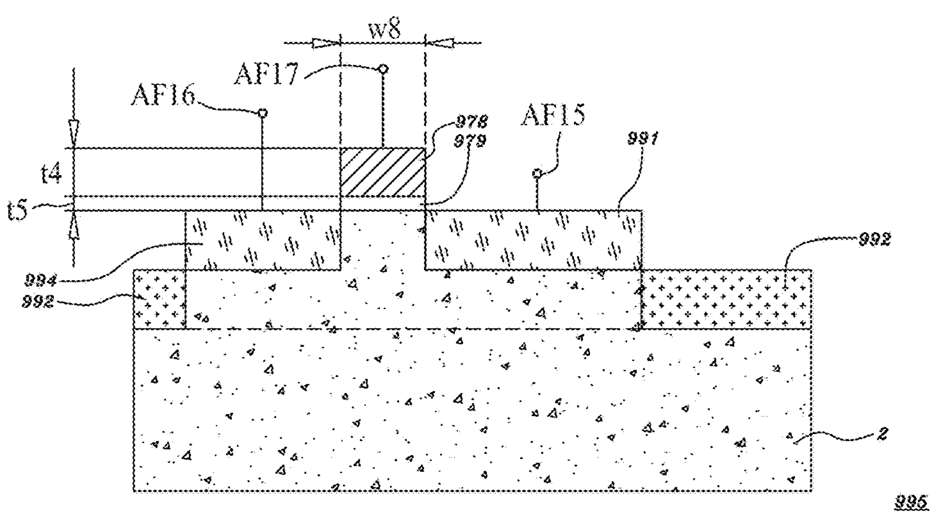

FIG. 12G is a schematically cross-sectional view showing a structure of a seventh type of anti-fuse in accordance with an embodiment of the present application. Referring to FIG. 12G, the seventh type of anti-fuse 995 may be provided by a metal-oxide-semiconductor (MOS) device at a top surface of a semiconductor substrate 2, such as P-type or N-type silicon substrate, which includes the structure of the sixth type of anti-fuse 993 as illustrated in FIG. 12F. For an element indicated by the same reference number shown in FIGS. 12E-12G, the specification of the element as seen in FIG. 12G may be referred to that of the element as illustrated in FIGS. 12E and 12F. The difference between the sixth and seventh types of anti-fuses 993 and 995 is that the diffusion portion 991 may act as a first terminal AF15 of the seventh type of anti-fuse 995, the diffusion portion 994 may act as a second terminal AF16 of the seventh type of anti-fuse 995 and the gate 978 may act as a third terminal AF17 of the seventh type of anti-fuse 995. Either when the second terminal AF16 of the seventh type of anti-fuse 995 is switched to couple to the voltage Vss of ground reference, the first terminal AF15 of the seventh type of anti-fuse 995 is switched to couple to a programming voltage V, between 2 and 10 volts, for example, and the third terminal AF17 of the seventh type of anti-fuse 995 is switched to couple to the voltage Vss of ground reference or the voltage Vcc of power supply, or when the second terminal AF16 of the seventh type of anti-fuse 995 is switched to couple to a programming voltage $V_{Pr}$ between 2 and 10 volts, for example, the first terminal AF15 of the seventh type of anti-fuse 995 is switched to couple to the voltage Vss of ground reference, and the third terminal AF17 of the seventh type of anti-fuse 995 is switched to couple to the voltage Vss of ground reference or the voltage Vcc of power supply, a large bias voltage between the first and second terminals AF15 and AF16 of the seventh type of anti-fuse 995 may cause a portion of the fin 977 between the diffusion portions 991 and 994 to break down, resulting in a short circuit between the first and second terminals AF15 and AF16 of the seventh type of anti-fuse 995.

Specification for Non-Volatile Memory Cell

I. Tenth Type of Non-Volatile Memory Cell

Figure 13A:
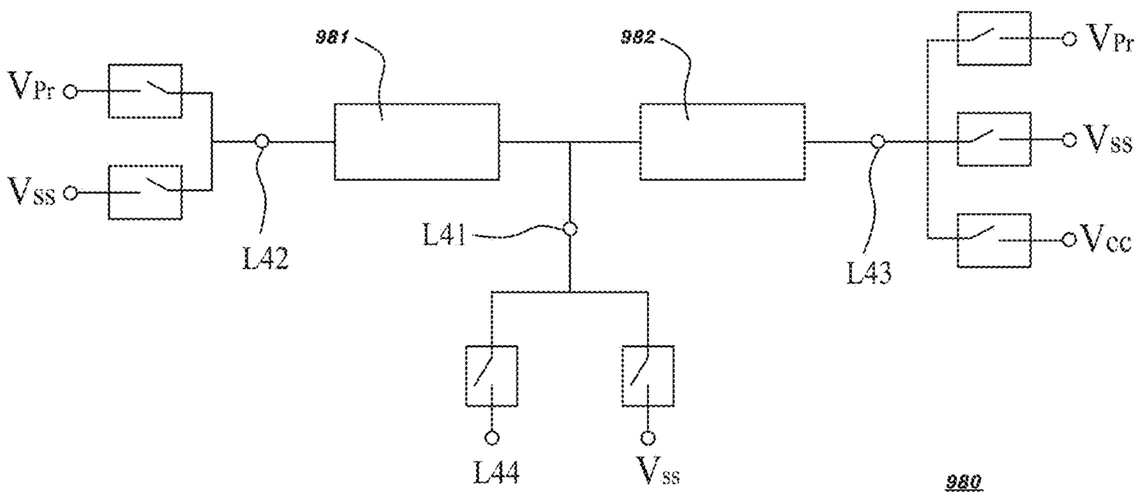
FIGS. 13A-13C are circuit diagrams illustrating tenth through twelfth types of non-volatile memory cells in accordance with an embodiment of the present application.

FIG. 13A is a circuit diagram illustrating a tenth type of non-volatile memory cell in accordance with an embodiment of the present application. Referring to FIG. 13A, the tenth type of non-volatile memory cell 980 may be provided with two anti-fuses 981 and 982, each of which may be the first, second, third, fourth, fifth, sixth or seventh type of anti-fuse 960, 961, 970, 975, 976, 993 or 995 as seen in FIGS. 12A-12G, having the second terminals AF2, AF4, AF6, AF8, AF12, AF14 or AF16 coupling to each other and to a node L41, wherein the anti-fuse 981 may have the first terminal AF1, AF3, AF5, AF7, AF11, AF13 or AF15 coupling to a node L42 and the anti-fuse 982 may have the first terminal AF1, AF3, AF5, AF7, AF11, AF13 or AF15 coupling to a node L43.

Referring to FIG. 13A, when the tenth type of non-volatile memory cell 980 is programmed to a logic level of "1", (1) the node L41 may be switched to couple to the voltage Vss of ground reference, (2) the node L42 may be switched to couple to the voltage Vss of ground reference, and (3) the node L43 may be switched to couple to a programming voltage V, between 2 and 10 volts, for example. If each of the anti-fuses 981 and 982 is the fourth type of anti-fuse 975 as seen in FIG. 12D, its third terminal AF9 may be switched to couple to the voltage Vss of ground reference or the voltage Vcc of power supply. If each of the anti-fuses 981 and 982 is the seventh type of anti-fuse 995 as seen in FIG. 12G, its third terminal AF17 may be switched to couple to the voltage Vss of ground reference or the voltage Vcc of power supply. Accordingly, a large bias voltage between the nodes L43 and L41 may cause the anti-fuse 982 to break down, resulting in a short circuit between the nodes L43 and L41.

Referring to FIG. 13A, when the tenth type of non-volatile memory cell 980 is programmed to a logic level of "0", (1) the node L41 may be switched to couple to the voltage Vss of ground reference, (2) the node L43 may be switched to couple to the voltage Vss of ground reference, and (3) the node L42 may be switched to couple to the programming voltage $V_{Pr}$ between 2 and 10 volts, for example. If each of the anti-fuses 981 and 982 is the fourth type of anti-fuse 975 as seen in FIG. 12D, its third terminal AF9 may be switched to couple to the voltage Vss of ground reference or the voltage Vcc of power supply. If each of the anti-fuses 981 and 982 is the seventh type of anti-fuse 995 as seen in FIG. 12G, its third terminal AF17 may be switched to couple to the voltage Vss of ground reference or the voltage Vcc of power supply. Accordingly, a large bias voltage between the nodes L42 and L41 may cause the anti-fuse 981 to break down, resulting in a short circuit between the nodes L42 and L41.

Referring to FIG. 13A, in operation of the tenth type of non-volatile memory cell 980, (1) the node L41 may be switched to couple to an output point L44 of the tenth type of non-volatile memory cell 980, (2) the node L42 may be switched to couple to the voltage Vss of ground reference, and (3) the node L43 may be switched to couple to the voltage Vcc of power supply. If each of the anti-fuses 981 and 982 is the fourth type of anti-fuse 975 as seen in FIG. 12D and is formed with the $N^+$ portions for its diffusion portions 966 and 971, its third terminal AF9 may be switched to couple to the voltage Vss of ground reference. If each of the anti-fuses 981 and 982 is the fourth type of anti-fuse 975 as seen in FIG. 12D and is formed with the $P^+$ portions for its diffusion portions 966 and 971, its third terminal AF9 may be switched to couple to the voltage Vcc of power supply. If each of the anti-fuses 981 and 982 is the seventh type of anti-fuse 995 as seen in FIG. 12G and is formed with the $N^+$ portions for its diffusion portions 991 and 994, its third terminal AF17 may be switched to couple to the voltage Vss of ground reference. If each of the anti-fuses 981 and 982 is the seventh type of anti-fuse 995 as seen in FIG. 12G and is formed with the $P^+$ portions for its diffusion portions 991 and 994, its third terminal AF17 may be switched to couple to the voltage Vcc of power supply. When the tenth type of non-volatile memory cell 980 is programmed to form a short circuit between the nodes L41 and L43, the output point L44 of the tenth type of non-volatile memory cell 980 may be associated with the node L41 and at a logic level of "1". When the tenth type of non-volatile memory cell 980 is programmed to form a short circuit between the nodes L41 and L42, the output point L44 of the tenth type of non-volatile memory cell 980 may be associated with the node L42 and at a logic level of "0".

II. Eleventh Type of Non-Volatile Memory Cell

Figure 13B:
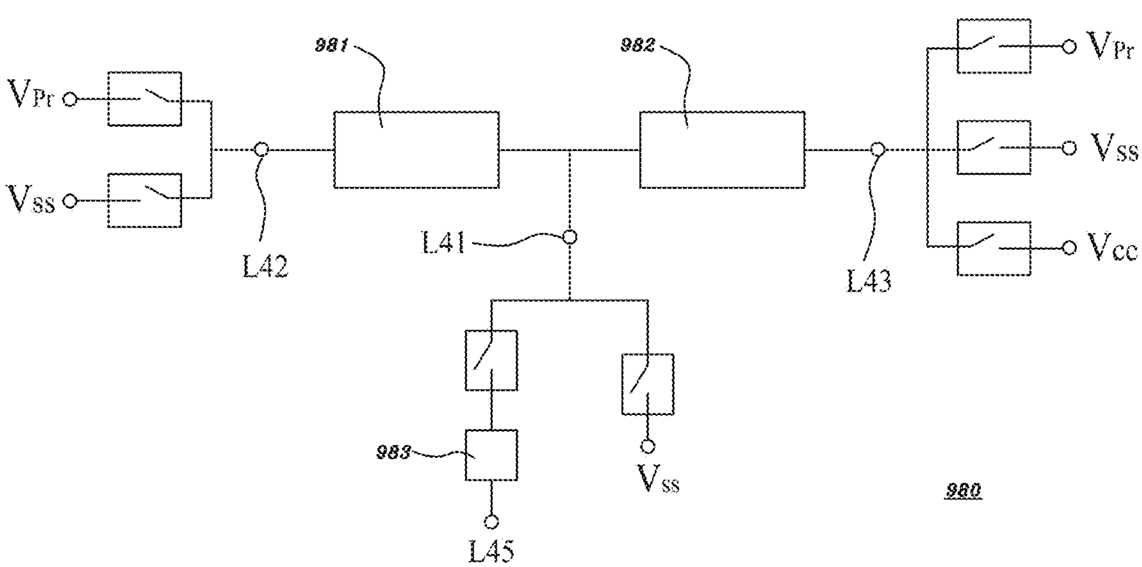

FIG. 13B is a circuit diagram illustrating an eleventh type of non-volatile memory cell in accordance with an embodiment of the present application. The scheme for the eleventh type of non-volatile memory cell 985 as seen in FIG. 13B is similar to that for the tenth type of non-volatile memory cell 980 as seen in FIG. 13A and can be referred to the illustration for FIG. 13A, but the difference between the schemes for the eleventh type of non-volatile memory cell 985 as seen in FIG. 13B and the tenth type of non-volatile memory cell 980 as seen in FIG. 13A is mentioned as below. For an element indicated by the same reference number shown in FIGS. 13A and 13B, the specification of the element as seen in FIG. 13B may be referred to that of the element as illustrated in FIG. 13A. Referring to FIG. 13B, the eleventh type of non-volatile memory cell 985 may further include a driving circuit 983, such as driver or inverter, configured to drive, amplify and/or invert a data input at its input point into a data output at its output point. In operation, the input point of the driving circuit 983 may be switched to couple to the node L41 of the eleventh type of non-volatile memory cell 985, and the output point of the driving circuit 983 may act as an output point L45 of the eleventh type of non-volatile memory cell 985.

III. Twelfth Type of Non-Volatile Memory Cell

Figure 13C:
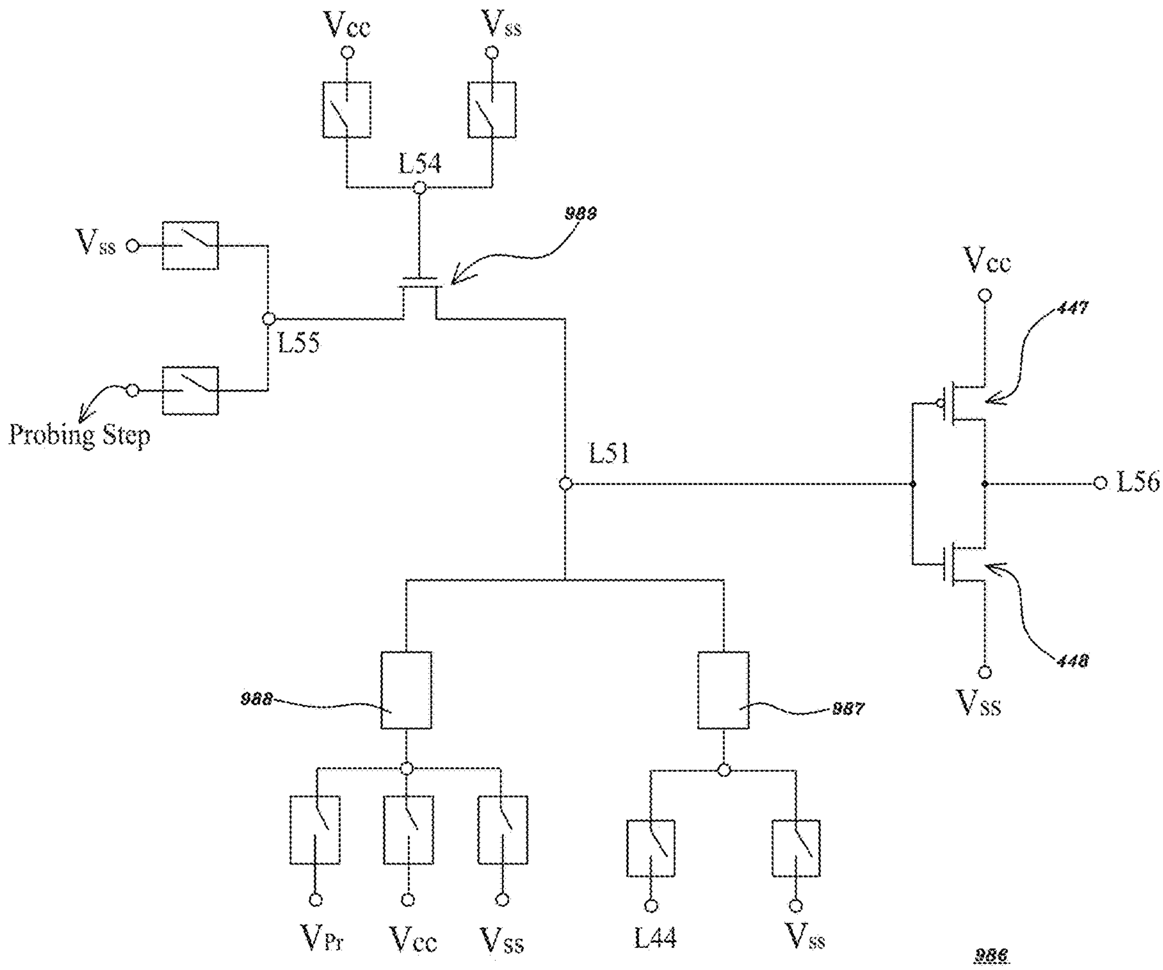

FIG. 13C is a circuit diagram illustrating a twelfth type of non-volatile memory cell in accordance with an embodiment of the present application. Referring to FIG. 13C, the twelfth type of non-volatile memory cell 986 may be provided with two anti-fuses 987 and 988, each of which may be the first, second, third, fourth, fifth, sixth or seventh type of anti-fuse 960, 961, 970, 975, 976, 993 or 995 as seen in FIGS. 12A-12G, having the first terminals AF1, AF3, AF5, AF7, AF11, AF13 or AF15 coupling to each other and to a node L51, wherein the anti-fuse 987 may have the second terminal AF2, AF4, AF6, AF8, AF12, AF14 or AF16 coupling to a node L52 and the anti-fuse 988 may have the second terminal AF2, AF4, AF6, AF8, AF12, AF14 or AF16 coupling to a node L53. The twelfth type of non-volatile memory cell 986 may further include (1) a switch 989, such as N-type MOS transistor, having a gate terminal coupling to a node L54 and a channel having two opposite terminals coupling to the node L51 and a node L55 respectively, and (2) a pair of a P-type MOS transistor 447 and N-type MOS transistor 448 both hiving respective drain terminals coupling to each other and to a node L56, respective gate terminals coupling to each other and to the node L51 and respective source terminals coupling to the voltage Vcc of power supply and to the voltage Vss of ground reference.

Referring to FIG. 13C, when the twelfth type of non-volatile memory cell 986 is programmed to a logic level of "1", (1) the node L54 may be switched to couple to the voltage Vcc of power supply such that the switch 989 may be switched on to couple the node L51 to the node L55, (2) the node L55 may be switched to couple to the voltage Vss of ground reference, (3) the node L52 may be switched to couple to a programming voltage $V_{Pr}$ between 2 and 10 volts, for example, and (4) the node L53 may be switched to couple to the voltage Vss of ground reference or to be floating. Accordingly, a large bias voltage between the nodes L51 and L52 may cause the anti-fuse 987 to break down, resulting in a short circuit between the nodes L51 and L52. If each of the anti-fuses 987 and 988 is the fourth type of anti-fuse 975 as seen in FIG. 12D, its third terminal AF9 may be switched to couple to the voltage Vss of ground reference or the voltage Vcc of power supply. If each of the anti-fuses 981 and 982 is the seventh type of anti-fuse 995 as seen in FIG. 12G, its third terminal AF17 may be switched to couple to the voltage Vss of ground reference or the voltage Vcc of power supply.

Referring to FIG. 13C, when the twelfth type of non-volatile memory cell 986 is programmed to a logic level of "0", (1) the node L54 may be switched to couple to the voltage Vcc of power supply such that the switch 989 may be switched on to couple the node L51 to the node L55, (2) the node L55 may be switched to couple to the voltage Vss of ground reference, (3) the node L52 may be switched to couple to the voltage Vss of ground reference or to be floating, and (4) the node L53 may be switched to couple to a programming voltage $V_{Pr}$ between 2 and 10 volts, for example. Accordingly, a large bias voltage between the nodes L51 and L53 may cause the anti-fuse 988 to break down, resulting in a short circuit between the nodes L51 and L53. If each of the anti-fuses 987 and 988 is the fourth type of anti-fuse 975 as seen in FIG. 12D, its third terminal AF9 may be switched to couple to the voltage Vss of ground reference or the voltage Vcc of power supply. If each of the anti-fuses 981 and 982 is the seventh type of anti-fuse 995 as seen in FIG. 12G, its third terminal AF17 may be switched to couple to the voltage Vss of ground reference or the voltage Vcc of power supply.

Referring to FIG. 13C, in operation of the twelfth type of non-volatile memory cell 986, (1) the node L54 may be switched to couple to the voltage Vss of ground reference such that the switch 989 may be switched off to decouple the node L51 from the node L55, (2) the node L52 may be switched to couple to the voltage Vss of ground reference, (3) the node L53 may be switched to couple to the voltage Vcc of power supply, and (4) the node L56 may be switched to act as an output point of the twelfth type of non-volatile memory cell 986. If each of the anti-fuses 981 and 982 is the fourth type of anti-fuse 975 as seen in FIG. 12D and is formed with the $N^+$ portions for its diffusion portions 966 and 971, its third terminal AF9 may be switched to couple to the voltage Vss of ground reference. If each of the anti-fuses 981 and 982 is the fourth type of anti-fuse 975 as seen in FIG. 12D and is formed with the $P^+$ portions for its diffusion portions 966 and 971, its third terminal AF9 may be switched to couple to the voltage Vcc of power supply. If each of the anti-fuses 981 and 982 is the seventh type of anti-fuse 995 as seen in FIG. 12G and is formed with the $N^+$ portions for its diffusion portions 991 and 994, its third terminal AF17 may be switched to couple to the voltage Vss of ground reference. If each of the anti-fuses 981 and 982 is the seventh type of anti-fuse 995 as seen in FIG. 12G and is formed with the $P^+$ portions for its diffusion portions 991 and 994, its third terminal AF17 may be switched to couple to the voltage Vcc of power supply. When the twelfth type of non-volatile memory cell 986 is programmed to form a short circuit between the nodes L51 and L52, the node L51 may be coupled through the anti-fuse 987 to the voltage Vss of ground reference to turn on the P-type MOS transistor 447 and turn off the N-type MOS transistor 448, and thus the output point L56 of the twelfth type of non-volatile memory cell 986 may be coupled to the voltage Vcc of power supply via a channel of the P-type MOS transistor 447 to be defined at a logic level of "1". When the twelfth type of non-volatile memory cell 986 is programmed to form a short circuit between the nodes L51 and L53, the node L51 may be coupled through the anti-fuse 988 to the voltage Vcc of power supply to turn off the P-type MOS transistor 447 and turn on the N-type MOS transistor 448, and thus the output point L56 of the twelfth type of non-volatile memory cell 986 may be coupled through the N-type MOS transistor 448 to the voltage Vss of ground reference to be defined at a logic level of "0".

Referring to FIG. 13C, before the twelfth type of non-volatile memory cell 986 is programmed to a logic level of "1" or "0", a step for probing the twelfth type of non-volatile memory cell 986 may be performed. In the step for probing the twelfth type of non-volatile memory cell 986, (1) the node L54 may be switched to couple to the voltage Vcc of power supply such that the switch 989 may be switched on to couple the node L51 to the node L55 configured to couple to a probing signal, (2) the node L52 may be switched to be floating, and (2) the node L53 may be switched to be floating. The anti-fuse 987 may decouple the node L51 from the node L52, and the anti-fuse 988 may decouple the node L51 from the node L53. When the probing signal is at a logic level of "0", the P-type MOS transistor 447 may be turned on and the N-type MOS transistor 448 may be turned off. Thereby, the output point L56 of the twelfth type of non-volatile memory cell 986 may be coupled through the P-type MOS transistor 447 to the voltage Vcc of power supply to be defined at a logic level of "1". When the probing signal is at a logic level of "1", the P-type MOS transistor 447 may be turned off and the N-type MOS transistor 448 may be turned on. Thereby, the output point L56 of the twelfth type of non-volatile memory cell 986 may be coupled through the N-type MOS transistor 448 to the voltage Vss of ground reference to be defined at a logic level of "0".

Specification for Electrical Fuse

Figure 14A:
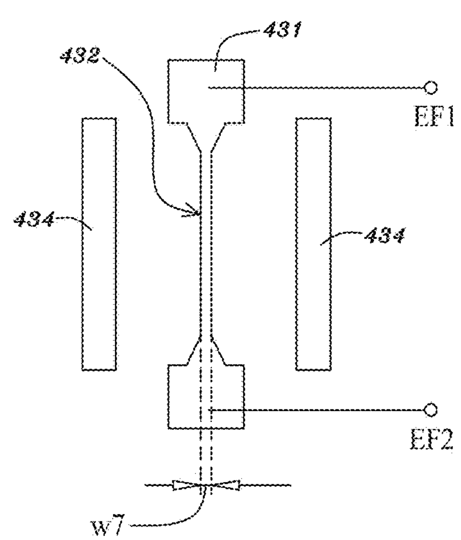
FIG. 14A is a schematically top view showing a structure of an electrical fuse (e-fuse) in accordance with an embodiment of the present application.

FIG. 14A is a schematically top view showing a structure of an electrical fuse (e-fuse) in accordance with an embodiment of the present application. Referring to FIG. 14A, for a first interconnection scheme of a chip (FISC) 20 as illustrated in FIGS. 34A-34D, one of its interconnection metal layers 6 may include (1) a metal trace 431 with a narrow neck 432 configured as an electrical fuse, i.e., e-fuse, wherein the narrow neck 432 may have a width w7 between 20 and 200 nm, and (2) a pair dam bars 434 at two opposite sides of the electrical fuse 432, extending along the electrical fuse 432 to protect the electrical fuse 432 from been damaged. The electrical fuse 432 may have two opposite terminals, that is, first and second terminals coupling to two nodes EF1 and EF2 respectively.

Specification for Non-Volatile Memory Cell

I. Thirteenth Type of Non-Volatile Memory Cell

Figure 14B:
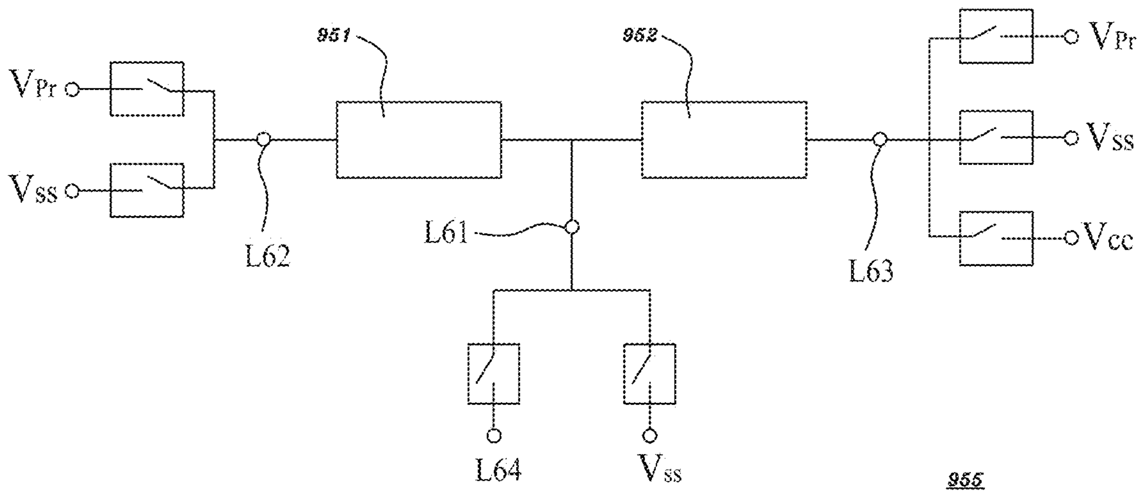
FIGS. 14B-14D are circuit diagrams illustrating thirteenth through fourteen types of non-volatile memory cells in accordance with an embodiment of the present application.

FIG. 14B is a circuit diagram illustrating a thirteenth type of non-volatile memory cell in accordance with an embodiment of the present application. Referring to FIG. 14B, the thirteenth type of non-volatile memory cell 955 may be provided with two e-fuses 951 and 952, each of which may be the e-fuse 432 as seen in FIG. 14A, having the second terminals EF2 coupling to each other and to a node L61, wherein the e-fuse 951 may have the first terminal EF1 coupling to a node L62 and the e-fuse 952 may have the first terminal EF1 coupling to a node L63.

Referring to FIG. 14B, when the thirteenth type of non-volatile memory cell 955 is programmed to a logic level of "0", (1) the node L61 may be switched to couple to the voltage Vss of ground reference, (2) the node L62 may be switched to couple to the voltage Vss of ground reference, and (3) the node L63 may be switched to couple to a programming voltage $V_{Pr}$ between 2 and 10 volts, for example. Accordingly, a large bias voltage between the nodes L63 and L61 may cause the e-fuse 952 to break down, resulting in an open circuit between the nodes L63 and L61.

Referring to FIG. 14B, when the thirteenth type of non-volatile memory cell 955 is programmed to a logic level of "1", (1) the node L61 may be switched to couple to the voltage Vss of ground reference, (2) the node L63 may be switched to couple to the voltage Vss of ground reference, and (3) the node L62 may be switched to couple to the programming voltage $V_{Pr}$ between 2 and 10 volts, for example. Accordingly, a large bias voltage between the nodes L62 and L61 may cause the e-fuse 951 to break down, resulting in an open circuit between the nodes L62 and L61.

Referring to FIG. 14B, in operation of the thirteenth type of non-volatile memory cell 955, (1) the node L61 may be switched to couple to an output point L64 of the thirteenth type of non-volatile memory cell 955, (2) the node L62 may be switched to couple to the voltage Vss of ground reference, and (3) the node L63 may be switched to couple to the voltage Vcc of power supply. When the thirteenth type of non-volatile memory cell 955 is programmed to form an open circuit between the nodes L61 and L63, the output point L64 of the thirteenth type of non-volatile memory cell 955 may be associated with the node L62 and at a logic level of "0". When the thirteenth type of non-volatile memory cell 955 is programmed to form an open circuit between the nodes L61 and L62, the output point L44 of the thirteenth type of non-volatile memory cell 955 may be associated with the node L63 and at a logic level of "1".

II. Fourteenth Type of Non-Volatile Memory Cell

Figure 14C:
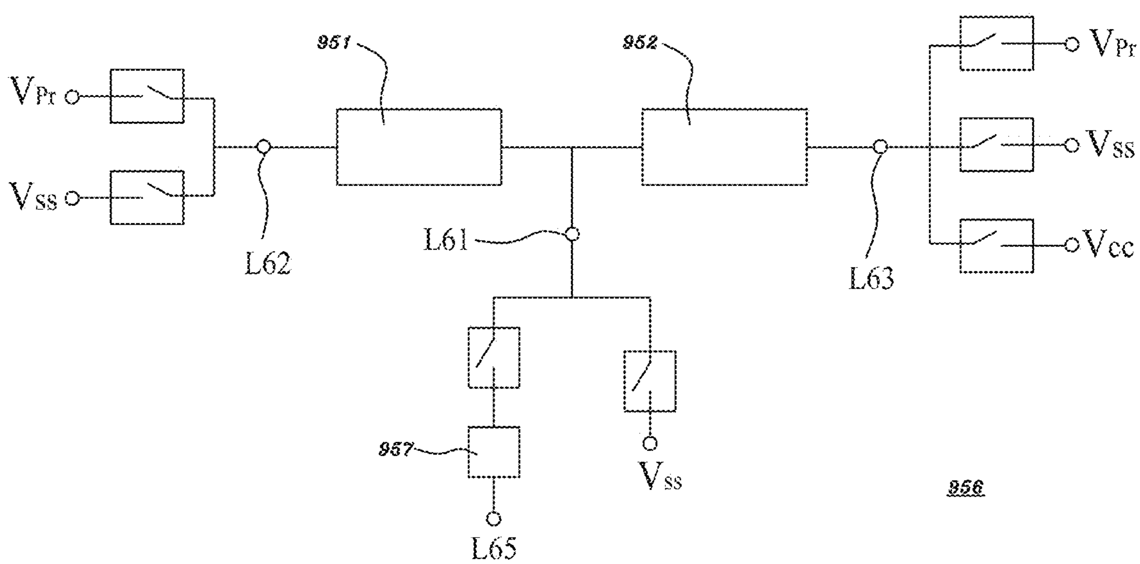

FIG. 14C is a circuit diagram illustrating a fourteenth type of non-volatile memory cell in accordance with an embodiment of the present application. The scheme for the fourteenth type of non-volatile memory cell 956 as seen in FIG. 14C is similar to that for the thirteenth type of non-volatile memory cell 955 as seen in FIG. 14B and can be referred to the illustration for FIG. 14B, but the difference between the schemes for the fourteenth type of non-volatile memory cell 956 as seen in FIG. 14C and the thirteenth type of non-volatile memory cell 955 as seen in FIG. 14B is mentioned as below. For an element indicated by the same reference number shown in FIGS. 14B and 14C, the specification of the element as seen in FIG. 14C may be referred to that of the element as illustrated in FIG. 14B. Referring to FIG. 14C, the fourteenth type of non-volatile memory cell 956 may further include a driving circuit 957, such as driver or inverter, configured to drive, amplify and/or invert a data input at its input point into a data output at its output point. In operation, the input point of the driving circuit 957 may be switched to couple to the node L61 of the fourteenth type of non-volatile memory cell 956, and the output point of the driving circuit 957 may act as an output point L65 of the fourteenth type of non-volatile memory cell 956.

III. Fifteenth Type of Non-Volatile Memory Cell

Figure 14D:
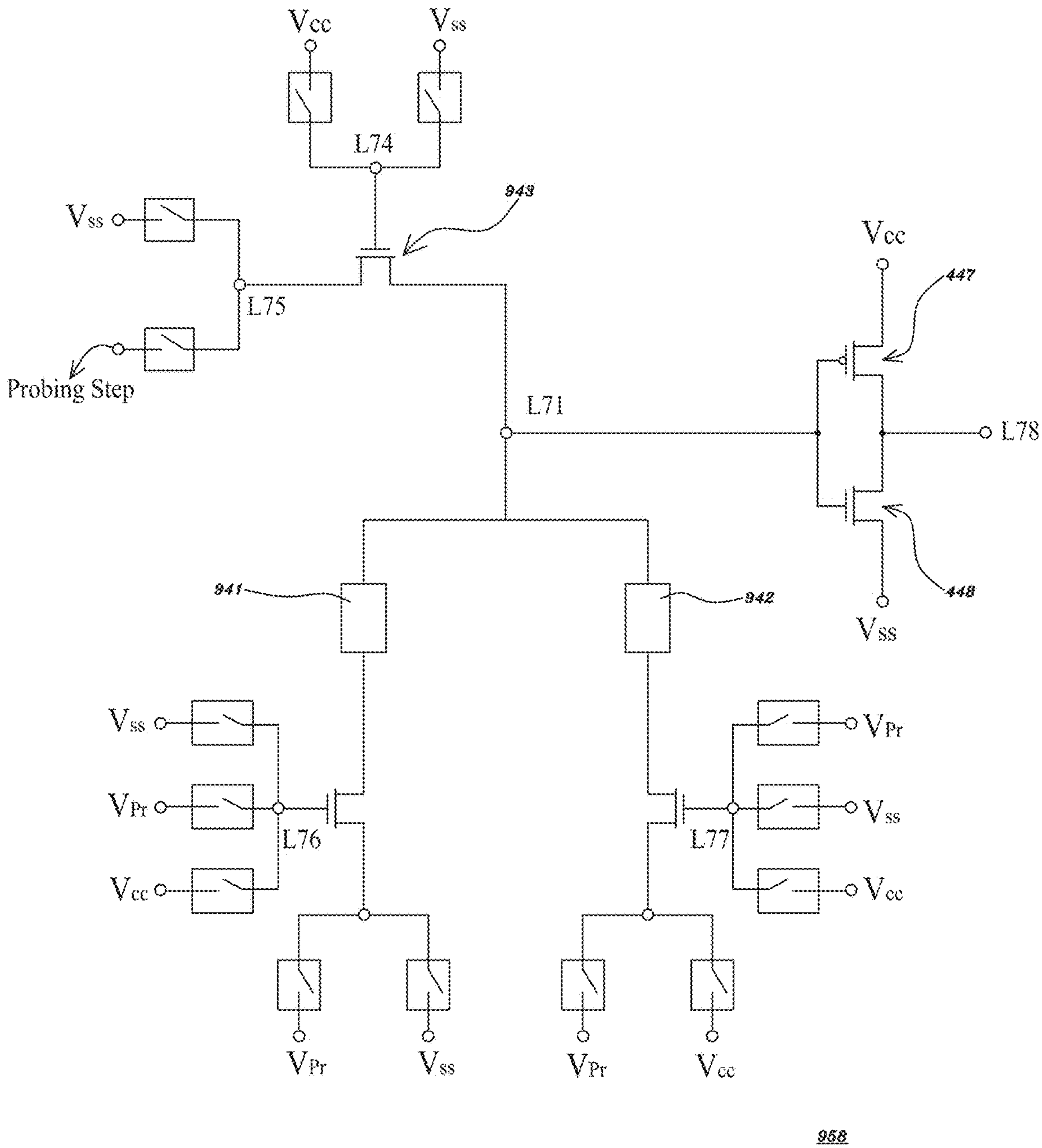

FIG. 14D is a circuit diagram illustrating a fifteenth type of non-volatile memory cell in accordance with an embodiment of the present application. Referring to FIG. 14D, the fifteenth type of non-volatile memory cell 958 may be provided with two c-fuses 941 and 942, each of which may be the c-fuse 432 as seen in FIG. 14A, having the first terminals EF1 coupling to each other and to a node L71. The fifteenth type of non-volatile memory cell 958 may further include (1) a switch 943, such as N-type MOS transistor, having a gate terminal coupling to a node L74 and a channel having two opposite terminals coupling to the node L71 and a node L75 respectively, (2) a switch 944, such as N-type MOS transistor, having a gate terminal coupling to a node L76 and a channel having two opposite terminals coupling to the second terminal EF2 of the c-fuse 941 and a node L72 respectively, (3) a switch 945, such as N-type MOS transistor, having a gate terminal coupling to a node L77 and a channel having two opposite terminals coupling to the second terminal EF2 of the c-fuse 942 and a node L73 respectively, and (4) a pair of a P-type MOS transistor 447 and N-type MOS transistor 448 both having respective drain terminals coupling to each other and to a node L78, respective gate terminals coupling to each other and to the node L71 and respective source terminals coupling to the voltage Vcc of power supply and to the voltage Vss of ground reference.

Referring to FIG. 14D, when the fifteenth type of non-volatile memory cell 958 is programmed to a logic level of “1”, (1) the node L74 may be switched to couple to the voltage Vcc of power supply such that the switch 943 may be switched on to couple the node L71 to the node L75, (2) the node L75 may be switched to couple to the voltage Vss of ground reference, (3) the node L72 may be switched to be floating, (4) the node L76 may be switched to couple to the voltage Vss of ground reference, (5) the node L73 may be switched to couple to a programming voltage $V_{Pr}$ between 2 and 10 volts, for example, and (7) the node L77 may be switched to couple to a programming voltage $V_{Pr}$ between 2 and 10 volts, for example. Accordingly, a large bias voltage between the nodes L73 and L71 may cause the e-fuse 942 to break down, resulting in an open circuit between the nodes L73 and L71.

Referring to FIG. 14D, when the fifteenth type of non-volatile memory cell 958 is programmed to a logic level of “0”, (1) the node L74 may be switched to couple to the voltage Vcc of power supply such that the switch 943 may be switched on to couple the node L71 to the node L75, (2) the node L75 may be switched to couple to the voltage Vss of ground reference, (3) the node L72 may be switched to couple to a programming voltage $V_{Pr}$ between 2 and 10 volts, for example, (4) the node L76 may be switched to couple to a programming voltage $V_{Pr}$ between 2 and 10 volts, for example, (5) the node L73 may be switched to be floating, and (7) the node L77 may be switched to the voltage Vss of ground reference. Accordingly, a large bias voltage between the nodes L72 and L71 may cause the e-fuse 941 to break down, resulting in an open circuit between the nodes L72 and L71.

Referring to FIG. 14D, in operation of the fifteenth type of non-volatile memory cell 958, (1) the node L74 may be switched to couple to the voltage Vss of ground reference such that the switch 943 may be switched off to decouple the node L71 from the node L75, (2) the node L72 may be switched to couple to the voltage Vss of ground reference, (3) the node L77 may be switched to couple to the voltage Vcc of power supply, (4) the node L73 may be switched to couple to the voltage Vcc of power supply, (5) the node L77 may be switched to couple to the voltage Vcc of power supply, and (6) the node L78 may be switched to act as an output point of the fifteenth type of non-volatile memory cell 958. When the fifteenth type of non-volatile memory cell 958 is programmed to form an open circuit between the nodes L71 and L73, the node L71 may be coupled through the e-fuse 941 and switch 944 to the voltage Vss of ground reference to turn on the P-type MOS transistor 447 and turn off the N-type MOS transistor 448, and thus the output point L78 of the fifteenth type of non-volatile memory cell 958 may be coupled through the P-type MOS transistor 447 to the voltage Vcc of power supply to be defined at a logic level of “1”. When the fifteenth type of non-volatile memory cell 958 is programmed to form an open circuit between the nodes L71 and L72, the node L71 may be coupled through the e-fuse 942 and switch 945 to the voltage Vcc of power supply to turn off the P-type MOS transistor 447 and turn on the N-type MOS transistor 448, and thus the output point L78 of the fifteenth type of non-volatile memory cell 958 may be coupled through the N-type MOS transistor 448 to the voltage Vss of ground reference to be defined at a logic level of “0”.

Referring to FIG. 14D, before the fifteenth type of non-volatile memory cell 958 is programmed to a logic level of “1” or “1”, a step for probing the fifteenth type of non-volatile memory cell 958 may be performed. In the step for probing the fifteenth type of non-volatile memory cell 958, (1) the node L74 may be switched to couple to the voltage Vcc of power supply such that the switch 943 may be switched on to couple the node L71 to the node L75 configured to couple to a probing signal, (2) the node L76 may be switched to couple to the voltage Vss of ground reference, (3) the node L72 may be switched to be floating, (4) the node L77 may be switched to couple to the voltage Vss of ground reference, (3) the node L73 may be switched to be floating. When the probing signal is at a logic level of “0”, the P-type MOS transistor 447 may be turned on and the N-type MOS transistor 448 may be turned off. Thereby, the output point L78 of the fifteenth type of non-volatile memory cell 986 may be coupled through the P-type MOS transistor 447 to the voltage Vcc of power supply to be defined at a logic level of “1”. When the probing signal is at a logic level of “1”, the P-type MOS transistor 447 may be turned off and the N-type MOS transistor 448 may be turned on. Thereby, the output point L78 of the fifteenth type of non-volatile memory cell 958 may be coupled through the N-type MOS transistor 448 to the voltage Vss of ground reference to be defined at a logic level of “0”.

Figure 15B:
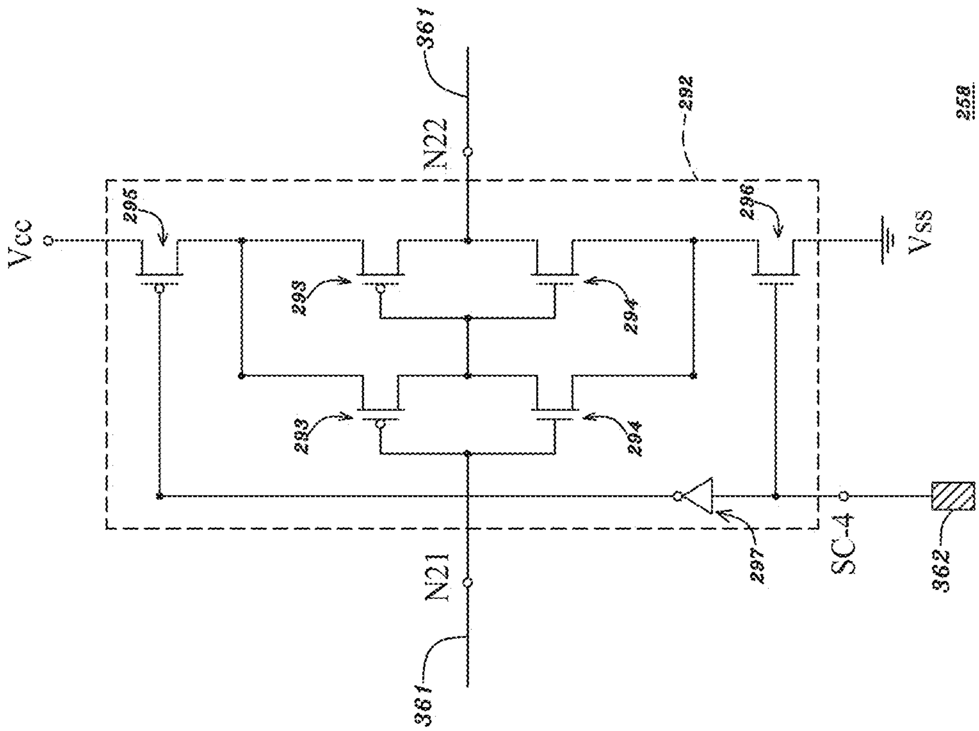
FIGS. 15A-15C are circuit diagrams illustrating various field programmable switch cells for first through third types of pass/no-pass switches in accordance with an embodiment of the present application.
Figure 15A:
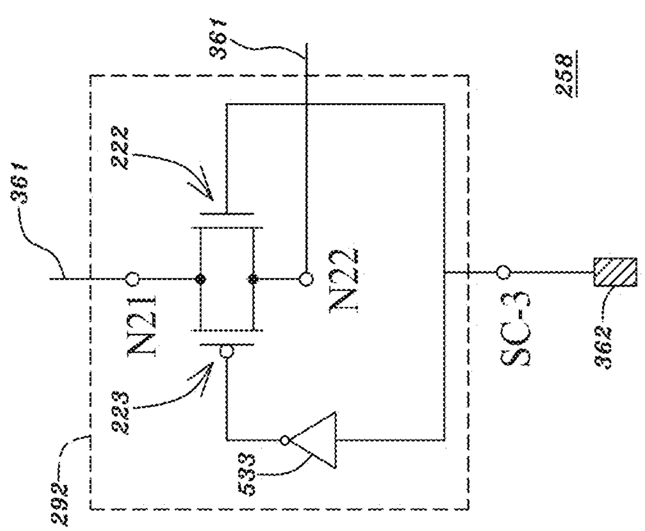

Specification for Field Programmable Switch Cell for Pass/No-Pass Switches (1) Field Programmable Switch Cell for First Type of Pass/No-Pass Switch FIG. 15A is a circuit diagram illustrating a field programmable switch cell for a first type of pass/no-pass switch in accordance with an embodiment of the present application. Referring to FIG. 15A, a first type of pass/no-pass switch 292 may include an N-type metal-oxide-semiconductor (MOS) transistor 222 and a P-type metal-oxide-semiconductor (MOS) transistor 223 coupling in parallel to each other. For the first type of pass/no-pass switch 292, each of its N-type and P-type metal-oxide-semiconductor (MOS) transistors 222 and 223 may be configured to form a channel between two opposites nodes N21 and N22. The first type of pass/no-pass switch 292 may further include an inverter 533 having an input point coupling to a gate terminal of the N-type MOS transistor 222 and a node SC-3 and volatile an output point coupling to a gate terminal of the P-type MOS transistor 223. For the first type of pass/no-pass switch 292, its inverter 533 is configured to invert a data input at the input point thereof as a data output at the output point thereof. Thereby, the first type of pass/no-pass switch 292 is configured to control, in accordance with a first data input at the node SC-3, coupling between an input point thereof at the node N21 and an output point thereof at the node N22.

(2) Field Programmable Switch Cell for Second Type of Pass/No-Pass Switch

FIG. 15B is a circuit diagram illustrating a field programmable switch cells for a second type of pass/no-pass switch in accordance with an embodiment of the present application. Referring to FIG. 15B, a second type of pass/no-pass switch 292 may be a multi-stage tri-state buffer, i.e., switch buffer, having a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, i.e., first and second stages. For the second type of pass/no-pass switch 292, its P-type MOS and N-type MOS transistors 293 and 294 in the first stage may have gate terminals coupling to each other at a node N21. The drain terminals of its P-type MOS and N-type MOS transistors 293 and 294 in the first stage may couple to each other and to gate terminals of its P-type MOS and N-type MOS transistors 293 and 294 in the second stage, i.e., output stage. Its P-type MOS and N-type MOS transistors 293 and 294 in the second stage, i.e., output stage, may have drain terminals couple to each other at a node N22.

Referring to FIG. 15B, the second type of pass/no-pass switch 292 may further include a switching mechanism configured to enable or disable the second type of pass/no-pass switch 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 having an input point coupling to a gate terminal of the N-type MOS transistor 296 and a node SC-4 and volatile an output point coupling to a gate terminal of the P-type MOS transistor 295. For the second type of pass/no-pass switch 292, its inverter 297 is configured to invert a data input at the input point thereof as a data output at the output point thereof. Thereby, the second type of pass/no-pass switch 292 is configured to control, in accordance with a data input at the node SC-4, coupling between an input point thereof at the node N21 and an output point thereof at the node N22 and data transmission from the input point thereof to the output point thereof.

For example, referring to FIG. 15B, when the second type of pass/no-pass switch 292 has the data input SC-4 at a logic level of "1" to enable the second type of pass/no-pass switch 292, the second type of pass/no-pass switch 292 may amplify a data input thereof at the node N21 as a data output thereof at the node N22 and pass data from the node N21 to the node N22. When the second type of pass/no-pass switch 292 has the data input SC-4 at a logic level of "0" to disable the second type of pass/no-pass switch 292, the second type of pass/no-pass switch 292 may cut off coupling between the nodes N21 and N22.

(3) Field Programmable Switch Cell for Third Type of Pass/No-Pass Switch

Figure 15C:
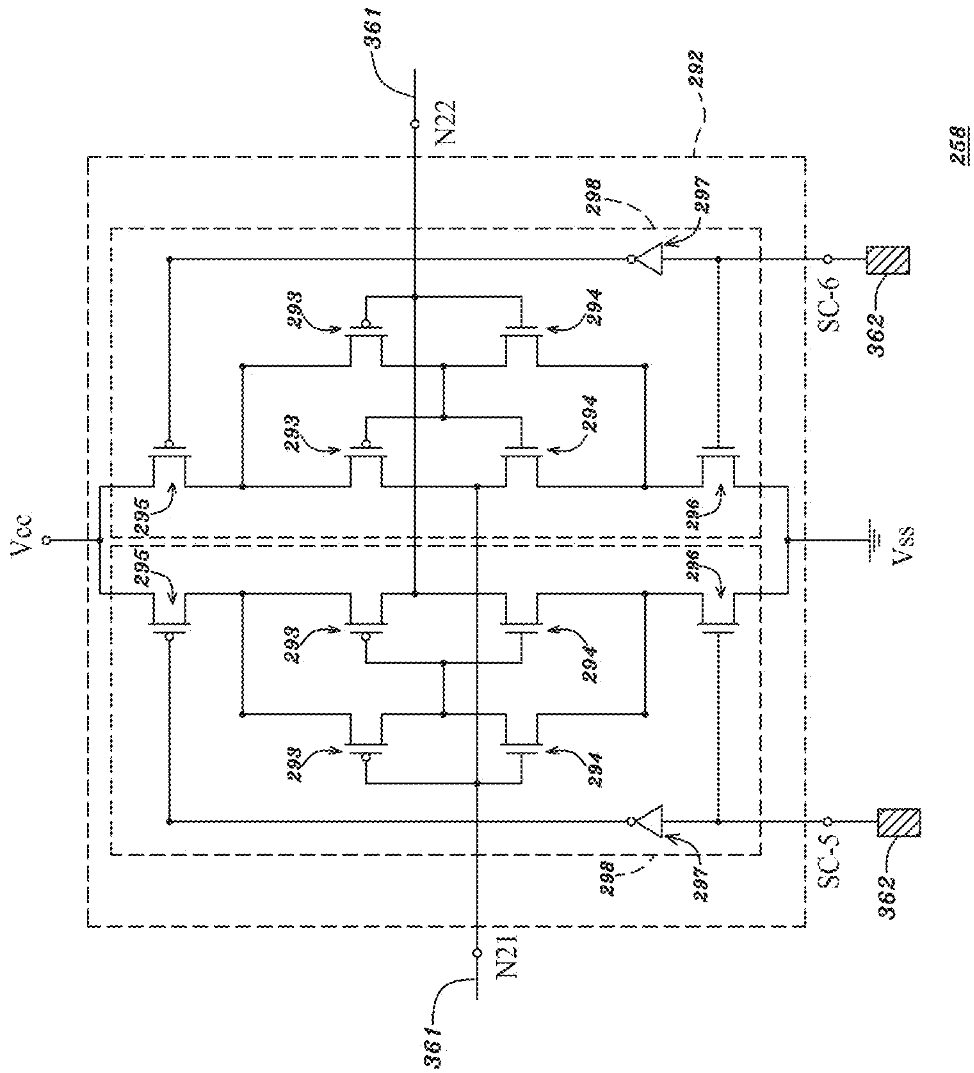

FIG. 15C is a circuit diagram illustrating a field programmable switch cells for a third type of pass/no-pass switch in accordance with an embodiment of the present application. Referring to FIG. 15C, a third type of pass/no-pass switch 292 may include a pair of multi-stage tri-state buffers 298, i.e., switch buffers, each have the same scheme as the second type of pass/no-pass switch 292 as illustrated in FIG. 15B. For an element indicated by the same reference number shown in FIGS. 15B and 15C, the specification of the element as seen in FIG. 15C may be referred to that of the element as illustrated in FIG. 15B. For the third type of pass/no-pass switch 292, a left one of its multi-stage tri-state buffers 298 may include the P-type and N-type MOS transistors 293 and 294 in the first stage having the gate terminals coupling to each other at a node N21. A right one of its multi-stage tri-state buffers 298 may include the P-type and N-type MOS transistors 293 and 294 in the second stage, i.e., output stage, having the drain terminals coupling to each other at the node N21. The right one of its multi-stage tri-state buffers 298 may include the P-type and N-type MOS transistors 293 and 294 in the first stage having the gate terminals coupling to each other at a node N22. The left one of its multi-stage tri-state buffers 298 may include the P-type and N-type MOS transistors 293 and 294 in the second stage, i.e., output stage, having the drain terminals coupling to each other at the node N22. The left one of its multi-stage tri-state buffers 298 may include the inverter 297 having the input point coupling to a node SC-5, and the right one of its multi-stage tri-state buffers 298 may include the inverter 297 having the input point coupling to a node SC-6. Thereby, the control P-type and N-type MOS transistors 295 and 296 of the left one of its multi-stage tri-state buffers 298 are configured to control, in accordance with a data input at the node SC-5, data transmission from the node N21 to the node N22. The control P-type and N-type MOS transistors 295 and 296 of the right one of its multi-stage tri-state buffers 298 are configured to control, in accordance with a data input at the node SC-6, data transmission from the node N22 to the node N21.

For example, referring to FIG. 15C, when the third type of pass/no-pass switch 292 has the data input SC-5 at a logic level of "1" to enable the left one of its multi-stage tri-state buffers 298 and the third type of pass/no-pass switch 292 has the data input SC-6 at a logic level of "0" to disable the right one of its multi-stage tri-state buffers 298, the third type of pass/no-pass switch 292 may amplify a data input thereof at the node N21 as a data output thereof at the node N22 and may not pass data from the node N22 to the node N21. When the third type of pass/no-pass switch 292 has the data input SC-5 at a logic level of "0" to disable the left one of its multi-stage tri-state buffers 298 and the third type of pass/no-pass switch 292 has the data input SC-6 at a logic level of "1" to enable the right one of its multi-stage tri-state buffers 298, the third type of pass/no-pass switch 292 may amplify a data input thereof at the node N22 as a data output thereof at the node N21 and may not pass data from the node N21 to the node N22. When the third type of pass/no-pass switch 292 has the data input SC-5 at a logic level of "0" to disable the left one of its multi-stage tri-state buffers 298 and the third type of pass/no-pass switch 292 has the data input SC-6 at a logic level of "0" to disable the right one of its multi-stage tri-state buffers 298, the third type of pass/no-pass switch 292 may neither pass data from the node N21 to the node N22 nor pass data from the node N22 to the node N21. When the third type of pass/no-pass switch 292 has the data input SC-5 at a logic level of "1" to enable the left one of its multi-stage tri-state buffers 298 and the third type of pass/no-pass switch 292 has the data input SC-6 at a logic level of "1" to enable the right one of its multi-stage tri-state buffers 298, the third type of pass/no-pass switch 292 may either amplify a data input thereof at the node N21 as a data output thereof at the node N22 or amplify a data input thereof at the node N22 as a data output thereof at the node N21.

Figure 16A:
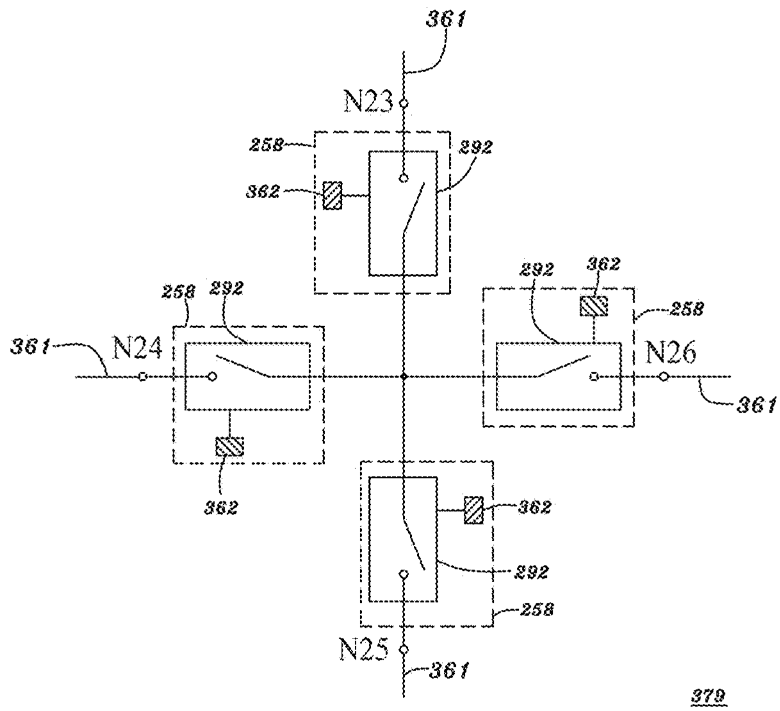
FIGS. 16A and 16B are circuit diagrams illustrating various field programmable switch cells for first and second types of cross-point switches in accordance with an embodiment of the present application.

Specification for Field Programmable Switch Cell for Cross-Point Switches (1) Field Programmable Switch Cell for First Type of Cross-Point Switch FIG. 16A is a circuit diagram illustrating a field programmable switch cells for a first type of cross-point switch composed of four pass/no-pass switches in accordance with an embodiment of the present application. Referring to FIG. 16A, four pass/no-pass switches 292, each of which may be one of the first and third types of pass/no-pass switches 292 as illustrated in FIGS. 15A and 15C respectively, may compose a first type of cross-point switch. For the first type of cross-point switch, four nodes N23-N26 at its top, left, bottom and right sides respectively are each configured to be switched to couple to another of the four nodes N23-N26 via two of its four pass/no-pass switches 292. The first type of cross-point switch may have a central node configured to couple to the four terminals N23-N26 via its four respective pass/no-pass switches 292. Each of its four pass/no-pass switches 292 may have a contact point at the node N21 as seen in FIGS. 15A and 15C coupling to one of the four nodes N23-N26 and another contact point at the node N22 coupling to its central node. For example, the first type of cross-point switch may be switched to pass data from the node N23 to the node N24 via top and left ones of its four pass/no-pass switches 292, to the node N25 via top and bottom ones of its four pass/no-pass switches 292 and/or to the node N26 via top and right ones of its four pass/no-pass switches 292.

(2) Field Programmable Switch Cell for Second Type of Cross-Point Switch

Figure 16B:
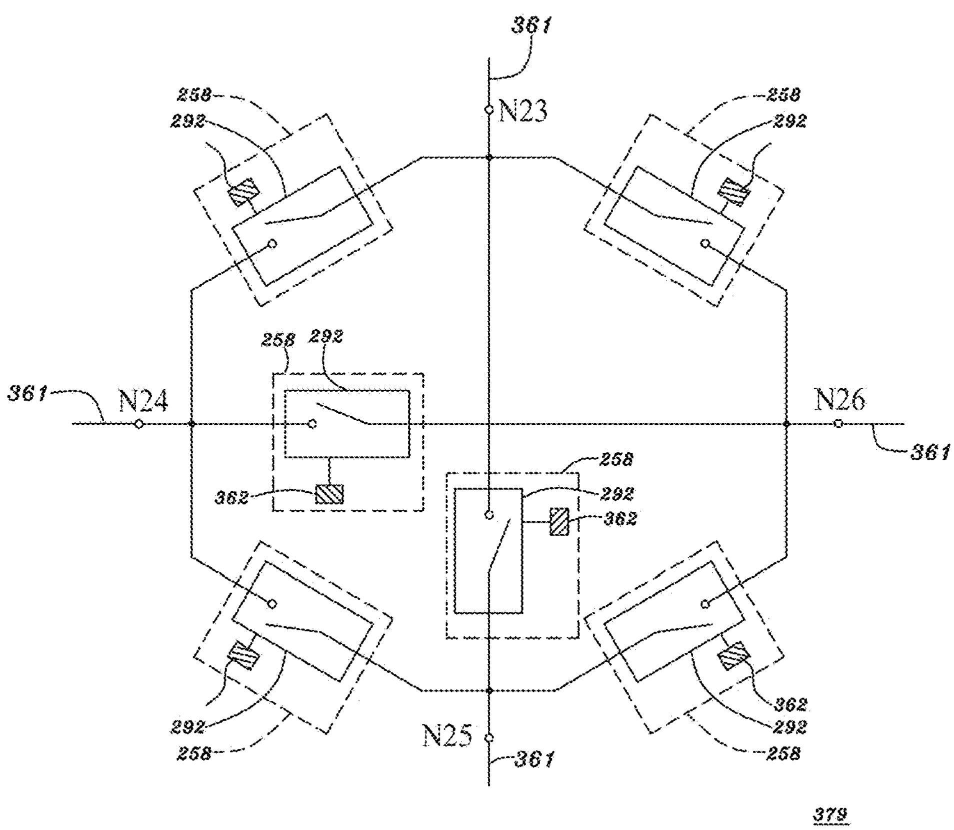

FIG. 16B is a circuit diagram illustrating a second type of cross-point switch composed of six pass/no-pass switches in accordance with an embodiment of the present application. Referring to FIG. 16B, six pass/no-pass switches 292, each of which may be one of the first and three types of pass/no-pass switches as illustrated in FIGS. 15A and 15C respectively, may compose a second type of cross-point switch. For the second type of cross-point switch, four nodes N23-N26 at its top, left, bottom and right sides respectively are each configured to be switched to couple to another one of the four nodes N23-N26 via one of its six pass/no-pass switches 292. Each of its six pass/no-pass switches 292 may have a contact point at the node N21 as seen in FIGS. 15A and 15C coupling to one of the four nodes N23-N26 and another contact point at the node N22 coupling to another of the four nodes N23-N26. For example, the second type of cross-point switch may be switched to pass data from the terminal N23 to the node N24 via a first one of its six pass/no-pass switches 292 between the nodes N23 and N24, to the node N25 via a second one of its six pass/no-pass switches 292 between the nodes N23 and N25 and/or to the node N26 via a third one of its six pass/no-pass switches 292 between the nodes N23 and N26.

Specification for Selection Circuit

Figure 17:
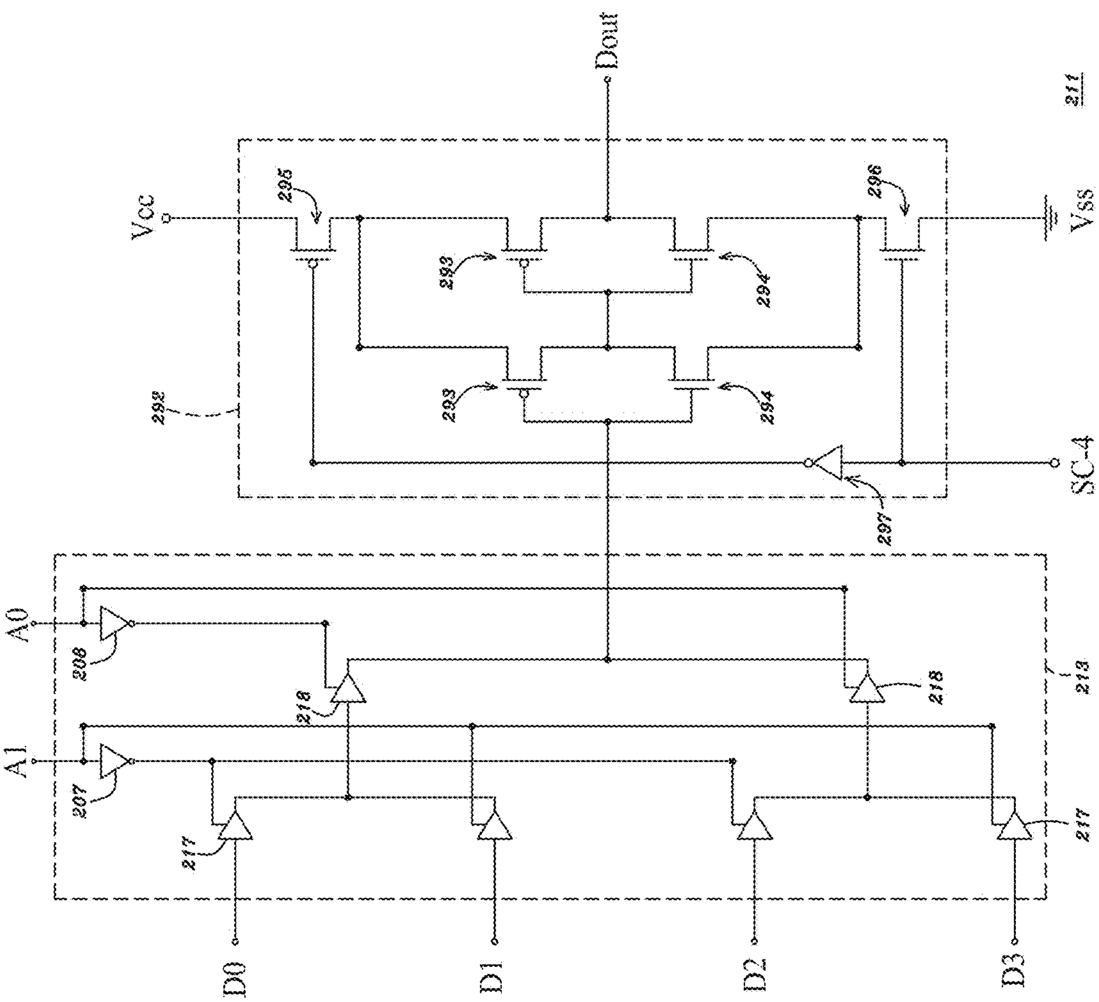
FIG. 17 is a circuit diagram illustrating a selection circuit in accordance with an embodiment of the present application.

FIG. 17 is a circuit diagram illustrating a selection circuit in accordance with an embodiment of the present application. Referring to FIG. 17, a selection circuit 211 may include a multiplexer 213 having a first set of two input points arranged in parallel for a first input data set, e.g., A0 and A1, and a second set of four input points arranged in parallel for a second input data set, e.g., D0, D1, D2 and D3. For the selection circuit 211, its multiplexer 213 may select, in accordance with the first input data set thereof, a data input, e.g., D0, D1, D2 or D3, from the second input data set thereof as a data output Dout thereof at an output point thereof.

Referring to FIG. 17, for the selection circuit 211, its multiplexer 213 may include multiple stages of switch buffers, e.g., two stages of switch buffers 217 and 218, coupling to each other or one another stage by stage. For more elaboration, its multiplexer 213 may include two pairs of two switch buffers 217 in the first stage, i.e., input stage, arranged in parallel, each switch buffer of which may have a first input point for a first data input thereof associated with the data input A1 of the first input data set of its multiplexer 213 and a second input point for a second data input thereof associated with a data input of the second input data set, e.g., D0, D1, D2 or D3, of its multiplexer 213. Said each switch buffer of the two pairs of two switch buffers 217 of its multiplexer 213 in the first stage may be switched on or off to pass or not to pass the second data input thereof from the second input point thereof to an output point thereof in accordance with the first data input thereof at the first input point thereof. Its multiplexer 213 may include an inverter 207 having an input point for the data input A1 of the first input data set of its multiplexer 213, wherein the inverter 207 is configured to invert the data input A1 of the first input data set of its multiplexer 213 as a data output thereof at an output point thereof. Each of the two pairs of two switch buffers 217 of its multiplexer 213 in the first stage may have a switch buffer to be switched on, in accordance with the first data input thereof at the first input point thereof coupling to one of the input and output points of the inverter 207 of its multiplexer 213, to pass the second data input thereof from the second input point thereof to the output point thereof as a data output of said each of the two pairs of two switch buffers 217 in the first stage and the other switch buffer to be switched off, in accordance with the first data input thereof at the first input point thereof coupling to the other of the input and output points of the inverter 207 of its multiplexer 213, not to pass the second data input thereof from the second input point thereof to the output point thereof. The respective two output points of each of the two pairs of two switch buffers 217 in the first stage may couple to each other. For example, a top one of a top pair of two switch buffers 217 of its multiplexer 213 in the first stage may have the first input point coupling to the output point of the inverter 207 of its multiplexer 213 and the second input point for the second data input thereof associated with the data input D0 of the second input data set of its multiplexer 213; a bottom one of the top pair of two switch buffers 217 of its multiplexer 213 in the first stage may have the first input point coupling to the input point of the inverter 207 of its multiplexer 213 and the second input point for the second data input thereof associated with the data input D1 of the second input data set of its multiplexer 213. The top one of the top pair of two switch buffers 217 in the first stage may be switched on in accordance with the first data input thereof at the first input point thereof to pass the second data input thereof from the second input point thereof to the output point thereof as a data output of the top pair of two switch buffers 217 in the first stage; the bottom one of the top pair of two switch buffers 217 in the first stage may be switched off in accordance with the first data input thereof at the first input point thereof not to pass the second data input thereof from the second input point thereof to the output point thereof. Thereby, each of the two pairs of two switch buffers 217 in the first stage may be switched in accordance with the respective two first data inputs thereof at the respective two first input points coupling to the input and output points of the inverter 207 respectively to pass one of the respective two second data inputs thereof from one of the respective two second input points thereof to one of the respective two output points thereof as a data output thereof coupling to a second input point of one of the switch buffers 218 in the second stage, i.e., output stage.

Referring to FIG. 17, for the selection circuit 211, its multiplexer 213 may include a pair of two switch buffers 218 in the second stage, i.e., output stage, arranged in parallel, each switch buffer of which may have a first input point for a first data input thereof associated with the data input A0 of the first input data set of its multiplexer 213 and a second input point for a second data input thereof associated with the data output of one of the two pairs of two switch buffers 217 of its multiplexer 213 in the first stage. Said each switch buffer of the pair of two switch buffers 218 in the second stage, i.e., output stage, may be switched on or off to pass or not to pass the second data input thereof from the second input point thereof to an output point thereof in accordance with the first data input thereof at the first input point thereof. Its multiplexer 213 may include an inverter 208 having an input point for the data input A0 of the first input data set of its multiplexer 213, wherein the inverter 208 is configured to invert the data input A0 of the first input data set of its multiplexer 213 as a data output thereof at an output point thereof. The pair of two switch buffers 218 in the second stage, i.e., output stage, may have a switch buffer to be switched on, in accordance with the first data input thereof at the first input point thereof coupling to one of the input and output points of the inverter 208 of its multiplexer 213, to pass the second data input thereof from the second input point thereof to the output point thereof as a data output of said pair of two switch buffers 218 in the second stage and the other switch buffer to be switched off, in accordance with the first data input thereof at the first input point thereof coupling to the other of the input and output points of the inverter 208 of its multiplexer 213, not to pass the second data input thereof from the second input point thereof to the output point thereof. The respective two output points of the pair of two switch buffers 218 in the second stage, i.e., output stage, may couple to each other. For example, atop one of the pair of two switch buffers 218 in the second stage, i.e., output stage, may have the first input point coupling to the output point of the inverter 208 of its multiplexer 213 and the second input point for the second data input thereof associated with the data output of the top one of the two pairs of two switch buffers 217 of its multiplexer 213 in the first stage; a bottom one of the pair of two switch buffers 218 in the second stage, i.e., output stage, may have the first input point coupling to the input point of the inverter 208 of its multiplexer 213 and the second input point for the second data input thereof associated with the data output of the bottom one of the two pairs of two switch buffers 217 of its multiplexer 213 in the first stage. The top one of the pair of two switch buffers 218 in the second stage, i.e., output stage, may be switched on in accordance with the first data input thereof at the first input point thereof to pass the second data input thereof from the second input point thereof to the output point thereof as a data output of the pair of two switch buffers 218 in the second stage; the bottom one of the pair of two switch buffers 218 in the second stage, i.e., output stage, may be switched off in accordance with the first data input thereof at the first input point thereof not to pass the second data input thereof from the second input point thereof to the output point thereof. Thereby, the pair of two switch buffers 218 in the second stage, i.e., output stage, may be switched in accordance with the respective two first data inputs thereof at the respective two first input points coupling to the input and output points of the inverter 208 respectively to pass one of the respective two second data inputs thereof from one of the respective two second input points thereof to one of the respective two output points thereof as a data output thereof.

Referring to FIG. 17, the selection circuit 211 may further include the second type of pass/no-pass switch or switch buffer 292, i.e., multi-stage tri-state buffer, as seen in FIG. 15B. For the selection circuit 211, its second type of pass/no-pass switch or switch buffer 292 may have an input point at the node N21 thereof coupling to the output point of the pair of two switch buffers 218 of its multiplexer 213 in the last stage, e.g., in the second stage or output stage in this case. For an element indicated by the same reference number shown in FIGS. 15B and 17, the specification of the element as seen in FIG. 17 may be referred to that of the element as illustrated in FIG. 15B. Accordingly, referring to FIG. 17, its second type of pass/no-pass switch 292 may control, in accordance with a first data input thereof at the node SC-4, coupling between the input point thereof at the node N21 for a second data input thereof associated with the data output of the pair of two switch buffers 218 of its multiplexer 213 and an output point thereof at the node N22 for a data output thereof and amplify the second data input thereof as the data output thereof to act as a data output Dout of the selection circuit 211.

Specification for Large I/O Circuits

Figure 18A:
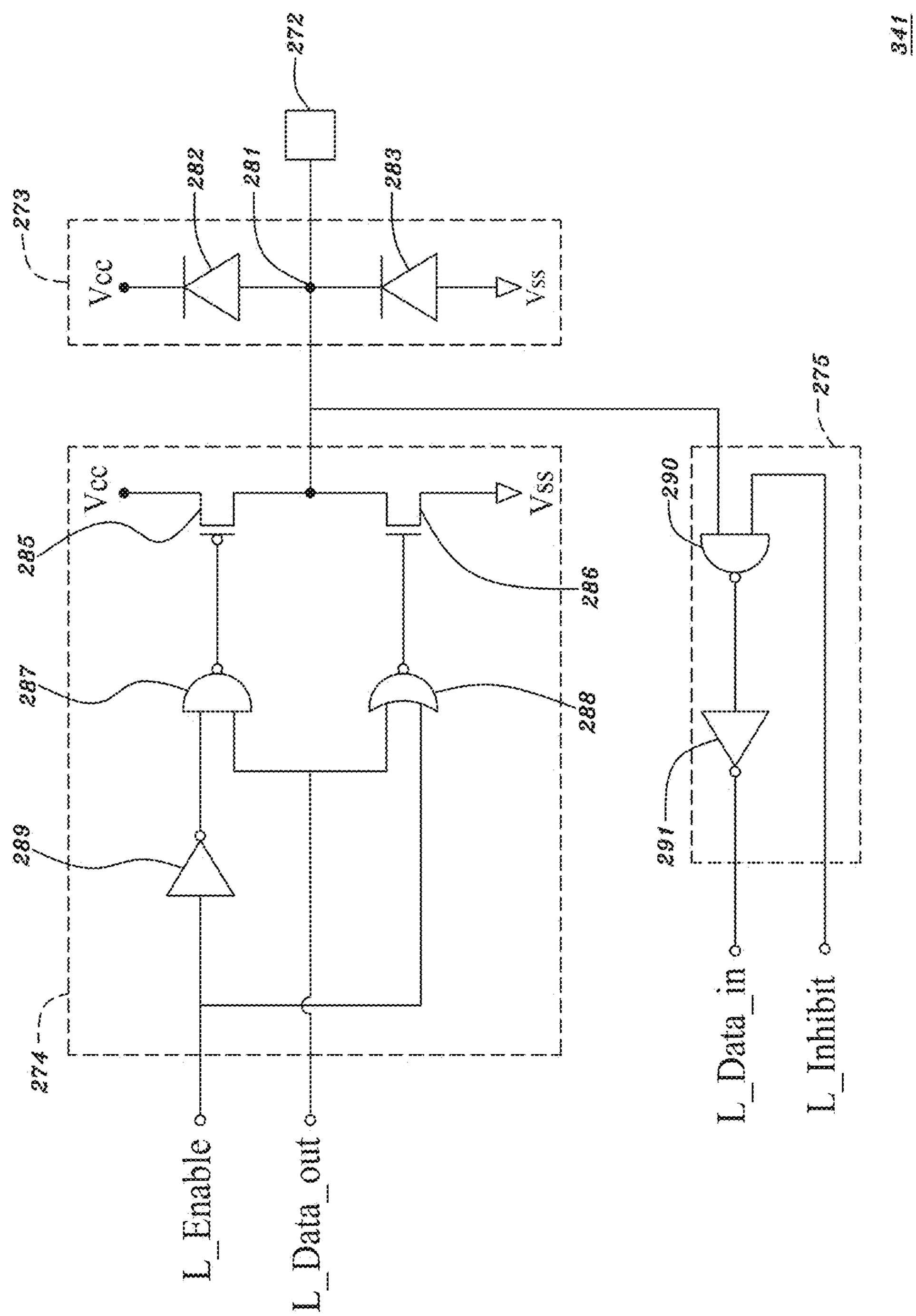
FIGS. 18A and 18B are circuit diagrams for large and small I/O circuits respectively in accordance with an embodiment of the present application.

FIG. 18A is a circuit diagram of a large I/O circuit in accordance with an embodiment of the present application. Referring to FIG. 18A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 18A, the large driver 274 may have a first input point for a first data input L_Enable for enabling the large driver 274 and a second input point for a second data input L_Data_out, and may be configured to amplify or drive the second data input L_Data_out as its data output at its output point at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output point at the node 281 and respective source terminals coupling to the voltage Vcc of power supply and to the voltage Vss of ground reference. The large driver 274 may have a NAND gate 287 having a data output at an output point of the NAND gate 287 coupling to a gate terminal of the P-type MOS transistor 285 and a NOR gate 288 having a data output at an output point of the NOR gate 288 coupling to a gate terminal of the N-type MOS transistor 286. The NAND gate 287 may have a first data input at its first input point associated with a data output of its inverter 289 at an output point of an inverter 289 of the large driver 274 and a second data input at its second input point associated with the second data input L_Data_out of the large driver 274 to perform a NAND operation on its first and second data inputs as its data output at its output point coupling to the gate terminal of its P-type MOS transistor 285. The NOR gate 288 may have a first data input at its first input point associated with the second data input L_Data_out of the large driver 274 and a second data input at its second input point associated with the first data input L_Enable of the large driver 274 to perform a NOR operation on its first and second data inputs as its data output at its output point coupling to the gate terminal of the N-type MOS transistor 286. The inverter 289 may be configured to invert its data input at its input point associated with the first data input L_Enable of the large driver 274 as its data output at its output point coupling to the first input point of the NAND gate 287.

Referring to FIG. 18A, when the large driver 274 has the first data input L_Enable at a logic level of "1", the data output of the NAND gate 287 is always at a logic level of "1" to turn off the P-type MOS transistor 285 and the data output of the NOR gate 288 is always at a logic level of "0" to turn off the N-type MOS transistor 286. Thereby, the large driver 274 may be disabled by its first data input L_Enable and the large driver 274 may not pass the second data input L_Data_out from its second input point to its output point at the node 281.

Referring to FIG. 18A, the large driver 274 may be enabled when the large driver 274 has the first data input L_Enable at a logic level of "0". Meanwhile, if the large driver 274 has the second data input L_Data_out at a logic level of "0", the data outputs of the NAND and NOR gates 287 and 288 are at a logic level of "1" to turn off the P-type MOS transistor 285 and on the N-type MOS transistor 286, and thereby the data output of the large driver 274 at the node 281 is at a logic level of "0" to be passed to said one of the I/O pads 272. If the large driver 274 has the second data input L_Data_out is at a logic level of "1", the data outputs of the NAND and NOR gates 287 and 288 are at a logic level of "0" to turn on the P-type MOS transistor 285 and off the N-type MOS transistor 286, and thereby the data output of the large driver 274 at the node 281 is at a logic level of "1" to be passed to said one of the I/O pads 272. Accordingly, the large driver 274 may be enabled by its first data input L_Enable to amplify or drive its second data input L_Data_out at its second input point as its data output at its output point at the node 281 to be transmitted to circuits outside the semiconductor chip through said one of the I/O pads 272.

Referring to FIG. 18A, the large receiver 275 may have a first data input L_Inhibit at its first input point and a second data input at its second input point coupling to said one of the I/O pads 272 to be amplified or driven by the large receiver 275 as its data output L_Data_in. The large receiver 275 may be inhibited by its first data input L_Inhibit from generating its data output L_Data_in associated with its second data input. The large receiver 275 may include a NAND gate 290 and an inverter 291 having a data input at an input point of the inverter 291 associated with a data output of the NAND gate 290. The NAND gate 290 has a first input point for its first data input associated with the second data input of the large receiver 275 and a second input point for its second data input associated with the first data input L_Inhibit of the large receiver 275 to perform a NAND operation on its first and second data inputs as its data output at its output point coupling to the input point of its inverter 291. The inverter 291 may be configured to invert its data input associated with the data output of the NAND gate 290 as its data output at its output point acting as the data output L_Data_in of the large receiver 275 at an output point of the large receiver 275.

Referring to FIG. 18A, when the large receiver 275 has the first data input L_Inhibit at a logic level of "0", the data output of the NAND gate 290 is always at a logic level of "1" and the data output L_Data_in of the large receiver 275 is always at a logic level of "0". Thereby, the large receiver 275 is inhibited from generating its data output L_Data_in associated with its second data input at the node 281.

Referring to FIG. 18A, the large receiver 275 may be activated when the large receiver 275 has the first data input L_Inhibit at a logic level of "1". Meanwhile, if the large receiver 275 has the second data input at a logic level of "1" from circuits outside the semiconductor chip through said one of the I/O pads 272, the NAND gate 290 has its data output at a logic level of "0", and thereby the large receiver 275 may have its data output L_Data_in at a logic level of "1". If the large receiver 275 has the second data input at a logic level of "0" from circuits outside the semiconductor chip through said one of the I/O pads 272, the NAND gate 290 has its data output at a logic level of "1", and thereby the large receiver 275 may have its data output L_Data_in at a logic level of "0". Accordingly, the large receiver 275 may be activated by its first data input L_Inhibit signal to amplify or drive its second data input from circuits outside the semiconductor chip through said one of the I/O pads 272 as its data output L_Data_in.

Referring to FIG. 18A, the large I/O circuit 341 may have an I/O power efficiency greater than 3, 5 or 10 pico-Joules per bit, per switch or per voltage swing. The large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The output capacitance of the large driver 274 can be used as driving capability of the large driver 274, which is the maximum loading at the output point of the large driver 274, measured from said one of the I/O pads 272 to loading circuits external of said one of the I/O pads 272. The size of the large ESD protection circuit or device 273 may be between 0.1 pF and 3 pF or between 0.1 pF and 1 pF, or larger than 0.1 pF. Said one of the I/O pads 272 may have an input capacitance, provided by the large ESD protection circuit or device 273 and large receiver 275 for example, between 0.15 pF and 4 pF or between 0.15 pF and 2 pF, or greater than 0.15 pF. The input capacitance is measured from said one of the I/O pads 272 to circuits internal of said one of the I/O pads 272.

Specification for Small I/O Circuits

Figure 18B:
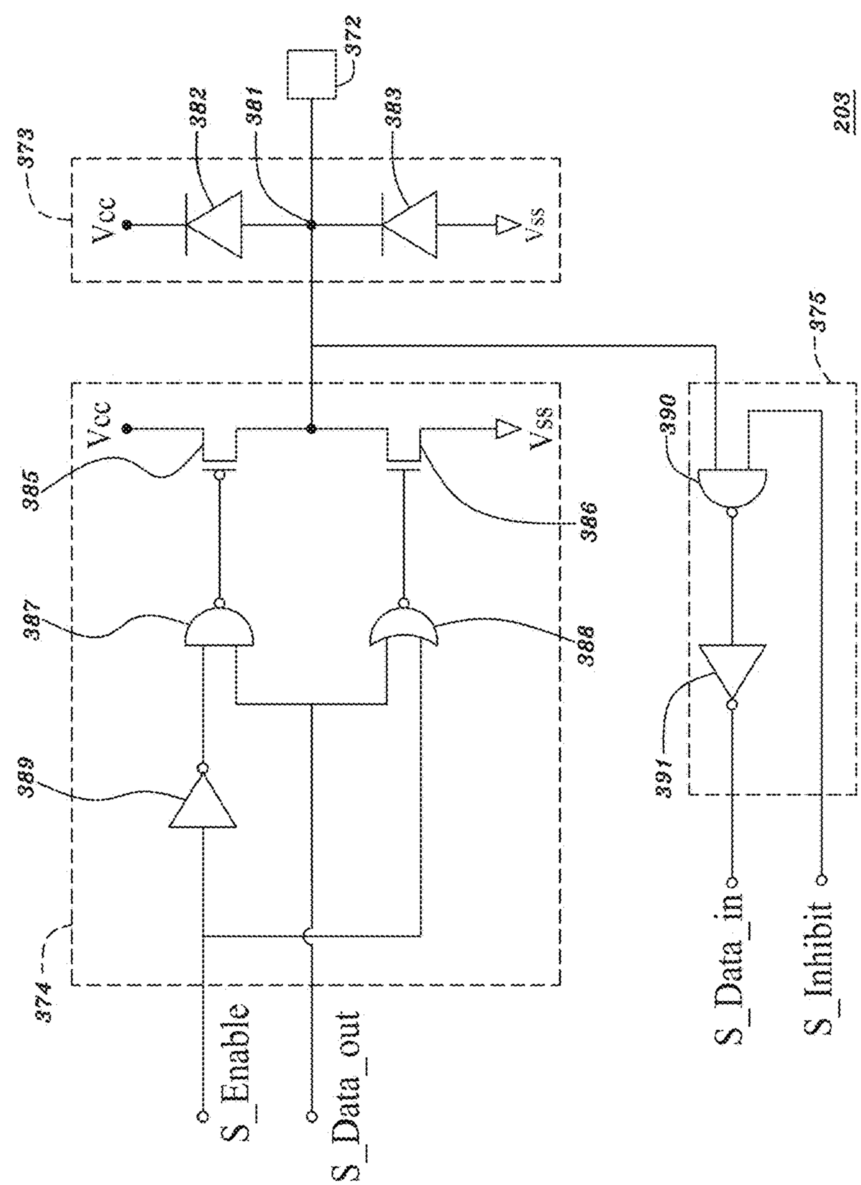

FIG. 18B is a circuit diagram of a small I/O circuit in accordance with an embodiment of the present application. Referring to FIG. 18B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 18B, the small driver 374 may have a first input point for a first data input S_Enable for enabling the small driver 374 and a second input point for a second data input S_Data_out, and may be configured to amplify or drive the second data input S_Data_out as its data output at its output point at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output point at the node 381 and respective source terminals coupling to the voltage Vcc of power supply and to the voltage Vss of ground reference. The small driver 374 may have a NAND gate 387 having a data output at an output point of the NAND gate 387 coupling to a gate terminal of the P-type MOS transistor 385 and a NOR gate 388 having a data output at an output point of the NOR gate 388 coupling to a gate terminal of the N-type MOS transistor 386. The NAND gate 387 may have a first data input at its first input point associated with a data output of its inverter 389 at an output point of an inverter 389 of the small driver 374 and a second data input at its second input point associated with the second data input S_Data_out of the small driver 374 to perform a NAND operation on its first and second data inputs as its data output at its output point coupling to the gate terminal of its P-type MOS transistor 385. The NOR gate 388 may have a first data input at its first input point associated with the second data input S_Data_out of the small driver 374 and a second data input at its second input point associated with the first data input S_Enable of the small driver 374 to perform a NOR operation on its first and second data inputs as its data output at its output point coupling to the gate terminal of the N-type MOS transistor 386. The inverter 389 may be configured to invert its data input at its input point associated with the first data input S_Enable of the small driver 374 as its data output at its output point coupling to the first input point of the NAND gate 387.

Referring to FIG. 18B, when the small driver 374 has the first data input S_Enable at a logic level of "1", the data output of the NAND gate 387 is always at a logic level of "1" to turn off the P-type MOS transistor 385 and the data output of the NOR gate 388 is always at a logic level of "0" to turn off the N-type MOS transistor 386. Thereby, the small driver 374 may be disabled by its first data input S_Enable and the small driver 374 may not pass the second data input S_Data_out from its second input point to its output point at the node 381.

Referring to FIG. 18B, the small driver 374 may be enabled when the small driver 374 has the first data input S_Enable at a logic level of "0". Meanwhile, if the small driver 374 has the second data input S_Data_out at a logic level of "0", the data outputs of the NAND and NOR gates 387 and 388 are at a logic level of "1" to turn off the P-type MOS transistor 385 and on the N-type MOS transistor 386, and thereby the data output of the small driver 374 at the node 381 is at a logic level of "0" to be passed to said one of the I/O pads 372. If the small driver 374 has the second data input S_Data_out at a logic level of "1", the data outputs of the NAND and NOR gates 387 and 388 are at a logic level of "0" to turn on the P-type MOS transistor 385 and off the N-type MOS transistor 386, and thereby the data output of the small driver 374 at the node 381 is at a logic level of "1" to be passed to said one of the I/O pads 372. Accordingly, the small driver 374 may be enabled by its first data input S_Enable to amplify or drive its second data input S_Data_out at its second input point as its data output at its output point at the node 381 to be transmitted to circuits outside the semiconductor chip through said one of the I/O pads 372.

Referring to FIG. 18B, the small receiver 375 may have a first data input S_Inhibit at its first input point and a second data input at its second input point coupling to said one of the I/O pads 372 to be amplified or driven by the small receiver 375 as its data output S_Data_in. The small receiver 375 may be inhibited by its first data input S_Inhibit from generating its data output S_Data_in associated with its second data input. The small receiver 375 may include a NAND gate 390 and an inverter 391 having a data input at an input point of the inverter 391 associated with a data output of the NAND gate 390. The NAND gate 390 has a first input point for its first data input associated with the second data input of the large receiver 275 and a second input point for its second data input associated with the first data input S_Inhibit of the small receiver 375 to perform a NAND operation on its first and second data inputs as its data output at its output point coupling to the input point of its inverter 391. The inverter 391 may be configured to invert its data input associated with the data output of the NAND gate 390 as its data output at its output point acting as the data output S_Data_in of the small receiver 375 at an output point of the small receiver 375.

Referring to FIG. 18B, when the small receiver 375 has the first data input S_Inhibit at a logic level of "0", the data output of the NAND gate 390 is always at a logic level of "1" and the data output S_Data_in of the small receiver 375 is always at a logic level of "0". Thereby, the small receiver 375 is inhibited from generating its data output S_Data_in associated with its second data input at the node 381.

Referring to FIG. 18B, the small receiver 375 may be activated when the small receiver 375 has the first data input S_Inhibit at a logic level of "1". Meanwhile, if the small receiver 375 has the second data input at a logic level of "1" from circuits outside the semiconductor chip through said one of the I/O pads 372, the NAND gate 390 has its data output at a logic level of "0", and thereby the small receiver 375 may have its data output S_Data_in at a logic level of "1". If the small receiver 375 has the second data input at a logic level of "0" from circuits outside the semiconductor chip through said one of the I/O pads 372, the NAND gate 390 has its data output at a logic level of "1", and thereby the small receiver 375 may have its data output S_Data_in at a logic level of "0". Accordingly, the small receiver 375 may be activated by its first data input S_Inhibit to amplify or drive its second data input from circuits outside the semiconductor chip through said one of the I/O pads 372 as its data output S_Data_in.

Referring to FIG. 18B, the small I/O circuit 203 may have an I/O power efficiency smaller than 0.5 pico-Joules per bit, per switch or per voltage swing, or between 0.01 and 0.5 pico-Joules per bit, per switch or per voltage swing. The small driver 374 may have an output capacitance or driving capability or loading, for example, between 0.05 pF and 2 pF or between 0.05 pF and 1 pF, or smaller than 2 pF or 1 pF. The output capacitance of the small driver 374 can be used as driving capability of the small driver 374, which is the maximum loading at the output point of the small driver 374, measured from said one of the I/O pads 372 to loading circuits external of said one of the I/O pads 372. The size of the small ESD protection circuit or device 373 maybe between 0.01 pF and 0.1 pF or smaller than 0.1 pF. In some cases, no small ESD protection circuit or device 373 is provided in the small I/O circuit 203. In some cases, the small driver 374 or receiver 375 of the small I/O circuit 203 in FIG. 18B may be designed just like an internal driver or receiver, having no small ESD protection circuit or device 373 and having the same input and output capacitances as the internal driver or receiver. Said one of the I/O pads 372 may have an input capacitance, provided by the small ESD protection circuit or device 373 and small receiver 375 for example, between 0.15 pF and 4 pF or between 0.15 pF and 2 pF, or greater than 0.15 pF. The input capacitance is measured from said one of the I/O pads 372 to loading circuits internal of said one of the I/O pads 372.

Specification for Programmable Logic Blocks

Figure 19:
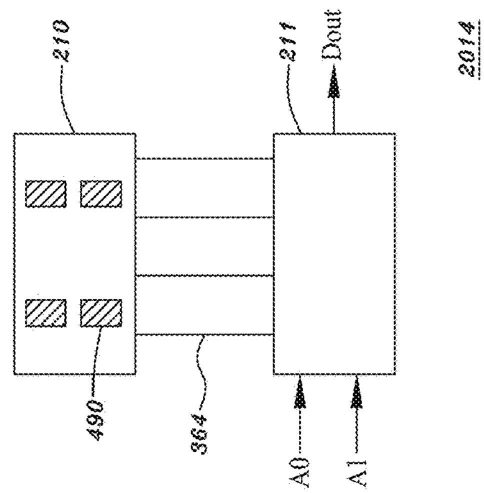
FIG. 19 is a schematic view showing a block diagram of a programmable logic cell or element in accordance with an embodiment of the present application.

FIG. 19 is a schematic view showing a block diagram of a programmable logic cell or element in accordance with an embodiment of the present application. Referring to FIG. 19, a programmable logic block (LB) or element may include one or a plurality of field programmable logic cells or elements (LCE) 2014 each configured to perform logic operation on its input data set at its input points. Each of the field programmable logic cells or elements (LCE) 2014, i.e., configurable logic cells, may include a logic gate or circuit therein composed of (1) multiple memory cells 490, i.e., configuration-programming-memory (CPM) cells, each configured to save or store one of resulting values of a look-up table (LUT) 210 or a programming code and (2) the selection circuit 211 as illustrated in FIG. 17 coupling to its memory cells 490 and configured to receive the resulting values of a look-up table (LUT) 210 and programming code all saved or stored in its memory cells 490. For the logic gate or circuit of each of the field programmable logic cells or elements (LCE) 2014, its selection circuit 211 may include the multiplexer 213 having the first set of two input points arranged in parallel for a first input data set, e.g., A0 and A1 as illustrated in FIG. 17, and the second set of four input points arranged in parallel for a second input data set, e.g., D0, D1, D2 and D3 as illustrated in FIG. 17, each associated with one of the resulting values or programming codes of the look-up table (LUT) 210 saved or stored in its memory cells 490. The multiplexer 213 of its selection circuit 211 is configured to select, in accordance with the first input data set thereof associated with the input data set of said each of the field programmable logic cells or elements (LCE) 2014, a data input from the second input data set thereof, e.g., D0, D1, D2 and D3 as illustrated in FIG. 17, as the data output thereof. Its selection circuit 211 may include the second type of pass/no-pass switch 292 as illustrated in FIG. 17 configured to control, in accordance with the first data input thereof associated with the programming code saved or stored in its memory cells 490, coupling between the input point thereof for the second data input thereof associated with the data output of the multiplexer 213 of its selection circuit 211 and the output point thereof for the data output thereof and to amplify the second data input thereof as the data output thereof to act as a data output Dout of said each of the field programmable logic cells or elements (LCE) 2014.

Referring to FIG. 19, for the logic gate or circuit of each of the field programmable logic cells or elements (LCE) 2014, each of its memory cells 490, i.e., configuration-programming-memory (CPM) cells, may have two types, i.e., first and second types, mentioned as below. Each of its first type of memory cells 490 may be referred to the memory cell 398 as illustrated in FIG. 1A or 1B, configured to save or store one of the resulting values of the look-up table (LUT) 210. Alternatively, each of its second type of memory cells 490 may be any of the ninth, tenth, eleventh, twelfth, thirteenth and fourteenth types of non-volatile memory cells 980, 985, 986, 955, 956 and 958 as illustrated in FIGS. 13A-13C and 14B-14D respectively, configured to save or store one of the resulting values of the look-up table (LUT) 210. The multiplexer 213 of its selection circuit 211 may have the second input data set, e.g., D0, D1, D2 and D3 as illustrated in FIG. 17, each associated with (1) a data output, i.e., configuration-programming-memory (CPM) data, of one of the first type of memory cells 490, e.g., one of the first and second data outputs Out1 and Out2 of the memory cell 398 as illustrated in FIG. 1A or 1B, or (2) a data output, i.e., configuration-programming-memory (CPM) data, of one of the second type of memory cells 490, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986. Furthermore, the second type of pass/no-pass switch 292 of its selection circuit 211 may have a data input at the node SC-4 as illustrated in FIGS. 15B and 17 associated with (1) a data output, i.e., configuration-programming-memory (CPM) data, of another of the first type of memory cells 490, e.g., one of the first and second data outputs Out1 and Out2 of the memory cell 398 as illustrated in FIG. 1A or 1B, or (2) a data output, i.e., configuration-programming-memory (CPM) data, of another of the second type of memory cells 490, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986.

Referring to FIG. 19, the logic gate or circuit of each of the field programmable logic cells or elements (LCE) 2014 may have the memory cells 490, i.e., configuration-programming-memory (CPM) cells, configured to be programed to store or save the resulting values or programing codes of the look-up table (LUT) 210 to perform the logic operation, such as AND operation, NAND operation, OR operation, NOR operation, EXOR operation or other Boolean operation, or an operation combining two or more of the above operations. For example, the logic gate or circuit of one of the field programmable logic cells or elements (LCE) 2014 may have the memory cells 490, i.e., configuration-programming-memory (CPM) cells, configured to be programed to store or save the resulting values or programing codes of the look-up table (LUT) 210 to perform the same logic operation as a basic logic operator, e.g., NAND operator or gate, as shown in FIG. 20A performs. For this case, the logic gate or circuit of said one of the field programmable logic cells or elements (LCE) 2014 may perform NAND operation on its input data set, e.g., A0 and A1, at its input points as a data output Dout at its output point. FIG. 20B shows a truth table for a NAND operator. Referring to FIGS. 19, 20A and 20B, said one of the field programmable logic cells or elements (LCE) 2014 may carry out logic functions based on the truth table.

Alternatively, the logic gate or circuit of each of the field programmable logic cells or elements (LCE) 2014 may have the memory cells 490, i.e., configuration-programming-memory (CPM) cells, configured to be programed to store or save the resulting values or programing codes of the look-up table (LUT) 210 to perform the same logic operation as a logic operator as shown in FIG. 20C performs. FIG. 20D shows a truth table for a logic operator as seen in FIG. 20C. Referring to FIGS. 19, 20C and 20D, the logic gate or circuit of said each of the field programmable logic cells or elements (LCE) 2014 may include the number $2^n$ of the memory cells 490, i.e., configuration-programming-memory (CPM) cells, each configured to save or store one of resulting values of the look-up table (LUT) 210 and the selection circuit 211 provided with the multiplexer 213 having the first set of the number n of input points arranged in parallel for the first input data set, e.g., A0-A3 as illustrated in FIG. 20C, and the second set of the number $2^n$ of input points arranged in parallel for the second input data set, e.g., D0-D15 as illustrated in FIG. 20D, each associated with one of the resulting values or programming codes of the look-up table (LUT) 210 stored in the number $2^n$ of its memory cells 490, wherein the number n is equal to 4 for this case. The multiplexer 213 of its selection circuit 211 is configured to select, in accordance with the first input data set thereof associated with the input data set of said each of the field programmable logic cells or elements (LCE) 2014, a data input from the second input data set, e.g., D0-D15 as illustrated in FIG. 20D, as the data output thereof at the output point thereof to act as a data output Dout of said each of the field programmable logic cells or elements (LCE) 2014 at an output point of said each of the field programmable logic cells or elements (LCE) 2014.

Figure 20E:
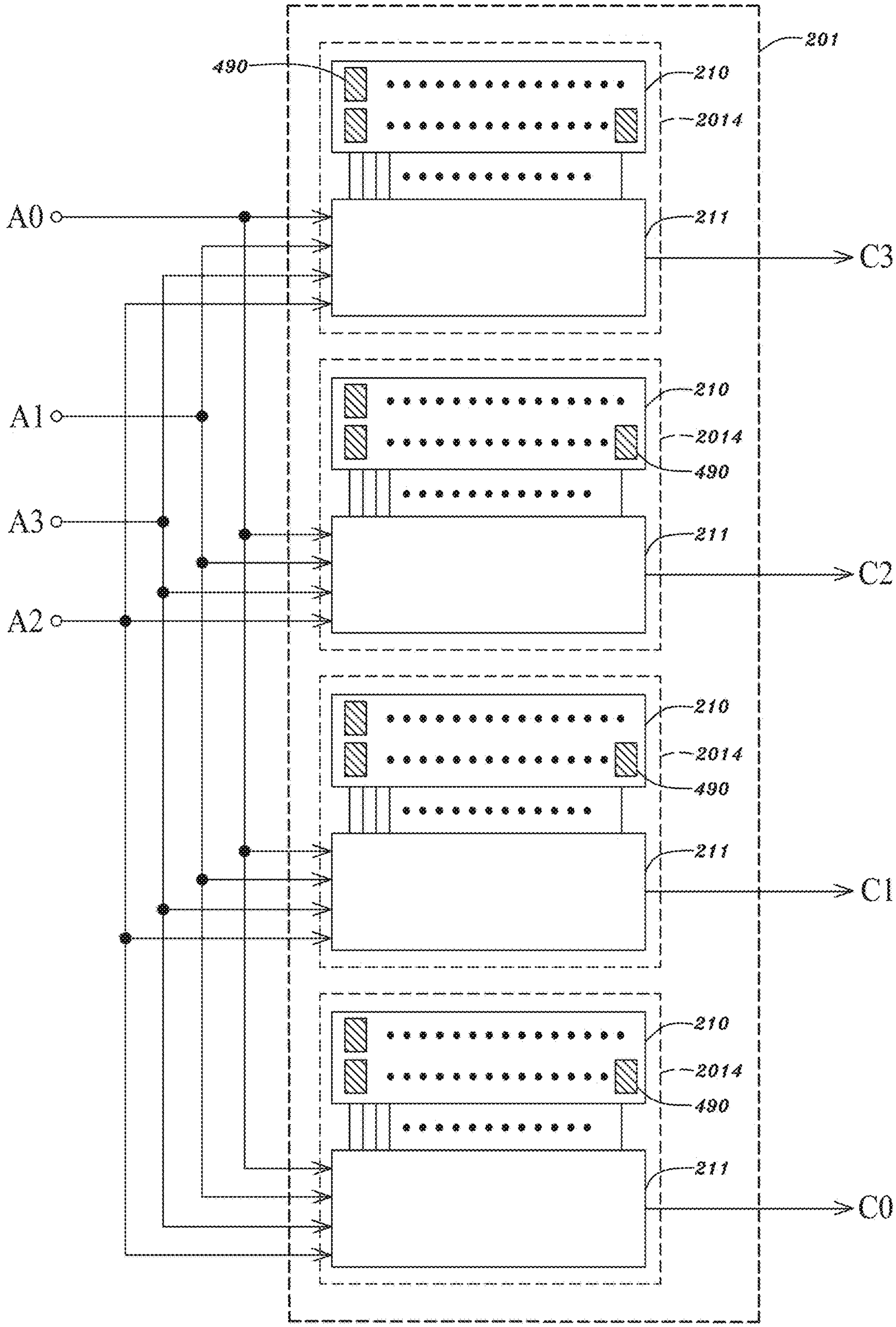
FIG. 20E is a block diagram illustrating a computation operator in accordance with an embodiment of the present application.
Figures 20F, 20G:
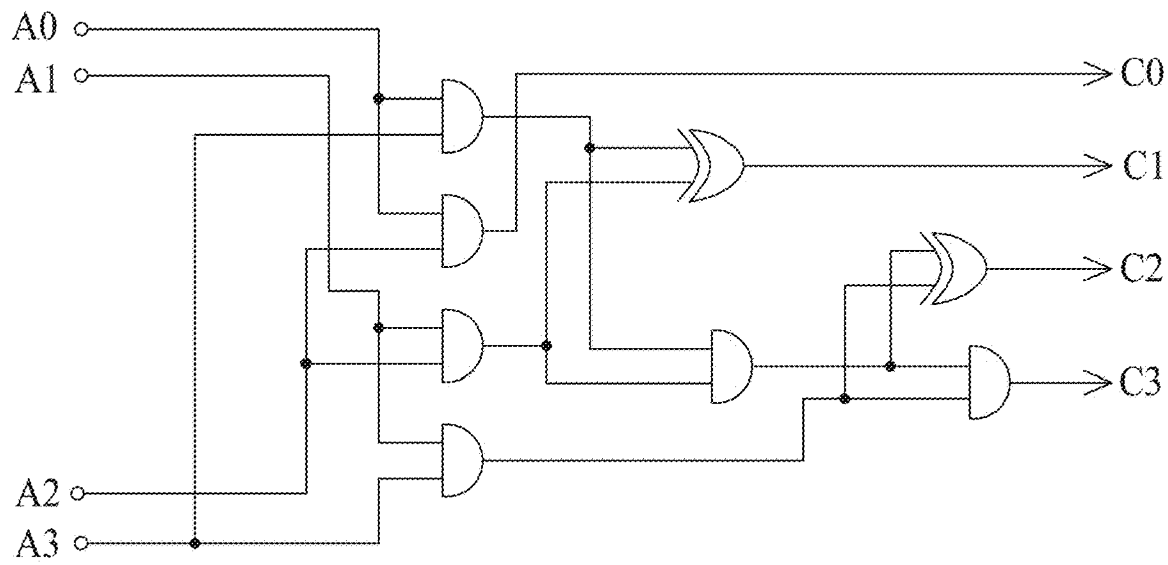
FIG. 20F shows a truth table for a logic operator as seen in FIG. 20E.
FIG. 20G is a circuit diagram of a computation operator in accordance with an embodiment of the present application.

Alternatively, a plurality of field programmable logic cells or elements (LCE) 2014 may provide a plurality of logic gate or circuits, each of which may be referred to one as illustrated in FIG. 19, configured to be programed to be integrated into the programmable logic block (LB) or element 201 acting as a computation operator to perform computation operation, such as addition, subtraction, multiplication or division operation. The computation operator may be an adder, a multiplier, a multiplexer, a shift register, floating-point circuits and/or division circuits. FIG. 20E is a block diagram illustrating a computation operator in accordance with an embodiment of the present application. For example, the computation operator as seen in FIG. 20E may be configured to multiply two two-binary-digit data inputs, i.e., [A1, A0] and [A3, A2], into a four-binary-digit output data set, i.e., [C3, C2, C1, C0], as seen in FIG. 20F. FIG. 20F shows a truth table for a logic operator as seen in FIG. 20E.

Referring to FIGS. 19, 20E and 20F, four field programmable logic cells or elements (LCE) 2014 may have four logic circuits, each of which may be referred to one as illustrated in FIGS. 19 and 20A-20D, configured to be programmed to be integrated into the computation operator. The logic gate or circuit of each of the four field programmable logic cells or elements (LCE) 2014 may have the input data set at the four input points thereof associated with an input data set [A1, A0, A3, A2] of the computation operator respectively. The logic gate or circuit of each of the field programmable logic cells or elements (LCE) 2014 of the computation operator may generate a data output, e.g., C0, C1, C2 or C3, of the four-binary-digit data output of the computation operator based on its input data set [A1, A0, A3, A2]. In the multiplication of the two-binary-digit number, i.e., [A1, A0], by the two-binary-digit number, i.e., [A3, A2], the four programmable logic block 201 may generate its four-binary-digit output data set, i.e., [C3, C2, C1, C0], based on its input data set [A1, A0, A3, A2]. The logic gate or circuit of each of the four field programmable logic cells or elements (LCE) 2014 may have the memory cells 490 to be programed to save or store resulting values or programming codes of its look-up table 210, e.g., Table-0, Table-1, Table-2 or Table-3.

For example, referring to FIGS. 19 and 20E and 20F, the logic gate or circuit of a first one of the four field programmable logic cells or elements (LCE) 2014 may have the memory cells 490, i.e., configuration-programming-memory (CPM) cells, configured to save or store the resulting values or programming codes of its look-up table (LUT) 210 of Table-0 and the selection circuit 211 having the multiplexer 213 configured to select, in accordance with the first input data set thereof associated with the input data set [A1, A0, A3, A2] of the computation operator, a data input from the second input data set D0-D15 thereof, each associated with the data output of one of its memory cells 490, i.e., one of the resulting values or programming codes of its look-up table (LUT) 210 of Table-0, as the data output thereof to act as a binary-digit data output C0 of the four-binary-digit output data set, i.e., [C3, C2, C1, C0], of the programmable logic block 201. The logic gate or circuit of a second one of the four field programmable logic cells or elements (LCE) 2014 may have the memory cells 490, i.e., configuration-programming-memory (CPM) cells, configured to save or store the resulting values or programming codes of its look-up table (LUT) 210 of Table-1 and the selection circuit 211 having the multiplexer 213 configured to select, in accordance with the first input data set thereof associated with the input data set [A1, A0, A3, A2] of the computation operator, a data input from the second input data set D0-D15 thereof, each associated with the data output of one of its memory cells 490, i.e., one of the resulting values or programming codes of its look-up table (LUT) 210 of Table-1, as the data output thereof to act as a binary-digit data output C1 of the four-binary-digit output data set, i.e., [C3, C2, C1, C0], of the programmable logic block 201. The logic gate or circuit of a third one of the four field programmable logic cells or elements (LCE) 2014 may have the memory cells 490, i.e., configuration-programming-memory (CPM) cells, configured to save or store the resulting values or programming codes of its look-up table (LUT) 210 of Table-2 and the selection circuit 211 having the multiplexer 213 configured to select, in accordance with the first input data set thereof associated with the input data set [A1, A0, A3, A2] of the computation operator, a data input from the second input data set D0-D15 thereof, each associated with the data output of one of its memory cells 490, i.e., one of the resulting values or programming codes of its look-up table (LUT) 210 of Table-2, as the data output thereof to act as a binary-digit data output C2 of the four-binary-digit output data set, i.e., [C3, C2, C1, C0], of the programmable logic block 201. The logic gate or circuit of a fourth one of the four field programmable logic cells or elements (LCE) 2014 may have the memory cells 490, i.e., configuration-programming-memory (CPM) cells, configured to save or store the resulting values or programming codes of its look-up table (LUT) 210 of Table-3 and the selection circuit 211 having the multiplexer 213 configured to select, in accordance with the first input data set thereof associated with the input data set [A1, A0, A3, A2] of the computation operator, a data input from the second input data set D0-D15 thereof, each associated with the data output of one of its memory cells 490, i.e., one of the resulting values or programming codes of its look-up table (LUT) 210 of Table-3, as the data output thereof to act as a binary-digit data output C3 of the four-binary-digit output data set, i.e., [C3, C2, C1, C0], of the programmable logic block 201.

Thereby, referring to FIGS. 19 and 20E and 20F, the programmable logic block 201 acting as the computation operator may be composed of the four field programmable logic cells or elements (LCE) 2014 to generate its four-binary-digit output data set, i.e., [C3, C2, C1, C0], based on its input data set [A1, A0, A3, A2].

Referring to FIGS. 19 and 20E and 20F, in a particular case for multiplication of 3 by 3, the logic gate or circuit of each of the four field programmable logic cells or elements (LCE) 2014 may have the selection circuit 211 having the multiplexer 213 configured to select, in accordance with the first input data set thereof associated with the input data set, i.e., [A1, A0, A3, A2]=[1, 1, 1, 1], of the computation operator, a data input from the second input data set D0-D15 thereof, each associated with one of the resulting values or programming codes of its look-up table (LUT) 210, i.e., one of Table-0, Table-1, Table-2 and Table-3, as the data output thereof to act as a binary-digit data output, i.e., one of C0, C1, C2 and C3, of the four-binary-digit output data set, i.e., [C3, C2, C1, C0]=[1, 0, 0, 1], of the programmable logic block 201. The logic gate or circuit of the first one of the four field programmable logic cells or elements (LCE) 2014 may generate its data output C0 at a logic level of "1" based on its input data set, i.e., [A1, A0, A3, A2]=[1, 1, 1, 1]; the logic gate or circuit of the second one of the four field programmable logic cells or elements (LCE) 2014 may generate its data output C1 at a logic level of "0" based on its input data set, i.e., [A1, A0, A3, A2]=[1, 1, 1, 1]; the logic gate or circuit of the third one of the four field programmable logic cells or elements (LCE) 2014 may generate its data output C2 at a logic level of "0" based on its input data set, i.e., [A1, A0, A3, A2]=[1, 1, 1, 1]; the logic gate or circuit of the fourth one of the four field programmable logic cells or elements (LCE) 2014 may generate its data output C3 at a logic level of "1" based on its input data set, i.e., [A1, A0, A3, A2]=[1, 1, 1, 1].

Referring to FIGS. 19, 20E and 20F, the programmable logic block (LB) 201 may be configured to be programed to perform the same computation operation as a computation operator, i.e., multiplier, as shown in FIG. 20G performs.

Figure 20H:
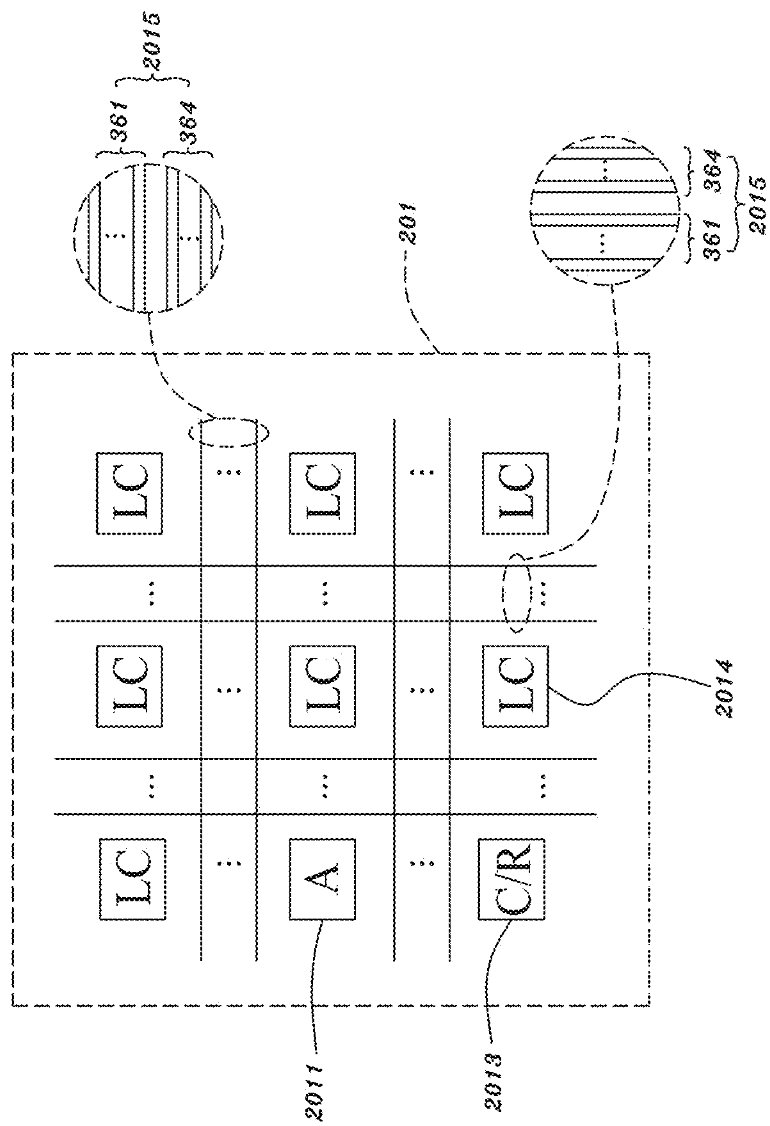
FIG. 20H is a block diagram illustrating a programmable logic block for a standard commodity FPGA IC chip in accordance with an embodiment of the present application.

Alternatively, FIG. 20H is a block diagram illustrating a programmable logic block for a standard commodity FPGA IC chip in accordance with an embodiment of the present application. Referring to FIG. 20H, the programmable logic block 201 may include (1) one or more cells (A) 2011 for fixed-wired adders, having the number ranging from 1 to 16 for example, (2) one or more cells (C/R) 2013 for caches and registers, each having capacity ranging from 256 to 2048 bits for example, and (3) the field programmable logic cells or elements (LC) 2014 as illustrated in FIGS. 19 and 20A-20L having the number ranging from 64 to 2048 for example. The programmable logic block 201 may further include multiple intra-block interconnects 2015 each extending over spaces between neighboring two of its cells 2011, 2013 and 2014 arranged in an array therein. For the programmable logic block (LB) 201, its intra-block interconnects 2015 may be divided into programmable interconnects 361 as illustrated in FIGS. 16A, 16B and 21 configured to be programmed for interconnection by its memory cells 362 and non-programmable interconnects 364 configured not to be programmable for interconnection.

Referring to FIG. 20H, the logic gate or circuit of each of the field programmable logic cells or elements (LCE) 2014 may have the memory cells 490, i.e., configuration-programming-memory (CPM) cells, having the number ranging from 4 to 256 for example, each configured to save or store one of the resulting values or programming codes of its look-up table 210, and the multiplexer 213 of its selection circuit 211 is configured to select, in accordance with the first input data set thereof having a bit-width ranging from 2 to 8 for example at the first input points thereof coupling to at least one of the programmable interconnects 361 and non-programmable interconnects 364 of the intra-block interconnects 2015, a data input from the second input data set thereof having a bit-width ranging from 4 to 256 for example as the data output thereof at the output point thereof coupling to at least one of the programmable interconnects 361 and non-programmable interconnects 364 of the intra-block interconnects 2015.

Figure 20I:
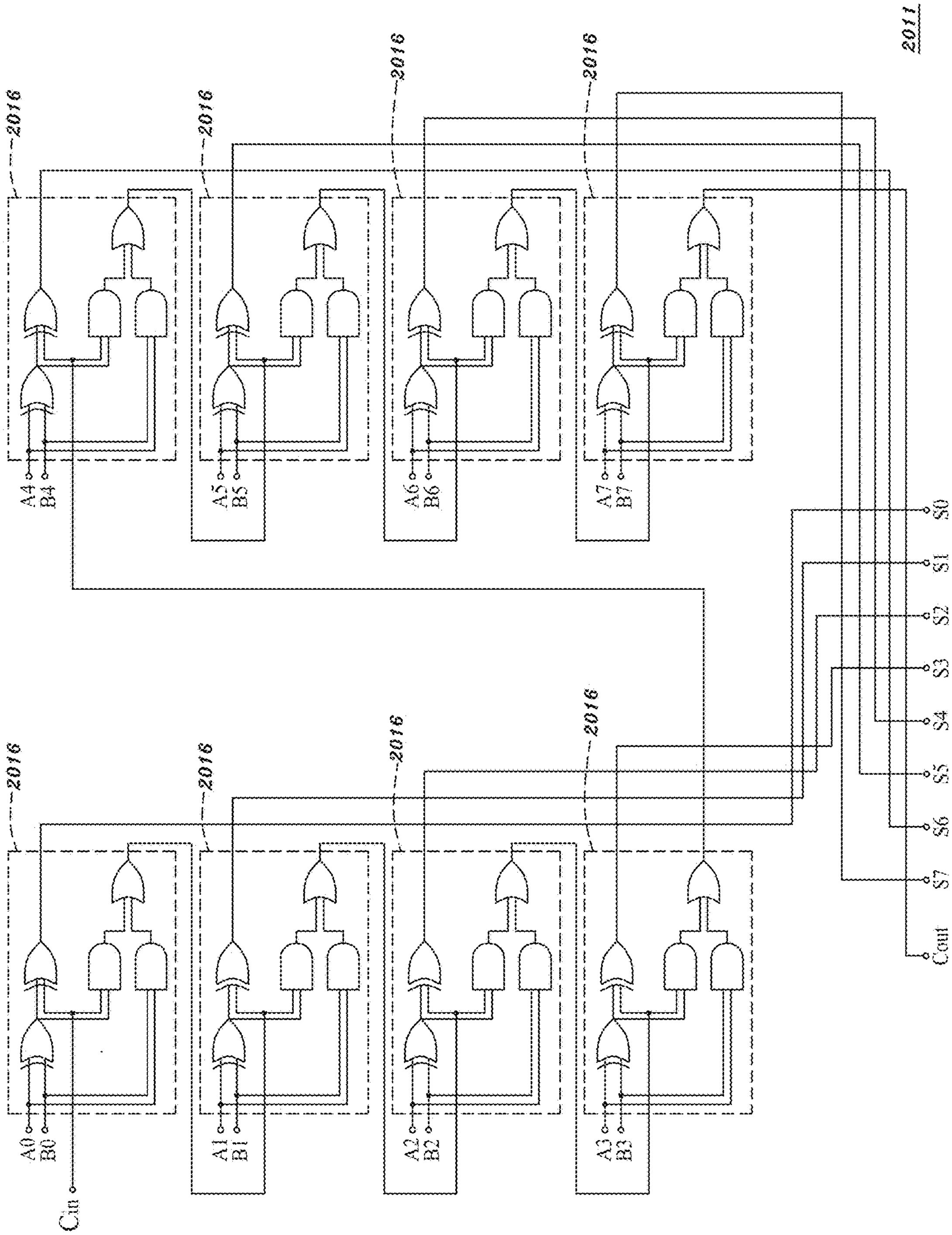
FIG. 20I is a circuit diagram illustrating a cell of an adder in accordance with an embodiment of the present application.
Figure 20J:
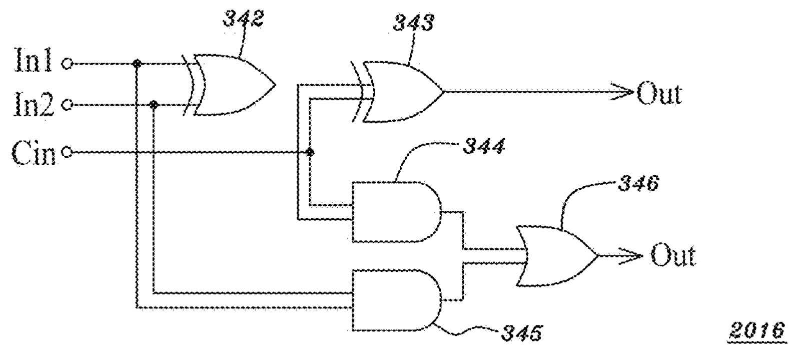
FIG. 20J is a circuit diagram illustrating an adding unit for a cell of an adder in accordance with an embodiment of the present application.
Figure 21:
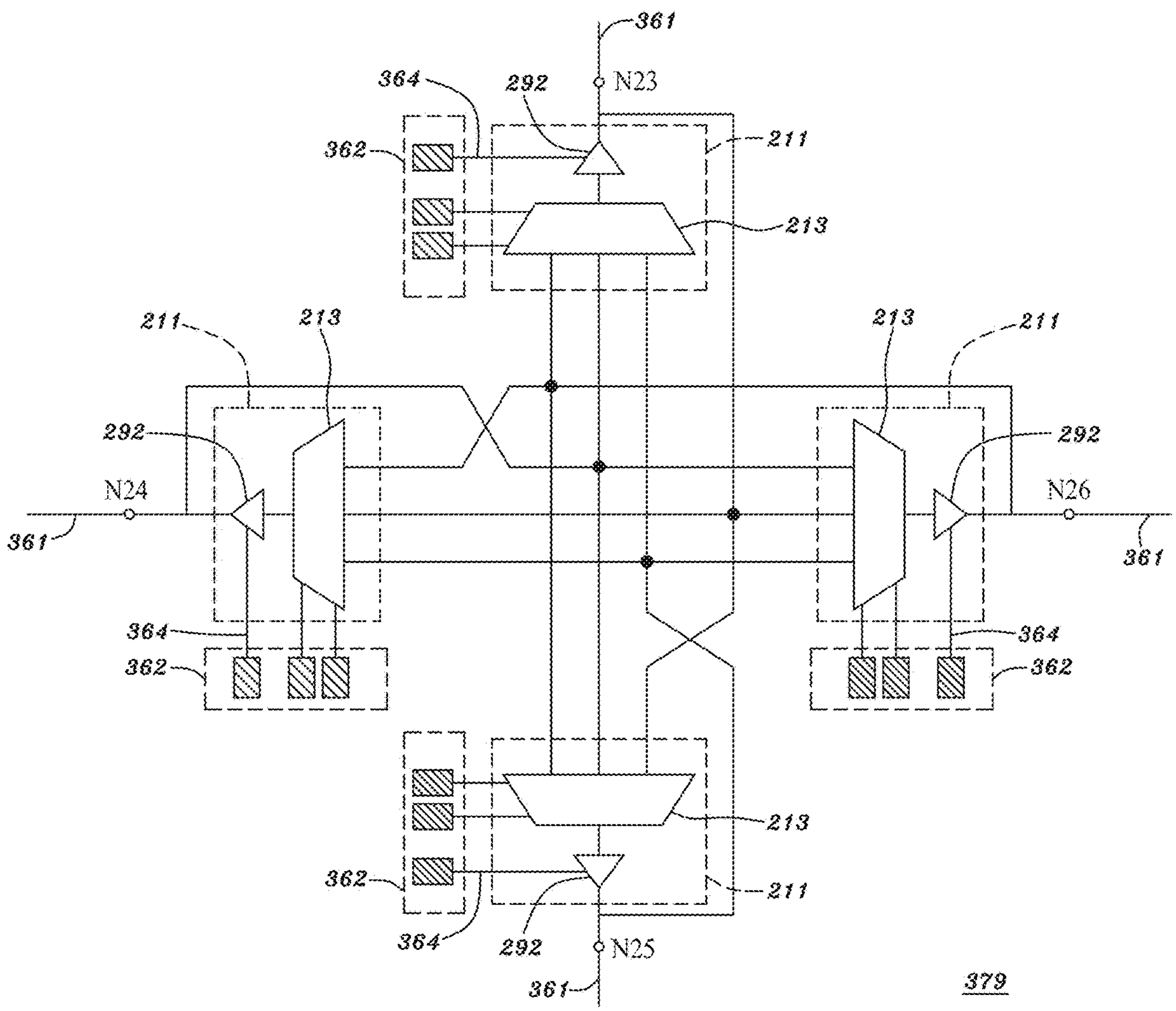
FIG. 21 is a block diagram illustrating programmable interconnects controlled by a field programmable switch cell for a third type of cross-point switch in accordance with an embodiment of the present application.

FIG. 20I is a circuit diagram illustrating a cell of an adder in accordance with an embodiment of the present application. FIG. 20J is a circuit diagram illustrating an adding unit for a cell of an adder in accordance with an embodiment of the present application. Referring to FIGS. 20H, 20I and 20J, each of the cells (A) 2011 for fixed-wired adders may include multiple fixed-wired adding units 2016, i.e., full adder, coupling in series and stage by stage to each other or one another. For example, said each of the cells (A) 2011 for fixed-wired adders as seen in FIG. 20H may include 8 stages of the adding unit 2016 coupling in series and stage by stage to one another as seen in FIGS. 20I and 20J to add its first 8-bit data inputs (A7, A6, A5, A4, A3, A2, A1, A0) at its first eight input points coupling to eight of the programmable interconnects 361 and non-programmable interconnects 364 of the intra-block interconnects 2015 by its second 8-bit data inputs (B7, B6, B5, B4, B3, B2, B1, B0) at its second eight input points coupling to another eight of the programmable interconnects 361 and non-programmable interconnects 364 of the intra-block interconnects 2015 as its 9-bit data output (Cout, S7, S6, S5, S4, S3, S2, S1, S0) at its output point coupling to another nine of the programmable interconnects 361 and non-programmable interconnects 364 of the intra-block interconnects 2015. Referring to FIGS. 20I and 20J, the adding unit 2016 of the first stage may take its carry-in data input Cin from a previous computation result coupling to one of the programmable interconnects 361 and non-programmable interconnects 364 of the intra-block interconnects 2015 into account to add its first data input In1 associated with the data input A0 of said each of the cells (A) 2011 for fixed-wired adders by its second data input In2 associated with the data input B0 of said each of the cells (A) 2011 as its two outputs, one of which is a data output Out acting as the data output S0 of said each of the cells (A) 2011 for fixed-wired adders and the other one of which is a carry-out data output Cout associated with a carry-in data input Cin of the adding unit 2016 of the second stage. Each of the adding units 2016 of the second through seventh stages may take its carry-in data input Cin from the carry-out data output Cout of one of the adding units 2016 of the first through sixth stages at a previous stage to said each of the adding units 2016 into account to add its first data input In1 associated with one of the data inputs A1, A2, A3, A4, A5 and A6 of said each of the cells (A) 2011 for fixed-wired adders by its second data input In2 associated with one of the data inputs B1, B2, B3, B4, B5 and B6 of said each of the cells (A) 2011 as its two data outputs, one of which is a data output Out acting as one of the data outputs S1, S2, S3, S4, S5 and S6 of said each of the cells (A) 2011 for fixed-wired adders and the other one of which is a carry-out data output Cout associated with a carry-in data input Cin of one of the adding units 2016 of the third through eighth stages at a subsequent stage to said each of the adding units 2016. For example, the adding unit 2016 of the seventh stage may take its carry-in data input Cin from a carry-out data output Cout of the adding unit 2016 of the sixth stage into account to add its first data input In1 associated with the data input A6 of said each of the cells (A) 2011 for fixed-wired adders by its second data input In2 associated with the data input B6 of said each of the cells (A) 2011 as its two outputs, one of which is a data output Out acting as the data output S6 of said each of the cells (A) 2011 for fixed-wired adders and the other one of which is a carry-out data output Cout associated with a carry-in data input Cin of the adding unit 2016 of the eighth stage. The adding unit 2016 of the eighth stage may take its carry-in data input Cin from the carry-out data output Cout of the adding unit 2016 of the seventh stage into account to add its first data input In1 associated with the data input A7 of said each of the cells (A) 2011 for fixed-wired adders by its second data input In2 associated with the data input B7 of said each of the cells (A) 2011 as its two data outputs, one of which is a data output Out acting as the data output S7 of said each of the cells (A) 2011 for fixed-wired adders and the other one of which is a carry-out data output Cout acting as the carry-out data output Cout of said each of the cells (A) 2011 for fixed-wired adders.

Referring to FIGS. 20H and 20I, each of the adding units 2016 of the first through eighth stages may include (1) an ExOR gate 342 configured to perform Exclusive-OR operation on the first and second data inputs of the ExOR gate 342 associated respectively with its first and second data inputs In1 and In2 as the data output of the ExOR gate 342, (2) an ExOR gate 343 configured to perform Exclusive-OR operation on the first data input of the ExOR gate 343 associated with the data output of the ExOR gate 342 and the second data input of the ExOR gate 343 associated with its carry-in data input Cin as the data output of the ExOR gate 343 acting as its data output Out, (3) an AND gate 344 configured to perform AND operation on the first data input of the AND gate 344 associated with its carry-in data input Cin and the second data input of the AND gate 344 associated with the data output of the ExOR gate 342 as the data output of the AND gate 344, (4) an AND gate 345 configured to perform AND operation on the first and second data inputs of the AND gate 345 associated respectively with its first and second data inputs In1 and In2 as the data output of the AND gate 345, and (5) an OR gate 346 configured to perform OR operation on the first data input of the OR gate 346 associated with the data output of the AND gate 344 and the second data input of the OR gate 346 associated with the data output of the AND gate 345 as the data output of the OR gate 346 acting as its Carry-out data output Cout.

Figure 20K:
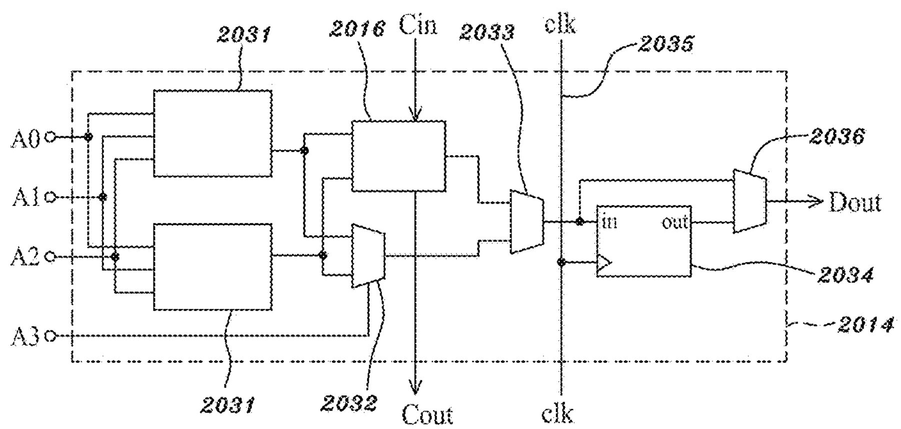
FIG. 20K is a schematic view showing a block diagram of a field programmable logic cell or element in accordance with another embodiment of the present application.

FIG. 20K is a schematic view showing a block diagram of a programmable logic cell or element in accordance with another embodiment of the present application. For a first type, the programmable logic cell or element 2014 may have the structure as illustrated in FIG. 19. Alternatively, for each embodiment in this paper, the first type of programmable logic cell or element 2014 may be replaced with a second type of programmable logic cell or element 2014 as illustrated in FIG. 20K. Referring to FIG. 20K, the second type of programmable logic cell or element 2014 may include (1) two logic gate or circuits 2031, each of which may be referred to one as illustrated in FIG. 19 and have three data inputs in a first data set thereof coupling respectively to three data inputs A0-A2 of the second type of programmable logic cell or element 2014, wherein each of its two logic gate or circuits 2031 may select, in accordance with the first data set thereof, an input data from multiple resulting values in a second data set thereof as a data output, (2) a fixed-wired adding unit 2016, i.e., full adder, having two-bit data inputs each coupling to a data output of one of its logic gate or circuits 2031, wherein the adding unit 2016 may be configured to take a carry-in data input thereof coupling to a data input Cin of the second type of programmable logic cell or element 2014 and passing from a carry-out data output of another adding unit 2016 of the previous stage into account to add the two-bit data inputs thereof as two data outputs thereof, one of which may be configured to be a first data output for a sum of addition and the other of which may be configured to be a second data output for a carry of addition coupling to a data output Cout of the second type of programmable logic cell or element 2014 and passing to a carry-in data input of another adding unit 2016 of the next stage, (3) a multiplexer 2032, i.e., LUT selection multiplexer, having a data input in a first input data set thereof coupling to a data input A3 of the second type of programmable logic cell or element 2014 and two data inputs in a second input data set thereof each coupling to the data output of one of its logic gate or circuits 2031, wherein its multiplexer 2032 may select, in accordance with the first input data set thereof, an input data from the second input data set thereof as a data output thereof, (4) a multiplexer 2033, i.e., addition-selection multiplexer, having a data input in a first input data set thereof coupling to a programming code stored in a memory cell (not shown) of the second type of programmable logic cell or element 2014 and two data inputs in a second input data set thereof, one of which may couple to the first data output of its fixed-wired adding unit 2016 and the other of which may couple to the data output of its multiplexer 2032, wherein its multiplexer 2033 may select, in accordance with the first input data set thereof, an input data from the second input data set thereof as a data output thereof that may be asynchronous, (5) a D-type flip-flop circuit 2034 having a first data input coupling to the data output of its multiplexer 2033 to be registered or stored therein and a second data input coupling to a clock signal clk on a clock bus 2035, wherein its D-type flip-flop circuit 2034 may synchronously generate, in accordance with the second data input thereof, a data output associated with the first data input thereof and the data output of its D-type flip-flop circuit 2034 may be synchronous with the clock signal clk, and (6) a multiplexer 2036, i.e., synchronization-selection multiplexer, having a data input in a first input data set thereof coupling to a memory cell (not shown) of the second type of programmable logic cell or element 2014 and two data inputs in a second input data set thereof, one of which may couple to the data output of its multiplexer 2033 and the other of which may couple to the data output of its D-type flip-flop circuit 2034, wherein its multiplexer 2036 may select, in accordance with the first input data set thereof, an input data from the second input data set thereof as a data output thereof, which may act as a data output Dout of the second type of programmable logic cell or element 2014. The memory cell for each of the multiplexers 2033 and 2036 may have two types, i.e., first and second types, mentioned as below. The first type of memory cells for each of the multiplexers 2033 and 2036 may be referred to the memory cell 398 as illustrated in FIG. 1A or 1B, configured to save or store the programming code for said each of the multiplexers 2033 and 2036. Alternatively, the second type of memory cells for each of the multiplexers 2033 and 2036 may be any of the ninth, tenth, eleventh, twelfth, thirteenth and fourteenth types of non-volatile memory cells 980, 985, 986, 955, 956 and 958 as illustrated in FIGS. 13A-13C and 14B-14D respectively, configured to save or store the programming code for said each of the multiplexers 2033 and 2036. Each of the multiplexers 2033 and 2036 may have the data input in the first input data set thereof, which is associated with (1) a data output, i.e., configuration-programming-memory (CPM) data, of the first type of memory cell for said each of the multiplexers 2033 and 2036, e.g., one of the first and second data outputs Out1 and Out2 of the memory cell 398 as illustrated in FIG. 1A or 1B, or (2) a data output, i.e., configuration-programming-memory (CPM) data, of the second type of memory cell for said each of the multiplexers 2033 and 2036, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986.

Figure 20L:
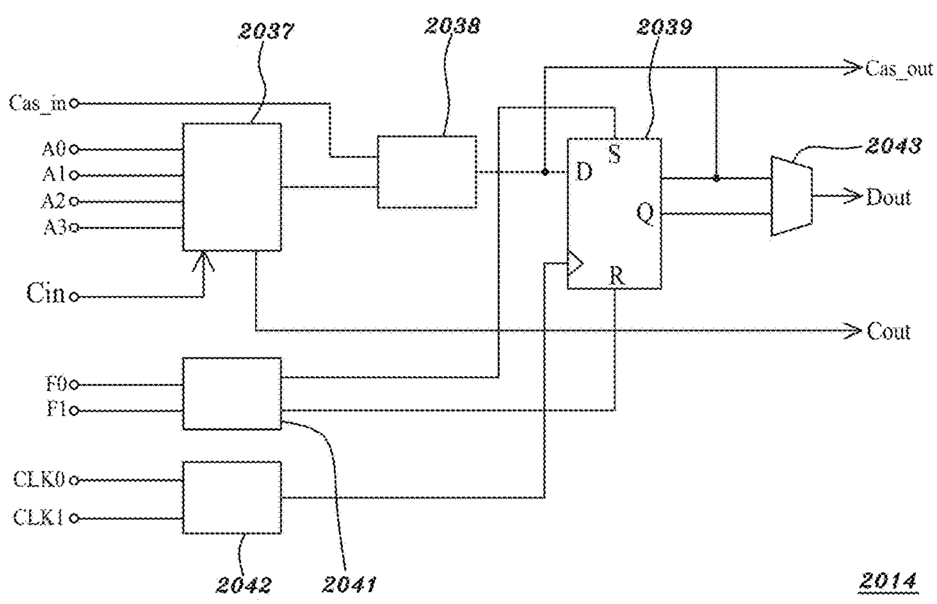
FIG. 20L is a schematic view showing a block diagram of a field programmable logic cell or element in accordance with another embodiment of the present application.

FIG. 20L is a schematic view showing a block diagram of a programmable logic cell or element in accordance with another embodiment of the present application. Alternatively, for each embodiment in this paper, the first type of programmable logic cell or element 2014 may be replaced with a third type of programmable logic cell or element 2014 as illustrated in FIG. 20L. Referring to FIG. 20L, the third type of programmable logic cell or element 2014 may include a logic operator or circuit 2037 having four-bit data inputs in a first input data set thereof coupling respectively to four data inputs A0-A3 of the third type of programmable logic cell or element 2014 and a carry-in data input in the first input data set thereof coupling to a data input Cin of the third type of programmable logic cell or element 2014, wherein the logic operator or circuit 2037 is configured to select, in accordance with the first input data set thereof, a first data input from multiple resulting values in a second input data set thereof as a first data output thereof and select, in accordance with the first input data set thereof, a second data input from multiple resulting values in a third input data set thereof as a second data output thereof. In an example, when the logic operator or circuit 2037 performs an addition operation, the logic operator or circuit 2037 may be configured to take the carry-in data input thereof from a carry-out data output of another logic operator or circuit 2037 of the previous stage into account to add two of the four-bit data inputs thereof as the first data output thereof for a sum of addition and the second data output thereof for a carry of addition at a data output Cout of the third type of programmable logic cell or element 2014, which may be associated with a carry-in data input of another logic operator or circuit 2037 of the next stage. In another example, when the logic operator or circuit 2037 performs a logic operation, the logic operator or circuit 2037 may be configured to select, in accordance with the first input data set thereof, a data input from multiple resulting values in the second input data set thereof as the first data output thereof for the logic operation.

Referring to FIG. 20L, the third type of programmable logic cell or element 2014 may further include (1) a cascade circuit 2038 provided with a logic gate having a first data input associated with a data input Cas_in of the third type of programmable logic cell or element 2014 for cascade data passed through one or more hard wires from a data output Cas_out of another third type of programmable logic cell or element 2014 in a previous stage, which may have the same structure as illustrated in FIG. 21L, and a second data input associated with the first data output of its logic operator or circuit 2037, wherein the logic gate of its cascade circuit 2033 may perform AND or OR logic operation on the first and second data inputs thereof as a data output of its cascade circuit 2033, wherein the data output of its cascade circuit 2033 may be asynchronous, (2) a D-type flip-flop circuit 2039 having a first data input coupling to the data output of its cascade circuit 2038 to be registered or stored therein and a second data input coupling to a clock signal on a clock bus 2040 of the third type of programmable logic cell or element 2014, wherein its D-type flip-flop circuit 2039 may synchronously generate, in accordance with the second data input thereof, a data output associated with the first data input thereof and the data output of its D-type flip-flop circuit 2039 may be synchronous with the clock signal, (3) a set-reset control circuit 2041 coupling to its D-type flip-flop circuit 2039 to set, reset or unchange its D-type flip-flop circuit 2039 in accordance with two data inputs thereof coupling respectively to two data inputs F0 and F1 of the third type of programmable logic cell or element 2014, and (4) a clock control circuit 2042 coupling to its D-type flip-flop circuit 2039 through its clock bus 2040, wherein its clock control circuit 2042 is configured to generate, in accordance with two data inputs thereof coupling respectively to two data inputs CLK0 and CLK1 of the third type of programmable logic cell or element 2014, the clock signal in one of various modes. For example, its clock control circuit 2042 may be controlled to be enabled or disabled in accordance with the data input CLK0 thereof, and in a mode the clock signal may be controlled to be the same as a reference clock in accordance with the data input CLK1 of the third type of programmable logic cell or element 2014; in another mode the clock signal may be controlled to be inverted to the reference clock in accordance with the data input CLK1 of the third type of programmable logic cell or element 2014.

Referring to FIG. 20L, the third type of programmable logic cell or element 2014 may further include a multiplexer 2043, i.e., synchronization-selection multiplexer, having a data input in a first input data set thereof coupling to a memory cell (not shown) of the third type of programmable logic cell or element 2014 and two data inputs in a second input data set thereof, one of which may couple to the data output of its cascade circuit 2038 and the other of which may couple to the data output of its D-type flip-flop circuit 2039, wherein its multiplexer 2043 may select, in accordance with the first input data set thereof, an input data from the second input data set thereof as a data output thereof, which may act as a data output Dout of the third type of programmable logic cell or element 2014. The third type of programmable logic cell or element 2014 may further include a data output Cas_out for cascade data coupling to the data output of its cascade circuit 2038 and the data output Cas_out of the third type of programmable logic cell or element 2014 may further include a data output Cas_out may be passed through one or more hard wires to the data input Cas_in of another third type of programmable logic cell or element 2014 in a next stage, which may have the same structure as illustrated in FIG. 21L.

Specification for Field Programmable Switch Cell for Cross-Point Switch

FIG. 21 is a circuit diagram illustrating programmable interconnects controlled by a field programmable switch cell for a third type of cross-point switch in accordance with an embodiment of the present application. Besides the first and second types of cross-point switches as illustrated in FIGS. 16A and 16B, a third type of cross-point switch as seen in FIG. 21 may be provided, including four selection circuits 211 at its top, bottom, left and right sides respectively, each as seen in FIG. 17 having the multiplexers 213 and the second type of pass/no-pass switch or switch buffer 292. For the third type of cross-point switch, the multiplexer 213 of each of its four selection circuits 211 as seen in FIG. 17 may be configured to select, in accordance with the first input data set, e.g., A0 and A1, thereof at the first set of input points thereof, a data input from the second input data set, e.g., D0-D2, thereof at the second set of input points thereof as the data output thereof. The second type of pass/no-pass switch 292 of each of its four selection circuits 211 as seen in FIG. 17 is configured to control, in accordance with a first data input thereof at the node SC-4, coupling between the input point thereof for a second data input thereof associated with the data output of the multiplexer 213 of said each of its four selection circuits 211 and the output point for a data output thereof and amplify the second data input thereof as the data output thereof to act as a data output Dout of said each of its four selection circuits 211. Each of the second set of three input points of the multiplexer 213 of one of its four selection circuits 211 may couple to one of the second set of three input points of the multiplexer 213 of each of another two of its four selection circuits 211 and to the output point of the other of its four selection circuits 211. Thereby, for each of its four selection circuits 211, its multiplexer 213 may select, in accordance with the first input data set, e.g., A0 and A1, thereof at the first set of input points thereof, a data input from the second input data set, e.g., D0-D2, thereof at the second set of three input points thereof coupling to respective three of four nodes N23-N26 coupling to respective three of four programmable interconnects 361 extending in four different directions respectively and to the output points of the other respective three of its four selection circuits 211, and its second type of pass/no-pass switch 292 is configured to generate the data output Dout of said each of its four selection circuits 211 at the other of the four nodes N23-N26 coupling to the other of the four programmable interconnects 361.

For example, referring to FIG. 21, for the top one of the four selection circuits 211 of the third type of cross-point switch, its multiplexer 213 may select, in accordance with the first input data set, e.g., A0 and A1, thereof at the first set of input points thereof, a data input from the second input data set, e.g., D0-D2, thereof at the second set of three input points thereof coupling to the respective three nodes N24-N26 coupling to the respective three programmable interconnects 361 extending in left, down and right directions respectively and to the respective output points of the left, bottom and right ones of the four selection circuits of the third type of cross-point switch, and its second type of pass/no-pass switch 292 is configured to generate the data output Dout of the top one of the four selection circuits 211 of the third type of cross-point switch at the node N23 coupling to the programmable interconnect 361 extending in an up direction. Thereby, data from one of the four programmable interconnects 361 may be switched by the third type of cross-point switch to be passed to another one, two or three of the four programmable interconnects 361.

Specification for Field Programmable Switch Cell

First Type of Field Programmable Switch Cell

The first type of pass/no-pass switch 292 as illustrated in FIG. 15A may be provided for a first type of field programmable switch cell 258, i.e., configurable switch cell. Referring to FIG. 15A, the first type of field programmable switch cell 258 may further include a memory cell 362, i.e., configuration-programming-memory (CPM) cell, configured to store or save a programming code. For the first type of field programmable switch cell 258, its first type of pass/no-pass switch 292 may have a contact point at the node SC-3 coupling to its memory cell 362 and configured to receive the programming code saved or stored in its memory cells 362. Its first type of pass/no-pass switch 292 is configured to control, in accordance with a first data input thereof at the node SC-3 associated with the programming code saved or stored in its memory cells 362, coupling between the input point thereof at the node N21 for a second data input thereof and the output point thereof at the node N22 for a data output thereof.

Referring to FIG. 15A, for the first type of field programmable switch cell 258, its memory cell 362 may have two types, i.e., first and second types, mentioned as below. Its first type of memory cell 362 may be referred to the memory cell 398 as illustrated in FIG. 1A or 1B, configured to save or store the programming code. Alternatively, its second type of memory cell 362 may be any of the ninth, tenth, eleventh, twelfth, thirteenth and fourteenth types of non-volatile memory cells 980, 985, 986, 955, 956 and 958 as illustrated in FIGS. 13A-13C and 14B-14D respectively, configured to save or store the programming code. Its first type of pass/no-pass switch 292 may have a data input at the node SC-3 as illustrated in FIG. 15A associated with (1) a data output, i.e., configuration-programming-memory (CPM) data, of the first type of memory cell 362, e.g., one of the first and second data outputs Out1 and Out2 of the memory cell 398 as illustrated in FIG. 1A or 1B, or (2) a data output, i.e., configuration-programming-memory (CPM) data, of the second type of memory cell 362, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986.

Second Type of Field Programmable Switch Cell

The second type of pass/no-pass switch 292 as illustrated in FIG. 15B may be provided for a second type of field programmable switch cell 258, i.e., configurable switch cell. Referring to FIG. 15B, the second type of field programmable switch cell 258 may further include a memory cell 362, i.e., configuration-programming-memory (CPM) cell, configured to store or save a programming code. For the second type of field programmable switch cell 258, its second type of pass/no-pass switch 292 may have a contact point at the node SC-4 coupling to its memory cell 362 and configured to receive the programming code saved or stored in its memory cells 362. Its second type of pass/no-pass switch 292 is configured to control, in accordance with a first data input thereof at the node SC-4 associated with the programming code saved or stored in its memory cells 362, coupling between the input point thereof at the node N21 for a second data input thereof and the output point thereof at the node N22 for a data output thereof, and to amplify the second data input as the data output.

Referring to FIG. 15B, for the second type of field programmable switch cell 258, its memory cell 362 may have two types, i.e., first and second types, mentioned as below. Its first type of memory cell 362 may be referred to the memory cell 398 as illustrated in FIG. 1A or 1B, configured to save or store the programming code. Alternatively, its second type of memory cell 362 may be any of the ninth, tenth, eleventh, twelfth, thirteenth and fourteenth types of non-volatile memory cells 980, 985, 986, 955, 956 and 958 as illustrated in FIGS. 13A-13C and 14B-14D respectively, configured to save or store the programming code. Its second type of pass/no-pass switch 292 may have a data input at the node SC-4 as illustrated in FIG. 15B associated with (1) a data output, i.e., configuration-programming-memory (CPM) data, of the first type of memory cell 362, e.g., one of the first and second data outputs Out1 and Out2 of the memory cell 398 as illustrated in FIG. 1A or 1B, or (2) a data output, i.e., configuration-programming-memory (CPM) data, of the second type of memory cell 362, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986.

Third Type of Field Programmable Switch Cell

The third type of pass/no-pass switch 292 as illustrated in FIG. 15C may be provided for a third type of field programmable switch cell 258, i.e., configurable switch cell. Referring to FIG. 15C, the third type of field programmable switch cell 258 may further include two memory cells 362, i.e., configuration-programming-memory (CPM) cell, each configured to store or save a programming code. For the third type of field programmable switch cell 258, its third type of pass/no-pass switch 292 may have a contact point at the node SC-5 coupling to one of its memory cells 362 and configured to receive the programming code saved or stored in said one of its memory cells 362 and another contact point at the node SC-6 coupling to another of its memory cells 362 and configured to receive the programming code saved or stored in said another of its memory cells 362. Its third type of pass/no-pass switch 292 is configured to control, in accordance with two first data inputs thereof at the respective nodes SC-5 and SC-6 associated with the programming codes saved or stored in its memory cells 362, coupling between the nodes N21 and N22 and data transmission from the node N21 to the node N22 or from the node N22 to the node N21.

Referring to FIG. 15C, for the third type of field programmable switch cell 258, each of its memory cells 362 may have two types, i.e., first and second types, mentioned as below. Each of its first type of memory cells 362 may be referred to the memory cell 398 as illustrated in FIG. 1A or 1B, configured to save or store the programming code. Alternatively, each of its second type of memory cells 362 may be any of the ninth, tenth, eleventh, twelfth, thirteenth and fourteenth types of non-volatile memory cells 980, 985, 986, 955, 956 and 958 as illustrated in FIGS. 13A-13C and 14B-14D respectively, configured to save or store the programming codes. Its third type of pass/no-pass switch 292 may have two data inputs at the respective nodes SC-5 and SC-6 as illustrated in FIG. 15C each associated with (1) a data output, i.e., configuration-programming-memory (CPM) data, of one of the first type of memory cells 362, e.g., one of the first and second data outputs Out1 and Out2 of the memory cell 398 as illustrated in FIG. 1A or 1B, or (2) a data output, i.e., configuration-programming-memory (CPM) data, of one of the second type of memory cells 362, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986.

Fourth Type of Field Programmable Switch Cell

The first type of cross-point switch as illustrated in FIG. 16A may be provided for a fourth type of field programmable switch cell 379, i.e., configurable switch cell. Referring to FIG. 16A, the fourth type of field programmable switch cell 379 may further include multiple memory cells 362, i.e., configuration-programming-memory (CPM) cell, each configured to store or save a programming code. For the fourth type of field programmable switch cell 379, its four pass/no-pass switches 292 may couple to its memory cells 362 to form four first type of field programmable switch cells 258 respectively, each of which may be referred to the specification as illustrated in FIG. 15A, or to form four third type of field programmable switch cells 258 respectively, each of which may be referred to the specification as illustrated in FIG. 15C.

Fifth Type of Field Programmable Switch Cell

The second type of cross-point switch as illustrated in FIG. 16B may be provided for a fifth type of field programmable switch cell 379, i.e., configurable switch cell. Referring to FIG. 16B, the fifth type of field programmable switch cell 379 may further include multiple memory cells 362, i.e., configuration-programming-memory (CPM) cell, each configured to store or save a programming code. For the fifth type of field programmable switch cell 379, its six pass/no-pass switches 292 may couple to its memory cells 362 to form six first type of field programmable switch cells 258 respectively, each of which may be referred to the specification as illustrated in FIG. 15A, or to form six third type of field programmable switch cells 258 respectively, each of which may be referred to the specification as illustrated in FIG. 15C.

Sixth Type of Field Programmable Switch Cell

The third type of cross-point switch as illustrated in FIG. 21 may be provided for a sixth type of field programmable switch cell 379, i.e., configurable switch cell. Referring to FIG. 21, the sixth type of field programmable switch cell 379 may further include multiple memory cells 362, i.e., configuration-programming-memory (CPM) cell, each configured to store or save a programming code. For the sixth type of field programmable switch cell 379, each of its four selection circuits 211 may include the multiplexer 213 having the first set of two input points arranged in parallel for a first input data set, e.g., A0 and A1 as illustrated in FIG. 17, each associated with one of the programming codes saved or stored in its memory cells 362, and the second type of pass/no-pass switch 292 having the first data input thereof at the node SC-4 as illustrated in FIGS. 15B and 17 associated with one of the programming codes saved or stored in its memory cells 362.

Referring to FIG. 21, for the sixth type of field programmable switch cell 379, each of its memory cells 362 may have two types, i.e., first and second types, mentioned as below. Each of its first type of memory cells 362 may be referred to the memory cell 398 as illustrated in FIG. 1A or 1B, configured to save or store the programming code. Alternatively, each of its second type of memory cells 362 may be any of the ninth, tenth, eleventh, twelfth, thirteenth and fourteenth types of non-volatile memory cells 980, 985, 986, 955, 956 and 958 as illustrated in FIGS. 13A-13C and 14B-14D respectively, configured to save or store the programming codes. The multiplexer 213 of each of its four selection circuits 211 may have the first input data set, e.g., A0 and A1 as illustrated in FIG. 17, each associated with (1) a data output, i.e., configuration-programming-memory (CPM) data, of one of the first type of memory cells 362, e.g., one of the first and second data outputs Out1 and Out2 of the memory cell 398 as illustrated in FIG. 1A or 1B, or (2) a data output, i.e., configuration-programming-memory (CPM) data, of one of the second type of memory cells 362, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986. The second type of pass/no-pass switch 292 of its selection circuit 211 may have a data input at the node SC-4 as illustrated in FIGS. 15B and 17 associated with (1) a data output, i.e., configuration-programming-memory (CPM) data, of another of the first type of memory cells 490, e.g., one of the first and second data outputs Out1 and Out2 of the memory cell 398 as illustrated in FIG. 1A or 1B, or (2) a data output, i.e., configuration-programming-memory (CPM) data, of another of the second type of memory cells 490, e.g., data output at the node L44 of the ninth type of non-volatile memory cells 980, data output at the node L45 of the tenth type of non-volatile memory cells 985, data output at the node L56 of the eleventh type of non-volatile memory cells 986, data output at the node L64 of the twelfth type of non-volatile memory cells 955, data output at the node L65 of the thirteenth type of non-volatile memory cells 956, or data output at the node L78 of the fourteenth type of non-volatile memory cells 986.

Figure 22A:
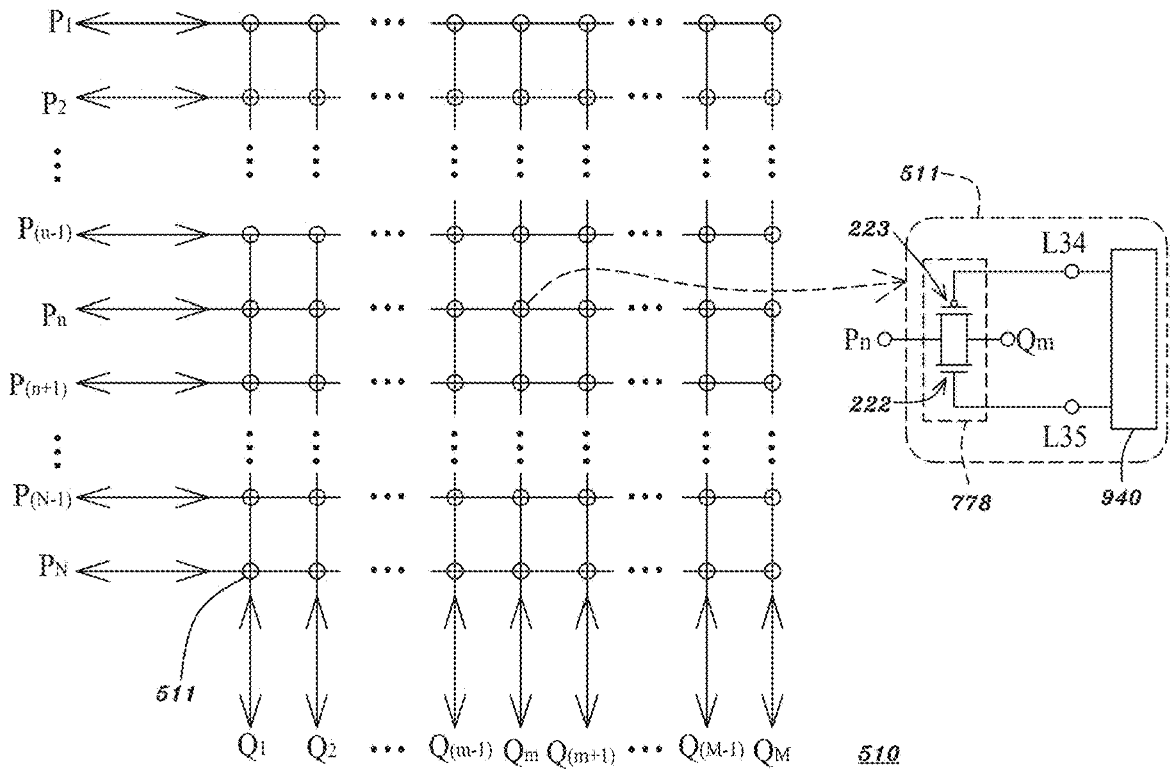
FIGS. 22A and 22B are schematic views showing a first type of cryptography block in accordance with an embodiment of the present application.
Figure 22B:
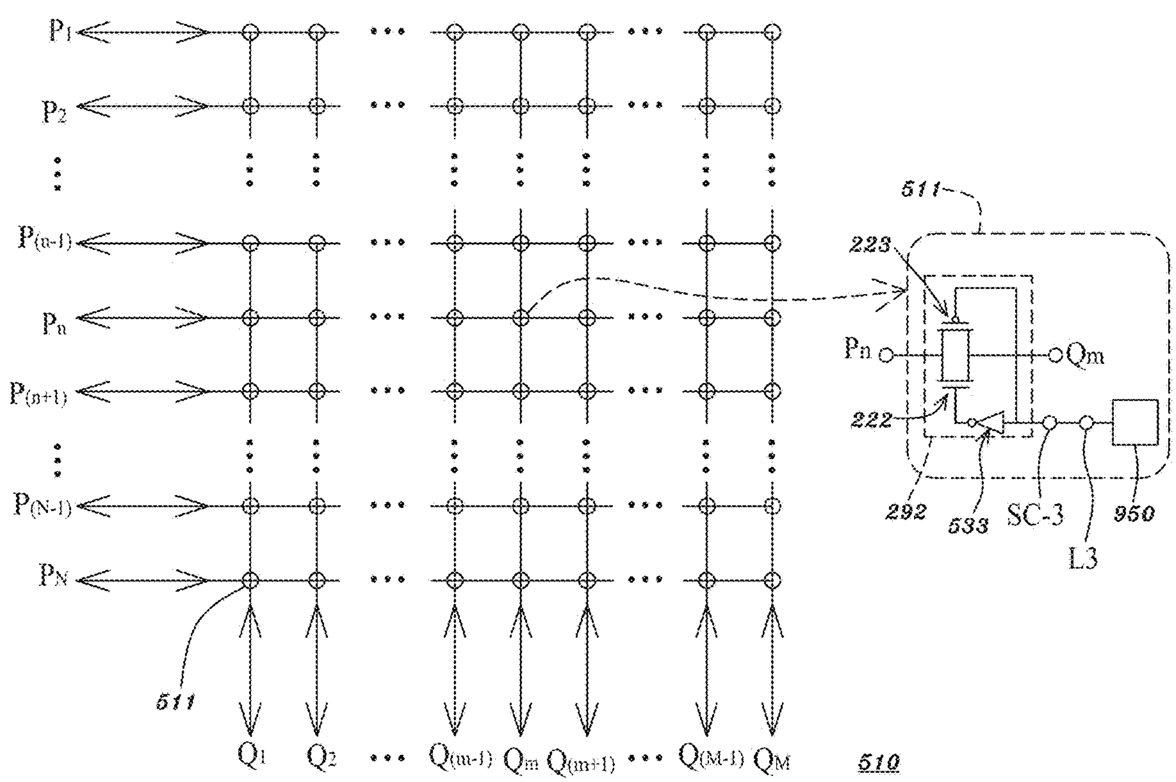

Specification for Various Cryptography Blocks (1) First Type of Cryptography Block FIGS. 22A and 22B are schematic views showing a first type of cryptography block in accordance with an embodiment of the present application. Referring to FIG. 22A, a first type of cryptography block 510, i.e., encryption/decryption circuit or security circuit, may include multiple cryptography units 511 arranged in multiple rows having the number of N and multiple columns laving the number of M, wherein the number of M may range from 4 to 16, such as 8, and the number of N may range from 4 to 16, such as 8. In a case, the number of M may be equal to the number of N. Alternatively, the number of M may be different from the number of N. Referring to FIG. 22A, for the first type of cryptography block 510, each of its cryptography units 511 may include (1) a pass/no-pass switch 778 having an N-type metal-oxide-semiconductor (MOS) transistor 222 and a P-type metal-oxide-semiconductor (MOS) transistor 223 each configured to form a channel having an end at a first node of its pass/no-pass switch 778 coupling to one $P_n$ of its nodes $P_1$-$P_N$ and the other opposite end at a second node of its pass/no-pass switch 778 coupling to one $Q_m$ of its nodes $Q_1$-$Q_M$ and (2) the first type of latched non-volatile memory cell 940 as illustrated in FIG. 11A having the node L34 coupling to the gate terminal of the P-type metal-oxide-semiconductor (MOS) transistor 223 of its pass/no-pass switch 778 and the node L35 coupling to the gate terminal of the N-type metal-oxide-semiconductor (MOS) transistor 222 of its pass/no-pass switch 778. For the first type of cryptography block 510, the pass/no-pass switches 778 of its cryptography units 511 arranged in each row may have the first nodes coupling to each other and to one $P_n$ of its nodes $P_1$-$P_N$ and the pass/no-pass switches 778 of its cryptography units 511 arranged in each column may have the second nodes coupling to each other and to one $Q_m$ of its nodes $Q_1$-$Q_M$.

Referring to FIGS. 11A and 22A, for the first type of latched non-volatile memory cell 940 of said each of the cryptography units 511, its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, is configured to store a digit of a first password therein. At an initial state, its node L36 may be switched to couple to the voltage Vcc of power supply to turn on its P-type and N-type MOS transistors 773 and 774 and its pass/no-pass switches 292. Thus, its node L31 may be coupled to the voltage Vcc of power supply through its P-type MOS transistor 773 and its node L32 may be coupled to the voltage Vss of ground reference through its N-type MOS transistor 774. Its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 may have the data output, associated with the digit of the first password, at the node L33 as seen in FIG. 11A to be passed to its memory cell 446 via its two stages of inverters 770 and pass/no-pass switches 292 to be stored in its memory cell 446. In operation, its node L36 may be switched to couple to the voltage Vss of ground reference to turn off the P-type and N-type MOS transistors 773 and 774 and the pass/no-pass switches 292, and the pass/no-pass switch 778 of said each of the cryptography units 511 may control, in accordance with its two data outputs at its respective two nodes L34 and L35, coupling between the nodes $P_n$ and $Q_m$ of the first type of cryptography block 510. For example, when its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, has the data output at a logic level of "0" at its node L33 to be passed to its memory cell 446 at the initial state, the pass/no-pass switch 778 of said each of the cryptography units 511 may be controlled by its memory cell 446 to be turned on in operation to couple the node $P_n$ of the first type of cryptography block 510 to the node $Q_m$ of the first type of cryptography block 510; when its non-volatile memory cell has the data output at a logic level of "1" at its node L33 to be passed to its memory cell 446 at the initial state, the pass/no-pass switch 778 of said each of the cryptography units 511 may be controlled by its memory cell 446 to be turned off to cut off connection between the nodes $P_n$ and $Q_m$ of the first type of cryptography block 510. Thereby, for the first type of cryptography block 510, the pass/no-pass switch 778 of only one of its cryptography units 511 in each row may be turned on to couple its node $P_n$ to its node $Q_m$, and each of the pass/no-pass switches 778 of the others of its cryptography units 511 in said each row may be turned off to cut off coupling between its nodes $P_n$ and $Q_m$; the pass/no-pass switch 778 of only one of its cryptography units 511 in each column may be turned on to couple its node $P_n$ to its node $Q_m$, and each of the pass/no-pass switches 778 of the others of its cryptography units 51 in said each column may be turned off to cut off coupling between its nodes $P_n$ and $Q_m$.

Alternatively, referring to FIG. 22B, each of the cryptography units 511 of the first type of cryptography block 510 may include (1) the first type of pass/no-pass switch 292 as illustrated in FIG. 15A, and (2) the second type of latched non-volatile memory cell 950 as illustrated in FIG. 11B. For an element indicated by the same reference number shown in FIGS. 22A and 22B, the specification of the element as seen in FIG. 22B may be referred to that of the element as illustrated in FIG. 22A. The difference between the circuits illustrated in FIG. 22B and the circuits illustrated in FIG. 22A is mentioned as below. Referring to FIG. 22B, for each of the cryptography units 511 of the first type of cryptography block 510, its second type of latched non-volatile memory cell 950 as illustrated in FIG. 11B may have the node L3 coupling to the node SC-3 of the first type of pass/no-pass switch 292. For the first type of cryptography block 510, the first type of pass/no-pass switches 292 of its cryptography units 511 arranged in each row may have the nodes N21 as seen in FIG. 15A coupling to each other and to one $P_n$ of its nodes $P_1$-$P_N$ and the first type of pass/no-pass switches 292 of its cryptography units 511 arranged in each column may have the nodes N22 as seen in FIG. 15A coupling to each other and to one $Q_m$ of its nodes $Q_1$-$Q_M$.

Referring to FIGS. 11B and 22B, for the second type of latched non-volatile memory cell 950 of said each of the cryptography units 511, its two non-volatile memory cells, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, are configured to store opposite logic levels representing a digit of the first password therein. At an initial state, its node EQ may be switched to couple to the voltage Vcc of power supply to turn off its P-type and N-type MOS transistors 775 and 776 and to turn on its P-type MOS transistors 774. Thereby, the gate terminals of the two pairs of P-type and N-type MOS transistors 447 and 448 of its memory cell 446 may be coupled to the voltage Vcc of power supply through its P-type MOS transistors 774 to be pre-charged at a logic level of "1" to turn on the N-type MOS transistors 448 of its memory cell 446 and to turn off the P-type MOS transistors 447 of its memory cell 446. In operation, its node EQ may be switched to couple to the voltage Vss of ground reference to turn on its P-type and N-type MOS transistors 775 and 776 and to turn off its P-type MOS transistors 774. Thus, its nodes L2 and L22 may be coupled to the voltage Vss of ground reference through its N-type MOS transistors 448 at the beginning in operation. At this time, one of its two non-volatile memory cells at one of the right and left sides of its memory cell 446 may first generate the data output at a logic level of "0" to the gate terminals of its P-type and N-type MOS transistors 447 and 448 at the other of the right and left sides of its memory cell 446 to turn on its P-type MOS transistor 447 at the other of the right and left sides of its memory cell 446 and off its N-type MOS transistor 448 at the other of the right and left sides of its memory cell 446, and the other of its two non-volatile memory cells at the other of the right and left sides of its memory cell 446 may generate the data output at a logic level of "1" to the gate terminals of its P-type and N-type MOS transistors 447 and 448 at said one of the right and left sides of its memory cell 446 to turn on its N-type MOS transistor 448 at said one of the right and left sides of its memory cell 446 and off its P-type MOS transistor 447 at said one of the right and left sides of its memory cell 446. The pass/no-pass switch 778 of said each of the cryptography units 511 may control, in accordance with its data output at the node L3, coupling between the nodes $P_n$ and $Q_m$ of the first type of cryptography block 510. For example, in operation when a right one of its two non-volatile memory cells, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, has the data output at a logic level of "0" at its node L3 and a left one of its two non-volatile memory cells has the data output at a logic level of "1" at its node L23, the first type of pass/no-pass switch 292 of said each of the cryptography units 511 may be turned on to couple the node $P_n$ of the first type of cryptography block 510 to the node $Q_m$ of the first type of cryptography block 510; when the right one of its two non-volatile memory cells has the data output at a logic level of "1" at its node L3 and a left one of its two non-volatile memory cells may have the data output at a logic level of "0" at its node L23, the first type of pass/no-pass switch 292 of said each of the cryptography units 511 may be turned off to cut off coupling between the nodes $P_n$ and $Q_m$ of the first type of cryptography block 510.

Alternatively, referring to FIG. 22B, for each of the cryptography units 511 of the first type of cryptography block 510, its second type of latched non-volatile memory cell 950 may be replaced with any of the ninth through eleventh types of non-volatile memory cells 980, 985 and 986 as illustrated in FIGS. 13A-13C respectively and the twelfth through fourteenth types of non-volatile memory cells 955, 956 and 958 as illustrated in FIGS. 14B-14D respectively, which is configured to be programmed to store a digit of the first password therein. In operation, said each of the cryptography units 511 may include (1) the ninth type of non-volatile memory cell 980 having the output point L44 associated with a digit of the first password stored therein and coupling to the node SC-3 of its first type of pass/no-pass switch 292, (2) the tenth type of non-volatile memory cell 985 having the output point L45 associated with a digit of the first password stored therein and coupling to the node SC-3 of its first type of pass/no-pass switch 292, (3) the eleventh type of non-volatile memory cell 986 having the output point L56 associated with a digit of the first password stored therein and coupling to the node SC-3 of its first type of pass/no-pass switch 292, (4) the twelfth type of non-volatile memory cell 955 having the output point L64 associated with a digit of the first password stored therein and coupling to the node SC-3 of its first type of pass/no-pass switch 292, (5) the thirteenth type of non-volatile memory cell 956 having the output point L65 associated with a digit of the first password stored therein and coupling to the node SC-3 of its first type of pass/no-pass switch 292, or (6) the fourteenth type of non-volatile memory cell 958 having the output point L78 associated with a digit of the first password stored therein and coupling to the node SC-3 of its first type of pass/no-pass switch 292. The pass/no-pass switch 778 of said each of the cryptography units 511 may control, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, coupling between the nodes $P_n$ and $Q_m$ of the first type of cryptography block 510. For example, in operation when its any ninth through fourteenth type of non-volatile memory cell 980, 985, 986, 955, 956 or 958 has the data output at a logic level of "0" at its node L44, L45, L56, L64, L65 or L78, its first type of pass/no-pass switch 292 may be turned on to couple the node $P_n$ of the first type of cryptography block 510 to the node $Q_m$ of the first type of cryptography block 510; when its any ninth through fourteenth type of non-volatile memory cell 980, 985, 986, 955, 956 or 958 has the data output at a logic level of "1" at its node L44, L45, L56, L64, L65 or L78, its first type of pass/no-pass switch 292 may be turned off to cut off coupling between the nodes $P_n$ and $Q_m$ of the first type of cryptography block 510.

Alternatively, referring to FIG. 22B, for each of the cryptography units 511 of the first type of cryptography block 510, its second type of latched non-volatile memory cell 950 may be replaced with a write-only memory cell.

Thereby, referring to FIGS. 22A and 22B, based on the first password, for decryption the first type of cryptography block 510 may have multiple data inputs at its input points, i.e., its nodes $P_1$-$P_N$, each to be decrypted by its cryptography units 511 in one of the rows as one of its data outputs at its output points, i.e., its nodes $Q_1$-$Q_M$. Based on the first password, for encryption the first type of cryptography block 510 may have multiple data inputs at its input points, i.e., its nodes $Q_1$-$Q_M$, each to be encrypted by its cryptography units 511 in one of the columns as one of its data outputs at its output points, i.e., its nodes $P_1$-$P_N$.

FIG. 22C illustrates a cryptography cross-point switch matrix in an original state for a first type of cryptography block in accordance with an embodiment of the present application. FIG. 22D illustrates a cryptography cross-point switch matrix in an encryption/decryption state for a first type of cryptography block in accordance with an embodiment of the present application. Referring to FIGS. 22C and 22D, in an example, the first type of cryptography block 510 may include sixty-four cryptography units 511 arranged in eight rows and eight columns, that is, both of the numbers "M" and "N" equal 8. The cryptography units 511 of the first type of cryptography block 510 as seen in FIG. 22A or 17B may be arranged in an array at corresponding positions to those of multiple numbers arranged in an array in a cryptography cross-point switch matrix as seen in FIG. 22C or 22D. For the first type of cryptography block 510, the state of the pass/no-pass switch 778 or 292 as illustrated in FIG. 22A or 22B for each of its cryptography units 511 at a cross of a first ordinal number n of its row and a second ordinal number m of its column may be represented by one of the numbers at a cross of a third ordinal number of row and a fourth ordinal number of column in the cryptography cross-point switch matrix as seen in FIG. 22C or 22D, wherein the first and second ordinal numbers are the same as the third and fourth ordinal numbers respectively, to indicate whether one $P_n$ of its nodes $P_1$-$P_N$ at the first ordinal number n of its row couples to one $Q_m$ of its nodes $Q_1$-$Q_M$ at the second ordinal number m of its column or not. When one of its cryptography units 511 at the cross of the first ordinal number n of its row and the second ordinal number m of its column as seen in FIG. 22A or 22B is switched to couple said one $P_n$ of its nodes $P_1$-$P_N$ at the first ordinal number n of its row to said one $Q_m$ of its nodes $Q_1$-$Q_m$ at the second ordinal number m of its column, said one of the numbers at the cross of the third ordinal number of row and the fourth ordinal number of column in the cryptography cross-point switch matrix as seen in FIG. 22C or 22D may be shown with "1". When one of its cryptography units 511 at the cross of the first ordinal number n of its row and the second ordinal number m of its column as seen in FIG. 22A or 22B is switched to cut off connection between said one $P_n$ of its nodes $P_1$-$P_N$ at the first ordinal number n of its row and said one $Q_m$ of its nodes $Q_1$-$Q_M$ at the second ordinal number m of its column, said one of the numbers at the cross of the third ordinal number of row and the fourth ordinal number of column in the cryptography cross-point switch matrix as seen in FIG. 22C or 22D may be shown with "0". For example, when one of its cryptography units 511 at the cross of its first row and its first column is switched to couple its node $P_1$ to its node $Q_1$, the number at the cross of the first row and the first column in the cryptography cross-point switch matrix as seen in FIG. 22C may be shown with "1"; when said one of its cryptography units 511 at the cross of its first row and its first column is switched to cut off connection between its nodes $P_1$ and $Q_1$, the number at the cross of the first row and the first column in the cryptography cross-point switch matrix as seen in FIG. 22D may be shown with "0".

Referring to FIG. 22C, for the cryptography cross-point switch matrix in an original state, a first group of numbers in a diagonal therein, each having the same third and fourth ordinal numbers, are shown with "1", but a second group of numbers not in the diagonal therein, each having different third and fourth ordinal numbers, are shown with "0". Accordingly, the first type of cryptography block 510 in the original state may have multiple data inputs at its nodes $P_1$-$P_N$ in the same sequence or order as that of its data outputs at its nodes $Q_1$-$Q_M$; alternatively, the first type of cryptography block 510 in the original state may have multiple data inputs at its nodes $Q_1$-$Q_M$ in the same sequence or order as that of its data outputs at its nodes $P_1$-$P_N$.

Referring to FIG. 22D, for the cryptography cross-point switch matrix in an encryption/decryption state, the numbers of "1" may not be in the diagonal therein but in other positions not in the diagonal therein; the numbers of "0" maybe in the diagonal therein. Accordingly, the first type of cryptography block 510 in the encryption/decryption state may have multiple data inputs at its nodes $P_1$-$P_N$ in a difference sequence or order from that of its data outputs at its nodes $Q_1$-$Q_M$; alternatively, the first type of cryptography block 510 in an encryption/decryption state may have multiple data inputs at its nodes $Q_1$-$Q_M$ in a difference sequence or order from that of its data outputs at its nodes $P_1$-$P_N$. Thereby, the first type of cryptography block 510 may provide (N!−1) first passwords to decrypt its data inputs at its nodes $P_1$-$P_N$ as its data outputs at its nodes $Q_1$-$Q_M$ and to encrypt its data inputs at its nodes $Q_1$-$Q_M$ as its data outputs at its nodes $P_1$-$P_N$. For both of the numbers "M" and "N" equal to 8, the first type of cryptography block 510 may provide 40,319 (8!−1) first passwords to decrypt its data inputs at its nodes $P_1$-$P_8$ as its data outputs at its nodes $Q_1$-$Q_8$ and to encrypt its data inputs at its nodes $Q_1$-$Q_8$ as its data outputs at its nodes $P_1$-$P_8$.

(2) Second Type of Cryptography Block

Figures 23A, 23B, 23C:
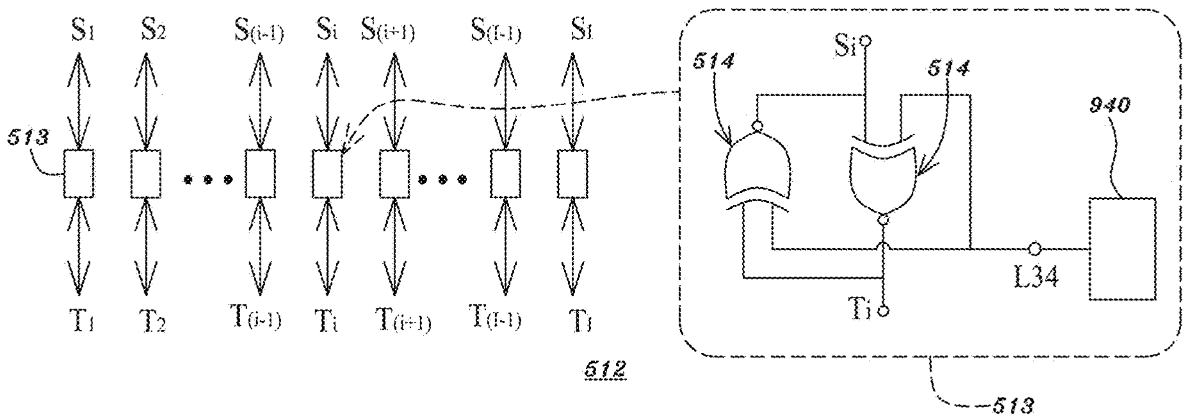
FIG. 23A is a schematic view showing a second type of cryptography block in accordance with an embodiment of the present application.
FIG. 23B illustrates a cryptography inverter matrix in an original state for a second type of cryptography block in accordance with an embodiment of the present application.
FIG. 23C illustrates a cryptography inverter matrix in an encryption/decryption state for a second type of cryptography block in accordance with an embodiment of the present application.

FIG. 23A is a schematic view showing a second type of cryptography block in accordance with an embodiment of the present application. Referring to FIG. 23A, a second type of cryptography block 512, i.e., encryption/decryption circuit or security circuit, may include multiple cryptography units 513 arranged in a line having the number of I ranging from 4 to 16, such as 8. Referring to FIG. 23A, for the second type of cryptography block 512, each of its cryptography units 513 may include (1) a pair of exclusive-or (XOR) gates 514 each configured to perform exclusive-or (EOR) operation on two data inputs at two respective input points of said each of the pair of exclusive-or (XOR) gates 514 as a data output at an output point of said each of the pair of exclusive-or (XOR) gates 514, wherein a first one of the two input points of a first one of the pair of exclusive-or (XOR) gates 514 may couple to a first one of the two input points of a second one of the pair of exclusive-or (XOR) gates 514, a second one of the two input points of the first one of the pair of exclusive-or (XOR) gates 514 may couple to an output point of the second one of the pair of exclusive-or (XOR) gates 514 and to one $S_i$ of its nodes $S_1$-$S_I$, and a second one of the two input points of the second one of the pair of exclusive-or (XOR) gates 514 may couple to an output point of the first one of the pair of exclusive-or (XOR) gates 514 and to one $T_i$ of its nodes $T_1$-$T_I$, and (2) the first type of latched non-volatile memory cell 940 as illustrated in FIG. 11A having the node L34 coupling to the first point of each of the pair of exclusive-or (XOR) gates 514.

Referring to FIGS. 11A and 23A, for the first type of latched non-volatile memory cell 940 of said each of the cryptography units 513, its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, is configured to store a digit of a second password therein. At an initial state, its node L36 may be switched to couple to the voltage Vcc of power supply to turn on its P-type and N-type MOS transistors 773 and 774 and its pass/no-pass switches 292. Thus, its node L31 may be coupled to the voltage Vcc of power supply through its P-type MOS transistor 773 and its node L32 may be coupled to the voltage Vss of ground reference through its N-type MOS transistor 774. Its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 may have the data output, associated with the digit of the second password, at the node L33 as seen in FIG. 11A to be passed to its memory cell 446 via its two stages of inverters 770 and pass/no-pass switches 292 to be stored in its memory cell 446. In operation, its node L36 may be switched to couple to the voltage Vss of ground reference to turn off the P-type and N-type MOS transistors 773 and 774 and the pass/no-pass switches 292, and the pair of exclusive-or (XOR) gates 514 of said each of the cryptography units 513 may control, in accordance with its data output at the node L34, inversion between data at the node $S_i$ and data at the node $T_i$. For example, for said each of the cryptography units 513, when the non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 has the data output at a logic level of "0" at its node L33 to be passed to the memory cell 446 of its first type of latched non-volatile memory cell 940 at the initial state, its data input at the node $S_i$ of the second type of cryptography block 512 may have a same logic level as its data output at the node $T_i$ of the second type of cryptography block 512 when data is transmitted from the node $S_i$ to the node $T_i$, or its data input at the node $T_i$ may have a same logic level as its data output at the node $S_i$ when data is transmitted from the node $T_i$ to the node $S_i$; when the non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 may have the data output at a logic level of "1" at its node L33 to be passed to the memory cell 446 of its first type of latched non-volatile memory cell 940 at the initial state, its data input at the node $S_i$ may have an opposite logic level to its data output at the node $T_i$ when data is transmitted from the node $S_i$ to the node $T_i$, or its data input at the node $T_i$ may have an opposite logic level to its data output at the node $S_i$ when data is transmitted from the node $T_i$ to the node $S_i$.

Alternatively, referring to FIG. 23A, for each of the cryptography units 513 of the second type of cryptography block 512, its first type of latched non-volatile memory cell 940 may be replaced with the second type of latched non-volatile memory cell 950 as illustrated in FIG. 11B, which is configured to be programmed to save or store a digit of the second password therein. Its second type of latched non-volatile memory cell 950 may have the node L3 coupling to the first point of each of the pair of its exclusive-or (XOR) gates 514.

Referring to FIGS. 11B and 23A, for the second type of latched non-volatile memory cell 950 of said each of the cryptography units 513, its two non-volatile memory cells, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, are configured to store opposite logic levels representing a digit of the second password therein. At an initial state, its node EQ may be switched to couple to the voltage Vcc of power supply to turn off its P-type and N-type MOS transistors 775 and 776 and to turn on its P-type MOS transistors 774. Thereby, the gate terminals of the two pairs of P-type and N-type MOS transistors 447 and 448 of its memory cell 446 may be coupled to the voltage Vcc of power supply through its P-type MOS transistors 774 to be pre-charged at a logic level of "1" to turn on the N-type MOS transistors 448 of its memory cell 446 and to turn off the P-type MOS transistors 447 of its memory cell 446. In operation, its node EQ may be switched to couple to the voltage Vss of ground reference to turn on its P-type and N-type MOS transistors 775 and 776 and to turn off its P-type MOS transistors 774. Thus, its nodes L2 and L22 may be coupled to the voltage Vss of ground reference through its N-type MOS transistors 448 at the beginning in operation. At this time, one of its two non-volatile memory cells at one of the right and left sides of its memory cell 446 may first generate the data output at a logic level of "0" to the gate terminals of its P-type and N-type MOS transistors 447 and 448 at the other of the right and left sides of its memory cell 446 to turn on its P-type MOS transistor 447 at the other of the right and left sides of its memory cell 446 and off its N-type MOS transistor 448 at the other of the right and left sides of its memory cell 446, and the other of its two non-volatile memory cells at the other of the right and left sides of its memory cell 446 may generate the data output at a logic level of "1" to the gate terminals of its P-type and N-type MOS transistors 447 and 448 at said one of the right and left sides of its memory cell 446 to turn on its N-type MOS transistor 448 at said one of the right and left sides of its memory cell 446 and off its P-type MOS transistor 447 at said one of the right and left sides of its memory cell 446. The pair of exclusive-or (XOR) gates 514 of said each of the cryptography units 513 may control, in accordance with its data output at the node L3, inversion between data at the node $S_i$ and data at the node $T_i$. For example, for said each of the cryptography units 513, in operation when a right one of the two non-volatile memory cells, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its second type of latched non-volatile memory cell 950 has the data output at a logic level of "0" at its node L3 and a left one of the two non-volatile memory cells of its second type of latched non-volatile memory cell 950 may have the data output at a logic level of "1" at its node L23, its data input at the node $S_i$ may have a same logic level as its data output at the node $T_i$ when data is transmitted from the node $S_i$ to the node $T_i$, or its data input at the node $T_i$ may have a same logic level as its data output at the node $S_i$ when data is transmitted from the node $T_i$ to the node $S_i$; when the right one of the two non-volatile memory cells of its second type of latched non-volatile memory cell 950 may have the data output at a logic level of "1" at its node L3 and a left one of the two non-volatile memory cells of its second type of latched non-volatile memory cell 950 may have the data output at a logic level of "0" at its node L23, its data input at the node $S_i$ may have an opposite logic level to its data output at the node $T_i$ when data is transmitted from the node $S_i$ to the node $T_i$, or its data input at the node $T_i$ may have an opposite logic level to its data output at the node $S_i$ when data is transmitted from the node $T_i$ to the node $S_i$.

Alternatively, referring to FIG. 23A, for each of the cryptography units 513 of the second type of cryptography block 512, its first type of latched non-volatile memory cell 940 may be replaced with any of the ninth through eleventh types of non-volatile memory cells 980, 985 and 986 as illustrated in FIGS. 13A-13C respectively and the twelfth through fourteenth types of non-volatile memory cells 955, 956 and 958 as illustrated in FIGS. 14B-14D respectively, which is configured to be programmed to store a digit of the second password therein. In operation, said each of the cryptography units 513 may include (1) the ninth type of non-volatile memory cell 980 having the output point L44 associated with a digit of the second password stored therein and coupling to the first point of each of the pair of its exclusive-or (XOR) gates 514, (2) the tenth type of non-volatile memory cell 985 having the output point L45 associated with a digit of the second password stored therein and coupling to the first point of each of the pair of its exclusive-or (XOR) gates 514, (3) the eleventh type of non-volatile memory cell 986 having the output point L56 associated with a digit of the second password stored therein and coupling to the first point of each of the pair of its exclusive-or (XOR) gates 514, (4) the twelfth type of non-volatile memory cell 955 having the output point L64 associated with a digit of the second password stored therein and coupling to the first point of each of the pair of its exclusive-or (XOR) gates 514, (5) the thirteenth type of non-volatile memory cell 956 having the output point L65 associated with a digit of the second password stored therein and coupling to the first point of each of the pair of its exclusive-or (XOR) gates 514, or (6) the fourteenth type of non-volatile memory cell 958 having the output point L78 associated with a digit of the second password stored therein and coupling to the first point of each of the pair of its exclusive-or (XOR) gates 514. The pair of exclusive-or (XOR) gates 514 of said each of the cryptography units 513 may control, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, inversion between data at the node $S_i$ and data at the node $T_i$. For example, for said each of the cryptography units 513, in operation when its any ninth through fourteenth type of non-volatile memory cell 980, 985, 986, 955, 956 or 958 has the data output at a logic level of "0" at its node L44, L45, L56, L64, L65 or L78, its data input at the node $S_i$ may have a same logic level as its data output at the node $T_i$ when data is transmitted from the node $S_i$ to the node $T_i$, or its data input at the node $T_i$ may have a same logic level as its data output at the node $S_i$ when data is transmitted from the node $T_i$ to the node $S_i$; when its any ninth through fourteenth type of non-volatile memory cell 980, 985, 986, 955, 956 or 958 has the data output at a logic level of "1" at its node L44, L45, L56, L64, L65 or L78, its data input at the node $S_i$ may have an opposite logic level to its data output at the node T; when data is transmitted from the node $S_i$ to the node $T_i$, or its data input at the node $T_i$ may have an opposite logic level to its data output at the node $S_i$ when data is transmitted from the node $T_i$ to the node $S_i$.

Alternatively, referring to FIG. 23A, for each of the cryptography units 513 of the second type of cryptography block 512, its first type of latched non-volatile memory cell 940 may be replaced with a write-only memory cell.

Thereby, referring to FIG. 23A, based on the second password, for decryption the second type of cryptography block 512 may have multiple data inputs at its input points, i.e., its nodes $S_1$-$S_I$, each to be decrypted by one of its cryptography units 513 as one of its data outputs at its output points, i.e., its nodes $T_1$-$T_I$. Based on the second password, for encryption the second type of cryptography block 512 may have multiple data inputs at its input points, i.e., its nodes $T_1$-$T_I$, each to be encrypted by one of its cryptography units 513 as one of its data outputs at its output points, i.e., its nodes $S_1$-$S_I$.

FIG. 23B illustrates a cryptography inverter matrix in an original state for a second type of cryptography block in accordance with an embodiment of the present application. FIG. 23C illustrates a cryptography inverter matrix in an encryption/decryption state for a second type of cryptography block in accordance with an embodiment of the present application. Referring to FIGS. 23B and 23C, in an example, the second type of cryptography block 512 may include eight cryptography units 513 arranged in a line, that is, the number "I" equals 8. The cryptography units 513 of the second type of cryptography block 512 as seen in FIG. 23A may be arranged in a line at corresponding positions to those of multiple numbers arranged in a line in a cryptography inverter matrix as seen in FIG. 23B or 23C. For the second type of cryptography block 512, the state of the pair of exclusive-or (XOR) gates 514 as illustrated in FIG. 23A or 23B for each of its cryptography units 513 at a fifth ordinal number i of position in sequence in the line may be represented by one of the numbers at a sixth ordinal number of position in sequence in a line in a cryptography inverter matrix as seen in FIG. 23B or 23C, wherein the fifth ordinal number is the same as the sixth ordinal number, to indicate whether its data input at one $S_i$ of its nodes $S_1$-$S_I$ is inverted by said each of its cryptography units 513 as its data output at one $T_i$ of its nodes $T_1$-$T_I$ or passed by said each of its cryptography units 513 as its data output at said one $T_i$ of its nodes $T_1$-$T_I$ having the same logic level as that of its data input at one $S_i$ of its nodes $S_1$-$S_I$ and/or to indicate whether its data input at said one $T_i$ of its nodes $T_1$-$T_I$ is inverted by said each of its cryptography units 513 as its data output at said one $S_i$ of its nodes $S_1$-$S_I$ or passed by said each of its cryptography units 513 as its data output at said one $S_i$ of its nodes $S_1$-$S_I$ having the same logic level as that of its data input at said one $T_i$ of its nodes $T_1$-$T_I$. When one of its cryptography units 513 at the fifth ordinal number i of position in sequence in the line as seen in FIG. 23A is switched to invert its data input at said one $S_i$ of its nodes $S_1$-$S_I$ as its data output at said one $T_i$ of its nodes $T_1$-$T_I$ and/or to invert its data input at said one $T_i$ of its nodes $T_1$-$T_I$ as its data output at said one $S_i$ of its nodes $S_1$-$S_I$, said one of the numbers at the sixth ordinal number of position in sequence in the line in the cryptography inverter matrix as seen in FIG. 23B or 23C may be shown with "0". When one of its cryptography units 513 at the fifth ordinal number i of position in sequence in the line as seen in FIG. 23A is switched to pass its data input at said one $S_i$ of its nodes $S_1$-$S_I$ as its data output at said one $T_i$ of its nodes $T_1$-$T_I$ having the same logic level as its data input at said one $S_i$ of its nodes $S_1$-$S_I$ and/or to pass its data input at said one $T_i$ of its nodes $T_1$-$T_I$ as its data output at said one $S_i$ of its nodes $S_1$-$S_I$ having the same logic level as its data input at said one $T_i$ of its nodes $T_1$-$T_I$, said one of the numbers at the sixth ordinal number of position in sequence in the line in the cryptography inverter matrix as seen in FIG. 23B or 23C may be shown with "1". For example, when one of its cryptography units 513 at the first position in sequence in the line as seen in FIG. 23A is switched to pass its data input at its node S, as its data output at its node $T_i$ having the same logic level as its data input at its node $S_i$ and to pass its data input at its node $T_i$ as its data output at its node S, having the same logic level as its data input at its node $T_1$, the number at the first position in sequence in the line in the cryptography inverter matrix as seen in FIG. 23B may be shown with "1"; when one of its cryptography units 513 at the first position in sequence in the line as seen in FIG. 23A is switched to invert its data input at its node $S_i$ as its data output at its node $T_i$ and to invert its data input at its node $T_i$ as its data output at its node $S_1$, the number at the first position in sequence in the line in the cryptography inverter matrix as seen in FIG. 23C may be shown with "0".

Referring to FIG. 23B, for the cryptography inverter matrix in an original state, all of the numbers in the cryptography inverter matrix are shown with "1". Accordingly, the second type of cryptography block 512 in the original state may pass its data inputs at its nodes $S_1$-$S_I$ as its data outputs at its nodes $T_1$-$T_I$ respectively, wherein its data inputs at its nodes $S_1$-$S_I$ may have the same logic levels as those of its data outputs at its nodes $T_1$-$T_I$ respectively, and/or pass its data inputs at its nodes $T_1$-$T_I$ as its data outputs at its nodes $S_1$-$S_I$ respectively, wherein its data inputs at its nodes $T_1$-$T_I$ may have the same logic levels as those of its data outputs at its nodes $S_1$-$S_I$ respectively.

Referring to FIG. 23C, for the cryptography inverter matrix in an encryption/decryption state, some of the numbers in the cryptography inverter matrix are shown with "1" and some of the numbers in the cryptography inverter matrix are shown with "0". Accordingly, the second type of cryptography block 512 in the encryption/decryption state may invert its data inputs at a first group of its nodes $S_1$-$S_I$ as its data outputs at a first group of its nodes $T_1$-$T_I$ respectively and pass its data inputs at a second group of its nodes $S_1$-$S_I$ as its data outputs at a second group of its nodes $T_1$-$T_I$ respectively, wherein its data inputs at the second group of its nodes $S_1$-$S_I$ may have the same logic levels as those of its data outputs at the second group of its nodes $T_1$-$T_I$ respectively. Further, the second type of cryptography block 512 in the encryption/decryption state may invert its data inputs at the first group of its nodes $T_1$-$T_I$ as its data outputs at the first group of its nodes $S_1$-$S_I$ respectively and pass its data inputs at the second group of its nodes $T_1$-$T_I$ as its data outputs at the second group of its nodes $S_1$-$S_I$ respectively, wherein its data inputs at the second group of its nodes $T_1$-$T_I$ may have the same logic levels as those of its data outputs at the second group of its nodes $S_1$-$S_I$ respectively. Thereby, the second type of cryptography block 512 may provide $(2^I-1)$ second passwords to decrypt its data inputs at its nodes $S_1$-$S_I$ as its data outputs at its nodes $T_1$-$T_I$ and to encrypt its data inputs at its nodes $T_1$-$T_I$ as its data outputs at its nodes $S_1$-$S_I$. For the number "1" equal to 8, the second type of cryptography block 512 may provide 255 $(2^8-1)$ second passwords to decrypt its data inputs at its nodes $S_1$-$S_8$ as its data outputs at its nodes $T_1$-$T_8$ and to encrypt its data inputs at its nodes $T_1$-$T_8$ as its data outputs at its nodes $S_1$-$S_8$.

(3) Third Type of Cryptography Block

Figure 24:
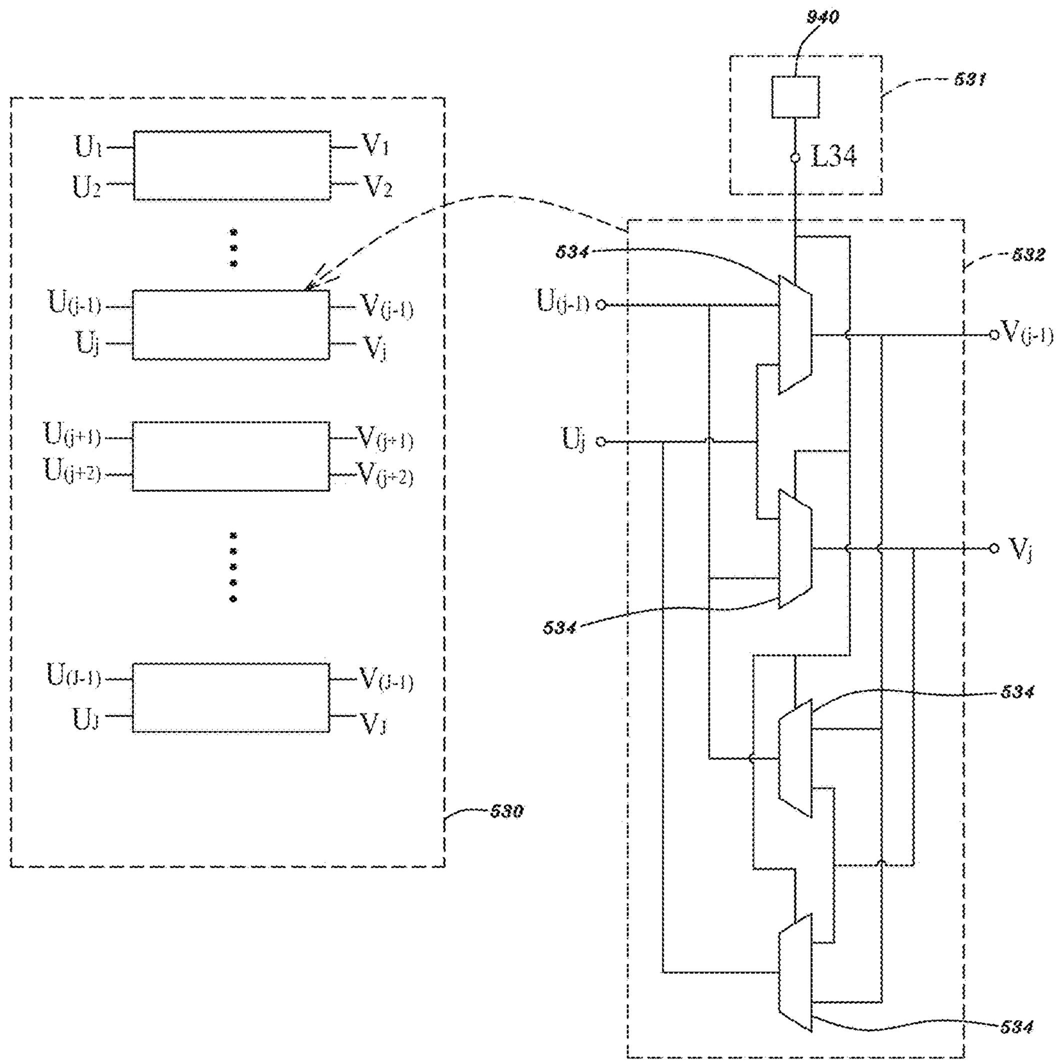
FIGS. 24 and 25 are schematic views showing third and fourth types of cryptography blocks respectively in accordance with an embodiment of the present application.

FIG. 24 is a schematic view showing a third type of cryptography block in accordance with an embodiment of the present application. Referring to FIG. 24, a third type of cryptography block 530, i.e., encryption/decryption circuit or security circuit, may include multiple cryptography units 531, i.e., bits-swap units, arranged in a line having the number of J/2 ranging from 2 to 8, such as 4. Referring to FIG. 24, for the third type of cryptography block 530, each of its cryptography units 531 may include (1) a first pair of multiplexers 532, a first one of which is configured to receive first and second data inputs at respective first and second input points thereof at respective neighboring two $U_{(j-1)}$ and $U_j$ of its nodes $U_1$-$U_J$, and a second one of which is configured to receive the second and first data inputs at respective first and second input points thereof at its two respective neighboring nodes $U_{(j-1)}$ and $U_j$, wherein the first one of the first pair of its multiplexers 532 is configured to select, in accordance with a digit of a third password at a third input point thereof, a data input from the first and second data inputs thereof at its two respective neighboring nodes $U_{(j-1)}$ and $U_j$ as a data output thereof at an output point thereof at one $V_{(j-1)}$ of its nodes $V_1$-$V_J$, and the second one of the first pair of its multiplexers 532 is configured to select, in accordance with the digit of the third password at a third input point thereof, the other data input from the second and first data inputs thereof at its two respective neighboring nodes $U_{(j-1)}$ and $U_j$ as a data output thereof at an output point thereof at one $V_j$ of its nodes $V_1$-$V_J$, wherein its node Vj neighbors its node $V_{(j-1)}$, (2) a second pair of multiplexers 534, a first one of which is configured to receive first and second data inputs at respective first and second input points thereof at respective neighboring two $V_{(j-1)}$ and $V_j$ of its nodes $V_1$-$V_J$, and a second one of which is configured to receive the second and first data inputs at respective first and second input points thereof at its two respective neighboring nodes $V_{(j-1)}$ and $V_j$, wherein the first one of the second pair of its multiplexers 534 is configured to select, in accordance with the digit of the third password at a third input point thereof, a data input from the first and second data inputs thereof at its two respective neighboring nodes $V_{(j-1)}$ and $V_j$ as a data output thereof at an output point thereof at one $U_{(j-1)}$ of its nodes $U_1$-$U_J$, and the second one of the second pair of its multiplexers 534 is configured to select, in accordance with the digit of the third password at a third input point thereof, the other data input from the second and first data inputs thereof at its two respective neighboring nodes $V_{(j-1)}$ and $V_j$ as a data output thereof at an output point thereof at one $U_j$ of its nodes $U_1$-$U_J$, and (3) the first type of latched non-volatile memory cell 940 as illustrated in FIG. 11A having the node L34 coupling to the third input point of each of the first and second pairs of its multiplexers 532 and 534. The number of its nodes $U_1$-$U_j$ may be equal to the number of its nodes $V_1$-$V_J$.

Referring to FIGS. 11A and 24, for the first type of latched non-volatile memory cell 940 of said each of the cryptography units 531, its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, is configured to store a digit of the third password therein. At an initial state, its node L36 may be switched to couple to the voltage Vcc of power supply to turn on its P-type and N-type MOS transistors 773 and 774 and its pass/no-pass switches 292. Thus, its node L31 may be coupled to the voltage Vcc of power supply through its P-type MOS transistor 773 and its node L32 may be coupled to the voltage Vss of ground reference through its N-type MOS transistor 774. Its non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 may have the data output, associated with the digit of the third password, at the node L33 as seen in FIG. 11A to be passed to its memory cell 446 via its two stages of inverters 770 and pass/no-pass switches 292 to be stored in its memory cell 446. In operation, its node L36 may be switched to couple to the voltage Vss of ground reference to turn off the P-type and N-type MOS transistors 773 and 774 and the pass/no-pass switches 292. The first pair of multiplexers 532 of said each of the cryptography units 531 may control, in accordance with its data output at the node L34, an interchange of two data inputs of said each of the cryptography units 531 at the two neighboring nodes $U_{(j-1)}$ and $U_j$ as two data outputs of said each of the cryptography units 531 at the two neighboring nodes $V_{(j-1)}$ and $V_j$, and the second pair of multiplexers 532 of said each of the cryptography units 531 may control, in accordance with its data output at the node L34, an interchange of two data inputs of said each of the cryptography units 531 at the two neighboring nodes $V_{(j-1)}$ and $V_j$ as two data outputs of said each of the cryptography units 531 at the two neighboring nodes $U_{(j-1)}$ and Up. For example, for said each of the cryptography units 531, when the non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 has the data output at a logic level of "0" at its node L33 to be passed to the memory cell 446 of its first type of latched non-volatile memory cell 940 at the initial state, the first one of the first pair of its multiplexers 532 is configured to select, in accordance with the data output of its first type of latched non-volatile memory cell 940 at the node L34, the second data input thereof at the second input point thereof at the node $U_j$ as a data output thereof at the output point thereof at the node $V_{(j-1)}$, the second one of the first pair of its multiplexers 532 is configured to select, in accordance with the data output of its first type of latched non-volatile memory cell 940 at the node L34, the second data input thereof at the second input point thereof at the node $U_{(j-1)}$ as a data output thereof at the output point thereof at the node $V_j$, the first one of the second pair of its multiplexers 534 is configured to select, in accordance with the data output of its first type of latched non-volatile memory cell 940 at the node L34, the second data input thereof at the second input point thereof at the node $V_j$ as a data output thereof at the output point thereof at the node $U_{(j-1)}$, and the second one of the second pair of its multiplexers 534 is configured to select, in accordance with the data output of its first type of latched non-volatile memory cell 940 at the node L34, the second data input thereof at the second input point thereof at the node $V_{(j-1)}$ as a data output thereof at the output point thereof at the node $U_j$. Thereby, two data inputs of the third type of cryptography block 530 at the two respective neighboring nodes $U_{(j-1)}$ and $U_j$ may be interchanged in order by said each of the cryptography units 531 as two data outputs of the third type of cryptography block 530 at the two respective neighboring nodes $V_j$ and $V_{(j-1)}$, and two data inputs of the third type of cryptography block 530 at the two respective neighboring nodes $V_{(j-1)}$ and $V_j$ may be interchanged in order by said each of the cryptography units 531 as two data outputs of the third type of cryptography block 530 at the two respective neighboring nodes $U_j$ and $U_{(j-1)}$. When the non-volatile memory cell, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its first type of latched non-volatile memory cell 940 may have the data output at a logic level of "1" at its node L33 to be passed to the memory cell 446 of its first type of latched non-volatile memory cell 940 at the initial state, the first one of the first pair of its multiplexers 532 is configured to select, in accordance with the data output of its first type of latched non-volatile memory cell 940 at the node L34, the first data input thereof at the first input point thereof at the node $U_{(j-1)}$ as a data output thereof at the output point thereof at the node $V_{(j-1)}$, the second one of the first pair of its multiplexers 532 is configured to select, in accordance with the data output of its first type of latched non-volatile memory cell 940 at the node L34, the first data input thereof at the first input point thereof at the node $U_j$ as a data output thereof at the output point thereof at the node $V_j$, the first one of the second pair of its multiplexers 534 is configured to select, in accordance with the data output of its first type of latched non-volatile memory cell 940 at the node L34, the first data input thereof at the first input point thereof at the node $V_{(j-1)}$ as a data output thereof at the output point thereof at the node $U_{(j-1)}$, the second one of the second pair of its multiplexers 534 is configured to select, in accordance with the data output of its first type of latched non-volatile memory cell 940 at the node L34, the first data input thereof at the first input point thereof at the node $V_j$ as a data output thereof at the output point thereof at the node $U_j$. Thereby, two data inputs of the third type of cryptography block 530 at the two respective neighboring nodes $U_{(j-1)}$ and $U_j$ may not be interchanged in order by said each of the cryptography units 531 as two data outputs of the third type of cryptography block 530 at the two respective neighboring nodes $V_{(j-1)}$ and $V_j$, and two data inputs of the third type of cryptography block 530 at the two respective neighboring nodes $V_{(j-1)}$ and $V_j$ may not be interchanged in order by said each of the cryptography units 531 as two data outputs of the third type of cryptography block 530 at the two respective neighboring nodes $U_{(j-1)}$ and $U_j$.

Alternatively, referring to FIG. 24, for each of the cryptography units 531 of the third type of cryptography block 530, its first type of latched non-volatile memory cell 940 may be replaced with the second type of latched non-volatile memory cell 950 as illustrated in FIG. 11B, which is configured to be programmed to save or store a digit of the third password therein. Its second type of latched non-volatile memory cell 950 may have the node L3 coupling to the third input point of each of the first and second pairs of its multiplexers 532 and 534.

Referring to FIGS. 11B and 24, for the second type of latched non-volatile memory cell 950 of said each of the cryptography units 531, its two non-volatile memory cells, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, are configured to store opposite logic levels representing a digit of the third password therein. At an initial state, its node EQ may be switched to couple to the voltage Vcc of power supply to turn off its P-type and N-type MOS transistors 775 and 776 and to turn on its P-type MOS transistors 774. Thereby, the gate terminals of the two pairs of P-type and N-type MOS transistors 447 and 448 of its memory cell 446 may be coupled to the voltage Vcc of power supply through its P-type MOS transistors 774 to be pre-charged at a logic level of "1" to turn on the N-type MOS transistors 448 of its memory cell 446 and to turn off the P-type MOS transistors 447 of its memory cell 446. In operation, its node EQ may be switched to couple to the voltage Vss of ground reference to turn on its P-type and N-type MOS transistors 775 and 776 and to turn off its P-type MOS transistors 774. Thus, its nodes L2 and L22 may be coupled to the voltage Vss of ground reference through its N-type MOS transistors 448 at the beginning in operation. At this time, one of its two non-volatile memory cells at one of the right and left sides of its memory cell 446 may first generate the data output at a logic level of "0" to the gate terminals of its P-type and N-type MOS transistors 447 and 448 at the other of the right and left sides of its memory cell 446 to turn on its P-type MOS transistor 447 at the other of the right and left sides of its memory cell 446 and off its N-type MOS transistor 448 at the other of the right and left sides of its memory cell 446, and the other of its two non-volatile memory cells at the other of the right and left sides of its memory cell 446 may generate the data output at a logic level of "1" to the gate terminals of its P-type and N-type MOS transistors 447 and 448 at said one of the right and left sides of its memory cell 446 to turn on its N-type MOS transistor 448 at said one of the right and left sides of its memory cell 446 and off its P-type MOS transistor 447 at said one of the right and left sides of its memory cell 446. The first pair of multiplexers 532 of said each of the cryptography units 531 may control, in accordance with its data output at the node L3, an interchange of two data inputs of said each of the cryptography units 531 at the two neighboring nodes $U_{(j-1)}$ and $U_j$ as two data outputs of said each of the cryptography units 531 at the two neighboring nodes $V_{(j-1)}$ and $V_j$, and the second pair of multiplexers 532 of said each of the cryptography units 531 may control, in accordance with its data output at the node L3, an interchange of two data inputs of said each of the cryptography units 531 at the two neighboring nodes $V_{(j-1)}$ and $V_j$ as two data outputs of said each of the cryptography units 531 at the two neighboring nodes $U_{(j-1)}$ and Up. For example, for said each of the cryptography units 531, in operation when a right one of the two non-volatile memory cells, such as 600, 650, 700, 721, 760, 800, 900 or 910 as seen in FIG. 2A-2C, 3A-3C, 4A-4C, 5A-5F, 6A-6C, 7A-7D, 8A-8G, 9A-9J or 10A-10N, of its second type of latched non-volatile memory cell 950 has the data output at a logic level of "0" at its node L3 and a left one of the two non-volatile memory cells of its second type of latched non-volatile memory cell 950 may have the data output at a logic level of "1" at its node L23, the first one of the first pair of its multiplexers 532 is configured to select, in accordance with the data output of its second type of latched non-volatile memory cell 950 at the node L3, the second data input thereof at the second input point thereof at the node $U_j$ as a data output thereof at the output point thereof at the node $V_{(j-1)}$, the second one of the first pair of its multiplexers 532 is configured to select, in accordance with the data output of its second type of latched non-volatile memory cell 950 at the node L3, the second data input thereof at the second input point thereof at the node $U_{(j-1)}$ as a data output thereof at the output point thereof at the node $V_j$, the first one of the second pair of its multiplexers 534 is configured to select, in accordance with the data output of its second type of latched non-volatile memory cell 950 at the node L3, the second data input thereof at the second input point thereof at the node $V_j$ as a data output thereof at the output point thereof at the node $U_{(j-1)}$, and the second one of the second pair of its multiplexers 534 is configured to select, in accordance with the data output of its second type of latched non-volatile memory cell 950 at the node L3, the second data input thereof at the second input point thereof at the node $V_{(j-1)}$ as a data output thereof at the output point thereof at the node $U_j$. Thereby, two data inputs of the third type of cryptography block 530 at the two respective neighboring nodes $U_{(j-1)}$ and $U_j$ may be interchanged in order by said each of the cryptography units 531 as two data outputs of the third type of cryptography block 530 at the two respective neighboring nodes $V_j$ and $V_{(j-1)}$, and two data inputs of the third type of cryptography block 530 at the two respective neighboring nodes $V_{(j-1)}$ and $V_j$ may be interchanged in order by said each of the cryptography units 531 as two data outputs of the third type of cryptography block 530 at the two respective neighboring nodes $U_j$ and $U_{(j-1)}$. When the right one of the two non-volatile memory cells of its second type of latched non-volatile memory cell 950 may have the data output at a logic level of "1" at its node L3 and a left one of the two non-volatile memory cells of its second type of latched non-volatile memory cell 950 may have the data output at a logic level of "0" at its node L23, the first one of the first pair of its multiplexers 532 is configured to select, in accordance with the data output of its second type of latched non-volatile memory cell 950 at the node L3, the first data input thereof at the first input point thereof at the node $U_{(j-1)}$ as a data output thereof at the output point thereof at the node $V_{(j-1)}$, the second one of the first pair of its multiplexers 532 is configured to select, in accordance with the data output of its second type of latched non-volatile memory cell 950 at the node L3, the first data input thereof at the first input point thereof at the node $U_j$ as a data output thereof at the output point thereof at the node $V_j$, the first one of the second pair of its multiplexers 534 is configured to select, in accordance with the data output of its second type of latched non-volatile memory cell 950 at the node L3, the first data input thereof at the first input point thereof at the node $V_{(j-1)}$, as a data output thereof at the output point thereof at the node $U_{(j-1)}$, the second one of the second pair of its multiplexers 534 is configured to select, in accordance with the data output of its second type of latched non-volatile memory cell 950 at the node L3, the first data input thereof at the first input point thereof at the node $V_j$ as a data output thereof at the output point thereof at the node $U_j$. Thereby, two data inputs of the third type of cryptography block 530 at the two respective neighboring nodes $U_{(j-1)}$ and $U_j$ may not be interchanged in order by said each of the cryptography units 531 as two data outputs of the third type of cryptography block 530 at the two respective neighboring nodes $V_{(j-1)}$ and $V_j$, and two data inputs of the third type of cryptography block 530 at the two respective neighboring nodes $V_{(j-1)}$ and $V_j$ may not be interchanged in order by said each of the cryptography units 531 as two data outputs of the third type of cryptography block 530 at the two respective neighboring nodes $U_{(j-1)}$ and $U_j$.

Alternatively, referring to FIG. 24, for each of the cryptography units 531 of the third type of cryptography block 530, its first type of latched non-volatile memory cell 940 may be replaced with any of the ninth through eleventh types of non-volatile memory cells 980, 985 and 986 as illustrated in FIGS. 13A-13C respectively and the twelfth through fourteenth types of non-volatile memory cells 955, 956 and 958 as illustrated in FIGS. 14B-14D respectively, which is configured to be programmed to store a digit of the second password therein. In operation, said each of the cryptography units 531 may include (1) the ninth type of non-volatile memory cell 980 having the output point L44 associated with a digit of the third password stored therein and coupling to the third input point of each of the first and second pairs of its multiplexers 532 and 534, (2) the tenth type of non-volatile memory cell 985 having the output point L45 associated with a digit of the third password stored therein and coupling to the third input point of each of the first and second pairs of its multiplexers 532 and 534, (3) the eleventh type of non-volatile memory cell 986 having the output point L56 associated with a digit of the third password stored therein and coupling to the third input point of each of the first and second pairs of its multiplexers 532 and 534, (4) the twelfth type of non-volatile memory cell 955 having the output point L64 associated with a digit of the third password stored therein and coupling to the third input point of each of the first and second pairs of its multiplexers 532 and 534, (5) the thirteenth type of non-volatile memory cell 956 having the output point L65 associated with a digit of the third password stored therein and coupling to the third input point of each of the first and second pairs of its multiplexers 532 and 534, or (6) the fourteenth type of non-volatile memory cell 958 having the output point L78 associated with a digit of the third password stored therein and coupling to the third input point of each of the first and second pairs of its multiplexers 532 and 534. The first pair of its multiplexers 532 may control, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, an interchange of its two data inputs at the two neighboring nodes $U_{(j-1)}$ and $U_j$ as its two data outputs at the two neighboring nodes $V_{(j-1)}$ and $V_j$, and the second pair of its multiplexers 532 may control, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, an interchange of its two data inputs at the two neighboring nodes $V_{(j-1)}$ and $V_j$ as its two data outputs at the two neighboring nodes $U_{(j-1)}$ and $U_j$. For example, for said each of the cryptography units 531, in operation when its any ninth through fourteenth type of non-volatile memory cell 980, 985, 986, 955, 956 or 958 has the data output at a logic level of "0" at its node L44, L45, L56, L64, L65 or L78, the first one of the first pair of its multiplexers 532 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the second data input thereof at the second input point thereof at the node $U_j$ as a data output thereof at the output point thereof at the node $V_{(j-1)}$, the second one of the first pair of its multiplexers 532 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the second data input thereof at the second input point thereof at the node $U_{(j-1)}$ as a data output thereof at the output point thereof at the node $V_j$, the first one of the second pair of its multiplexers 534 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the second data input thereof at the second input point thereof at the node $V_j$ as a data output thereof at the output point thereof at the node $U_{(j-1)}$, and the second one of the second pair of its multiplexers 534 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the second data input thereof at the second input point thereof at the node $V_{(j-1)}$ as a data output thereof at the output point thereof at the node $U_j$. Thereby, two data inputs of the third type of cryptography block 530 at the two respective neighboring nodes $U_{(j-1)}$ and $U_j$ may be interchanged in order by said each of the cryptography units 531 as two data outputs of the third type of cryptography block 530 at the two respective neighboring nodes $V_j$ and $V_{(j-1)}$), and two data inputs of the third type of cryptography block 530 at the two respective neighboring nodes V0.1) and $V_j$ may be interchanged in order by said each of the cryptography units 531 as two data outputs of the third type of cryptography block 530 at the two respective neighboring nodes $U_j$ and $U_{(j-1)}$. When its any ninth through fourteenth type of non-volatile memory cell 980, 985, 986, 955, 956 or 958 has the data output at a logic level of "1" at its node L44, L45, L56, L64, L65 or L78, the first one of the first pair of its multiplexers 532 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the first data input thereof at the first input point thereof at the node $U_{(j-1)}$ as a data output thereof at the output point thereof at the node $V_{(j-1)}$, the second one of the first pair of its multiplexers 532 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the first data input thereof at the first input point thereof at the node $U_j$ as a data output thereof at the output point thereof at the node $V_j$, the first one of the second pair of its multiplexers 534 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the first data input thereof at the first input point thereof at the node $V_{(j-1)}$ as a data output thereof at the output point thereof at the node $U_{(j-1)}$, the second one of the second pair of its multiplexers 534 is configured to select, in accordance with the data output of its any ninth through fourteenth type of non-volatile memory cell 980, 985, 986, 955, 956 or 958 at the output point L44, L45, L56, L64, L65 or L78 of its any ninth through fourteenth type of non-volatile memory cell 980, 985, 986, 955, 956 or 958, the first data input thereof at the first input point thereof at the node $V_j$ as a data output thereof at the output point thereof at the node $U_j$. Thereby, two data inputs of the third type of cryptography block 530 at the two respective neighboring nodes $U_{(j-1)}$ and $U_j$ may not be interchanged in order by said each of the cryptography units 531 as two data outputs of the third type of cryptography block 530 at the two respective neighboring nodes $V_{(j-1)}$ and $V_j$, and two data inputs of the third type of cryptography block 530 at the two respective neighboring nodes $V_{(j-1)}$ and $V_j$ may not be interchanged in order by said each of the cryptography units 531 as two data outputs of the third type of cryptography block 530 at the two respective neighboring nodes $U_{(j-1)}$ and $U_j$.

Alternatively, referring to FIG. 24, for each of the cryptography units 531 of the third type of cryptography block 530, its first type of latched non-volatile memory cell 940 may be replaced with a write-only memory cell.

(4) Fourth Type of Cryptography Block

Figure 25:
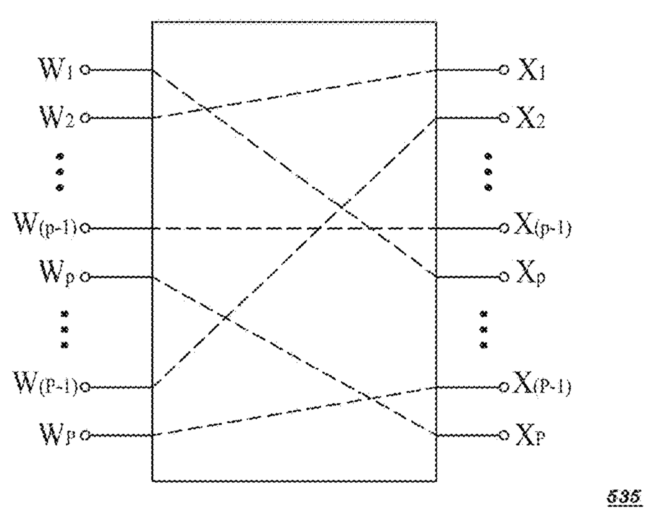

FIG. 25 is a schematic view showing a fourth type of cryptography block in accordance with an embodiment of the present application. Referring to FIG. 25, a fourth type of cryptography block 535, i.e., encryption/decryption circuit or security circuit, may be a fixed-wired bits-swap circuit coupling each of its nodes $W_1$-$W_P$, having the number ranging from 2 to 8, to one of its nodes $X_1$-$X_P$, having the number ranging from 2 to 8, via a fixed wire. The fourth type of cryptography block 535 may change its data inputs at its nodes $W_1$-$W_P$ in order as its data outputs at its nodes $X_1$-$X_P$, and may change its data inputs at its nodes $X_1$-$X_P$ in order as its data outputs at its nodes $W_1$-$W_P$.

Specification for Combined Cryptography Block

Figure 26A:
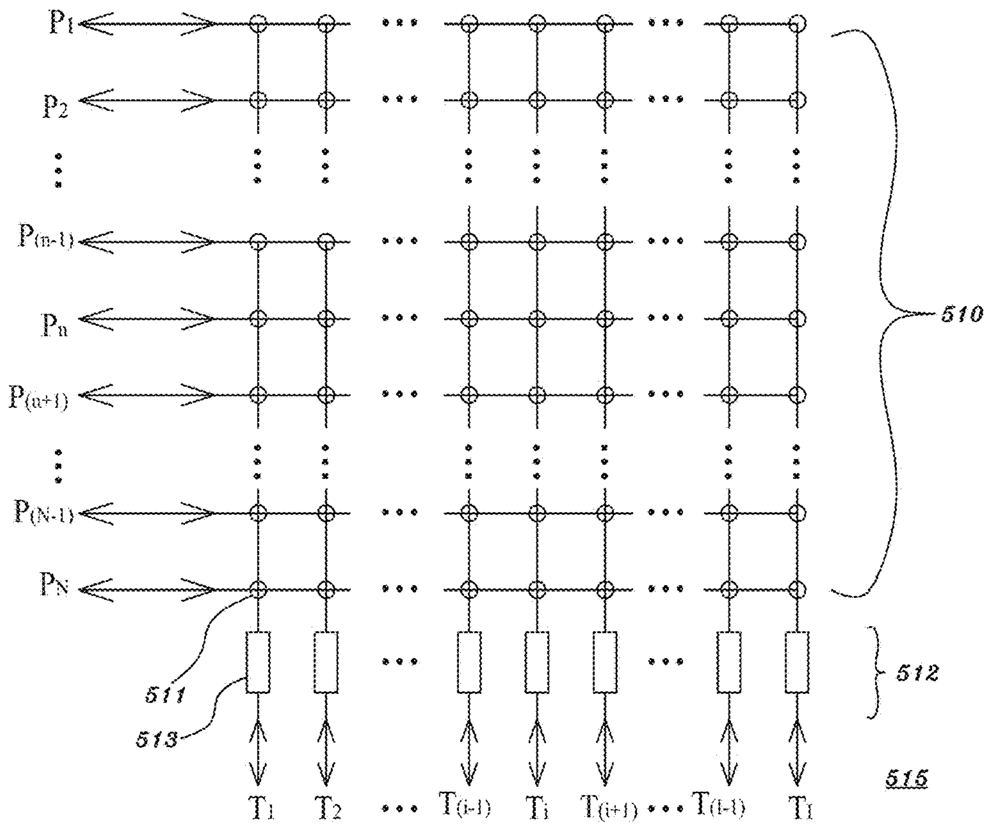
FIGS. 26A-26C are schematic views showing various combinations of first through fourth types of cryptography blocks in accordance with various embodiments of the present application.
Figure 26B:
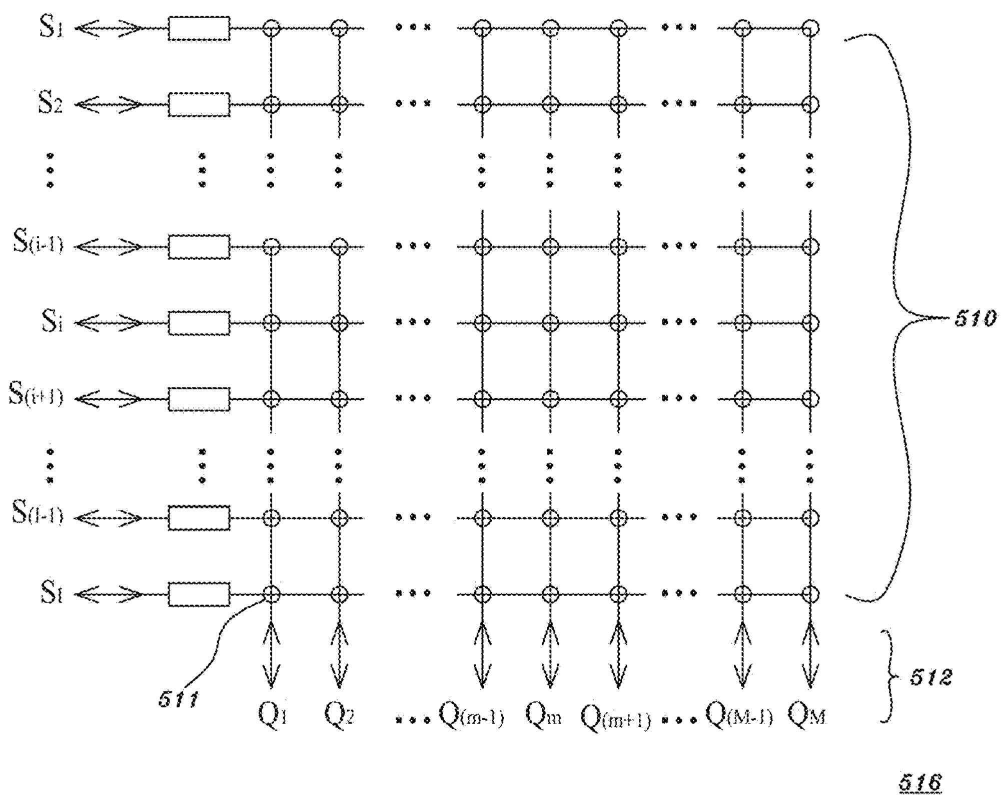
Figure 26C:
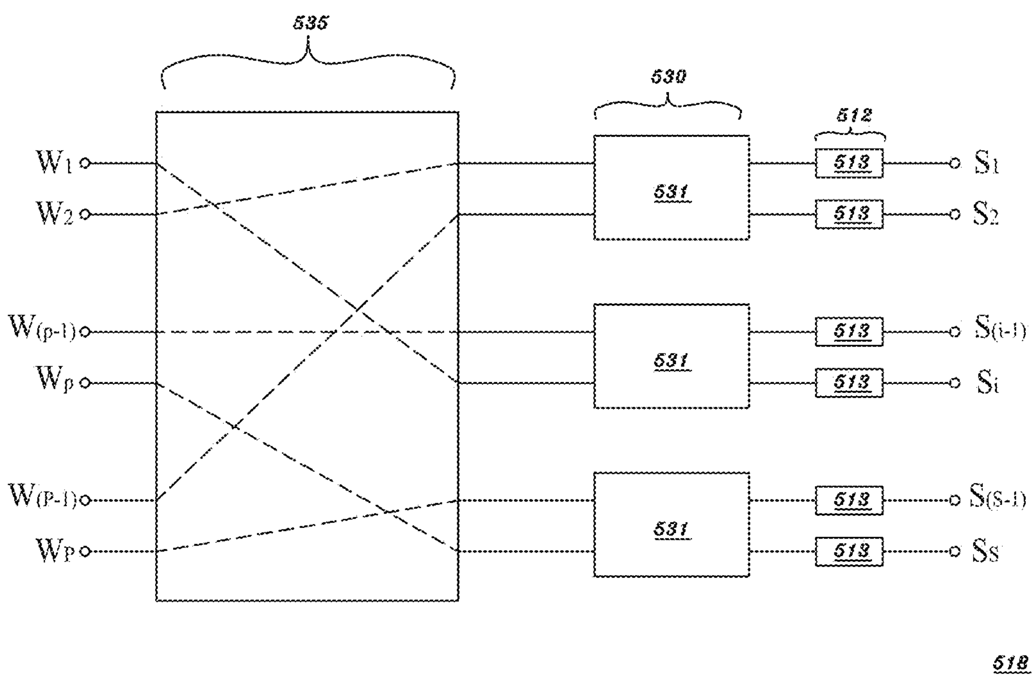

Two, three or all from the first through fourth types of cryptography blocks 510, 512, 530 and 535 as illustrated in FIGS. 22A-22D, 23A-23C, 24 and 25 may be selected to be coupled to each other or one another in any sequence to form a combined cryptography block. FIGS. 26A-26C are schematic views showing various combinations of first through fourth types of cryptography blocks in accordance with various embodiments of the present application. Referring to FIG. 26A, a first combined cryptography block 515 may include the second type of cryptography block 512 and the first type of cryptography block 510 having the nodes $Q_1$-$Q_M$ coupling respectively to the nodes $S_1$-$S_M$ of its second type of cryptography block 512 to perform multi-level encryption and multi-level decryption, wherein the number of the nodes $Q_1$-$Q_M$ of its first type of cryptography block 510 may be equal to the number of the nodes $S_1$-$S_I$ of its second type of cryptography block 512. Thereby, for decryption, the first combined cryptography block 515 may have multiple data inputs at its input points at the nodes $P_1$-$P_N$ of its first type of cryptography block 510, to be decrypted in sequence by the cryptography units 511 of its first type of cryptography block 510 in accordance with its first password and by the cryptography units 513 of its second type of cryptography block 512 in accordance with its second password as multiple data outputs at its output points at the nodes $T_1$-$T_I$ of its second type of cryptography block 512. For encryption, the first combined cryptography block 515 may have multiple data inputs at its input points at the nodes $T_1$-$T_I$ of its second type of cryptography block 512, to be encrypted in sequence by the cryptography units 513 of its second type of cryptography block 512 in accordance with its second password and by the cryptography units 511 of its first type of cryptography block 510 in accordance with its first password as multiple data outputs at its output points at the nodes $P_1$-$P_N$ of its first type of cryptography block 510.

Thereby, referring to FIG. 26A, the first combined cryptography block 515 may provide ($N!2^I-1$) passwords to decrypt its data inputs at its nodes $P_1$-$P_N$ as its data outputs at its nodes $T_1$-$T_I$ and to encrypt its data inputs at its nodes $T_1$-$T_I$ as its data outputs at its nodes $P_1$-$P_N$. For both of the numbers "N" and "I" equal to 8, the first combined cryptography block 515 may provide 10,321,919 ($8!2^8-1$) passwords to decrypt its data inputs at its nodes $P_1$-$P_8$ as its data outputs at its nodes $T_1$-$T_8$ and to encrypt its data inputs at its nodes $T_1$-$T_8$ as its data outputs at its nodes $P_1$-$P_8$.

Alternatively, referring to FIG. 26B, a second combined cryptography block 516 may include the second type of cryptography block 512 and the first type of cryptography block 510 having the nodes $P_1$-$P_N$ coupling respectively to the nodes $T_1$-$T_I$ of its second type of cryptography block 512 to perform multi-level encryption and multi-level decryption, wherein the number of the nodes $P_1$-$P_N$ of its first type of cryptography block 510 may be equal to the number of the nodes $T_1$-$T_I$ of its second type of cryptography block 512. Thereby, for decryption, the second combined cryptography block 516 may have multiple data inputs at its input points at the nodes $S_1$-$S_I$ of its second type of cryptography block 512, to be decrypted by in sequence the cryptography units 513 of its second type of cryptography block 512 in accordance with its second password and by the cryptography units 511 of its first type of cryptography block 510 in accordance with its first password as multiple data outputs at its output points at the nodes $Q_1$-$Q_M$ of its first type of cryptography block 510. For encryption, the second combined cryptography block 516 may have multiple data inputs at its input points at the nodes $Q_1$-$Q_M$ of its first type of cryptography block 510, to be encrypted in sequence by the cryptography units 511 of its first type of cryptography block 510 in accordance with its first password and by the cryptography units 513 of its second type of cryptography block 512 in accordance with its second password as multiple data outputs at its output points at the nodes $S_1$-$S_I$ of its second type of cryptography block 512.

Thereby, referring to FIG. 26B, the second combined cryptography block 516 may provide ($2^IM!-1$) passwords to decrypt its data inputs at its nodes $S_1$-$S_I$ as its data outputs at its nodes $Q_1$-$Q_M$ and to encrypt its data inputs at its nodes $Q_1$-$Q_M$ as its data outputs at its nodes $S_1$-$S_I$. For both of the numbers "I" and "M" equal to 8, the second combined cryptography block 516 may provide 10,321,919 ($2^88!-1$) passwords to decrypt its data inputs at its nodes $S_1$-$S_8$ as its data outputs at its nodes $Q_1$-$Q_8$ and to encrypt its data inputs at its nodes $Q_1$-$Q_8$ as its data outputs at its nodes $S_1$-$S_8$.

Alternatively, referring to FIG. 26C, a third combined cryptography block 518 may include the second type of cryptography block 512, the third type of cryptography block 530 having the nodes $V_1$-$V_J$ coupling respectively to the nodes $T_1$-$T_I$ of its second type of cryptography block 512, and the fourth type of cryptography block 535 having the nodes $X_1$-$X_P$ coupling respectively to the nodes $U_1$-$U_J$ of its third type of cryptography block 530 so as to perform multi-level encryption and multi-level decryption, wherein the number of the nodes $V_1$-$V_J$ of its third type of cryptography block 530 may be equal to the number of the nodes $T_1$-$T_I$ of its second type of cryptography block 512, and the number of the nodes $U_1$-$U_J$ of its third type of cryptography block 530 may be equal to the number of the nodes $X_1$-$X_P$ of its fourth type of cryptography block 535. Thereby, for encryption, the third combined cryptography block 518 may have multiple data inputs at its input points at the nodes $W_1$-$W_P$ of its fourth type of cryptography block 535, to be encrypted in sequence by its fourth type of cryptography block 535, by the cryptography units 531 of its third type of cryptography block 530 in accordance with its third password and by the cryptography units 513 of its second type of cryptography block 512 in accordance with its second password as multiple data outputs at its output points at the nodes $S_1$-$S_I$ of its second type of cryptography block 512. For decryption, the third combined cryptography block 518 may have multiple data inputs at its input points at the nodes $S_1$-$S_I$ of its second type of cryptography block 512, to be decrypted in sequence by the cryptography units 513 of its second type of cryptography block 512 in accordance with its second password, by the cryptography units 511 of its first type of cryptography block 510 in accordance with its first password and by its fourth type of cryptography block 535 as multiple data outputs at its output points at the nodes $W_1$-$W_P$ of its fourth type of cryptography block 535.

Figure 27A:
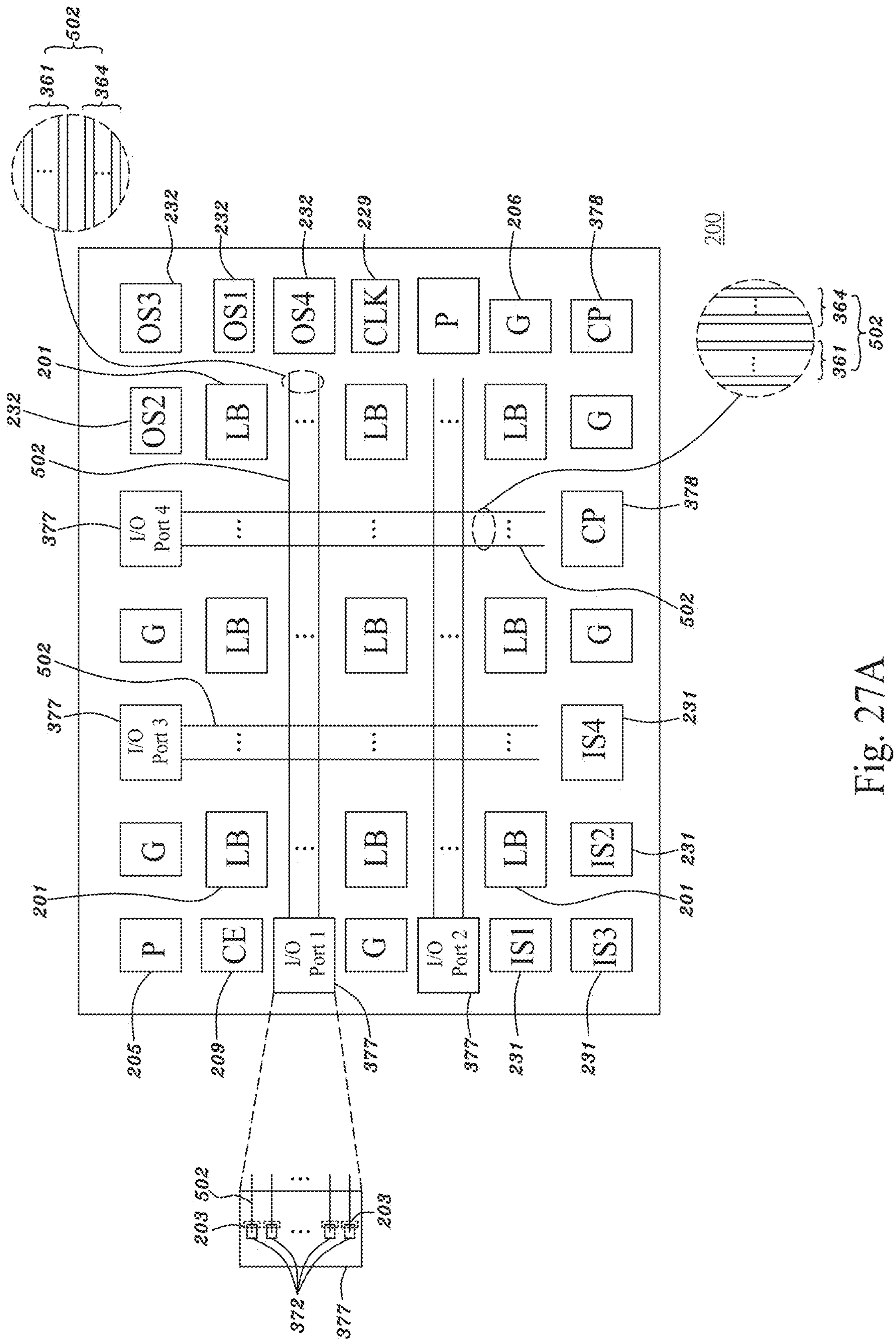
FIG. 27A is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 27A is a schematically top view showing a block diagram of a standard commodity FPGA IC chip in accordance with an embodiment of the present application. Referring to FIG. 27A, the standard commodity FPGA IC chip 200 may include (1) a plurality of programmable logic blocks (LB) 201 as illustrated in FIGS. 19 and 20A-20L arranged in an array in a central region thereof, (2) a plurality of cross-point switches as illustrated in FIGS. 15A-15C, 16A, 16B and 21 arranged around each of the programmable logic blocks (LB) 201, (3) a plurality of memory cells 362 as illustrated in FIGS. 16A, 16B and 21 configured to be programmed to control its cross-point switches, (4) a plurality of intra-chip interconnects 502 each extending over spaces between neighboring two of the programmable logic blocks (LB) 201, wherein the intra-chip interconnects 502 may include the programmable interconnects 361 as seen in FIGS. 16A, 16B and 21 configured to be programmed for interconnection by its memory cells 362 and the non-programmable interconnects 364 for programing its memory cells 362 and 490, and (5) a plurality of small input/output (I/O) circuits 203 as illustrated in FIG. 18B each providing the small driver 374 with the second data input S_Data_out at the second input point of the small driver 374 configured to couple to its programmable interconnects 361 or non-programmable interconnects 364 and providing the small receiver 375 with the data output S_Data_in at the output point of the small receiver 375 configured to couple to its programmable interconnects 361 or non-programmable interconnects 364.

Referring to FIG. 27A, the programmable interconnects 361 of the intra-chip interconnects 502 may couple to the programmable interconnects 361 of the intra-block interconnects 2015 of each of the programmable logic blocks (LB) 201 as seen in FIG. 20H. The non-programmable interconnects 364 of the intra-chip interconnects 502 may couple to the non-programmable interconnects 364 of the intra-block interconnects 2015 of each of the programmable logic blocks (LB) 201 as seen in FIG. 20H.

Referring to FIG. 27A, each of the programmable logic blocks (LB) 201 may include one or more field programmable logic cells or elements (LCE) 2014 as illustrated in FIGS. 19 and 20A-20L. Each of the one or more field programmable logic cells or elements (LCE) 2014 may have the input data set at its input points each coupling to one of the programmable and non-programmable interconnects 361 and 364 of the intra-chip interconnects 502 and may be configured to perform logic operation or computation operation on its input data set into its data output coupling to another of the programmable and non-programmable interconnects 361 and 364 of the intra-chip interconnects 502, wherein the computation operation may include an addition, subtraction, multiplication or division operation, and the logic operation may include a Boolean operation such as AND, NAND, OR or NOR operation.

Referring to FIG. 27A, the standard commodity FPGA IC chip 200 may include multiple I/O pads 372 as seen in FIG. 18B each vertically over one of its small input/output (I/O) circuits 203. For example, in a first clock cycle, for one of the small input/output (I/O) circuits 203 of the standard commodity FPGA IC chip 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, passed from the data output of one of the field programmable logic cells or elements (LCE) 2014 of the standard commodity FPGA IC chip 200 as illustrated in FIGS. 19 and 2A-20L through first one or more of the programmable interconnects 361 of the standard commodity FPGA IC chip 200 and/or one or more of the field programmable switch cells 379 of the standard commodity FPGA IC chip 200 each coupled between two of said first one or more of the programmable interconnects 361, as the data output of its small driver 374 to be transmitted to one of the I/O pads 372 vertically over said one of the small input/output (I/O) circuits 203 for external connection to circuits outside the standard commodity FPGA IC chip 200.

In a second clock cycle, for said one of the small input/output (I/O) circuits 203 of the standard commodity FPGA IC chip 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the standard commodity FPGA IC chip 200 through said one of the I/O pads 372 as the data output S_Data_in of its small receiver 375 to be passed as a data input of the input data set of one of the field programmable logic cells or elements (LCE) 2014 of the standard commodity FPGA IC chip 200 as illustrated in FIGS. 19 and 20A-20L through second one or more of the programmable interconnects 361 of the standard commodity FPGA IC chip 200 and/or one or more of the field programmable switch cells 379 of the standard commodity FPGA IC chip 200 each coupled between two of said second one or more of the programmable interconnects 361.

Referring to FIG. 27A, the standard commodity FPGA IC chip 200 may include multiple I/O ports 377 laving the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 18B laving the number ranging from 4 to 256, such as 64 for this case, arranged in parallel for data transmission with bit width ranging from 4 to 256, such as 64 for this case, and (2) the I/O pads 372 as seen in FIG. 18B having the number ranging from 4 to 256, such as 64 for this case, arranged in parallel and vertically over the small I/O circuits 203 respectively.

Referring to FIG. 27A, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200; when the chip-enable (CE) pad 209 is at a logic level of "1", the standard commodity FPGA IC chip 200 may be disabled not to process data and/or operate with circuits outside of the standard commodity FPGA IC chip 200.

Figure 32:
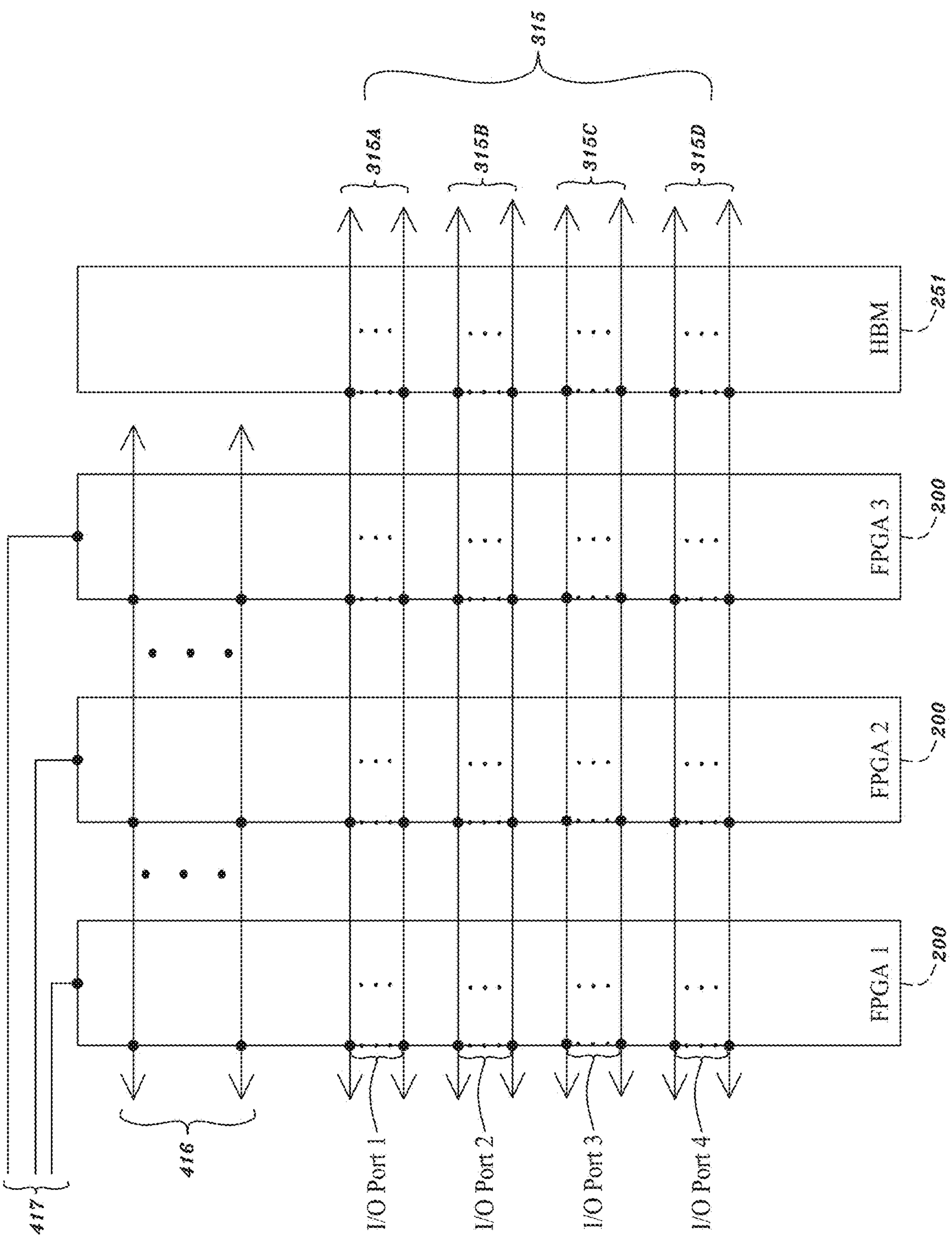
FIG. 32 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with the present application.

Referring to FIG. 27A, the standard commodity FPGA IC chip 200 may include multiple input selection (IS) pads 231, e.g., IS1, IS2, IS3 and IS4 pads, each configured to receive data to be passed as the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be passed as the first data input S_Inhibit of the small receiver 375 of each of the small I/O circuits 203 of its I/O Port 1 through a first one of its small I/O circuits 203; the IS2 pad 231 may receive data to be passed as the first data input S_Inhibit of the small receiver 375 of each of the small I/O circuits 203 of I/O Port 2 through a second one of its small I/O circuits 203; the IS3 pad 231 may receive data to be passed as the first data input S_Inhibit of the small receiver 375 of each of the small I/O circuits 203 of I/O Port 3 through a third one of its small I/O circuits 203; and the IS4 pad 231 may receive data to be passed as the first data input S_Inhibit of the small receiver 375 of each of the small I/O circuits 203 of I/O Port 4 through a fourth one of its small I/O circuits 203. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small/circuits 203 of one of the I/O ports 377 selected in accordance with the logic level at one of the input selection (IS) pads 231 of the standard commodity FPGA IC chip 200, its small receiver 375 may be activated by the first data input S_Inhibit of its small receiver 375 associated with the logic level at said one of the input selection (IS) pads 231 of the standard commodity FPGA IC chip 200 to amplify or pass the second data input of its small receiver 375, transmitted from a data path of one of data buses 315 as illustrated in FIG. 32 outside the standard commodity FPGA IC chip 200 through one of the I/O pads 372 of said one of the I/O ports 377 selected in accordance with the logic level at said one of the input selection (IS) pads 231 of the standard commodity FPGA IC chip 200, as the data output S_Data_in of its small receiver 375 to be passed as a data input of the input data set of one of the field programmable logic cells or elements (LCE) 2014 of the standard commodity FPGA IC chip 200 through one or more of the programmable interconnects 361 of the standard commodity FPGA IC chip 200, for example. For each of the small I/O circuits 203 of the other one or more of the I/O ports 377, not selected in accordance with the logic level at the other(s) of the input selection (IS) pads 231, of the standard commodity FPGA IC chip 200, its small receiver 375 may be inhibited by the first data input S_Inhibit of its small receiver 375 associated with the logic level at one of the other(s) of the input selection (IS) pads 231.

For example, referring to FIG. 27A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the IS1 pad 231 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375 associated respectively with the logic levels at the IS2, IS3 and IS4 pads 231 of the standard commodity FPGA IC chip 200.

For example, referring to FIG. 27A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the standard commodity FPGA IC chip 200, its small receiver 375 may be activated by the first data input S_Inhibit of its small receiver 375 associated respectively with the logic levels at the IS1, IS2, IS3 and IS4 pads 231 of the standard commodity FPGA IC chip 200.

Referring to FIG. 27A, the standard commodity FPGA IC chip 200 may include multiple output selection (OS) pads 232, e.g., OS1, OS2, OS3 and OS4 pads, each configured to receive data to be passed as the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive data to be passed as the first data input S_Enable of the small driver 374 of each of the small I/O circuits 203 of I/O Port 1 through a fifth one of its small I/O circuits 203; the OS2 pad 232 may receive data to be passed as the first data input S_Enable of the small driver 374 of each of the small I/O circuits 203 of I/O Port 2 through a sixth one of its small I/O circuits 203; the OS3 pad 232 may receive data to be passed as the first data input S_Enable of the small driver 374 of each of the small I/O circuits 203 of I/O Port 3 through a seventh one of its small I/O circuits 203; the OS4 pad 232 may receive data to be passed as the first data input S_Enable of the small driver 374 of each of the small I/O circuits 203 of I/O Port 4 through an eighth one of its small I/O circuits 203. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with the data output of one of the field programmable logic cells or elements (LCE) 2014 of the standard commodity FPGA IC chip 200 through one or more of the programmable interconnects 361 of the standard commodity FPGA IC chip 200, as the data output of its small driver 374 to be transmitted to a data path of one of data buses 315 as illustrated in FIG. 32 outside the standard commodity FPGA IC chip 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the standard commodity FPGA IC chip 200, its small driver 374 may be disabled by the first data input S_Enable of its small driver 374 associated with the logic level at one of the output selection (OS) pads 232.

For example, referring to FIG. 27A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the OS1 pad 232 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small driver 374 may be disabled by the first data input S_Enable of its small driver 374 associated respectively with the logic levels at the OS2, OS3 and OS4 pads 232 of the standard commodity FPGA IC chip 200.

For example, referring to FIG. 27A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the standard commodity FPGA IC chip 200, its small driver 374 may be enabled by the first data input S_Enable of its small driver 374 associated respectively with the logic levels at the OS1, OS2, OS3 and OS4 pads 232 of the standard commodity FPGA IC chip 200.

Thereby, referring to FIG. 27A, in a clock cycle, one or more of the I/O ports 377, e.g., I/O Port 1, I/O Port 2, I/O Port 3 and I/O Port 4, may be selected, in accordance with the logic levels at the IS1, IS2, IS3 and IS4 pads 231, to pass data for the input operation, while another one or more of the I/O ports 377, e.g., I/O Port 1, I/O Port 2, I/O Port 3 and I/O Port 4, may be selected, in accordance with the logic levels at the OS1, OS2, OS3 and OS4 pads 232, to pass data for the output operation. The input selection (IS) pads 231 and output selection (OS) pads 232 may be provided as I/O-port selection pads.

Referring to FIG. 27A, the standard commodity FPGA IC chip 200 may further include (1) multiple power pads 205 configured for applying the voltage Vcc of power supply to its field programmable logic cells or elements (LCE) 2014 as illustrated in FIGS. 19 and 20A-20L, its field programmable switch cells 379 as illustrated in FIGS. 16A, 16B and 21 and/or the small drivers 374 and receivers 375 of its small I/O circuits 203 as seen in FIG. 18B through one or more of its non-programmable interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to its field programmable logic cells or elements (LCE) 2014 as illustrated in FIGS. 19 and 20A-20L, its field programmable switch cells 379 as illustrated in FIGS. 16A, 16B and 21 and/or the small drivers 374 and receivers 375 of its small I/O circuits 203 as seen in FIG. 18B through one or more of its non-programmable interconnects 364.

Referring to FIG. 27A, the standard commodity FPGA IC chip 200 may further include a clock pad (CLK) 229 configured to receive a clock signal from circuits outside of the standard commodity FPGA IC chip 200 to the D-type flip-flop circuit 2034 or 2039 of each of its field programmable logic cells or elements (LCE) 2014 as illustrated in FIGS. 20K and 20L and multiple control pads (CP) 378 configured to receive control commands to control the standard commodity FPGA IC chip 200.

Referring to FIG. 27A, for the standard commodity FPGA IC chip 200, its field programmable logic cells or elements (LCE) 2014 as seen in FIGS. 19 and 20A-20L may be reconfigurable for artificial-intelligence (AI) application. For example, in a clock cycle, one of the field programmable logic cells or elements (LCE) 2014 of the standard commodity FPGA IC chip 200 may have its memory cells 490 to be programmed to perform OR operation; however, after one or more events happen, in another clock cycle said one of its field programmable logic cells or elements (LCE) 2014 of the standard commodity FPGA IC chip 200 may have its memory cells 490 to be programmed to perform NAND operation for better A1 performance.

Referring to FIG. 27A, the standard commodity FPGA IC chip 200 may be designed, implemented and fabricated using an advanced semiconductor technology node or generation, for example more advanced than or equal to, or below or equal to 30 nm, 20 nm or 10 nm. The standard commodity FPGA IC chip 200 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the standard commodity FPGA IC chip 200 used in the advanced semiconductor technology node or generation may be fin field-effect transistors (FINFETs), gate-all-around field-effect transistors (GAAFETs), FINFETs on silicon-on-insulator (FINFETs SOI), fully depleted silicon-on-insulator (FDSOI) metal-oxide-semiconductor field-effect transistors (MOSFETs), partially depleted silicon-on-insulator (PDSOI) MOSFETs or conventional MOSFETs.

Figure 27B:
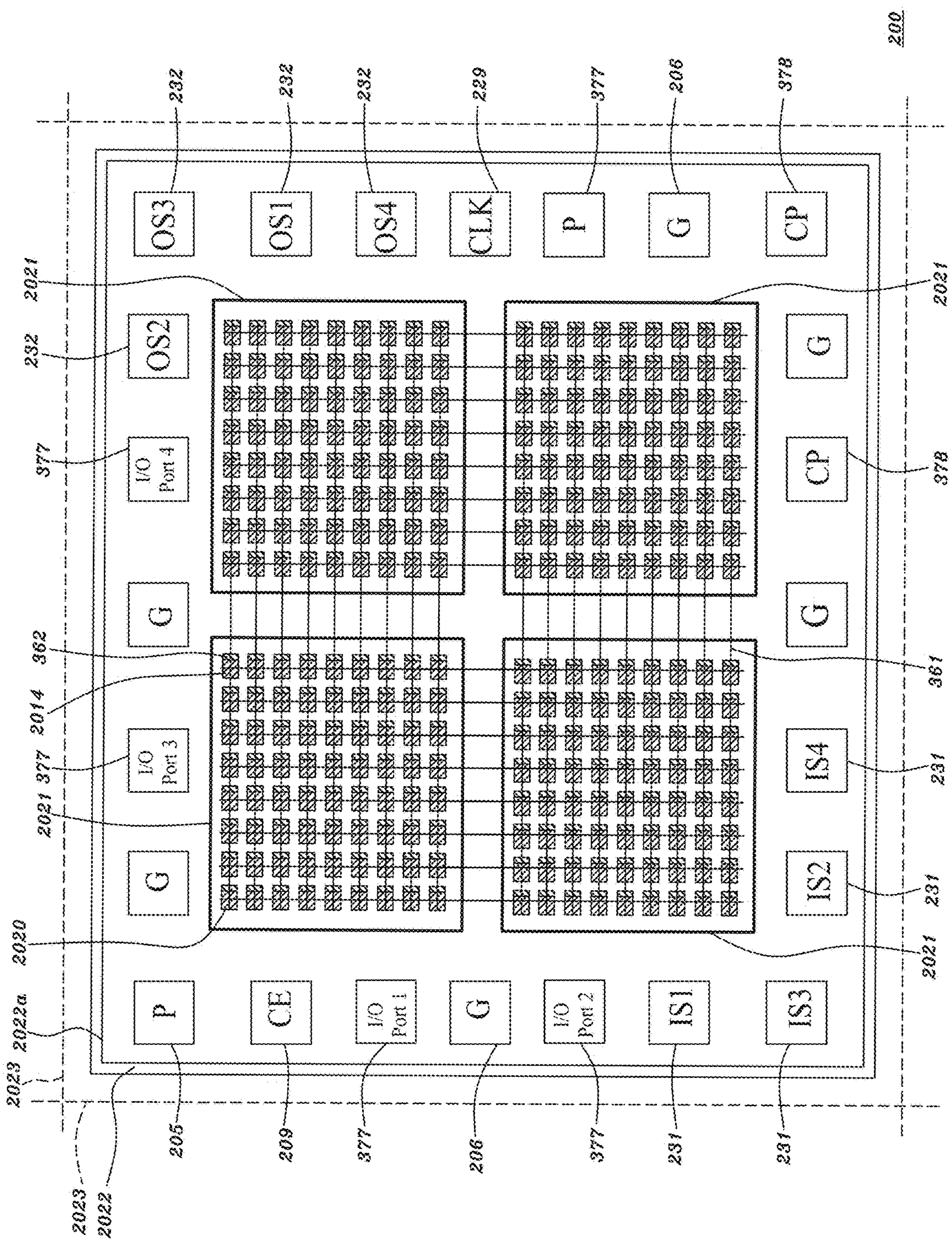
FIG. 27B is a top view showing a layout of a standard commodity FPGA IC chip in accordance with an embodiment of the present application.

FIG. 27B is a top view showing a layout of a standard commodity FPGA IC chip in accordance with an embodiment of the present application. Referring to FIG. 27B, the standard commodity FPGA IC chip 200 may include multiple repetitive circuit arrays 2021 arranged in an array therein, and each of the repetitive circuit arrays 2021 may include multiple repetitive circuit units 2020 arranged in an array therein. Each of the repetitive circuit units 2020 may include a programmable logic cell (LC) 2014 as illustrated in FIG. 19, and/or the memory cells 362 for the programmable interconnection as illustrated in FIGS. 15A-15C, 16A, 16B and 21. The field programmable logic cells or elements (LCE) 2014 may be programmed or configured as functions of, for example, digital-signal processor (DSP), microcontroller, adders, and/or multipliers. For the standard commodity FPGA IC chip 200, its programmable interconnects 361 may couple neighboring two of its repetitive circuit units 2020 and the repetitive circuit units 2020 in neighboring two of its repetitive circuit units 2020. The standard commodity FPGA IC chip 200 may include a seal ring 2022 at its four edges, enclosing its repetitive circuit arrays 2021, its I/O ports 277 and its various circuits as illustrated in FIG. 27A, and a scribe line, kerf or die-saw area 2023 at its border and outside and around the seal ring 2022. For example, for the standard commodity FPGA IC chip 200, greater than 85%, 90%, 95% or 99% area (not counting its seal ring 2022 and scribe line 2023, that is, only including an area within an inner boundary 2022*a* of its seal ring 2022) is used for its repetitive circuit arrays 2021; alternatively, all or most of its transistors are used for its repetitive circuit arrays 2021. Alternatively, for the standard commodity FPGA IC chip 200, none or minimal area may be provided for its control circuits, I/O circuits or hard macros, for example, less than 15%, 10%, 5%, 2% or 1% of its area (not counting its seal ring 2022 and scribe line 2023, that is, only including an area within an inner boundary 2022*a* of its seal ring 2022) is used for its control circuits, I/O circuits or hard macros; alternatively, none or minimal transistors may be provided for its control circuits, I/O circuits or hard macros, for example, less than 15%, 10%, 5%, 2% or 1% of the total number of its transistors are used for its control circuits, I/O circuits or hard macros.

The standard commodity plural FPGA IC chip 200 may have standard common features, counts or specifications: (1) its regular repetitive logic array may have the number of programmable logic arrays or sections equal to or greater than 2, 4, 8, 10 or 16, wherein its regular repetitive logic array may include programmable logic blocks or elements 201 as illustrated in FIGS. 19 and 20A-20L with the count equal to or greater than 128K, 512K, 1M, 4M, 8M, 16M, 32M or 80M; (2) its regular memory array may have the number of memory banks equal to or greater than 2, 4, 8, 10 or 16, wherein its regular memory array may include memory cells with the bit count equal to or greater than 1M, 10M, 50M, 100M, 200M or 500M bits; (3) the number of data inputs to each of its programmable logic blocks or elements 201 may be greater than or equal to 4, 8, 16, 32, 64, 128 or 256; (4) its applied voltage may be between 0.1V and 1.5V, between 0.1V and 1.0V, between 0.1V and 0.7V, or between 0.1V and 0.5V; and (4) its I/O pads 372 as seen in FIG. 27A may be arranged in terms of layout, location, number and function.

Figure 27C:
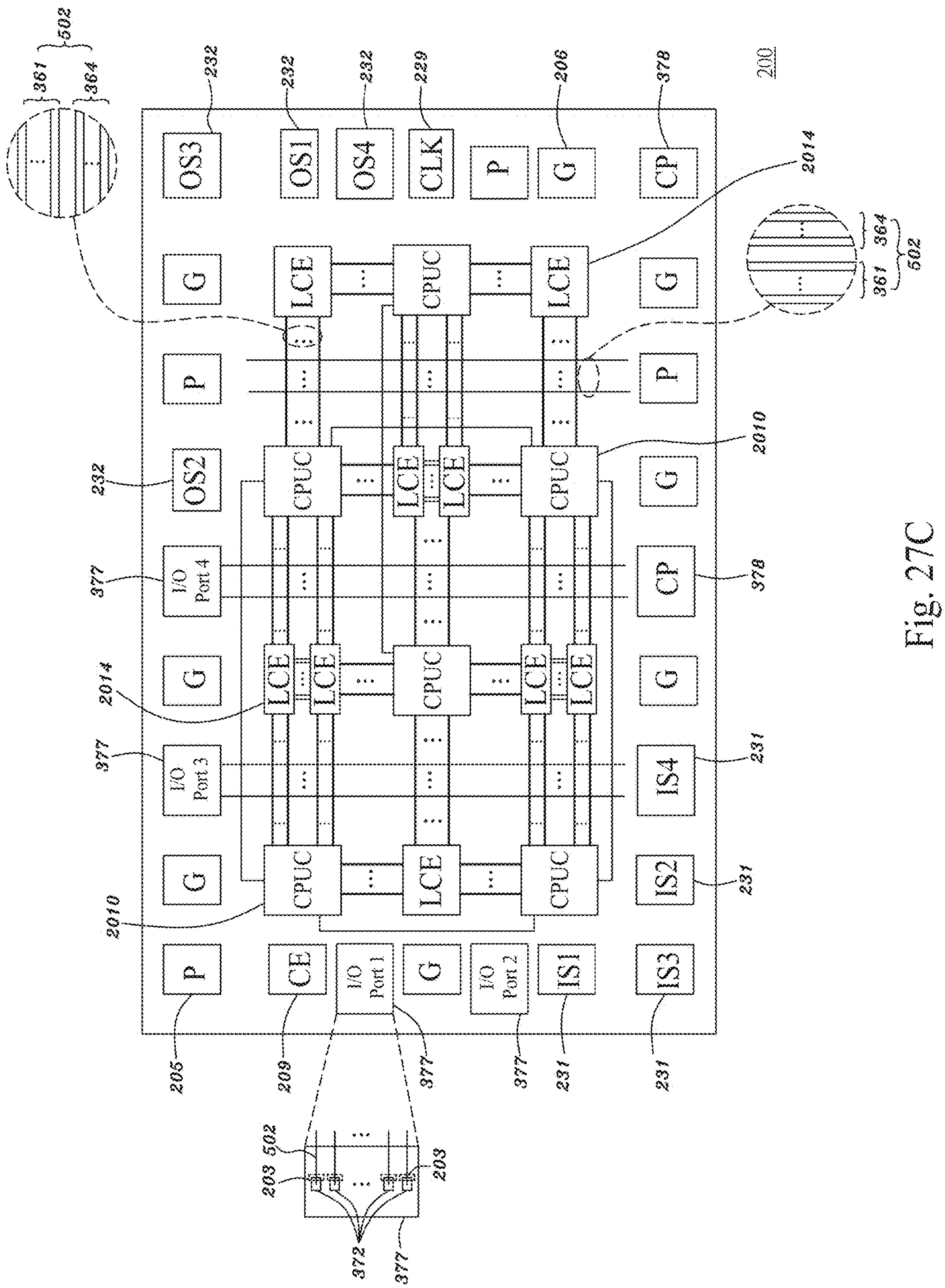
FIG. 27C is a top view showing a layout of a standard commodity FPGA IC chip in accordance with another embodiment of the present application.

Alternatively, FIG. 27C is a top view showing a layout of a standard commodity FPGA IC chip in accordance with another embodiment of the present application. Referring to FIG. 27C, the standard commodity FPGA IC chip 200 may be used as a data-process-unit (DPU) chip, including (1) multiple field programmable logic cells or elements (LCE) or elements (LCE) 2014 as illustrated in FIGS. 19, 20K and 20L arranged in an array in a central region thereof, (2) multiple center-processing-unit cores (CPUC) 2010 arranged in an array in the central region thereof, each of which is between two of the field programmable logic cells or elements (LCE) 2014 in a vertical direction and between another two of the field programmable logic cells or elements (LCE) 2014 in a horizontal direction, (3) multiple cross-point switches as illustrated in FIGS. 15A-15C, 16A, 16B and 21 arranged around each of the field programmable logic cells or elements (LCE) 2014 and center-processing-unit cores (CPUC) 2010, (4) multiple of memory cells 362 as illustrated in FIGS. 16A, 16B and 21 configured to be programmed to control its cross-point switches, (5) multiple intra-chip interconnects 502 each extending over spaces between neighboring two of the field programmable logic cells or elements (LCE) 2014 and center-processing-unit cores (CPUC) 2010, wherein the intra-chip interconnects 502 may include the programmable interconnects 361 as seen in FIGS. 16A, 16B and 21 configured to be programmed for interconnection by its memory cells 362 and the non-programmable interconnects 364 for programing its memory cells 362 and 490, and (6) multiple small input/output (I/O) circuits 203 as illustrated in FIG. 18B each providing the small driver 374 with the second data input S_Data_out at the second input point of the small driver 374 configured to couple to its programmable interconnects 361 or non-programmable interconnects 364 and providing the small receiver 375 with the data output S_Data_in at the output point of the small receiver 375 configured to couple to its programmable interconnects 361 or non-programmable interconnects 364. The center-processing-unit cores (CPUC) 2010 may be ARM Cortex processor/controller cores based on a reduced instruction set computing (RISC) architecture or x86 central-processing-unit (CPU) cores based on complex instruction set computing (CISC) architecture, wherein the ARM Cortex processor/controller cores may be 8-bit, 16-bit, 32-bit, 64-bit or more-than-64-bit reduced-instruction-set-computing (RISC) ARM processor/controller cores licensed from ARM Holdings.

Referring to FIG. 27C, the programmable interconnects 361 of the intra-chip interconnects 502 may couple to one or more of the field programmable logic cells or elements (LCE) 2014 and/or one or more of the center-processing-unit cores (CPUC) 2010. The non-programmable interconnects 364 of the intra-chip interconnects 502 may couple to one or more of the field programmable logic cells or elements (LCE) 2014 and/or one or more of the center-processing-unit cores (CPUC) 2010. Each of the one or more field programmable logic cells or elements (LCE) 2014 may be arranged next to two of the center-processing-unit cores (CPUC) 2010 to provide a smart interface between said two of the center-processing-unit cores (CPUC) 2010, and thereby said each of the one or more field programmable logic cells or elements (LCE) 2014 may perform field programmability and artificial intelligent networking between said two of the center-processing-unit cores (CPUC) 2010. That is, each of the one or more field programmable logic cells or elements (LCE) 2014 may have the input data set at its input points, which may include data passed from a first one of the center-processing-unit cores (CPUC) 2010, such as a left one, next to said each of the one or more field programmable logic cells or elements (LCE) 2014 through a first path formed by coupling of multiple of the programmable interconnects 361 of the intra-chip interconnects 502 controlled by one or more of the cross-point switches of the standard commodity FPGA IC chip 200 as illustrated in FIGS. 15A-15C, 16A, 16B and 21 or formed by one or more of the non-programmable interconnects 364 of the intra-chip interconnects 502 and may be configured to perform logic operation or computation operation on its input data set into its data output passed to a second one of the center-processing-unit cores (CPUC) 2010, such as a right one, next to said each of the one or more field programmable logic cells or elements (LCE) 2014 through a second path formed by coupling of multiple of the programmable interconnects 361 of the intra-chip interconnects 502 controlled by one or more of the cross-point switches of the standard commodity FPGA IC chip 200 or formed by one or more of the non-programmable interconnects 364 of the intra-chip interconnects 502, wherein the computation operation may include an addition, subtraction, multiplication or division operation, and the logic operation may include a Boolean operation such as AND, NAND, OR or NOR operation. Further, one or more of the non-programmable interconnects 364 may be provided as one or more bypasses coupling the first and second ones of the center-processing-unit cores (CPUC) 2010 to bypass said each of the one or more field programmable logic cells or elements (LCE) 2014.

Referring to FIG. 27C, the standard commodity FPGA IC chip 200 may include multiple I/O pads 372 as seen in FIG. 18B each vertically over one of its small input/output (I/O) circuits 203. For example, in a first clock cycle, for one of the small input/output (I/O) circuits 203 of the standard commodity FPGA IC chip 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, associated with the data output of one of the field programmable logic cells or elements (LCE) 2014 of the standard commodity FPGA IC chip 200 as illustrated in FIGS. 19 and 2A-20L or an output data of one of the center-processing-unit cores (CPUC) 2010 of the standard commodity FPGA IC chip 200, as the data output of its small driver 374 to be transmitted to one of the I/O pads 372 vertically over said one of the small input/output (I/O) circuits 203 for external connection to circuits outside the standard commodity FPGA IC chip 200.

In a second clock cycle, for said one of the small input/output (I/O) circuits 203 of the standard commodity FPGA IC chip 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the standard commodity FPGA IC chip 200 through said one of the I/O pads 372 as the data output S_Data_in of its small receiver 375 to be passed as a data input of the input data set of one of the field programmable logic cells or elements (LCE) 2014 of the standard commodity FPGA IC chip 200 as illustrated in FIGS. 19 and 20A-20L or a data input of one of the center-processing-unit cores (CPUC) 2010 of the standard commodity FPGA IC chip 200.

Referring to FIG. 27C, the standard commodity FPGA IC chip 200 may include multiple I/O ports 377 laving the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 18B laving the number ranging from 4 to 256, such as 64 for this case, arranged in parallel for data transmission with bit width ranging from 4 to 256, such as 64 for this case, and (2) the I/O pads 372 as seen in FIG. 18B having the number ranging from 4 to 256, such as 64 for this case, arranged in parallel and vertically over the small I/O circuits 203 respectively.

Referring to FIG. 27C, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200; when the chip-enable (CE) pad 209 is at a logic level of "1", the standard commodity FPGA IC chip 200 may be disabled not to process data and/or operate with circuits outside of the standard commodity FPGA IC chip 200.

Referring to FIG. 27C, the standard commodity FPGA IC chip 200 may include multiple input selection (IS) pads 231, e.g., IS1, IS2, IS3 and IS4 pads, each configured to receive data to be passed as the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be passed as the first data input S_Inhibit of the small receiver 375 of each of the small I/O circuits 203 of its I/O Port 1 through a first one of its small I/O circuits 203; the IS2 pad 231 may receive data to be passed as the first data input S_Inhibit of the small receiver 375 of each of the small I/O circuits 203 of I/O Port 2 through a second one of its small I/O circuits 203; the IS3 pad 231 may receive data to be passed as the first data input S_Inhibit of the small receiver 375 of each of the small I/O circuits 203 of I/O Port 3 through a third one of its small I/O circuits 203; and the IS4 pad 231 may receive data to be passed as the first data input S_Inhibit of the small receiver 375 of each of the small I/O circuits 203 of I/O Port 4 through a fourth one of its small I/O circuits 203. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of one of the I/O ports 377 selected in accordance with the logic level at one of the input selection (IS) pads 231 of the standard commodity FPGA IC chip 200, its small receiver 375 may be activated by the first data input S_Inhibit of its small receiver 375 associated with the logic level at said one of the input selection (IS) pads 231 of the standard commodity FPGA IC chip 200 to amplify or pass the second data input of its small receiver 375, transmitted from a data path of one of data buses 315 as illustrated in FIG. 32 outside the standard commodity FPGA IC chip 200 through one of the I/O pads 372 of said one of the I/O ports 377 selected in accordance with the logic level at said one of the input selection (IS) pads 231 of the standard commodity FPGA IC chip 200, as the data output S_Data_in of its small receiver 375 to be passed as a data input of the input data set of one of the field programmable logic cells or elements (LCE) 2014 of the standard commodity FPGA IC chip 200 or a data input of one of the center-processing-unit cores (CPUC) 2010 of the standard commodity FPGA IC chip 20. For each of the small I/O circuits 203 of the other one or more of the I/O ports 377, not selected in accordance with the logic level at the other(s) of the input selection (IS) pads 231, of the standard commodity FPGA IC chip 200, its small receiver 375 may be inhibited by the first data input S_Inhibit of its small receiver 375 associated with the logic level at one of the other(s) of the input selection (IS) pads 231.

For example, referring to FIG. 27C, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the IS1 pad 231 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375 associated respectively with the logic levels at the IS2, IS3 and IS4 pads 231 of the standard commodity FPGA IC chip 200.

For example, referring to FIG. 27C, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the standard commodity FPGA IC chip 200, its small receiver 375 may be activated by the first data input S_Inhibit of its small receiver 375 associated respectively with the logic levels at the IS1, IS2, IS3 and IS4 pads 231 of the standard commodity FPGA IC chip 200.

Referring to FIG. 27C, the standard commodity FPGA IC chip 200 may include multiple output selection (OS) pads 232, e.g., OS1, OS2, OS3 and OS4 pads, each configured to receive data to be passed as the first data input S_Enable of the small driver 374 of each of the small I/O circuits 203 of one of its I/O ports 377, e.g., I/O Port 1, I/O Port 2, IO Port 3 and I/O Port 4. For more elaboration, the OS1 pad 232 may receive data to be passed as the first data input S_Enable of the small driver 374 of each of the small I/O circuits 203 of 1K Port 1 through a fifth one of its small I/O circuits 203; the OS2 pad 232 may receive data to be passed as the first data input S_Enable of the small driver 374 of each of the small I/O circuits 203 of I/O Port 2 through a sixth one of its small I/O circuits 203; the OS3 pad 232 may receive data to be passed as the first data input S_Enable of the small driver 374 of each of the small I/O circuits 203 of I/O Port 3 through a seventh one of its small I/O circuits 203; the OS4 pad 232 may receive data to be passed as the first data input S_Enable of the small driver 374 of each of the small I/O circuits 203 of I/O Port 4 through an eighth one of its small I/O circuits 203. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with the data output of one of the field programmable logic cells or elements (LCE) 2014 of the standard commodity FPGA IC chip 200 or an data output of one of the center-processing-unit cores (CPUC) 2010 of the standard commodity FPGA IC chip 200, as the data output of its small driver 374 to be transmitted to a data path of one of data buses 315 as illustrated in FIG. 32 outside the standard commodity FPGA IC chip 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the standard commodity FPGA IC chip 200, its small driver 374 may be disabled by the first data input S_Enable of its small driver 374 associated with the logic level at one of the output selection (OS) pads 232.

For example, referring to FIG. 27C, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the OS1 pad 232 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small driver 374 may be disabled by the first data input S_Enable of its small driver 374 associated respectively with the logic levels at the OS2, OS3 and OS4 pads 232 of the standard commodity FPGA IC chip 200.

For example, referring to FIG. 27C, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the standard commodity FPGA IC chip 200, its small driver 374 may be enabled by the first data input S_Enable of its small driver 374 associated respectively with the logic levels at the OS1, OS2, OS3 and OS4 pads 232 of the standard commodity FPGA IC chip 200.

Thereby, referring to FIG. 27C, in a clock cycle, one or more of the I/O ports 377, e.g., I/O Port 1, I/O Port 2, I/O Port 3 and I/O Port 4, may be selected, in accordance with the logic levels at the IS1, IS2, IS3 and IS4 pads 231, to pass data for the input operation, while another one or more of the I/O ports 377, e.g., I/O Port 1, I/O Port 2, I/O Port 3 and I/O Port 4, may be selected, in accordance with the logic levels at the OS1, OS2, OS3 and OS4 pads 232, to pass data for the output operation. The input selection (IS) pads 231 and output selection (OS) pads 232 may be provided as I/O-port selection pads.

Referring to FIG. 27C, the standard commodity FPGA IC chip 200 may further include (1) multiple power pads 205 configured for applying the voltage Vcc of power supply to its field programmable logic cells or elements (LCE) 2014 as illustrated in FIGS. 19 and 20A-20L, its center-processing-unit cores (CPUC) 2010, its field programmable switch cells 379 as illustrated in FIGS. 16A, 16B and 21 and/or the small drivers 374 and receivers 375 of its small I/O circuits 203 as seen in FIG. 18B through one or more of its non-programmable interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to its field programmable logic cells or elements (LCE) 2014 as illustrated in FIGS. 19 and 20A-20L, its center-processing-unit cores (CPUC) 2010, its field programmable switch cells 379 as illustrated in FIGS. 16A, 16B and 21 and/or the small drivers 374 and receivers 375 of its small I/O circuits 203 as seen in FIG. 18B through one or more of its non-programmable interconnects 364.

Referring to FIG. 27C, the standard commodity FPGA IC chip 200 may further include a clock pad (CLK) 229 configured to receive a clock signal from circuits outside of the standard commodity FPGA IC chip 200 to be passed to the D-type flip-flop circuit 2034 or 2039 of each of its field programmable logic cells or elements (LCE) 2014 as illustrated in FIGS. 20K and 20L and multiple control pads (CP) 378 configured to receive control commands to control the standard commodity FPGA IC chip 200.

Referring to FIG. 27C, for the standard commodity FPGA IC chip 200, its field programmable logic cells or elements (LCE) 2014 as seen in FIGS. 19 and 20A-20L may be reconfigurable for artificial-intelligence (AI) application. For example, in a clock cycle, one of the field programmable logic cells or elements (LCE) 2014 of the standard commodity FPGA IC chip 200 may have its memory cells 490 to be programmed to perform OR operation; however, after one or more events happen, in another clock cycle said one of its field programmable logic cells or elements (LCE) 2014 of the standard commodity FPGA IC chip 200 may have its memory cells 490 to be programmed to perform NAND operation for better A1 performance.

Referring to FIG. 27C, the standard commodity FPGA IC chip 200 may be designed, implemented and fabricated using an advanced semiconductor technology node or generation, for example more advanced than or equal to, or below or equal to 30 nm, 20 nm or 10 nm. The standard commodity FPGA IC chip 200 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the standard commodity FPGA IC chip 200 used in the advanced semiconductor technology node or generation may be fin field-effect transistors (FINFETs), gate-all-around field-effect transistors (GAAFETs), FINFETs on silicon-on-insulator (FINFETs SOI), fully depleted silicon-on-insulator (FDSOI) metal-oxide-semiconductor field-effect transistors (MOSFETs), partially depleted silicon-on-insulator (PDSOI) MOSFETs or conventional MOSFETs.

Figure 28:
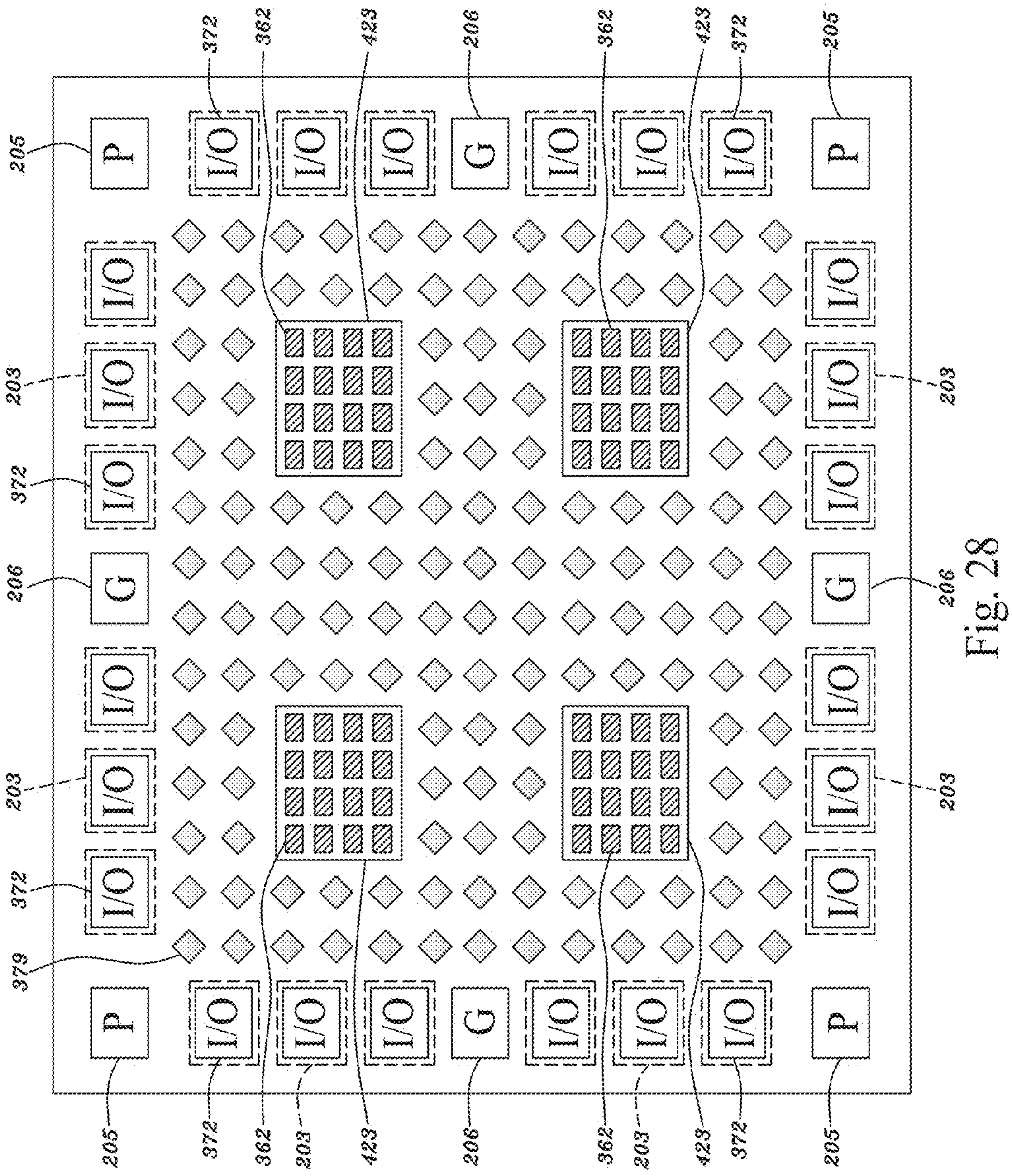
FIG. 28 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 28 is a schematically top view showing a block diagram of a dedicated programmable interconnection (DPI) integrated-circuit (IC) chip in accordance with an embodiment of the present application. Referring to FIG. 28, the DPIIC chip 410 may include (1) a plurality of memory-array blocks 423 arranged in an array in a central region thereof, wherein each of the memory-array blocks 423 may include a plurality of memory cells 362 as illustrated in FIGS. 16A, 16B and 21 arranged in an array, (2) a plurality of groups of cross-point switches as illustrated in FIGS. 16A, 16B and 21, each group of which is arranged in one or more rings around one of the memory-array blocks 423, wherein each of its memory cells 362 in one of its memory-array blocks 423 is configured to be programmed to control its cross-point switches around said one of its memory-array blocks 423, (4) a plurality of intra-chip interconnects including the programmable interconnects 361 as seen in FIGS. 16A, 16B and 21 configured to be programmed for interconnection by its memory cells 362 and multiple non-programmable interconnects for programing its memory cells 362, and (6) a plurality of small input/output (I/O) circuits 203 as illustrated in FIG. 18B each providing the small receiver 375 with the data output S_Data_in associated with a data input at one of the nodes N23-N26 of one of its field programmable switch cells 379 as illustrated in FIGS. 16A, 16B and 21 through one or more of its programmable interconnects 361 and providing the small driver 374 with the data input S_Data_out associated with a data output at one of the nodes N23-N26 of another of its field programmable switch cells 379 as illustrated in FIGS. 16A, 16B and 21 through another one or more of its programmable interconnects 361.

Referring to FIG. 28, the DPIIC chip 410 may provide the first type of pass/no-pass switches 292 for its first or second type of cross-point switches as illustrated in FIGS. 16A and 16B close to one of its memory-array blocks 423, each of which may have the data input SC-3 as seen in FIG. 15A associated with a data output, i.e., configuration-programming-memory (CPM) data, of one of its memory cells 362, i.e., configuration-programming-memory (CPM) cells, in said one of its memory-array blocks 423. Alternatively, the DPIIC chip 410 may provide the third type of pass/no-pass switches 292 for its first or second type of cross-point switches as illustrated in FIGS. 16A and 16B close to one of the memory-array blocks 423, each of which may have the data inputs SC-5 and SC-6 as seen in FIG. 15C each associated with a data output, i.e., configuration-programming-memory (CPM) data, of one of its memory cells 362, i.e., configuration-programming-memory (CPM) cells, in said one of its memory-array blocks 423. Alternatively, the DPIIC chip 410 may provide the multiplexers 211 for its third type of cross-point switches s illustrated in FIG. 21 close to one of the memory-array blocks 423, each of which may have the first set of input points for multiple data inputs of the first input data set of said each of its multiplexers 211 each associated with a data output, i.e., configuration-programming-memory (CPM) data, of one of its memory cells 362, i.e., configuration-programming-memory (CPM) cells, in said one of its memory-array blocks 423.

Referring to FIG. 28, the DPIIC chip 410 may include multiple intra-chip interconnects (not shown) each extending over spaces between neighboring two of the memory-array blocks 423, wherein said each of the intra-chip interconnects may be the programmable interconnect 361, coupling to one of the nodes N23-N26 of one of its field programmable switch cells 379 as illustrated in FIGS. 16A, 16B and 21. For the DPIIC chip 410, each of its small input/output (I/O) circuits 203, as illustrated in FIG. 18B, may provide the small receiver 375 with the data output S_Data_in to be passed through one or more of its programmable interconnects 361 and the first data input S_Inhibit passed through another one or more of its programmable interconnects 361 and provide the small driver 374 with the first data input S_Enable passed through another one or more of its programmable interconnects 361 and the second data input S_Data_out passed through another one or more of its programmable interconnects.

Referring to FIG. 28, the DPIIC chip 410 may include multiple of the I/O pads 372 as seen in FIG. 18B, each vertically over one of its small input/output (I/O) circuits 203, coupling to the node 381 of said one of its small input/output (I/O) circuits 203. For the DPIIC chip 410, in a first clock cycle, data from one of the nodes N23-N26 of one of its field programmable switch cells 379 as illustrated in FIGS. 16A, 16B and 21 may be associated with the second data input S_Data_out of the small driver 374 of one of its small input/output (I/O) circuits 203 through one or more of the programmable interconnects 361 programmed by a first group of its memory cells 362, and then the small driver 374 of said one of its small input/output (I/O) circuits 203 may amplify or pass the second data input S_Data_out of the small driver 374 of said one of its small input/output (I/O) circuits 203 into the data output of the small driver 374 of said one of its small input/output (I/O) circuits 203 to be transmitted to one of its I/O pads 372 vertically over said one of its small input/output (I/O) circuits 203 for external connection to circuits outside the DPIIC chip 410. In a second clock cycle, data from circuits outside the DPIIC chip 410 may be associated with the second data input of the small receiver 375 of said one of its small input/output (I/O) circuits 203 through said one of its I/O pads 372, and then the small receiver 375 of said one of the small input/output (I/O) circuits 203 may amplify or pass the second data input of the small receiver 375 of said one of its small input/output (I/O) circuits 203 into the data output S_Data_in of the small receiver 375 of said one of its small input/output (I/O) circuits 203 to be passed as one of the nodes N23-N26 of another of its field programmable switch cells 379 as illustrated in FIGS. 16A, 16B and 21 through another one or more of the programmable interconnects 361 programmed by a second group of its memory cells 362.

Referring to FIG. 28, the DPIIC chip 410 may further include (1) multiple power pads 205 for applying the voltage Vcc of power supply to its memory cells 362 for its field programmable switch cells 379 as illustrated in FIGS. 16A, 16B and 21 and/or its field programmable switch cells 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 362 for its field programmable switch cells 379 as illustrated in FIGS. 16A, 16B and 21 and/or its field programmable switch cells 379.

Referring to FIG. 28, the DPIIC chip 410 may further include multiple volatile storage units 398 of the first type as illustrated in FIG. 1A used as cache memory for data latch or storage. Each of the volatile storage units 398 may include two switches 449, such as N-type or P-type MOS transistors, for bit and bit-bar data transfer, and two pairs of P-type and N-type MOS transistors 447 and 448 for data latch or storage nodes. For each of the volatile storage units 398 acting as the cache memory of the DPIIC chip 410, its two switches 449 may perform control of writing data into each of its memory cells 446 and reading data stored in each of its memory cells 446. The DPIIC chip 410 may further include a sense amplifier for reading, amplifying or detecting data from the memory cells 446 of its volatile storage units 398 acting as the cache memory.

Referring to FIG. 28, the dedicated programmable interconnection (DPI) integrated-circuit (IC) chip 410 may be designed, implemented and fabricated using an advanced semiconductor technology node or generation, for example more advanced than or equal to, or below or equal to 30 nm, 20 nm or 10 nm. The DPIIC chip 410 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the DPIIC chip 410 used in the advanced semiconductor technology node or generation may be fin field-effect transistors (FINFETs), gate-all-around field-effect transistors (GAAFETs), FINFETs on silicon-on-insulator (FINFETs SOI), fully depleted silicon-on-insulator (FDSOI) MOSFETs, partially depleted silicon-on-insulator (PDSOI) MOSFETs or conventional MOSFETs.

Specification for Cooperating and Supporting (CS) Integrated-Circuit (IC) Chip

Figure 29:
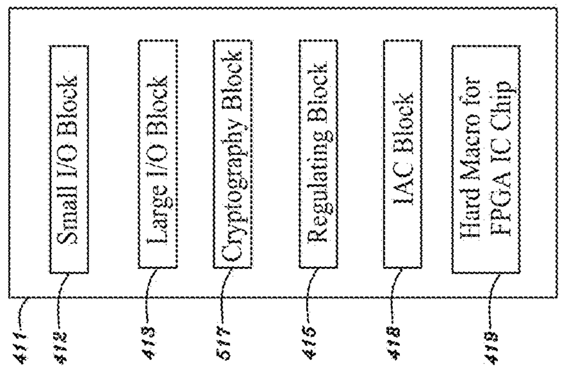
FIG. 29 is a schematically top view showing a block diagram of a cooperating and supporting (AS) integrated-circuit (IC) chip in accordance with an embodiment of the present application.

FIG. 29 is a schematically top view showing a block diagram of a cooperating and supporting (CS) integrated-circuit (IC) chip in accordance with an embodiment of the present application. Referring to FIG. 29, the cooperating and supporting (CS) integrated-circuit (IC) chip 411 may include one, more or all of the following circuit blocks: (1) a large-input/output (I/O) block 412 configured for serial-advanced-technology-attachment (SATA) ports or peripheral-components-interconnect express (PCIe) ports each having a plurality of large input/output (I/O) circuits 341 as illustrated in FIG. 18A configured to couple to a memory integrated-circuit (IC) chip, such as non-volatile memory (NVM) integrated-circuit (IC) chip, NAND flash memory integrated-circuit (IC) chip or NOR flash memory integrated-circuit (IC) chip, for data transmission between the cooperating and supporting (CS) integrated-circuit (IC) chip 411 and the memory integrated-circuit (IC) chip, (2) a small-input/output (I/O) block 413 laving a plurality of small input/output (I/O) circuits 203 as illustrated in FIG. 18B configured to couple to a logic integrated-circuit (IC) chip, such as field-programmable-gate-array (FPGA) integrated-circuit (IC) chip, central-processing-unit (CPU) chip, graphic-processing-unit (GPU) chip, application-processing-unit (APU) chip or digital-signal-processing (DSP) chip, for data transmission between the cooperating and supporting (CS) integrated-circuit (IC) chip 411 and the logic integrated-circuit (IC) chip, (3) a cryptography block 517 configured to decrypt encrypted data from the memory integrated-circuit (IC) chip as decrypted data to be passed to the logic integrated-circuit (IC) chip and to encrypt data from the logic integrated-circuit (IC) chip as encrypted data to be passed to the memory integrated-circuit (IC) chip, wherein the cryptography block 517 may be any as illustrated in FIGS. 22A-22D, 23A-23C, 24, 25 and 26A-26C, (4) a regulating block 415 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to the logic integrated-circuit (IC) chip, (5) an innovated application-specific-integrated-circuit (ASIC) or customer-owned tooling (COT) block 418, i.e., IAC block, configured to implement intellectual-property (IP) circuits, application-specific (AS) circuits, analog circuits, mixed-mode signal circuits, radio-frequency (RF) circuits, and/or transmitter, receiver, transceiver circuits for customers, and (6) multiple hard macros 419 for an FPGA IC chip 200 mounted to the cooperating and supporting (CS) integrated-circuit (IC) chip 411, wherein each of its macros 419 may be a digital-signal-processing (DSP) slice for multiplication or division, block random-access memory (RAM) cells for logic operation, central-processing unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having output data coupling to input data of the first input data set of the multiplexer 213 of the selection circuit 211 of one of the field programmable logic cells or elements (LCE) 2014 of the FPGA IC chip 200 as illustrated in FIG. 19 through one or more of the field programmable switch cells 252 or 379 of the FPGA IC chip 200 as illustrated in FIG. 15A-15C, 16A, 16B or 21 or having input data associated with output data of the multiplexer 213 of the selection circuit 211 of one of the field programmable logic cells or elements (LCE) 2014 of the FPGA IC chip 200 through one or more of the field programmable switch cells 252 or 379 of the FPGA IC chip 200. The central-processing-unit (CPU) cores may be ARM Cortex processor/controller cores based on a reduced instruction set computing (RISC) architecture or x86 central-processing-unit (CPU) cores based on complex instruction set computing (CISC) architecture, wherein the ARM Cortex processor/controller cores may be 8-bit, 16-bit, 32-bit, 64-bit or more-than-64-bit reduced-instruction-set-computing (RISC) ARM processor/controller cores licensed from ARM Holdings. Alternatively, the hard macros 419 for an FPGA IC chip 200 may be a phase locked loop (PLL) circuit or digital clock manager (DCM) configured to generate a clock signal to the FPGA IC chip 200. The hard macros 419 may be targeted for a specific IC manufacturing technology. The hard macros 419 may be block level designs optimized for power, area, timing and testing. While accomplishing physical design it is possible to only access I/O points of the hard macros 419 unlike soft macros allowing us to manipulate a register-transfer level (RTL). The hard macros 419 may be blocks generated using full custom design methodology and imported into a physical design database as a graphic design system (GDS) file. The hard macros 419 may cooperate with a FPGA IC chip 200 as illustrated in FIGS. 27A-27C mounted to the cooperating and supporting (CS) integrated-circuit (IC) chip 411 to accelerate compilation of the FPGA IC chip 200. The time for compiling the FPGA IC chip 200 may be reduced by using the hard macros 419 that may be pre-compiled circuit blocks. The hard macros 419 may include previously synthesized, mapped, placed and routed circuitry that may be relatively placed with short tool runtimes and that make it possible to reuse previous computational effort. The hard macros 419 may couple to the field programmable logic cells or elements (LCE) 2014 of the FPGA IC chip 200 to perform a logic, computing or processing function.

Specification for Logic Drive

Figure 30A:
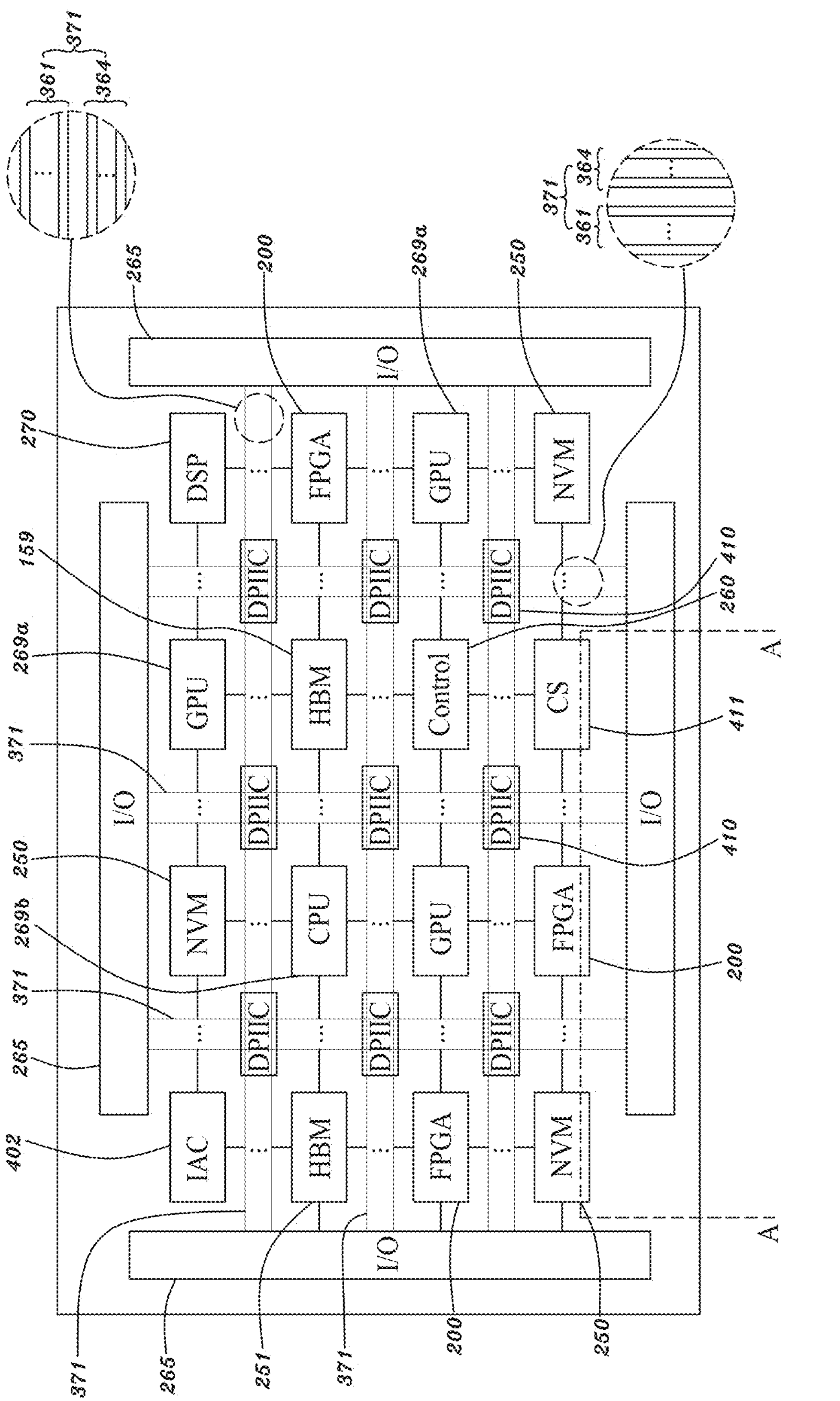
FIG. 30A is a schematically top view showing arrangement for various chips packaged in a standard commodity logic drive in accordance with an embodiment of the present application.

FIG. 30A is a schematically top view showing arrangement for various chips packaged in a standard commodity logic drive in accordance with an embodiment of the present application. Referring to FIG. 30A, a standard commodity logic drive 300 may be packaged with multiple logic integrated-circuit (IC) chips, such as graphic-processing unit (GPU) chips 269*a*, a central-processing-unit (CPU) chip 269*b*, a digital-signal-processing (DSP) chip 270 and multiple standard commodity FPGA IC chip 200, wherein each of the standard commodity FPGA IC chip 200 may have the same structure and specification as that illustrated in FIGS. 27A-27C. Further, the standard commodity logic drive 300 may be packaged with multiple high-bandwidth-memory (HBM) integrated-circuit (IC) chips 251 each arranged next to one of the GPU IC chips 269*a*, CPU IC chip 269*b* and FPGA IC chips 200 for communication with said one of the GPU IC chips 269*a*, CPU IC chip 269*b* and FPGA IC chips 200 in a high speed, high bandwidth and wide bitwidth of greater than 64 or 256, for example. Each of the HBM IC chips 251 in the standard commodity logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The standard commodity logic drive 300 may be further packaged with one or more of non-volatile memory (NVM) IC chips 250, such as NAND or NOR flash chip, MRAM IC chip or RRAM IC chip, configured to store data from data information memory (DIM) cells of each of the HBM IC chips 251. The standard commodity logic drive 300 may be further packaged with an innovated application-specific-IC (ASIC) or customer-owned-tooling (COT) (abbreviated as IAC below) chip 402 for intellectual-property (IP) circuits, application-specific (AS) circuits, analog circuits, mixed-mode signal circuits, radio-frequency (RF) circuits, and/or transmitter, receiver or transceiver circuits, etc. The standard commodity logic drive 300 may be further packaged with a dedicated control and input/output (I/O) chip 260 to control data transmission between any two of its CPU IC chip 269*b*, DSP chip 270, standard commodity FPGA IC chips 200, GPU IC chips 269*a*, NVM IC chips 250, IAC chip 402 and HBM IC chips 251. The standard commodity logic drive 300 may be further packaged with one or more cooperating and supporting (CS) integrated-circuit (IC) chips 411 for performing the functions as illustrated in FIG. 29. The dedicated control and input/output (I/O) chip 260 may be replaced with a dedicated control chip. The CPU IC chip 269*b*, DSP chip 270, dedicated control and input/output (I/O) chip 260, standard commodity FPGA IC chips 200, GPU IC chips 269*a*, cooperating and supporting (CS) integrated-circuit (IC) chips 411, NVM IC chips 250, IAC chip 402 and HBM IC chips 251 may be arranged in an array, wherein the CPU IC chip 269*b* and dedicated control and input/output (I/O) chip 260 may be arranged in a center region surrounded by a periphery region having the standard commodity FPGA IC chips 200, DSP chip 270, GPU IC chips 269*a*, NVM IC chips 250, cooperating and supporting (CS) integrated-circuit (IC) chips 411, IAC chip 402 and HBM IC chips 251 arranged therein.

Referring to FIG. 30A, the standard commodity logic drive 300 may include the inter-chip interconnects 371 each coupling neighboring two of the standard commodity FPGA IC chips 200, NVM IC chips 250, dedicated control and input/output (I/O) chip 260, GPU IC chips 269*a*, CPU IC chip 269*b*, DSP chip 270, cooperating and supporting (CS) integrated-circuit (IC) chips 411, IAC chip 402 and HBM IC chips 251. The standard commodity logic drive 300 may include a plurality of DPIIC chip 410 each aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control and input/output (I/O) chip 260, GPU IC chips 269*a*, CPU IC chip 269*b*, DSP chip 270, IAC chip 402, cooperating and supporting (CS) integrated-circuit (IC) chips 411 and HBM IC chips 251 around said each of the DPIIC chips 410. The inter-chip interconnects 371 may be formed for the programmable interconnect 361 and non-programmable interconnects 364. Data transmission may be built (1) between one of the programmable interconnects 361 of the inter-chip interconnects 371 and one of the programmable interconnects 361 of one of the standard commodity FPGA IC chips 200 via one of the small input/output (I/O) circuits 203 of said one of the standard commodity FPGA IC chips 200, and (2) between one of the programmable interconnects 361 of the inter-chip interconnects 371 and one of the programmable interconnects 361 one of the DPIIC chips 410 via one of the small input/output (I/O) circuits 203 of said one of the DPIIC chips 410.

Referring to FIG. 30A, for a first aspect, a first one of the large I/O circuits 341 of each of the NVM IC chips 250 may have the large driver 274 as see in FIG. 18A coupling to the large receiver 275 of a second one of the large I/O circuits 341 of one of the CS IC chips 411 via one of the non-programmable interconnects 364 of the inter-chip interconnects 371 for passing first encrypted CPM data from the large driver 274 of the first one of the large I/O circuits 341 to the large receiver 275 of the second one of the large I/O circuits 341. Next, the first encrypted CPM data may be decrypted as illustrated in FIG. 29 by the cryptography block 517 of said one of the CS IC chips 411 as first decrypted CPM data. Next, a first one of the small I/O circuits 203 of said one of the CS IC chips 411 may have the small driver 374 as seen in FIG. 18B coupling to the small receiver 375 of a second one of the small I/O circuits 203 of one of the standard commodity FPGA IC chips 200 via another of the non-programmable interconnects 364 of the inter-chip interconnects 371 for passing the first decrypted CPM data from the small driver 374 of the first one of the small I/O circuits 203 to the small receiver 375 of the second one of the small I/O circuits 203. Next, for said one of the standard commodity FPGA IC chips 200, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, a third one of the small I/O circuits 203 of said one of the standard commodity FPGA IC chips 200 may have the small driver 374 as seen in FIG. 18B coupling to the small receiver 375 of a fourth one of the small I/O circuits 203 of said one of the CS IC chips 411 via another of the non-programmable interconnects 364 of the inter-chip interconnects 371 for passing second CPM data used to program or configure the first type of memory cells 490 of one of the field programmable logic cells or elements (LCE) 2014 of said one of the standard commodity FPGA IC chips 200 or the first type of memory cells 362 of one of the field programmable switch cells 258 or 379 of said one of the standard commodity FPGA IC chips 200 from the small driver 374 of the third one of the small I/O circuits 203 to the small receiver 375 of the fourth one of the small I/O circuits 203. Next, the second CPM data may be encrypted as illustrated in FIG. 29 by the cryptography block 517 of said one of the CS IC chips 411 as second encrypted CPM data. Next, a third one of the large I/O circuits 341 of said one of the CS IC chips 411 may have the large driver 274 as see in FIG. 18A coupling to the large receiver 275 of a fourth one of the large I/O circuits 341 of said each of the NVM IC chips 250 via another of the non-programmable interconnects 364 of the inter-chip interconnects 371 for passing the second encrypted CPM data from the large driver 274 of the third one of the large I/O circuits 341 to the large receiver 275 of the fourth one of the large I/O circuits 341 to be stored in said each of the NVM IC chips 250.

Referring to FIG. 30A, for a second aspect, a first one of the large I/O circuits 341 of each of the NVM IC chips 250 may have the large driver 274 as see in FIG. 18A coupling to the large receiver 275 of a second one of the large I/O circuits 341 of one of the CS IC chips 411 via one of the non-programmable interconnects 364 of the inter-chip interconnects 371 for passing first encrypted CPM data from the large driver 274 of the first one of the large I/O circuits 341 to the large receiver 275 of the second one of the large I/O circuits 341. Next, a first one of the small I/O circuits 203 of said one of the CS IC chips 411 may have the small driver 374 as seen in FIG. 18B coupling to the small receiver 375 of a second one of the small I/O circuits 203 of one of the standard commodity FPGA IC chips 200 via another of the non-programmable interconnects 364 of the inter-chip interconnects 371 for passing the first encrypted CPM data from the small driver 374 of the first one of the small I/O circuits 203 to the small receiver 375 of the second one of the small I/O circuits 203. Next, said one of the standard commodity FPGA IC chips 200 may include a cryptography block configured to decrypt the first encrypted CPM data as first decrypted CPM data, wherein the cryptography block may be any as illustrated in FIGS. 22A-22D, 23A-23C, 24, 25 and 26A-26C. Next, for said one of the standard commodity FPGA IC chips 200, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for said one of the standard commodity FPGA IC chips 200, second CPM data used to program or configure the first type of memory cells 490 of one of its field programmable logic cells or elements (LCE) 2014 or the first type of memory cells 362 of one of its field programmable switch cells 258 or 379 may be encrypted by its cryptography block as second encrypted CPM data. Next, a third one of the small I/O circuits 203 of said one of the standard commodity FPGA IC chips 200 may have the small driver 374 as seen in FIG. 18B coupling to the small receiver 375 of a fourth one of the small I/O circuits 203 of said one of the CS IC chips 411 via another of the non-programmable interconnects 364 of the inter-chip interconnects 371 for passing the second encrypted CPM data from the small driver 374 of the third one of the small I/O circuits 203 to the small receiver 375 of the fourth one of the small I/O circuits 203. Next, a third one of the large I/O circuits 341 of said one of the CS IC chips 411 may have the large driver 274 as see in FIG. 18A coupling to the large receiver 275 of a fourth one of the large I/O circuits 341 of said each of the NVM IC chips 250 via another of the non-programmable interconnects 364 of the inter-chip interconnects 371 for passing the second encrypted CPM data from the large driver 274 of the third one of the large I/O circuits 341 to the large receiver 275 of the fourth one of the large I/O circuits 341 to be stored in said each of the NVM IC chips 250.

Referring to FIG. 30A, for a third aspect, a first one of the large I/O circuits 341 of each of the NVM IC chips 250 may have the large driver 274 as see in FIG. 18A coupling to the large receiver 275 of a second one of the large I/O circuits 341 of one of the standard commodity FPGA IC chips 200 via one of the non-programmable interconnects 364 of the inter-chip interconnects 371 for passing first encrypted CPM data from the large driver 274 of the first one of the large I/O circuits 341 to the large receiver 275 of the second one of the large I/O circuits 341. Next, said one of the standard commodity FPGA IC chips 200 may include a cryptography block configured to decrypt the first encrypted CPM data as first decrypted CPM data, wherein the cryptography block may be any as illustrated in FIGS. 22A-22D, 23A-23C, 24, 25 and 26A-26C. Next, for said one of the standard commodity FPGA IC chips 200, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for said one of the standard commodity FPGA IC chips 200, second CPM data used to program or configure the first type of memory cells 490 of one of its field programmable logic cells or elements (LCE) 2014 or the first type of memory cells 362 of one of its field programmable switch cells 258 or 379 may be encrypted by its cryptography block as second encrypted CPM data. Next, a third one of the large I/O circuits 341 of said one of the standard commodity FPGA IC chips 200 may have the large driver 274 as seen in FIG. 18B coupling to the large receiver 275 of a fourth one of the large I/O circuits 341 of said each of the NVM IC chips 250 via another of the non-programmable interconnects 364 of the inter-chip interconnects 371 for passing the second encrypted CPM data from the large driver 274 of the third one of the small I/O circuits 203 to the large receiver 275 of the fourth one of the small I/O circuits 203 to be stored in said each of the NVM IC chips 250.

Referring to FIG. 30A, for a fourth aspect, each of the NVM IC chips 250 may include a cryptography block configured to decrypt first encrypted CPM data stored therein as first decrypted CPM data, wherein the cryptography block may be any as illustrated in FIGS. 22A-22D, 23A-23C, 24, 25 and 26A-26C. A first one of the large I/O circuits 341 of said each of the NVM IC chips 250 may have the large driver 274 as see in FIG. 18A coupling to the large receiver 275 of a second one of the large I/O circuits 341 of one of the CS IC chips 411 via one of the non-programmable interconnects 364 of the inter-chip interconnects 371 for passing the first decrypted CPM data from the large driver 274 of the first one of the large I/O circuits 341 to the large receiver 275 of the second one of the large I/O circuits 341. Next, a first one of the small I/O circuits 203 of said one of the CS IC chips 411 may have the small driver 374 as seen in FIG. 18B coupling to the small receiver 375 of a second one of the small I/O circuits 203 of one of the standard commodity FPGA IC chips 200 via another of the non-programmable interconnects 364 of the inter-chip interconnects 371 for passing the first decrypted CPM data from the small driver 374 of the first one of the small I/O circuits 203 to the small receiver 375 of the second one of the small I/O circuits 203. Next, for said one of the standard commodity FPGA IC chips 200, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, a third one of the small I/O circuits 203 of said one of the standard commodity FPGA IC chips 200 may have the small driver 374 as seen in FIG. 18B coupling to the small receiver 375 of a fourth one of the small I/O circuits 203 of said one of the CS IC chips 411 via another of the non-programmable interconnects 364 of the inter-chip interconnects 371 for passing second CPM data used to program or configure the first type of memory cells 490 of one of the field programmable logic cells or elements (LCE) 2014 of said one of the standard commodity FPGA IC chips 200 or the first type of memory cells 362 of one of the field programmable switch cells 258 or 379 of said one of the standard commodity FPGA IC chips 200 from the small driver 374 of the third one of the small I/O circuits 203 to the small receiver 375 of the fourth one of the small I/O circuits 203. Next, a third one of the large I/O circuits 341 of said one of the CS IC chips 411 may have the large driver 274 as see in FIG. 18A coupling to the large receiver 275 of a fourth one of the large I/O circuits 341 of said each of the NVM IC chips 250 via another of the non-programmable interconnects 364 of the inter-chip interconnects 371 for passing the second CPM data from the large driver 274 of the third one of the large I/O circuits 341 to the large receiver 275 of the fourth one of the large I/O circuits 341. For said each of the NVM IC chips 250, the second CPM data may be encrypted by its cryptography block as second encrypted CPM data to be stored therein.

Referring to FIG. 30A, for a fifth aspect, each of the NVM IC chips 250 may include a cryptography block configured to decrypt first encrypted CPM data stored therein as first decrypted CPM data, wherein the cryptography block may be any as illustrated in FIGS. 22A-22D, 23A-23C, 24, 25 and 26A-26C. A first one of the large I/O circuits 341 of said each of the NVM IC chips 250 may have the large driver 274 as see in FIG. 18A coupling to the large receiver 275 of a second one of the large I/O circuits 341 of one of the FPGA IC chips 200 via one of the non-programmable interconnects 364 of the inter-chip interconnects 371 for passing the first decrypted CPM data from the large driver 274 of the first one of the large I/O circuits 341 to the large receiver 275 of the second one of the large I/O circuits 341. Next, for said one of the standard commodity FPGA IC chips 200, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, a third one of the large I/O circuits 341 of said one of the standard commodity FPGA IC chips 200 may have the large driver 274 as seen in FIG. 18A coupling to the large receiver 275 of a fourth one of the large I/O circuits 341 of said each of the NVM IC chips 250 via another of the non-programmable interconnects 364 of the inter-chip interconnects 371 for passing second CPM data used to program or configure the first type of memory cells 490 of one of the field programmable logic cells or elements (LCE) 2014 of said one of the standard commodity FPGA IC chips 200 or the first type of memory cells 362 of one of the field programmable switch cells 258 or 379 of said one of the standard commodity FPGA IC chips 200 from the large driver 274 of the third one of the large I/O circuits 341 to the large receiver 275 of the fourth one of the large I/O circuits 341. For said each of the NVM IC chips 250, the second CPM data may be encrypted by its cryptography block as second encrypted CPM data to be stored therein.

Referring to FIG. 30A, for a sixth aspect, for each of the standard commodity FPGA IC chips 200, its field programmable logic cells or elements (LCE) 2014 as seen in FIG. 19 may have the second type of memory cells 490 each to be programmed or configured by breaking down one of its anti-fuses 981 and 982 for the tenth or eleventh type of non-volatile memory cell 980 or 985 as illustrated in FIG. 13A or 13B, one of its anti-fuses 987 and 988 for the twelfth type of non-volatile memory cell 986 as illustrated in FIG. 13C, one of its e-fuses 951 and 952 for the thirteenth or fourteenth type of non-volatile memory cell 955 or 956 as illustrated in FIG. 14B or 14C, or one of its e-fuses 941 and 942 for the fifteenth type of non-volatile memory cell 958 as illustrated in FIG. 14D. Its field programmable switch cells 258 or 379 as seen in FIG. 15A-15C, 16A, 16B or 21 may have the second type of memory cells 490 each to be programmed or configured by breaking down one of its anti-fuses 981 and 982 for the tenth or eleventh type of non-volatile memory cell 980 or 985 as illustrated in FIG. 13A or 13B, one of its anti-fuses 987 and 988 for the twelfth type of non-volatile memory cell 986 as illustrated in FIG. 13C, one of its e-fuses 951 and 952 for the thirteenth or fourteenth type of non-volatile memory cell 955 or 956 as illustrated in FIG. 14B or 14C, or one of its e-fuses 941 and 942 for the fifteenth type of non-volatile memory cell 958 as illustrated in FIG. 14D.

Referring to FIG. 30A, for the above second and third aspects, for the standard commodity logic drive 300, the fourth type of non-volatile memory cell 721 as illustrated in FIGS. 5A-5C and 5E formed by the FINFET process technology or as illustrated in FIGS. 5A and 5F formed by the GAAFET process technology may be formed in each of its FPGA IC chips 200 for storing the first, second and/or third password as illustrated in FIGS. 22A-22D, 23A-23C, 24, 25 and 26A-26C for the cryptography block of said each of its FPGA IC chips 200; while for the above first aspect the fourth type of non-volatile memory cell 721 as illustrated in FIGS. 5A and 5D formed by the planar MOSFET process technology may be formed in each of its cooperating and supporting (CS) IC chips 411 for storing the first, second and/or third password as illustrated in FIGS. 22A-22D, 23A-23C, 24, 25 and 26A-26C for the cryptography block of said each of its cooperating and supporting (CS) IC chips 411.

Referring to FIG. 30A, one or more of the programmable interconnects 361 of the inter-chip interconnects 371 may couple from each of the standard commodity FPGA IC chips 200 to all of the DPIIC chips 410. One or more of the programmable interconnects 361 of the inter-chip interconnects 371 may couple from each of the standard commodity FPGA IC chips 200 to the dedicated control and input/output (I/O) chip 260. One or more of the programmable interconnects 361 of the inter-chip interconnects 371 may couple from each of the standard commodity FPGA IC chips 200 to both of the NVM IC chips 250. One or more of the programmable interconnects 361 of the inter-chip interconnects 371 may couple from each of the standard commodity FPGA IC chips 200 to all of the GPU IC chips 269*a*. One or more of the programmable interconnects 361 of the inter-chip interconnects 371 may couple from each of the standard commodity FPGA IC chips 200 to the CPU IC chip 269*b*. One or more of the programmable interconnects 361 of the inter-chip interconnects 371 may couple from each of the standard commodity FPGA IC chips 200 to the DSP chip 270. One or more of the programmable interconnects 361 of the inter-chip interconnects 371 may couple from one of the standard commodity FPGA IC chips 200 to one of the HBM IC chips 251 next to said one of the standard commodity FPGA IC chips 200 and the communication between said one of the standard commodity FPGA IC chips 200 and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the standard commodity FPGA IC chips 200 to the other of the standard commodity FPGA IC chips 200. One or more of the programmable interconnects 361 of the inter-chip interconnects 371 may couple from each of the standard commodity FPGA IC chips 200 to the IAC chip 402. One or more of the programmable interconnects 361 of the inter-chip interconnects 371 may couple from each of the DPIIC chips 410 to the dedicated control and input/output (I/O) chip 260. One or more of the programmable interconnects 361 of the inter-chip interconnects 371 may couple from each of the DPIIC chips 410 to both of the NVM IC chips 250. One or more of the programmable interconnects 361 of the inter-chip interconnects 371 may couple from each of the DPIIC chips 410 to all of the GPU IC chips 269*a*. One or more of the programmable interconnects 361 of the inter-chip interconnects 371 may couple from each of the DPIIC chips 410 to the CPU IC chip 269*b*. One or more of the programmable interconnects 361 of the inter-chip interconnects 371 may couple from each of the DPIIC chips 410 to the DSP chip 270. One or more of the programmable interconnects 361 of the inter-chip interconnects 371 may couple from each of the DPIIC chips 410 to all of the HBM IC chips 251. One or more of the programmable interconnects 361 of the inter-chip interconnects 371 may couple from each of the DPIIC chips 410 to the others of the DPIIC chips 410. One or more of the programmable interconnects 361 of the inter-chip interconnects 371 may couple from each of the DPIIC chips 410 to the IAC chip 402. One or more of the programmable interconnects 361 of the inter-chip interconnects 371 may couple from the CPU IC chip 269*b* to all of the GPU IC chips 269*a*. One or more of the programmable interconnects 361 of the inter-chip interconnects 371 may couple from the DSP chip 270 to all of the GPU IC chips 269*a*. One or more of the programmable interconnects 361 of the inter-chip interconnects 371 may couple from the CPU IC chip 269*b* to both of the NVM IC chips 250. One or more of the programmable interconnects 361 of the inter-chip interconnects 371 may couple from the DSP chip 270 to both of the NVM IC chips 250. One or more of the programmable interconnects 361 of the inter-chip interconnects 371 may couple from the CPU IC chip 269*b* to one of the HBM IC chips 251 next to the CPU IC chip 269*b* and the communication between the CPU IC chip 269*b* and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from the CPU IC chip 269*b* to the IAC chip 402. One or more of the programmable interconnects 361 of the inter-chip interconnects 371 may couple from the DSP chip 270 to the IAC chip 402. One or more of the programmable interconnects 361 of the inter-chip interconnects 371 may couple from the CPU IC chip 269*b* to the DSP chip 270. One or more of the programmable interconnects 361 of the inter-chip interconnects 371 may couple from one of the GPU IC chips 269*a* to one of the HBM IC chips 251 next to said one of the GPU IC chips 269*a* and the communication between said one of the GPU IC chips 269*a* and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the GPU IC chips 269*a* to both of the NVM IC chips 250. One or more of the programmable interconnects 361 of the inter-chip interconnects 371 may couple from each of the GPU IC chips 269*a* to the others of the GPU IC chips 269*a*. One or more of the programmable interconnects 361 of the inter-chip interconnects 371 may couple from each of the GPU IC chips 269*a* to the IAC chip 402. One or more of the programmable interconnects 361 of the inter-chip interconnects 371 may couple from each of the NVM IC chips 250 to the dedicated control and input/output (I/O) chip 260. One or more of the programmable interconnects 361 of the inter-chip interconnects 371 may couple from each of the HBM IC chips 251 to the dedicated control and input/output (I/O) chip 260. One or more of the programmable interconnects 361 of the inter-chip interconnects 371 may couple from each of the GPU IC chips 269*a* to the dedicated control and input/output (I/O) chip 260. One or more of the programmable interconnects 361 of the inter-chip interconnects 371 may couple from the CPU IC chip 269*b* to the dedicated control and input/output (I/O) chip 260. One or more of the programmable interconnects 361 of the inter-chip interconnects 371 may couple from the DSP chip 270 to the dedicated control and input/output (I/O) chip 260. One or more of the programmable interconnects 361 of the inter-chip interconnects 371 may couple from each of the NVM IC chips 250 to all of the HBM IC chips 251. One or more of the programmable interconnects 361 of the inter-chip interconnects 371 may couple from each of the NVM IC chips 250 to the IAC chip 402. One or more of the programmable interconnects 361 of the inter-chip interconnects 371 may couple from each of the HBM IC chips 251 to the IAC chip 402. One or more of the programmable interconnects 361 of the inter-chip interconnects 371 may couple from each of the IAC chip 402 to the dedicated control and input/output (I/O) chip 260. One or more of the programmable interconnects 361 of the inter-chip interconnects 371 may couple from each of the NVM IC chips 250 to the other of the NVM IC chips 250. One or more of the programmable interconnects 361 of the inter-chip interconnects 371 may couple from each of the HBM IC chips 251 to the others of the HBM IC chips 251.

Referring to FIG. 30A, the logic drive 300 may include multiple dedicated input/output (I/O) chips 265 in a peripheral region thereof surrounding a center region thereof having the standard commodity FPGA IC chips 200, NVM IC chips 250, dedicated control and input/output (I/O) chip 260, GPU IC chips 269*a*, CPU IC chip 269*b*, DSP chip 270, HBM IC chips 251, IAC chip 402 and DPIIC chips 410 located therein. One or more of the programmable interconnects 361 of the inter-chip interconnects 371 may couple from each of the standard commodity FPGA IC chips 200 to all of the dedicated input/output (I/O) chips 265. One or more of the programmable interconnects 361 of the inter-chip interconnects 371 may couple from each of the DPIIC chips 410 to all of the dedicated input/output (I/O) chips 265. One or more of the programmable interconnects 361 of the inter-chip interconnects 371 may couple from each of the NVM IC chips 250 to all of the dedicated input/output (I/O) chips 265. One or more of the programmable interconnects 361 of the inter-chip interconnects 371 may couple from the dedicated control and input/output (I/O) chip 260 to all of the dedicated input/output (I/O) chips 265. One or more of the programmable interconnects 361 of the inter-chip interconnects 371 may couple from each of the GPU IC chips 269*a* to all of the dedicated input/output (I/O) chips 265. One or more of the programmable interconnects 361 of the inter-chip interconnects 371 may couple from the CPU IC chip 269*b* to all of the dedicated input/output (I/O) chips 265. One or more of the programmable interconnects 361 of the inter-chip interconnects 371 may couple from the DSP chip 270 to all of the dedicated input/output (I/O) chips 265. One or more of the programmable interconnects 361 of the inter-chip interconnects 371 may couple from each of the HBM IC chips 251 to all of the dedicated input/output (I/O) chips 265. One or more of the programmable interconnects 361 of the inter-chip interconnects 371 may couple from the IAC chip 402 to all of the dedicated input/output (I/O) chips 265. For the standard commodity logic drive 300, its dedicated control and input/output (I/O) chip 260 is configured to control data transmission between each of its dedicated input/output (I/O) chips 265 and one of its CPU IC chip 269*b*, DSP chip 270, standard commodity FPGA IC chips 200, GPU IC chips 269*a*, NVM IC chips 250, IAC chip 402 and HBM IC chips 251.

Referring to FIG. 30A, for the standard commodity logic drive 300 being in operation, each of its DPIIC chip 410 may be arranged with the 6T SRAM cells 398, as seen in FIG. 1A, acting as cache memory to store data from any of the CPU IC chip 269*b*, DSP chip 270, dedicated control and input/output (I/O) chip 260, standard commodity FPGA IC chips 200, GPU IC chips 269*a*, NVM IC chips 250, IAC chip 402 and HBM IC chips 251.

Referring to FIG. 30A, for the standard commodity logic drive 300, each of its CS IC chips 411 may include the regulating block 415 as illustrated in FIG. 29 configured to regulate a voltage of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to each of its CPU IC chip 269*b*, DSP chip 270, dedicated control and input/output (I/O) chip 260, standard commodity FPGA IC chips 200, GPU IC chips 269*a*, NVM IC chips 250, IAC chip 402 and HBM IC chips 251. Alternatively, instead of only one CS IC chip 411, multiple CS IC chips 411 may be provided for the standard commodity logic drive 300. Each of its CS IC chips 411 may provide the same function as the CS IC chip 411 as illustrated in FIGS. 29 and 30A.

Figure 30B:
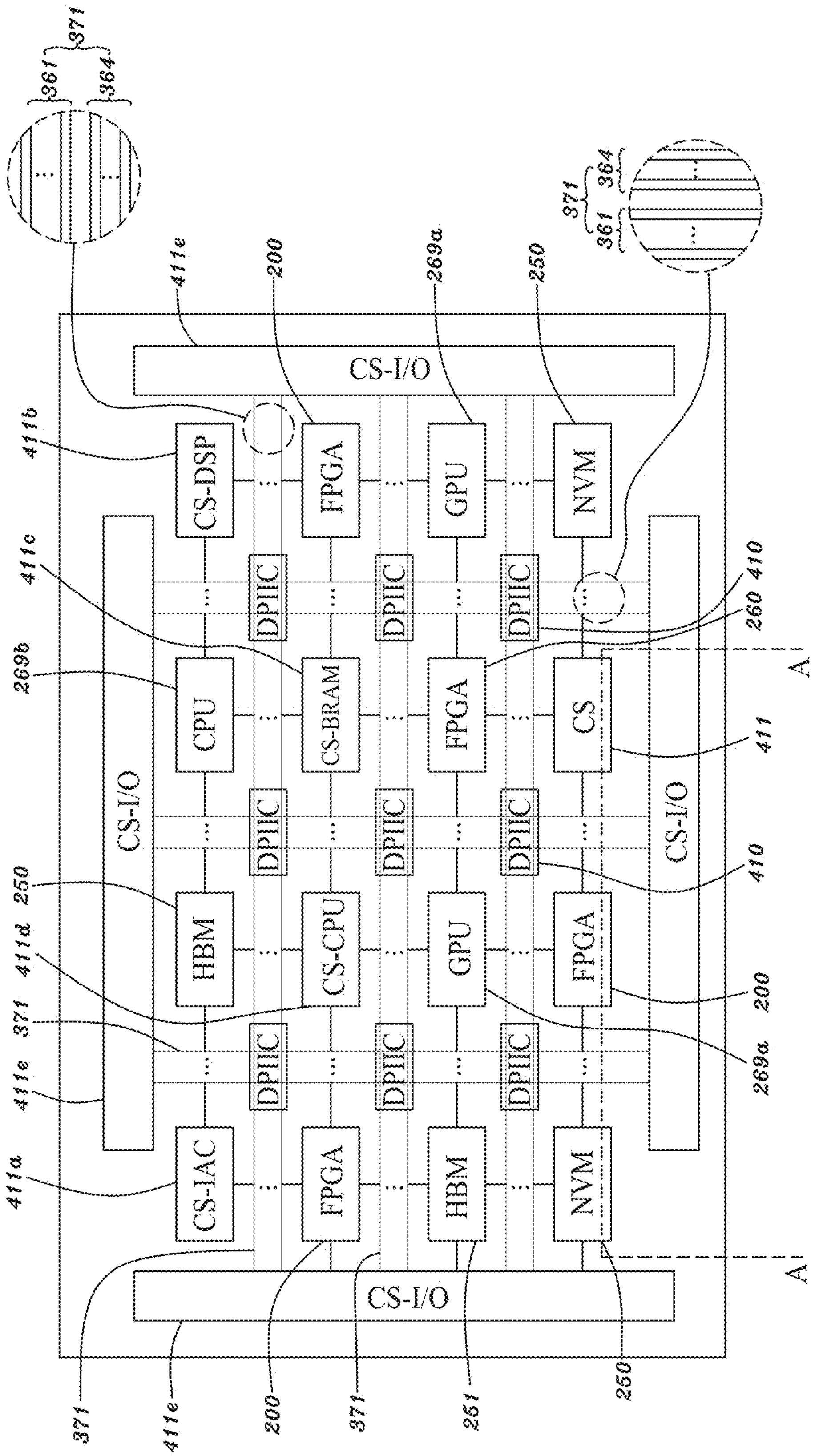
FIG. 30B is a schematically top view showing arrangement for various chips packaged in a standard commodity logic drive in accordance with another embodiment of the present application.

FIG. 30B is a schematically top view showing arrangement for various chips packaged in a standard commodity logic drive in accordance with another embodiment of the present application. Referring to FIG. 30B, a standard commodity logic drive 300 may be packaged with multiple logic integrated-circuit (IC) chips, such as graphic-processing unit (GPU) chips 269*a*, a central-processing-unit (CPU) chip 269*b* and multiple standard commodity FPGA IC chip 200, wherein each of the standard commodity FPGA IC chip 200 may have the same structure and specification as that illustrated in FIGS. 27A-27C. Further, the standard commodity logic drive 300 may be packaged with multiple high-bandwidth-memory (HBM) integrated-circuit (IC) chips 251 each arranged next to one of the GPU IC chips 269*a*, CPU IC chip 269*b* and FPGA IC chips 200 for communication with said one of the GPU IC chips 269*a*, CPU IC chip 269*b* and FPGA IC chips 200 in a high speed, high bandwidth and wide bitwidth of greater than 64 or 256, for example. Each of the HBM IC chips 251 in the standard commodity logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The standard commodity logic drive 300 may be further packaged with one or more of non-volatile memory (NVM) IC chips 250, such as NAND or NOR flash chip, MRAM IC chip or RRAM IC chip, configured to store data from data information memory (DIM) cells of the HBM IC chips 251. The standard commodity logic drive 300 may be further packaged with one or more cooperating and supporting (CS) integrated-circuit (IC) chips 411 for performing the functions as illustrated in FIG. 29. For example, one of the cooperating and supporting (CS) integrated-circuit (IC) chips 411 may be provided with intellectual-property (IP) circuits, application-specific (AS) circuits, analog circuits, mixed-mode signal circuits, radio-frequency (RF) circuits, and/or transmitter, receiver or transceiver circuits, etc., to be used for an innovated application-specific-IC (ASIC) or customer-owned-tooling (COT) chip abbreviated as a CS-IAC chip 411*a*. One of the cooperating and supporting (CS) integrated-circuit (IC) chips 411 may be formed with digital-signal-processing (DSP) slices for multiplication or division, which may be abbreviated as a CS-DSP chip 411*b*. One of the cooperating and supporting (CS) integrated-circuit (IC) chips 411 may be formed with multiple block static-random-access memory (SRAM) cells for logic operation, which may be abbreviated as a CS-BRAM chip 411*c*. One of the cooperating and supporting (CS) integrated-circuit (IC) chips 411 may be formed with multiple central-processing-unit (CPU) cores, which may be abbreviated as a CS-CPU IC chip 411*d*, wherein the central-processing-unit (CPU) cores may be ARM Cortex processor/controller cores based on a reduced instruction set computing (RISC) architecture or x86 central-processing-unit (CPU) cores based on complex instruction set computing (CISC) architecture, wherein the ARM Cortex processor/controller cores may be 8-bit, 16-bit, 32-bit, 64-bit or more-than-64-bit reduced-instruction-set-computing (RISC) ARM processor/controller cores licensed by ARM Holdings. The CPU IC chip 269*b*, standard commodity FPGA IC chips 200, GPU IC chips 269*a*, cooperating and supporting (CS) integrated-circuit (IC) chips 411, CS-IAC chip 411*a*, CS-DSP chip 411*b*, CS-BRAM chip 411*c*, CS-CPU IC chip 411*d*, NVM IC chips 250 and HBM IC chips 251 may be arranged in an array.

Referring to FIG. 30B, the standard commodity logic drive 300 may include the inter-chip interconnects 371 each coupling neighboring two of the standard commodity FPGA IC chips 200, NVM IC chips 250, GPU IC chips 269*a*, CPU IC chip 269*b*, cooperating and supporting (CS) integrated-circuit (IC) chip 411, CS-IAS chip 411*a*, CS-DSP chip 411*b*, CS-BRAM chip 411*c*, CS-CPU IC chip 411*d* and HBM IC chips 251. The standard commodity logic drive 300 may include a plurality of DPIIC chip 410 each aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, GPU IC chips 269*a*, CPU IC chip 269*b*, cooperating and supporting (CS) integrated-circuit (IC) chip 411, CS-IAS chip 411*a*, CS-DSP chip 411*b*, CS-BRAM chip 411*c*, CS-CPU IC chip 411*d* and HBM IC chips 251 around said each of the DPIIC chips 410. The inter-chip interconnects 371 may be formed for the programmable interconnect 361 and non-programmable interconnects 364. Data transmission may be built (1) between one of the programmable interconnects 361 of the inter-chip interconnects 371 and one of the programmable interconnects 361 of one of the standard commodity FPGA IC chips 200 via one of the small input/output (I/O) circuits 203 of said one of the standard commodity FPGA IC chips 200, and (2) between one of the programmable interconnects 361 of the inter-chip interconnects 371 and one of the programmable interconnects 361 one of the DPIIC chips 410 via one of the small input/output (I/O) circuits 203 of said one of the DPIIC chips 410.

Referring to FIG. 30B, the standard commodity logic drive 300 may include the NVM IC chips 250, CS IC chip 411 and standard commodity FPGA IC chips 200 to perform the data transmission as illustrated in FIG. 30A for each of the first and second aspects. Alternatively, the standard commodity logic drive 300 may include the NVM IC chips 250 and standard commodity FPGA IC chips 200 to perform the data transmission as illustrated in FIG. 30A for each of the third through sixth aspects.

Referring to FIG. 30B, for the above second and third aspects as illustrated in FIG. 30A, for the standard commodity logic drive 300, the fourth type of non-volatile memory cell 721 as illustrated in FIGS. 5A-5C and 5E formed by the FINFET process technology or as illustrated in FIGS. 5A and 5F formed by the GAAFET process technology may be formed in each of its FPGA IC chips 200 for storing the first, second and/or third password as illustrated in FIGS. 22A-22D, 23A-23C, 24, 25 and 26A-26C for the cryptography block of said each of its FPGA IC chips 200; while for the above first aspect as illustrated in FIGS. 30A and 30B, the fourth type of non-volatile memory cell 721 as illustrated in FIGS. 5A and 5D formed by the planar MOSFET process technology may be formed in its cooperating and supporting (CS) IC chip 411 for storing the first, second and/or third password as illustrated in FIGS. 22A-22D, 23A-23C, 24, 25 and 26A-26C for the cryptography block of its cooperating and supporting (CS) IC chip 411.

Referring to FIG. 30B, for the standard commodity logic drive 300, a voltage (Vcc) of power supply supplied for its CS-CPU IC chip 411*d* may be the same as that supplied for each of its standard commodity FPGA IC chips 200. Further, gate oxide of each of transistors of its CS-CPU IC chip 411*d* may have the same thickness as that of each of transistors of each of its FPGA IC chips 200. The semiconductor technology node or generation used in its CS-CPU IC chip 411*d* may be the same as or similar to that used in its standard commodity FPGA IC chip 200.

Referring to FIG. 30B, one or more of the programmable interconnects 361 of the inter-chip interconnects 371 may couple from each of the standard commodity FPGA IC chips 200 to each of the cooperating and supporting (CS) IC chip 411, CS-IAC chip 411*a*, CS-DSP chip 411*b*, CS-BRAM chip 411*c* and CS-CPU IC chip 411*d*. One or more of the programmable interconnects 361 of the inter-chip interconnects 371 may couple from each of the standard commodity FPGA IC chips 200 to all of the DPIIC chips 410. One or more of the programmable interconnects 361 of the inter-chip interconnects 371 may couple from each of the standard commodity FPGA IC chips 200 to both of the NVM IC chips 250. One or more of the programmable interconnects 361 of the inter-chip interconnects 371 may couple from each of the standard commodity FPGA IC chips 200 to all of the GPU IC chips 269*a*. One or more of the programmable interconnects 361 of the inter-chip interconnects 371 may couple from each of the standard commodity FPGA IC chips 200 to the CPU IC chip 269*b*. One or more of the programmable interconnects 361 of the inter-chip interconnects 371 may couple from one of the standard commodity FPGA IC chips 200 to one of the HBM IC chips 251 next to said one of the standard commodity FPGA IC chips 200 and the communication between said one of the standard commodity FPGA IC chips 200 and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the standard commodity FPGA IC chips 200 to the other of the standard commodity FPGA IC chips 200. One or more of the programmable interconnects 361 of the inter-chip interconnects 371 may couple from each of the DPIIC chips 410 to both of the NVM IC chips 250. One or more of the programmable interconnects 361 of the inter-chip interconnects 371 may couple from each of the DPIIC chips 410 to all of the GPU IC chips 269*a*. One or more of the programmable interconnects 361 of the inter-chip interconnects 371 may couple from each of the DPIIC chips 410 to the CPU IC chip 269*b*. One or more of the programmable interconnects 361 of the inter-chip interconnects 371 may couple from each of the DPIIC chips 410 to all of the HBM IC chips 251. One or more of the programmable interconnects 361 of the inter-chip interconnects 371 may couple from each of the DPIIC chips 410 to the others of the DPIIC chips 410. One or more of the programmable interconnects 361 of the inter-chip interconnects 371 may couple from the CPU IC chip 269*b* to all of the GPU IC chips 269*a*. One or more of the programmable interconnects 361 of the inter-chip interconnects 371 may couple from the CPU IC chip 269*b* to both of the NVM IC chips 250. One or more of the programmable interconnects 361 of the inter-chip interconnects 371 may couple from the CPU IC chip 269*b* to one of the HBM IC chips 251 next to the CPU IC chip 269*b* and the communication between the CPU IC chip 269*b* and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from one of the GPU IC chips 269*a* to one of the HBM IC chips 251 next to said one of the GPU IC chips 269*a* and the communication between said one of the GPU IC chips 269*a* and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the GPU IC chips 269*a* to both of the NVM IC chips 250. One or more of the programmable interconnects 361 of the inter-chip interconnects 371 may couple from each of the GPU IC chips 269*a* to the others of the GPU IC chips 269*a*. One or more of the programmable interconnects 361 of the inter-chip interconnects 371 may couple from each of the NVM IC chips 250 to all of the HBM IC chips 251. One or more of the programmable interconnects 361 of the inter-chip interconnects 371 may couple from each of the NVM IC chips 250 to the other of the NVM IC chips 250. One or more of the programmable interconnects 361 of the inter-chip interconnects 371 may couple from each of the HBM IC chips 251 to the others of the HBM IC chips 251.

For example, referring to FIG. 30B, one of the standard commodity FPGA IC chips 200 may be arranged next to two of the GPU IC chips 269*a* and between two of the GPU IC chips 269*a* to provide a smart interface between said two of the GPU IC chips 269*a*, and thereby said one of the standard commodity FPGA IC chips 200 may perform field programmability and artificial intelligent networking between said two of the GPU IC chips 269*a*.

Referring to FIG. 30B, the logic drive 300 may include multiple cooperating and supporting (CS) IC chips 411 provided with the large-input/output (I/O) block 412 and small-input/output (I/O) block 413 as illustrated in FIG. 29, which may be abbreviated as CS-I/O chips 411*e*. The CS-I/O chips 411*e* may be arranged in a peripheral region thereof surrounding a center region thereof having the standard commodity FPGA IC chips 200, NVM IC chips 250, GPU IC chips 269*a*, CPU IC chip 269*b*, cooperating and supporting (CS) integrated-circuit (IC) chip 411, CS-IAS chip 411*a*, CS-DSP chip 411*b*, CS-BRAM chip 411*c*, CS-CPU IC chip 411*d* and HBM IC chips 251 located therein. One or more of the programmable interconnects 361 of the inter-chip interconnects 371 may couple from each of the standard commodity FPGA IC chips 200 to all of the CS-I/O chips 411*e*. One or more of the programmable interconnects 361 of the inter-chip interconnects 371 may couple from each of the DPIIC chips 410 to all of the CS-I/O chips 411*e*. One or more of the programmable interconnects 361 of the inter-chip interconnects 371 may couple from each of the NVM IC chips 250 to all of the CS-I/O chips 411*e*. One or more of the programmable interconnects 361 of the inter-chip interconnects 371 may couple from each of the GPU IC chips 269*a* to all of the CS-I/O chips 411*e*. One or more of the programmable interconnects 361 of the inter-chip interconnects 371 may couple from the CPU IC chip 269*b* to all of the CS-I/O chips 411*e*. One or more of the programmable interconnects 361 of the inter-chip interconnects 371 may couple from each of the HBM IC chips 251 to all of the CS-I/O chips 411*e*.

Referring to FIG. 30B, for the standard commodity logic drive 300 being in operation, each of its DPIIC chip 410 may be arranged with the 6T SRAM cells 398, as seen in FIG. 1A, acting as cache memory to store data from any of the CPU IC chip 269*b*, standard commodity FPGA IC chips 200, GPU IC chips 269*a*, NVM IC chips 250 and HBM IC chips 251.

Referring to FIG. 30B, for the standard commodity logic drive 300, its CS IC chip 411 may include the regulating block 415 as illustrated in FIG. 29 configured to regulate a voltage of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to each of its standard commodity FPGA IC chips 200. Alternatively, instead of only one CS IC chip 411, multiple CS IC chips 411 may be provided for the standard commodity logic drive 300. Each of its CS IC chips 411 may provide the same function as the CS IC chip 411 as illustrated in FIGS. 29, 30A and 30B.

Interconnection for Logic Drive

Figure 31A:
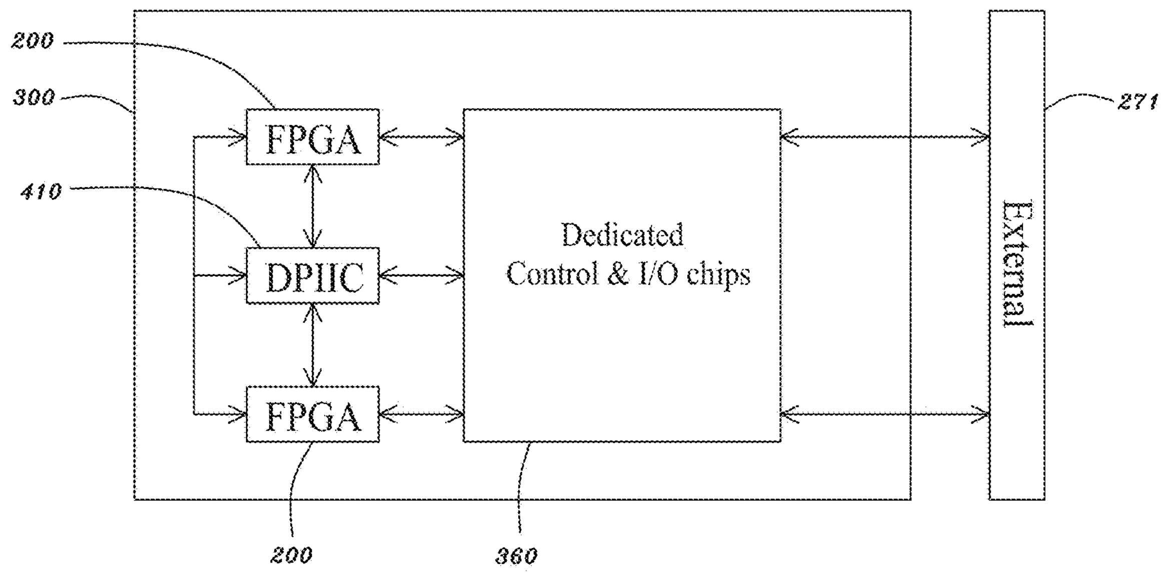
FIG. 31A is a block diagram showing interconnection between chips in a standard commodity logic drive in accordance with an embodiment of the present application.

FIG. 31A is a block diagram showing interconnection between chips in a standard commodity logic drive in accordance with an embodiment of the present application. Referring to FIG. 31A, two blocks 200 may be two different groups of the standard commodity FPGA IC chips 200 in the logic drive 300 illustrated in FIG. 30A or 30B; a block 410 may be a combination of the DPIIC chips 410 in the logic drive 300 illustrated in FIG. 30A or 30B; a block 360 may be a combination of the dedicated I/O chips 265 and dedicated control and input/output (I/O) chip 260 in the logic drive 300 illustrated in FIG. 30A or a combination of the CS-I/O chips 411*e* in the logic drive 300 illustrated in FIG. 30B.

Referring to FIG. 31A, for each of the standard commodity logic drives 300 as illustrated in FIGS. 30A and 30B, one or more of the programmable interconnects 361 of its inter-chip interconnects 371 may couple one or more of the small I/O circuits 203 of each of its dedicated I/O chips 265 or CS-I/O chips 411*e* in the block 360 to one or more of the small I/O circuits 203 of one of its standard commodity FPGA IC chips 200. One or more of the programmable interconnects 361 of its inter-chip interconnects 371 may couple one or more of the small I/O circuits 203 of each of its dedicated I/O chips 265 or CS-I/O chips 411*e* in the block 360 to one or more of the small I/O circuits 203 of one of its DPIIC chips 410. One or more of the non-programmable interconnects 364 of the inter-chip interconnects 371 may couple one or more of the small I/O circuits 203 of each of its dedicated I/O chips 265 or CS-I/O chips 411*e* in the block 360 to one or more of the small I/O circuits 203 of one of its standard commodity FPGA IC chips 200. One or more of the non-programmable interconnects 364 of the inter-chip interconnects 371 may couple one or more of the small I/O circuits 203 of each of its dedicated I/O chips 265 or CS-I/O chips 411*e* in the block 360 to one or more of the small I/O circuits 203 of one of its DPIIC chips 410.

Referring to FIG. 31A, for each of the standard commodity logic drives 300 as illustrated in FIGS. 30A and 30B, one or more of the programmable interconnects 361 of its inter-chip interconnects 371 may couple one or more of the small I/O circuits 203 of each of its DPIIC chips 410 to one or more of the small I/O circuits 203 of one of the standard commodity FPGA IC chips 200. One or more of the programmable interconnects 361 of its inter-chip interconnects 371 may couple one or more of the small I/O circuits 203 of each of its DPIIC chips 410 to one or more of the small I/O circuits 203 of another of the DPIIC chips 410. One or more of the non-programmable interconnects 364 of the inter-chip interconnects 371 may couple one or more of the small I/O circuits 203 of each of its DPIIC chips 410 to one or more of the small I/O circuits 203 of one of its standard commodity FPGA IC chips 200. One or more of the non-programmable interconnects 364 of the inter-chip interconnects 371 may couple one or more of the small I/O circuits 203 of each of its DPIIC chips 410 to one or more of the small I/O circuits 203 of another of its DPIIC chips 410.

Referring to FIG. 31A, for each of the standard commodity logic drives 300 as illustrated in FIGS. 30A and 30B, one or more of the programmable interconnects 361 of its inter-chip interconnects 371 may couple one or more of the small I/O circuits 203 of each of its standard commodity FPGA IC chips 200 to one or more of the small I/O circuits 203 of another of the standard commodity FPGA IC chips 200. One or more of the non-programmable interconnects 364 of its inter-chip interconnects 371 may couple one or more of the small I/O circuits 203 of each of its standard commodity FPGA IC chips 200 to one or more of the small I/O circuits 203 of another of its standard commodity FPGA IC chips 200.

Referring to FIG. 31A, for each of the standard commodity logic drives 300 as illustrated in FIGS. 30A and 30B, one or more of the programmable interconnects 361 of its inter-chip interconnects 371 may couple one or more of the small I/O circuits 203 of its dedicated control and I/O chip 260 or CS-I/O chips 411*e* in the block 360 to one or more of the small I/O circuits 203 of each of its standard commodity FPGA IC chips 200. One more of the non-programmable interconnects 364 of its inter-chip interconnects 371 may couple one or more of the small I/O circuits 203 of its dedicated control and I/O chip 260 or CS-I/O chips 411*e* in the block 360 to one or more of the small I/O circuits 203 of each of its standard commodity FPGA IC chips 200. One or more of the programmable interconnects 361 of its inter-chip interconnects 371 may couple one or more of the small I/O circuits 203 of its dedicated control and I/O chip 260 or CS-I/O chips 411*e* in the block 360 to one or more of the small I/O circuits 203 of each of the DPIIC chips 410. One more of the non-programmable interconnects 364 of its inter-chip interconnects 371 may couple one or more of the small I/O circuits 203 of its dedicated control and I/O chip 260 or CS-I/O chips 411*e* in the block 360 to one or more of the small I/O circuits 203 of each of its DPIIC chips 410. One or more of the non-programmable interconnects 364 of its inter-chip interconnects 371 may couple one or more of the large I/O circuits 341 of its dedicated control and I/O chip 260 or one of its CS-I/O chips 411*e* in the block 360 to one or more of the large I/O circuits 341 of each of its dedicated I/O chips 265 or each of its CS-I/O chips 411*e*. One or more of the large I/O circuits 341 of its dedicated control and I/O chip 260 or each of its CS-I/O chips 411*e* in the block 360 may couple to the external circuitry 271 outside the standard commodity logic drive 300.

Referring to FIG. 31A, for the standard commodity logic drives 300 as illustrated in FIG. 30A, one or more of the large I/O circuits 341 of each of its dedicated I/O chips 265 in the block 360 may couple to the external circuitry 271 outside the standard commodity logic drive 300.

Referring to FIGS. 30A, 30B and 31A, for the standard commodity logic drive 300, a voltage (Vcc) of power supply supplied for each of the large I/O circuits 341 of each of its dedicated I/O chips 265 and dedicated control and I/O chip 260 in the block 360 may be higher than that supplied for each of the small I/O circuits 203 of said each of its dedicated I/O chips 265 and dedicated control and I/O chip 260 in the block 360 and that supplied for each of the small I/O circuits 203 of each of its standard commodity FPGA IC chips 200, wherein the voltage (Vcc) of power supply supplied for each of the small I/O circuits 203 of each of its dedicated I/O chips 265 and dedicated control and I/O chip 260 in the block 360 may be the same as that supplied for each of the small I/O circuits 203 of each of its standard commodity FPGA IC chips 200. Further, gate oxide of each of the large I/O circuits 341 of each of its dedicated I/O chips 265 and dedicated control and I/O chip 260 in the block 360 may have a greater thickness than that of each of the small I/O circuits 203 of said each of its dedicated I/O chips 265 and dedicated control and I/O chip 260 in the block 360.

Referring to FIGS. 30A, 30B and 31A, for the standard commodity logic drive 300, each of its standard commodity FPGA IC chips 200 may reload resulting values or first programming codes from its non-volatile memory (NVM) IC chip 250 to the memory cells 490 of said each of its standard commodity FPGA IC chips 200 via one or more of the non-programmable interconnects 364 of its intra-chip interconnects 502, and thereby the resulting values or first programming codes may be stored or latched in the memory cells 490 of said each of its standard commodity FPGA IC chips 200 to program its field programmable logic cells 2014 as illustrated in FIGS. 19 and 20A-20L. Said each of its standard commodity FPGA IC chips 200 may reload second programming codes from its non-volatile memory (NVM) IC chip 250 to the memory cells 362 of said each of its standard commodity FPGA IC chips 200 via one or more of the non-programmable interconnects 364 of its intra-chip interconnects 502, and thereby the second programming codes may be stored or latched in the memory cells 362 of said each of its standard commodity FPGA IC chips 200 to program the field programmable switch cells 292 or 379 of said each of its standard commodity FPGA IC chips 200 as illustrated in FIGS. 15A-15C, 16A, 16B and 21. Said each of its DPIIC chips 410 may reload third programming codes from its non-volatile memory (NVM) IC chip 250 to the memory cells 362 of said each of its DPIIC chips 410, and thereby the third programming codes may be stored or latched in the memory cells 362 of said each of its DPIIC chips 410 to program the field programmable switch cells 292 or 379 of said each of its DPIIC chips 410 as illustrated in FIGS. 15A-15C, 16A, 16B, 21 and 28.

Thereby, referring to FIGS. 30A, 30B and 31A, one of the dedicated I/O chips 265 of the standard commodity logic drive 300 may have one of its large I/O circuits 341 to drive data from the external circuitry 271 outside the logic drive 300 to one of its small I/O circuits 203. For said one of the dedicated I/O chips 265, said one of its small I/O circuits 203 may drive the data to a first one of the small I/O circuits 203 of one of the DPIIC chips 410 of the standard commodity logic drive 300 via one or more of the programmable interconnects 361 of the inter-chip interconnects 371 of the standard commodity logic drive 300. For said one of the dedicated DPIIC chips 410, the first one of its small I/O circuits 203 may drive the data to one of its field programmable switch cells 379 via a first one of the programmable interconnects 361 of its intra-chip interconnects; said one of its field programmable switch cells 379 may pass the data from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the data to one of the small I/O circuits 203 of one of the standard commodity FPGA IC chips 200 of the standard commodity logic drive 300 via one or more of the programmable interconnects 361 of the inter-chip interconnects 371 of the standard commodity logic drive 300. For said one of the standard commodity FPGA IC chips 200, said one of its small I/O circuits 203 may drive the data to one of its field programmable switch cells 379 through a first group of programmable interconnects 361 of its intra-chip interconnects 502 as seen in FIG. 27A-27C; said one of its field programmable switch cells 379 may pass the data from the first group of programmable interconnects 361 of its intra-chip interconnects 502 to a second group of programmable interconnects 361 of its intra-chip interconnects 502 to be passed as a data input of the first input set of one of its field programmable logic cells or elements (LCE) 2014 as seen in FIGS. 19 and 20A-20H or a data input of one of its center-processing-unit cores (CPUC) 2010 as seen in FIG. 27C.

Referring to FIGS. 30A, 30B and 31A, in another aspect, for a first one of the standard commodity FPGA IC chips 200 of the standard commodity logic drive 300 as illustrated in FIG. 27A-27C, one of its field programmable logic cells or elements (LCE) 2014 as seen in FIGS. 19 and 20A-20L or one of its center-processing-unit cores (CPUC) 2010 as seen in FIG. 27C may have the data output to be passed to one of its field programmable switch cells 379 via a first group of programmable interconnects 361 of its intra-chip interconnects 502; said one of its field programmable switch cells 379 may pass the data output of said one of its field programmable logic cells or elements (LCE) 2014 or said one of its center-processing-unit cores (CPUC) 2010 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its field programmable logic cells or elements (LCE) 2014 or said one of its center-processing-unit cores (CPUC) 2010 to a first one of the small I/O circuits 203 of one of the DPIIC chips 410 of the standard commodity logic drive 300 via one or more of programmable interconnects 361 of the inter-chip interconnects 371 of the standard commodity logic drive 300. For said one of the DPIIC chips 410, the first one of its small I/O circuits 203 may drive the data output of said one of its field programmable logic cells or elements (LCE) 2014 or said one of its center-processing-unit cores (CPUC) 2010 to one of its field programmable switch cells 379 via a first group of programmable interconnects 361 of its intra-chip interconnects; said one of its field programmable switch cells 379 may pass the data output of said one of its field programmable logic cells or elements (LCE) 2014 or said one of its center-processing-unit cores (CPUC) 2010 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its field programmable logic cells or elements (LCE) 2014 or said one of its center-processing-unit cores (CPUC) 2010 to one of the small I/O circuits 203 of a second one of the standard commodity FPGA IC chips 200 of the standard commodity logic drive 300 via one or more of the programmable interconnects 361 of the inter-chip interconnects 371 of the standard commodity logic drive 300. For the second one of the FPGA IC chips 200, said one of its small I/O circuits 203 may drive the data output of said one of its field programmable logic cells or elements (LCE) 2014 or said one of its center-processing-unit cores (CPUC) 2010 to one of its field programmable switch cells 379 through a first group of programmable interconnects 361 of its intra-chip interconnects 502; said one of its field programmable switch cells 379 may pass the data output of said one of its field programmable logic cells or elements (LCE) 2014 or said one of its center-processing-unit cores (CPUC) 2010 from the first group of programmable interconnects 361 of its intra-chip interconnects 502 to a second group of programmable interconnects 361 of its intra-chip interconnects 502 to be passed as a data input of the input data set of one of its field programmable logic cells or elements (LCE) 2014 as seen in FIGS. 19 and 20A-20L or a data input of one of its center-processing-unit cores (CPUC) 2010 as seen in FIG. 27L.

Referring to FIGS. 30A, 30B and 31A, in another aspect, for one of the standard commodity FPGA IC chips 200 of the standard commodity logic drive 300 as seen in FIG. 27A-27C, one of its field programmable logic cells or elements (LCE) 2014 as seen in FIGS. 19 and 20A-20L or one of its center-processing-unit cores (CPUC) 2010 may have a data output to be passed to one of its field programmable switch cells 379 via a first group of programmable interconnects 361 of its intra-chip interconnects 502; said one of its field programmable switch cells 379 may pass the data output of said one of its field programmable logic cells or elements (LCE) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its field programmable logic cells or elements (LCE) 2014 or said one of its center-processing-unit cores (CPUC) 2010 to a first one of the small I/O circuits 203 of one of the DPIIC chips 410 of the standard commodity FPGA IC chips 200 via one or more of the programmable interconnects 361 of the inter-chip interconnects 371 of the standard commodity FPGA IC chips 200. For said one of the DPIIC chips 410, the first one of its small I/O circuits 203 may drive the data output of said one of its field programmable logic cells or elements (LCE) 2014 or said one of its center-processing-unit cores (CPUC) 2010 to one of its field programmable switch cells 379 via a first group of programmable interconnects 361 of its intra-chip interconnects; said one of its field programmable switch cells 379 may pass the data output of said one of its field programmable logic cells or elements (LCE) 2014 or said one of its center-processing-unit cores (CPUC) 2010 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its field programmable logic cells or elements (LCE) 2014 to one of the small I/O circuits 203 of one of the dedicated I/O chips 265 of the standard commodity FPGA IC chips 200 via one or more of programmable interconnects 361 of the inter-chip interconnects 371 of the standard commodity FPGA IC chips 200. For said one of the dedicated I/O chips 265, said one of its small I/O circuits 203 may drive the data output of said one of its field programmable logic cells or elements (LCE) 2014 or said one of its center-processing-unit cores (CPUC) 2010 to one of its large I/O circuits 341 to be passed to the external circuitry 271 outside the standard commodity logic drive 300.

Referring to FIGS. 30A, 30B and 31A, the external circuitry 271 outside the standard commodity logic drive 300 may not be allowed to reload the resulting values and first, second and third programming codes from any of the NVM IC chips 250 of the standard commodity logic drive 300. Alternatively, the external circuitry 271 outside the standard commodity logic drive 300 may be allowed to reload the resulting values and first, second and third programming codes from one or more of the NVM IC chips 250 of the standard commodity logic drive 300.

Figure 31B:
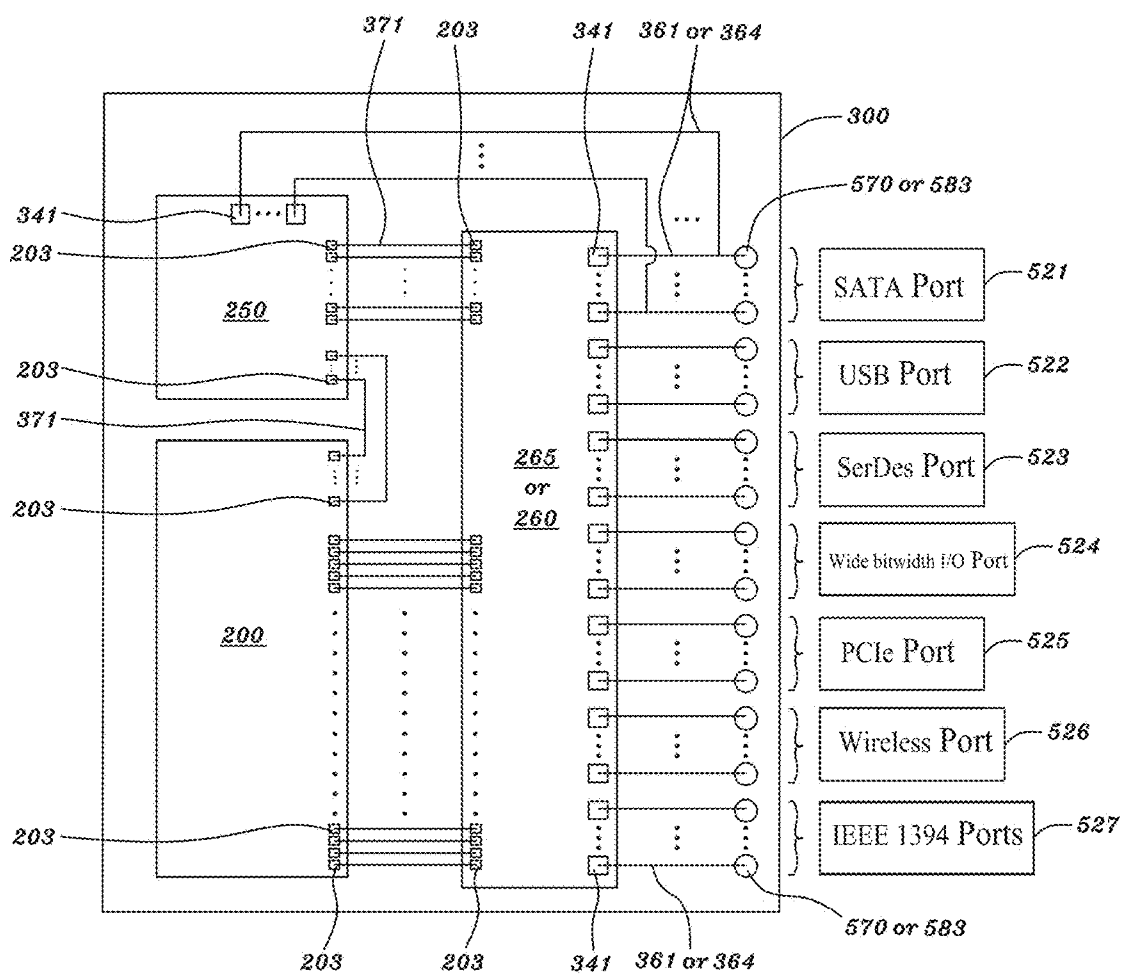
FIG. 31B is a block diagram showing interconnection in a standard commodity logic drive in accordance with an embodiment of the present application.

FIG. 31B is a block diagram showing interconnection in a standard commodity logic drive in accordance with an embodiment of the present application. Referring to FIG. 31B, for the standard commodity logic drive 300 as illustrated in FIG. 30, each of its dedicated I/O chips 265 and control and I/O chip 260 may include a first group of small I/O circuits 203 as illustrated in FIG. 18B each having the node 381 coupling to the node 381 of one of a first group of small I/O circuits 203 of one of its FPGA IC chips 200 through one of its inter-chip interconnect 371, i.e., programmable or non-programmable interconnect 361 or 364, and a second group of small I/O circuits 203 each having the node 381 coupling to the node 381 of one of a first group of small I/O circuits 203 of one of its NVM IC chips 250 through one of its inter-chip interconnect 371, i.e., programmable or non-programmable interconnect 361 or 364. Said one of its FPGA IC chips 200 may include a second group of small I/O circuits 203 as illustrated in FIG. 18B each having the node 381 coupling to the node 381 of one of a second group of small I/O circuits 203 of said one of its NVM IC chips 250 through one of its inter-chip interconnect 371, i.e., programmable or non-programmable interconnect 361 or 364. Said each of its dedicated I/O chips 265 and control and I/O chip 260 may include (1) a first group of large I/O circuits 341 as illustrated in FIG. 18A each having the node 281 coupling to one of its metal bumps or pillars 570, metal pads 583 or solder balls 538 as seen in FIGS. 36A-44 for one or more serial-advanced-technology-attachment (SATA) ports 521 and the node 281 of one of the large I/O circuits 341 of said one of its NVM IC chips 250 through one of its programmable or non-programmable interconnects 361 or 364, (2) a second group of large I/O circuits 341 each having the node 281 coupling to one of its metal bumps or pillars 570 or metal pads 583 for one or more universal serial bus (USB) ports 522 through one of its programmable or non-programmable interconnects 361 or 364, (3) a third group of large I/O circuits 341 each having the node 281 coupling to one of its metal bumps or pillars 570 or metal pads 583 for one or more serializer/deserializer (SerDes) ports 523 through one of its programmable or non-programmable interconnects 361 or 364, (4) a fourth group of large I/O circuits 341 each having the node 281 coupling to one of its metal bumps or pillars 570 or metal pads 583 for one or more wide input/output (I/O) ports 524 through one of its programmable or non-programmable interconnects 361 or 364, (5) a fifth group of large I/O circuits 341 each having the node 281 coupling to one of its metal bumps or pillars 570 or metal pads 583 for one or more peripheral-components-interconnect express (PCIe) ports 525 through one of its programmable or non-programmable interconnects 361 or 364, (6) a sixth group of large I/O circuits 341 each having the node 281 coupling to one of its metal bumps or pillars 570 or metal pads 583 for one or more wireless ports 526 through one of its programmable or non-programmable interconnects 361 or 364 and (7) a seventh group of large I/O circuits 341 each having the node 281 coupling to one of its metal bumps or pillars 570 or metal pads 583 for one or more IEEE 1394 ports 527 through one of its programmable or non-programmable interconnects 361 or 364.

Referring to FIG. 31B, for the standard commodity logic drive 300 as illustrated in FIG. 30, each of its dedicated I/O chips 265 and control and I/O chip 260 may include a buffer and/or driver circuits for downloading the resulting values from each of its non-volatile memory (NVM) IC chips 250 to the memory cells 490 of each of its FPGA IC chips 200 as illustrated in FIGS. 19 and 20A-20L and downloading the programmable codes from each of its non-volatile memory (NVM) IC chips 250 to the memory cells 362 of each of its FPGA IC chips 200 as illustrated in FIGS. 15A-15C, 16A, 16B and 21. The buffer and/or driver circuits of each of its dedicated I/O chips 265 and control and I/O chip 260 may latch data associated with the resulting values and programmable codes from each of its non-volatile memory (NVM) IC chips 250 and amplify the data to the memory cells 490 and/or 362 of each of its FPGA IC chips 200 with an increased bit width of the data. For example, the data from each of its non-volatile memory (NVM) IC chips 250 to each of its dedicated I/O chips 265 and control and I/O chip 260 may have a bit-width of 1 bit in a standard of serial advanced technology attachment (SATA), and the buffer of each of its dedicated I/O chips 265 and control and I/O chip 260 may latch the data in multiple memory cells, i.e., SRAM cells, therein. Next, the buffer of each of its dedicated I/O chips 265 and control and I/O chip 260 may simultaneously output and amplify the data in parallel to the memory cells 490 and/or 362 of each of its FPGA IC chips 200 with an increased bit width of equal to or more than 4, 8, 16, 32 or 64 for example. For another example, the data from each of its non-volatile memory (NVM) IC chips 250 to each of its dedicated I/O chips 265 and control and I/O chip 260 may have a bit-width of 32 bit in a standard of peripheral component interconnect express (PCIe), and the buffer of each of its dedicated I/O chips 265 and control and I/O chip 260 may latch the data in multiple memory cells, i.e., SRAM cells, therein. Next, the buffer of each of its dedicated I/O chips 265 and control and I/O chip 260 may simultaneously output and amplify the data in parallel to the memory cells 490 and/or 362 of each of its FPGA IC chips 200 with an increased bit width of equal to or more than 64, 128, or 256 for example.

Data and Control Buses for Expandable Logic Scheme Based on Standard Commodity FPGA IC Chips and/or High Bandwidth Memory (HBM) IC Chips FIG. 32 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with the present application. Referring to FIGS. 27A-27C, 30A, 30B and 32, the standard commodity logic drive 300 may be provided with multiple control buses 416 each constructed from multiple of the programmable interconnects 361 of its inter-chip interconnects 371 or multiple of the non-programmable interconnects 364 of its inter-chip interconnects 371.

For example, in the arrangement as illustrated in FIGS. 27A-27C, for the standard commodity logic drive 300, one of its control buses 416 may couple the IS1 pads 231 of all of its standard commodity FPGA IC chips 200 to each other or one another. Another of its control buses 416 may couple the IS2 pads 231 of all of its standard commodity FPGA IC chips 200 to each other or one another. Another of its control buses 416 may couple the IS3 pads 231 of all of its standard commodity FPGA IC chips 200 to each other or one another. Another of its control buses 416 may couple the IS4 pads 231 of all of its standard commodity FPGA IC chips 200 to each other or one another. Another of its control buses 416 may couple the OS1 pads 232 of all of its standard commodity FPGA IC chips 200 to each other or one another. Another of its control buses 416 may couple the OS2 pads 232 of all of its standard commodity FPGA IC chips 200 to each other or one another. Another of its control buses 416 may couple the OS3 pads 232 of all of its standard commodity FPGA IC chips 200 to each other or one another. Another of its control buses 416 may couple the OS4 pads 232 of all of its standard commodity FPGA IC chips 200 to each other or one another.

Referring to FIGS. 27A-27C, 30A, 30B and 32, the standard commodity logic drive 300 may be provided with multiple chip-enable (CE) lines 417 each constructed from one or more of the programmable interconnects 361 of its inter-chip interconnects 371 or one or more of the non-programmable interconnects 364 of its inter-chip interconnects 371 to couple to the chip-enable (CE) pad 209 of one of its standard commodity FPGA IC chips 200.

Furthermore, referring to FIGS. 27A-27C, 30A, 30B and 32, the standard commodity logic drive 300 may be provided with a set of data buses 315 for use in an expandable interconnection scheme. In this case, for the standard commodity logic drive 300, the set of its data buses 315 may include four data bus subsets or data buses, e.g., 315A, 315B, 315C and 315D, each coupling to or being associated with one of the I/O ports 377, e.g., I/O Port 1, 10 Port 2, I/O Port 3 and I/O Port 4, of each of its standard commodity FPGA IC chips 200 and one of multiple I/O ports of each of its high bandwidth memory (HBM) IC chips 251, that is, the data bus 315A couples to and is associated with one of the I/O ports 377, e.g., I/O Port 1, of each of its standard commodity FPGA IC chips 200 and a first one of the I/O ports of each of its high bandwidth memory (HBM) IC chips 251; the data bus 315B couples to and is associated with one of the I/O ports 377, e.g., I/O Port 2, of each of its standard commodity FPGA IC chips 200 and a second one of the I/O ports of each of its high bandwidth memory (HBM) IC chips 251; the data bus 315C couples to and is associated with one of the I/O ports 377, e.g., I/O Port 3, of each of its standard commodity FPGA IC chips 200 and a third one of the I/O ports of each of its high bandwidth memory (HBM) IC chips 251; and the data bus 315D couples to and is associated with one of the I/O ports 377, e.g., I/O Port 4, of each of its standard commodity FPGA IC chips 200 and a fourth one of the I/O ports of each of its high bandwidth memory (HBM) IC chips 251. Each of the four data buses, e.g., 315A, 315B, 315C and 315D, may provide data transmission with bit width ranging from 4 to 256, such as 64 for a case. In this case, for the standard commodity logic drive 300, each of its four data buses, e.g., 315A, 315B, 315C and 315D, may be composed of multiple data paths, having the number of 64 arranged in parallel, coupling respectively to the I/O pads 372, having the number of 64 arranged in parallel, of one of the I/O ports 377, e.g., I/O Port 1, I/O Port 2, I/O Port 3 and I/O Port 4, of each of its standard commodity FPGA IC chips 200, wherein each of the data paths of said each of its four data buses, e.g., 315A, 315B, 315C and 315D, may be constructed from multiple of the programmable interconnects 361 of its inter-chip interconnects 371 or multiple of the non-programmable interconnects 364 of its inter-chip interconnects 371.

Furthermore, referring to FIGS. 27A-27C, 30A, 30B and 32, for the standard commodity logic drive 300, each of its data buses 315 may pass data for each of its standard commodity FPGA IC chips 200 and each of its high bandwidth memory (HBM) IC chips 251 (only one is shown in FIG. 32). For example, in a fifth clock cycle, for the standard commodity logic drive 300, a first one of its standard commodity FPGA IC chips 200 may be selected in accordance with a logic level at the chip-enable pad 209 of the first one of its standard commodity FPGA IC chips 200 to be enabled to pass data for the input operation of the first one of its standard commodity FPGA IC chips 200, and a second one of its standard commodity FPGA IC chips 200 may be selected in accordance with a logic level at the chip-enable pad 209 of the second one of its standard commodity FPGA IC chips 200 to be enabled to pass data for the output operation of the second one of its standard commodity FPGA IC chips 200. For the first one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads; for the second one of its standard commodity FPGA IC chips 200, the same I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Thereby, in the fifth clock cycle, for the standard commodity logic drive 300, the selected I/O port, e.g., I/O Port 1, of the second one of its standard commodity FPGA IC chips 200 may have the small drivers 374 to drive or pass first data associated with the data output of one of the field programmable logic cells or elements (LCE) 2014 of the second one of its standard commodity FPGA IC chips 200 or the data output of one of the center-processing-unit cores (CPUC) 2010 of the second one of its standard commodity FPGA IC chips 200 as seen in FIG. 27C, for example, to a first one, e.g., 315A, of its data buses 315 and the small receivers 375 of the selected I/O port, e.g., I/O Port 1, of the first one of its standard commodity FPGA IC chips 200 may receive the first data to be passed as a data input of the input data set of one of the field programmable logic cells or elements (LCE) 2014 of the first one of its standard commodity FPGA IC chips 200 or a data input of one of the center-processing-unit cores (CPUC) 2010 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the second one of its standard commodity FPGA IC chips 200 to the small receiver 375 of one of the small I/O circuits 203 of the selected I/O port, e.g., I/O Port 1, of the first one of its standard commodity FPGA IC chips 200.

Furthermore, referring to FIGS. 27A-27C, 30A and 30B and 32, in the fifth clock cycle, for the standard commodity logic drive 300, a third one of its standard commodity FPGA IC chips 200 may be selected in accordance with a logic level at the chip-enable pad 209 of the third one of its standard commodity FPGA IC chips 200 to be enabled to pass data for the input operation of the third one of its standard commodity FPGA IC chips 200. For the third one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the fifth clock cycle, for the standard commodity logic drive 300, the small receivers 375 of the selected I/O port, e.g., I/O Port 1, of the third one of its standard commodity FPGA IC chips 200 may receive the first data to be passed as a data input of the input data set of one of the field programmable logic cells or elements (LCE) 2014 of the third one of its standard commodity FPGA IC chips 200 or a data input of one of the center-processing-unit cores (CPUC) 2010 of the third one of its standard commodity FPGA IC chips 200 as seen in FIG. 27C, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the third one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For all of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Furthermore, referring to FIGS. 27A-27C, 30A, 30B and 32, in the fifth clock cycle, for the first one of the standard commodity FPGA IC chips 200 of the standard commodity logic drive 300, an I/O port, e.g. I/O Port 2, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads; for the second one of its standard commodity FPGA IC chips 200, the same I/O port, e.g. I/O Port 2, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads. Thereby, in the fifth clock cycle, for the standard commodity logic drive 300, the selected I/O port, e.g., I/O Port 2, of the first one of its standard commodity FPGA IC chips 200 may have the small drivers 374 to drive or pass additional data associated with the data output of said one of the field programmable logic cells or elements (LCE) 2014 of the first one of its standard commodity FPGA IC chips 200 or the data output of said one of the center-processing-unit cores (CPUC) 2010 of the first one of its standard commodity FPGA IC chips 200, for example, to a second one, e.g., 315B, of its data buses 315 and the small receivers 375 of the selected I/O port, e.g., I/O Port 2, of the second one of its standard commodity FPGA IC chips 200 may receive the additional data to be passed as a data input of the input data set of said one of the field programmable logic cells or elements (LCE) 2014 of the second one of its standard commodity FPGA IC chips 200 or a data input of said one of the center-processing-unit cores (CPUC) 2010 of the second one of its standard commodity FPGA IC chips 200, for example, from the second one, e.g., 315B, of its data buses 315. The second one, e.g., 315B, of its data buses 315 may have the data paths each coupling the small driver 374 of one of the small I/O circuits 203 of the selected I/O port, e.g., I/O Port 2, of the first one of its standard commodity FPGA IC chips 200 to the small receiver 375 of one of the small I/O circuits 203 of the selected I/O port, e.g., I/O Port 2, of the second one of its standard commodity FPGA IC chips 200. For example, said one of the field programmable logic cells or elements (LCE) 2014 of the first one of its standard commodity FPGA IC chips 200 may be programmed to perform logic operation for multiplication.

Further, referring to FIGS. 27A-27C, 30A, 30B and 32, in a sixth clock cycle, for the standard commodity logic drive 300, the first one of its standard commodity FPGA IC chips 200 may be selected in accordance with the logic level at the chip-enable pad 209 of the first one of its standard commodity FPGA IC chips 200 to be enabled to pass data for the input operation of the first one of its standard commodity FPGA IC chips 200. For the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Further, in the sixth clock cycle, for the standard commodity logic drive 300, a first one of its high bandwidth memory (HBM) IC chips 251 may be selected to be enabled to pass data for an output operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, in the sixth clock cycle, for the standard commodity logic drive 300, the selected I/O port, e.g., first I/O Port, of the first one of its high bandwidth memory (HBM) IC chips 251 may have the small drivers 374 to drive or pass second data to the first one, e.g., 315A, of its data buses 315 and the small receivers 375 of the selected I/O port, e.g., I/O Port 1, of the first one of its standard commodity FPGA IC chips 200 may receive the second data to be passed as a data input of the input data set of said one of the field programmable logic cells or elements (LCE) 2014 of the first one of its standard commodity FPGA IC chips 200 or a data input of said one of the center-processing-unit cores (CPUC) 2010 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the first one of its high bandwidth memory (HBM) IC chips 251 to the small receiver 375 of one of the small I/O circuits 203 of the selected I/O port, e.g., I/O Port 1, of the first one of its standard commodity FPGA IC chips 200.

Furthermore, referring to FIGS. 27A-27C, 30A, 30B and 32, in the sixth clock cycle, for the standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the third one of its standard commodity FPGA IC chips 200. For the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the sixth clock cycle, for the standard commodity logic drive 300, the small receivers 375 of the selected I/O port, e.g., I/O Port 1, of the second one of its standard commodity FPGA IC chips 200 may receive the second data to be passed as a data input of the input data set of said one of the field programmable logic cells or elements (LCE) 2014 of the second one of its standard commodity FPGA IC chips 200 or a data input of said one of the center-processing-unit cores (CPUC) 2010 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of the data buses 315 of the standard commodity logic drive 300 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Further, referring to FIGS. 27A-27C, 30A, 30B and 32, in a seventh clock cycle, for the standard commodity logic drive 300, the first one of its standard commodity FPGA IC chips 200 may be selected in accordance with a logic level at the chip-enable pad 209 of the first one of its standard commodity FPGA IC chips 200 to be enabled to pass data for the output operation of the first one of its standard commodity FPGA IC chips 200. For the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Further, in the seventh clock cycle, for the standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Thereby, in the seventh clock cycle, for the standard commodity logic drive 300, the selected I/O port, e.g., first I/O Port, of the first one of its high bandwidth memory (HBM) IC chips 251 may have the small receivers 375 to receive third data from the first one, e.g., 315A, of its data buses 315 and the small drivers 374 of the selected I/O port, e.g., I/O Port 1, of the first one of its standard commodity FPGA IC chips 200 may drive or pass the third data associated with the data output of said one of the field programmable logic cells or elements (LCE) 2014 of the first one of its standard commodity FPGA IC chips 200 or the data output of said one of the center-processing-unit cores (CPUC) 2010 of the first one of its standard commodity FPGA IC chips 200, for example, to the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the first one of its standard commodity FPGA IC chips 200 to the small receiver 375 of one of the small I/O circuits 203 of the selected I/O port, e.g., first I/O port, of the first one of its high bandwidth memory (HBM) IC chips 251.

Furthermore, referring to FIGS. 27A-27C, 30A, 30B and 32, in the seventh clock cycle, for the standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the second one of its standard commodity FPGA IC chips 200. For the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the seventh clock cycle, for the standard commodity logic drive 300, the small receivers 375 of the selected I/O port, e.g., I/O Port 1, of the second one of its standard commodity FPGA IC chips 200 may receive the third data to be passed as a data input of the input data set of said one of the field programmable logic cells or elements (LCE) 2014 of the second one of its standard commodity FPGA IC chips 200 or a data input of said one of the center-processing-unit cores (CPUC) 2010 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Further, referring to FIGS. 27A-27C, 30A, 30B and 32, in an eighth clock cycle, for the standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Further, in the eighth clock cycle, for the standard commodity logic drive 300, a second one of its high bandwidth memory (HBM) IC chips 251 may be selected to be enabled to pass data for an output operation of the second one of its high bandwidth memory (HBM) IC chips 251. For the second one of the high bandwidth memory (HBM) IC chips 251 of the standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, in the eighth clock cycle, for the standard commodity logic drive 300, the selected I/O port, e.g., first I/O Port, of the first one of its high bandwidth memory (HBM) IC chips 251 may have the small receivers 375 to receive fourth data from the first one, e.g., 315A, of its data buses 315 and the selected I/O port, e.g., first I/O Port, of the second one of its high bandwidth memory (HBM) IC chips 251 may have the small drivers 374 to drive of pass the fourth data to the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the second one of its high bandwidth memory (HBM) IC chips 251 to the small receiver 375 of one of the small I/O circuits 203 of the selected I/O port, e.g., first I/O port, of the first one of its high bandwidth memory (HBM) IC chips 251. For all of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Architecture of Operation in Standard Commodity FPGA IC Chip

Figure 33A:
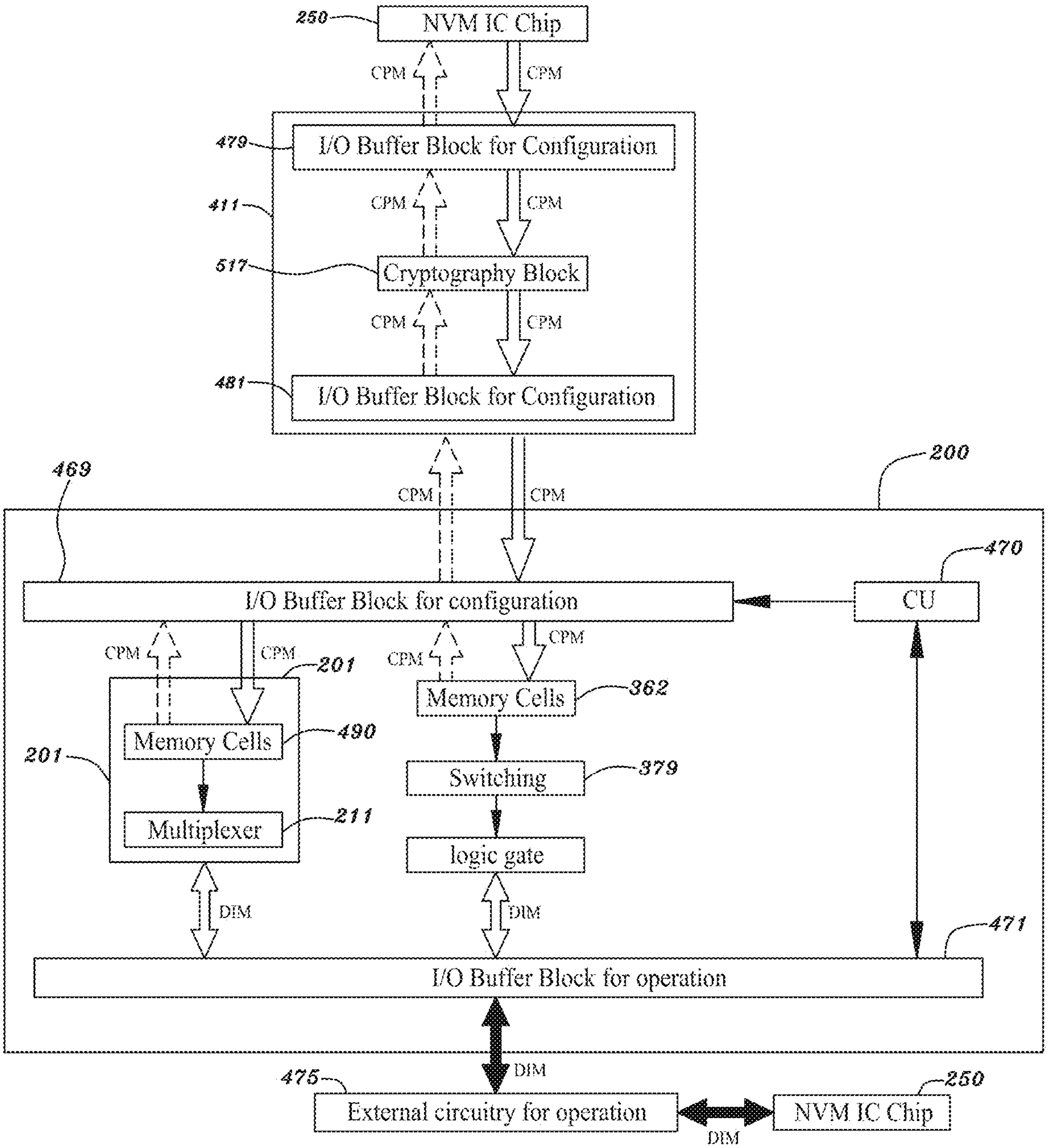
FIG. 33A-33C are various block diagrams showing various architectures of programming and operation for a standard commodity FPGA IC chip in accordance with an embodiment of the present application.
Figure 33B:
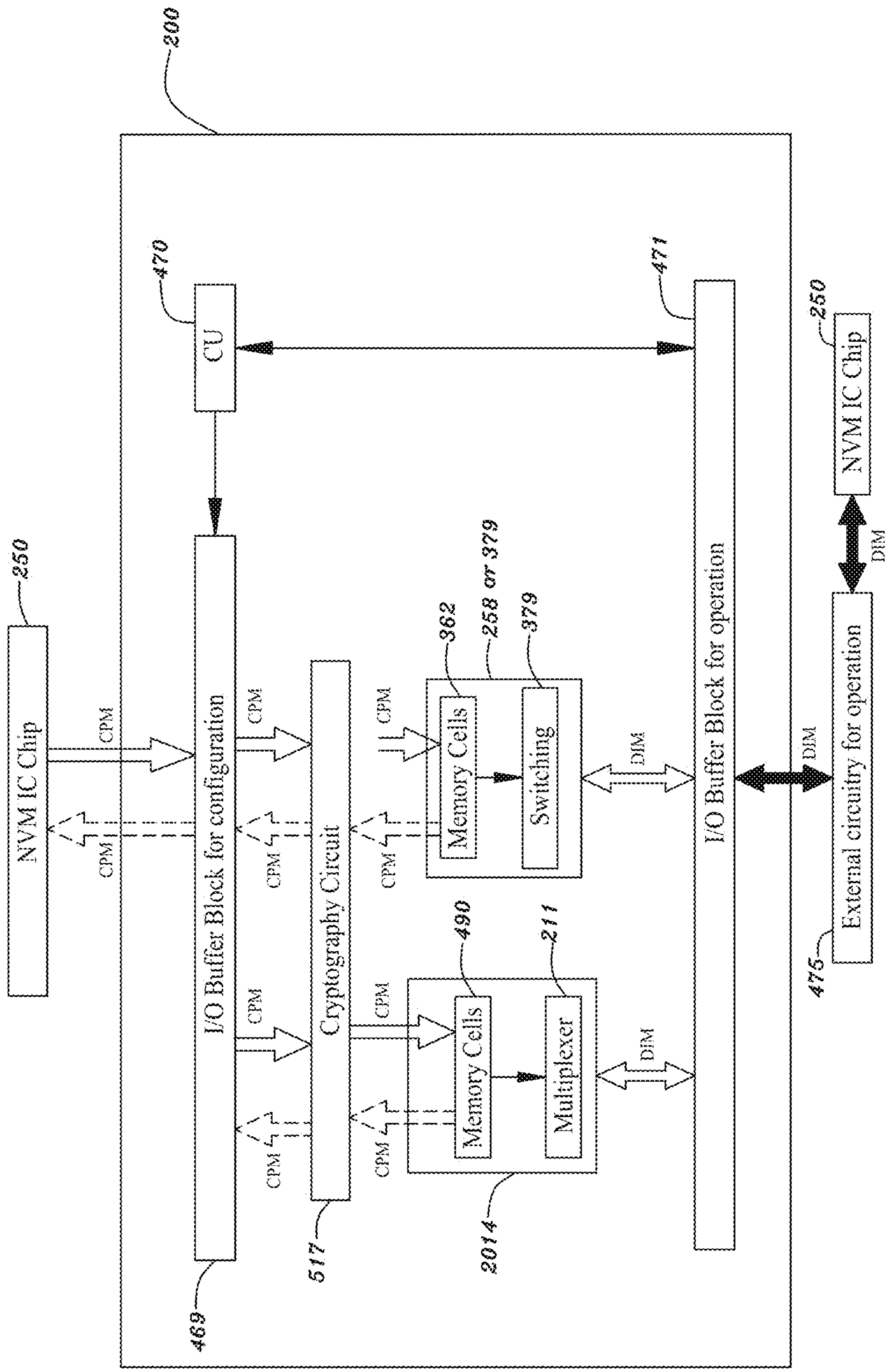
Figure 33C:
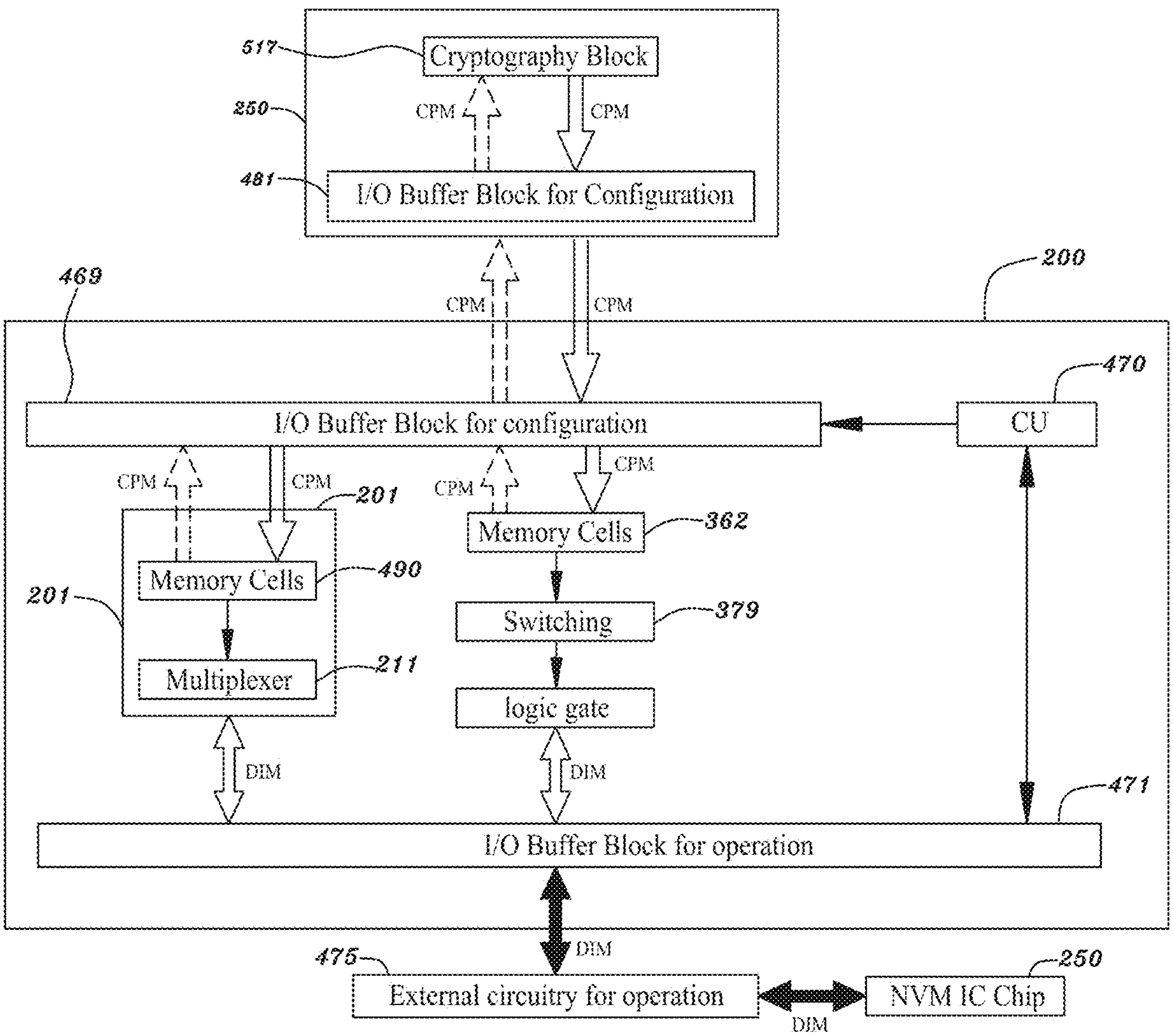

FIG. 33A-33C are various block diagrams showing various architectures of programming and operation for a standard commodity FPGA IC chip in accordance with an embodiment of the present application. Referring to FIG. 33A-33C, one of the non-volatile memory (NVM) IC chips 250 in the standard commodity logic drive 300 as illustrated in FIG. 30A or 30B may include three non-volatile memory blocks each composed of multiple non-volatile memory cells arranged in an array. For the standard commodity logic drive 300, the non-volatile memory cells, i.e., configuration programming memory (CPM) cells, of a first one of the three non-volatile memory blocks of said one of its non-volatile memory (NVM) IC chips 250 are configured to save or store encrypted CPM data for original resulting values or programming codes of the look-up tables (LUT) 210 as seen in FIGS. 19 and 20A-20L and for original programming codes for the field programmable switch cells 258 or 379 as seen in FIGS. 15A-15C, 16A, 16B and 21; the non-volatile memory cells, i.e., configuration programming memory (CPM) cells, of a second one of the three non-volatile memory blocks of said one of its non-volatile memory (NVM) IC chips 250 are configured to save or store encrypted CPM data for immediately-previously self-configured resulting values or programming codes of the look-up tables (LUT) 210 as seen in FIGS. 19 and 20A-20L and for immediately-previously self-configured programming codes for the field programmable switch cells 258 or 379 as seen in FIGS. 15A-15C, 16A, 16B and 21; the non-volatile memory cells, i.e., configuration programming memory (CPM) cells, of a third one of the three non-volatile memory blocks of said one of its non-volatile memory (NVM) IC chips 250 are configured to save or store encrypted CPM data for currently self-configured resulting values or programming codes of the look-up tables (LUT) 210 as seen in FIGS. 19 and 20A-20L and for currently self-configured programming codes for the field programmable switch cells 258 or 379 as seen in FIGS. 15A-15C, 16A, 16B and 21.

Referring to FIG. 33A for explanation for the first aspect as mentioned in FIG. 30, for said one of its non-volatile memory (NVM) IC chips 250 of the standard commodity logic drive 300 as seen in FIG. 30, the encrypted CPM data for one of original, immediately-previously self-configured or currently self-configured resulting values or programming codes of the look-up tables (LUT) 210 and original, immediately-previously self-configured or currently self-configured programming codes for the field programmable switch cells 258 or 379 stored in one of its three non-volatile memory blocks may be passed from the large driver 274 of one of its large I/O circuits 341 to the large receiver 275 of one of the large I/O circuits 341 in an I/O buffering block 479 of one of the cooperating and supporting (CS) integrated-circuit (IC) chips 411 of the standard commodity logic drive 300. For said one of the CS IC chips 411, the data output L_Data_in of the large receiver 275 of said one of the large I/O circuits 341 in its I/O buffering block 479, associated with the encrypted CPM data for said one of original, immediately-previously self-configured or currently self-configured resulting values or programming codes of the look-up tables (LUT) 210 and original, immediately-previously self-configured or currently self-configured programming codes for the field programmable switch cells 258 or 379 may be decrypted by its cryptography block 517 as decrypted CPM data for said one of original, immediately-previously self-configured or currently self-configured resulting values or programming codes of the look-up tables (LUT) 210 and original, immediately-previously self-configured or currently self-configured programming codes for the field programmable switch cells 258 or 379. The decrypted data for said one of original, immediately-previously self-configured or currently self-configured resulting values or programming codes of the look-up tables (LUT) 210 and original, immediately-previously self-configured or currently self-configured programming codes for the field programmable switch cells 258 or 379 may be passed from the small driver 374 of one of its small I/O circuits 203 in its I/O buffering block 481 to the small receiver 375 of one of the small I/O circuits 203 in an I/O buffering block 469 of one of the FPGA IC chips 200 of the standard commodity logic drive 300. Thereby, for said one of the standard commodity FPGA IC chips 200, one of the first type of memory cells 490 of one of its field programmable logic cells or elements (LCE) 2014 as seen in FIG. 19 or one of the first type of memory cells 362 of one of its field programmable switch cells 258 or 379 as seen in FIGS. 15A-15C, 16A, 16B and 21 may be programmed or configured in accordance with the decrypted CPM data.

Referring to FIG. 33B for explanation for the third aspect as mentioned in FIG. 30, for said one of its non-volatile memory (NVM) IC chips 250 of the standard commodity logic drive 300 as seen in FIG. 30, the encrypted CPM data for one of original, immediately-previously self-configured or currently self-configured resulting values or programming codes of the look-up tables (LUT) 210 and original, immediately-previously self-configured or currently self-configured programming codes for the field programmable switch cells 258 or 379 stored in one of its three non-volatile memory blocks may be passed from the large driver 274 of one of its large I/O circuits 341 to the large receiver 275 of one of the large I/O circuits 341 in an I/O buffering block 469 of one of the FPGA IC chips 200 of the standard commodity logic drive 300. For said one of the FPGA IC chips 200, the data output L_Data_in of the large receiver 275 of said one of the large I/O circuits 341 in its I/O buffering block 469, associated with the encrypted CPM data for said one of original, immediately-previously self-configured or currently self-configured resulting values or programming codes of the look-up tables (LUT) 210 and original, immediately-previously self-configured or currently self-configured programming codes for the field programmable switch cells 258 or 379 may be decrypted by its cryptography block 517 as decrypted CPM data for said one of original, immediately-previously self-configured or currently self-configured resulting values or programming codes of the look-up tables (LUT) 210 and original, immediately-previously self-configured or currently self-configured programming codes for the field programmable switch cells 258 or 379. Thereby, one of the first type of memory cells 490 of one of its field programmable logic cells or elements (LCE) 2014 as seen in FIG. 19 or one of the first type of memory cells 362 of one of its field programmable switch cells 258 or 379 as seen in FIGS. 15A-15C, 16A, 16B and 21 may be programmed or configured in accordance with the decrypted CPM data.

Referring to FIG. 33C for explanation for the fifth aspect as mentioned in FIG. 30, for said one of its non-volatile memory (NVM) IC chips 250 of the standard commodity logic drive 300 as seen in FIG. 30, the encrypted CPM data for one of original, immediately-previously self-configured or currently self-configured resulting values or programming codes of the look-up tables (LUT) 210 and original, immediately-previously self-configured or currently self-configured programming codes for the field programmable switch cells 258 or 379 stored in one of its three non-volatile memory blocks may be decrypted by its cryptography block 517 as decrypted CPM data for said one of original, immediately-previously self-configured or currently self-configured resulting values or programming codes of the look-up tables (LUT) 210 and original, immediately-previously self-configured or currently self-configured programming codes for the field programmable switch cells 258 or 379. The large driver 274 of one of the large I/O circuits 341 in its I/O buffering block 482 may have the data input L_data_out, associated with the decrypted CPM data, to the large receiver 275 of one of the large I/O circuits 341 in an I/O buffering block 469 of one of the FPGA IC chips 200 of the standard commodity logic drive 300. Thereby, for said one of the FPGA IC chips 200, one of the first type of memory cells 490 of one of its field programmable logic cells or elements (LCE) 2014 as seen in FIG. 19 or one of the first type of memory cells 362 of one of its field programmable switch cells 258 or 379 as seen in FIGS. 15A-15C, 16A, 16B and 21 may be programmed or configured in accordance with the decrypted CPM data.

Referring to FIGS. 33A-33C, for the standard commodity logic drive 300 as illustrated in FIG. 30, multiple data information memory (DIM) cells of circuits 475 external of its standard commodity FPGA IC chips 200, such as SRAM or DRAM cells of one of its HBM IC chips 251, may pass a data information memory (DIM) stream to be passed as the first input data set of the multiplexer 211 of one of the field programmable logic cells or elements (LCE) 2014 of one of its standard commodity FPGA IC chips 200, or multiple data inputs of a set of center-processing-unit cores (CPUC) 2010 of one of its standard commodity FPGA IC chips 200, through one or more of the small I/O circuits 203 of said one of its standard commodity FPGA IC chips 200 as seen in FIG. 18B, which are defined in an I/O buffering block 471 of said one of its standard commodity FPGA IC chips 200. A data information memory (DIM) cell of circuits 475 external of its standard commodity FPGA IC chips 200, such as SRAM or DRAM cell of said one of its HBM IC chips 251, may receive a data information memory (DIM) stream associated with the data output of the multiplexer 211 of said one of the field programmable logic cells or elements (LCE) 2014 of said one of its standard commodity FPGA IC chips 200, or multiple data outputs of the set of center-processing-unit cores (CPUC) 2010 of said one of its standard commodity FPGA IC chips 200, through one or more of the small I/O circuits 203 of said one of its standard commodity FPGA IC chips 200 as seen in FIG. 18B. One of the field programmable switch cells 379 of said one of its standard commodity FPGA IC chips 200 may pass a data information memory (DIM) stream for a data input of a logic gate or logic operation, such as data input of the input data set of one of the field programmable logic cells or elements (LCE) 2014 of said one of its standard commodity FPGA IC chips 200 or a data input of one of the center-processing-unit cores (CPUC) 2010 of said one of its standard commodity FPGA IC chips 200, which is associated with data from a data information memory (DIM) cell of the circuits 475 external of its standard commodity FPGA IC chips 200, such as SRAM or DRAM cell of said one of its HBM IC chips 251, through one or more of the small I/O circuits 203 of said one of its standard commodity FPGA IC chips 200 as seen in FIG. 18B. One of the field programmable switch cells 379 of said one of its standard commodity FPGA IC chips 200 may pass a data information memory (DIM) stream for a data output of a logic gate or logic operation, such as data output of one of the field programmable logic cells or elements (LCE) 2014 of said one of its standard commodity FPGA IC chips 200 or a data output of one of the center-processing-unit cores (CPUC) 2010 of said one of its standard commodity FPGA IC chips 200, which is associated with data to a data information memory (DIM) cell of the circuits 475 external of its standard commodity FPGA IC chips 200, such as SRAM or DRAM cell of said one of its HBM IC chips 251, through one or more of the small I/O circuits 203 of said one of its standard commodity FPGA IC chips 200 as seen in FIG. 18B.

Referring to FIGS. 33A-33C, for the standard commodity logic drive 300 as illustrated in FIG. 30, the data for the data information memory (DIM) stream saved or stored in the SRAM or DRAM cells, i.e., data information memory (DIM) cells, of one of its HBM IC chips 251 may be backed up or stored in one of its NVM IC chips 250 or circuits outside the standard commodity logic drive 300. Thereby, when the standard commodity logic drive 300 is powered off, the data for the data information memory (DIM) stream stored in said one of the NVM IC chips 250 of the standard commodity logic drive 300 may be kept.

For reconfiguration for artificial intelligence (A1), machine learning or deep learning, for each of the standard commodity FPGA IC chips 200 of the standard commodity logic drive 300 as illustrated in FIG. 30, the current logic operation, such as AND logic operation, of one of its field programmable logic cells or elements (LCE) 2014 may be self-reconfigured to another logic operation, such as NAND logic operation, by reconfiguring the resulting values or programming codes, i.e., configuration programming memory (CPM) data, in the memory cells 490 of said one of its field programmable logic cells or elements (LCE) 2014. The current switching state of one of its field programmable switch cells 379 may be self-reconfigured to another switching state by reconfiguring the programming codes, i.e., configuration programming memory (CPM) data, in the memory cells 362 for said one of its field programmable switch cells 379.

For the first aspect as mentioned in FIG. 30, for said each of the standard commodity FPGA IC chips 200 as seen in FIG. 33A, the small drivers 374 of the small I/O circuits 203 in its I/O buffering block 469 may have the data inputs S_Data_out, associated with the currently self-reconfigured resulting values or programming codes, i.e., configuration programming memory (CPM) data, in the memory cells 490 of said one of its field programmable logic cells or elements (LC or LCEs) 2014 and in the memory cells 362 for said one of its field programmable switch cells 379, to passed to the small receivers 375 of the small I/O circuits 203 in the I/O buffering block 481 of one of the cooperating and supporting (CS) integrated-circuit (IC) chips 411 of the standard commodity logic drive 300 as illustrated in FIG. 30. For said one of the CS IC chips 411, the currently self-reconfigured resulting values or programming codes may be encrypted by its cryptography circuits 517 as encrypted CPM data for currently self-reconfigured resulting values or programming codes. The large drivers 274 of the large I/O circuits 341 in its I/O buffering block 479 may have the data inputs L_Data_out, associated with the encrypted CPM data for currently self-reconfigured resulting values or programming codes, to be passed to the large receivers 275 of the large I/O circuits 341 of one of the NVM IC chips 250 of the standard commodity logic drive 300 as illustrated in FIG. 30A or 30B to be stored in the non-volatile memory cells, i.e., configuration programming memory (CPM) cells, of the third one of the three non-volatile memory blocks of said one of the non-volatile memory (NVM) IC chips 250.

For the third aspect as mentioned in FIG. 30, for said each of the standard commodity FPGA IC chips 200 as seen in FIG. 33B, the currently self-reconfigured resulting values or programming codes, i.e., configuration programming memory (CPM) data, in the memory cells 490 of said one of its field programmable logic cells or elements (LCE) 2014 and in the memory cells 362 for said one of its field programmable switch cells 379 may be encrypted by its cryptography circuits 517 as encrypted CPM data for currently self-reconfigured resulting values or programming codes. The large drivers 274 of the large I/O circuits 341 in its I/O buffering block 469 may have the data inputs L_Data_out, associated with the encrypted CPM data, to be passed to the large receivers 275 of the large I/O circuits 341 of one of the NVM IC chips 250 of the standard commodity logic drive 300 as illustrated in FIG. 30A or 30B to be stored in the non-volatile memory cells, i.e., configuration programming memory (CPM) cells, of the third one of the three non-volatile memory blocks of said one of the non-volatile memory (NVM) IC chips 250.

For the fifth aspect as mentioned in FIG. 30A or 30B, for said each of the standard commodity FPGA IC chips 200 as seen in FIG. 33C, the large drivers 274 of the large I/O circuits 341 in its I/O buffering block 469 may have the data inputs L_Data_out, associated with the currently self-reconfigured resulting values or programming codes, i.e., configuration programming memory (CPM) data, in the memory cells 490 of said one of its field programmable logic cells or elements (LCE) 2014 and in the memory cells 362 for said one of its field programmable switch cells 379, to passed to the large receivers 275 of the large I/O circuits 341 in an I/O buffering block 482 of one of the NVM IC chips 250 of the standard commodity logic drive 300 as illustrated in FIG. 30. For said one of the NVM IC chips 250, the currently self-reconfigured resulting values or programming codes may be encrypted by its cryptography circuits 517 as encrypted CPM data for currently self-reconfigured resulting values or programming codes to be stored in the non-volatile memory cells, i.e., configuration programming memory (CPM) cells, of the third one of its three non-volatile memory blocks.

Accordingly, referring to FIGS. 33A-33C, for the standard commodity logic drive 300, when it is powered on, the encrypted data for currently self-configured configuration programming memory (CPM) data stored or saved in the non-volatile memory cells in the third one of the three non-volatile memory blocks of one of its non-volatile memory (NVM) IC chips 250 may be decrypted to be reloaded to the memory cells 490 and 362 of its standard commodity FPGA IC chips 200. During operation, its standard commodity FPGA IC chips 200 may be reset and the encrypted data for original or immediately-previously self-configured configuration programming memory (CPM) data stored or saved in the non-volatile memory cells in the first or second one of the three non-volatile memory blocks of said one of its non-volatile memory (NVM) IC chips 250 may be decrypted to be reloaded to the memory cells 490 and 362 of its standard commodity FPGA IC chips 200.

Development for Standard Commodity Logic Drives

In a first business model, a hardware company may purchase the standard commodity logic drive 300 as seen in FIG. 30A or 30B without performing application-specific-integrated-circuits (ASIC) or (customer-owned-tooling) integrated-circuits design and/or production, develop the configuration-programming-memory (CPM) data for configuring the standard commodity FPGA IC chips 200 in the standard commodity logic drive 300 and install the configuration-programming-memory (CPM) data in the standard commodity logic drive 300 to be sold as a hardware to a customer or user. For the standard commodity logic drive 300, when the software or firmware for configuring its standard commodity FPGA IC chips 200 is being developed, the first type of cryptography block 510 as seen in FIG. 22A or 22B may be set in the original state as illustrated in FIG. 22C, the second type of cryptography block 512 as seen in FIG. 23A may be set in the original state as illustrated in FIG. 23B, the third type of cryptography block 530 as seen in FIG. 24 may be set in the original state, the first or second combined cryptography block 515 or 516 as seen in FIG. 26A or 26B either may be provided with the first type of cryptography block 510 as seen in FIG. 22A or 22B set in the original state as illustrated in FIG. 22C and the second type of cryptography block 512 as seen in FIG. 23A set in the original state as illustrated in FIG. 23B, or the third combined cryptography block 518 as seen in FIG. 26C may be provided with the second type of cryptography block 512 as seen in FIG. 23A set in the original state as illustrated in FIG. 23B and the third type of cryptography block 530 as seen in FIG. 24 set in the original state. When the development for the software or firmware is finished and before the hardware is sold to the customer or user, the first type of cryptography block 510 as seen in FIG. 22A or 22B may be set in the encryption/decryption state as illustrated in FIG. 22D in accordance with the first password, the second type of cryptography block 512 as seen in FIG. 23A may be set in the encryption/decryption state as illustrated in FIG. 23C in accordance with the second password, the third type of cryptography block 530 as seen in FIG. 24 may be set in the encryption/decryption state in accordance with the third password, the first or second combined cryptography block 515 or 516 as seen in FIG. 26A or 26B either may be provided with the first type of cryptography block 510 as seen in FIG. 22A or 22B set in the encryption/decryption state as illustrated in FIG. 22D in accordance with the first password and the second type of cryptography block 512 as seen in FIG. 23A set in the encryption/decryption state as illustrated in FIG. 23C in accordance with the second password, or the third combined cryptography block 530 as seen in FIG. 26C may be provided with the second type of cryptography block 512 as seen in FIG. 23A set in the encryption/decryption state as illustrated in FIG. 23C in accordance with the second password and the third type of cryptography block 530 as seen in FIG. 24 set in the encryption/decryption state in accordance with the third password. For each of the standard commodity FPGA IC chips 200 of the standard commodity logic drive 300, only if the first, second and/or third password are correctly loaded to the first, second or third type of cryptography block 510, 512 or 530 or to the first, second or third combined cryptography block 515, 516 or 518, its field programmable logic cells 2014 as illustrated in FIGS. 19 and 20A-20L and field programmable switch cells 258 or 379 as illustrated in FIGS. 15A-15C, 16A, 16B and 21 may be correctly configured by the configuration-programming-memory (CPM) data to provide correct function. Since the first, second and/or third password(s) are/is stored in a non-volatile fashion in the first, second or third type of cryptography block 510, 512 or 530 or in the first, second or third combined cryptography block 515, 516 or 530, the configuration-programming-memory (CPM) data may be securely protected.

In a second business model, a software company may develop the configuration-programming-memory (CPM) data for configuring the standard commodity FPGA IC chips 200 in the standard commodity logic drive 300 as seen in FIG. 30A or 30B for an innovation or application to be sold as a software or firmware to a customer or user, and the customer or user may purchase the software or firmware to be installed in the standard commodity logic drive 300 as seen in FIG. 30. The customer or user may configure each of the standard commodity FPGA IC chips 200 of the standard commodity logic drive 300 through network installation by, for example, downloading a file or executable program comprising (1) a user-specific password, i.e., the first password for the first type of cryptography block 510, the second password for the second type of cryptography block 512 and/or the third password for the third type of cryptography block 530, to be installed in the first, second and/or third type(s) of cryptography block 510, 512 and/or 530 and (2) the configuration-programming-memory (CPM) data encrypted in accordance with the user-specific password to be installed in the non-volatile memory (NVM) IC chips 250 of the standard commodity logic drive 300 as seen in FIG. 30. The file or executable program may be a temporary file temporarily stored in the non-volatile memory (NVM) IC chips 250 of the standard commodity logic drive 300 in a computer or mobile phone, for example, and maybe deleted after the above installations for the user-specific password and configuration-programming-memory (CPM) data.

Specification for Semiconductor Chip

1. First Type of Semiconductor Chip

Figure 34A:
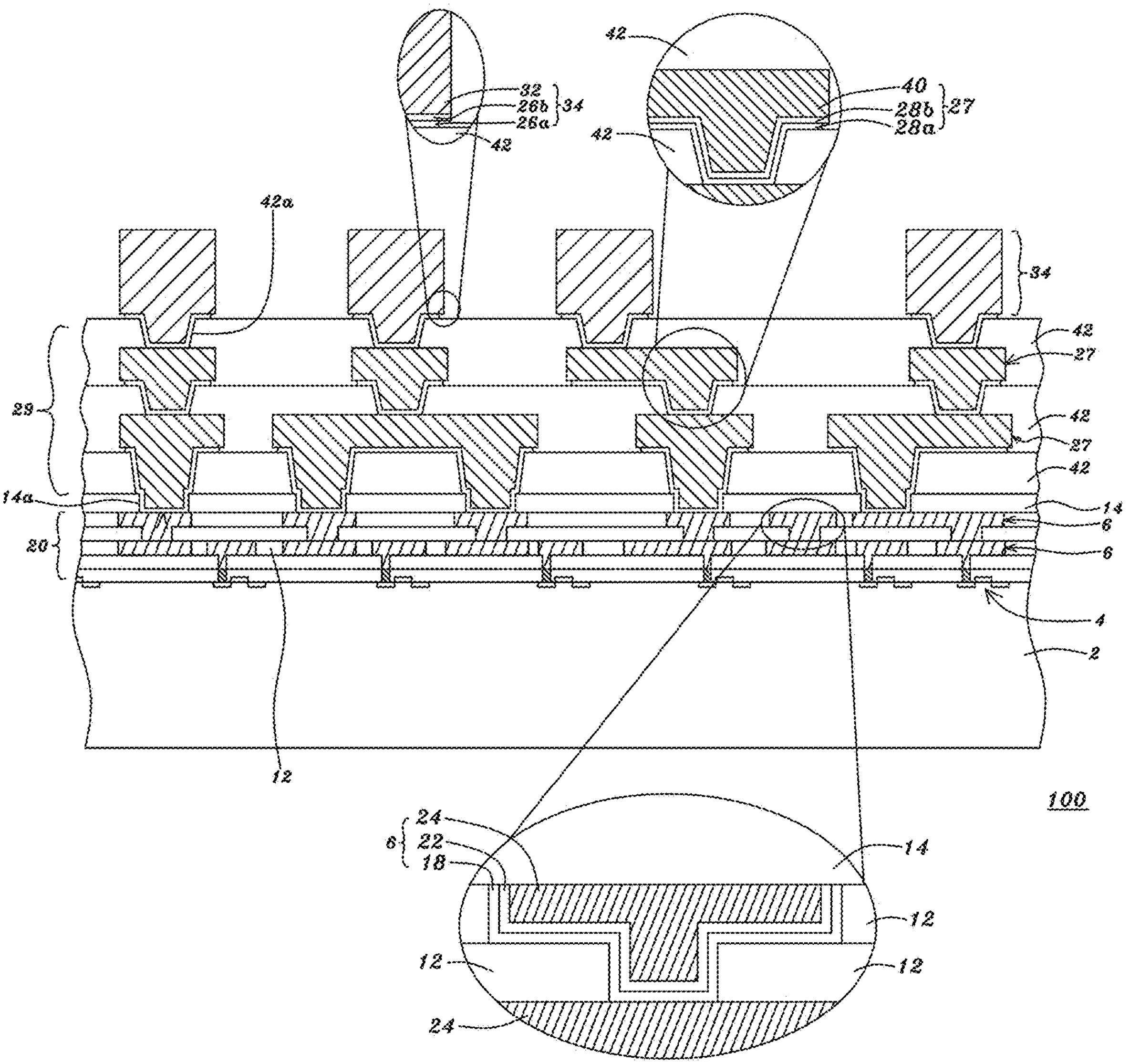
FIGS. 34A-34D are schematically cross-sectional views showing first through fourth types of semiconductor chips respectively in accordance with an embodiment of the present application.

FIG. 34A is a schematically cross-sectional view showing a first type of semiconductor chip in accordance with an embodiment of the present application. The first type of semiconductor chip 100 may include (1) a semiconductor substrate 2, such as silicon substrate, GaAs substrate, SiGe substrate or Silicon-On-Insulator (SOI) substrate; (2) multiple semiconductor devices 4 on its semiconductor substrate 2; (3) a first interconnection scheme for a chip (FISC) 20 over its semiconductor substrate 2, provided with one or more interconnection metal layers 6 coupling to its semiconductor devices 4 and one or more insulating dielectric layers 12 each between neighboring two of its interconnection metal layers 6, wherein each of its one or more interconnection metal layers 6 may have a thickness between 0.1 and 2 micrometers; (4) a passivation layer 14 over its first interconnection scheme for a chip (FISC) 20, wherein multiple openings 14*a* in its passivation layer 14 may be aligned with and over multiple metal pads of the topmost one of the interconnection metal layers 6 of its first interconnection scheme for a chip (FISC) 20; (5) a second interconnection scheme for a chip (SISC) 29 optionally provided over its passivation layer 14, provided with one or more interconnection metal layers 27 coupling to the topmost one of the interconnection metal layers 6 of its first interconnection scheme for a chip (FISC) 20 through the openings 14*a* in its passivation layer 14 and one or more polymer layers 42, i.e., insulating dielectric layers, each between neighboring two of its interconnection metal layers 27, under a bottommost one of its interconnection metal layers 27 or over a topmost one of its interconnection metal layers 27, wherein multiple openings 42*a* in the topmost one of its polymer layers 42 may be aligned with and over multiple metal pads of the topmost one of the interconnection metal layers 27 of its second interconnection scheme for a chip (SISC) 29, wherein each of the interconnection metal layers 27 of its second interconnection scheme for a chip (SISC) 29 may have a thicknesses between 3 and 5 micrometers; and (6) multiple micro-bumps or micro-pillars 34 on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20.

Referring to FIG. 34A, for the first type of semiconductor chip 100, its semiconductor devices 4 may include a memory cell, a logic circuit, a passive device, such as resistor, capacitor, inductor or filter, or an active device, such as p-channel and/or n-channel MOS devices. Its semiconductor devices 4 for the standard commodity FPGA IC chip 200 may compose the field programmable logic cells or elements (LCE) 2014 as illustrated in FIGS. 19 and 20A-20L, the field programmable switch cells 258 or 378 as illustrated in FIGS. 15A-15C, 16A, 16B and 21, any of the first through fourth types of cryptography blocks 510, 512, 530 and 535 as illustrated in FIGS. 22A, 22B, 23A, 24 and 25, any of the first through third combined cryptography blocks 515, 516 and 518 as illustrated in FIGS. 26A-26C, and/or any of the large and small I/O circuits 341 and 203 as illustrated in FIGS. 18A and 18B. The semiconductor devices 4 for the DPIIC chip 410 as illustrated in FIGS. 28, 30A and 30B may compose the field programmable switch cells 258 or 378 as illustrated in FIGS. 15A-15C, 16A, 16B and 21 and/or any of the large and small I/O circuits 341 and 203 as illustrated in FIGS. 18A and 18B. The semiconductor devices 4 for the CS IC chip 411 as illustrated in FIGS. 29 30A and 30B may compose any of the first through fourth types of cryptography blocks 510, 512, 530 and 535 as illustrated in FIGS. 22A, 22B, 23A, 24 and 25, any of the first through third combined cryptography blocks 515, 516 and 518 as illustrated in FIGS. 26A-26C, regulating block 415 as illustrated in FIG. 29, IAC block 418 as illustrated in FIG. 29 and/or any of the large and small I/O circuits 341 and 203 as illustrated in FIGS. 18A and 18B.

Referring to FIG. 34A, for the first type of semiconductor chip 100, each of the interconnection metal layers 6 of its first interconnection scheme for a chip (FISC) 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. Each of the interconnection metal layers 6 of its first interconnection scheme for a chip (FISC) 20 may be patterned with a metal line or trace having a thickness between 0.1 and 2 micrometers, between 3 nm and 1,000 nm or between 10 nm and 500 nm, or thinner than or equal to 5 nm, 10 nm, 30 nm, 50 nm, 100 nm, 200 nm, 300 nm, 500 nm or 1,000 nm and a width between 3 nm and 1,000 nm or between 10 nm and 500 nm, or narrower than 5 nm, 10 nm, 20 nm, 30 nm, 70 nm, 100 nm, 300 nm, 500 nm or 1,000 nm, for example. Each of the insulating dielectric layers 12 of its first interconnection scheme for a chip (FISC) 20 may have a thickness between 0.1 and 2 micrometers, between 3 nm and 1,000 nm or between 10 nm and 500 nm, or thinner than 5 nm, 10 nm, 30 nm, 50 nm, 100 nm, 200 nm, 300 nm, 500 nm or 1,000 nm.

Referring to FIG. 34A, for the first type of semiconductor chip 100, its passivation layer 14 containing a silicon-nitride, SiON or SiCN layer hiving a thickness greater than 0.3 μm for example and, alternatively, a polymer layer hiving a thickness between 1 and 10 μm may protect the semiconductor devices 4 and the interconnection metal layers 6 from being damaged by moisture foreign ion contamination, or from water moisture or contamination form external environment, for example sodium mobile ions. Each of the openings 14*a* in its passivation layer 14 may have a transverse dimension, from a top view, of between 0.5 and 20 sm.

Referring to FIG. 34A, for the first type of semiconductor chip 100, each of the interconnection metal layers 27 of its second interconnection scheme for a chip (SISC) 29 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 of its second interconnection scheme for a chip (SISC) 29 may be patterned with a metal line or trace hiving a thickness between, for example, 0.3 μm and 20 μm, 0.5 μm and 10 μm, 1 μm and 5 μm, 1 μm and 10 μm, or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm, or 2 μm and 10 μm, or wider than or equal to 0.3 μm, 0.5 μm, 0.7 μm, 1 μm, 1.5 μm, 2 μm or 3 μm. Each of the polymer layers 42 of its second interconnection scheme for a chip (SISC) 29 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 sm.

Referring to FIG. 34A, for the first type of semiconductor chip 100, each of its micro-bumps or micro-pillars 34 may be of various types. A first type of micro-bumps or micro-pillars 34 may include, as seen in FIG. 34A, (1) an adhesion layer 26*a*, such as titanium (Ti) or titanium nitride (TiN) layer having a thickness of between 1 nm and 50 nm, on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20, (2) a seed layer 26*b*, such as copper, on its adhesion layer 26*a* and (3) a copper layer 32 having a thickness of between 1 μm and 60 μm on its seed layer 26*b*.

Alternatively, a second type of micro-bumps or micro-pillars 34 may include the adhesion layer 26*a*, seed layer 26*b* and copper layer 32 as mentioned above, and may further include a tin-containing solder cap made of tin or a tin-silver alloy, which has a thickness of between 1 μm and 50 μm on its copper layer 32.

Alternatively, a third type of micro-bumps or micro-pillars 34 may be thermal compression bumps, including the adhesion layer 26*a* and seed layer 26*b* as mentioned above, and may further include a copper layer having a thickness of between 2 μm and 20 μm, such as 3 μm, and a largest transverse dimension, such as diameter in a circular shape, between 1 μm and 15 μm, such as 3 μm, on its seed layer 26*b* and a solder cap made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer. The third type of micro-bumps or micro-pillars 34 are formed respectively on multiple metal pads 6*b* provided by a frontmost one of the interconnection metal layers 27 of its second interconnection scheme for a chip (SISC) 29 or by, if the second interconnection scheme for a chip (SISC) 29 is not provided, a frontmost one of the interconnection metal layers 6 of its first interconnection scheme for a chip (FISC) 20, wherein each of the metal pads 6*b* may have a thickness t1 between 1 and 10 micrometers or between 2 and 10 micrometers and a largest transverse dimension w1, such as diameter in a circular shape, between 1 μm and 15 μm, such as 5 sm. A pitch between neighboring two of its third type of micro-bumps or micro-pillars 34 may be between 3 μm and 20 μm.

Alternatively, a fourth type of micro-bumps or micro-pillars 34 may be thermal compression pads, including the adhesion layer 26*a* and seed layer 26*b* as mentioned above, and further including a copper layer having a thickness of between 1 μm and 10 μm or between 2 and 10 micrometers and a largest transverse dimension, such as diameter in a circular shape, between 1 μm and 15 μm, such as 5 μm, on its seed layer 26*b* and a metal cap made of a tin-silver alloy, a tin-gold alloy, a tin-copper alloy, a tin-indium alloy, indium, tin or gold, which has a thickness of between 0.1 μm and 5 μm, such as 1 μm, on its copper layer. Neighboring two of its fourth type of micro-bumps or micro-pillars 34 may have a pitch between 3 μm and 20 sm.

2. Second Type of Semiconductor Chip

Figure 34B:
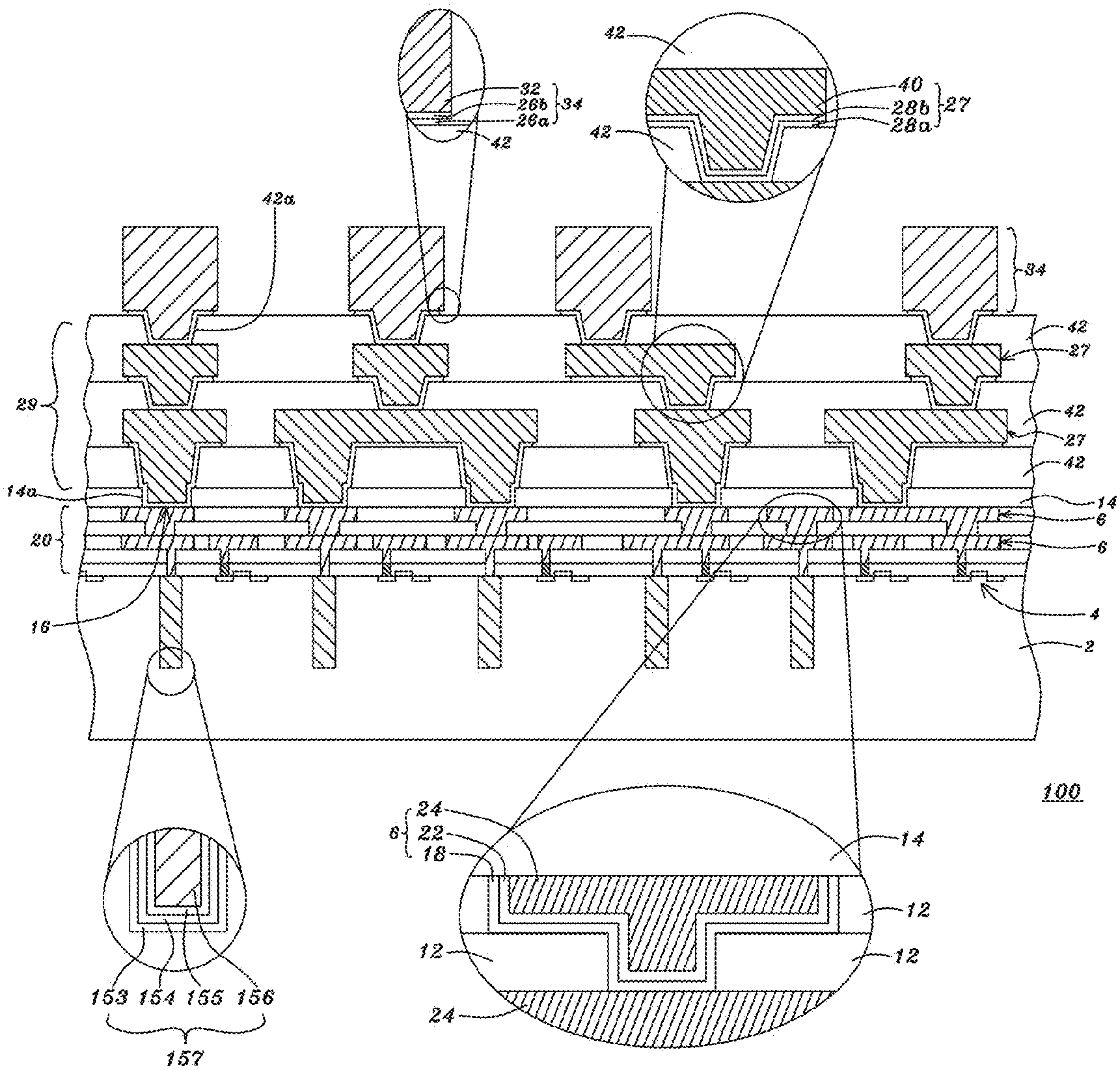

FIG. 34B is a schematically cross-sectional view showing a second type of semiconductor chip in accordance with an embodiment of the present application. Referring to FIG. 34B, the second type of semiconductor chip 100 may have a similar structure as illustrated in FIG. 34A. For an element indicated by the same reference number shown in FIGS. 34A and 34B, the specification of the element as seen in FIG. 34B may be referred to that of the element as illustrated in FIG. 34A. The difference between the first and second types of semiconductor chips 100 is that the second type of semiconductor chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of its through silicon vias (TSVs) 157 may have a depth between 30 μm and 200 μm and a largest transverse dimension, such as diameter or width, between 2 μm and 20 μm or between 4 μm and 10 sm.

Referring to FIG. 34B, each of the through silicon vias (TSV) 157 of the second type of semiconductor chip 100 may include (1) an electroplated copper layer 156 having a depth between 30 μm and 200 μm and a largest transverse dimension, such as diameter or width, between 2 μm and 20 μm or between 4 μm and 10 μm in the semiconductor substrate 2 of the second type of semiconductor chip 100, (2) an insulating lining layer 153, such as thermally grown silicon oxide ($SiO_2$) and/or CVD silicon nitride ($Si_3N_4$) at a bottom and sidewall of its electroplated copper layer 156, (3) an adhesion layer 154, such as titanium (Ti) or titanium nitride (TiN) layer having a thickness between 1 nm to 50 nm, at the bottom and sidewall of its electroplated copper layer 156 and between its electroplated copper layer 156 and its insulating lining layer 153, and (4) an electroplating seed layer 155, such as copper seed layer 155 hiving a thickness between 3 nm and 200 nm, at the bottom and sidewall of its electroplated copper layer 156 and between its electroplated copper layer 156 and its adhesion layer 154.

3. Third Type of Semiconductor Chip

Figure 34C:
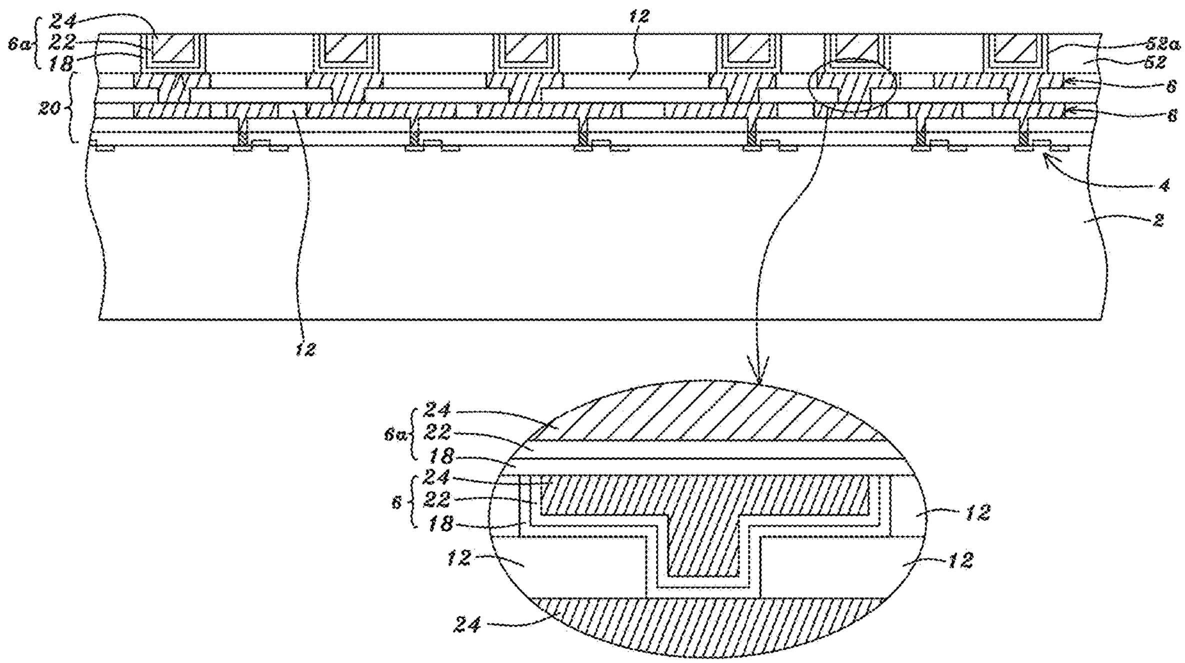

FIG. 34C is a schematically cross-sectional view showing a third type of semiconductor chip in accordance with an embodiment of the present application. Referring to FIG. 34C, the third type of semiconductor chip 100 may have a similar structure as illustrated in FIG. 34A. For an element indicated by the same reference number shown in FIGS. 34A and 34C, the specification of the element as seen in FIG. 34C may be referred to that of the element as illustrated in FIG. 34A. The difference between the first and third types of semiconductor chips 100 is that the third type of semiconductor chip 100 may be provided with (1) an insulating bonding layer 52 at its active side and on the topmost one of the insulating dielectric layers 12 of its first interconnection scheme for a chip (FISC) 20 and (2) multiple metal pads 6*a* at its active side and in multiple openings 52*a* in its insulating bonding layer 52 and on the topmost one of the interconnection metal layers 6 of its first interconnection scheme for a chip (FISC) 20, instead of the second interconnection scheme for a chip (SISC) 29, the passivation layer 14 and micro-bumps or micro-pillars 34 as seen in FIG. 34A. For the third type of semiconductor chip 100, its insulating bonding layer 52 may include a silicon-oxide layer having a thickness between 0.1 and 2 sm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a* and on the topmost one of the interconnection metal layers 6 of its first interconnection scheme for a chip (FISC) 20, and (3) a seed layer 22, such as copper, between the copper layer 24 and adhesion layer 18 of said each of its metal pads 6*a*, wherein the copper layer 24 of said each of its metal pads 6*a* may have a top surface substantially coplanar with a top surface of the silicon-oxide layer of its insulating bonding layer 52.

4. Fourth Type of Semiconductor Chip

Figure 34D:
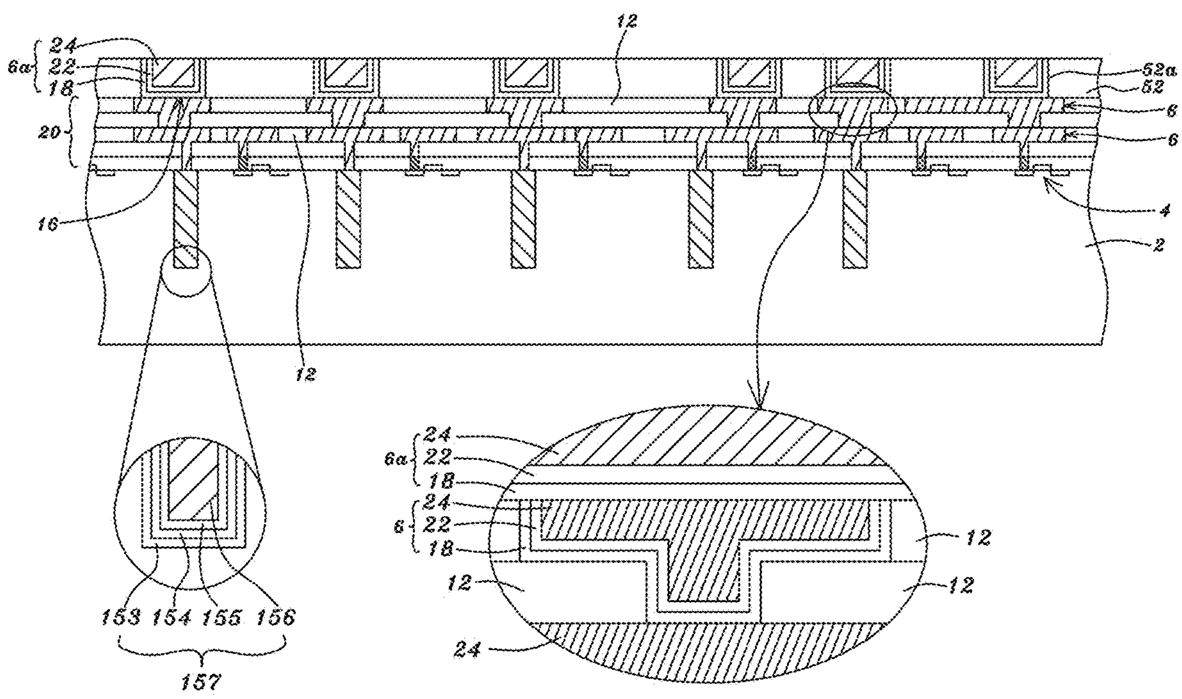

FIG. 34D is a schematically cross-sectional view showing a fourth type of semiconductor chip in accordance with an embodiment of the present application. Referring to FIG. 34D, the fourth type of semiconductor chip 100 may have a similar structure as illustrated in FIG. 34C. For an element indicated by the same reference number shown in FIGS. 34C and 34D, the specification of the element as seen in FIG. 34D may be referred to that of the element as illustrated in FIG. 34C. The difference between the third and fourth types of semiconductor chips 100 is that the fourth type of semiconductor chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of its through silicon vias (TSVs) 157 may have a depth between 30 μm and 200 μm and a largest transverse dimension, such as diameter or width, between 2 μm and 20 μm or between 4 μm and 10 μm. Each of its through silicon vias (TSV) 157 may have the same specification as that of the through silicon vias (TSV) 157 of the second type of semiconductor chip 100 as illustrated in FIG. 34B.

Specification for Vertical-Through-Via (VTV) Connector

Figure 35A:
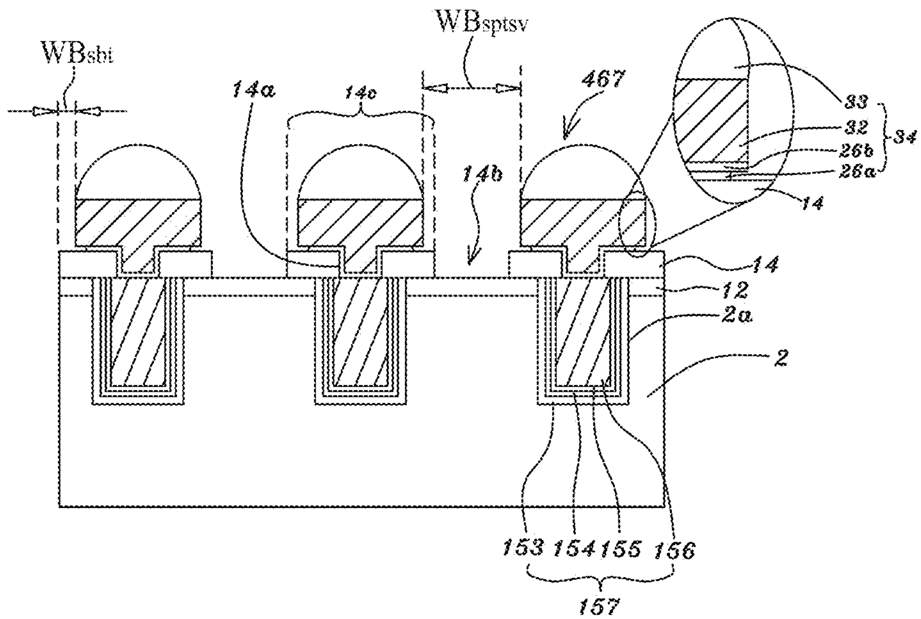
FIGS. 35A and 35B are schematically cross-sectional views showing various types of vertical-through-via connectors in accordance with an embodiment of the present application.
Figure 35B:
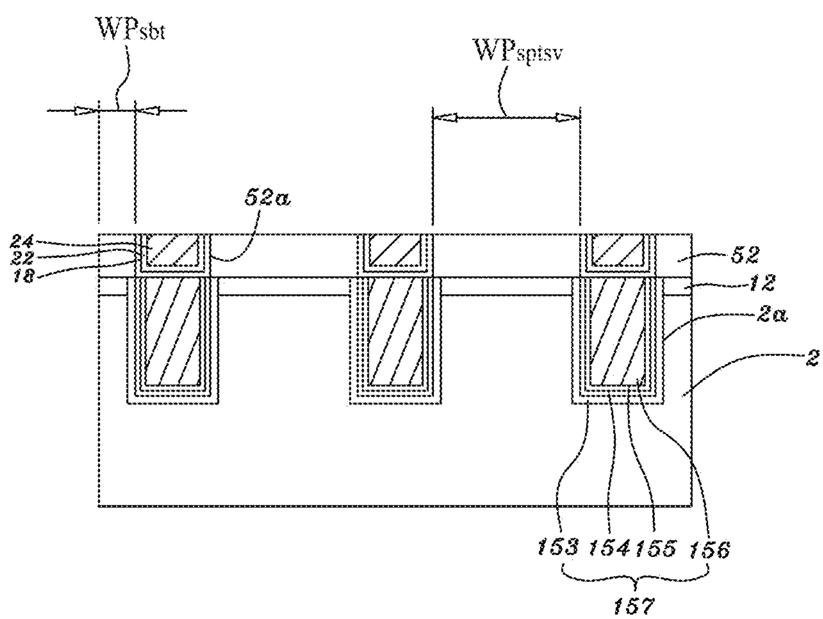

FIGS. 35A and 35B are schematically cross-sectional views showing various types of vertical-through-via connectors in accordance with an embodiment of the present application. Referring to FIGS. 35A and 35B, each of the first and second types of vertical-through-via connectors 467 is provided for vertical connection to transmit signals or deliver a power source or ground reference in a vertical direction.

First Type of Vertical-through-via (VTV) Connector

Referring to FIG. 35A, the first type of vertical-through-via (VTV) connector 467 may include (1) a semiconductor substrate 2, such as silicon substrate, (2) an insulating dielectric layer 12 on the semiconductor substrate 2, wherein the insulating dielectric layer 12 may include a silicon-oxide layer having a thickness between 0.1 and 2 μm, (3) multiple through silicon vias (TSVs) 157 in the semiconductor substrate 2, wherein each of the through silicon vias (TSVs) 157 extends vertically through the insulating dielectric layer 12 and has a top surface substantially coplanar to a top surface of the insulating dielectric layer 12, wherein each of the through silicon vias (TSVs) 157 may have a depth between 30 μm and 200 μm and a largest transverse dimension, such as diameter or width, between 2 μm and 20 μm or between 4 μm and 10 μm, (3) a passivation layer 14 may be formed on the top surface of the insulating dielectric layer 12, (4) a passivation layer 14 on the top surface of the insulating dielectric layer 12, wherein the passivation layer 14 may include a silicon-nitride layer having a thickness of greater than 0.3 micrometers and, optionally, a polymer layer, such as polyimide, having a thickness between 1 and 5 micrometers on the silicon-nitride layer, wherein the electroplated copper layer 156 of each of the through silicon vias (TSVs) 157 may have a contact point at a bottom of one of multiple opening 14*a* in the passivation layer 14, wherein each of the openings 14*a* may have a largest transverse dimension, from a top view, between 0.5 and 20 micrometers or between 20 and 200 micrometers, and (5) multiple micro-bump or micro-pillars 34 each on the contact point of the electroplated copper layer 156 of one of the through silicon vias (TSVs) 157.

Referring to FIG. 35A, for the first type of vertical-through-via (VTV) connector 467, each of its through silicon vias (TSV) 157 may have the same specification as that of the through silicon vias (TSV) 157 of the second type of semiconductor chip 100 as illustrated in FIG. 34B. Each of its micro-bump or micro-pillars 34 may have various types, i.e., first, second, third and fourth types, which may have the same specification as that of the first, second, third and fourth types of micro-bump or micro-pillars 34 respectively as illustrated in FIG. 34A. Multiple trenches 14*b* may be formed in its passivation layer 14 to form multiple insulating-material islands 14*c* between neighboring two of the trenches 14*b*. A pitch between each neighboring two of its first, second, third or fourth type of micro-bumps or micro-pillars 34 may range from 20 to 150 micrometers or from 40 to 100 micrometers; and a space $WB_{sptsv}$ between each neighboring two of its first, second, third or fourth type of micro-bumps or micro-pillars 34 may range from 20 to 150 micrometers or from 40 to 100 micrometers. A distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34 and/or 36; alternatively, the distance $WB_{sbt}$ between its edge and one of its first, second, third or fourth type of micro-bumps or micro-pillars 34 and/or 36 may be smaller than 50, 40 or 30 micrometers.

Second Type of Vertical-Through-Via (VTV) Connector

Referring to FIG. 35B, the second type of vertical-through-via (VTV) connector 467 may have similar structure as the first type of vertical-through-via (VTV) connector 467 as illustrated in FIG. 35A. For an element indicated by the same reference number shown in FIGS. 35A and 35B, the specification of the element as seen in FIG. 35B may be referred to that of the element as illustrated in FIG. 35A. Referring to FIG. 35B, the second type of vertical-through-via (VTV) connector 467 may further include (1) an insulating bonding layer 52 on the insulating dielectric layer 12, wherein the insulating bonding layer 52 may include a silicon-oxide layer having a thickness between 0.1 and 2 micrometers, wherein the electroplated copper layer 156 of each of the through silicon vias (TSVs) 157 may have a contact point at a bottom of one of multiple opening 52*a* in the insulating bonding layer 52, and (2) multiple metal pads 6*a* each in one of the openings 52*a* in the insulating bonding layer 52 and on the contact point of the electroplated copper layer 156 of one of the through silicon vias (TSVs) 157. Each of the metal pads 6*a* may include (1) a copper layer 24 having a thickness of between 3 nm and 500 nm in one of the openings 52*a* in the insulating dielectric layer 52, (2) an adhesion layer 18, such as titanium or titanium nitride having a thickness of between 1 nm and 50 nm, at a bottom and sidewall of the copper layer 24, and (3) a seed layer 22, such as copper, between the copper layer 24 and the adhesion layer 18, wherein the copper layer 24 of said each of the metal pads 6a may have a top surface substantially coplanar with a top surface of the silicon-oxide layer of the insulating bonding layer 52.

Referring to FIG. 35B, for the second type of vertical-through-via (VTV) connector 467, a pitch $WP_p$ between each neighboring two of its metal pads 6a may range from 20 to 150 micrometers or from 40 to 100 micrometers; and a space $WP_{sptsv}$ between each neighboring two of its metal pads 6a may range from 20 to 150 micrometers or from 40 to 100 micrometers. A distance $WP_{sbt}$ between its edge and one of its metal pads 6a may be smaller than the space $WP_{sptsv}$ between neighboring two of its metal pads 6a and optionally its edge may be aligned with an edge of said one of its metal pads 6a; alternatively, the distance $WP_{sbt}$ between its edge and one of its metal pads 6a may be smaller than 50, 40 or 30 micrometers.

Embodiments for Various Chip Package for Standard Commodity Logic Drive

First Type of Chip Package for Fan-Out Interconnection Technology (FOIT)

Figure 36A:
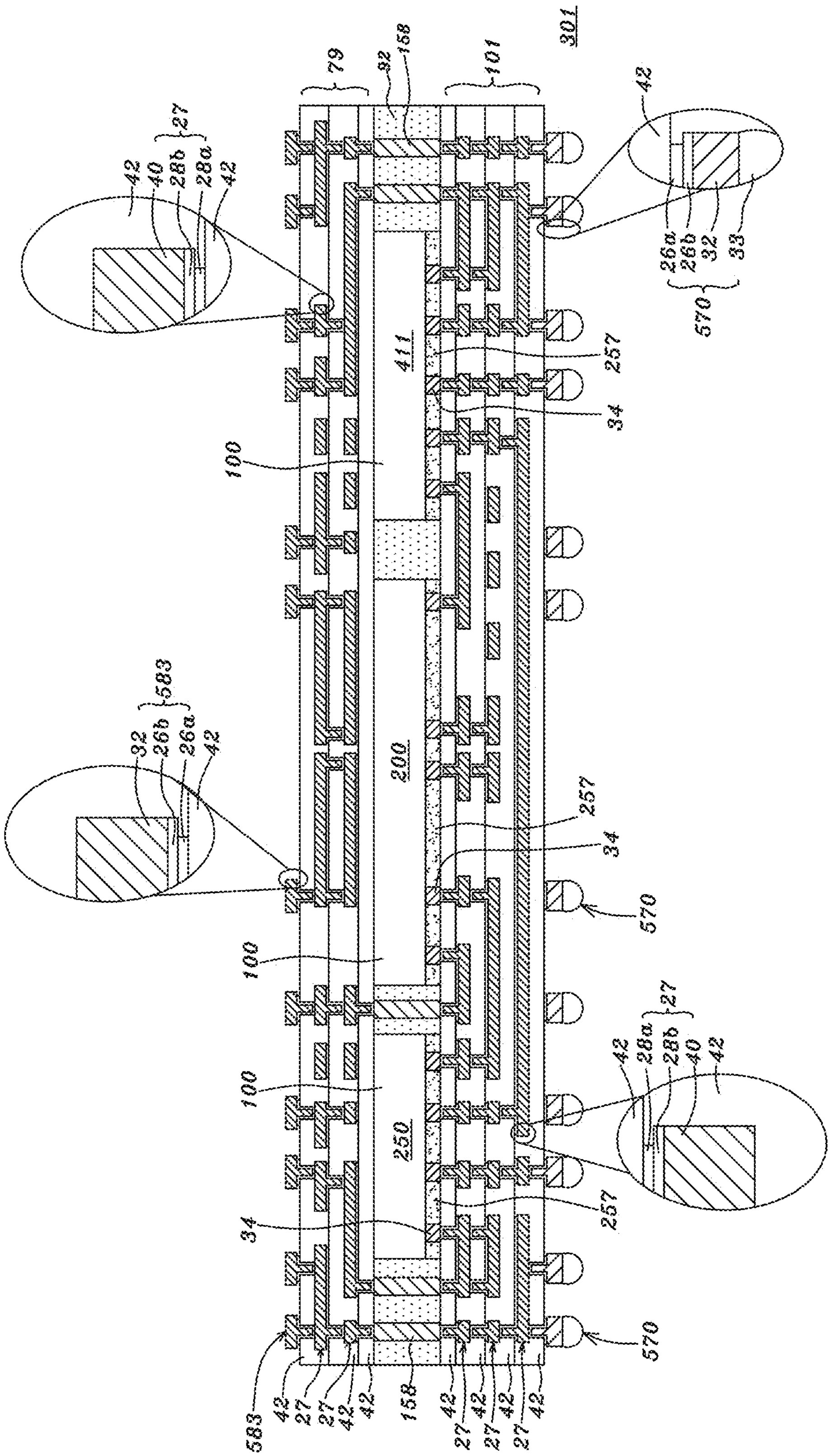
FIG. 36A-36C are schematically cross-sectional views showing a first type of chip package for a standard commodity logic drive in accordance with various embodiments of the present application.

FIG. 36A is a schematically cross-sectional view showing a first type of chip package for a standard commodity logic drive in accordance with an embodiment of the present application. FIG. 36A is a schematically cross-sectional view along a cross-sectional line A-A in FIG. 30. Referring to FIG. 36A, the first type of chip package 301 may be performed for the standard commodity logic drive 300 as illustrated in FIG. 30. The first type of chip package 301 may include (1) multiple first type of semiconductor chips 100 arranged in a horizontal level, wherein each of its first type of semiconductor chips 100 may have the same specification as illustrated in FIG. 34A, and its first type of semiconductor chips 100 may be the FPGA IC chips 200, graphic-processing unit (GPU) chips 269a, central-processing-unit (CPU) chip 269b, digital-signal-processing (DSP) chip 270, high-bandwidth-memory (HBM) integrated-circuit (IC) chips 251, non-volatile memory (NVM) IC chips 250, IAC chip 402, dedicated control and input/output (I/O) chip 260, cooperating and supporting (CS) integrated-circuit (IC) chips 411 and dedicated input/output (I/O) chips 265 as illustrated in FIG. 30, among of which are the FPGA IC chip 200, CS IC chip 411 and NVM IC chip 250 shown in FIG. 36A, (2) a polymer layer 92, such as molding compound, epoxy-based material or polyimide, filled into multiple gaps each between neighboring two of its first type of semiconductor chips 100, (3) multiple through package vias (TPVs) 158 in the polymer layer 92, wherein each of its through package vias (TPVs) 158 may be made of a copper layer having a height between 20 μm and 300 μm, 30 μm and 200 μm, 50 μm and 150 μm, 50 μm and 120 μm, 20 μm and 100 μm, 10 μm and 100 μm, 20 μm and 60 μm, 20 μm and 40 μm, or 20 μm and 30 μm, or greater than or equal to 100 μm, 50 μm, 30 μm or 20 μm, (4) a frontside interconnection scheme for a logic drive or device (FISD) 101 under its first type of semiconductor chips 100, polymer layer 92 and through package vias (TPVs) 158, (5) a backside interconnection scheme for a logic drive or device (BISD) over its first type of semiconductor chips 100, polymer layer 92 and through package vias (TPVs) 158, (6) multiple metal bumps or pillars 570 in an array at a bottom of the first type of chip package 301 and on a bottom surface of its FISD 101, and (7) multiple metal pads 583 in an array at a top of the first type of chip package 301 and on a top surface of its BISD 79.

Referring to FIG. 36A, each of the first type of semiconductor chips 100 of the first type of chip package 301 may further include a polymer layer 257 on the topmost one of the polymer layers 42 of its second interconnection scheme for a chip (SISC) 29 as seen in FIG. 34A. For said each of the first type of semiconductor chips 100 of the first type of chip package 301, its first type of micro-bumps or micro-pillars 34 may be provided with a bottom surface coupling to the FISD 101 of the first type of chip package 301, and its polymer layer 257 may have a bottom surface substantially coplanar to the bottom surface of each of its first type of micro-bumps or micro-pillars 34, a bottom surface of the polymer layer 92 of the first type of chip package 301 and a bottom surface of each of the through package vias (TPVs) 158.

Referring to FIG. 36A, the FISD 101 of the first type of chip package 301 may be provided with one or more interconnection metal layers 27 coupling to each of the first type of micro-pillars or micro-bumps 34 of each of the first type of semiconductor chips 100 of the first type of chip package 301 and one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the first type of chip package 301, the topmost one of the polymer layers 42 of its FISD 101 may have a top surface in contact with the bottom surface of the polymer layer 257 of each of its first type of semiconductor chips 100 and the bottom surface of its polymer layer 92. The topmost one of the polymer layers 42 of its FISD 101 may be between the topmost one of the interconnection metal layers 27 of its FISD 101 and its polymer layer 92 and between the topmost one of the interconnection metal layers 27 of its FISD 101 and the frontside of each of its first type of semiconductor chips 100, wherein each opening in the topmost one of polymer layers 42 of its FISD 101 may be under one of the first type of micro-pillars or micro-bumps 34 of one of its first type of semiconductor chips 100 or one of its through package vias (TPVs) 158, and thus the topmost one of the interconnection metal layers 27 of its FISD 101 may extend through said each opening to couple to said one of the first type of micro-pillars or micro-bumps 34 or said one of its through package vias (TPVs) 158. Each of the interconnection metal layers 27 of its FISD 101 may extend horizontally across an edge of each of its first type of semiconductor chips 100. The bottommost one of the interconnection metal layers 27 of its FISD 101 may have multiple metal pads at tops of multiple respective openings 42a in the bottommost one of the polymer layers 42 of its FISD 101. The specification and process for the interconnection metal layers 27 and polymer layers 42 for the frontside interconnection scheme for a logic drive or device (FISD) 101 may be referred to those for the SISC 29 as illustrated in FIG. 34A.

Referring to FIG. 36A, for the frontside interconnection scheme for a logic drive or device (FISD) 101 of the first type of chip package 301, each of its polymer layers 42 may be a layer of polyimide, benzocyclobutene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 hiving one or more upper portions in openings in one of its polymer layers 42, and a lower portion having a thickness 0.3 μm and 20 μm under said one of its polymer layers 42, (2) an adhesion layer 28*a*, such as titanium or titanium nitride having a thickness between 1 nm and 50 nm, at a top and sidewall of each of the one or more upper portions of the copper layer 40 of said each of the metal traces or lines and at a top of the lower portion of the copper layer 40 of said each of the metal traces or lines, and (3) a seed layer 28*b*, such as copper, between the copper layer 40 and adhesion layer 28*a* of said each of the metal traces or lines, wherein the lower portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Referring to FIG. 36A, the BISD 79 of the first type of chip package 301 may be provided with one or more interconnection metal layers 27 coupling to each of the through package vias (TPVs) 158 of the first type of chip package 301 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the first type of chip package 301, the bottommost one of the polymer layers 42 of its BISD 79 may be between the bottommost one of the interconnection metal layers 27 of its BISD 79 and its polymer layer 92 and between the bottommost one of the interconnection metal layers 27 of its BISD 79 and the backside of each of its first type of semiconductor chips 100, wherein each opening in the bottommost one of the polymer layers 42 of its BISD 79 may be vertically over one of its through package vias (TPVs) 158, and thus the bottommost one of the interconnection metal layers 27 of its BISD 79 may extend through said each opening to couple to said one of its through package vias (TPVs) 158. Each of the interconnection metal layers 27 of its BISD 79 may extend horizontally across an edge of each of its first type of semiconductor chips 100. The specification and process for the interconnection metal layers 27 and polymer layers 42 for the backside interconnection scheme for a logic drive or device (BISD) 79 may be referred to those for the SISC 29 as illustrated in FIG. 34A.

Referring to FIG. 36A, for the first type of chip package 301, one or more of the interconnection metal layers 27 of its FISD 101 may be provided to form one of its programmable interconnects 361 or one of its non-programmable interconnects 364 as illustrated in FIG. 30; alternatively, one or more of the interconnection metal layers 27 of its FISD 101, one or more of its through package vias (TPVs) 158 and one or more of the interconnection metal layers 27 of its BISD 79 may be provided to form one of its programmable interconnects 361 or one of its non-programmable interconnects 364 as illustrated in FIG. 30.

Referring to FIG. 36A, each of the metal bumps or pillars 570 of the first type of chip package 301 may be of various types. A first type of metal bumps or pillars 570 of the first type of chip package 301 each may include (1) an adhesion layer 26*a*, such as titanium (Ti) or titanium nitride (TiN) layer having a thickness between 1 nm and 50 nm, on a bottom surface of one of the metal pads of the bottommost one of the interconnection metal layers 27 of the FISD 101 of the first type of chip package 301, (2) a seed layer 26*b*, such as copper, on and under its adhesion layer 26*a* and (3) a copper layer 32 having a thickness between 1 μm and 60 μm on and under its seed layer 26*b*. Alternatively, a second type of metal bumps or pillars 570 of the first type of chip package 301 each may include the adhesion layer 26*a*, seed layer 26*b* and copper layer 32 as mentioned above, and may further include a tin-containing solder cap 33 made of tin or a tin-silver alloy having a thickness between 1 μm and 50 μm or between 20 μm and 100 μm on its copper layer 32. Alternatively, a third type of metal bumps or pillars 570 of the first type of chip package 301 each may include a gold layer having a thickness between 3 and 15 micrometers under the bottommost one of the interconnection metal layers 27 of the FISD 101 of the first type of chip package 301.

Referring to FIG. 36A, each of the metal pads 583 of the first type of chip package 301 may include (1) an adhesion layer 26*a*, such as titanium (Ti) or titanium nitride (TiN) layer having a thickness between 1 nm and 50 nm, on the topmost one of the interconnection metal layers 27 of the BISD 101 of the first type of chip package 301, (2) a seed layer 26*b*, such as copper, on and under its adhesion layer 26*a* and (3) a copper layer 32 having a thickness between 1 μm and 60 μm on and under its seed layer 26*b*.

Referring to FIGS. 30A, 30B and 36A, for the first type of chip package 301, its CS IC chip 411 may include a buffer and/or driver circuits for downloading the resulting values from each of its non-volatile memory (NVM) IC chips 250 to the memory cells 490 of each of its FPGA IC chips 200 as illustrated in FIGS. 19 and 20A-20L and downloading the programmable codes from each of its non-volatile memory (NVM) IC chips 250 to the memory cells 362 of each of its FPGA IC chips 200 as illustrated in FIGS. 15A-15C, 16A, 16B and 21. The buffer and/or driver circuits of its CS IC chip 411 may latch data associated with the resulting values and programmable codes from each of its non-volatile memory (NVM) IC chips 250 and amplify the data to the memory cells 490 and/or 362 of each of its FPGA IC chips 200 with an increased bit width of the data. For example, the data from each of its non-volatile memory (NVM) IC chips 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of each of its CS IC chip 411 may simultaneously output and amplify the data in parallel to the memory cells 490 and/or 362 of each of its FPGA IC chips 200 with an increased bit width of equal to or more than 4, 8, 16, 32 or 64 for example. For another example, the data from each of its non-volatile memory (NVM) IC chips 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data in parallel to the memory cells 490 and/or 362 of each of its FPGA IC chips 200 with an increased bit width of equal to or more than 64, 128, or 256 for example.

Referring to FIGS. 30A, 30B and 36A, for the first type of chip package 301, its CS IC chip 411 may include multiple small I/O circuits 203, each of which may be referred to the specification as illustrated in FIG. 18B, each coupling to one of multiple small I/O circuits 203 of its FPGA IC chip 200, each of which may be referred to the specification as illustrated in FIG. 18B, through one or more of the interconnection metal layers 27 of its frontside interconnection scheme for a logic drive or device (FISD) 101. Its CS IC chip 411 may include multiple large I/O circuits 341, each of which may be referred to the specification as illustrated in FIG. 18A, each coupling to an external circuit of the first type of chip package 301 or one of multiple large I/O circuits 341 of one of its NVM IC chips 250, each of which may be referred to the specification as illustrated in FIG. 18A, through one or more of the interconnection metal layers 27 of its frontside interconnection scheme for a logic drive or device (FISD) 101. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of each of its standard commodity FPGA IC chips 200, wherein the voltage (Vcc) of power supply supplied for each of the small I/O circuits 203 of its CS IC chip 411 may be the same as that supplied for each of the small I/O circuits 203 of each of its standard commodity FPGA IC chips 200. Further, gate oxide of each of the large I/O circuits 341 of its CS IC chip 411 may have a greater thickness than that of each of the small I/O circuits 203 of its CS IC chip 411.

Referring to FIGS. 30A, 30B and 36A, for the first type of chip package 301, its CS IC chip 411 may include the hard macros 419 as illustrated in FIG. 29. The hard macros 419 of its CS IC chip 411 may be divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its FPGA IC chip 200 as illustrated in FIG. 19 through, in sequence, one of the small I/O circuits 203 of its CS IC chip 411, one or more of the interconnection metal layers 27 of its frontside interconnection scheme for a logic drive or device (FISD) 101, one of the small I/O circuits 203 of its FPGA IC chip 200 and one or more of the field programmable switch cells 252 or 379 of its FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its FPGA IC chip 200 through, in sequence, one or more of the field programmable switch cells 252 or 379 of its FPGA IC chip 200, one of the small I/O circuits 203 of its FPGA IC chip 200, one or more of the interconnection metal layers 27 of its frontside interconnection scheme for a logic drive or device (FISD) 101 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its FPGA IC chip 200 as illustrated in FIG. 20K or 20L through, in sequence, one of the small I/O circuits 203 of its CS IC chip 411, one or more of the interconnection metal layers 27 of its frontside interconnection scheme for a logic drive or device (FISD) 101 and one of the small I/O circuits 203 of its FPGA IC chip 200.

Figure 36B:
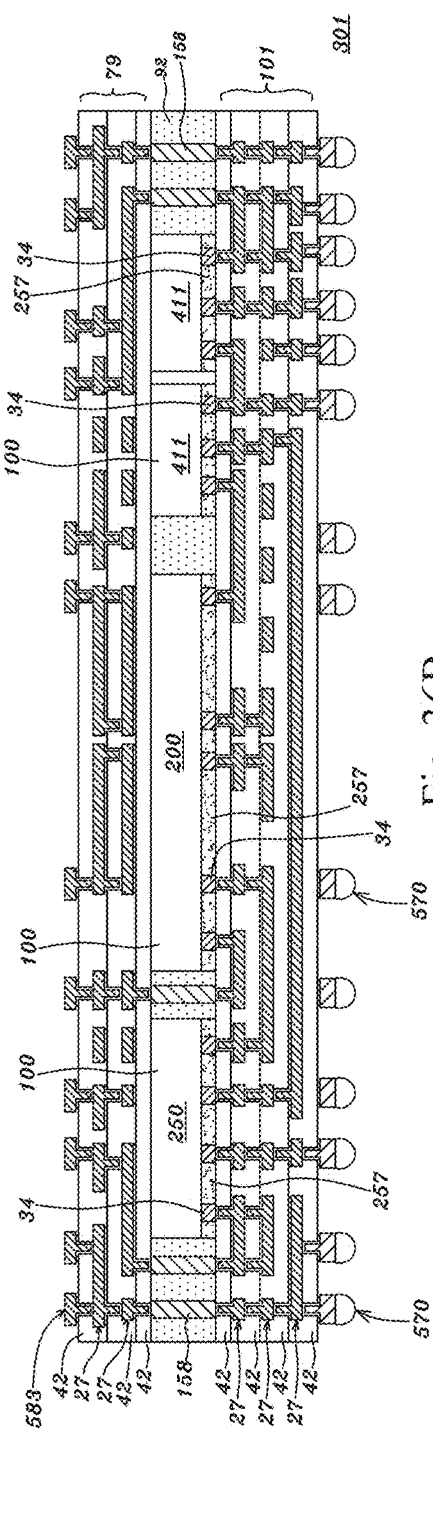

Alternatively, FIG. 36B is a schematically cross-sectional view showing a first type of chip package for a standard commodity logic drive in accordance with another embodiment of the present application. The first type of chip package 301 as seen in FIG. 36B may have a similar structure to the first type of chip package 301 as seen in FIG. 36A. For an element indicated by the same reference number shown in FIGS. 36A and 36B, the specification of the element as seen in FIG. 36B may be referred to that of the element as illustrated in FIG. 36A. The difference therebetween is that the only one CS IC chip 411 as seen in FIG. 36A may be replaced with multiple CS IC chips 411 as seen in FIG. 36B for performing the logic drive 300 as illustrated in FIG. 30. Referring to FIG. 36B, for the first type of chip package 301, each of its CS IC chips 411 may provide the same function as the CS IC chip 411 as illustrated in FIGS. 29 and 30.

Figure 36C:
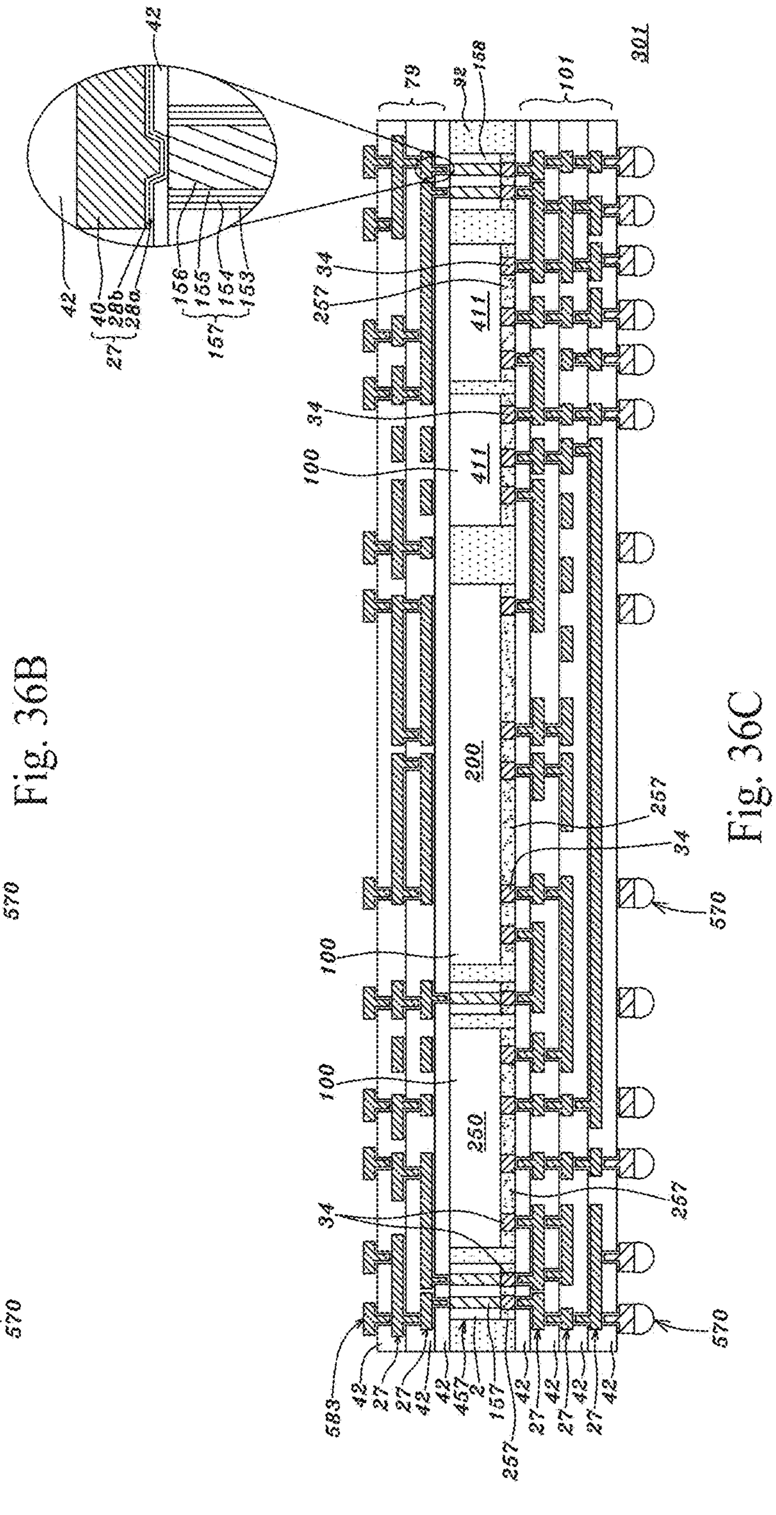

Alternatively, FIG. 36C is a schematically cross-sectional view showing a first type of chip package for a standard commodity logic drive in accordance with another embodiment of the present application. The first type of chip package 301 as seen in FIG. 36C may have similar structure to the first type of chip package 301 as seen in FIG. 36B. For an element indicated by the same reference number shown in FIGS. 36A-36C, the specification of the element as seen in FIG. 36C may be referred to that of the element as illustrated in FIG. 36A or 36B. The difference therebetween is that the through package vias (TPVs) as seen in FIGS. 36A and 36B may be replaced with one or more first type of vertical-through-via (VTV) connectors 467 as illustrated in FIG. 35A. Referring to FIG. 36C, each of the first type of vertical-through-via (VTV) connector 467 of the first type of chip package 301 may further include a polymer layer 257 on its insulating dielectric layer 12 and passivation layer 14 as seen in FIG. 35A. For said each of the first type of vertical-through-via (VTV) connector 467 of the first type of chip package 301, its first type of micro-bumps or micro-pillars 34 may be provided with a bottom surface coupling to the FISD 101 of the first type of chip package 301, and its polymer layer 257 may have a bottom surface substantially coplanar to the bottom surface of each of its first type of micro-bumps or micro-pillars 34, the bottom surface of each of the first type of micro-bumps or micro-pillars 34 of each of the first type of semiconductor chips 100 of the first type of chip package 301 and the bottom surface of the polymer layer 92 of the first type of chip package 301. Its semiconductor substrate 2 may have a portion at a backside thereof removed by a chemical-mechanical-polishing (CMP) or mechanical grinding process, and thereby each of its through silicon vias (TSVs) 157, that is, the electroplated copper layer 156 thereof, may have a backside substantially coplanar to the backside of its semiconductor substrate 2.

Referring to FIG. 36C, for the first type of chip package 301, each opening in the topmost one of polymer layers 42 of its FISD 101 may be under one of the first type of micro-pillars or micro-bumps 34 of one of its first type of semiconductor chips 100 or one of the first type of micro-pillars or micro-bumps 34 of one of its first type of vertical-through-via (VTV) connector 467, and thus the topmost one of the interconnection metal layers 27 of its FISD 101 may extend through said each opening to couple to said one of the first type of micro-pillars or micro-bumps 34 of said one of its first type of semiconductor chips 100 or said one of the first type of micro-pillars or micro-bumps 34 of said one of its first type of vertical-through-via (VTV) connector 467. Each opening in the bottommost one of the polymer layers 42 of its BISD 79 may be vertically over the backside of the electroplated copper layer 156 of one of the through silicon vias (TSVs) 157 of one of its first type of vertical-through-via (VTV) connector 467, and thus the bottommost one of the interconnection metal layers 27 of its BISD 79 may extend through said each opening to couple to the backside of the electroplated copper layer 156 of said one of the through silicon vias (TSVs) 157.

Referring to FIG. 36C, for the first type of chip package 301, one or more of the interconnection metal layers 27 of its FISD 101 may be provided to form one of its programmable interconnects 361 or one of its non-programmable interconnects 364 as illustrated in FIG. 30; alternatively, one or more of the interconnection metal layers 27 of its FISD 101, one or more of the through silicon vias (TSVs) 157 of one of its first type of vertical-through-via (VTV) connectors 467 and one or more of the interconnection metal layers 27 of its BISD 79 may be provided to form one of its programmable interconnects 361 or one of its non-programmable interconnects 364 as illustrated in FIG. 30.

Accordingly, referring to FIG. 36A-36C, for the first type of chip package 301, each of its FPGA IC chips 200 may be configured or programmed based on any of the first through sixth aspects as illustrated in FIG. 30.

Figure 37:
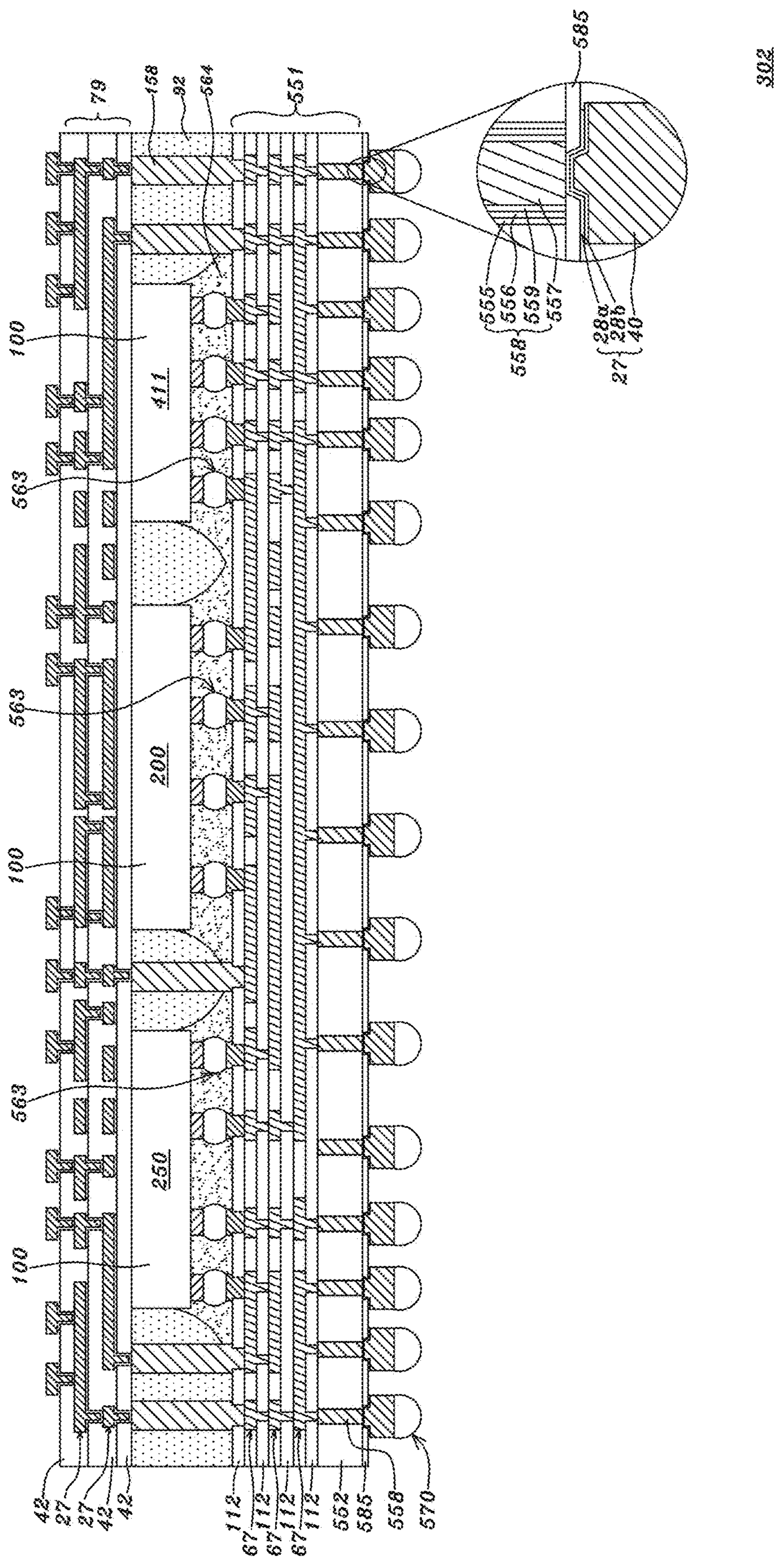
FIG. 37-40 are schematically cross-sectional views showing second through fifth types of chip packages respectively in accordance with an embodiment of the present application.

Second Type of Chip Package Fabricated by Multichip-on-interposer (COIP) Flip-chip Packaging Method FIG. 37 is a schematically cross-sectional view showing a second type of chip package for a standard commodity logic drive in accordance with an embodiment of the present application. The second type of chip package 302 as seen in FIG. 37 may have a similar structure to the first type of chip package 301 as seen in FIG. 36A. For an element indicated by the same reference number shown in FIGS. 36A and 37, the specification of the element as seen in FIG. 37 may be referred to that of the element as illustrated in FIG. 36A. The difference therebetween is that the FISD 101 of the first type of chip package 301 as seen in FIG. 36A may be replaced with an interposer 551 as seen in FIG. 37. Referring to FIG. 37, the second type of chip package 302 may be performed for the standard commodity logic drive 300 as illustrated in FIG. 30. The interposer 551 of the second type of chip package 302 may include (1) a silicon substrate 552, (2) multiple through silicon vias 558 extending vertically through its silicon substrate 552, (3) an interconnection scheme over the silicon substrate 552, having the same specification as illustrated for the FISC 20, SISC 29 or combination of FISC 20 and SISC 29 in FIGS. 34A and 34B, wherein its interconnection scheme may include multiple interconnection metal layers 67 over the silicon substrate 552, coupling to its through silicon vias 558 and each having the same specification as that of the interconnection metal layer 6 of the FISC 20 or that of the interconnection metal layer 27 of the SISC 27, and multiple insulating dielectric layers 112 each between neighboring two of its interconnection metal layers 67, under the bottommost one of its interconnection metal layers 67 or over the topmost one of its interconnection metal layers 67, each having the same specification as that of the insulating dielectric layer 12 of the FISC 20 or that of polymer layer 42 of the SISC 29, and (4) an insulating dielectric layer 585, i.e., polymer layer, on a bottom surface of its silicon substrate 552, wherein each opening in the insulating dielectric layer 585 may be vertically under a backside of one of its through silicon vias 558.

Referring to FIG. 37, each of the through silicon vias 558 of the interposer 551 of the second type of chip package 302 may include (1) a copper layer 557 extending vertically through the silicon substrate 552, (2) an insulating layer 555 around a sidewall of its copper layer 557 and in the silicon substrate 552 of the interposer 551, (3) an adhesion layer 556 around the sidewall of the copper layer 557 and between the copper layer 557 and the insulating layer 555 and (4) a seed layer 559 around the sidewall of the copper layer 557 and between the copper layer 557 and the adhesion layer 556. Each of the through silicon vias 558, i.e., the copper layer 557 thereof, may have a depth between 30 μm and 150 μm, or 50 μm and 100 μm, and a diameter or largest transverse size between 5 μm and 50 μm, or 5 μm and 15 μm. The adhesion layer 556 may include a titanium (Ti) or titanium nitride (TiN) layer having a thickness between 1 nm to 50 nm. The seed layer 559 may be a copper layer having a thickness of between 3 nm and 200 nm. The insulating layer 555 may include a thermally grown silicon oxide ($SiO_2$) and/or a CVD silicon nitride ($Si_3N_4$), for example.

Referring to FIG. 37, for the second type of chip package 302, each of its first type of semiconductor chips 100 may have the first, second, third or fourth type of micro-bumps or micro-pillars 34 as illustrated in FIG. 34A bonded to its interposer 551 to form multiple metal contacts 563 between said each of its first type of semiconductor chips 100 and its interposer 551, wherein each of its metal contacts 563 may include a copper layer having a thickness between 2 μm and 20 μm and a largest transverse dimension 1 μm and 15 μm between said each of its first type of semiconductor chips 100 and its interposer 551 and a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The second type of chip package 302 may further include an underfill 564, i.e., polymer layer, between each of its first type of semiconductor chips 100 and its interposer 551, covering a sidewall of each of its metal contacts 563 between said each of its first type of semiconductor chips 100 and its interposer 551. Each of its through package vias (TPVs) 158 may be formed on the topmost one of interconnection metal layers 67 of its interposer 551, coupling one or more of the interconnection metal layers 67 of its interposer 551 to one or more of the interconnection metal layers 27 of its BISD 79. Its polymer layer 92 may be formed on its interposer 551 and its underfill 564 and around its first type of semiconductor chips 100 and its through package vias (TPVs) 158. Each of its metal bumps or pillars 570 may have various types, i.e., first, second and third types, which may have the same specification as that of the first, second and third types of metal bumps or pillars 570 respectively as illustrated in FIG. 36A, wherein each of its metal bumps or pillars 570 may have the adhesion layer **26*a* on the backside of one of the through silicon vias 558 of its interposer 551, i.e., a backside of the copper layer 557** thereof.

Referring to FIG. 37, for the second type of chip package 302, one or more of the interconnection metal layers 67 of its interposer 551 may be provided to form one of its programmable interconnects 361 or one of its non-programmable interconnects 364 as illustrated in FIG. 30; alternatively, one or more of the interconnection metal layers 67 of its interposer 551, one or more of its through package vias (TPVs) 158 and one or more of the interconnection metal layers 27 of its BISD 79 may be provided to form one of its programmable interconnects 361 or one of its non-programmable interconnects 364 as illustrated in FIG. 30.

Alternatively, for the second type of chip package 302, its through package vias (TPVs) as seen in FIG. 37 may be replaced with one or more first type of vertical-through-via (VTV) connectors 467 as illustrated in FIG. 35A. Each of its first type of vertical-through-via (VTV) connectors 467 may have the first, second, third or fourth type of micro-bumps or micro-pillars 34 as illustrated in FIGS. 34A and 35A bonded to its interposer 551 to form multiple metal contacts between said each of its first type of vertical-through-via (VTV) connectors 467 and its interposer 551, each of which may have the same specification as illustrated for its metal contacts 563 between said each of its first semiconductor chips 100 and its interposer 551. The second type of chip package 302 may further include an underfill 564, i.e., polymer layer, between said each of its first type of vertical-through-via (VTV) connectors 467 and its interposer 551, covering a sidewall of each of its metal contacts between said each of its first type of vertical-through-via (VTV) connectors 467 and its interposer 551. Each opening in the bottommost one of the polymer layers 42 of its BISD 79 may be vertically over the backside of the electroplated copper layer 156 of one of the through silicon vias (TSVs) 157 of one of its first type of vertical-through-via (VTV) connector 467, and thus the bottommost one of the interconnection metal layers 27 of its BISD 79 may extend through said each opening to couple to the backside of the electroplated copper layer 156 of said one of the through silicon vias (TSVs) 157, as seen in FIG. 36C. Accordingly, for the second type of chip package 302, one or more of the interconnection metal layers 67 of its interposer 551 may be provided to form one of its programmable interconnects 361 or one of its non-programmable interconnects 364 as illustrated in FIG. 30; alternatively, one or more of the interconnection metal layers 67 of its interposer 551, one or more of the through silicon vias (TSVs) 157 of one of its first type of vertical-through-via (VTV) connectors 467 and one or more of the interconnection metal layers 27 of its BISD 79 may be provided to form one of its programmable interconnects 361 or one of its non-programmable interconnects 364 as illustrated in FIG. 30.

Accordingly, referring to FIG. 37, for the second type of chip package 302, each of its FPGA IC chips 200 may be configured or programmed based on any of the first through sixth aspects as illustrated in FIG. 30. Alternatively, multiple CS IC chips 411 may be provided on its interposer 551 for performing the logic drive 300 as illustrated in FIG. 30. Each of its CS IC chips 411 may provide the same function as the CS IC chip 411 as illustrated in FIGS. 29 and 30.

Referring to FIGS. 30A, 30B and 37, for the second type of chip package 302, its CS IC chip 411 may include multiple small I/O circuits 203, each of which may be referred to the specification as illustrated in FIG. 18B, each coupling to one of multiple small I/O circuits 203 of its FPGA IC chip 200, each of which may be referred to the specification as illustrated in FIG. 18B, through one or more of the interconnection metal layers 67 of its interposer 551. Its CS IC chip 411 may include multiple large I/O circuits 341, each of which may be referred to the specification as illustrated in FIG. 18A, each coupling to an external circuit of the second type of chip package 302 or one of multiple large I/O circuits 341 of one of its NVM IC chips 250, each of which may be referred to the specification as illustrated in FIG. 18A, through one or more of the interconnection metal layers 67 of its interposer 551. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of each of its standard commodity FPGA IC chips 200, wherein the voltage (Vcc) of power supply supplied for each of the small I/O circuits 203 of its CS IC chip 411 may be the same as that supplied for each of the small I/O circuits 203 of each of its standard commodity FPGA IC chips 200. Further, gate oxide of each of the large I/O circuits 341 of its CS IC chip 411 may have a greater thickness than that of each of the small I/O circuits 203 of its CS IC chip 411.

Referring to FIGS. 30A, 30B and 37, for the second type of chip package 302, its CS IC chip 411 may include the hard macros 419 as illustrated in FIG. 29. The hard macros 419 of its CS IC chip 411 may be divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its FPGA IC chip 200 as illustrated in FIG. 19 through, in sequence, one of the small I/O circuits 203 of its CS IC chip 411, one or more of the interconnection metal layers 67 of its interposer 551, one of the small I/O circuits 203 of its FPGA IC chip 200 and one or more of the field programmable switch cells 252 or 379 of its FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its FPGA IC chip 200 through, in sequence, one or more of the field programmable switch cells 252 or 379 of its FPGA IC chip 200, one of the small I/O circuits 203 of its FPGA IC chip 200, one or more of the interconnection metal layers 67 of its interposer 551 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its FPGA IC chip 200 as illustrated in FIG. 20K or 20L through, in sequence, one of the small I/O circuits 203 of its CS IC chip 411, one or more of the interconnection metal layers 67 of its interposer 551 and one of the small I/O circuits 203 of its FPGA IC chip 200.

Figure 38:
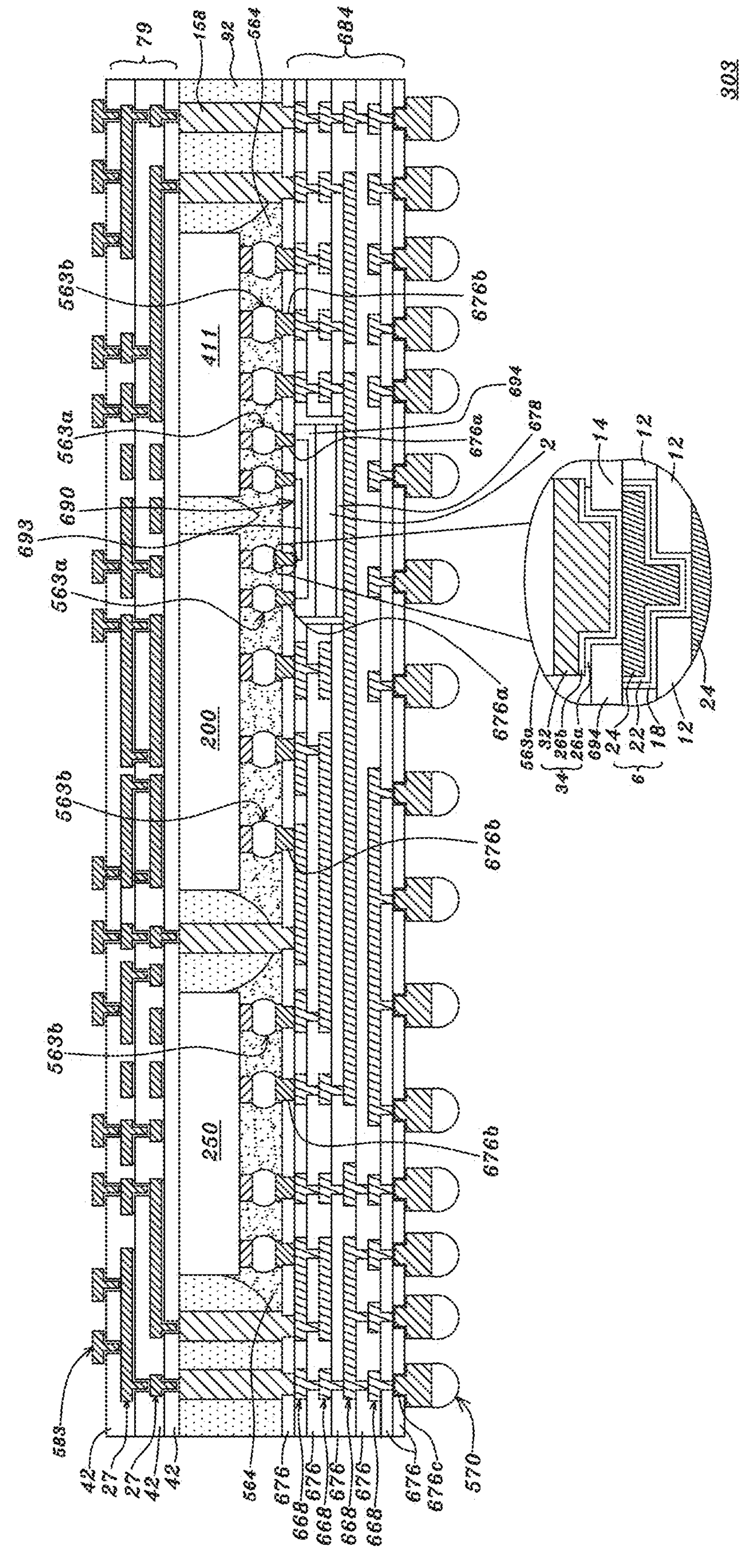

Third Type of Chip Package Fabricated by Multichip-On-Interposer (COIP) Flip-Chip Packaging Method FIG. 38 is a schematically cross-sectional view showing a third type of chip package for a standard commodity logic drive in accordance with an embodiment of the present application. The third type of chip package 303 as seen in FIG. 38 may have a similar structure to the first type of chip package 301 as seen in FIG. 36A. For an element indicated by the same reference number shown in FIGS. 36A and 38, the specification of the element as seen in FIG. 38 may be referred to that of the element as illustrated in FIG. 36A. The difference therebetween is that the FISD 101 of the first type of chip package 301 as seen in FIG. 36A may be replaced with an interconnection substrate 684 as seen in FIG. 38. Referring to FIG. 38, the third type of chip package 303 may be performed for the standard commodity logic drive 300 as illustrated in FIG. 30. The interconnection substrate 684 of the third type of chip package 303 may be a coreless substrate including (1) multiple interconnection metal layers 668, made of copper, (2) multiple polymer layers 676 each between neighboring two of its interconnection metal layers 668, and (3) one or more fine-line interconnection bridges (FIBs) 690 (only one is shown) embedded in its interconnection substrate 684 and attached onto one of its interconnection metal layers 668 via an adhesive 678. One or more of its interconnection metal layers 668 may surround four sidewalls of each of its fine-line interconnection bridges (FIBs) 690.

Referring to FIG. 38, each of the fine-line interconnection bridges (FIBs) 690 of the interconnection substrate 684 of the third type of chip package 303 may include (1) a silicon substrate 2 and (2) an interconnection scheme 694 over the silicon substrate 2 thereof, having the same specification as illustrated for the FISC 20, SISC 29 or combination of FISC 20 and SISC 29 in FIGS. 34A and 34B, wherein its interconnection scheme may include multiple interconnection metal layers over the silicon substrate 2, each having the same specification as that of the interconnection metal layer 6 of the FISC 20 or that of the interconnection metal layer 27 of the SISC 27, and multiple insulating dielectric layers each between neighboring two of the interconnection metal layers of its interconnection scheme, under the bottommost one of the interconnection metal layers of its interconnection scheme or over the topmost one of the interconnection metal layers 67 of its interconnection scheme, each having the same specification as that of the insulating dielectric layer 12 of the FISC 20 or that of polymer layer 42 of the SISC 29. Each of the fine-line interconnection bridges (FIBs) 690 of the interconnection substrate 684 of the third type of chip package 303 may include (1) multiple metal pads provided by the topmost one of the interconnection metal layers of its interconnection scheme 694, and (2) metal lines or traces 693 provided by one or more of the interconnection metal layers of its interconnection scheme 694, each coupling two of its metal pads at its two opposite sides.

Referring to FIG. 38, for the interconnection substrate 684 of the third type of chip package 303, the topmost one of its polymer layers 676 may be provided over its fine-line interconnection bridges (FIBs) 690. A first group of openings 767*a* in the topmost one of its polymer layers 676 may be formed vertically over the metal pads of its fine-line interconnection bridges (FIBs) 690, a second group of openings 767*b* in the topmost one of its polymer layers 676 may be formed vertically over multiple metal pads of the topmost one of its interconnection metal layers 668 and a third group of openings 767*c* in the bottommost one of its polymer layers 676 may be formed respectively vertically under multiple metal pads of the bottommost one of its interconnection metal layers 668, which are provided in one of its polymer layers 676 on and over the bottommost one of its polymer layers 676. Each of its interconnection metal layers 668 may be made of copper and have a thickness, for example, between 5 and 100 micrometers, between 5 and 50 micrometers or between 10 and 50 micrometers, and thicker than that of each of the interconnection metal layers of the interconnection scheme 694 of each of its fie-line interconnection bridges (FIBs) 690.

Referring to FIG. 38, for the third type of chip package 303, each of its first type of semiconductor chips 100 may have the first, second, third or fourth type of micro-bumps or micro-pillars 34 as illustrated in FIG. 34A bonded respectively to multiple micro-bumps or micro-pillars 34 of its interconnection substrate 684, in which the micro-bumps or micro-pillars 34 of its interconnection substrate 684 may be of a first, second, third or fourth type as illustrated for the first, second, third or fourth type of micro-bumps or micro-pillars 34 respectively in FIG. 34A, to form (1) multiple high-density metal contacts 563*a* between said each of its first type of semiconductor chips 100 and one of the fine-line interconnection bridges (FIBs) 690 of its interconnection substrate 684, each coupling said each of its first type of semiconductor chips 100 to one of the metal pads of the fine-line interconnection bridges (FIBs) 690 of its interconnection substrate 684, and (2) multiple low-density metal contacts 563*b* between said each of its first type of semiconductor chips 100 and its interconnection substrate 684, each coupling said each of its first type of semiconductor chips 100 to one of the metal pads of the topmost one of the interconnection metal layers 668 of its interconnection substrate 684, wherein each of its high-density and low-density metal contacts 563*a* and 563*b* may include a copper layer having a thickness between 2 μm and 20 μm between said each of its first type of semiconductor chips 100 and its interconnection substrate 684 and a solder cap, made of a tin-silver alloy, a tin-gold alloy, a tin-copper alloy, a tin-indium alloy, indium or tin, having a thickness of between 1 μm and 15 μm between the copper layer of said each of its high-density and low-density metal contacts 563*a* and 563*b* and its interconnection substrate 684. Accordingly, neighboring two of its first type of semiconductor chips 100 may couple to each other through, in sequence, one of its high-density metal contacts 563*a* under one of said neighboring two of its first type of semiconductor chips 100, one of the metal lines or traces 693 of one of the fine-line interconnection bridges (FIBs) 690 of its interconnection substrate 684 vertically under said neighboring two of its first type of semiconductor chips 100 and one of its high-density metal contacts 563*a* under the other of said neighboring two of its first type of semiconductor chips 100.

Referring to FIG. 38, for the third type of chip package 303, each of its high-density metal contacts 563*a* may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 sm. The smallest space between neighboring two of its high-density metal contacts 563*a* may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. Each of its low-density metal contacts 563*b* may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 sm. The smallest space between neighboring two of its low-density metal contacts 563*b* may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 sm. The ratio of the largest dimension in a horizontal cross section of each of its low-density metal contacts 563*b* to that of each of its high-density metal contacts 563*a* may be between 1.1 and 5 or greater than 1.2, 1.5 or 2, for example. The ratio of the smallest space between neighboring two of its low-density metal contacts 563*b* to that between neighboring two of its high-density metal contacts 563*a* may be between 1.1 and 5 or greater than 1.2, 1.5 or 2, for example.

Referring to FIG. 38, the third type of chip package 303 may further include an underfill 564, i.e., polymer layer, between each of its first type of semiconductor chips 100 and its interconnection substrate 684, covering a sidewall of each of its high-density and low-density metal contacts 563*a* and 563*b* between said each of its first type of semiconductor chips 100 and its interconnection substrate 684. Each of its through package vias (TPVs) 158 may be formed on the topmost one of interconnection metal layers 676 of its interconnection substrate 684, coupling one or more of the interconnection metal layers 676 of its interconnection substrate 684 to one or more of the interconnection metal layers 27 of its BISD 79. Its polymer layer 92 may be formed on its interconnection substrate 684 and its underfill 564 and around its first type of semiconductor chips 100 and its through package vias (TPVs) 158. Each of its metal bumps or pillars 570 may have various types, i.e., first, second and third types, which may have the same specification as that of the first, second and third types of metal bumps or pillars 570 respectively as illustrated in FIG. 36A, wherein each of its metal bumps or pillars 570 may have the adhesion layer 26*a* on a bottom surface of one of the metal pad of the bottommost one of the interconnection metal layers 668 of its interconnection substrate 684.

Referring to FIG. 38, for the third type of chip package 303, one or more of the metal lines or traces 693 of the fine-line interconnection bridges (FIBs) 690 of its interconnection substrate 684 may be provided to form one of its programmable interconnects 361 or one of its non-programmable interconnects 364 as illustrated in FIG. 30; alternatively, one or more of the interconnection metal layers 668 of its interconnection substrate 684 may be provided to form one of its programmable interconnects 361 or one of its non-programmable interconnects 364 as illustrated in FIG. 30; alternatively, one or more of the interconnection metal layers 668 of its interconnection substrate 684, one or more of its through package vias (TPVs) 158 and one or more of the interconnection metal layers 27 of its BISD 79 may be provided to form one of its programmable interconnects 361 or one of its non-programmable interconnects 364 as illustrated in FIG. 30.

Alternatively, for the third type of chip package 303, its through package vias (TPVs) as seen in FIG. 38 may be replaced with one or more first type of vertical-through-via (VTV) connectors 467 as illustrated in FIG. 35A. Each of its first type of vertical-through-via (VTV) connectors 467 may have the first, second, third or fourth type of micro-bumps or micro-pillars 34 as illustrated in FIGS. 34A and 35A bonded to its interconnection substrate 684 to form (1) multiple high-density metal contacts between said each of its first type of vertical-through-via (VTV) connectors 467 and one of the fine-line interconnection bridges (FIBs) 690 of its interconnection substrate 684, each of which may have the same specification as illustrated for its high-density metal contacts 563*a* and couple said each of its first type of vertical-through-via (VTV) connectors 467 to one of the metal pads of said one of the fine-line interconnection bridges (FIBs) 690 of its interconnection substrate 684, and (2) multiple low-density metal contacts between said each of its first type of vertical-through-via (VTV) connectors 467 and one of the metal pads of the topmost one of the interconnection metal layers 668 of its interconnection substrate 684, each of which may have the same specification as illustrated for its high-density metal contacts 563*b* and couple said each of its first type of vertical-through-via (VTV) connectors 467 to said one of the metal pads of the topmost one of the interconnection metal layers 668 of its interconnection substrate 684. The third type of chip package 303 may further include an underfill 564, i.e., polymer layer, between said each of its first type of vertical-through-via (VTV) connectors 467 and its interconnection substrate 684, covering a sidewall of each of its high-density and low-density metal contacts between said each of its first type of vertical-through-via (VTV) connectors 467 and its interconnection substrate 684. Each opening in the bottommost one of the polymer layers 42 of its BISD 79 may be vertically over the backside of the electroplated copper layer 156 of one of the through silicon vias (TSVs) 157 of one of its first type of vertical-through-via (VTV) connectors 467, and thus the bottommost one of the interconnection metal layers 27 of its BISD 79 may extend through said each opening to couple to the backside of the electroplated copper layer 156 of said one of the through silicon vias (TSVs) 157, as seen in FIG. 36C. Accordingly, each of the through silicon vias (TSVs) 157 of each of its first type of vertical-through-via (VTV) connectors 467 may couple one or more of the interconnection metal layers 27 of its BISD 79 to one of the metal line or traces 693 of one of the fine-line interconnection bridges (FIBs) 690 of its interconnection substrate 684 under said each of its first type of vertical-through-via (VTV) connectors 467 or to one of the metal pads of the topmost one of the interconnection metal layers 668 of its interconnection substrate 684. Accordingly, one or more of the metal lines or traces 693 of one of the fine-line interconnection bridges (FIBs) 690 of its interconnection substrate 684 may be provided to form one of its programmable interconnects 361 or one of its non-programmable interconnects 364 as illustrated in FIG. 30; alternatively, one or more of the interconnection metal layers 668 of its interconnection substrate 684 may be provided to form one of its programmable interconnects 361 or one of its non-programmable interconnects 364 as illustrated in FIG. 30; alternatively, one or more of the metal lines or traces 693 of one of the fine-line interconnection bridges (FIBs) 690 of its interconnection substrate 684, one of the through silicon vias (TSVs) 157 of one of its first type of vertical-through-via (VTV) connectors 467 and one or more of the interconnection metal layers 27 of its BISD 79 may be provided to form one of its programmable interconnects 361 or one of its non-programmable interconnects 364 as illustrated in FIG. 30; alternatively, one or more of the interconnection metal layers 668 of its interconnection substrate 684, one of the through silicon vias (TSVs) 157 of one of its first type of vertical-through-via (VTV) connectors 467 and one or more of the interconnection metal layers 27 of its BISD 79 may be provided to form one of its programmable interconnects 361 or one of its non-programmable interconnects 364 as illustrated in FIG. 30.

Accordingly, referring to FIG. 38, for the third type of chip package 303, each of its FPGA IC chips 200 may be configured or programmed based on any of the first through sixth aspects as illustrated in FIG. 30. Alternatively, multiple CS IC chips 411 may be provided on its interconnection substrate 684 for performing the logic drive 300 as illustrated in FIG. 30. Each of its CS IC chips 411 may provide the same function as the CS IC chip 411 as illustrated in FIGS. 29 and 30.

Referring to FIGS. 30A, 30B and 38, for the third type of chip package 303, its CS IC chip 411 may include multiple small I/O circuits 203, each of which may be referred to the specification as illustrated in FIG. 18B, each coupling to one of multiple small I/O circuits 203 of its FPGA IC chip 200, each of which may be referred to the specification as illustrated in FIG. 18B, through one or more of the metal lines or traces 693 of the fine-line interconnection bridges (FIBs) 690 of its interconnection substrate 684. Its CS IC chip 411 may include multiple large I/O circuits 341, each of which may be referred to the specification as illustrated in FIG. 18A, each coupling to an external circuit of the third type of chip package 303 or one of multiple large I/O circuits 341 of one of its NVM IC chips 250, each of which may be referred to the specification as illustrated in FIG. 18A, through one or more of the interconnection metal layers 668 of its interconnection substrate 684. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of each of its standard commodity FPGA IC chips 200, wherein the voltage (Vcc) of power supply supplied for each of the small I/O circuits 203 of its CS IC chip 411 may be the same as that supplied for each of the small I/O circuits 203 of each of its standard commodity FPGA IC chips 200. Further, gate oxide of each of the large I/O circuits 341 of its CS IC chip 411 may have a greater thickness than that of each of the small I/O circuits 203 of its CS IC chip 411.

Referring to FIGS. 30A, 30B and 38, for the third type of chip package 303, its CS IC chip 411 may include the hard macros 419 as illustrated in FIG. 29. The hard macros 419 of its CS IC chip 411 may be divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its FPGA IC chip 200 as illustrated in FIG. 19 through, in sequence, one of the small I/O circuits 203 of its CS IC chip 411, one or more of the metal lines or traces 693 of the fine-line interconnection bridges (FIBs) 690 of its interconnection substrate 684, one of the small I/O circuits 203 of its FPGA IC chip 200 and one or more of the field programmable switch cells 252 or 379 of its FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its FPGA IC chip 200 through, in sequence, one or more of the field programmable switch cells 252 or 379 of its FPGA IC chip 200, one of the small I/O circuits 203 of its FPGA IC chip 200, one or more of the metal lines or traces 693 of the fine-line interconnection bridges (FIBs) 690 of its interconnection substrate 684 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its FPGA IC chip 200 as illustrated in FIG. 20K or 20L through, in sequence, one of the small I/O circuits 203 of its CS IC chip 411, one or more of the metal lines or traces 693 of the fine-line interconnection bridges (FIBs) 690 of its interconnection substrate 684 and one of the small I/O circuits 203 of its FPGA IC chip 200.

Fourth Type of Chip Package

Figure 39:
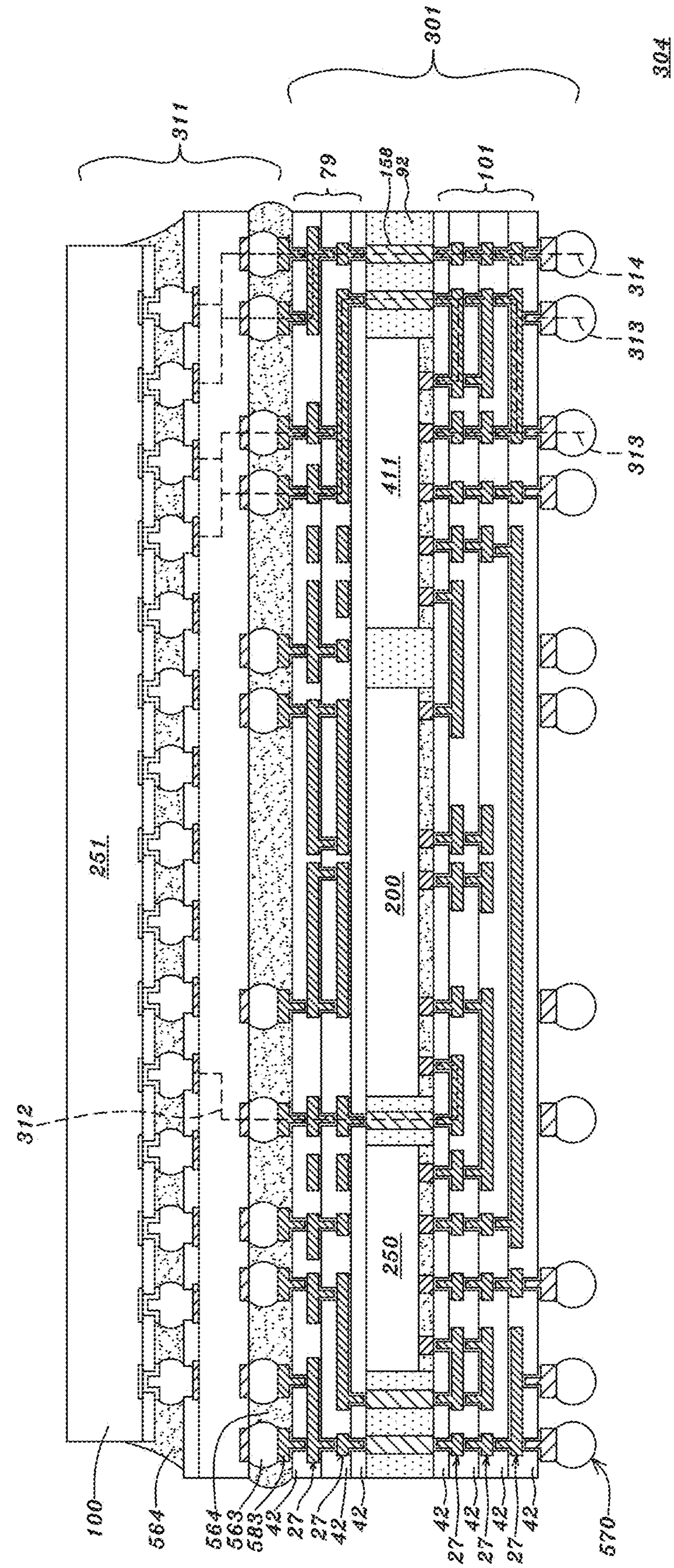

FIG. 39 is a schematically cross-sectional view showing a fourth type of chip package in accordance with an embodiment of the present application. Referring to FIG. 39, another chip package 311 may be stacked over any of the first, second and third types of chip packages 301, 302 and 303 as illustrated in FIGS. 36A-36C, 37 and 38 to form the fourth type of chip package 304, i.e., package-on-package (POP) assembly, but only shown to be stacked over the first type of chip package 301 as illustrated in FIG. 36A. For an element indicated by the same reference number shown in FIGS. 36A and 39, the specification of the element as seen in FIG. 39 may be referred to that of the element as illustrated in FIG. 36A. The chip package 311 may include (1) a ball-grid-array (BGA) substrate 321, (2) a first type of semiconductor chip 100 as illustrated in FIG. 34A over its ball-grid-array (BGA) substrate 321, wherein its first type of semiconductor chip 100 may be a memory integrated-circuit (IC) chip, such as HBM IC chip 251, and (3) multiple solder balls 322 under and in contact with a bottom surface of its ball-grid-array (BGA) substrate 321, each joining its ball-grid-array (BGA) substrate 321 to one of the metal pads 583 of the first type of chip package 301. For the chip package 311, its HBM IC chip 251 may have multiple micro-bump or micro-pillars, which may have various types, i.e., first, second, third and fourth types, having the same specification as that of the first, second, third and fourth types of micro-bump or micro-pillars 34 respectively as illustrated in FIG. 34A, bonded to its ball-grid-array (BGA) substrate 321 to form multiple metal contact 563 between its HBM IC chip 251 and its ball-grid-array (BGA) substrate 321, wherein each of its metal contacts 563 may include a copper layer having a thickness between 2 μm and 20 μm and a largest transverse dimension 1 μm and 15 μm between its HBM IC chip 251 and its ball-grid-array (BGA) substrate 321, and a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its ball-grid-array (BGA) substrate 321. The chip package 311 may further include an underfill 564, i.e., polymer layer, between its HBM IC chip 251 and its ball-grid-array (BGA) substrate 321, covering a sidewall of each of its metal contacts 563 between its HBM IC chip 251 and its ball-grid-array (BGA) substrate 321. The fourth type of chip package 304 may further include an underfill 564, i.e., polymer layer, between its chip packages 311 and its first type of chip package 301, covering a sidewall of each of the solder balls 322 of its chip package 311. Alternatively, the chip package 311 may be achieved by a thin small outline package (TSOP) based on a lead frame, a BGA package based on wirebonding or flipchip bonding on a ball grid array substrate, or an FOIT package as illustrated in FIGS. 36A-36C.

Referring to FIG. 39, for the fourth type of chip package 304, the HBM IC chip 251 of its chip package 311 may have a set of small I/O circuits 203, each having the same specification as illustrated in FIG. 18B, coupling respective to a set of small I/O circuits 203 of one of the FPGA IC chips 200 of its first type of chip package 301, or other logic integrated-circuit (IC) chip, such as graphic-processing unit (GPU) chips 269*a*, central-processing-unit (CPU) chip 269*b* or digital-signal-processing (DSP) chip 270, of its first type of chip package 301 as illustrated in FIG. 30A or 30B for data transmission with a data bit width of equal to or greater than 64, 128, 256, 512, 1024, 2048, 4096, 8K, or 16K. The HBM IC chip 251 of its chip package 311 may couple to one of logic integrated-circuit (IC) chips, such as FPGA IC chips 200, graphic-processing unit (GPU) chips 269*a*, central-processing-unit (CPU) chip 269*b* and digital-signal-processing (DSP) chip 270, of its first type of chip package 301 for interpackage signal transmission or power or ground delivery through, in sequence, one of the metal contacts 563 of its chip package 311, the ball-grid-array (BGA) substrate 321 of its chip package 311, the solder balls 322 of its chip package 311, one of the metal pads 583 of its first type of chip package 301, the interconnection metal layers 27 of the BISD 79 of its first type of chip package 301, one of the through package vias 158 of its first type of chip package 301, one or more of the interconnection metal layers 27 of the FISD 101 of its first type of chip package 301, shown as a first metal interconnect 312. The HBM IC chip 251 of its chip package 311 and the CS IC chip 411 of its first type of chip package 301 may couple to one or more common metal bumps or pillars 570 of its first type of chip package 301 for external signal transmission or power or ground delivery through a second metal interconnect 313. The HBM IC chip 251 of its chip package 311 may couple to one or more metal bumps or pillars 570 of its first type of chip package 301 for external signal transmission or power or ground delivery through a third metal interconnect 314, without coupling to any of the first type of semiconductor chips 100 of its first type of chip package 301.

Fifth Type of Chip Package

Figure 40:
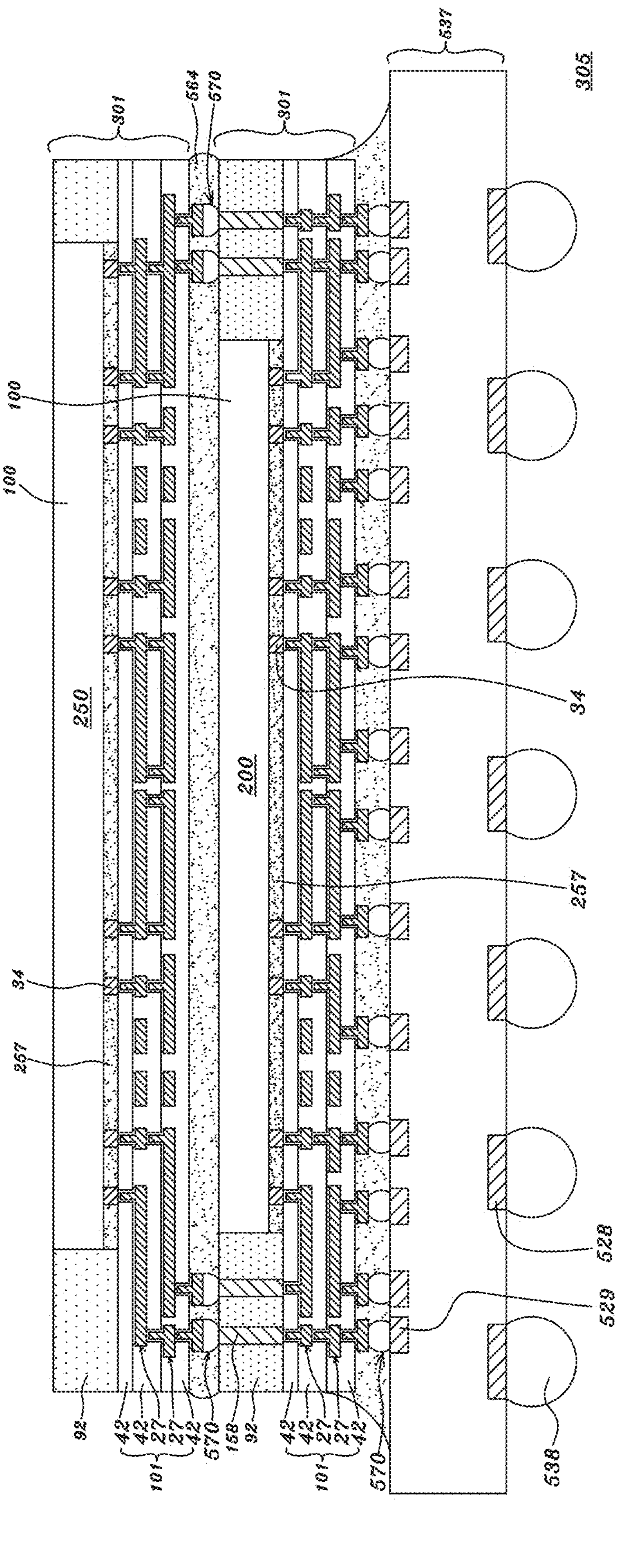

FIG. 40 is a schematically cross-sectional view showing a fifth type of chip package in accordance with an embodiment of the present application. Referring to FIG. 40, the fifth type of chip package 305 may include two first type of chip packages 301, each of which may have the similar structure to that as illustrated in FIG. 36A, stacked with each other, i.e., top and bottom ones. For an element indicated by the same reference number shown in FIGS. 36A and 40, the specification of the element as seen in FIG. 40 may be referred to that of the element as illustrated in FIG. 36A.

Referring to FIG. 40, for the bottom one of the first type of chip packages 301 of the fifth type of chip package 305, the BISD 79 as illustrated in FIG. 36A may be saved. Thereby, the top one of the first type of chip packages 301 of the fifth type of chip package 305 may include the metal bumps or pillars 570 each mounted to a top surface of one of the through package vias (TPVs) 158 of the bottom one of the first type of chip packages 301 of the fifth type of chip package 305. For the top one of the first type of chip packages 301 of the fifth type of chip package 305, the BISD 79 and through package vias (TPVs) 158 as illustrated in FIG. 36A may be saved. For the fifth type of chip package 305, the bottom one of its first type of chip packages 301 may include one or more first type of semiconductor chips 100 used for logic integrated-circuit (IC) chips 326, such as FPGA IC chip, graphic-processing unit (GPU) chip, central-processing-unit (CPU) chip or digital-signal-processing (DSP) chip, and the top one of its first type of chip packages 301 may include one or more first type of semiconductor chips 100 used for one or more NVM IC chips 250, such as NAND or NOR flash chip, MRAM IC chip or RRAM IC chip. The fifth type of chip package 305 may further include (1) a ball-grid-array (BGA) substrate 537 having multiple metal pads 529 at a top surface thereof and multiple metal pads 528 at a bottom surface thereof, wherein the bottom one of its first type of chip packages 301 may have the metal bumps or pillars 570 bonded respectively to the metal pads 529 of its ball-grid-array (BGA) substrate 537, (2) multiple solder balls 538 each on one of the metal pads 528 of its ball-grid-array (BGA) substrate 537, (3) an underfill 564 between the top and bottom ones of its first type of chip packages 301, covering a sidewall of each of the metal bumps or pillars 570 of the top one of its first type of chip packages 301, and (4) an underfill 564 between the bottom one of its first type of chip packages 301 and its ball-grid-array (BGA) substrate 537, covering a sidewall of each of the metal bumps or pillars 570 of the bottom one of its first type of chip packages 301.

Alternatively, referring to FIG. 40, tor the fifth type of chip package 305, the top one of its first type of chip packages 301 may include one or more first type of semiconductor chips 100 used for logic integrated-circuit (IC) chips 326, such as FPGA IC chip, graphic-processing unit (GPU) chip, central-processing-unit (CPU) chip or digital-signal-processing (DSP) chip, and the bottom one of its first type of chip packages 301 may include one or more first type of semiconductor chips 100 used for one or more NVM IC chips 250, such as NAND or NOR flash chip, MRAM IC chip or RRAM IC chip.

Referring to FIG. 40, for the fifth type of chip package 305, in the case that its logic integrated-circuit (IC) chip 326 is the FPGA IC chip 200 as illustrated in FIG. 27, a first one of the large I/O circuits 341 of its NVM IC chip 250 may have the large driver 274 as see in FIG. 18A coupling to the large receiver 275 of a second one of the large I/O circuits 341 of its logic integrated-circuit (IC) chip 326 via the interconnection metal layers 27 of the FISD 101 of the top one of its first type of chip package 301, one of the metal bumps or pillars 570 of the top one of its first type of chip package 301, one of the through package vias (TPVs) 158 of the bottom one of its first type of chip package 301 and one or more of the interconnection metal layers 27 of the FISD 101 of the bottom one of its first type of chip package 301 for passing first encrypted CPM data from the large driver 274 of the first one of the large I/O circuits 341 to the large receiver 275 of the second one of the large I/O circuits 341. Next, its logic integrated-circuit (IC) chip 326 may include a cryptography block configured to decrypt the first encrypted CPM data as first decrypted CPM data, wherein the cryptography block may be any as illustrated in FIGS. 22A-22D, 23A-23C, 24, 25 and 26A-26C. Next, for the logic integrated-circuit (IC) chip 326 of the fifth type of chip package 305, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for the logic integrated-circuit (IC) chip 326 of the fifth type of chip package 305, second CPM data used to program or configure the first type of memory cells 490 of one of its field programmable logic cells or elements (LCE) 2014 or the first type of memory cells 362 of one of its field programmable switch cells 258 or 379 may be encrypted by its cryptography block as second encrypted CPM data. Next, for the fifth type of chip package 305, a third one of the large I/O circuits 341 of its logic integrated-circuit (IC) chip 326 may have the large driver 274 as seen in FIG. 18B coupling to the large receiver 275 of a fourth one of the large I/O circuits 341 of its NVM IC chips 250 via one or more of the interconnection metal layers 27 of the FISD 101 of the bottom one of its first type of chip package 301, one of the through package vias (TPVs) 158 of the bottom one of its first type of chip package 301, one of the metal bumps or pillars 570 of the top one of its first type of chip package 301 and the interconnection metal layers 27 of the FISD 101 of the top one of its first type of chip package 301 for passing the second encrypted CPM data from the large driver 274 of the third one of the large I/O circuits 341 to the large receiver 275 of the fourth one of the large I/O circuits 341 to be stored in its NVM IC chip 250.

Alternatively, referring to FIG. 40, for the fifth type of chip package 305, in the case that its logic integrated-circuit (IC) chip 326 is the FPGA IC chip 200 as illustrated in FIG. 27, its NVM IC chips 250 may include a cryptography block configured to decrypt first encrypted CPM data stored therein as first decrypted CPM data, wherein the cryptography block may be any as illustrated in FIGS. 22A-22D, 23A-23C, 24, 25 and 26A-26C. A first one of the large I/O circuits 341 of its NVM IC chip 250 may have the large driver 274 as see in FIG. 18A coupling to the large receiver 275 of a second one of the large I/O circuits 341 of its logic integrated-circuit (IC) chip 326 via the interconnection metal layers 27 of the FISD 101 of the top one of its first type of chip package 301, one of the metal bumps or pillars 570 of the top one of its first type of chip package 301, one of the through package vias (TPVs) 158 of the bottom one of its first type of chip package 301 and one or more of the interconnection metal layers 27 of the FISD 101 of the bottom one of its first type of chip package 301 for passing the first decrypted CPM data from the large driver 274 of the first one of the large I/O circuits 341 to the large receiver 275 of the second one of the large I/O circuits 341. Next, for the logic integrated-circuit (IC) chip 326 of the fifth type of chip package 305, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for the fifth type of chip package 305, a third one of the large I/O circuits 341 of its logic integrated-circuit (IC) chip 326 may have the large driver 274 as seen in FIG. 18A coupling to the large receiver 275 of a fourth one of the large I/O circuits 341 of its NVM IC chip 250 via one or more of the interconnection metal layers 27 of the FISD 101 of the bottom one of its first type of chip package 301, one of the through package vias (TPVs) 158 of the bottom one of its first type of chip package 301, one of the metal bumps or pillars 570 of the top one of its first type of chip package 301 and the interconnection metal layers 27 of the FISD 101 of the top one of its first type of chip package 301 for passing second CPM data used to program or configure the first type of memory cells 490 of one of the field programmable logic cells or elements (LCE) 2014 of its logic integrated-circuit (IC) chip 326 or the first type of memory cells 362 of one of the field programmable switch cells 258 or 379 of its logic integrated-circuit (IC) chip 326 from the large driver 274 of the third one of the large I/O circuits 341 to the large receiver 275 of the fourth one of the large I/O circuits 341. For the NVM IC chip 250 of the fifth type of chip package 305, the second CPM data may be encrypted by its cryptography block as second encrypted CPM data to be stored therein.

Sixth Type of Chip Package

Figure 41A:
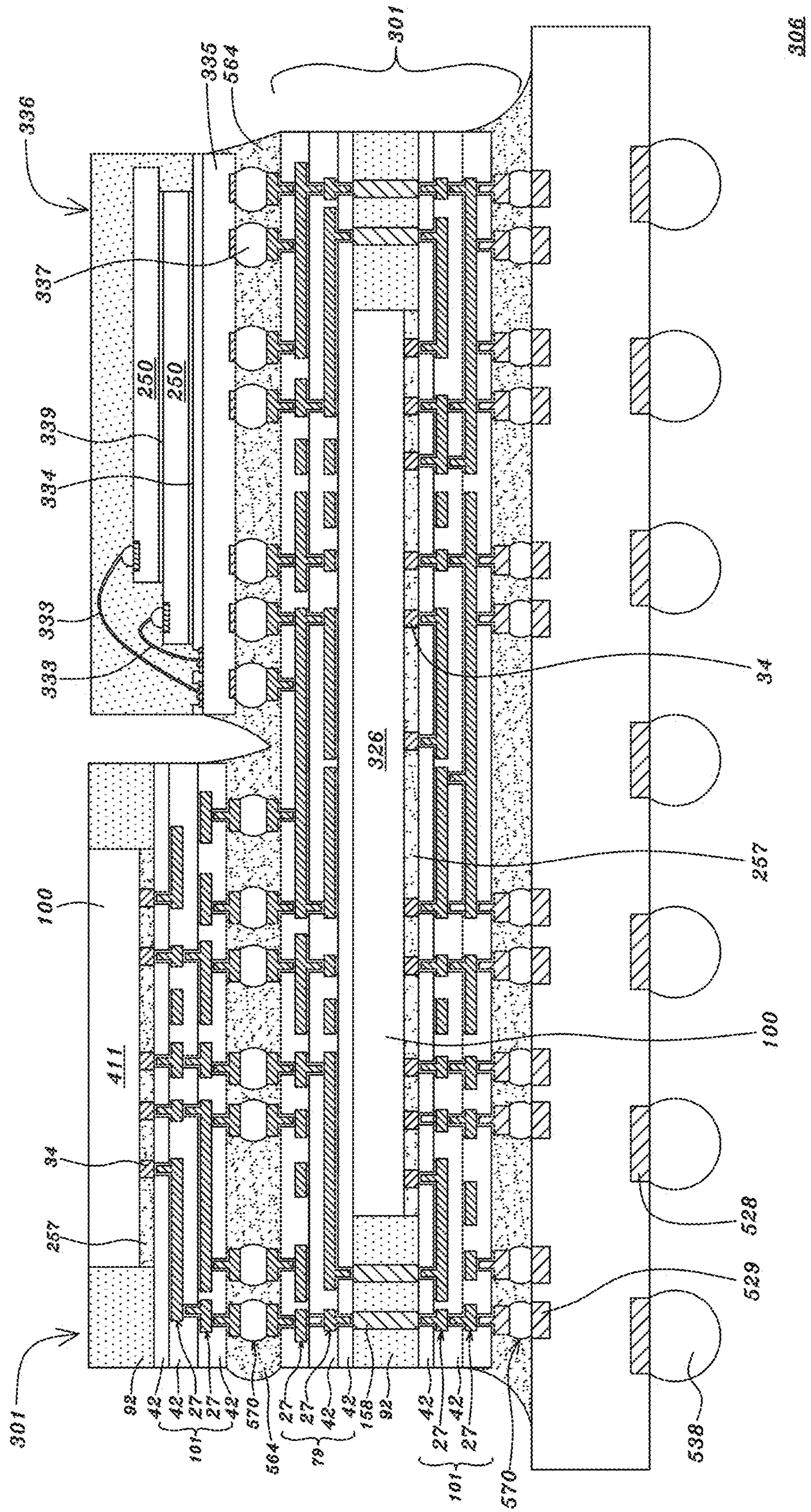
FIGS. 41A and 41B are schematically cross-sectional views showing a sixth type of chip package in accordance with various embodiments of the present application.

FIG. 41A is a schematically cross-sectional view showing a sixth type of chip package in accordance with an embodiment of the present application. Referring to FIG. 41A, the sixth type of chip package 306 may include two first type of chip packages 301, each of which may have the similar structure to that as illustrated in FIG. 36A, stacked with each other, i.e., top and bottom ones, and an non-volatile-memory (NVM) chip package 336 stacked on the bottom one of its first type of chip packages 301. For an element indicated by the same reference number shown in FIGS. 36A and 41A, the specification of the element as seen in FIG. 41A may be referred to that of the element as illustrated in FIG. 36A.

Referring to FIG. 41A, the non-volatile-memory (NVM) chip package 336 of the sixth type of chip package 306 may include (1) two non-volatile memory IC chips 250, each of which may be a NAND flash chip or NOR flash chip, stacked with each other and mounted to each other via an adhesive layer 511 such as silver paste or an heat conductive paste, wherein an upper one of the non-volatile memory IC chips 250 may overhang from an edge of a lower one of the non-volatile memory IC chips 250, (2) a circuit board 335 under the non-volatile memory IC chips 250 to have the lower one of the non-volatile memory IC chips 250 to be attached to a top surface thereof via an adhesive layer 334 such as silver paste or an heat conductive paste, (3) multiple wirebonded wires 333 each coupling one of the non-volatile memory IC chips 250 to the circuit board 335, (4) a molded polymer 332 over the circuit board 335, encapsulating the non-volatile memory IC chips 250 and wirebonded wires 333 and (5) multiple solder balls 337 at the bottom thereof each attached to one of the metal pads 583 of the bottom one of the first type of chip packages 301 of the sixth type of chip package 306.

Referring to FIG. 41A, for the top one of the first type of chip packages 301 of the sixth type of chip package 306, the BISD 79 and through package vias (TPVs) 158 as illustrated in FIG. 36A may be saved, and each of its metal bumps or pillars 570 may be bonded to one the metal pads 583 of the bottom one of the first type of chip packages 301 of the sixth type of chip package 306. For the sixth type of chip package 306, the bottom one of its first type of chip packages 301 may include one or more first type of semiconductor chips 100 used for logic integrated-circuit (IC) chips 326, such as FPGA IC chip, graphic-processing unit (GPU) chip, central-processing-unit (CPU) chip or digital-signal-processing (DSP) chip, and the top one of its first type of chip packages 301 may include one or more first type of semiconductor chips 100 used for one or more cooperating and supporting (CS) IC chips 411 as illustrated in FIG. 29. The sixth type of chip package 306 may further include (1) a ball-grid-array (BGA) substrate 537 having multiple metal pads 529 at a top surface thereof and multiple metal pads 528 at a bottom surface thereof, wherein the bottom one of its first type of chip packages 301 may have the metal bumps or pillars 570 bonded respectively to the metal pads 529 of its ball-grid-array (BGA) substrate 537, (2) multiple solder balls 538 each on one of the metal pads 528 of its ball-grid-array (BGA) substrate 537, (3) an underfill 564 between the top and bottom ones of its first type of chip packages 301, covering a sidewall of each of the metal bumps or pillars 570 of the top one of its first type of chip packages 301, (4) an underfill 564 between its non-volatile-memory (NVM) chip package 336 and the bottom one of its first type of chip packages 301, covering a sidewall of each of the solder balls 337 of its NVM chip package 336, and (5) an underfill 564 between the bottom one of its first type of chip packages 301 and its ball-grid-array (BGA) substrate 537, covering a sidewall of each of the metal bumps or pillars 570 of the bottom one of its first type of chip packages 301.

Referring to FIG. 41A, for the sixth type of chip package 306, in the case that its logic integrated-circuit (IC) chip 326 is the FPGA IC chip 200 as illustrated in FIG. 27, a first one of the large I/O circuits 341 of one of its NVM IC chips 250 may have the large driver 274 as see in FIG. 18A coupling to the large receiver 275 of a second one of the large I/O circuits 341 of its CS IC chip 411 via one of the wirebonded wires 333 of its NVM chip package 336, the circuit board 335 of its NVM chip package 336, one of the solder balls 337 of its NVM chip package 336, one or more of the interconnection metal layers 27 of the BISD 79 of the bottom of its first type of chip packages 301, one of the metal bumps or pillars 570 of the top one of its first type of chip package 301, and the interconnection metal layers 27 of the FISD 101 of the top one of its first type of chip package 301 for passing first encrypted CPM data from the large driver 274 of the first one of the large I/O circuits 341 to the large receiver 275 of the second one of the large I/O circuits 341. Next, the first encrypted CPM data may be decrypted as illustrated in FIG. 29 by the cryptography block 517 of its CS IC chip 411 as first decrypted CPM data. Next, a first one of the small I/O circuits 203 of its CS IC chip 411 may have the small driver 374 as seen in FIG. 18B coupling to the small receiver 375 of a second one of the small I/O circuits 203 of its logic integrated-circuit (IC) chip 326 via the interconnection metal layers 27 of the FISD 101 of the top one of its first type of chip package 301, one of the metal bumps or pillars 570 of the top one of its first type of chip package 301, the interconnection metal layers 27 of the BISD 79 of the bottom of its first type of chip packages 301, one of the through package vias (TPVs) 158 of the bottom one of its first type of chip package 301 and one or more of the interconnection metal layers 27 of the FISD 101 of the bottom one of its first type of chip package 301 for passing the first decrypted CPM data from the small driver 374 of the first one of the small I/O circuits 203 to the small receiver 375 of the second one of the small I/O circuits 203. Next, for the logic integrated-circuit (IC) chip 326 of the bottom one of the first type of chip package 301 of the sixth type of chip package 306, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for the sixth type of chip package 306, a third one of the small I/O circuits 203 of its logic integrated-circuit (IC) chip 326 may have the small driver 374 as seen in FIG. 18B coupling to the small receiver 375 of a fourth one of the small I/O circuits 203 of its CS IC chips 411 via one or more of the interconnection metal layers 27 of the FISD 101 of the bottom one of its first type of chip package 301, one of the through package vias (TPVs) 158 of the bottom one of its first type of chip package 301, the interconnection metal layers 27 of the BISD 79 of the bottom of its first type of chip packages 301, one of the metal bumps or pillars 570 of the top one of its first type of chip package 301 and the interconnection metal layers 27 of the FISD 101 of the top one of its first type of chip package 301 for passing second CPM data used to program or configure the first type of memory cells 490 of one of the field programmable logic cells or elements (LCE) 2014 of its logic integrated-circuit (IC) chip 326 or the first type of memory cells 362 of one of the field programmable switch cells 258 or 379 of its logic integrated-circuit (IC) chip 326 from the small driver 374 of the third one of the small I/O circuits 203 to the small receiver 375 of the fourth one of the small I/O circuits 203. Next, the second CPM data may be encrypted as illustrated in FIG. 29 by the cryptography block 517 of its CS IC chip 411 as second encrypted CPM data. Next, a third one of the large I/O circuits 341 of its CS IC chips 411 may have the large driver 274 as see in FIG. 18A coupling to the large receiver 275 of a fourth one of the large I/O circuits 341 of one of its NVM IC chips 250 via the interconnection metal layers 27 of the FISD 101 of the top one of its first type of chip package 301, one of the metal bumps or pillars 570 of the top one of its first type of chip package 301, and the interconnection metal layers 27 of the FISD 101 of the top one of its first type of chip package 301, one or more of the interconnection metal layers 27 of the BISD 79 of the bottom of its first type of chip packages 301, one of the solder balls 337 of its NVM chip package 336, the circuit board 335 of its NVM chip package 336, and one of the wirebonded wires 333 of its NVM chip package 336 for passing the second encrypted CPM data from the large driver 274 of the third one of the large I/O circuits 341 to the large receiver 275 of the fourth one of the large I/O circuits 341 to be stored in one of its NVM IC chips 250.

Referring to FIG. 41A, for the sixth type of chip package 306, its CS IC chip 411 may include the regulating block 415 as seen in FIG. 29 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its logic integrated-circuit (IC) chip 326 and/or each of its NVM IC chips 250.

Referring to FIG. 41A, for the sixth type of chip package 306, each of its one or more CS IC chips 411 may include a buffer and/or driver circuits for downloading the resulting values from each of its non-volatile memory (NVM) IC chips 250 to the memory cells 490 of each of its one or more logic integrated-circuit (IC) chips 326 in case of FPGA IC chips 200 as illustrated in FIGS. 19 and 20A-20L and downloading the programmable codes from each of its non-volatile memory (NVM) IC chips 250 to the memory cells 362 of each of its one or more logic integrated-circuit (IC) chips 326 in case of FPGA IC chips 200 as illustrated in FIGS. 15A-15C, 16A, 16B and 21. The buffer and/or driver circuits of said each of its one or more CS IC chips 411 may latch data associated with the resulting values and programmable codes from each of its non-volatile memory (NVM) IC chips 250 and amplify the data to the memory cells 490 and/or 362 of each of its one or more logic integrated-circuit (IC) chips 326 with an increased bit width of the data. For example, the data from each of its non-volatile memory (NVM) IC chips 250 to each of its one or more CS IC chips 411 may have a bit-width of 1 bit in a standard of serial advanced technology attachment (SATA), and the buffer of said each of its one or more CS IC chips 411 may latch the data in multiple memory cells, i.e., SRAM cells, therein. Next, the buffer of said each of its one or more CS IC chips 411 may simultaneously output and amplify the data in parallel to the memory cells 490 and/or 362 of each of its one or more logic integrated-circuit (IC) chips 326 with an increased bit width of equal to or more than 4, 8, 16, 32 or 64 for example. For another example, the data from each of its non-volatile memory (NVM) IC chips 250 to each of its one or more CS IC chips 411 may have a bit-width of 32 bit in a standard of peripheral component interconnect express (PCIe), and the buffer of said each of its one or more CS IC chips 411 may latch the data in multiple memory cells, i.e., SRAM cells, therein. Next, the buffer of said each of its one or more CS IC chips 411 may simultaneously output and amplify the data in parallel to the memory cells 490 and/or 362 of each of its one or more logic integrated-circuit (IC) chips 326 with an increased bit width of equal to or more than 64, 128, or 256 for example.

Referring to FIG. 41A, for the sixth type of chip package 306, each of its CS IC chips 411 may include multiple small I/O circuits 203, each of which may be referred to the specification as illustrated in FIG. 18B, each coupling to one of multiple small I/O circuits 203 of its logic integrated-circuit (IC) chip 326, each of which may be referred to the specification as illustrated in FIG. 18B, through, in sequence, the interconnection metal layers 27 of the FISD 101 of the top one of its first type of chip packages 301, one of the metal bumps or pillars 570 of the top one of its first type of chip packages 301, the interconnection metal layers 27 of the BISD 79 of the bottom one of its first type of chip packages 301, one of the through package vias (TPVs) 158 of the bottom one of its first type of chip packages 301 and one or more of the interconnection metal layers 27 of the FISD 101 of the bottom one of its first type of chip packages 301. Each of its CS IC chips 411 may include multiple large I/O circuits 341, each of which may be referred to the specification as illustrated in FIG. 18A, each coupling to (1) an external circuit of the sixth type of chip package 306 through, in sequence, the interconnection metal layers 27 of the FISD 101 of the top one of its first type of chip packages 301, one of the metal bumps or pillars 570 of the top one of its first type of chip packages 301, the interconnection metal layers 27 of the BISD 79 of the bottom one of its first type of chip packages 301, one of the through package vias (TPVs) 158 of the bottom one of its first type of chip packages 301, the interconnection metal layers 27 of the FISD 101 of the bottom one of its first type of chip packages 301 and one of the metal bumps or pillars 570 of the bottom one of its first type of chip packages 301, or (2) one of multiple large I/O circuits 341 of one of its NVM IC chips 250, each of which may be referred to the specification as illustrated in FIG. 18A, through, in sequence, the interconnection metal layers 27 of the FISD 101 of the top one of its first type of chip packages 301, one of the metal bumps or pillars 570 of the top one of its first type of chip packages 301, one or more of the interconnection metal layers 27 of the BISD 79 of the bottom one of its first type of chip packages 301, one of the solder balls 337 of its non-volatile-memory (NVM) chip package 336, the circuit board 335 of its non-volatile-memory (NVM) chip package 336 and one of the wirebonded wires 333 of its non-volatile-memory (NVM) chip package 336. A voltage (Vcc) of power supply supplied for each of the large I/O circuits 341 of each of its CS IC chips 411 may be higher than that supplied for each of the small I/O circuits 203 of said each of its CS IC chips 411 and that supplied for each of the small I/O circuits 203 of its logic integrated-circuit (IC) chip 326, wherein the voltage (Vcc) of power supply supplied for each of the small I/O circuits 203 of said each of its CS IC chips 411 may be the same as that supplied for each of the small I/O circuits 203 of its logic integrated-circuit (IC) chip 326. Further, gate oxide of each of the large I/O circuits 341 of each of its CS IC chips 411 may have a greater thickness than that of each of the small I/O circuits 203 of said each of its CS IC chips 411.

Referring to FIGS. 30A, 30B and 41A, for the sixth type of chip package 306, each of its CS IC chips 411 may include the hard macros 419 as illustrated in FIG. 29. The hard macros 419 of each of its CS IC chips 411 may be divided into two groups: each of the hard macros 419 of each of its CS IC chips 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its logic integrated-circuit (IC) chip 326 in case of the FPGA IC chip 200 as illustrated in FIG. 19 through, in sequence, one of the small I/O circuits 203 of said each of its CS IC chips 411, the interconnection metal layers 27 of the FISD 101 of the top one of its first type of chip packages 301, one of the metal bumps or pillars 570 of the top one of its first type of chip packages 301, the interconnection metal layers 27 of the BISD 79 of the bottom one of its first type of chip packages 301, one of the through package vias (TPVs) 158 of the bottom one of its first type of chip packages 301, one or more of the interconnection metal layers 27 of the FISD 101 of the bottom one of its first type of chip packages 301, one of the small I/O circuits 203 of its logic integrated-circuit (IC) chip 326 and one or more of the field programmable switch cells 252 or 379 of its logic integrated-circuit (IC) chip 326 in case of the FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its logic integrated-circuit (IC) chip 326 through, in sequence, one or more of the field programmable switch cells 252 or 379 of its logic integrated-circuit (IC) chip 326, one of the small I/O circuits 203 of its logic integrated-circuit (IC) chip 326, one or more of the interconnection metal layers 27 of the FISD 101 of the bottom one of its first type of chip packages 301, one of the through package vias (TPVs) 158 of the bottom one of its first type of chip packages 301, the interconnection metal layers 27 of the BISD 79 of the bottom one of its first type of chip packages 301, one of the metal bumps or pillars 570 of the top one of its first type of chip packages 301, the interconnection metal layers 27 of the FISD 101 of the top one of its first type of chip packages 301 and one of the small I/O circuits 203 of said each of its CS IC chips 411. Each of the hard macros 419 of said each of its CS IC chips 411 in a second group may be a phase locked loop (PLL) circuit or digital clock manager (DCM) configured to generate a clock signal to be passed to the D-type flip-flop circuit 2034 or 2039 of its logic integrated-circuit (IC) chip 326 in case of the FPGA IC chip 200 as illustrated in FIG. 20K or 20L through, in sequence, one of the small I/O circuits 203 of said each of its CS IC chips 411, the interconnection metal layers 27 of the FISD 101 of the top one of its first type of chip packages 301, one of the metal bumps or pillars 570 of the top one of its first type of chip packages 301, the interconnection metal layers 27 of the BISD 79 of the bottom one of its first type of chip packages 301, one of the through package vias (TPVs) 158 of the bottom one of its first type of chip packages 301, one or more of the interconnection metal layers 27 of the FISD 101 of the bottom one of its first type of chip packages 301 and one of the small I/O circuits 203 of its logic integrated-circuit (IC) chip 326.

Figure 41B:
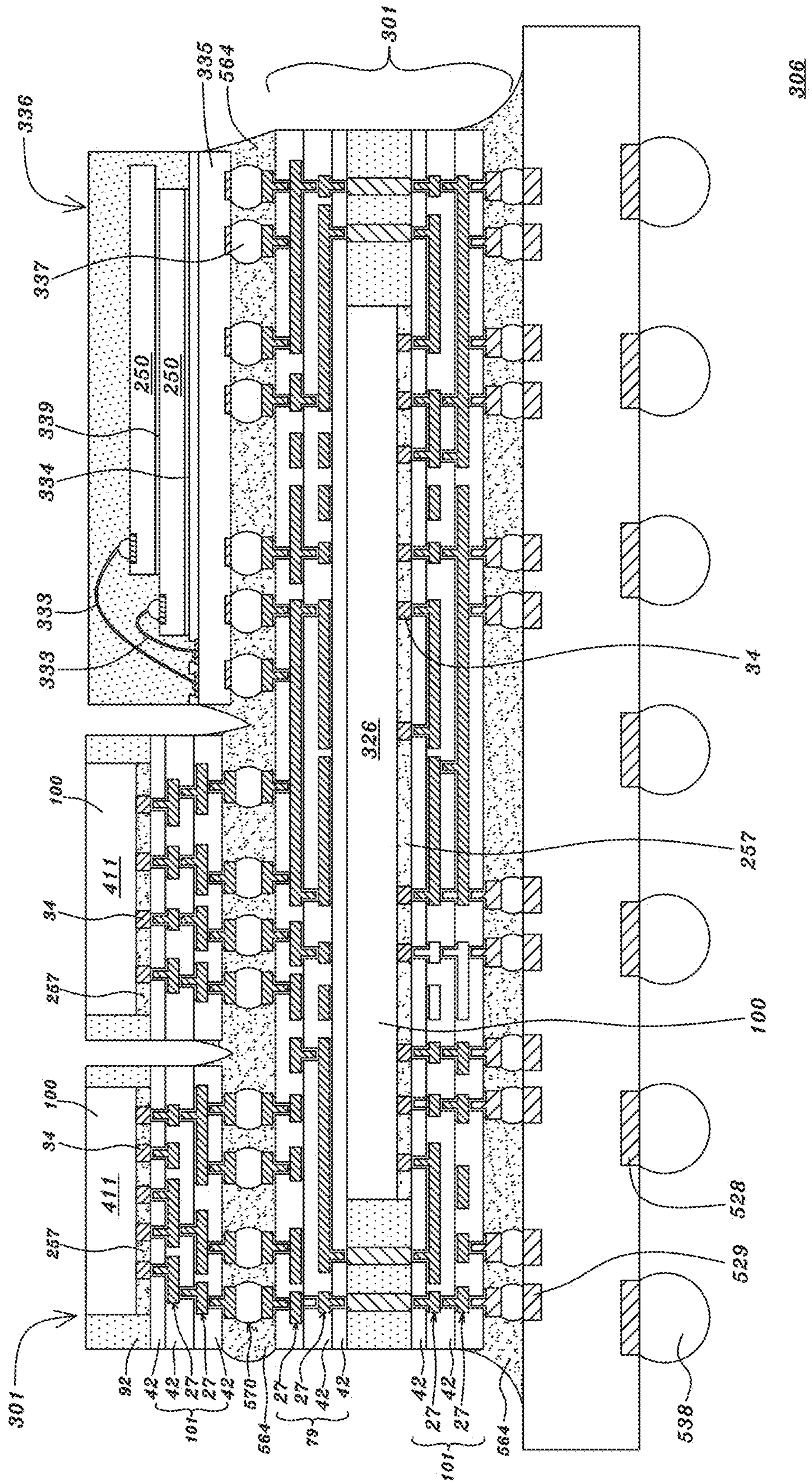

Alternatively, FIG. 41B is a schematically cross-sectional view showing a sixth type of chip package in accordance with another embodiment of the present application. The sixth type of chip package 306 as seen in FIG. 41B may have a similar structure to the sixth type of chip package 306 as seen in FIG. 41A. For an element indicated by the same reference number shown in FIGS. 41A and 41B, the specification of the element as seen in FIG. 41B may be referred to that of the element as illustrated in FIG. 41A. The difference therebetween is that multiple first type of chip packages 301 as illustrated in FIG. 36A, i.e., top ones, may be stacked over the bottom of its first type of chip packages 301. For each of the top ones of the first type of chip packages 301 of the sixth type of chip package 306, the BISD 79 and through package vias (TPVs) 158 as illustrated in FIG. 36A may be saved, and each of its metal bumps or pillars 570 may be bonded to one the metal pads 583 of the bottom one of the first type of chip packages 301 of the sixth type of chip package 306. For the sixth type of chip package 306, each of the top ones of its first type of chip packages 301 may include one or more first type of semiconductor chips 100 used for one or more cooperating and supporting (CS) IC chips 411 as illustrated in FIG. 29. The CS IC chips 411 of the top ones of its first type of chip packages 301 as seen in FIG. 41B may be combined to perform functions like the CS IC chip 411 of the top one of the first type of chip packages 301 of the sixth type of the chip package 306 as illustrated in FIG. 41A. Each of its CS IC chips 411 may provide the same function as the CS IC chip 411 as illustrated in FIG. 41A. The sixth type of chip package 306 may further include an underfill 564 between each of the top ones of its first type of chip packages 301 and the bottom one of its first type of chip packages 301, covering a sidewall of each of the metal bumps or pillars 570 of said each of the top ones of its first type of chip packages 301.

Seventh Type of Chip Package

Figure 42:
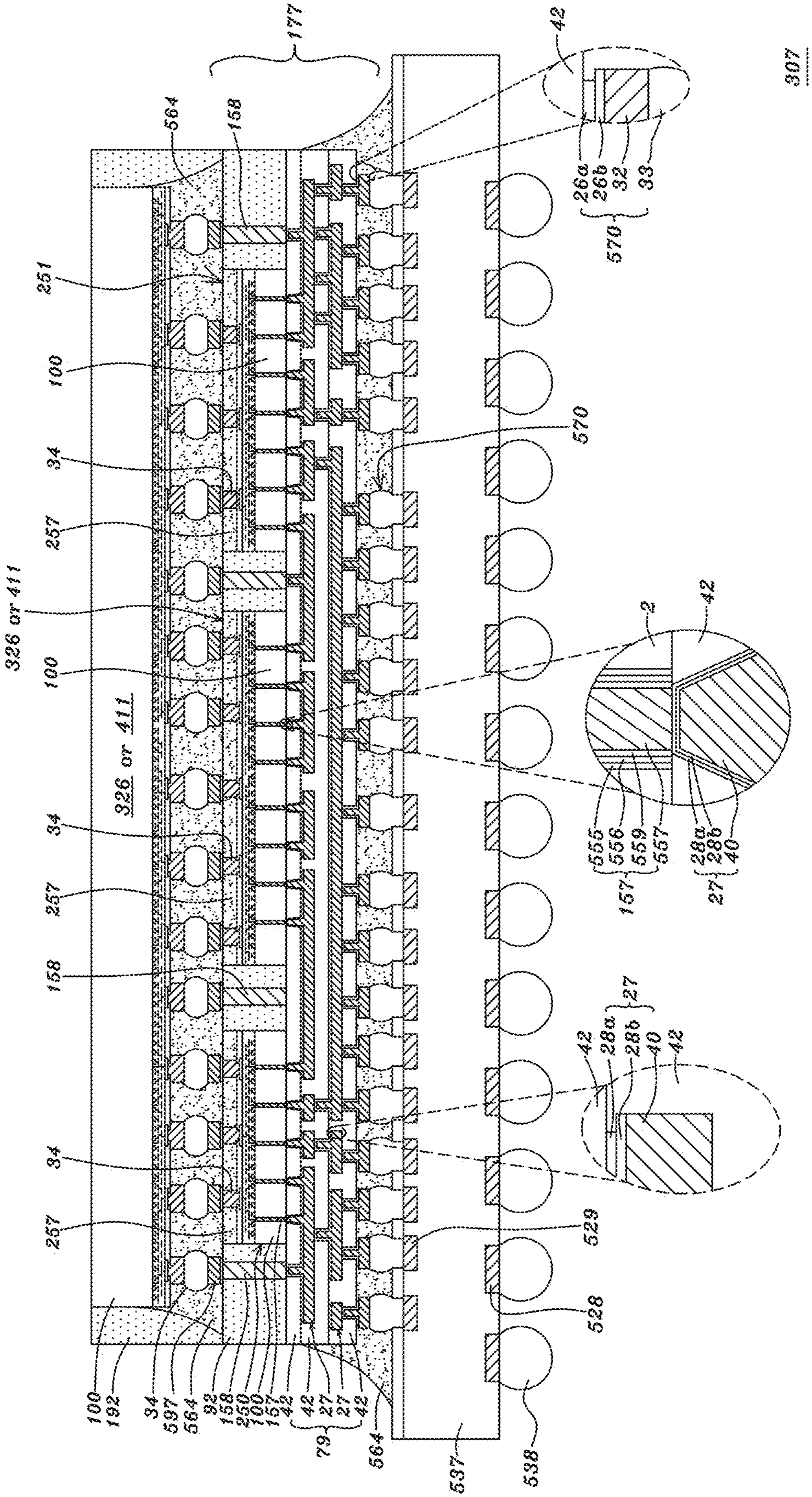
FIGS. 42-44 are schematically cross-sectional views showing seventh through ninth types of chip packages respectively in accordance with an embodiment of the present application.

FIG. 42 is a schematically cross-sectional view showing a seventh type of chip package in accordance with an embodiment of the present application.

1. First Alternative

Referring to FIG. 42, the seventh type of chip package 307 for a first alternative may be provided with a chip embedded substrate 177, i.e., chip package, including multiple second type of semiconductor chips 100 arranged in a horizontal level, wherein each of its second type of semiconductor chips 100 may have the same specification as illustrated in FIG. 34B, and each of its second type of semiconductor chips 100 may be an NVM IC chip 250, such as NAND or NOR flash chip, MRAM IC chip or RRAM IC chip, an HBM IC chip 251, such as SRAM IC chip or DRAM IC chip, or a CS IC chip 411 as illustrated in FIG. 29. For Example, for the chip embedded substrate 177 of the seventh type of chip package 307, a left one of its second type of semiconductor chips 100 may be the NVM IC chip 250, a middle one of its second type of semiconductor chips 100 may be the CS IC chip 411, and a right one of its second type of semiconductor chips 100 may be the HBM IC chip 251. Each of its second type of semiconductor chips 100 may further include a polymer layer 257 on the topmost one of the polymer layers 42 of its second interconnection scheme for a chip (SISC) 29 as seen in FIG. 34B. The chip embedded substrate 177 of the seventh type of chip package 307 may further include (1) a polymer layer 92, such as molding compound, epoxy-based material or polyimide, filled into multiple gaps each between neighboring two of its second type of semiconductor chips 100, wherein its polymer layer 92 may have a top surface coplanar to a top surface of the polymer layer 257 of each of its second type of semiconductor chips 100 and a top surface of each of the first type of micro-bumps or micro-pillars 34 of each of its second type of semiconductor chips 100, (2) multiple through package vias (TPVs) 158 in its polymer layer 92, wherein each of its through package vias (TPVs) 158 may be made of a copper layer having a height between 20 μm and 300 μm 30 μm and 200 μm, 50 μm and 150 μm, 50 μm and 120 μm, 20 μm and 100 μm, 20 μm and 60 μm, 20 μm and 40 μm, or 20 μm and 30 μm, or greater than or equal to 100 μm, 50 μm, 30 μm or 20 μm, and may have a top surface coplanar to the top surface of its polymer layer 92 and (3) a backside interconnection scheme for a logic drive or device (BISD) 79 under its second type of semiconductor chips 100, polymer layer 92 and through package vias (TPVs) 158.

Referring to FIG. 42, for each of the second type of semiconductor chips 100 of the chip embedded substrate 177 of the seventh type of chip package 307 for the first alternative, its semiconductor substrate 2 may have a portion at a backside thereof removed by a chemical-mechanical-polishing (CMP) or mechanical grinding process such that each of its through silicon vias (TSVs) 157, that is, the electroplated copper layer 156 thereof, may have a backside substantially coplanar to the backside of its semiconductor substrate 2 and a bottom surface of the polymer layer 92 of the chip embedded substrate 177 of the seventh type of chip package 307.

Referring to FIG. 42, the BISD 79 of the chip embedded substrate 177 of the seventh type of chip package 307 for the first alternative may be provided with one or more interconnection metal layers 27 coupling to each of the through silicon vias (TSVs) 157 of each of the second type of semiconductor chips 100 of the chip embedded substrate 177 of the seventh type of chip package 307 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the chip embedded substrate 177 of the seventh type of chip package 307, the topmost one of the polymer layers 42 of its BISD 79 may have a top surface in contact with the bottom surface of its polymer layer 92. The topmost one of the polymer layers 42 of its BISD 79 may be between the topmost one of the interconnection metal layers 27 of its BISD 79 and its polymer layer 92 and between the topmost one of the interconnection metal layers 27 of its BISD 79 and the backside of each of its second type of semiconductor chips 100, wherein each opening in the topmost one of polymer layers 42 of its BISD 79 may be under one of the through silicon vias (TSVs) 157 of one of its second type of semiconductor chips 100 or one of its through package vias (TPVs) 158, and thus the topmost one of the interconnection metal layers 27 of its BISD 79 may extend through said each opening to couple to said one of the through silicon vias (TSVs) 157 or said one of its through package vias (TPVs) 158. Each of the interconnection metal layers 27 of its BISD 79 may extend horizontally across an edge of each of its second type of semiconductor chips 100. The bottommost one of the interconnection metal layers 27 of its BISD 79 may have multiple metal pads at tops of multiple respective openings **42*a* in the bottommost one of the polymer layers 42 of its BISD 79. The specification and process for the interconnection metal layers 27 and polymer layers 42 for the backside interconnection scheme for a logic drive or device (BISD) 79 may be referred to those for the SISC 29 as illustrated in FIG. 34**A.

Referring to FIG. 42, the chip embedded substrate 177 of the seventh type of chip package 307 for the first alternative may further include multiple metal bumps or pillars 570 in an array at a bottom thereof, each having various types, i.e., first, second, third and fourth types, which may have the same specification as that of the first, second, third and fourth types of micro-bump or micro-pillars 34 respectively as illustrated in FIG. 34A. Each of the first, second, third or fourth metal bumps or pillars 570 may have the adhesion layer 26*a* on a bottom surface of one of the metal pads of the bottommost one of the interconnection metal layers 27 of its BISD 79.

Referring to FIG. 42, the seventh type of chip package 307 for the first alternative may further include (1) a first type of semiconductor chip 100 over its chip embedded substrate 177, wherein its first type of semiconductor chip 100 may have the same specification as illustrated in FIG. 34A and may be used for a logic integrated-circuit (IC) chip 326, such as FPGA IC chip, graphic-processing unit (GPU) chip, central-processing-unit (CPU) chip or digital-signal-processing (DSP) chip. For the seventh type of chip package 307, its logic integrated-circuit (IC) chip 326 may have the first, second, third or fourth type of micro-bumps or micro-pillars 34 as illustrated in FIG. 34A each bonded to a metal pad 597, such as copper pad, preformed on the top surface of one of the first type of micro-bumps or micro-pillars 34 of one of the second type of semiconductor chips 100 of its chip embedded substrate 177 or the top surface of one of the through package vias (TPVs) 158 of its chip embedded substrate 177, (2) an underfill 564, i.e., polymer layer, between its logic integrated-circuit (IC) chip 326 and its chip embedded substrate 177, covering a sidewall of each of the first, second, third or fourth type of micro-bumps or micro-pillars 34 of its logic integrated-circuit (IC) chip 326, (3) a polymer layer 192, such as molding compound, epoxy-based material or polyimide, on its chip embedded substrate 177 and around its logic integrated-circuit (IC) chip 326, wherein its polymer layer 192 has a top surface coplanar to a top surface of its logic integrated-circuit (IC) chip 326, (4) a ball-grid-array (BGA) substrate 537 having multiple metal pads 529 at a top surface thereof and multiple metal pads 528 at a bottom surface thereof, wherein its chip embedded substrate 177 may have the metal bumps or pillars 570 bonded respectively to the metal pads 529 of its ball-grid-array (BGA) substrate 537, (5) multiple solder balls 538 each on one of the metal pads 528 of its ball-grid-array (BGA) substrate 537, and (6) an underfill 564 between its chip embedded substrate 177 and its ball-grid-array (BGA) substrate 537, covering a sidewall of each of the metal bumps or pillars 570 of its chip embedded substrate 177.

Referring to FIG. 42, for the seventh type of chip package 307 for the first alternative, in the case that its logic integrated-circuit (IC) chip 326 is the FPGA IC chip 200 as illustrated in FIG. 27, a first one of the large I/O circuits 341 of its NVM IC chip 250 may have the large driver 274 as see in FIG. 18A coupling to the large receiver 275 of a second one of the large I/O circuits 341 of its CS IC chip 411 via one of the through silicon vias (TSVs) of its NVM IC chip 250, one or more of the interconnection metal layers 27 of the BISD 79 of its chip embedded substrate 177 and one of the through silicon vias (TSVs) of its CS IC chip 411 for passing first encrypted CPM data from the large driver 274 of the first one of the large I/O circuits 341 to the large receiver 275 of the second one of the large I/O circuits 341. Next, the first encrypted CPM data may be decrypted as illustrated in FIG. 29 by the cryptography block 517 of its CS IC chip 411 as first decrypted CPM data. Next, a first one of the small I/O circuits 203 of its CS IC chip 411 may have the small driver 374 as seen in FIG. 18B coupling to the small receiver 375 of a second one of the small I/O circuits 203 of its logic integrated-circuit (IC) chip 326 via one of the first, second, third or fourth type of micro-bumps or micro-pillars 34 of its logic integrated-circuit (IC) chip 326 for passing the first decrypted CPM data from the small driver 374 of the first one of the small I/O circuits 203 to the small receiver 375 of the second one of the small I/O circuits 203. Next, for the logic integrated-circuit (IC) chip 326 of the seventh type of chip package 307, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for the seventh type of chip package 307, a third one of the small I/O circuits 203 of its logic integrated-circuit (IC) chip 326 may have the small driver 374 as seen in FIG. 18B coupling to the small receiver 375 of a fourth one of the small I/O circuits 203 of its CS IC chips 411 via one of the first, second, third or fourth type of micro-bumps or micro-pillars 34 of its logic integrated-circuit (IC) chip 326 for passing second CPM data used to program or configure the first type of memory cells 490 of one of the field programmable logic cells or elements (LCE) 2014 of its logic integrated-circuit (IC) chip 326 or the first type of memory cells 362 of one of the field programmable switch cells 258 or 379 of its logic integrated-circuit (IC) chip 326 from the small driver 374 of the third one of the small I/O circuits 203 to the small receiver 375 of the fourth one of the small I/O circuits 203. Next, the second CPM data may be encrypted as illustrated in FIG. 29 by the cryptography block 517 of its CS IC chip 411 as second encrypted CPM data. Next, a third one of the large I/O circuits 341 of its CS IC chips 411 may have the large driver 274 as see in FIG. 18A coupling to the large receiver 275 of a fourth one of the large I/O circuits 341 of its NVM IC chip 250 via one of the through silicon vias (TSVs) of its CS IC chip 411, one or more of the interconnection metal layers 27 of the BISD 79 of its chip embedded substrate 177 and one of the through silicon vias (TSVs) of its NVM IC chip 250 for passing the second encrypted CPM data from the large driver 274 of the third one of the large I/O circuits 341 to the large receiver 275 of the fourth one of the large I/O circuits 341 to be stored in its NVM IC chip 250.

Referring to FIG. 42, for the seventh type of chip package 307 for the first alternative, its CS IC chip 411 may include the regulating block 415 as seen in FIG. 29 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its logic integrated-circuit (IC) chip 326, its NVM IC chip 250 and/or its NVM IC chip 250.

Referring to FIG. 42, for the seventh type of chip package 307 for the first alternative, its HBM IC chip 251 may have a set of small I/O circuits 203, each laving the same specification as illustrated in FIG. 18B, coupling respective to a set of small I/O circuits 203 of its logic integrated-circuit (IC) chip 326 through a set of first, second, third or fourth type of micro-bumps or micro-pillars 34 of its logic integrated-circuit (IC) chip 326 for data transmission with a data bit width of equal to or greater than 64, 128, 256, 512, 1024, 2048, 4096, 8K, or 16K.

Referring to FIG. 42, for the seventh type of chip package 307, its CS IC chip 411 may include a buffer and/or driver circuits for downloading the resulting values from its non-volatile memory (NVM) IC chip 250 to the memory cells 490 of its logic integrated-circuit (IC) chip 326 in case of an FPGA IC chip 200 as illustrated in FIGS. 19 and 20A-20L and downloading the programmable codes from its non-volatile memory (NVM) IC chip 250 to the memory cells 362 of its logic integrated-circuit (IC) chip 326 in case of an FPGA IC chip 200 as illustrated in FIGS. 15A-15C, 16A, 16B and 21. The buffer and/or driver circuits of its CS IC chip 411 may latch data associated with the resulting values and programmable codes from its non-volatile memory (NVM) IC chip 250 and amplify the data to the memory cells 490 and/or 362 of its logic integrated-circuit (IC) chip 326 with an increased bit width of the data. For example, the data from its non-volatile memory (NVM) IC chip 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of its CS IC chip 411 may simultaneously output and amplify the data in parallel to the memory cells 490 and/or 362 of its logic integrated-circuit (IC) chip 326 with an increased bit width of equal to or more than 4, 8, 16, 32 or 64 for example. For another example, the data from its non-volatile memory (NVM) IC chip 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data in parallel to the memory cells 490 and/or 362 of its logic integrated-circuit (IC) chip 326 with an increased bit width of equal to or more than 64, 128, or 256 for example.

Alternatively, for the first alternative of the seventh type of chip package 307 for the first alternative, the FISD 101 as illustrated in FIGS. 36A-36C, 39, 40, 41A and 41B may be provided on its chip embedded substrate 177, including (1) one or more of the interconnection metal layers 27 over its chip embedded substrate 177 and coupling to each of the first type of micro-bumps or micro-pillars 34 of each of the second type of semiconductor chips 100 of its chip embedded substrate 177 and each of the through package vias (TPVs) 158 of its chip embedded substrate 177, and (2) one or more polymer layers 42, i.e., insulating dielectric layers, each between neighboring two of the interconnection metal layers 27 of its FISD 101. Its logic integrated-circuit (IC) chip 326 may have the first, second, third or fourth type of micro-bumps or micro-pillars 34 as illustrated in FIG. 34A each bonded to a metal pad, such as copper pad, preformed on a top surface of the topmost one of the interconnection metal layers 27 of its FISD 101 to couple to (1) one of the first type of micro-bumps or micro-pillars 34 of one of the second type of semiconductor chips 100 of its chip embedded substrate 177 through the interconnection metal layers 27 of its FISD 101 or (2) one of the through package vias (TPVs) 158 of its chip embedded substrate 177 through the interconnection metal layers 27 of its FISD 101. Its underfill 564, i.e., polymer layer, may be formed between its logic integrated-circuit (IC) chip 326 and its FISD 101. Its polymer layer 192, such as molding compound, epoxy-based material or polyimide, may be formed on its FISD 101 and around its logic integrated-circuit (IC) chip 326, wherein its polymer layer 192 has a top surface coplanar to a top surface of its logic integrated-circuit (IC) chip 326.

Referring to FIG. 42, for the seventh type of chip package 307 for the first alternative, its CS IC chip 411 may include multiple small I/O circuits 203, each of which may be referred to the specification as illustrated in FIG. 18B, each coupling to one of multiple small I/O circuits 203 of its logic integrated-circuit (IC) chip 326, each of which may be referred to the specification as illustrated in FIG. 18B, through, in sequence, one of the first type of micro-bumps or micro-pillars 34 of its CS IC chip 411, one of its metal pad 597 and one of the first, second, third or fourth type of micro-bumps or micro-pillars 34 of its logic integrated-circuit (IC) chip 326. Its CS IC chip 411 may include multiple large I/O circuits 341, each of which may be referred to the specification as illustrated in FIG. 18A, each coupling to (1) an external circuit of the seventh type of chip package 307 through, in sequence, one of the through silicon vias (TSVs) 157 of its CS IC chip 411, the interconnection meta layers 27 of the BISD 79 of its chip embedded substrate 177, one of the metal bumps or pillars 570 of its chip embedded substrate 177, its ball-grid-array (BGA) substrate 537 and one of its solder balls 538, or (2) one of multiple large I/O circuits 341 of its NVM IC chip 250, each of which may be referred to the specification as illustrated in FIG. 18A, through, in sequence, one of the through silicon vias (TSVs) 157 of its CS IC chip 411, one or more of the interconnection meta layers 27 of the BISD 79 of its chip embedded substrate 177 and one of the through silicon vias (TSVs) 157 of its NVM IC chip 250. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of its logic integrated-circuit (IC) chip 326, wherein the voltage (Vcc) of power supply supplied for each of the small I/O circuits 203 of its CS IC chip 411 may be the same as that supplied for each of the small I/O circuits 203 of its logic integrated-circuit (IC) chip 326. Further, gate oxide of each of the large I/O circuits 341 of its CS IC chip 411 may have a greater thickness than that of each of the small I/O circuits 203 of its CS IC chip 411.

Referring to FIGS. 30A, 30B and 42, for the seventh type of chip package 307 for the first alternative, its CS IC chip 411 may include the hard macros 419 as illustrated in FIG. 29. The hard macros 419 of its CS IC chip 411 may be divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its logic integrated-circuit (IC) chip 326 in case of the FPGA IC chip 200 as illustrated in FIG. 19 through, in sequence, one of the small I/O circuits 203 of its CS IC chip 411, one of the first type of micro-bumps or micro-pillars 34 of its CS IC chip 411, one of its metal pad 597 and one of the first, second, third or fourth type of micro-bumps or micro-pillars 34 of its logic integrated-circuit (IC) chip 326, one of the small I/O circuits 203 of its logic integrated-circuit (IC) chip 326 and one or more of the field programmable switch cells 252 or 379 of its logic integrated-circuit (IC) chip 326 in case of the FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its logic integrated-circuit (IC) chip 326 through, in sequence, one or more of the field programmable switch cells 252 or 379 of its logic integrated-circuit (IC) chip 326, one of the small I/O circuits 203 of its logic integrated-circuit (IC) chip 326, one of the first, second, third or fourth type of micro-bumps or micro-pillars 34 of its logic integrated-circuit (IC) chip 326, one of its metal pad 597, one of the first type of micro-bumps or micro-pillars 34 of its CS IC chip 411 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its logic integrated-circuit (IC) chip 326 in case of the FPGA IC chip 200 as illustrated in FIG. 20K or 20L through, in sequence, one of the small I/O circuits 203 of its CS IC chip 411, one of the first type of micro-bumps or micro-pillars 34 of its CS IC chip 411, one of its metal pad 597 and one of the first, second, third or fourth type of micro-bumps or micro-pillars 34 of its logic integrated-circuit (IC) chip 326 and one of the small I/O circuits 203 of its logic integrated-circuit (IC) chip 326.

2. Second Alternative

Referring to FIG. 42, the difference between the seventh type of chip packages 307 for the first and second alternatives is that the logic integrated-circuit (IC) chip 326 of the seventh type of chip package 307 for the first alternative may be replaced with a CS IC chip 411 for the seventh type of chip package 307 for the second alternative, which may have the same specification as illustrated in FIG. 34A to perform the same function as the CS IC chip 411 of the seventh type of chip package 307 for the first alternative, while the CS IC chip 411 of the seventh type of chip package 307 for the first alternative may be replaced with a logic integrated-circuit (IC) chip 326 for the seventh type of chip package 307 for the second alternative, which may have the same specification as illustrated in FIG. 34B to perform the same function as the logic integrated-circuit (IC) chip 326 of the seventh type of chip package 307 for the first alternative. For an element indicated by the same reference number for the seventh type of chip packages 307 for the first and second alternatives, the specification of the element for the seventh type of chip package 307 for the second alternative may be referred to that of the element for the seventh type of chip package 307 for the first alternative. For the seventh type of chip package 307 for the second alternative, its logic integrated-circuit (IC) chip 326 may include multiple small I/O circuits 203, each of which may be referred to the specification as illustrated in FIG. 18B, each coupling to one of multiple small I/O circuits 203 of its CS IC chip 411, each of which may be referred to the specification as illustrated in FIG. 18B, through, in sequence, one of the first type of micro-bumps or micro-pillars 34 of its logic integrated-circuit (IC) chip 326, one of its metal pad 597 and one of the first, second, third or fourth type of micro-bumps or micro-pillars 34 of its CS IC chip 411. Its CS IC chip 411 may include multiple large I/O circuits 341, each of which may be referred to the specification as illustrated in FIG. 18A, each coupling to (1) an external circuit of the seventh type of chip package 307 through, in sequence, one of the first, second, third or fourth type of micro-bumps or micro-pillars 34 of its CS IC chip 411, one of its metal pad 597, one of the through package vias (TPVs) 158 of its chip embedded substrate 177, the interconnection meta layers 27 of the BISD 79 of its chip embedded substrate 177, one of the metal bumps or pillars 570 of its chip embedded substrate 177, its ball-grid-array (BGA) substrate 537 and one of its solder balls 538, or (2) one of multiple large I/O circuits 341 of its NVM IC chip 250, each of which may be referred to the specification as illustrated in FIG. 18A, through, in sequence, one of the first, second, third or fourth type of micro-bumps or micro-pillars 34 of its CS IC chip 411, one of its metal pad 597 and one of the first type of micro-bumps or micro-pillars 34 of its NVM IC chip 250. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of its logic integrated-circuit (IC) chip 326, wherein the voltage (Vcc) of power supply supplied for each of the small I/O circuits 203 of its CS IC chip 411 may be the same as that supplied for each of the small I/O circuits 203 of its logic integrated-circuit (IC) chip 326. Further, gate oxide of each of the large I/O circuits 341 of its CS IC chip 411 may have a greater thickness than that of each of the small I/O circuits 203 of its CS IC chip 411. The hard macros 419 of its CS IC chip 411 maybe divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its logic integrated-circuit (IC) chip 326 in case of the FPGA IC chip 200 as illustrated in FIG. 19 through, in sequence, one of the small I/O circuits 203 of its CS IC chip 411, one of the first, second, third or fourth type of micro-bumps or micro-pillars 34 of its CS IC chip 411, one of its metal pad 597, one of the first type of micro-bumps or micro-pillars 34 of its logic integrated-circuit (IC) chip 326, one of the small I/O circuits 203 of its logic integrated-circuit (IC) chip 326 and one or more of the field programmable switch cells 252 or 379 of its logic integrated-circuit (IC) chip 326 in case of the FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its logic integrated-circuit (IC) chip 326 through, in sequence, one or more of the field programmable switch cells 252 or 379 of its logic integrated-circuit (IC) chip 326, one of the small I/O circuits 203 of its logic integrated-circuit (IC) chip 326, one of the first type of micro-bumps or micro-pillars 34 of its logic integrated-circuit (IC) chip 326, one of its metal pads 597, one of the first, second, third or fourth type of micro-bumps or micro-pillars 34 of its CS IC chip 411 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its logic integrated-circuit (IC) chip 326 in case of the FPGA IC chip 200 as illustrated in FIG. 20K or 20L through, in sequence, one of the small I/O circuits 203 of its CS IC chip 411, one of the first, second, third or fourth type of micro-bumps or micro-pillars 34 of its CS IC chip 411, one of its metal pad 597, one of the first type of micro-bumps or micro-pillars 34 of its logic integrated-circuit (IC) chip 326 and one of the small I/O circuits 203 of its logic integrated-circuit (IC) chip 326.

Eighth Type of Chip Package

Figure 43:
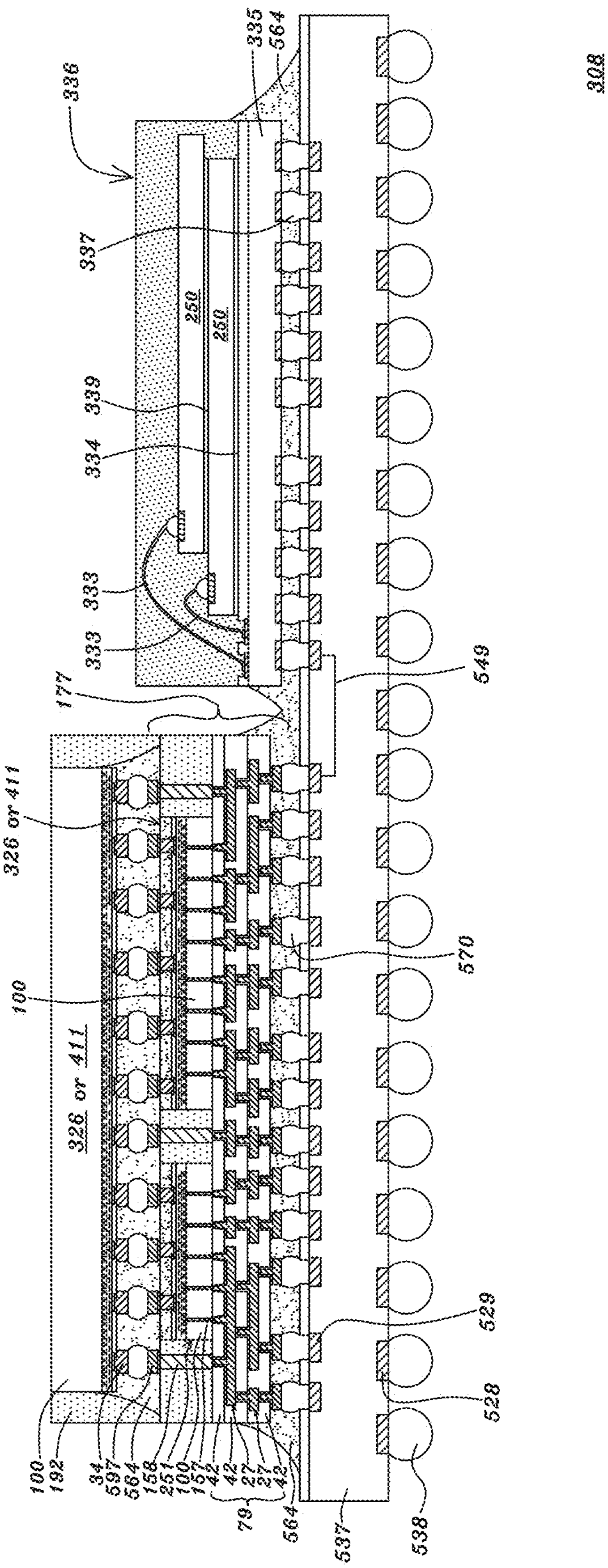

FIG. 43 is a schematically cross-sectional view showing an eighth type of chip package in accordance with an embodiment of the present application.

1. First Alternative

Referring to FIG. 43, the eighth type of chip package 308 for a first alternative may have a similar structure to the seventh type of chip package 307 for the first alternative as seen in FIG. 42. For an element indicated by the same reference number shown in FIGS. 42 and 43, the specification of the element as seen in FIG. 43 may be referred to that of the element as illustrated in FIG. 42. The difference therebetween is that the eighth type of chip package 308 may further include (1) the non-volatile-memory (NVM) chip package 336 as illustrated in FIG. 41A having the solder balls 337 each attached to one of the metal pads 529 of its ball-grid-array (BGA) substrate 537, and (2) an underfill 564 between its non-volatile-memory (NVM) chip package 336 and its ball-grid-array (BGA) substrate 537, covering a sidewall of each of the solder balls 337 of its NVM chip package 336. Furthermore, for the chip embedded substrate 177 of the eighth type of chip package 308, the NVM IC chip 250 as illustrated in FIG. 41 for the chip embedded substrate 177 of the seventh type of chip package 307 may be saved.

Referring to FIG. 43, for the eighth type of chip package 308 for the first alternative, in the case that its logic integrated-circuit (IC) chip 326 is the FPGA IC chip 200 as illustrated in FIG. 27, a first one of the large I/O circuits 341 of one of its NVM IC chips 250 may have the large driver 274 as see in FIG. 18A coupling to the large receiver 275 of a second one of the large I/O circuits 341 of its CS IC chip 411 via one of the wirebonded wires 333 of its NVM chip package 336, the circuit board 335 of its NVM chip package 336, one of the solder balls 337 of its NVM chip package 336, a metal line or trace 549 of its ball-grid-array (BGA) substrate 537, one of the metal bumps or pillars 570 of its chip embedded substrate 177, the interconnection metal layers 27 of its BISD of its chip embedded substrate 177 and one of the through silicon vias (TSVs) of its CS IC chip 411 for passing first encrypted CPM data from the large driver 274 of the first one of the large I/O circuits 341 to the large receiver 275 of the second one of the large I/O circuits 341. Next, the first encrypted CPM data may be decrypted as illustrated in FIG. 29 by the cryptography block 517 of its CS IC chip 411 as first decrypted CPM data. Next, a first one of the small I/O circuits 203 of its CS IC chip 411 may have the small driver 374 as seen in FIG. 18B coupling to the small receiver 375 of a second one of the small I/O circuits 203 of its logic integrated-circuit (IC) chip 326 via one of the first, second, third or fourth type of micro-bumps or micro-pillars 34 of its logic integrated-circuit (IC) chip 326 for passing the first decrypted CPM data from the small driver 374 of the first one of the small I/O circuits 203 to the small receiver 375 of the second one of the small I/O circuits 203. Next, for the logic integrated-circuit (IC) chip 326 of the seventh type of chip package 307, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for the seventh type of chip package 307, a third one of the small I/O circuits 203 of its logic integrated-circuit (IC) chip 326 may have the small driver 374 as seen in FIG. 18B coupling to the small receiver 375 of a fourth one of the small I/O circuits 203 of its CS IC chips 411 via one of the first, second, third or fourth type of micro-bumps or micro-pillars 34 of its logic integrated-circuit (IC) chip 326 for passing second CPM data used to program or configure the first type of memory cells 490 of one of the field programmable logic cells or elements (LCE) 2014 of its logic integrated-circuit (IC) chip 326 or the first type of memory cells 362 of one of the field programmable switch cells 258 or 379 of its logic integrated-circuit (IC) chip 326 from the small driver 374 of the third one of the small I/O circuits 203 to the small receiver 375 of the fourth one of the small I/O circuits 203. Next, the second CPM data may be encrypted as illustrated in FIG. 29 by the cryptography block 517 of its CS IC chip 411 as second encrypted CPM data. Next, a third one of the large I/O circuits 341 of its CS IC chips 411 may have the large driver 274 as see in FIG. 18A coupling to the large receiver 275 of a fourth one of the large I/O circuits 341 of one of its NVM IC chips 250 via one of the through silicon vias (TSVs) of its CS IC chip 411, the interconnection metal layers 27 of the BISD 79 of its chip embedded substrate 177, one of the metal bumps or pillars 570 of its chip embedded substrate 177, a metal line or trace 549 of its ball-grid-array (BGA) substrate 537, one of the solder balls 337 of its NVM chip package 336, the circuit board 335 of its NVM chip package 336 and one of the wirebonded wires 333 of its NVM chip package 336 for passing the second encrypted CPM data from the large driver 274 of the third one of the large I/O circuits 341 to the large receiver 275 of the fourth one of the large I/O circuits 341 to be stored in one of its NVM IC chips 250.

Referring to FIG. 43, for the eighth type of chip package 308 for the first alternative, its CS IC chip 411 may include the regulating block 415 as seen in FIG. 29 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its logic integrated-circuit (IC) chip 326, its NVM IC chip 250 and/or each of its NVM IC chips 250.

Referring to FIG. 43, for the eighth type of chip package 308 for the first alternative, its HBM IC chip 251 may have a set of small I/O circuits 203, each having the same specification as illustrated in FIG. 18B, coupling respective to a set of small I/O circuits 203 of its logic integrated-circuit (IC) chip 326 through a set of first, second, third or fourth type of micro-bumps or micro-pillars 34 of its logic integrated-circuit (IC) chip 326 for data transmission with a data bit width of equal to or greater than 64, 128, 256, 512, 1024, 2048, 4096, 8K, or 16K.

Referring to FIG. 43, for the eighth type of chip package 308, its CS IC chip 411 may include a buffer and/or driver circuits for downloading the resulting values from each of its non-volatile memory (NVM) IC chips 250 to the memory cells 490 of its logic integrated-circuit (IC) chip 326 in case of a FPGA IC chip 200 as illustrated in FIGS. 19 and 20A-20L and downloading the programmable codes from each of its non-volatile memory (NVM) IC chips 250 to the memory cells 362 of its logic integrated-circuit (IC) chip 326 in case of an FPGA IC chip 200 as illustrated in FIGS. 15A-15C, 16A, 16B and 21. The buffer and/or driver circuits of its CS IC chip 411 may latch data associated with the resulting values and programmable codes from each of its non-volatile memory (NVM) IC chips 250 and amplify the data to the memory cells 490 and/or 362 of its logic integrated-circuit (IC) chip 326 with an increased bit width of the data. For example, the data from each of its non-volatile memory (NVM) IC chips 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of each of its CS IC chip 411 may simultaneously output and amplify the data in parallel to the memory cells 490 and/or 362 of its logic integrated-circuit (IC) chip 326 with an increased bit width of equal to or more than 4, 8, 16, 32 or 64 for example. For another example, the data from each of its non-volatile memory (NVM) IC chips 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data in parallel to the memory cells 490 and/or 362 of its logic integrated-circuit (IC) chip 326 with an increased bit width of equal to or more than 64, 128, or 256 for example.

Referring to FIG. 43, for the eighth type of chip package 308 for the first alternative, its CS IC chip 411 may include multiple small I/O circuits 203, each of which may be referred to the specification as illustrated in FIG. 18B, each coupling to one of multiple small I/O circuits 203 of its logic integrated-circuit (IC) chip 326, each of which may be referred to the specification as illustrated in FIG. 18B, through, in sequence, one of the first type of micro-bumps or micro-pillars 34 of its CS IC chip 411, one of its metal pad 597 and one of the first, second, third or fourth type of micro-bumps or micro-pillars 34 of its logic integrated-circuit (IC) chip 326. Its CS IC chip 411 may include multiple large I/O circuits 341, each of which may be referred to the specification as illustrated in FIG. 18A, each coupling to (1) an external circuit of the eighth type of chip package 308 through, in sequence, one of the through silicon vias (TSVs) 157 of its CS IC chip 411, the interconnection meta layers 27 of the BISD 79 of its chip embedded substrate 177, one of the metal bumps or pillars 570 of its chip embedded substrate 177, its ball-grid-array (BGA) substrate 537 and one of its solder balls 538, or (2) one of multiple large I/O circuits 341 of one of its NVM IC chips 250, each of which may be referred to the specification as illustrated in FIG. 18A, through, in sequence, one of the through silicon vias (TSVs) 157 of its CS IC chip 411, the interconnection meta layers 27 of the BISD 79 of its chip embedded substrate 177, one of the metal bumps or pillars 570 of its chip embedded substrate 177, the metal line or trace 549 of its ball-grid-array (BGA) substrate 537, one of the solder balls 337 of its non-volatile-memory (NVM) chip package 336, the circuit board 335 of its non-volatile-memory (NVM) chip package 336 and one of the wire-bonded wires 333 of its non-volatile-memory (NVM) chip package 336. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of its logic integrated-circuit (IC) chip 326, wherein the voltage (Vcc) of power supply supplied for each of the small I/O circuits 203 of its CS IC chip 411 may be the same as that supplied for each of the small I/O circuits 203 of its logic integrated-circuit (IC) chip 326. Further, gate oxide of each of the large I/O circuits 341 of its CS IC chip 411 may have a greater thickness than that of each of the small I/O circuits 203 of its CS IC chip 411.

2. Second Alternative

Referring to FIG. 43, the difference between the eighth type of chip packages 308 for the first and second alternatives is that the logic integrated-circuit (IC) chip 326 of the eighth type of chip package 308 for the first alternative may be replaced with a CS IC chip 411 for the eighth type of chip package 308 for the second alternative, which may have the same specification as illustrated in FIG. 34A to perform the same function as the CS IC chip 411 of the eighth type of chip package 308 for the first alternative, while the CS IC chip 411 of the eighth type of chip package 308 for the first alternative may be replaced with a logic integrated-circuit (IC) chip 326 for the eighth type of chip package 308 for the second alternative, which may have the same specification as illustrated in FIG. 34B to perform the same function as the logic integrated-circuit (IC) chip 326 of the eighth type of chip package 308 for the first alternative. For an element indicated by the same reference number for the eighth type of chip packages 308 for the first and second alternatives and for the seventh type of chip package 307 for the second alternative, the specification of the element for the eighth type of chip package 308 for the second alternative may be referred to that of the element for the eighth type of chip package 308 for the first alternative and for the seventh type of chip package 307 for the second alternative. For the eighth type of chip package 308 for the second alternative, its logic integrated-circuit (IC) chip 326 may include multiple small I/O circuits 203, each of which may be referred to the specification as illustrated in FIG. 18B, each coupling to one of multiple small I/O circuits 203 of its CS IC chip 411, each of which may be referred to the specification as illustrated in FIG. 18B, through, in sequence, one of the first type of micro-bumps or micro-pillars 34 of its logic integrated-circuit (IC) chip 326, one of its metal pad 597 and one of the first, second, third or fourth type of micro-bumps or micro-pillars 34 of its CS IC chip 411. Its CS IC chip 411 may include multiple large I/O circuits 341, each of which may be referred to the specification as illustrated in FIG. 18A, each coupling to (1) an external circuit of the eighth type of chip package 308 through, in sequence, one of the first, second, third or fourth type of micro-bumps or micro-pillars 34 of its CS IC chip 411, one of its metal pad 597, one of the through package vias (TPVs) 158 of its chip embedded substrate 177, the interconnection meta layers 27 of the BISD 79 of its chip embedded substrate 177, one of the metal bumps or pillars 570 of its chip embedded substrate 177, its ball-grid-array (BGA) substrate 537 and one of its solder balls 538, or (2) one of multiple large I/O circuits 341 of one of its NVM IC chips 250, each of which may be referred to the specification as illustrated in FIG. 18A, through, in sequence, one of the first, second, third or fourth type of micro-bumps or micro-pillars 34 of its CS IC chip 411, one of its metal pad 597, one of the through package vias (TPVs) 158 of its chip embedded substrate 177, the interconnection meta layers 27 of the BISD 79 of its chip embedded substrate 177, one of the metal bumps or pillars 570 of its chip embedded substrate 177, the metal line or trace 549 of its ball-grid-array (BGA) substrate 537, one of the solder balls 337 of its non-volatile-memory (NVM) chip package 336, the circuit board 335 of its non-volatile-memory (NVM) chip package 336 and one of the wire-bonded wires 333 of its non-volatile-memory (NVM) chip package 336. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of its logic integrated-circuit (IC) chip 326, wherein the voltage (Vcc) of power supply supplied for each of the small I/O circuits 203 of its CS IC chip 411 may be the same as that supplied for each of the small I/O circuits 203 of its logic integrated-circuit (IC) chip 326. Further, gate oxide of each of the large I/O circuits 341 of its CS IC chip 411 may have a greater thickness than that of each of the small I/O circuits 203 of its CS IC chip 411.

Ninth Type of Chip Package

Figure 44:
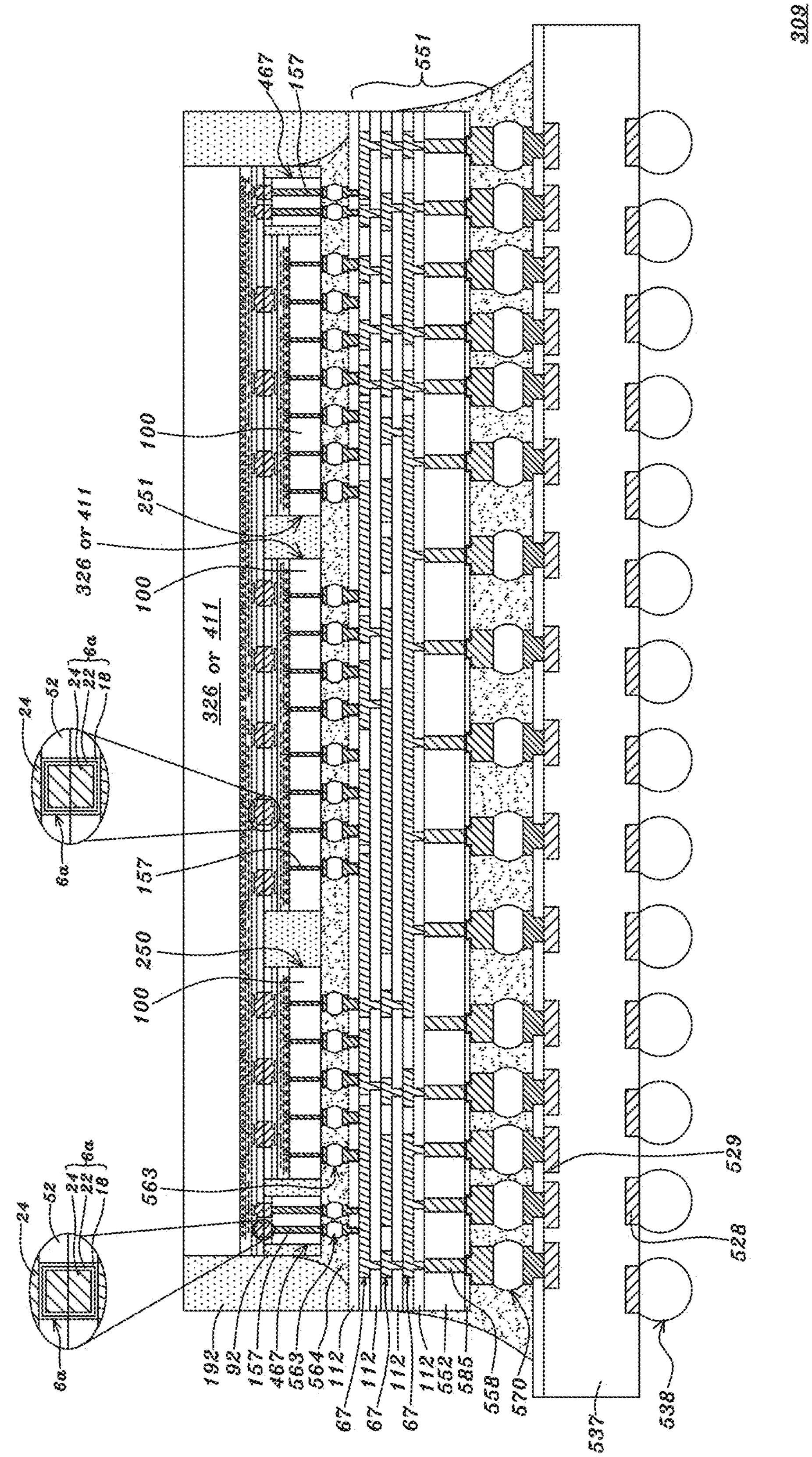
Figure 45:
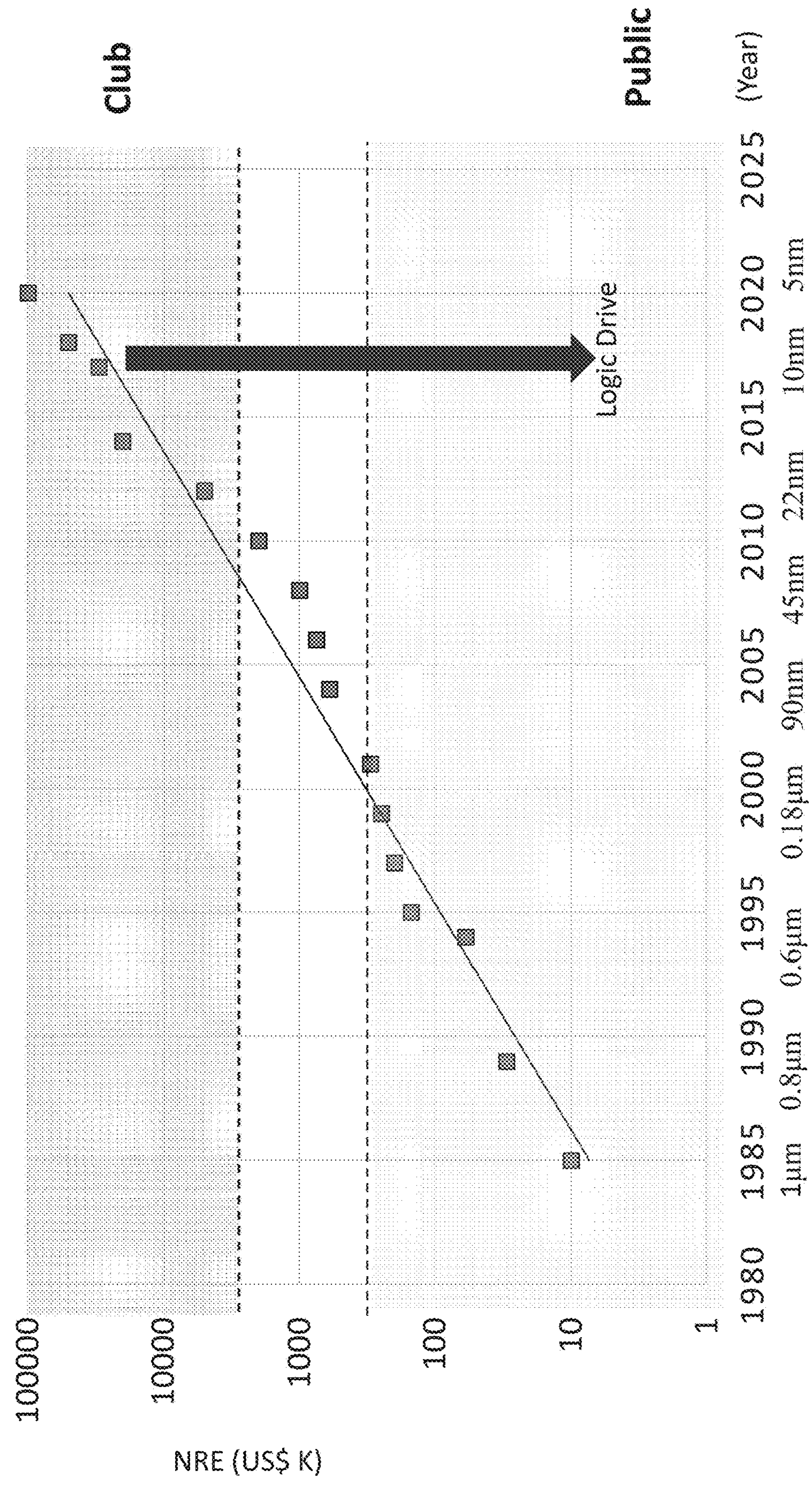
FIG. 45 is a chart showing a trend of relationship between non-recurring engineering (NRE) costs and technology nodes.

FIG. 44 is a schematically cross-sectional view showing a ninth type of chip package in accordance with an embodiment of the present application.

1. First Alternative

Referring to FIG. 44, the ninth type of chip package 309 for a first alternative may include (1) a third type of semiconductor chip 100 having the same specification as illustrated in FIG. 34C, which may be used for a logic integrated-circuit (IC) chip 326, such as FPGA IC chip, graphic-processing unit (GPU) chip, central-processing-unit (CPU) chip or digital-signal-processing (DSP) chip, (2) multiple fourth type of semiconductor chip 100 each having the same specification as illustrated in FIG. 34D, each of which may be an NVM IC chip 250, such as NAND or NOR flash chip, MRAM IC chip or RRAM IC chip, an HBM IC chip 251, such as SRAM IC chip or DRAM IC chip, or a CS IC chip 411 as illustrated in FIG. 29, and (3) multiple second type of vertical-through-via (VTV) connectors 467 each having the same specification as illustrated in FIG. 35B. For example, for the ninth type of chip package 309, a left one of its fourth type of semiconductor chips 100 may be the NVM IC chip 250, a middle one of its fourth type of semiconductor chips 100 may be the CS IC chip 411, and a right one of its fourth type of semiconductor chips 100 may be the HBM IC chip 251.

Referring to FIG. 44, for the ninth type of chip package 309 for the first alternative, each of its fourth type of semiconductor chip 100 and second type of vertical-through-via (VTV) connectors 467 may be provided with (1) the insulating bonding layer 52, i.e., silicon oxide, having a top surface attached to a bottom surface of the insulating bonding layer 52, i.e., silicon oxide, of its logic integrated-circuit (IC) chip 326 and (2) the metal pads 6*a*, i.e., copper layer 24 thereof, each having a top surface bonded to a bottom surface of one of the metal pads 6*a*, i.e., copper layer 24 thereof, of its logic integrated-circuit (IC) chip 326.

Referring to FIG. 44, the ninth type of chip package 309 for the first alternative may include a polymer layer 92, such as molding compound, epoxy-based material or polyimide, filled into multiple gaps each between neighboring two of its fourth type of semiconductor chips 100 and second type of vertical-through-via (VTV) connectors 467. For each of the fourth type of semiconductor chips 100 of the ninth type of chip package 309, its semiconductor substrate 2 may have a portion at a backside thereof removed by a chemical-mechanical-polishing (CMP) or mechanical grinding process such that each of its through silicon vias (TSVs) 157, that is, the electroplated copper layer 156 thereof, may have a backside substantially coplanar to the backside of its semiconductor substrate 2 and a bottom surface of the polymer layer 92 of the ninth type of chip package 309.

Referring to FIG. 44, the ninth type of chip package 309 for the first alternative may further include multiple metal bumps or pillars in an array at a bottom thereof, each having various types, i.e., first, second, third and fourth types, which may have the same specification as that of the first, second, third and fourth types of micro-bump or micro-pillars 34 respectively as illustrated in FIG. 34A. Each of its first, second, third or fourth metal bumps or pillars may have the adhesion layer 26*a* on a bottom surface of one of the through silicon vias (TSVs) 157 of one of its fourth type of semiconductor chip 100 and second type of vertical-through-via (VTV) connectors 467.

Referring to FIG. 44, the ninth type of chip package 309 for the first alternative may include an interposer 551 having the same specification as illustrated in FIG. 37. For the ninth type of chip package 309, each of its fourth type of semiconductor chips 100 and second type of vertical-through-via (VTV) connectors 467 may have the first, second, third or fourth type of micro-bumps or micro-pillars bonded to its interposer 551 to form multiple metal contacts 563 between said each of its fourth type of semiconductor chips 100 and second type of vertical-through-via (VTV) connectors 467 and its interposer 551, wherein each of its metal contacts 563 may include a copper layer having a thickness between 2 μm and 20 μm and a largest transverse dimension 1 μm and 15 μm between said each of its fourth type of semiconductor chips 100 and second type of vertical-through-via (VTV) connectors 467 and its interposer 551 and a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The ninth type of chip package 309 may further include (1) an underfill 564, i.e., polymer layer, between each of its fourth type of semiconductor chips 100 and second type of vertical-through-via (VTV) connectors 467 and its interposer 551 and between its polymer 92 and its interposer 551, covering a sidewall of each of its metal contacts 563 between said each of its fourth type of semiconductor chips 100 and second type of vertical-through-via (VTV) connectors 467 and its interposer 551, (2) a polymer layer 192, such as molding compound, epoxy-based material or polyimide, on its interposer 551 and underfill 564, wherein its polymer layer 192 has a top surface coplanar to a top surface of its logic integrated-circuit (IC) chip 326, and (3) multiple metal bumps or pillars 570 in an array on a bottom surface of its interposer 551. Each of its metal bumps or pillars 570 may have various types, i.e., first, second and third types, which may have the same specification as that of the first, second and third types of metal bumps or pillars 570 respectively as illustrated in FIG. 36A, wherein each of its metal bumps or pillars 570 may have the adhesion layer 26*a* on the backside of one of the through silicon vias 558 of its interposer 551, i.e., a backside of the copper layer 557 thereof.

Referring to FIG. 44, the ninth type of chip package 309 for the first alternative may further include (1) a ball-grid-array (BGA) substrate 537 having multiple metal pads 529 at a top surface thereof and multiple metal pads 528 at a bottom surface thereof, wherein its metal bumps or pillars 570 may be bonded respectively to the metal pads 529 of its ball-grid-array (BGA) substrate 537, (2) multiple solder balls 538 each on one of the metal pads 528 of its ball-grid-array (BGA) substrate 537, and (3) an underfill 564 between its interposer 511 and its ball-grid-array (BGA) substrate 537, covering a sidewall of each of its metal bumps or pillars 570.

Referring to FIG. 44, for the ninth type of chip package 309 for the first alternative, in the case that its logic integrated-circuit (IC) chip 326 is the FPGA IC chip 200 as illustrated in FIG. 27, a first one of the large I/O circuits 341 of its NVM IC chip 250 may have the large driver 274 as see in FIG. 18A coupling to the large receiver 275 of a second one of the large I/O circuits 341 of its CS IC chip 411 via one of the through silicon vias (TSVs) of its NVM IC chip 250, one of its metal contacts 563 under its NVM IC chip 250, one or more of the interconnection metal layers 77 of its interposer 551, one of its metal contacts 563 under its CS IC chip 411, and one of the through silicon vias (TSVs) of its CS IC chip 411 for passing first encrypted CPM data from the large driver 274 of the first one of the large I/O circuits 341 to the large receiver 275 of the second one of the large I/O circuits 341. Next, the first encrypted CPM data may be decrypted as illustrated in FIG. 29 by the cryptography block 517 of its CS IC chip 411 as first decrypted CPM data. Next, a first one of the small I/O circuits 203 of its CS IC chip 411 may have the small driver 374 as seen in FIG. 18B coupling to the small receiver 375 of a second one of the small I/O circuits 203 of its logic integrated-circuit (IC) chip 326 via one of the metal pads 6*a* of its CS IC chip 411 and one of the metal pads 6*a* of its logic integrated-circuit (IC) chip 326 for passing the first decrypted CPM data from the small driver 374 of the first one of the small 1U) circuits 203 to the small receiver 375 of the second one of the small I/O circuits 203. Next, for the logic integrated-circuit (IC) chip 326 of the seventh type of chip package 307, one of the first type of memory cells 490 of one of its field programmable logic cells or elements (LCE) 2014 as seen in FIG. 19 may be programmed or configured in accordance with the first decrypted CPM data, or one of the first type of memory cells 362 of one of its field programmable switch cells 258 or 379 as seen in FIGS. 15A-15C, 16A, 16B and 21 may be programmed or configured in accordance with the first decrypted CPM data. Alternatively, for the seventh type of chip package 307, a third one of the small I/O circuits 203 of its logic integrated-circuit (IC) chip 326 may have the small driver 374 as seen in FIG. 18B coupling to the small receiver 375 of a fourth one of the small I/O circuits 203 of its CS IC chips 411 via one of the metal pads 6*a* of its logic integrated-circuit (IC) chip 326 and one of the metal pads 6*a* of its CS IC chip 411 for passing second CPM data used to program or configure the first type of memory cells 490 of one of the field programmable logic cells or elements (LCE) 2014 of its logic integrated-circuit (IC) chip 326 or the first type of memory cells 362 of one of the field programmable switch cells 258 or 379 of its logic integrated-circuit (IC) chip 326 from the small driver 374 of the third one of the small I/O circuits 203 to the small receiver 375 of the fourth one of the small I/O circuits 203. Next, the second CPM data may be encrypted as illustrated in FIG. 29 by the cryptography block 517 of its CS IC chip 411 as second encrypted CPM data. Next, a third one of the large I/O circuits 341 of its CS IC chips 411 may have the large driver 274 as see in FIG. 18A coupling to the large receiver 275 of a fourth one of the large I/O circuits 341 of its NVM IC chip 250 via one of the through silicon vias (TSVs) of its CS IC chip 411, one of its metal contacts 563 under its CS IC chip 411, one or more of the interconnection metal layers 77 of its interposer 551, one of its metal contacts 563 under its NVM IC chip 250 and one of the through silicon vias (TSVs) of its NVM IC chip 250 for passing the second encrypted CPM data from the large driver 274 of the third one of the large I/O circuits 341 to the large receiver 275 of the fourth one of the large I/O circuits 341 to be stored in its NVM IC chip 250.

Referring to FIG. 44, for the ninth type of chip package 309 for the first alternative, its CS IC chip 411 may include the regulating block 415 as seen in FIG. 29 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its logic integrated-circuit (IC) chip 326, its NVM IC chip 250 and/or its NVM IC chip 250.

Referring to FIG. 44, for the ninth type of chip package 309 for the first alternative, its HBM IC chip 251 may have a set of small I/O circuits 203, each hiving the same specification as illustrated in FIG. 18B, coupling respective to a set of small I/O circuits 203 of its logic integrated-circuit (IC) chip 326 through the bonding of each of a set of metal pads 6*a* of its logic integrated-circuit (IC) chip 326 to one of a set of metal pads 6*a* of its HBM IC chip 251 for data transmission with a data bit width of equal to or greater than 64, 128, 256, 512, 1024, 2048, 4096, 8K, or 16K.

Referring to FIG. 44, for the ninth type of chip package 309, its CS IC chip 411 may include a buffer and/or driver circuits for downloading the resulting values from its non-volatile memory (NVM) IC chip 250 to the memory cells 490 of its logic integrated-circuit (IC) chip 326 in case of an FPGA IC chip 200 as illustrated in FIGS. 19 and 20A-20L and downloading the programmable codes from its non-volatile memory (NVM) IC chip 250 to the memory cells 362 of its logic integrated-circuit (IC) chip 326 in case of an FPGA IC chip 200 as illustrated in FIGS. 15A-15C, 16A, 16B and 21. The buffer and/or driver circuits of its CS IC chip 411 may latch data associated with the resulting values and programmable codes from its non-volatile memory (NVM) IC chip 250 and amplify the data to the memory cells 490 and/or 362 of its logic integrated-circuit (IC) chip 326 with an increased bit width of the data. For example, the data from its non-volatile memory (NVM) IC chip 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of its CS IC chip 411 may simultaneously output and amplify the data in parallel to the memory cells 490 and/or 362 of its logic integrated-circuit (IC) chip 326 with an increased bit width of equal to or more than 4, 8, 16, 32 or 64 for example. For another example, the data from its non-volatile memory (NVM) IC chip 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data in parallel to the memory cells 490 and/or 362 of its logic integrated-circuit (IC) chip 326 with an increased bit width of equal to or more than 64, 128, or 256 for example.

Referring to FIG. 44, for the ninth type of chip package 309 for the first alternative, its CS IC chip 411 may include multiple small I/O circuits 203, each of which may be referred to the specification as illustrated in FIG. 18B, each coupling to one of multiple small I/O circuits 203 of its logic integrated-circuit (IC) chip 326, each of which may be referred to the specification as illustrated in FIG. 18B, through, in sequence, one of the metal pads 6*a* of its CS IC chip 411 and overlying one of the metal pads 6*a* of its logic integrated-circuit (IC) chip 326. Its CS IC chip 411 may include multiple large I/O circuits 341, each of which may be referred to the specification as illustrated in FIG. 18A, each coupling to (1) an external circuit of the ninth type of chip package 309 through, in sequence, one of the through silicon vias (TSVs) 157 of its CS IC chip 411, underlying one of its metal contacts 563, the interconnection metal layers 67 of its interposer 551, one of the through silicon vias (TSVs) 558 of its interposer 551, underlying one of its metal bumps or pillars 570, its ball-grid-array (BGA) substrate 537 and one of its solder balls 538, or (2) one of multiple large I/O circuits 341 of its NVM IC chip 250, each of which may be referred to the specification as illustrated in FIG. 18A, through, in sequence, one of the through silicon vias (TSVs) 157 of its CS IC chip 411, underlying one of its metal contacts 563, one or more of the interconnection metal layers 67 of its interposer 551, one of its metal contacts 563 between its NVM IC chip 250 and its interposer 551 and overlying one of the through silicon vias (TSVs) 157 of its NVM IC chip 250. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of its logic integrated-circuit (IC) chip 326, wherein the voltage (Vcc) of power supply supplied for each of the small I/O circuits 203 of its CS IC chip 411 may be the same as that supplied for each of the small I/O circuits 203 of its logic integrated-circuit (IC) chip 326. Further, gate oxide of each of the large I/O circuits 341 of its CS IC chip 411 may have a greater thickness than that of each of the small I/O circuits 203 of its CS IC chip 411.

Referring to FIGS. 30A, 30B and 44, for the ninth type of chip package 309 for the first alternative, its CS IC chip 411 may include the hard macros 419 as illustrated in FIG. 29. The hard macros 419 of its CS IC chip 411 may be divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its logic integrated-circuit (IC) chip 326 in case of the FPGA IC chip 200 as illustrated in FIG. 19 through, in sequence, one of the small I/O circuits 203 of its CS IC chip 411, one of the metal pads 6*a* of its CS IC chip 411, overlying one of the metal pads 6*a* of its logic integrated-circuit (IC) chip 326, one of the small I/O circuits 203 of its logic integrated-circuit (IC) chip 326 and one or more of the field programmable switch cells 252 or 379 of its logic integrated-circuit (IC) chip 326 in case of the FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its logic integrated-circuit (IC) chip 326 through, in sequence, one or more of the field programmable switch cells 252 or 379 of its logic integrated-circuit (IC) chip 326, one of the small I/O circuits 203 of its logic integrated-circuit (IC) chip 326, one of the metal pads 6*a* of its logic integrated-circuit (IC) chip 326, underlying one of the metal pads 6*a* of its CS IC chip 411 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its logic integrated-circuit (IC) chip 326 in case of the FPGA IC chip 200 as illustrated in FIG. 20K or 20L through, in sequence, one of the small I/O circuits 203 of its CS IC chip 411, one of the metal pads 6*a* of its CS IC chip 411, overlying one of the metal pads 6*a* of its logic integrated-circuit (IC) chip 326 and one of the small I/O circuits 203 of its logic integrated-circuit (IC) chip 326.

2. Second Alternative

Referring to FIG. 44, the difference between the ninth type of chip packages 309 for the first and second alternatives is that the logic integrated-circuit (IC) chip 326 of the ninth type of chip package 309 for the first alternative may be replaced with a CS IC chip 411 for the ninth type of chip package 309 for the second alternative, which may have the same specification as illustrated in FIG. 34A to perform the same function as the CS IC chip 411 of the ninth type of chip package 309 for the first alternative, while the CS IC chip 411 of the ninth type of chip package 309 for the first alternative may be replaced with a logic integrated-circuit (IC) chip 326 for the ninth type of chip package 309 for the second alternative, which may have the same specification as illustrated in FIG. 34B to perform the same function as the logic integrated-circuit (IC) chip 326 of the ninth type of chip package 309 for the first alternative. For an element indicated by the same reference number for the ninth type of chip packages 309 for the first and second alternatives, the specification of the element for the ninth type of chip package 309 for the second alternative may be referred to that of the element for the ninth type of chip package 309 for the first alternative. For the ninth type of chip package 309 for the second alternative, its CS IC chip 411 may include multiple small I/O circuits 203, each of which may be referred to the specification as illustrated in FIG. 18B, each coupling to one of multiple small I/O circuits 203 of its logic integrated-circuit (IC) chip 326, each of which may be referred to the specification as illustrated in FIG. 18B, through, in sequence, one of the metal pads 6*a* of its CS IC chip 411 and underlying one of the metal pads 6*a* of its logic integrated-circuit (IC) chip 326. Its CS IC chip 411 may include multiple large I/O circuits 341, each of which may be referred to the specification as illustrated in FIG. 18A, each coupling to (1) an external circuit of the ninth type of chip package 309 through, in sequence, one of the metal pads 6*a* of its CS IC chip 411, underlying one of the metal pads 6*a* of one of its second type of vertical-through-via (VTV) connectors 467, underlying one of the through silicon vias (TSVs) 157 of said one of its second type of vertical-through-via (VTV) connectors 467, underlying one of its metal contacts 563, the interconnection metal layers 67 of its interposer 551, one of the through silicon vias (TSVs) 558 of its interposer 551, underlying one of its metal bumps or pillars 570, its ball-grid-array (BGA) substrate 537 and one of its solder balls 538, or (2) one of multiple large I/O circuits 341 of its NVM IC chip 250, each of which may be referred to the specification as illustrated in FIG. 18A, through, in sequence, one of the metal pads 6*a* of its CS IC chip 411 and underlying one of the metal pads 6*a* of its NVM IC chip 250. A voltage (Vcc) of power supply supplied for each of the large I/O circuits 341 of its CS IC chip 411 may be higher than that supplied for each of the small I/O circuits 203 of its CS IC chip 411 and that supplied for each of the small I/O circuits 203 of its logic integrated-circuit (IC) chip 326, wherein the voltage (Vcc) of power supply supplied for each of the small I/O circuits 203 of its CS IC chip 411 may be the same as that supplied for each of the small I/O circuits 203 of its logic integrated-circuit (IC) chip 326. Further, gate oxide of each of the large I/O circuits 341 of its CS IC chip 411 may have a greater thickness than that of each of the small I/O circuits 203 of its CS IC chip 411. The hard macros 419 of its CS IC chip 411 may be divided into two groups: each of the hard macros 419 of its CS IC chip 411 in a first group may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit and/or application-processing-unit (APU) circuit, having (1) output data to be passed as input data of the first input data set of the multiplexer 213 of the selection circuit 211 of one of the field programmable logic cells or elements (LCE) 2014 of its logic integrated-circuit (IC) chip 326 in case of the FPGA IC chip 200 as illustrated in FIG. 19 through, in sequence, one of the small I/O circuits 203 of its CS IC chip 411, one of the metal pads 6*a* of its CS IC chip 411, underlying one of the metal pads 6*a* of its logic integrated-circuit (IC) chip 326, one of the small I/O circuits 203 of its logic integrated-circuit (IC) chip 326 and one or more of the field programmable switch cells 252 or 379 of its logic integrated-circuit (IC) chip 326 in case of the FPGA IC chip 200 as illustrated in FIG. 15A-15C, 16A, 16B or 21 or (2) input data passed from output data of the multiplexer 213 of the selection circuit 211 of one of the field programmable logic cells or elements (LCE) 2014 of its logic integrated-circuit (IC) chip 326 through, in sequence, one or more of the field programmable switch cells 252 or 379 of its logic integrated-circuit (IC) chip 326, one of the small I/O circuits 203 of its logic integrated-circuit (IC) chip 326, one of the metal pads 6*a* of its logic integrated-circuit (IC) chip 326, overlying one of the metal pads 6*a* of its CS IC chip 411 and one of the small I/O circuits 203 of its CS IC chip 411. Each of the hard macros 419 of its CS IC chip 411 in a second group may be a phase locked loop (PLL) circuit or digital clock manager (DCM) configured to generate a clock signal to be passed to the D-type flip-flop circuit 2034 or 2039 of its logic integrated-circuit (IC) chip 326 in case of the FPGA IC chip 200 as illustrated in FIG. 20K or 20L through, in sequence, one of the small I/O circuits 203 of its CS IC chip 411, one of the metal pads 6*a* of its CS IC chip 411, underlying one of the metal pads 6*a* of its logic integrated-circuit (IC) chip 326 and one of the small I/O circuits 203 of its logic integrated-circuit (IC) chip 326.

Note

Referring to FIG. 40, for the fifth type of chip package 305, the fourth type of non-volatile memory cell 721 as illustrated in FIGS. 5A-5C and 5E formed by the FINFET process technology or as illustrated in FIGS. 5A and 5F formed by the GAAFET process technology may be formed in its FPGA IC chip 200 for storing the first, second and/or third password as illustrated in FIGS. 22A-22D, 23A-23C, 24, 25 and 26A-26C for the cryptography block of its FPGA IC chip 200; while, for each of the first through fourth and sixth through ninth type of chip packages 301-304 and 306-309, the fourth type of non-volatile memory cell 721 as illustrated in FIGS. 5A and 5D formed by the planar MOSFET process technology may be formed in each of its cooperating and supporting (CS) IC chips 411 for storing the first, second and/or third password as illustrated in FIGS. 22A-22D, 23A-23C, 24, 25 and 26A-26C for the cryptography block of said each of its cooperating and supporting (CS) IC chips 411.

Referring to FIGS. 36A-36C, 37, 38, 39, 40, 41A, 41B, 42, 43 and 44, for each of the first through ninth types of chip packages 301-309, each of its cooperating and supporting (CS) integrated-circuit (IC) chips 411 may be designed, implemented and fabricated using varieties of semiconductor technology nodes or generations, including old or matured technology notes or generations, for example, a semiconductor note or generation less advanced than or equal to, or above or equal to 20 nm, 30 nm, 40 nm, 50 nm, 90 nm, 130 nm, 250 nm, 350 nm, or 500 nm. The semiconductor technology node or generation used in each of its CS IC chips may be 1, 2, 3, 4, 5 or greater than 5 notes or generations older, more matured or less advanced than that used in each of its standard commodity FPGA IC chip 200 or logic integrated-circuit (IC) chip 326. Transistors used in each of its CS IC chips 411 may be fully depleted silicon-on-insulator (FDSOI) MOSFETs, partially depleted silicon-on-insulator (PDSOI) MOSFETs or conventional planar MOSFETs. Transistors used in each of its CS IC chips 411 may be different from those used in its standard commodity FPGA IC chip 200 or logic integrated-circuit (IC) chip 326; for example, each of its CS IC chips 411 may be formed with conventional planar MOSFETs, while its standard commodity FPGA IC chip 200 or logic integrated-circuit (IC) chip 326 may be formed with FINFETs or GAAFETs. A voltage (Vcc) of power supply used in each of its CS IC chips 411 may be greater than or equal to 1.5 V, 2.0 V, 2.5 V, 3 V, 3.5V, 4V or 5V, while a voltage (Vcc) of power supply used in its standard commodity FPGA IC chip 200 or logic integrated-circuit (IC) chip 326 may be smaller than or equal to 2.5 V, 2 V, 1.8 V, 1.5 V or 1 V. A voltage (Vcc) of power supply used in each of its CS IC chips 411 may be different from that used in its standard commodity FPGA IC chip 200 or logic integrated-circuit (IC) chip 326. For an example, a voltage (Vcc) of power supply used in each of its CS IC chips 411 may be 4 V, while a voltage (Vcc) of power supply used in its standard commodity FPGA IC chip 200 or logic integrated-circuit (IC) chip 326 may be 1.5V. For another example, a voltage (Vcc) of power supply used in each of its CS IC chips 411 may be 2.5V, while a voltage (Vcc) of power supply used in its standard commodity FPGA IC chip 200 or logic integrated-circuit (IC) chip 326 may be 0.75V. Each of its CS IC chips 411 may be formed with multiple field effect transistors (FETs) each having a gate oxide with a physical thickness greater than or equal to 5 nm, 6 nm, 7.5 nm, 10 nm, 12.5 nm, or 15 nm, while its standard commodity FPGA IC chip 200 or logic integrated-circuit (IC) chip 326 may be formed with multiple field effect transistors (FETs) each having a gate oxide with a physical thickness less than 4.5 nm, 4 nm, 3 nm or 2 nm. Each of its CS IC chips 411 may be formed with multiple field effect transistors (FETs) each having a gate oxide with a physical thickness different from that of a gate oxide of each of field effect transistors (FETs) of its standard commodity FPGA IC chip 200 or logic integrated-circuit (IC) chip 326. For an example, each of its CS IC chips 411 may be formed with multiple field effect transistors (FETs) each having a gate oxide with a physical thickness of 10 nm, while its standard commodity FPGA IC chip 200 or logic integrated-circuit (IC) chip 326 may be formed with multiple field effect transistors (FETs) each having a gate oxide with a physical thickness of 3 nm. For another example, each of its CS IC chips 411 may be formed with multiple field effect transistors (FETs) each having a gate oxide with a physical thickness of 7.5 nm, while its standard commodity FPGA IC chip 200 or logic integrated-circuit (IC) chip 326 may be formed with multiple field effect transistors (FETs) each having a gate oxide with a physical thickness of 2 nm.

Referring to FIGS. 36A-36C, 37, 38, 39, 40, 41A, 41B, 42, 43 and 44, each of the first through ninth types of chip packages 301-309 may be used for an edge device for a user or client. The user or client may install or download configuration data or information, i.e., resulting values or programmable codes, from developers or suppliers to configure the memory cells 490 and 362 of its FPGA IC chip 200 or one for its logic integrated-circuit (IC) chip 326, as illustrated in FIGS. 19, 20A-20L and 21, in his or her edge device for applications of artificial intelligence (AI), machine learning, deep learning, big data, internet of things (IOT), virtual reality (VR), augmented reality (AR), car electronics, graphic processing (GP), digital signal processing (DSP), micro controlling (MC) and/or central processing (CP). The configuration data or information may be based on tiny machine learning algorithm or architecture implemented in ultra-low power machine learning technologies and approaches dealing with machine intelligence at the edge device of the cloud. The tiny machine learning algorithm or architecture may include machine learning architectures, techniques, tools, and approaches capable of performing on-device analytics. As an example, the on-device analytics may use a machine training mode or parameters being pruned as small as possible, and retraining is just updating the machine training model or parameters for a simple training process. The edge device may be formatted or partitioned using methods similar to formation, location or partition of a data storage hard disc or solid-state memory disc. The on-device analytics used in the edge device at an edge of the cloud may provide security and privacy for the user or client. The user or client does not need to buy 10 different edge devices, he or she just need to buy an edge device and decide what are to be installed or loaded onto it for image recognition or speech recognition, for example. When the user or client needs a smart home device, he or she does not need to keep buying new hardware for the new need. One benefit of the on-device analytics used in the edge device is that the user or client does not have to connect with the cloud, so data of the user or client are private. The edge device may have a model or parameters to be personalized by training with data of the user or client locally.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multichip package comprising:

a non-volatile memory (NVM) integrated-circuit (IC) chip comprising a plurality of first metal contacts at a top thereof;

a polymer layer at a same horizontal level as the non-volatile memory (NVM) integrated-circuit (IC) chip;

a field-programmable-gate-array (FPGA) integrated-circuit (IC) chip over the non-volatile memory (NVM) integrated-circuit (IC) chip and polymer layer and coupling to the non-volatile memory (NVM) integrated-circuit (IC) chip, wherein the field-programmable-gate-array (FPGA) integrated-circuit (IC) chip comprises a plurality of second metal contacts at a bottom thereof, wherein each of the plurality of first metal contacts couples to one of the plurality of second metal contacts, wherein the field-programmable-gate-array (FPGA) integrated-circuit (IC) chip is to be configured in accordance with configuration data stored in the non-volatile memory (NVM) integrated-circuit (IC) chip; and a plurality of metal bumps at a bottom of the multichip package.

2. The multichip package of claim 1, wherein the field-programmable-gate-array (FPGA) integrated-circuit (IC) chip comprises a selection circuit having a first input data set fora logic operation and a second input data set having data associated with the configuration data, wherein the selection circuit is configured to select, in accordance with the first input data set, input data from the second input data set as output data for the logic operation.

3. The multichip package of claim 1, wherein the field-programmable-gate-array (FPGA) integrated-circuit (IC) chip comprises a switch having input data associated with the configuration data, a first interconnect coupling to the switch, and a second interconnect coupling to the switch, wherein the switch is configured to control, in accordance with the input data, coupling between the first and second interconnects.

4. The multichip package of claim 1, wherein the non-volatile memory (NVM) integrated-circuit (IC) chip comprises a first silicon-oxide containing layer, and the field-programmable-gate-array (FPGA) integrated-circuit (IC) chip comprises a second silicon-oxide containing layer having a bottom surface bonded to and in contact with a top surface of the first silicon-oxide containing layer, wherein each of the plurality of first metal contacts comprises a first copper pad in the first silicon-oxide containing layer, and each of the plurality of second metal contacts comprises a second copper pad in the second silicon-oxide containing layer and having a bottom surface bonded to and in contact with a top surface of the first copper pad.

5. The multichip package of claim 1 further comprising a tin-containing layer between a first metal contact of the plurality of first metal contacts and a second metal contact of the plurality of second metal contacts, wherein the second metal contact is vertically aligned with and bonded to the first metal contact.

6. The multichip package of claim 5 further comprising an underfill between the field-programmable-gate-array (FPGA) integrated-circuit (IC) chip and non-volatile memory (NVM) integrated-circuit (IC) chip.

7. The multichip package of claim 1 further comprising a metal via vertically in the polymer layer, under the field-programmable-gate-array (FPGA) integrated-circuit (IC) chip and coupling to the field-programmable-gate-array (FPGA) integrated-circuit (IC) chip.

8. The multichip package of claim 7 further comprising an interconnection scheme under the non-volatile memory (NVM) integrated-circuit (IC) chip, polymer layer and metal via, wherein the interconnection scheme couples to the field-programmable-gate-array (FPGA) integrated-circuit (IC) chip through the metal via.

9. The multichip package of claim 1, wherein each of the plurality of metal bumps comprises tin.

10. The multichip package of claim 1 further comprising a semiconductor integrated-circuit (IC) chip at the same horizontal level as the non-volatile memory (NVM) integrated-circuit (IC) chip and polymer layer, under the field-programmable-gate-array (FPGA) integrated-circuit (IC) chip and coupling to the field-programmable-gate-array (FPGA) integrated-circuit (IC) chip.

11. The multichip package of claim 1, wherein the non-volatile memory (NVM) integrated-circuit (IC) chip comprises a silicon substrate and a metal via vertically in the silicon substrate.

12. The multichip package of claim 1, wherein the non-volatile memory (NVM) integrated-circuit (IC) chip is a NAND flash chip.

13. The multichip package of claim 1, wherein the non-volatile memory (NVM) integrated-circuit (IC) chip is a NOR flash chip.

14. A multichip package comprising:

a first circuit substrate;

a solder bump on a bottom surface of the first circuit substrate and at a bottom of the multichip package;

a first chip package over a top surface of the first circuit substrate and coupling to the first circuit substrate, wherein the first chip package comprises a second circuit substrate over the top surface of the first circuit substrate, a first metal bump between the first and second circuit substrates and coupling the first circuit substrate to the second circuit substrate, and a fieldprogrammable-gate-array (FPGA) integrated-circuit (IC) chip over the second circuit substrate and coupling to the second circuit substrate; and a second chip package over the top surface of the first circuit substrate, at a same horizontal level as the first chip package and coupling to the first circuit substrate, wherein the second chip package comprises a third circuit substrate over the first circuit substrate, a second metal bump between the first and third circuit substrates and coupling the first circuit substrate to the third circuit substrate, a non-volatile memory (NVM) integrated-circuit (IC) chip over the third circuit substrate and coupling to the third circuit substrate, wherein the field-programmable-gate-array (FPGA) integrated-circuit (IC) chip is to be configured in accordance with configuration data stored in the non-volatile memory (NVM) integrated-circuit (IC) chip.

15. The multichip package of claim 14, wherein the field-programmable-gate-array (FPGA) integrated-circuit (IC) chip comprises a selection circuit having a first input data set fora logic operation and a second input data set having data associated with the configuration data, wherein the selection circuit is configured to select, in accordance with the first input data set, input data from the second input data set as output data for the logic operation.

16. The multichip package of claim 14, wherein the field-programmable-gate-array (FPGA) integrated-circuit (IC) chip comprises a switch having input data associated with the configuration data, a first interconnect coupling to the switch, and a second interconnect coupling to the switch, wherein the switch is configured to control, in accordance with the input data, coupling between the first and second interconnects.

17. The multichip package of claim 14 further comprising a polymer layer over the top surface of the first circuit substrate and contacting a sidewall of the second chip package.

18. The multichip package of claim 14 further comprising a polymer layer over the top surface of the first circuit substrate and contacting a sidewall of the first chip package.

19. The multichip package of claim 14 further comprising an underfill between the first and second circuit substrates and covering a sidewall of the first metal bump.

20. The multichip package of claim 14, wherein the first chip package further comprises a polymer layer over the second circuit substrate and covering a sidewall of the field-programmable-gate-array (FPGA) integrated-circuit (IC) chip.

21. The multichip package of claim 14, wherein the second chip package further comprises a wirebonded wire coupling the non-volatile memory (NVM) integrated-circuit (IC) chip to the third circuit substrate, and a polymer layer over the third circuit substrate and encapsulating the non-volatile memory (NVM) integrated-circuit (IC) chip and wirebonded wire.

22. The multichip package of claim 14, wherein the first chip package comprises a third metal bump between the field-programmable-gate-array (FPGA) integrated-circuit (IC) chip and second circuit substrate and coupling the field-programmable-gate-array (FPGA) integrated-circuit (IC) chip to the second circuit substrate.

23. The multichip package of claim 14, wherein the non-volatile memory (NVM) integrated-circuit (IC) chip is a NAND flash chip.

24. The multichip package of claim 14, wherein the non-volatile memory (NVM) integrated-circuit (IC) chip is a NOR flash chip.

25. The multichip package of claim 14, wherein the first circuit substrate is a ball-grid-array (BGA) substrate.

26. The multichip package of claim 14, wherein the configuration data stored in the non-volatile memory (NVM) integrated-circuit (IC) chip is encrypted.

* * * * *